US012577268B2

(12) United States Patent
Chen et al.

(10) Patent No.: US 12,577,268 B2
(45) **Date of Patent: *Mar. 17, 2026**

(54) ORGANIC ELECTROLUMINESCENT MATERIALS AND DEVICES

(71) Applicant: Universal Display Corporation, Ewing, NJ (US)

(72) Inventors: Hsiao-Fan Chen, Lawrence Township, NJ (US); Tyler Fleetham, Newtown, PA (US); Peter Wolohan, Princeton Junction, NJ (US); Jason Brooks, Philadelphia, PA (US); Pierre-Luc T. Boudreault, Pennington, NJ (US); Charles J. Stanton, III, Wilmington, DE (US); Olexandr Tretyak, Newark, DE (US); Raghupathi Neelarapu, Newark, DE (US); Katarina Rohlfing, Wilmington, DE (US); Douglas Williams, Mullica Hill, NJ (US); Rasha Hamze, Philadelphia, PA (US)

(73) Assignee: UNIVERSAL DISPLAY CORPORATION, Ewing, NJ (US)

(*) Notice: Subject to any disclaimer, the term of this patent is extended or adjusted under 35 U.S.C. 154(b) by 1328 days.

This patent is subject to a terminal disclaimer.

(21) Appl. No.: 17/314,024

(22) Filed: May 6, 2021

(65) Prior Publication Data

US 2021/0284672 A1 Sep. 16, 2021

Related U.S. Application Data

(63) Continuation-in-part of application No. 17/016,928, filed on Sep. 10, 2020, now Pat. No. 11,832,510,
(Continued)

(51) Int. Cl.

| | |
|---|---|
| *C07F 15/00* | (2006.01) |
| *H10K 85/30* | (2023.01) |
| *H10K 99/00* | (2023.01) |

(52) U.S. Cl.
CPC ....... *C07F 15/0086* (2013.01); *H10K 85/346* (2023.02); *H10K 99/00* (2023.02)

(58) Field of Classification Search
CPC .............. C07F 15/0086; H10K 85/346; H10K 2101/10
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | |
|---|---|---|
| CN | 106117269 | 11/2016 |
| CN | 108299505 | 7/2018 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Sean M DeGuire
(74) *Attorney, Agent, or Firm* — DUANE MORRIS LLP

(57) ABSTRACT

Tetradentate platinum complexes including an imidazole/benzimidazole carbene having a structure of Formula I
(Continued)

Formula I

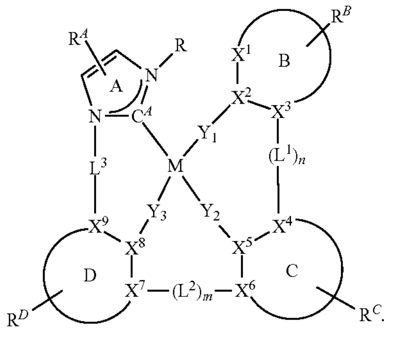

is disclosed. In Formula I, M is Pd or Pt. These platinum carbenes with the specific substituents disclosed herein are novel and provides phosphorescent emissive compounds that exhibit physical properties that can be tuned, such as sublimation temperature, emission color, and device stability.

20 Claims, 2 Drawing Sheets

Related U.S. Application Data which is a continuation-in-part of application No. 16/807,877, filed on Mar. 3, 2020, now Pat. No. 11,814,403, which is a continuation-in-part of application No. 16/718,355, filed on Dec. 18, 2019, now Pat. No. 11,802,136, which is a continuation-in-part of application No. 16/211,332, filed on Dec. 6, 2018, now Pat. No. 11,725,022, which is a continuation-in-part of application No. 15/967,732, filed on May 1, 2018, now Pat. No. 11,552,261.

(60) Provisional application No. 62/945,273, filed on Dec. 9, 2019, provisional application No. 62/898,219, filed on Sep. 10, 2019, provisional application No. 62/897,667, filed on Sep. 9, 2019, provisional application No. 62/859,919, filed on Jun. 11, 2019, provisional application No. 62/842,230, filed on May 2, 2019, provisional application No. 62/834,666, filed on Apr. 16, 2019, provisional application No. 62/823,922, filed on Mar. 26, 2019, provisional application No. 62/524,080, filed on Jun. 23, 2017, provisional application No. 62/524,086, filed on Jun. 23, 2017.

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
11,725,022 B2 * 8/2023 Chen .................. C07F 15/0086
11,802,136 B2 * 10/2023 Chen .................. C07F 15/0086
11,814,403 B2 * 11/2023 Chen .................. H10K 85/346
11,832,510 B2 * 11/2023 Chen .................. C09K 11/06
2002/0034656 A1 3/2002 Thompson et al.
2002/0134984 A1 9/2002 Igarashi
2002/0158242 A1 10/2002 Son et al.
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Prakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2012/0302753 A1 11/2012 Li
2013/0026909 A1 * 1/2013 Zeng .................. H10K 85/6574
313/504
2013/0306940 A1 11/2013 Zeng
2014/0027733 A1 1/2014 Zeng
2015/0104446 A1 * 4/2015 Polack ................. A61K 31/137
424/133.1
2015/0105556 A1 4/2015 Li
2015/0295189 A1 10/2015 Brooks
2015/0295190 A1 10/2015 Chen
2016/0072082 A1 3/2016 Brooks
2017/0183368 A1 6/2017 Hara
2018/0090691 A1 3/2018 Brooks
2018/0219161 A1 8/2018 Li
2018/0305384 A1 10/2018 Chen

(56) References Cited

U.S. PATENT DOCUMENTS

| | | | |
|---|---|---|---|
| 2018/0305385 | A1 | 10/2018 | Chen |
| 2018/0370978 | A1 | 12/2018 | Wolohan |
| 2018/0375036 | A1 | 12/2018 | Chen |
| 2019/0119312 | A1 | 4/2019 | Chen |
| 2020/0168811 | A1 | 5/2020 | Wolohan |
| 2021/0284672 | A1 | 9/2021 | Chen et al. |

FOREIGN PATENT DOCUMENTS

| | | |
|---|---|---|
| EP | 0650955 | 5/1995 |
| EP | 1725079 | 11/2006 |
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| JP | 2012-144455 | 8/2012 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2012/162488 | 11/2012 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2, N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

(56) References Cited

OTHER PUBLICATIONS

Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N^C^N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes Of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Fleetham, T., et al., "Efficient "Pure" Blue OLEDs Employing Tetradentate Pt Complexes with a Narrow Spectral Bandwidth," Adv. Mater., Nov. 2014, pp. 7116-7121, vol. 26, No. 41. DOI: 10.1002/adma.201401759.
Extended European Search Report dated Jun. 19, 2020 for corresponding EP Application No. 20165219.5.
Marie-Paule Van Den Eede et al: "Controlled Polymerization of a Cyclopentadithiophene-Phenylene Alternating Copolymer", Macromolecules, vol. 51, No. 21, Nov. 13, 2018 (Nov. 13, 2018), pp. 9043-9051, XP55702090, Washington, DC, United States ISSN: 0024-9297, DOI: 10.1021/acs.macromol.8b01820 *Figure 1 [Pd-PEPPSI-(Anisole)C12]*.
Joydev Dinda et al: ")-NHC", New Journal of Chemistry, vol. 37, No. 2, Jan. 1, 2013 (Jan. 1, 2013), pp. 431-438, XP55702144, GB ISSN: 1144-0546, DOI: 10.1039/C2NJ40740J *the whole document*.

* cited by examiner

ORGANIC ELECTROLUMINESCENT MATERIALS AND DEVICES

CROSS-REFERENCE TO RELATED APPLICATIONS

This application is a continuation-in-part application of U.S. patent application Ser. No. 17/016,928, filed on Sep. 10, 2020, which is a continuation-in-part application of U.S. patent application Ser. No. 16/807,877, filed on Mar. 3, 2020, which is a continuation-in-part application of U.S. patent application Ser. No. 16/718,355, filed Dec. 18, 2019, which claims priority under 35 U.S.C. § 119(e) to U.S. Provisional Applications No. 62/945,273, filed on Dec. 9, 2019, U.S. Pat. No. 62,898,219, filed on Sep. 10, 2019, U.S. Pat. No. 62,897,667, filed on Sep. 9, 2019, No. 62/859,919, filed on Jun. 11, 2019, No. 62/834,666, filed on Apr. 16, 2019, and No. 62/823,922, filed on Mar. 26, 2019, the entire contents of which are incorporated herein by reference. The U.S. patent application Ser. No. 16/718,355 is also a continuation-in-part of U.S. patent application Ser. No. 16/211,332, filed on Dec. 6, 2018, which is a continuation-in-part of U.S. patent application Ser. No. 15/967,732, filed on May 1, 2018, which claims priority under 35 U.S.C. § 119(e) to United States Provisional Applications No. 62/524,080, filed on Jun. 23, 2017, and No. 62/524,086, filed on Jun. 23, 2017, the entire contents of which are incorporated herein by reference. The U.S. patent application Ser. No. 16/807,877, filed on Mar. 3, 2020 also claims priority under 35 U.S.C. § 119(e) to U.S. Provisional Application No. 62/842,230, filed on May 2, 2019, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

The carbene carbon is chemically reactive and can potentially form a C—C bond with a neighboring group intra- and intermolecularly. This process can lead to compound degradation and shorten the OLED device lifetime. In this invention, a bulky group is introduced to prevent any close contacts intermolecularly between the carbene carbon and a host molecule. In the meanwhile, the introduced bulky group cannot sit too close to the carbene carbon to avoid intramolecular interaction. By incorporating these two criteria into complex design, there is a good possibility to achieve long device lifetime, especially for blue emitter.

Tetradentate platinum complexes comprising an imidazole/benzimidazole carbene are disclosed. These platinum carbenes with the specific substituents disclosed herein are novel and provides phosphorescent emissive compounds that exhibit physical properties that can be tuned, such as sublimation temperature, emission color, and device stability. These compounds are useful in OLED applications.

A compound of

Formula I

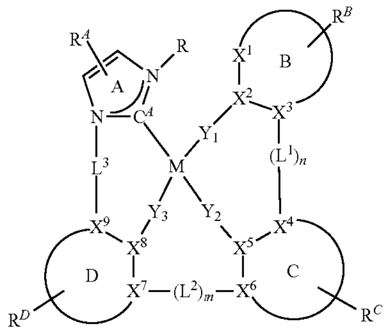

is disclosed. In Formula I, M is Pd or Pt; rings B, C, and D are each independently a 5-membered or 6-membered carbocyclic or heterocyclic ring; $X^1$ to $X^9$ are each independently C or N; $Y_1$ to $Y_3$ are each independently selected from the group consisting of a direct bond, O, and S; at least one of $Y_1$ to $Y_3$ is a direct bond; $C^A$ is a carbene carbon; $L^1$ to $L^3$ are each independently selected from the group consisting of a direct bond, O, S, CR'R", SiR'R", BR', and NR', alkyl, cycloalkyl, heteroalkyl, heterocycloalkyl, aryl, and heteroaryl; m and n are each independently 0 or 1; at least one of m and n is 1; at least one of R, $R^A$, $R^B$, $R^C$, $R^D$, $L^1$, $L^2$, and $L^3$ comprises a group having a structure of Formula II

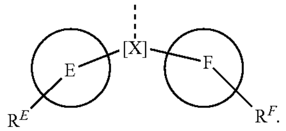

In Formula II, [X] is a 5-membered heterocyclic ring, 5-membered carbocyclic ring, a 6-membered heterocyclic ring, a 6-membered carbocyclic ring, or a fused heterocylic or carbocyclic ring system comprising two or more fused rings; and rings E and F are each independently a 5-membered or 6-membered carbocyclic or heterocyclic ring. In Formula I and Formula II, $R^A$, $R^B$, $R^C$, $R^D$, $R^E$, and $R^F$ each independently represents mono the maximum allowable substitutions, or no substitution; each R, R', R", $R^A$, $R^B$, $R^C$, $R^D$, $R^E$, and $R^F$ is independently a hydrogen or a substituent selected from the group consisting of the general substituents defined herein; any adjacent substituents can be joined or fused into a ring; R and an $R^B$ substituent can be joined to form a ring; and the molecular weight of the group having a structure of Formula II is greater than or equal to 395 grams/mole.

In another embodiment, a compound comprising a structure selected from the group consisting of:

Formula V

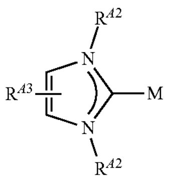

and

Formula VI

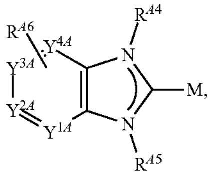

where,

M is selected from the group consisting of Os, Pd, Pt, Ir, Cu, and Au;

at least one of $R^{A1}$, $R^{A2}$, $R^{A4}$, $R^{A5}$, or $R^{A6}$ is a structure of Formula VII

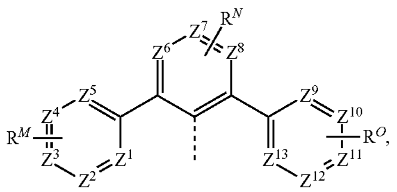

Formula VIII

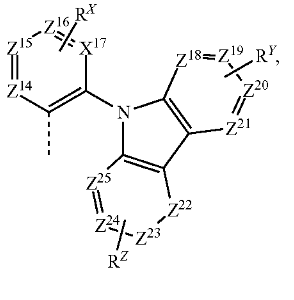

or

-continued

Furmula IX

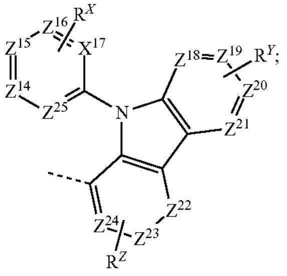

$Y^{1A}$ to $Y^{4A}$ are each independently C or N;

no more than two of $Y^{1A}$ to $Y^{4A}$ are N;

$Z^1$ to $Z^{25}$ are each independently C or N;

three consecutive $Z^1$ to $Z^{21}$ in the same ring cannot be N;

$R^{A5}$, $R^{A6}$, $R^M$, $R^N$, $R^O$, $R^X$, $R^Y$, and $R^Z$ each independently represents mono to the maximum allowable substitutions, or no substitution;

each $R^{A1}$, $R^{A2}$, $R^{A3}$, $R^{A4}$, $R^{A5}$, $R^{A6}$, $R^M$, $R^N$, $R^O$, $R^X$, $R^Y$, and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof;

M can be coordinated to other ligands;

any two adjacent substituents can be joined or fused to form a ring; and provided that when the compound is of Formula V, and one of $R^{A1}$ and $R^{A2}$ is Formula VII, then at least one of $R^M$, $R^N$, and $R^O$ is selected from the group consisting of deuterium, alkyl, cycloalkyl, heteroalkyl, heterocycloalkyl, aryl, heteroaryl, and combinations thereof.

An OLED comprising at least one of the compounds of the present disclosure in an organic layer therein is also disclosed.

A consumer product comprising such OLED is also disclosed.

DETAILED DESCRIPTION

A. Terminology

Figure 1:
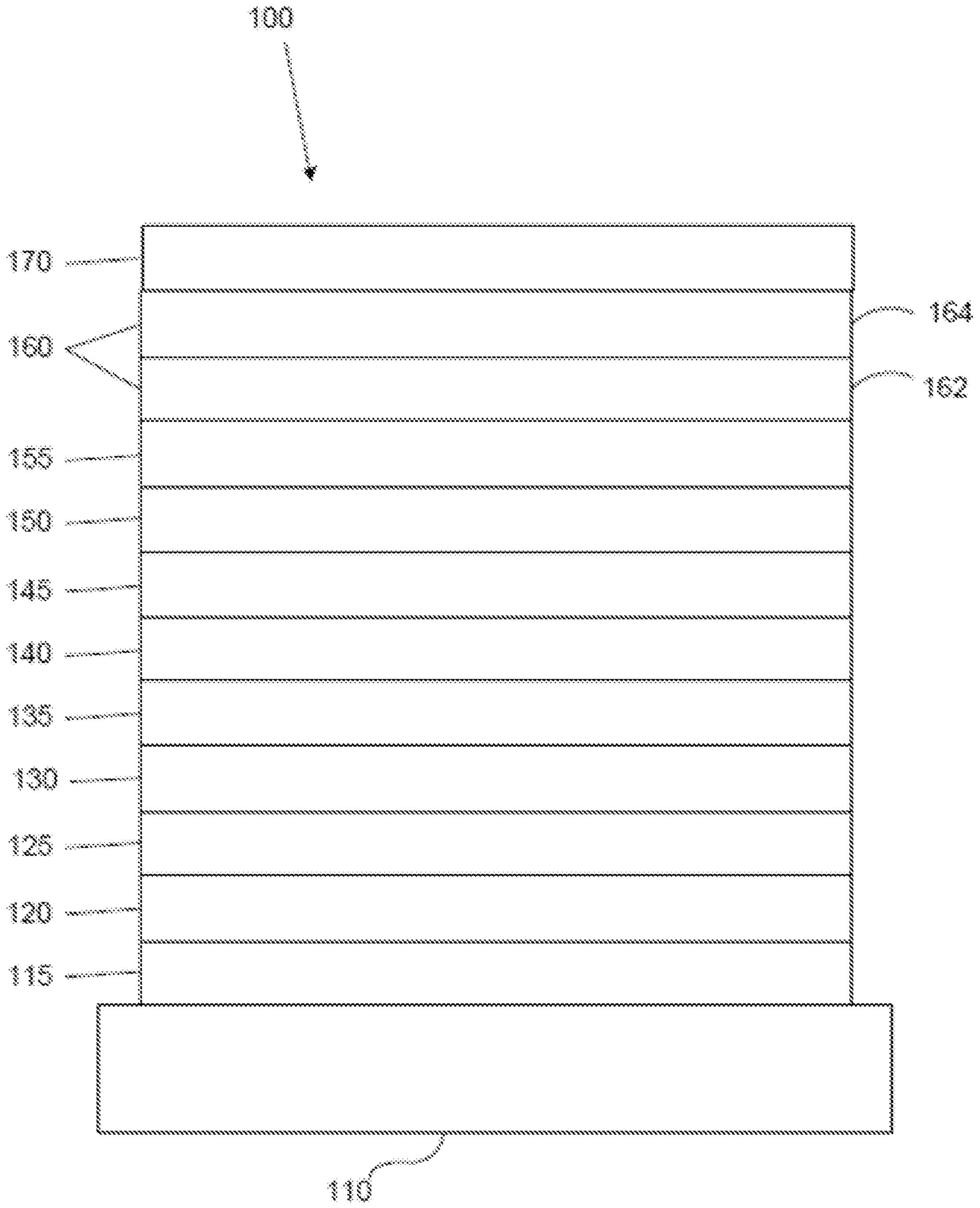
FIG. 1 shows an organic light emitting device.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The term "sulfinyl" refers to a $—S(O)—R_s$ radical.

The term "sulfonyl" refers to a $—SO_2—R_s$ radical.

The term "phosphino" refers to a $—P(R_s)_3$ radical, wherein each $R_s$ can be same or different.

The term "silyl" refers to a $—Si(R_s)_3$ radical, wherein each $R_s$ can be same or different.

The term "boryl" refers to a $—B(R_s)_2$ radical or its Lewis adduct $—B(R_s)_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, 0, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof.

In some instances, the more preferred general substituents are selected from the group consisting of deuterium, fluorine, alkyl, cycloalkyl, alkoxy, aryloxy, amino, silyl, boryl, aryl, heteroaryl, sulfanyl, and combinations thereof.

In yet other instances, the most preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (Reviews) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

B. The Compounds of the Present Disclosure

Provided is a compound of

Formula I

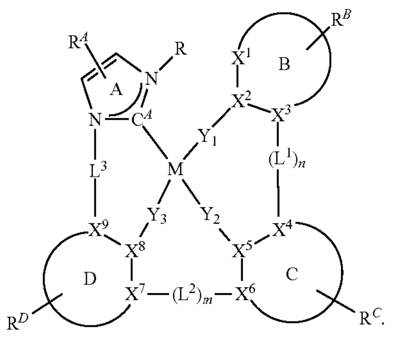

In Formula I, M is Pd or Pt; rings B, C, and D are each independently a 5-membered or 6-membered carbocyclic or heterocyclic ring; $X^1$ to $X^9$ are each independently C or N; $Y_1$ to $Y_3$ are each independently selected from the group consisting of a direct bond, O, and S; at least one of $Y_1$ to $Y_3$ is a direct bond; $C^A$ is a carbene carbon; $L^1$ to $L^3$ are each independently selected from the group consisting of a direct bond, O, S, CR'R", SiR'R", BR', and NR', alkyl, cycloalkyl, heteroalkyl, heterocycloalkyl, aryl, and heteroaryl; m and n are each independently 0 or 1; at least one of m and n is 1. In some embodiments at least one of R, $R^A$, $R^B$, $R^C$, $R^D$, $L^1$, $L^2$, and $L^3$ Comprises a group having a structure of Formula II

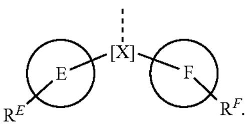

In Formula II, [X] is a 5-membered heterocyclic ring, 5-membered carbocyclic ring, a 6-membered heterocyclic ring, a 6-membered carbocyclic ring, or a fused heterocylic or carbocyclic ring system comprising two or more fused rings; and rings E and F are each independently a 5-membered or 6-membered carbocyclic or heterocyclic ring. In Formula I and Formula II, $R^A$, $R^B$, $R^C$, $R^D$, $R^E$, and $R^F$ each independently represents mono the maximum allowable substitutions, or no substitution; each R, R', R", $R^A$, $R^B$, $R^C$, $R^D$, $R^E$, and $R^F$ is independently a hydrogen or a substituent selected from the group consisting of the general substituents defined herein; any adjacent substituents can be joined or fused into a ring; R and an $R^B$ substituent can be joined to form a ring; and the molecular weight of the group having a structure of Formula II is greater than or equal to 395 grams/mole. In some embodiments, at least one of R, $R^A$, $R^B$, $R^C$, $R^D$, $L^1$, $L^2$, and $L^3$ comprises a chemical group containing at least three 6-membered aromatic rings that are not fused next to each other, each R, $R^A$, $R^B$, $R^C$, and $R^D$ is independently a hydrogen or a substituent selected from the group consisting of the general substituents defined herein; any adjacent substituents can be joined or fused into a ring. In some embodiments, at least one of R, $R^A$, $R^B$, $R^C$, $R^D$, $L^1$, $L^2$, and $L^3$ comprises a chemical group containing at least four 6-membered aromatic rings that are not fused next to each other. In some embodiments, at least one of R, $R^A$, $R^B$, $R^C$, $R^D$, $L^1$, $L^2$, and $L^3$ comprises a chemical group containing at least five 6-membered aromatic rings that are not fused next to each other. In some embodiments, at least one of R, $R^A$, $R^B$, $R^C$, $R^D$, $L^1$, $L^2$, and $L^3$ comprises a chemical group containing at least six 6-membered aromatic rings that are not fused next to each other. In some embodiments, at least two of R, $R^A$, $R^B$, $R^C$, $R^D$, $L^1$, $L^2$, and $L^3$ comprises a chemical group containing at least three 6-membered aromatic rings that are not fused next to each other.

In some embodiments of the compound, each R, R', R", $R^A$, $R^B$, $R^C$, $R^D$, $R^E$, and $R^F$ is independently a hydrogen or a substituent selected from the group consisting of the preferred general substituents defined herein.

In some embodiments of the compound, the closest calculated intramolecular contact between the carbene carbon $C^A$ and the next nearest closest non-hydrogen atomic position of any substituent group on the ring A excluding the heavy atom of any substituent R directly attached to the N of ring A in the compound at 0 K is greater than or equal to 2.70 Å. The structure of the compound used to measure this distance was derived from the ground state geometry of the molecular structure calculated using Gaussian 09, Revision D.01 with the B3LYP functional applying the Grimme dispersion correction, a 6-31G* basis set for host structures and CEP-31G for emitter structures. This was after performing a systematic torsional sampling of the conformational space of the molecular structure using Maestro, Release 2019-1 from Schrödinger, LLC, with the OPLS3e forcefield.

The lowest energy conformer was used as input for the ground state B3LYP calculation described above.

The ground state molecular structure of the platinum emitter, from the Gaussian calculation, was used to measure the closest intramolecular contact between the carbene carbon, $C^A$, and the next nearest closest non-hydrogen atomic position of any substituent group on the ring A excluding the heavy atom of any substituent R directly attached to of the N of ring A, in units of Angstrom.

In some embodiments, the closest calculated intermolecular distance between the carbene carbon $C^A$ and a non-hydrogen atom in a compound of Formula III or Formula IV, shown below, in an amorphous film configuration at 0 K is greater than or equal to 2.70 Å. To measure the equivalent intermolecular close contact, it is necessary to find low energy bimolecular pairs between host like molecules, compounds of Formula III and Formula IV, and the emitter itself that will occur in the emissive layer of an OLED device. To model the most favorable low energy pairwise structures the following procedure was used. The ground state B3LYP structures served as input for a Metropolis Monte Carlo simulated annealing sampling of molecular pairs using BIOVIA Materials Studio, Release 18.1, with the Adsorption Locator tool. In each Monte Carlo simulation, the Universal forcefield was used while electrostatic interactions were described by extracting the Hirshfeld charges fitted to the dipole moment from a single point DMol3 calculation with the PBE functional, employing a DNP basis set. A total number of 10 heating cycles were used for each simulation and 500,000 molecular pair configurations were sampled at each cycle using automated temperature control. From each intermolecular pair simulation, the lowest 50 pairs were returned. Of these pairs those within 1 kcal/mol of the lowest pair were examined for the closest intermolecular contact between the carbene carbon of the emitter, $C^A$, and next nearest non-hydrogen closest atomic position, in units of Angstrom. Formula III and Formula IV are shown below:

Formula III

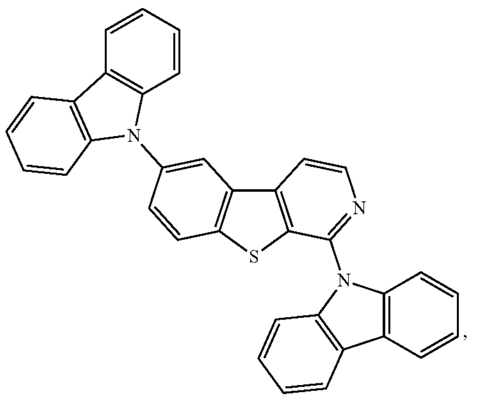

Formula IV

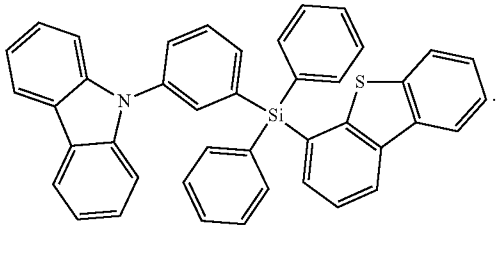

In some embodiments of the compound, rings B, C, and D are each 6-membered aromatic rings. In some embodiments, ring B is a pyridine ring.

In some embodiments of the compound, $L^1$ is a direct bond. In some embodiments, $L^3$ is a direct bond. In some embodiments, $L^2$ is O.

In some embodiments of the compound, $R^A$ comprises a group having a structure of Formula II. In some embodiments, $R^D$ comprises a group having a structure of Formula II.

In some embodiments of the compound, [X] comprises a benzene ring. In some embodiments, [X] comprises carbazole.

In some embodiments of the compound, $Y_1$ to $Y_3$ are each a direct bond. In some embodiments, one of $Y_1$ to $Y_3$ is O, and the remainder are direct bonds. In some embodiments, one of $X^2$, $X^5$, and $X^8$ is N, and the others are C. In some embodiments, $X^2$ is N, $X^1$ is C, and $X^3$ to $X^9$ are each C.

In some embodiments of the compound, the closest calculated intramolecular contact between the carbene carbon $C^A$ and any other non-hydrogen atom in the compound at 0 K is greater than or equal to 2.90 Å. In some embodiments, the closest calculated intramolecular contact between the carbene carbon $C^A$ and any other non-hydrogen atom in the compound at 0 K is greater than or equal to 2.90 Å. In some embodiments, the closest calculated intramolecular contact between the carbene carbon $C^A$ and any other non-hydrogen atom in the compound at 0 K is greater than or equal to 3.00 Å. In some embodiments, the closest calculated intramolecular contact between the carbene carbon $C^A$ and any other non-hydrogen atom in the compound at 0 K is greater than or equal to 3.10 Å.

In some embodiments of the compound, the closest calculated intermolecular distance between the carbene carbon $C^A$ and a non-hydrogen atom in a compound of Formula III or Formula IV in an amorphous film at 0 K is greater than or equal to 2.80 Å. In some embodiments, the closest calculated intermolecular distance between the carbene carbon $C^A$ and a non-hydrogen atom in a compound of Formula III or Formula IV in an amorphous film at 0 K is greater than or equal to 2.90 Å. In some embodiments, the closest calculated intermolecular distance between the carbene carbon $C^A$ and a non-hydrogen atom in a compound of Formula III or Formula IV in an amorphous film at OK is greater than or equal to 3.00 Å. In some embodiments, the closest calculated intermolecular distance between the carbene carbon $C^A$ and a non-hydrogen atom in a compound of Formula III or Formula IV in an amorphous film at 0 K is greater than or equal to 3.10 Å.

In some embodiments of the compound, M is Pt.

In some embodiments of the compound, the group having a structure of Formula II is selected from the group consisting of:

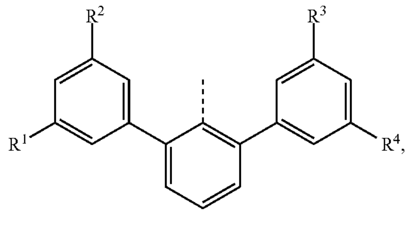

-continued
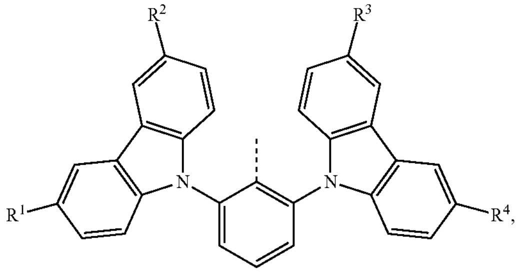
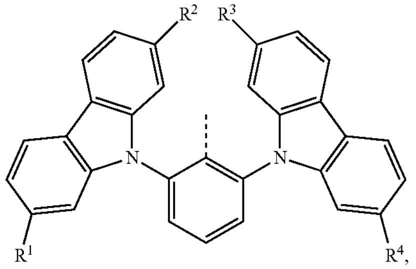
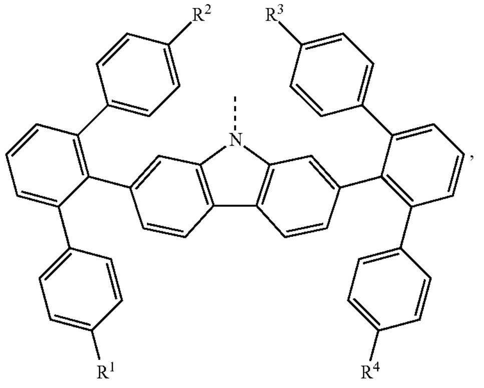
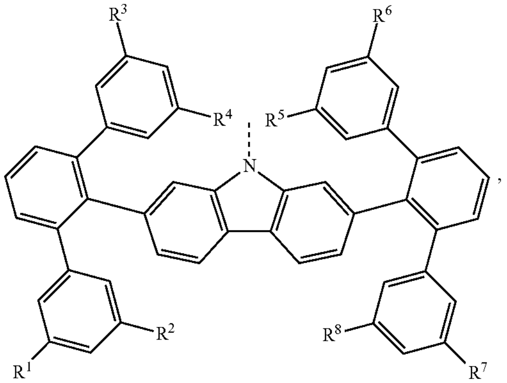
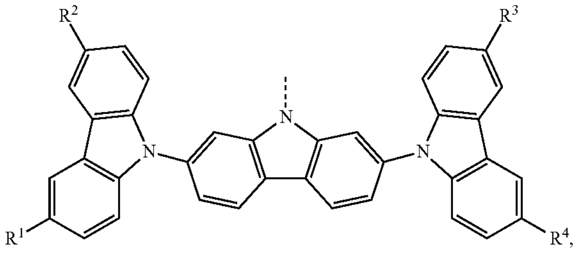
-continued
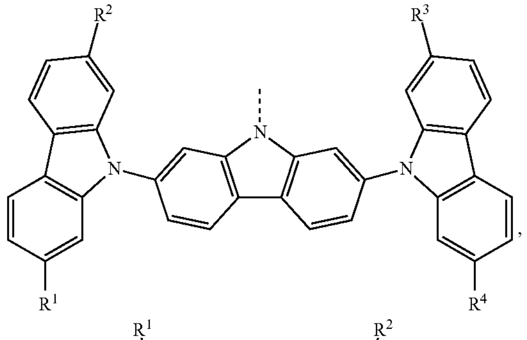
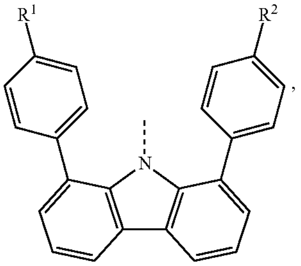
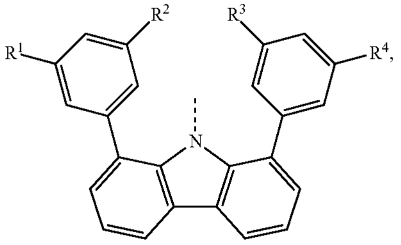
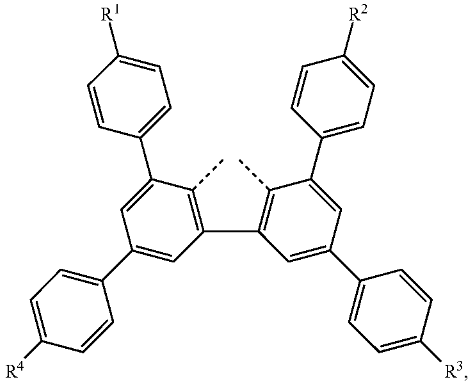
and
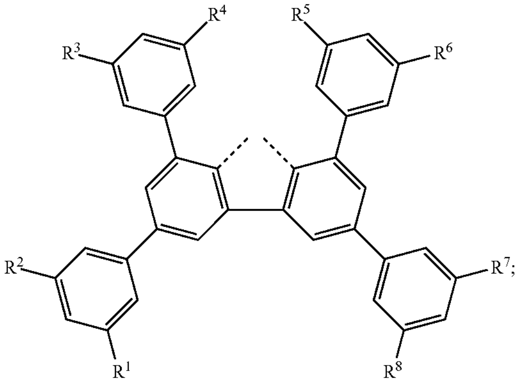
and where each $R^1$ to $R^8$ is independently selected from the group consisting of hydrogen, deuterium, alkyl, cycloalkyl, heteroalkyl, heterocycloalkyl, aryl, heteroaryl, and combinations thereof.

In some embodiments of the compound, the compound of Formula I is selected from the group consisting of:
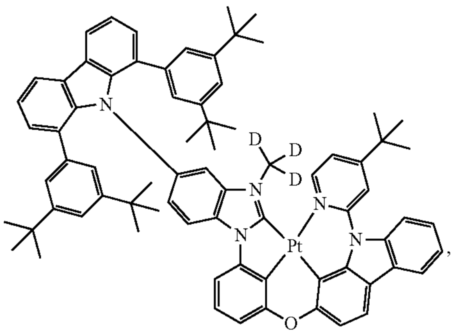
,
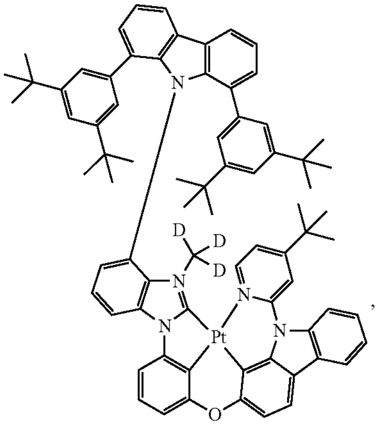
,
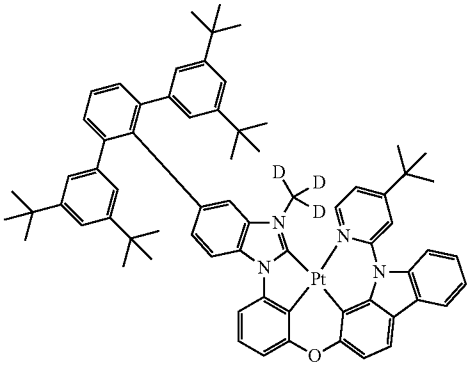
,
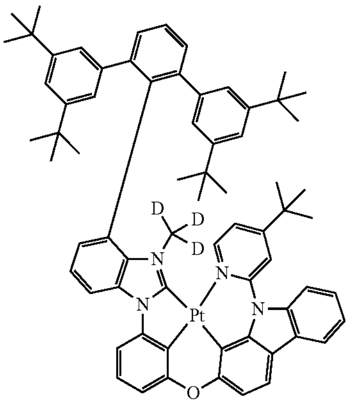
,
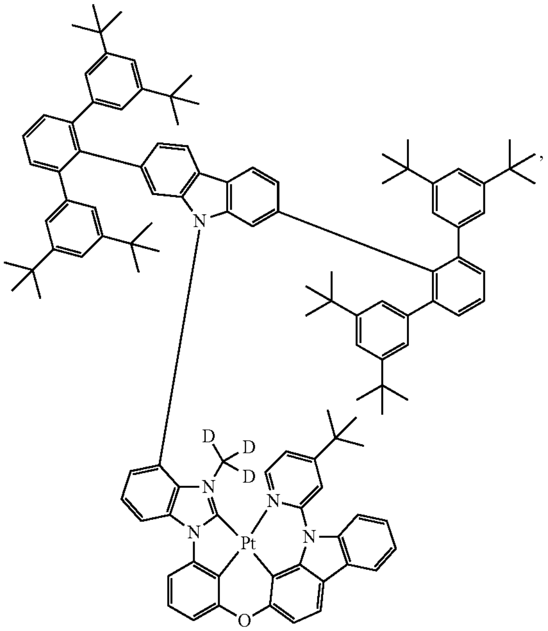
,
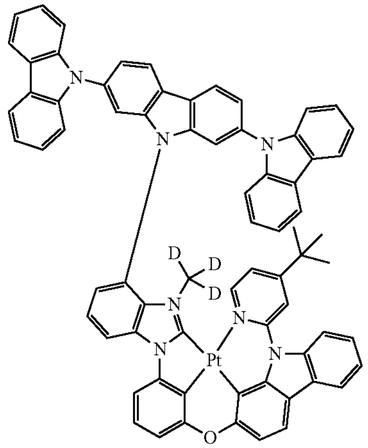
, -continued
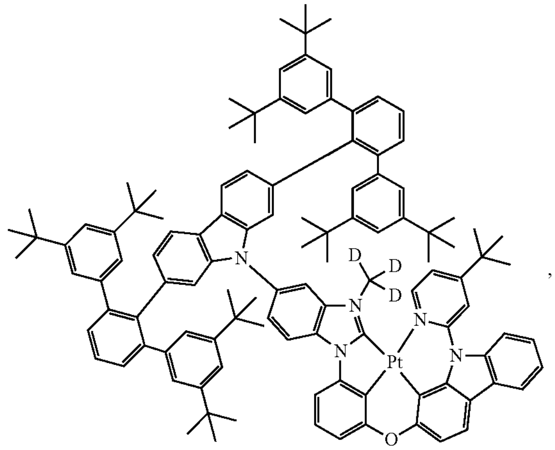
,
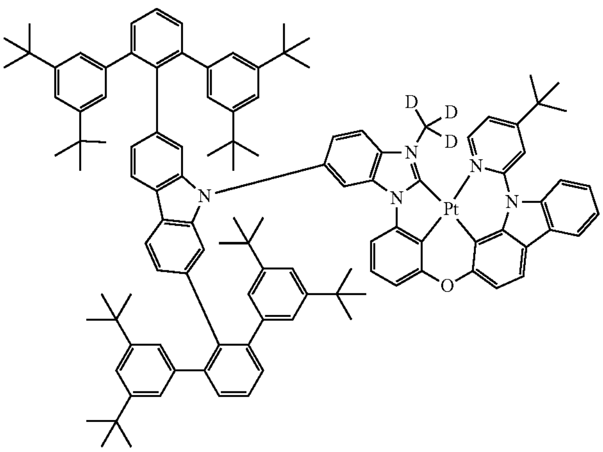
, and
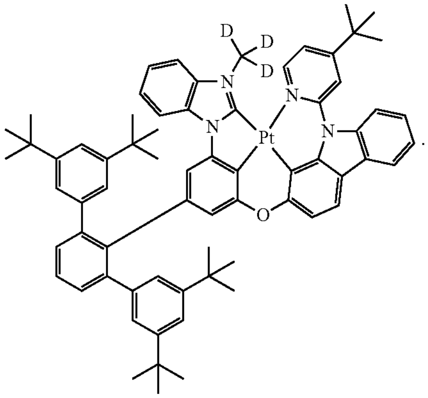
.
A compound comprising a structure selected from the group consisting of
Formula V
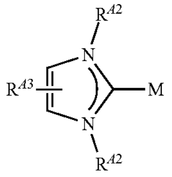
and
Formula VI
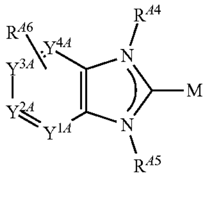
Formula VII
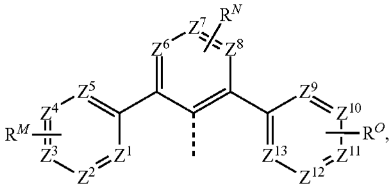
Formula VIII
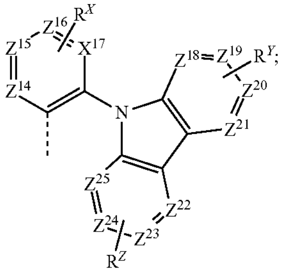
or
is disclosed; wherein, M is selected from the group consisting of Os, Pd, Pt, Ir, Cu, and Au. In some embodiments, at least one of $R^{A1}$, $R^{A2}$, $R^{A4}$, $R^{A5}$, or $R^{A6}$ is a structure of -continued Furmula IX

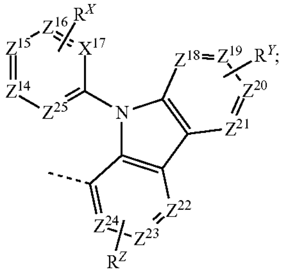

where $Y^{1A}$ to $Y^{4A}$ are each independently C or N; no more than two of $Y^{1A}$ to $Y^{4A}$ are N; $Z^1$ to $Z^{25}$ are each independently C or N; three consecutive $Z^1$ to $Z^{25}$ in the same ring cannot be N; $R^{A3}$, $R^{A6}$, $R^M$, $R^N$, $R^O$, $R^X$, $R^Y$, and $R^Z$ each independently represent mono to the maximum allowable substitutions, or no substitution; each $R^{A1}$, $R^{A2}$, $R^{A3}$, $R^{A4}$, $R^{A5}$, $R^{A6}$, $R^M$, $R^N$, $R^O$, $R^X$, $R^Y$, and $R^Z$ is independently a hydrogen or a substituent selected from the group consisting of the general substituents defined herein; M can be coordinated to other ligands; any two substituents can be joined or fused to form a ring; and provided that when the compound is Formula V, and one of $R^{A1}$ and $R^{A2}$ is Formula VII, then at least one of $R^M$, $R^N$, and $R^O$ is selected from the group consisting of deuterium, alkyl, cycloalkyl, heteroalkyl, heterocycloalkyl, aryl, heteroaryl, and combinations thereof. In some embodiments, only at least one of $R^{A1}$ and $R^{A2}$ in Formula V can be a structure of Formula VII, Formula VIII, or Formula IX. In some embodiments, only at least one of $R^{A4}$ and $R^{A5}$ in Formula VI can be a structure of Formula VII, Formula VIII, or Formula IX.

In some embodiments of the compound having the structure selected from the group consisting of Formula V or Formula VI as defined above, at least one of $R^{A1}$, $R^{A2}$, $R^{A4}$, $R^{A5}$, or $R^{A6}$ comprises a chemical group containing at least three 6-membered aromatic rings that are not fused next to each other, each $R^{A1}$, $R^{A2}$, $R^{A3}$, $R^{A4}$, $R^{A5}$, and $R^{A6}$ is independently a hydrogen or a substituent selected from the group consisting of the general substituents defined herein, any adjacent substituents can be joined or fused into a ring. In some embodiments, at least one of $R^{A1}$, $R^{A2}$, $R^{A4}$, $R^{A5}$, or $R^{A6}$ comprises a chemical group containing at least four 6-membered aromatic rings that are not fused next to each other. In some embodiments, at least one of $R^{A1}$, $R^{A2}$, $R^{A4}$, $R^{A5}$, or $R^{A6}$ comprises a chemical group containing at least five 6-membered aromatic rings that are not fused next to each other. In some embodiments, at least one of $R^{A1}$, $R^{A2}$, $R^{A4}$, $R^{A5}$, or $R^{A6}$ comprises a chemical group containing at least six 6-membered aromatic rings that are not fused next to each other. In some embodiments, at least two of $R^{A1}$, $R^{A2}$, $R^{A4}$, $R^{A5}$, or $R^{A6}$ comprises a chemical group containing at least three 6-membered aromatic rings that are not fused next to each other.

In some embodiments of the compound having the structure of Formula V or Formula VI as defined above, each $R^{A1}$, $R^{A2}$, $R^{A3}$, $R^{A4}$, $R^{A5}$, $R^{A6}$, $R^M$, $R^N$, $R^O$, $R^X$, $R^Y$, and $R^Z$ is independently a hydrogen or a substituent selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof. In some embodiments, M is coordinated to at least one monoanionic bidentate ligand. In some embodiments, $Y^{1A}$ to $Y^{4A}$ are each C. In some embodiments, $Z^1$ to $Z^{13}$ are each C. In some embodiments, at least one of $Z^1$ to $Z^{13}$ is N.

In some embodiments of the compound having the structure of Formula V or Formula VI as defined above, at least one of $R^M$, $R^N$, and $R^O$ is a secondary or tertiary alkyl group. In some embodiments, at least one of $R^M$, $R^N$, and $R^O$ is a fully or partially deuterated of alkyl, cycloalkyl, heteroalkyl, heterocycloalkyl, aryl, heteroaryl group, and combinations thereof. In some embodiments, at $Z^{14}$ to $Z^{25}$ are each C. In some embodiments, at least one of $Z^{14}$ to $Z^{25}$ is N. In some embodiments, at least one $R^X$ is selected from the group consisting of alkyl, cycloalkyl, heteroalkyl, heterocycloalkyl, aryl, heteroaryl, and combinations thereof. In some embodiments, M is four-coordinate. In some embodiments, M is six-coordinate.

In some embodiments of the compound having the structure of Formula V or Formula VI as defined above, at least one of $R^{A1}$ and $R^{A2}$ in Formula V, or at least one of $R^{A4}$ and $R^{A5}$ in Formula VI, is linked with other ligands to comprise a bidentate, tridentate, tetradentate, pentadentate, or hexadentate ligand. In some embodiments, M is Pd, Pt, or Ir. In some embodiments, at least one of $R^{A1}$, $R^{A2}$, $R^{A4}$, $R^{A5}$, or $R^{A6}$ is selected from the group consisting of:

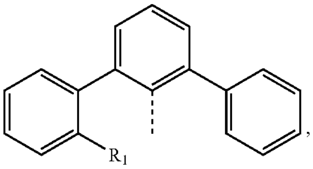
,
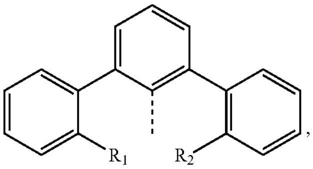
,
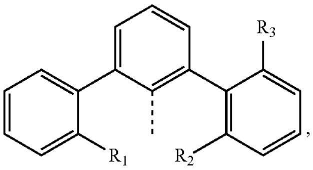
,
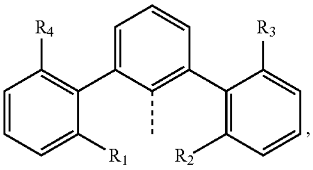
,
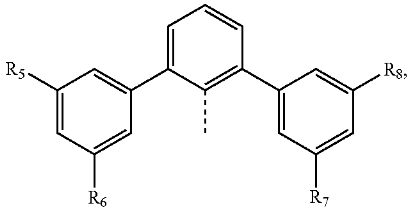

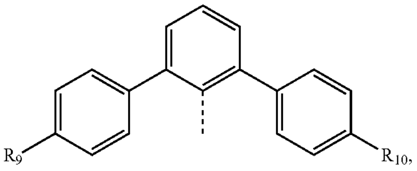

-continued

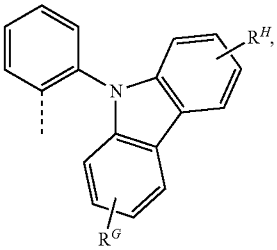

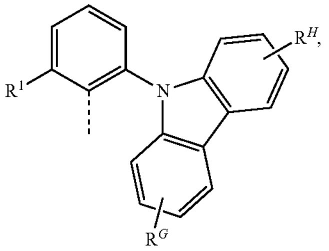

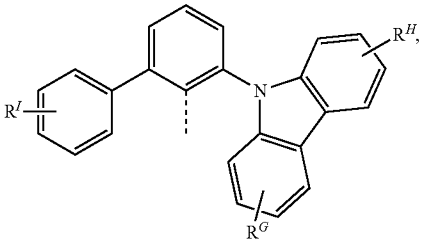

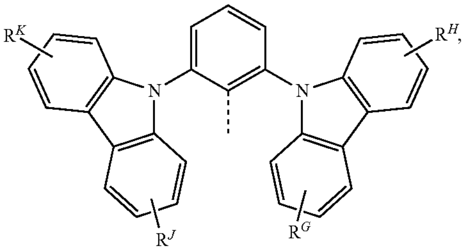

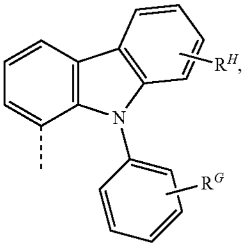

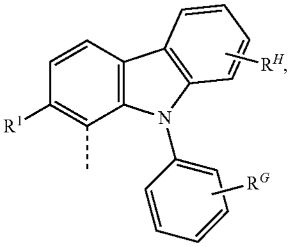

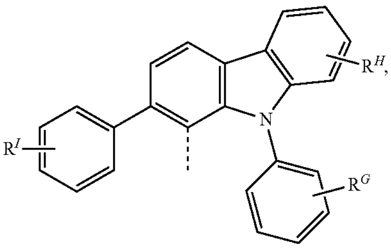

-continued

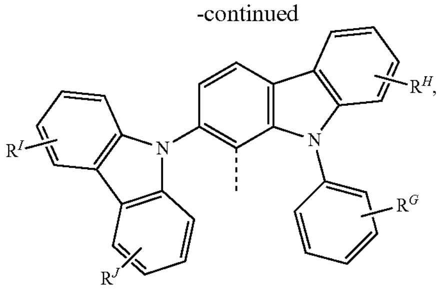

and

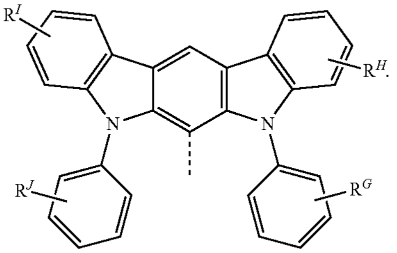

In some embodiments of the compound having the structure of Formula V or Formula VI as defined above, M is Ir, Pt, or Pd and the compound comprises a ligand $L_A$, that is coordinated to M, selected from the group consisting of Formula IX

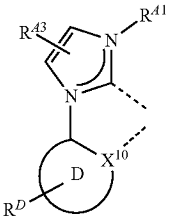

and

Formula X

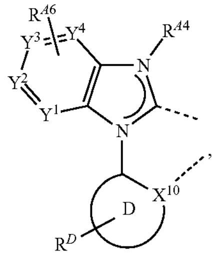

where, ring D is a 5-membered or 6-membered carbocyclic or heterocyclic ring; $R^D$ represents mono to the maximum number of allowable substitutions, or no substitution; each $R^D$ is hydrogen or or a substituent selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof; and any two substituents can be joined or fused to form a ring. In some embodiments of the compound that comprises a ligand $L_A$ selected from the group consisting of Formula IX and Formula X as defined above, ring D is a 6-membered aromatic ring. In some embodiments, $X^8$ is C. In some embodiments, each $R^{A3}$ and $R^{A6}$ is independently selected from the group consisting of hydrogen, deuterium, alkyl, cycloalkyl, heteroalkyl, heterocycloalkyl, aryl, heteroaryl, and combinations thereof. In some embodiments, $R^{A1}$ and $R^{A4}$ are independently selected from the group consisting of alkyl, cycloalkyl, heteroalkyl, heterocycloalkyl, aryl, heteroaryl, and combinations thereof. In some embodiments, $R^{A1}$ and $R^{A4}$ are each independently selected from the group consisting of Formula VII, Formula VIII, and Formula IX, defined above.
In some embodiments, the ligand $L_A$ is selected from the group consisting of:
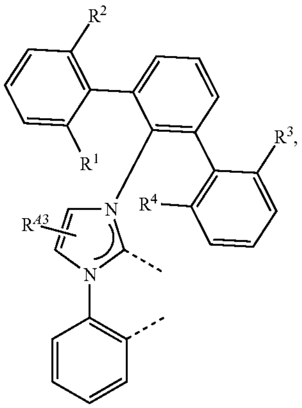
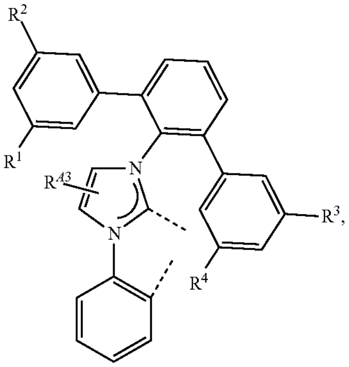
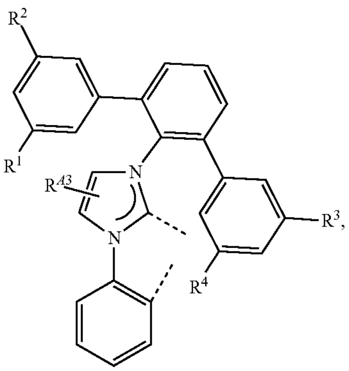
-continued
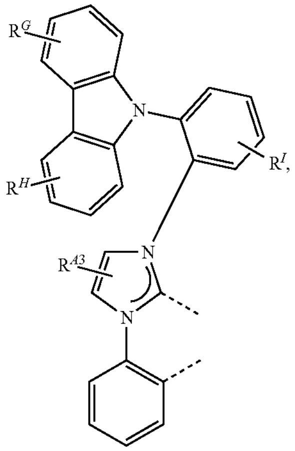
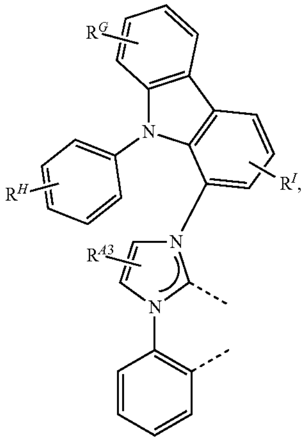
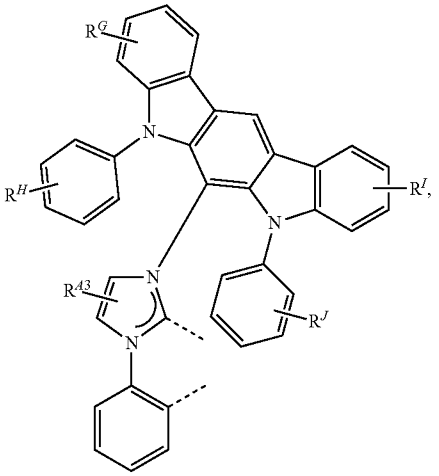
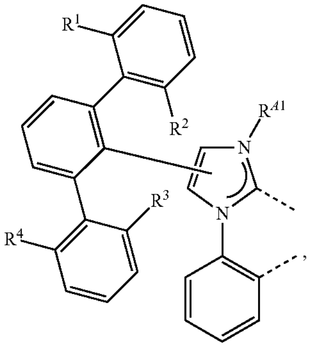

-continued
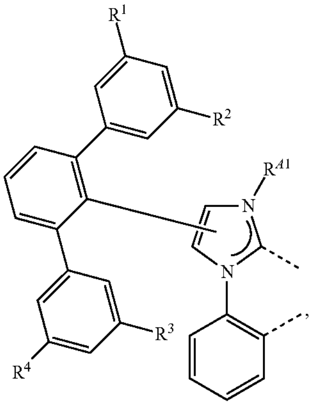
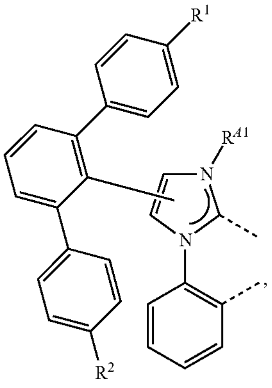
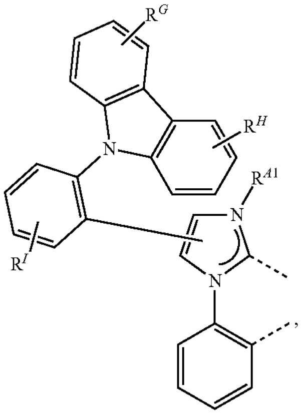
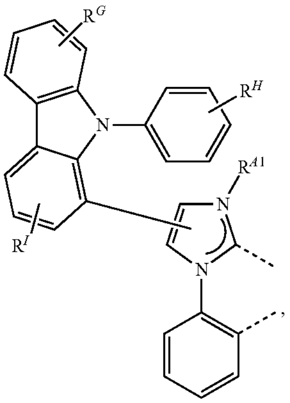
-continued
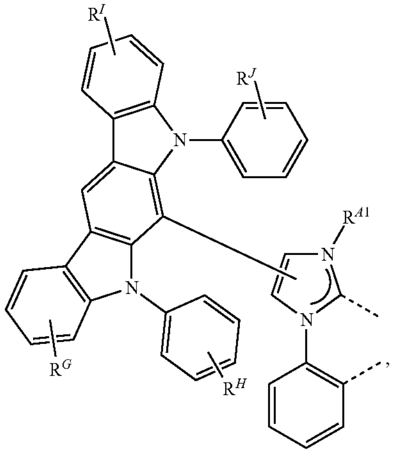
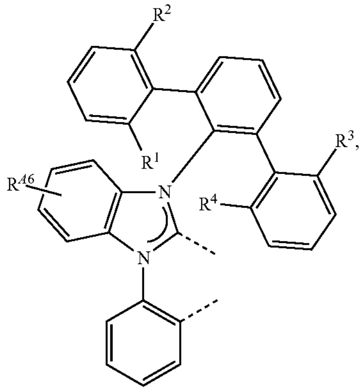
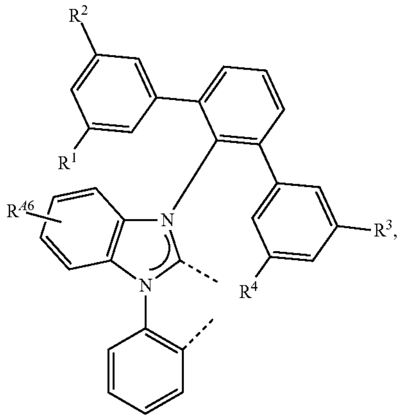
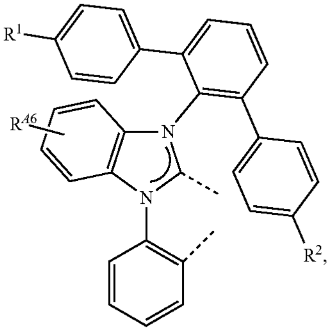

-continued
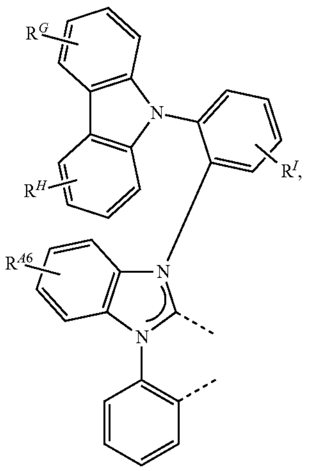
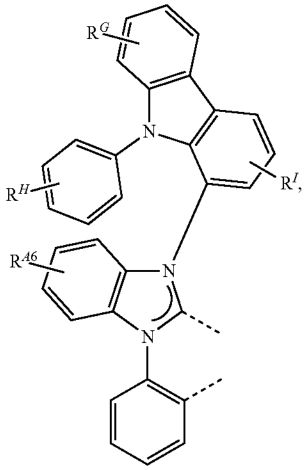
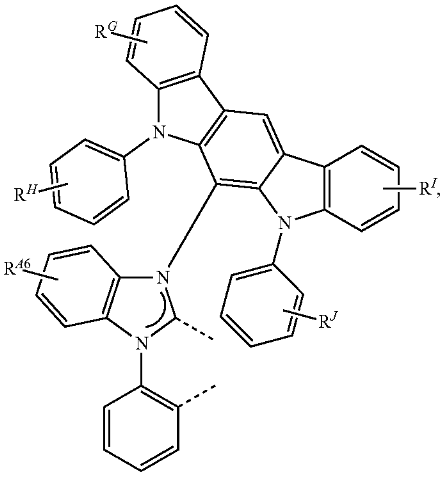
-continued
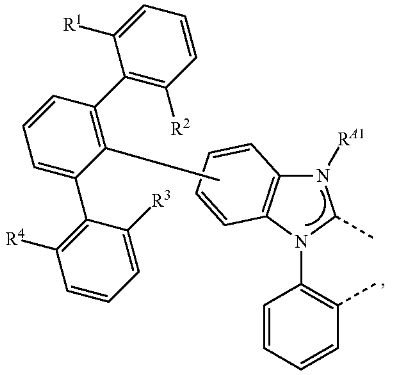
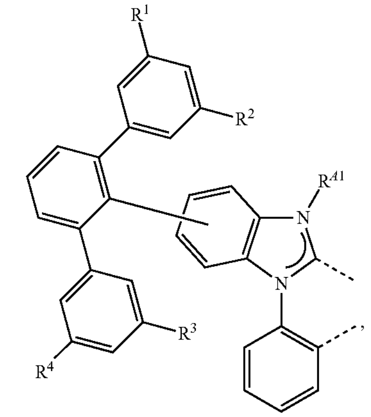
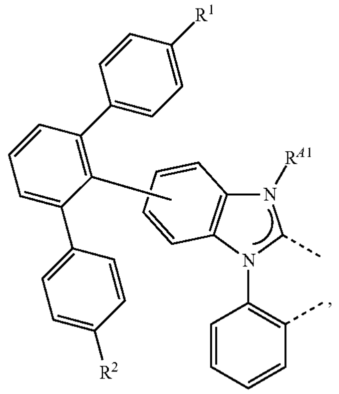
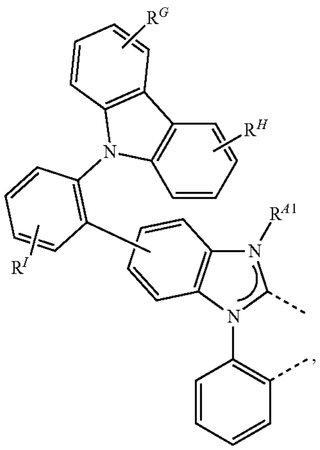

-continued

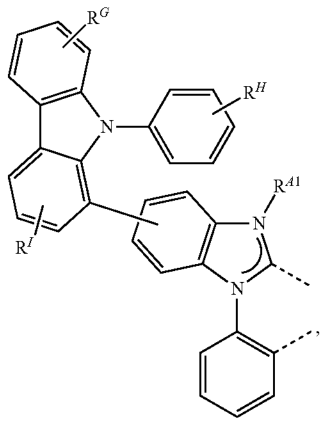

-continued

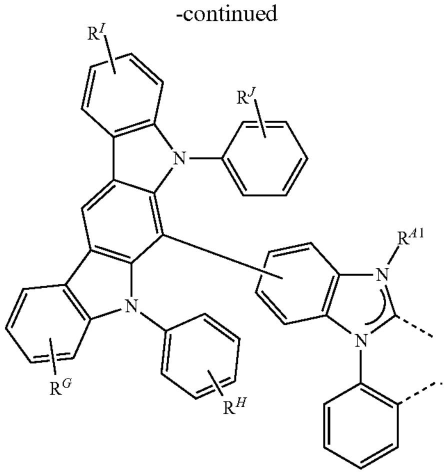

In some embodiments of the compound that comprises a ligand $L_A$ selected from the group consisting of Formula IX and Formula X as defined above, the ligand $L_A$ is selected from the group consisting of $L_{A1}$ to $L_{A2438910}$ that are defined as follows:

| $L_{Ai}$ | Structure of $L_{Ai}$ | $Ar^1$, R | i |
|---|---|---|---|
| wherein $L_{A1}$ to $L_{A110405}$ have the structure | 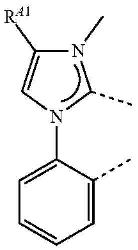 | wherein $R^{A1}$ = Rj, wherein j is an integer from 1 to 110405, and | i = j |
| wherein $L_{A110406}$-$L_{A220810}$ have the structure | 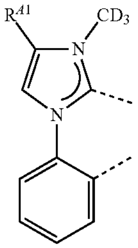 | wherein $R^{A1}$ = Rj, wherein j is an integer from 1 to 110405, and | i = j + 110405 |
| wherein $L_{A220811}$-$L_{A331215}$ have the structure | 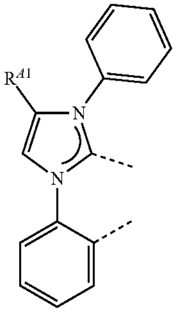 | wherein $R^{A1}$ = Rj, wherein j is an integer from 1 to 110405, and | i = j + 220810 |

-continued

| $L_{Ai}$ | Structure of $L_{Ai}$ | $Ar^1$, R | i |
|---|---|---|---|
| wherein $L_{A331216}$-$L_{A441620}$ have the structure | 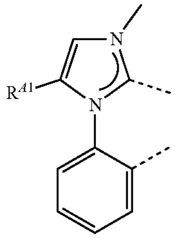 | wherein $R^{A1}$ = Rj, wherein j is an integer from 1 to 110405, and | i = j + 331215 |
| wherein $L_{A441621}$-$L_{A552025}$ have the structure | 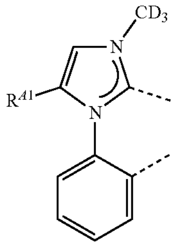 | wherein $R^{A1}$ = Rj, $R^{A2}$ = Rk wherein j and k are an integer from 1 to 110405, and | i = j + 441620 |
| wherein $L_{A552026}$-$L_{A662430}$ have the structure | 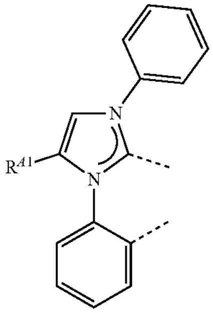 | wherein $R^{A1}$ = Rj, wherein j is an integer from 1 to 110405, and | i = j + 552025 |
| wherein $L_{A662431}$-$L_{A772835}$ have the structure | 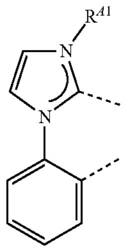 | wherein $R^{A1}$ = Rj, wherein j is an integer from 1 to 110405, and | i = j + 662430 |
| wherein $L_{A772836}$-$L_{A883240}$ have the structure | 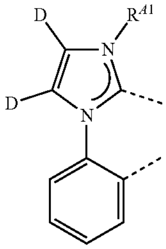 | wherein $R^{A1}$ = Rj, wherein j is an integer from 1 to 110405, and | i = j + 772835 |
| wherein $L_{A883241}$-$L_{A993645}$ have the structure | 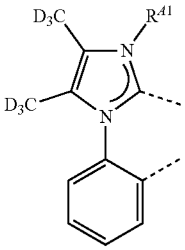 | wherein $R^{A1}$ = Rj, wherein j is an integer from 1 to 110405, and | i = j + 883240 |

-continued

| $L_{Ai}$ | Structure of $L_{Ai}$ | $Ar^1$, R | i |
|---|---|---|---|
| wherein $L_{A993646}$-$L_{A1104050}$ have the structure | 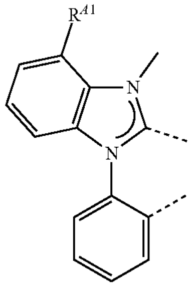 | wherein $R^{A1}$ = Rj, wherein j is an integer from 1 to 110405, and | i = j + 993645 |
| wherein $L_{A1104051}$-$L_{A1214455}$ have the structure | 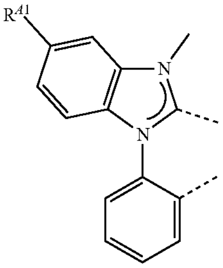 | wherein $R^{A1}$ = Rj, wherein j is an integer from 1 to 110405, and | i = j + 1104050 |
| wherein $L_{A1214456}$-$L_{A1324860}$ have the structure | 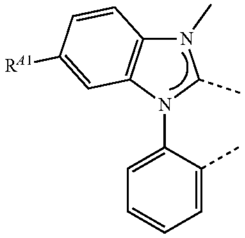 | wherein $R^{A1}$ = Rj, wherein j is an integer from 1 to 110405, and | i = j + 1214455 |
| wherein $L_{A1324861}$-$L_{A1435265}$ have the structure | 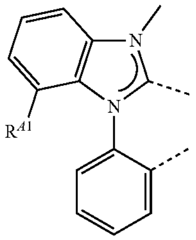 | wherein $R^{A1}$ = Rj, wherein j is an integer from 1 to 110405, and | i = j + 1324860 |
| wherein $L_{A1435266}$-$L_{A1545670}$ have the structure | 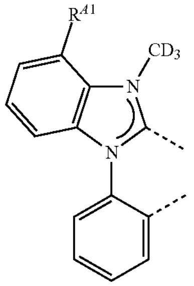 | wherein $R^{A1}$ = Rj, wherein j is an integer from 1 to 110405, and | i = j + 1435265 |

-continued

| $L_{Ai}$ | Structure of $L_{Ai}$ | $Ar^1$, R | i |
|---|---|---|---|
| wherein $L_{A1545671}$-$L_{A1656075}$ have the structure | 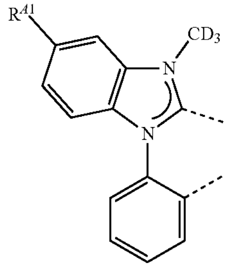 | wherein $R^{A1}$ = Rj, wherein j is an integer from 1 to 110405, and | i = j + 1545670 |
| wherein $L_{A1656076}$-$L_{A1766480}$ have the structure | 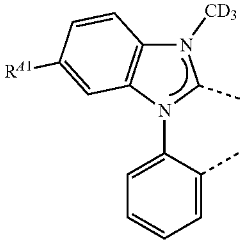 | wherein $R^{A1}$ = Rj, wherein j is an integer from 1 to 110405, and | i = j + 1656075 |
| wherein $L_{A1766481}$-$L_{A1876885}$ have the structure | 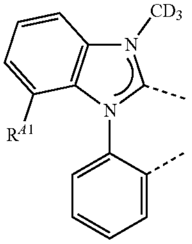 | wherein $R^{A1}$ = Rj, wherein j is an integer from 1 to 110405, and | i = j + 1766480 |
| wherein $L_{A1876886}$-$L_{A1987290}$ have the structure | 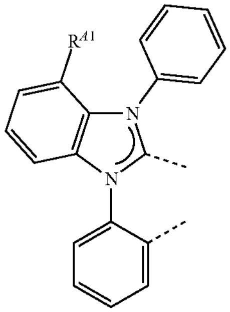 | wherein $R^{A1}$ = Rj, wherein j is an integer from 1 to 110405, and | i = j + 1876885 |
| wherein $L_{A1987291}$-$L_{2097695}$ have the structure | 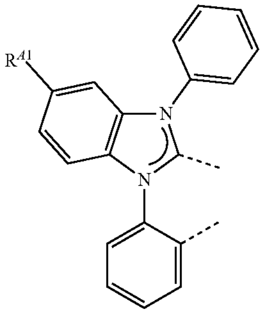 | wherein $R^{A1}$ = Rj, wherein j is an integer from 1 to 110405, and | i = j + 1987290 |

-continued

| $L_{Ai}$ | Structure of $L_{Ai}$ | $Ar^1$, R | i |
|---|---|---|---|
| wherein $L_{A2097696}$-$L_{A2208100}$ have the structure | 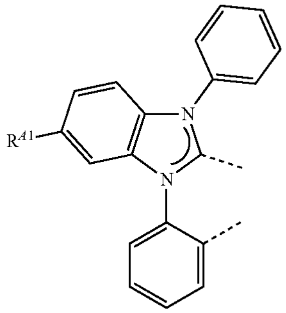 | wherein $R^{A1}$ = Rj, wherein j is an integer from 1 to 110405, and | i = j + 2097695 |
| wherein $L_{A2208101}$-$L_{A2318505}$ have the structure | 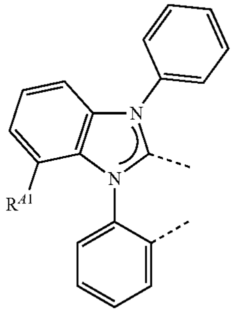 | wherein $R^{A1}$ = Rj, wherein j is an integer from 1 to 110405, and | i = j + 2208100 |
| wherein $L_{A2318506}$-$L_{A2428910}$ have the structure | 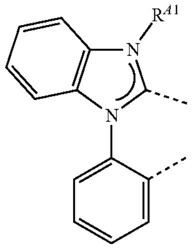 | wherein $R^{A1}$ = Rj, wherein j is an integer from 1 to 110405, and | i = j + 2318505 |
| wherein $L_{A2428911}$-$L_{A2438910}$ have the structure | 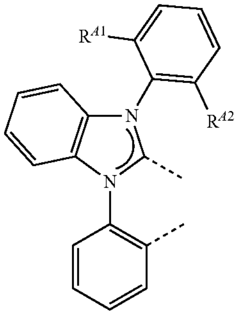 | wherein $R^{A1}$ = Bj, $R^{A2}$ = Bk, wherein j and k is an integer from 1 to 100, and | i = 100(j − 1) + k + 2428910 |
| wherein $L_{A2438911}$-$L_{A3438910}$ have the structure | 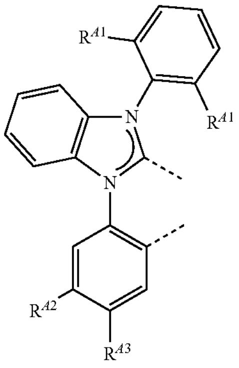 | wherein $R^{A1}$ = Bj, $R^{A2}$ = Bk, $R^{A3}$ = Bl, wherein j and k is an integer from 1 to 100, and | i = 10000(j − 1) + 100(k − 1) + 1 + 2438910 |

-continued

| $L_{Ai}$ | Structure of $L_{Ai}$ | $Ar^1$, R | i |
|---|---|---|---|
| wherein $L_{A3438911}$-$L_{A3448910}$ have the structure | 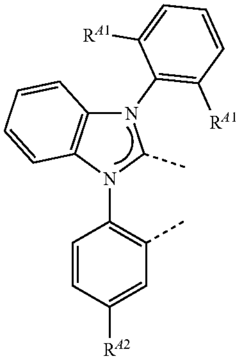 | wherein $R^{A1}$ = Bj, $R^{A2}$ = Bk, wherein j and k is an integer from 1 to 100, and | i = 100(j − 1) + k + 3438910 |
| wherein $L_{A3448911}$-$L_{A3458910}$ have the structure | 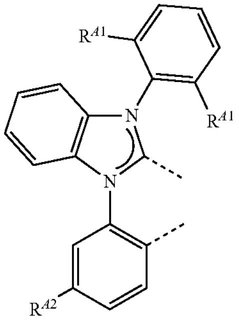 | wherein $R^{A1}$ = Bj, $R^{A2}$ = Bk, wherein j and k is an integer from 1 to 100, and | i = 100(j − 1) + k + 3448910 |
| wherein $L_{A3458911}$-$L_{A4458910}$ have the structure | 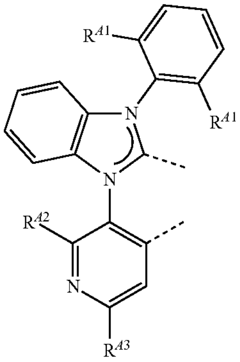 | wherein $R^{A1}$ = Bj, $R^{A2}$ = Bk, $R^{A3}$ = Bl, wherein j and k is an integer from 1 to 100, and | i = 10000(j − 1) + 100(k − 1) + 1 + 3458910 |

where R1 to R110405 have the following structures:

| Rj | Structure of Rm | $R^{S1}$, $R^{S2}$, $R^{S3}$ | j |
|---|---|---|---|
| wherein R1-R100 have the structure | 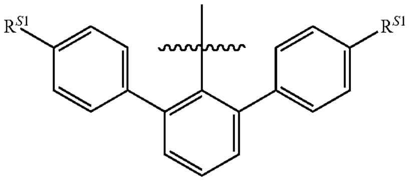 | wherein $R^{S1}$ = Bt, wherein t is an integer from 1 to 100, and | j = t |
| wherein R101-R10100 have the structure | 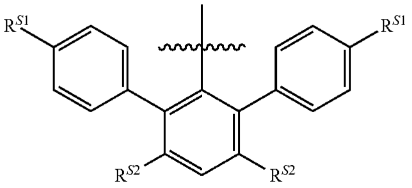 | wherein $R^{S1}$ = Bt, $R^{S2}$ = Bu wherein t and u are an integer from 1 to 100, and | j = 100(t − 1) + u + 100 |

-continued

| Rj | Structure of Rm | $R^{S1}$, $R^{S2}$, $R^{S3}$ | j |
|---|---|---|---|
| wherein R10101-R20100 have the structure | 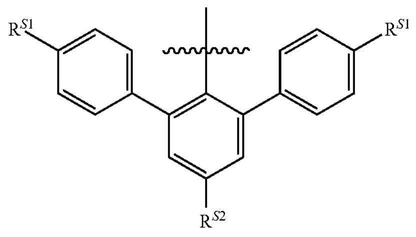 | wherein $R^{S1}$ = Bt, $R^{S2}$ = Bu wherein t and u are an integer from 1 to 100, and | j = 100(t − 1) + u + 10100 |
| wherein R20101-R20200 have the structure | 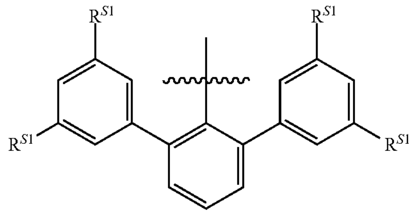 | wherein $R^{S1}$ = Bt, wherein t is an integer from 1 to 100, and | j = t + 20100 |
| wherein R20201-R30200 have the structure | 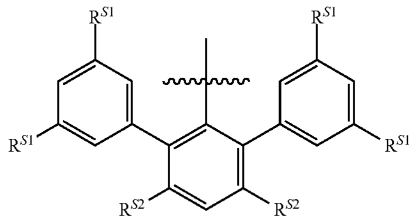 | wherein $R^{S1}$ = Bt, $R^{S2}$ = Bu wherein t and u are an integer from 1 to 100, and | j = 100(t − 1) + u + 20100 |
| wherein R30201-R40200 have the structure | 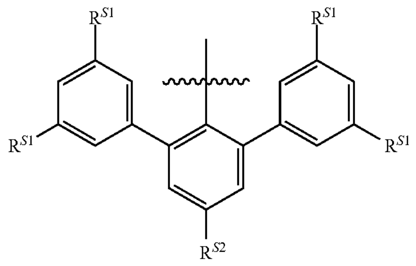 | wherein $R^{S1}$ = Bt, $R^{S2}$ = Bu wherein t and u are an integer from 1 to 100, and | j = 100(t − 1) + u + 30200 |
| wherein R40201 have the structure | 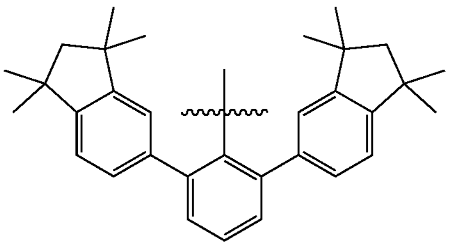 | | j = 40201 |
| wherein R40202-R40301 have the structure | 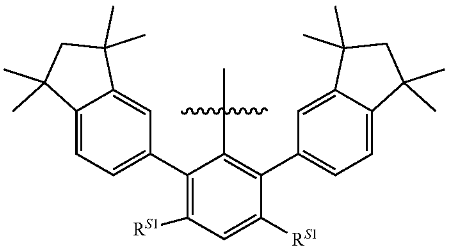 | wherein $R^{S1}$ = Bt, wherein t is an integer from 1 to 100, and | j = t + 40201 |

-continued

| Rj | Structure of Rm | $R^{S1}$, $R^{S2}$, $R^{S3}$ | j |
|---|---|---|---|
| wherein R40302-R40401 have the structure | 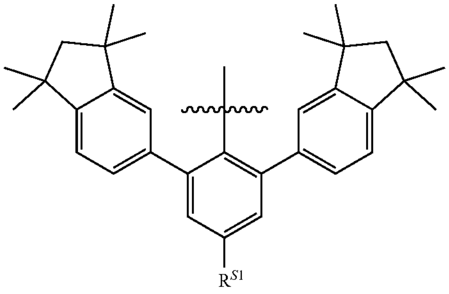 | wherein $R^{S1}$ = Bt, wherein t is an integer from 1 to 100, and | j = t + 40301 |
| wherein R40402 have the structure | 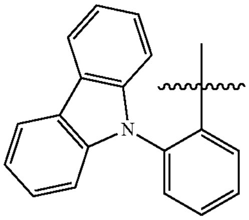 [SMILES: *c1ccccc1-n1c2ccccc2c2ccccc21] | | j = 40402 |
| wherein R40403-R40502 have the structure | 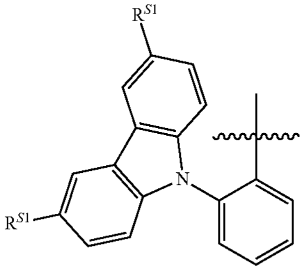 | wherein $R^{S1}$ = Bt, wherein t is an integer from 1 to 100, and | j = t + 40402 |
| wherein R40503-R40602 have the structure | 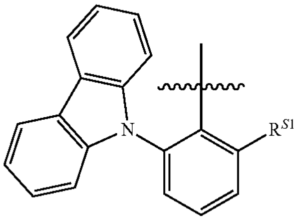 | wherein $R^{S1}$ = Bt, wherein t is an integer from 1 to 100, and | j = t + 40502 |
| wherein R40603-R50602 have the structure | 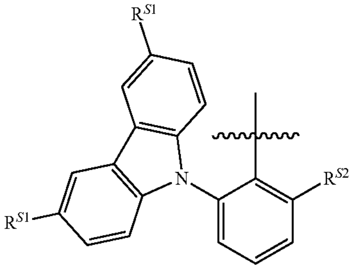 | wherein $R^{S1}$ = Bt, $R^{S2}$ = Bu wherein t and u are an integer from 1 to 100, and | j = 100(t − 1) + u + 40602 |
| wherein R50603 have the structure | 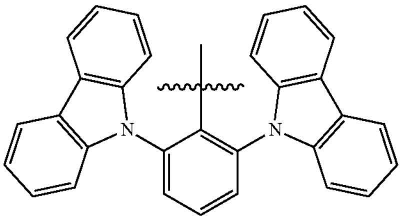 [SMILES: *c1c(-n2c3ccccc3c3ccccc32)cccc1-n1c2ccccc2c2ccccc21] | | j = 50603 |

-continued

| Rj | Structure of Rm | $R^{S1}$, $R^{S2}$, $R^{S3}$ | j |
|---|---|---|---|
| wherein R50604-R50703 have the structure | 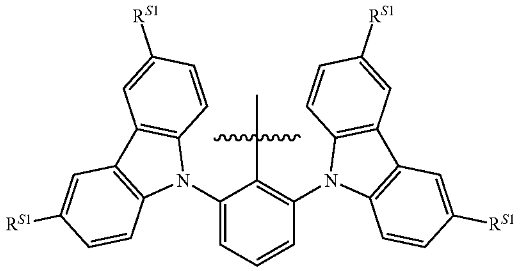 | wherein $R^{S1}$ = Bt, wherein t is an integer from 1 to 100, and | j = t + 50603 |
| wherein R50704 have the structure | 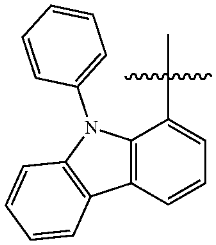 [SMILES: *c1cccc2c3ccccc3n(-c3ccccc3)c12] | | j = 50704 |
| wherein R50705-R50804 have the structure | 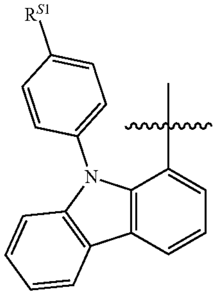 | wherein $R^{S1}$ = Bt, wherein t is an integer from 1 to 100, and | j = t + 50704 |
| wherein R50805-R50904 have the structure | 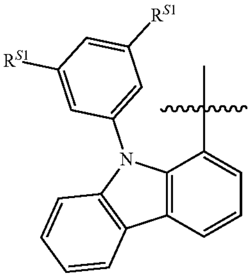 | wherein $R^{S1}$ = Bt, wherein t is an integer from 1 to 100, and | j = t + 50804 |
| wherein R50905-R51004 have the structure | 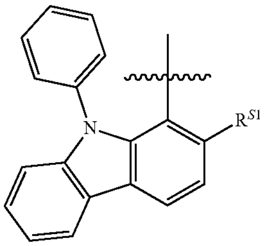 | wherein $R^{S1}$ = Bt, wherein t is an integer from 1 to 100, and | s = t + 50904 |

-continued

| Rj | Structure of Rm | $R^{S1}$, $R^{S2}$, $R^{S3}$ | j |
|---|---|---|---|
| wherein R51005-R61004 have the structure | 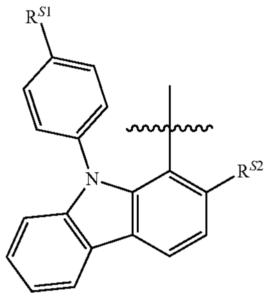 | wherein $R^{S1}$ = Bt, $R^{S2}$ = Bu wherein t and u are an integer from 1 to 100, and | j = 30(t − 1) + u + 51004 |
| wherein R61005-R71004 have the structure | 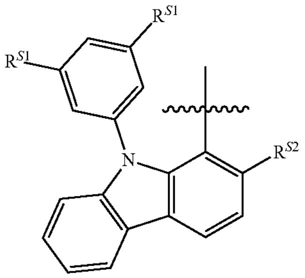 | wherein $R^{S1}$ = Bt, $R^{S2}$ = Bu wherein t and u are an integer from 1 to 100, and | j = 30(t − 1) + u + 61004 |
| wherein R71005 have the structure | 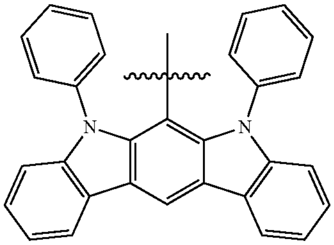 [SMILES: *c1c2c(cc3c4ccccc4n(-c4ccccc4)c13)c1ccccc1n2-c1ccccc1] | | j = 71005 |
| wherein R71006-R71105 have the structure | 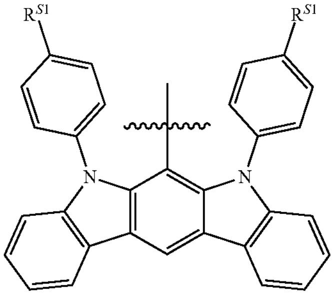 | wherein $R^{S1}$ = Bt, wherein t is an integer from 1 to 100, and | j = t + 71105 |
| wherein R71106-R71205 have the structure | 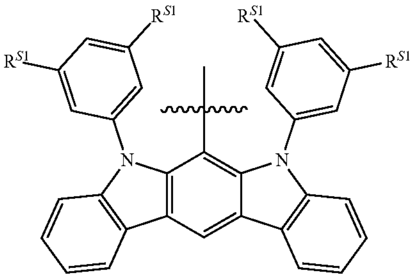 | wherein $R^{S1}$ = Bt, wherein t is an integer from 1 to 100, and | j = t + 71105 |

-continued

| Rj | Structure of Rm | $R^{S1}$, $R^{S2}$, $R^{S3}$ | j |
|---|---|---|---|
| wherein R71206-R71305 have the structure | 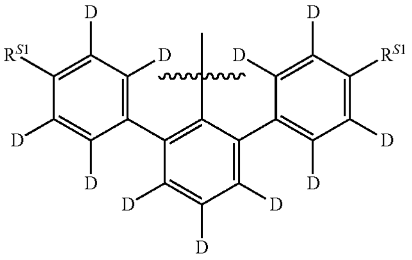 | wherein $R^{S1}$ = Bt, wherein t is an integer from 1 to 100, and | j = t + 71205 |
| wherein R71306-R81305 have the structure | 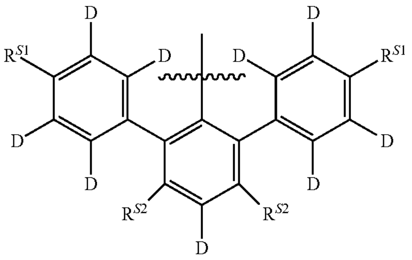 | wherein $R^{S1}$ = Bt, $R^{S2}$ = Bu wherein t and u are an integer from 1 to 100, and | j = 100(t − 1) + u + 71305 |
| wherein R81306-R91305 have the structure | 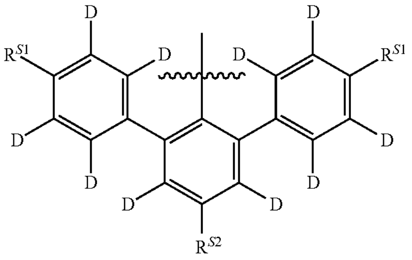 | wherein $R^{S1}$ = Bt, $R^{S2}$ = Bu wherein t and u are an integer from 1 to 100, and | j = 100(t − 1) + u + 81305 |
| wherein R91306-R91405 have the structure | 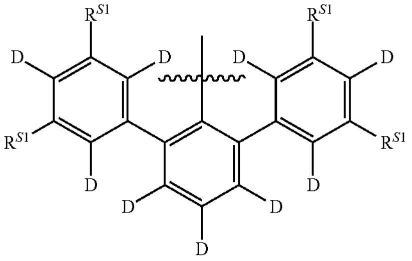 | wherein $R^{S1}$ = Bt, wherein t is an integer from 1 to 100, and | j = t + 91305 |
| wherein R91406-R101405 have the structure | 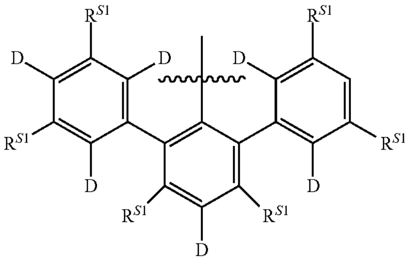 | wherein $R^{S1}$ = Bt, $R^{S2}$ = Bu wherein t and u are an integer from 1 to 100, and | j = 100(t − 1) + u + 91405 |

-continued
| Rj | Structure of Rm | $R^{S1}$, $R^{S2}$, $R^{S3}$ | j |
|---|---|---|---|
| wherein R101406-R110405 have the structure | 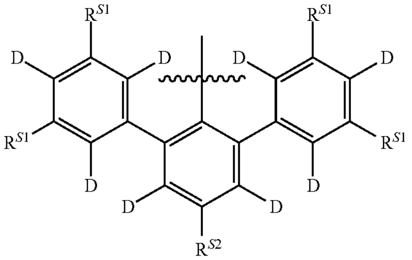 | wherein $R^{S1}$ = Bt, $R^{S2}$ = Bu wherein t and u are an integer from 1 to 100, and | j = 100(t − 1) + u + 101405 |
where B1 to B60 have the following structures:
B1
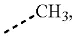
B2
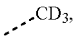
B3
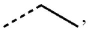
B4
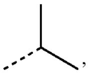
B5
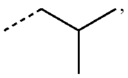
B6
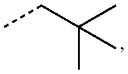
B7
B8
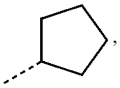
B9
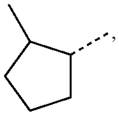
B10
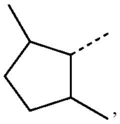
B11
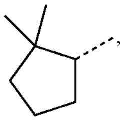
-continued
B12
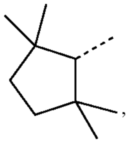
B13
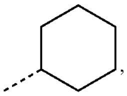
B14
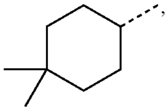
B15
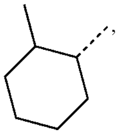
B16
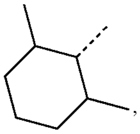
B17
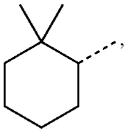
B18
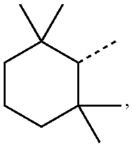
B19
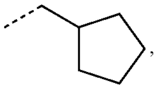
B20
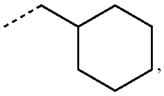

-continued
B21
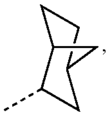,
B22
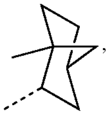,
B23
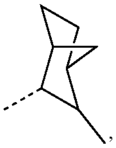,
B24
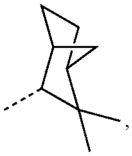,
B25
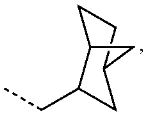,
B26
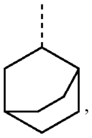,
B27
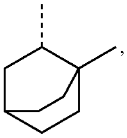,
B28
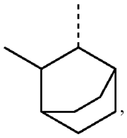,
B29
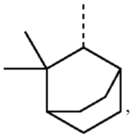,
B30
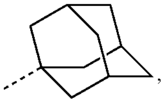,
B31
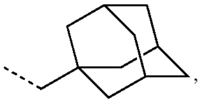,
-continued
B32
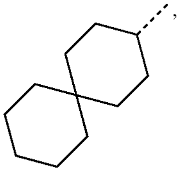,
B33
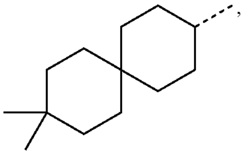,
B34
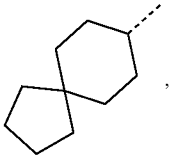,
B35
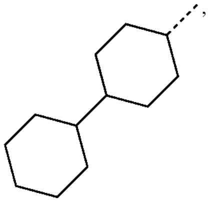,
B36
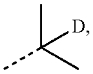,
B37
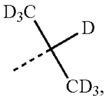,
B38
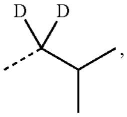,
B39
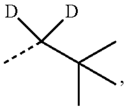,
B40
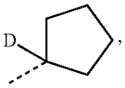,
B41
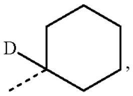,
B42
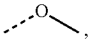,
B43
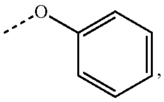, -continued
B44
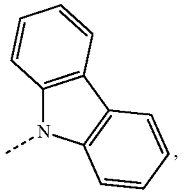
,
B45
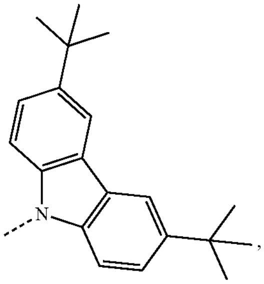
,
B46
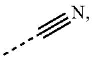
,
B47
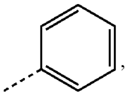
,
B48
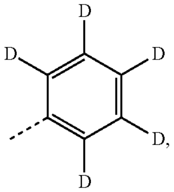
,
B49
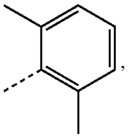
,
B50
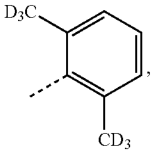
,
B51
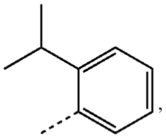
,
B52
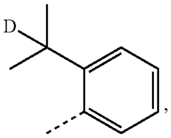
,
-continued
B53
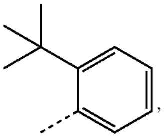
,
B54
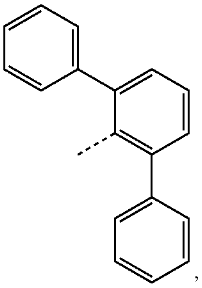
,
B55
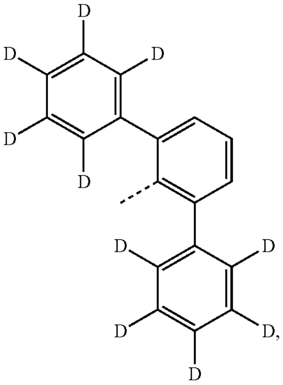
,
B56
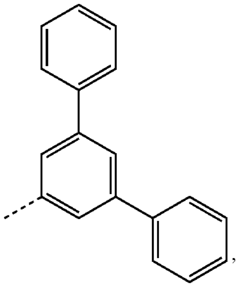
,
B57
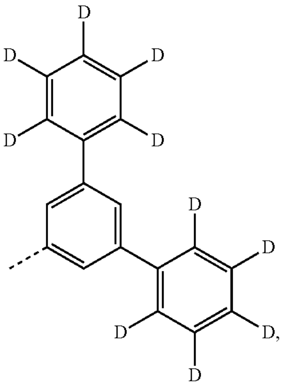
, B58
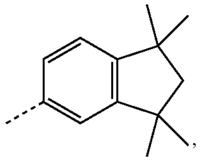
B59
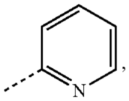
B60
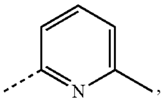
B61
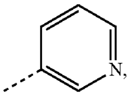
B62
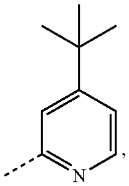
B63
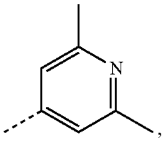
B64
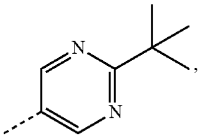
B65
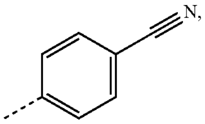
B66
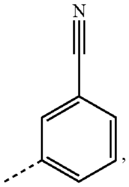
B67
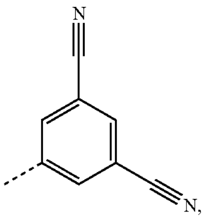
B68
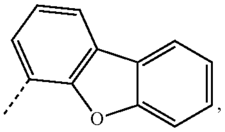
B69
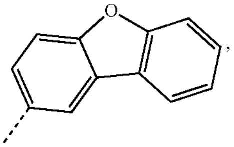
B70
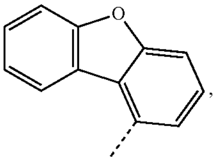
B71
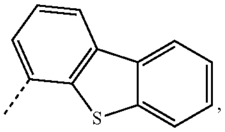
B72
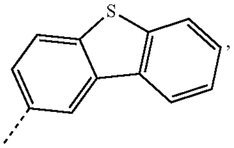
B73
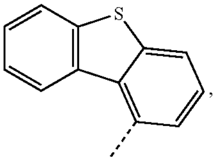
B74
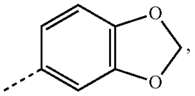
B75
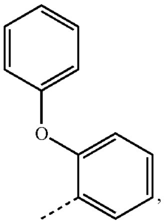
B76
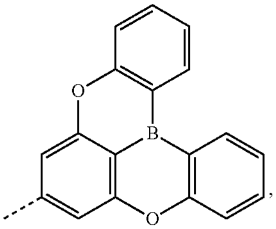

-continued
B77
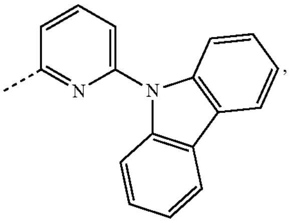,
B78
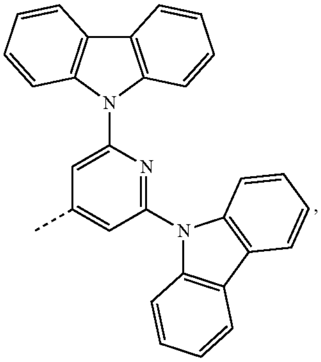,
B79
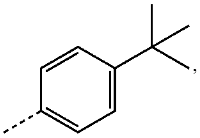,
B80
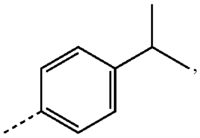,
B81
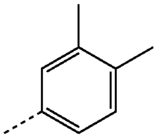,
B82
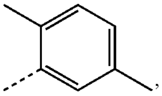,
B83
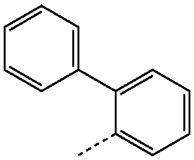,
B84
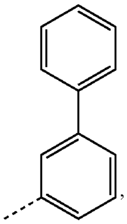,
-continued
B85
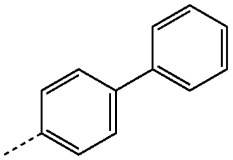,
B86
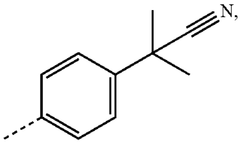,
B87
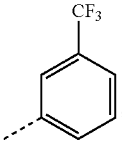,
B88
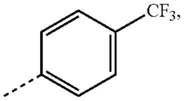,
B89
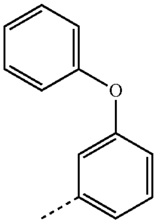,
B90
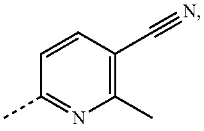,
B91
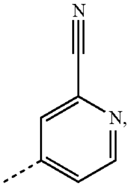,
B92
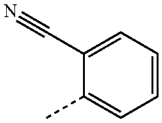,
B93
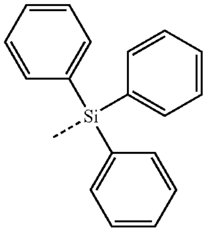, -continued

B94

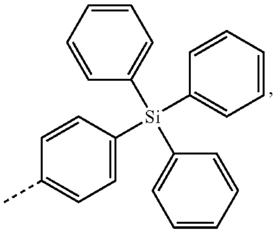

B95

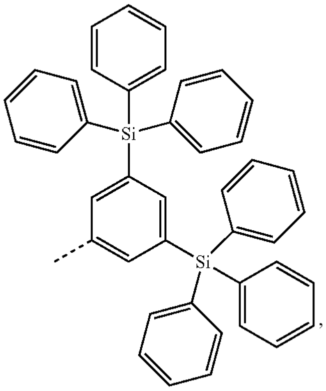

B96

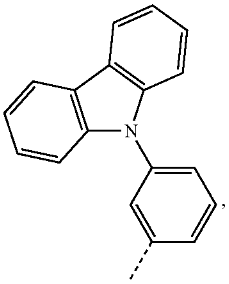

B97

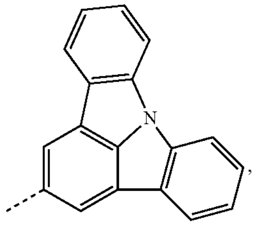

B98

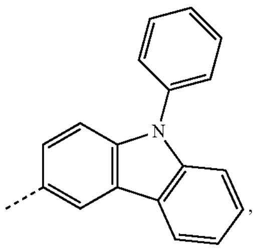

-continued

B99

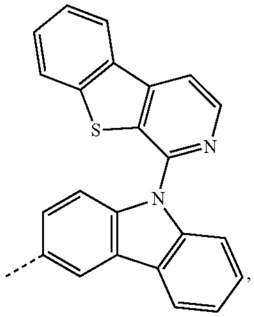

and

B100

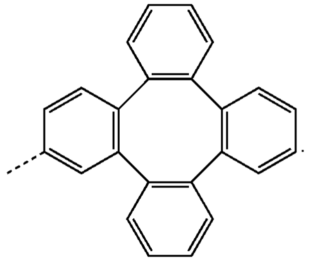

In some embodiments of the compound that comprises a ligand $L_A$ selected from the group consisting of Formula IX and Formula X as defined above, those ligands among $L_{A1}$ to $L_{A44458910}$ that contain substituent $R^{A1}$ that contains one of the following structures B1, B2, B7, B13, B30, B36, B37, B44, B45, B46, B47, B48, B49, B50, B64, B65, B66, B67, B68, B69, B70, B76, B77, B78, B86, B91, B93, B94, B96, B97, B98, B99, or B100 as the substituents $R^{S1}$ or $R^{S2}$ are preferred.

In some embodiments of the compound where the ligand $L_A$ is selected from the group consisting of Formula IX and Formula X, the ligand $L_A$ is preferably selected from the group consisting of

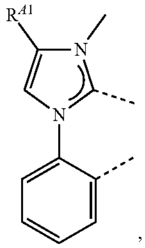
,
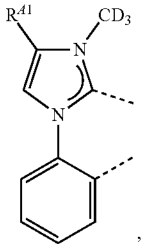
,
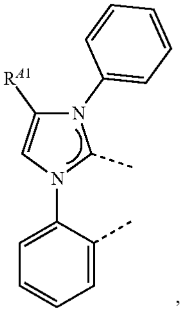
,

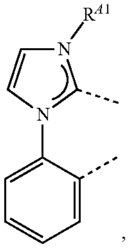
,
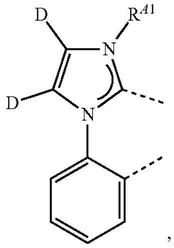
,
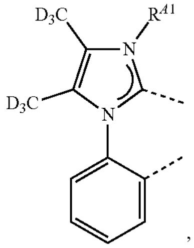
,

-continued

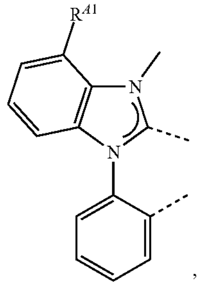
,
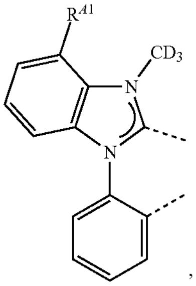
,
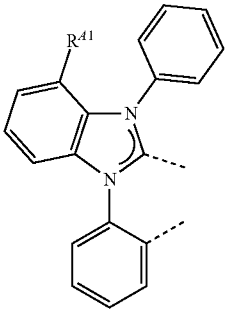
, and
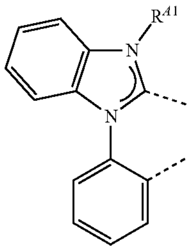
.

In some embodiments of the compound where the ligand $L_A$ is selected from the group consisting of Formula IX and Formula X, the compound has a formula of $M(L_A)_x(L_B)_y(L_C)_z$ where $L_B$ and $L_C$ are each a bidentate ligand; x is 1, 2, or 3; y is 0, 1, or 2; z is 0, 1, or 2; and x+y+z is the oxidation state of the metal M. In some embodiments, the compound has a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and $L_A$, $L_B$, and $L_C$ are different from each other. In some embodiments, the compound has a formula of $Pt(L_A)(L_B)$; and $L_A$ and $L_B$ can be same or different.

In some embodiments where the compound has the formula of $Pt(L_A)(L_B)$ defined above, $L_A$ and $L_B$ can be connected to form a tetradentate ligand.

In some embodiments of the compound that has the formula of $M(L_A)_x(L_B)_y(L_C)$ defined above, $L_B$ and $L_C$ are each independently selected from the group consisting of:

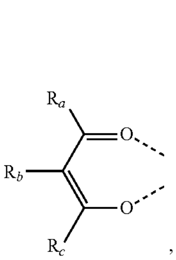
,
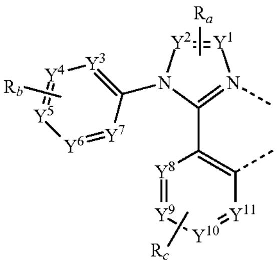
,
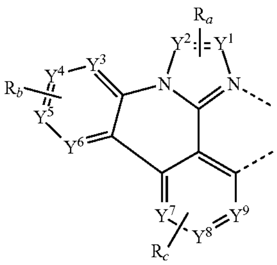
,
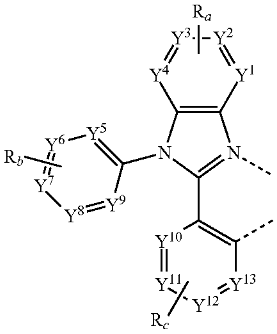
,

-continued

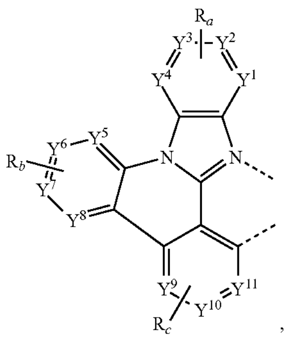
,
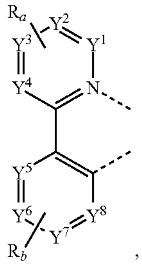
,
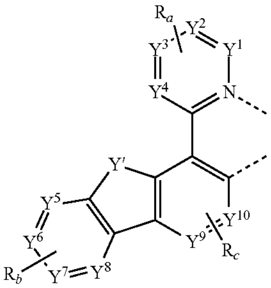
,
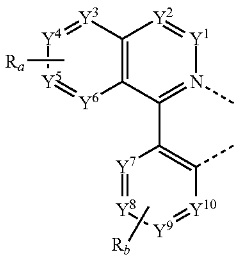
,
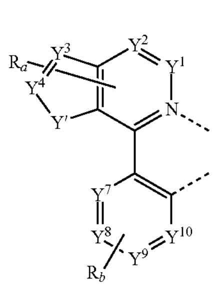
,
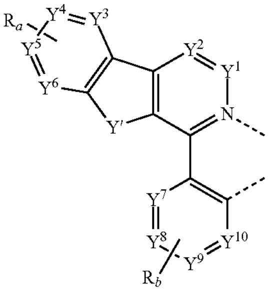
,
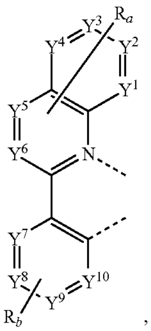
,
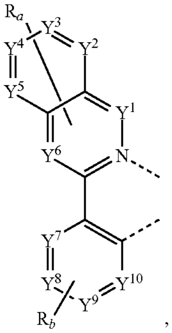
,
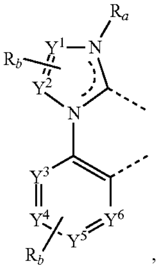
,
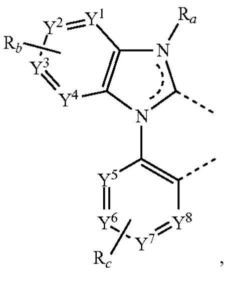
,
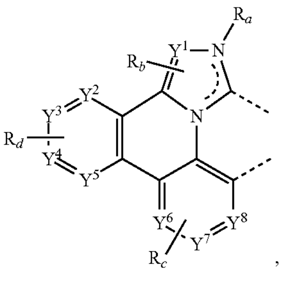
, -continued

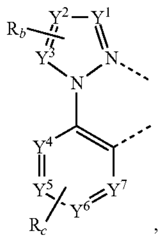
,
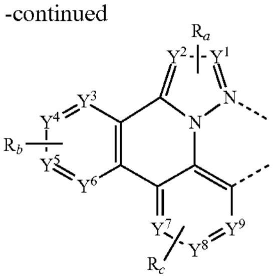
,
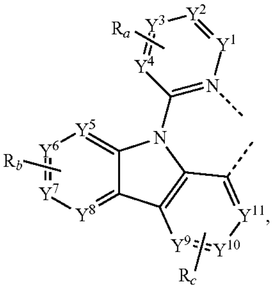

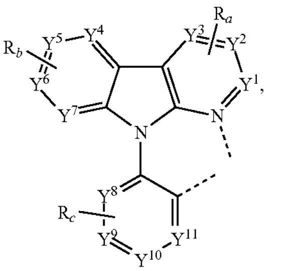
and

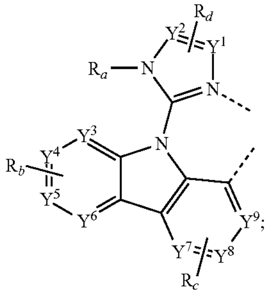

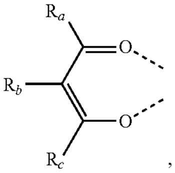
,
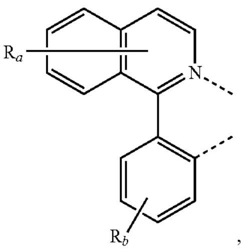
,
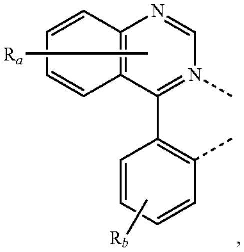
,
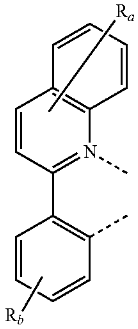
,
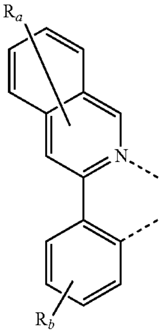
,
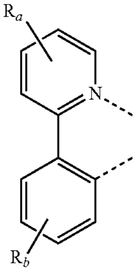
,
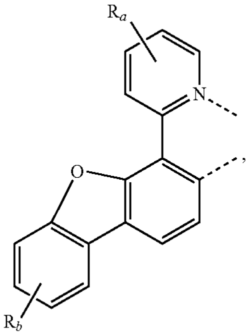
,
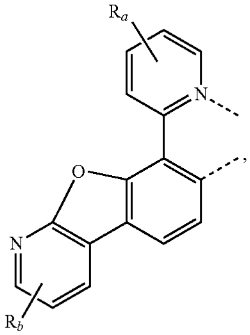
,
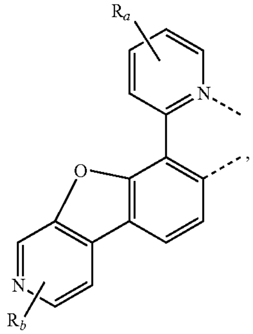
,
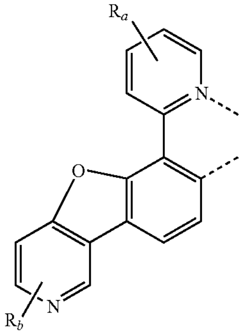
, where, each $Y^1$ to $Y^{13}$ are independently selected from the group consisting of carbon and nitrogen; Y' is selected from the group consisting of B $R_e$, N $R_e$, P $R_e$, O, S, Se, C═O, S═O, $SO_2$, $CR_eR_f$, $SiR_eR_f$, and $GeR_eR_f$; $R_e$ and $R_f$ can be fused or joined to form a ring; each $R_a$, $R_b$, $R_c$, and $R_d$ may independently represent from mono substitution to the maximum possible number of substitution, or no substitution; each $R_a$, $R_b$, $R_c$, $R_d$, $R_e$ and $R_f$ is independently a hydrogen or a substituent selected from the group consisting of the general substituents defined herein; and any two adjacent substituents of $R_a$, $R_b$, $R_c$, and $R_d$ can be fused or joined to form a ring or form a multidentate ligand.

In some embodiments of the compound that has the formula of $M(L_A)_x(L_B)_y(L_C)$ defined above, $L_B$ and $L_C$ are each independently selected from the group consisting of:

-continued
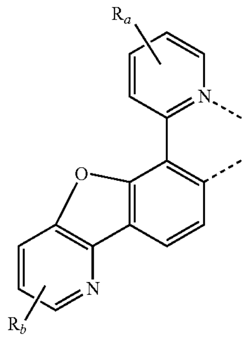
,
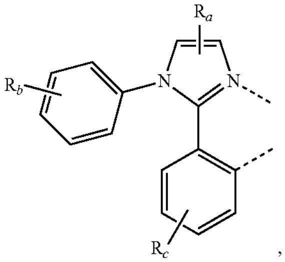
,
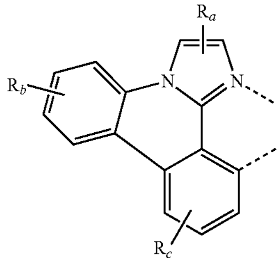
,
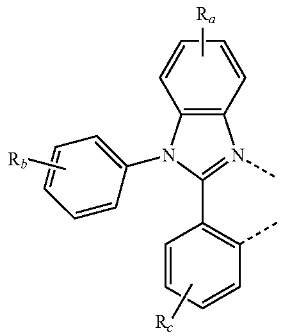
,
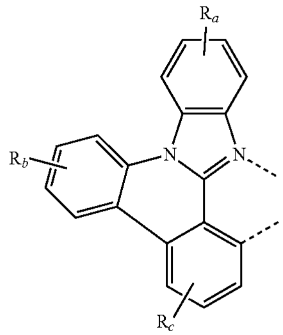
,
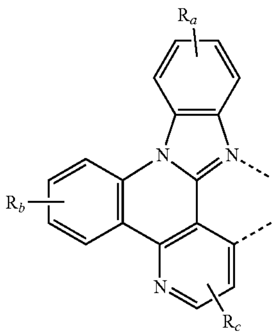
,
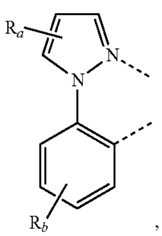
,
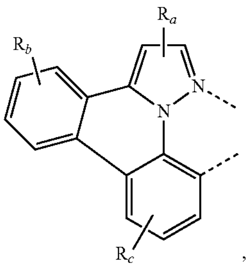
,
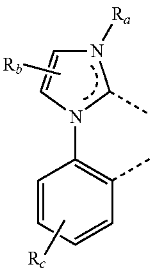
,
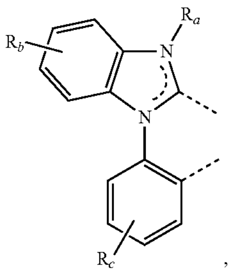
,
-continued
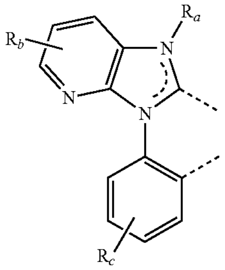
,
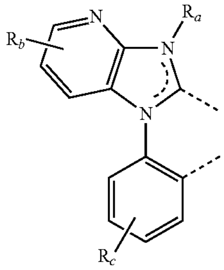
,
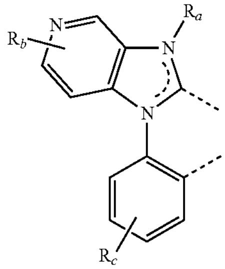
,
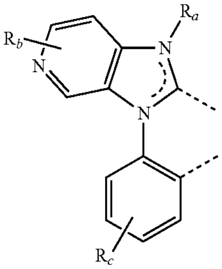
,
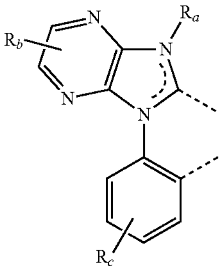
,
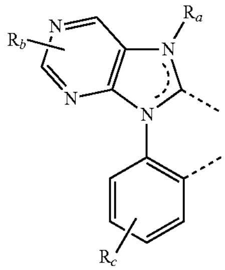
,
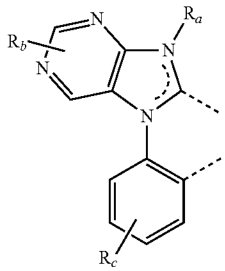
,
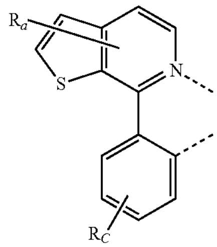
,
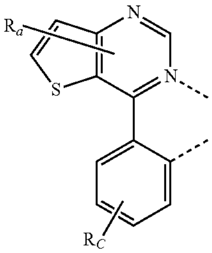
,
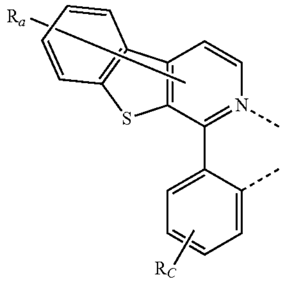
,
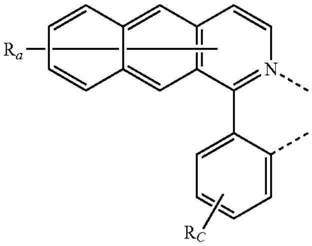
, -continued

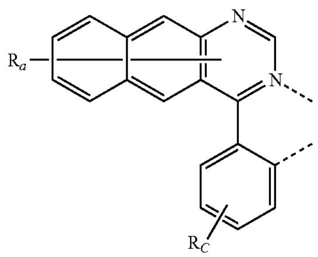

,

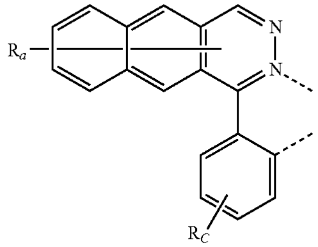

,

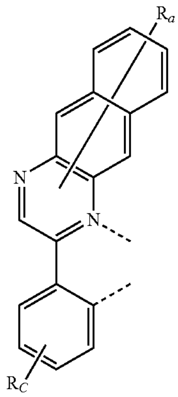

,

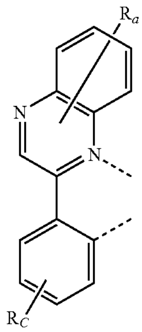

, and

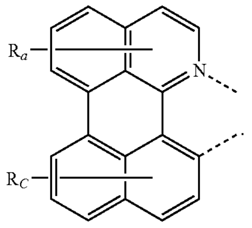

In some embodiments of the compound where the compound has a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$, and $L_A$, $L_B$, and $L_C$ are different from each other, the compound is the Compound Ax having the formula $Ir(L_{Ai})_3$, or the Compound By having the formula $Ir(L_{Ai})_2(L_{Bl})$, or the Compound Cz having the formula $Ir(L_{Ai})(L_{Bl})_2$; where, x=i, y=263(i−1)+l, and z=263(i−1)+l;

i is an integer from 1 to 889790, and l is an integer from 1 to 263;

$L_{Bl}$ have the following structures:

$L_{B1}$

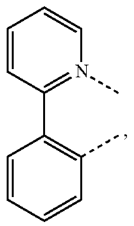

$L_{B2}$

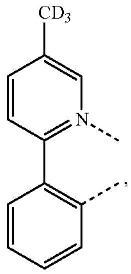

$L_{B3}$

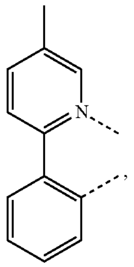

$L_{B4}$

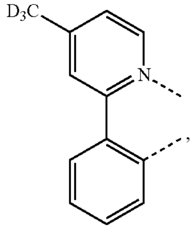

$L_{B5}$

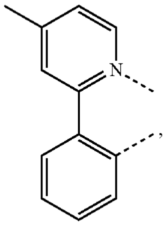

$L_{B6}$

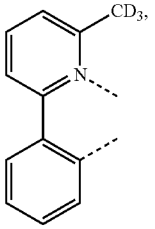

-continued
$L_{B7}$
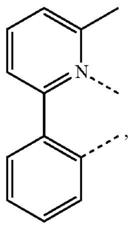
$L_{B8}$
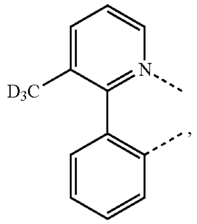
$L_{B9}$
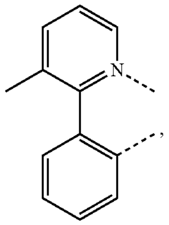
$L_{B10}$
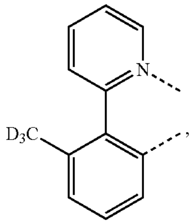
$L_{B11}$
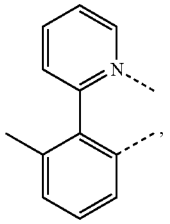
$L_{B12}$
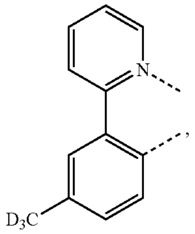
-continued
$L_{B13}$
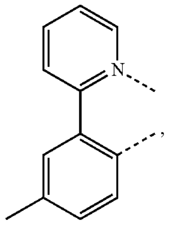
$L_{B14}$
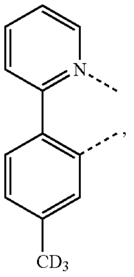
$L_{B15}$
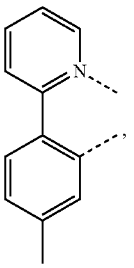
$L_{B16}$
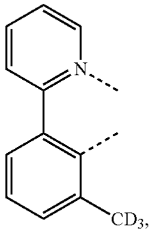
$L_{B17}$
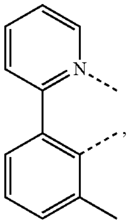
$L_{B18}$
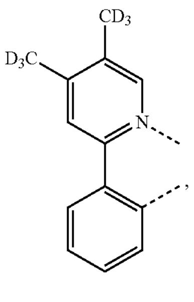

-continued
$L_{B19}$
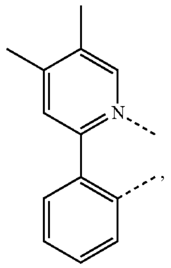
$L_{B20}$
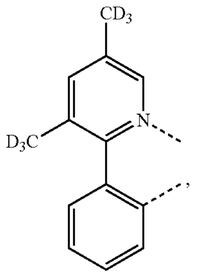
$L_{B21}$
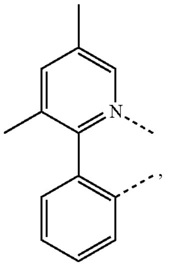
$L_{B22}$
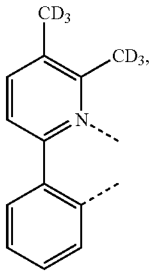
$L_{B23}$
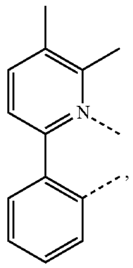
-continued
$L_{B24}$
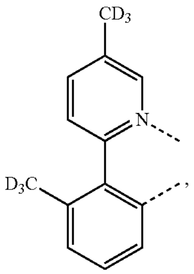
$L_{B25}$
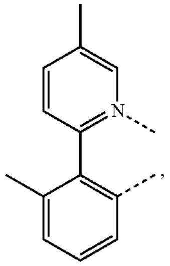
$L_{B26}$
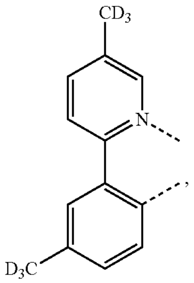
$L_{B27}$
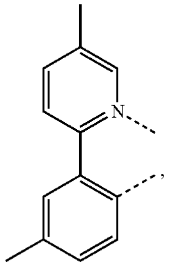
$L_{B28}$
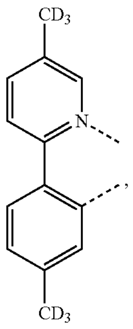

-continued
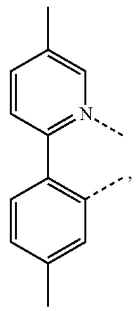
$L_{B29}$
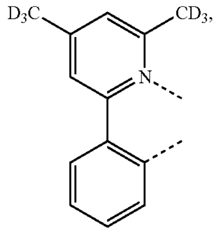
$L_{B30}$
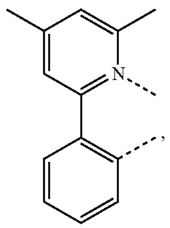
$L_{B31}$
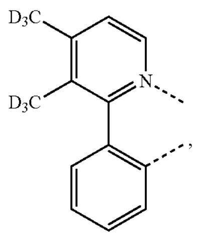
$L_{B32}$
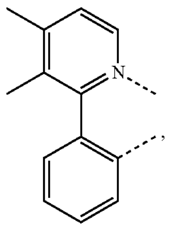
$L_{B33}$
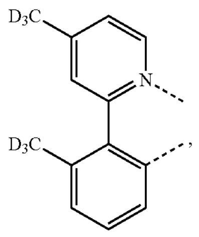
$L_{B34}$
-continued
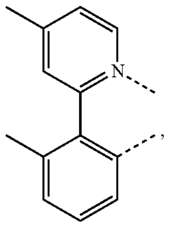
$L_{B35}$
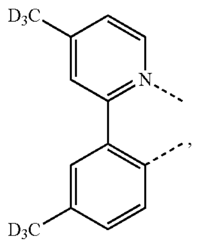
$L_{B36}$
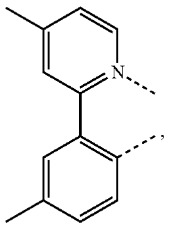
$L_{B37}$
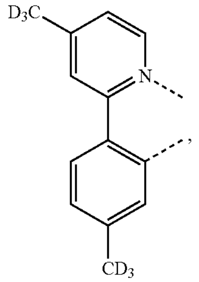
$L_{B38}$
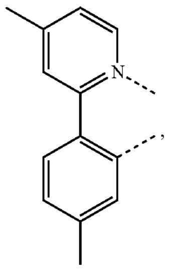
$L_{B39}$
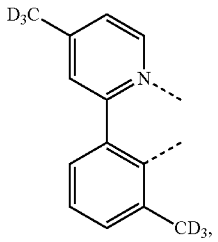
$L_{B40}$ -continued
$L_{B41}$
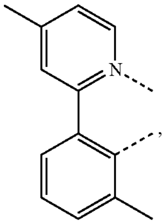
$L_{B42}$
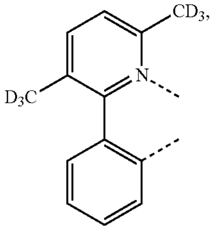
$L_{B43}$
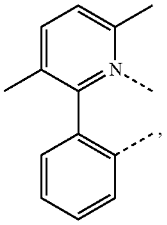
$L_{B44}$
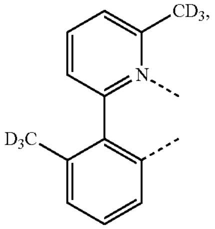
$L_{B45}$
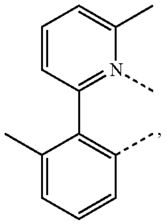
$L_{B46}$
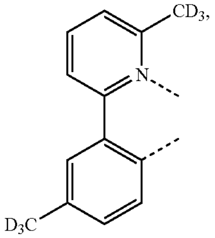
-continued
$L_{B47}$
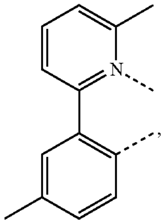
$L_{B48}$
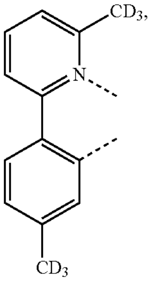
$L_{B49}$
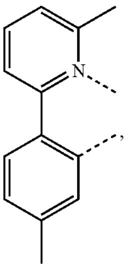
$L_{B50}$
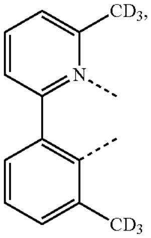
$L_{B51}$
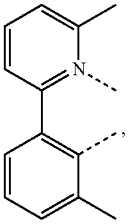
$L_{B52}$
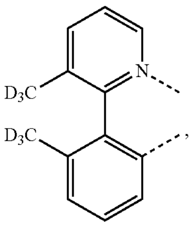

-continued
$L_{B53}$
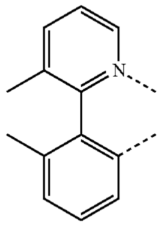
$L_{B54}$
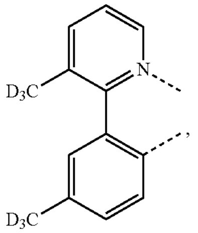
$L_{B55}$
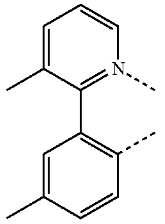
$L_{B56}$
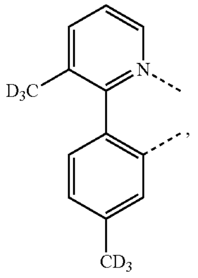
$L_{B57}$
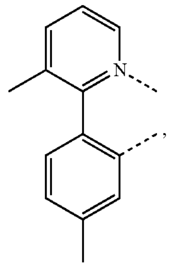
$L_{B58}$
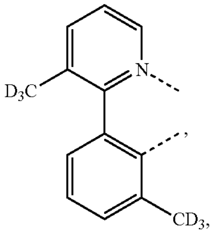
-continued
$L_{B59}$
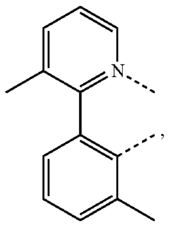
$L_{B60}$
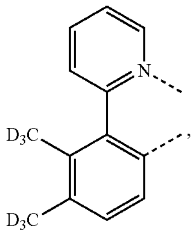
$L_{B61}$
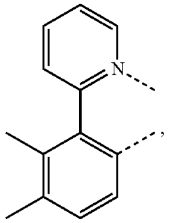
$L_{B62}$
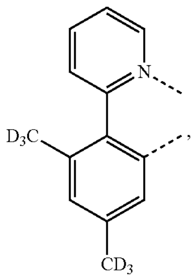
$L_{B63}$
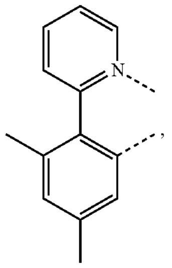
$L_{B64}$
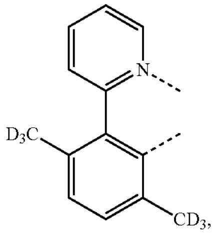

-continued
$L_{B65}$
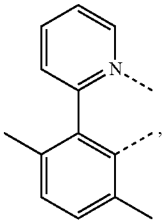
$L_{B66}$
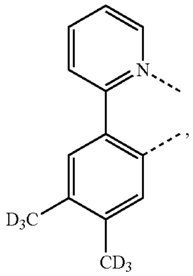
$L_{B67}$
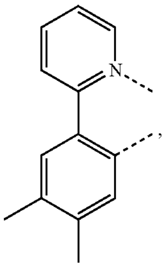
$L_{B68}$
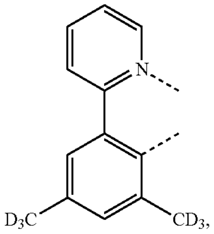
$L_{B69}$
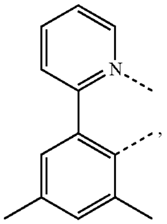
$L_{B70}$
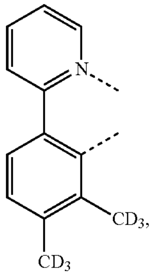
-continued
$L_{B71}$
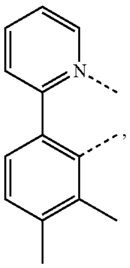
$L_{B72}$
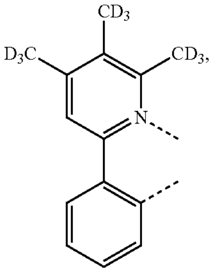
$L_{B73}$
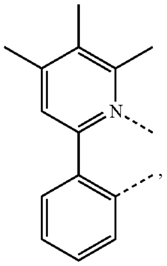
$L_{B74}$
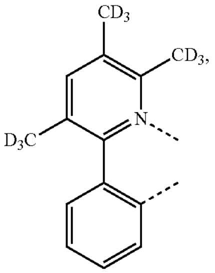
$L_{B75}$
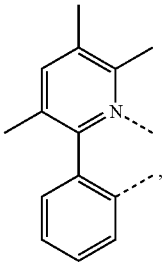

-continued
$L_{B76}$
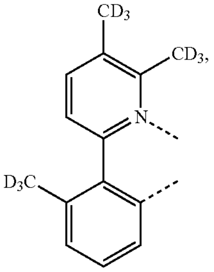
$L_{B77}$
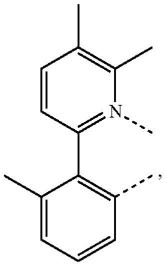
$L_{B78}$
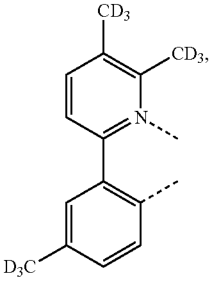
$L_{B79}$
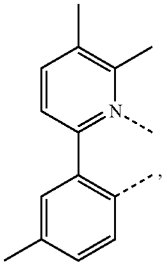
$L_{B80}$
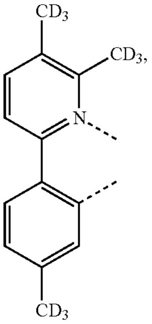
-continued
$L_{B81}$
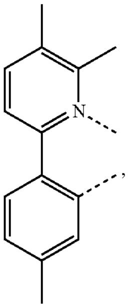
$L_{B82}$
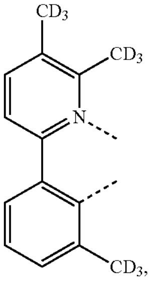
$L_{B83}$
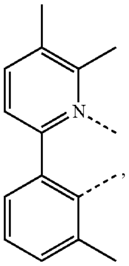
$L_{B84}$
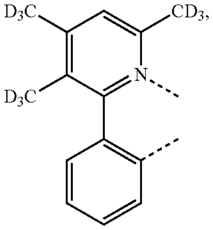
$L_{B85}$
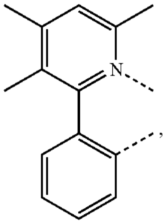
$L_{B86}$
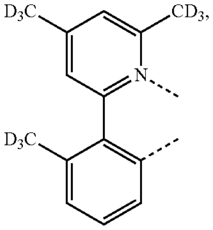

-continued
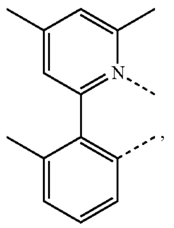
$L_{B87}$
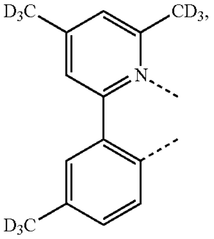
$L_{B88}$
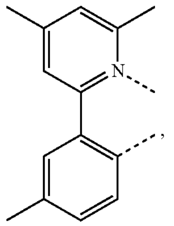
$L_{B89}$
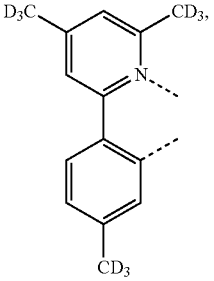
$L_{B90}$
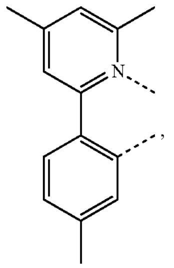
$L_{B91}$
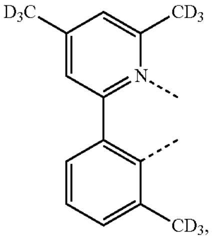
$L_{B92}$
-continued
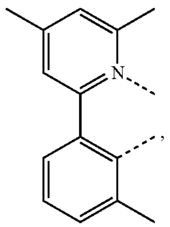
$L_{B93}$
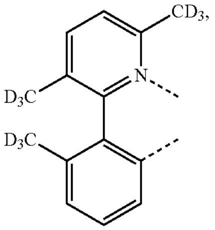
$L_{B94}$
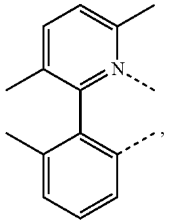
$L_{B95}$
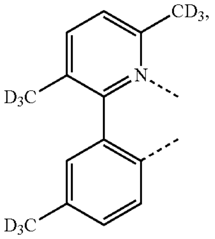
$L_{B96}$
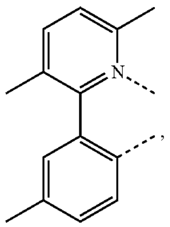
$L_{B97}$
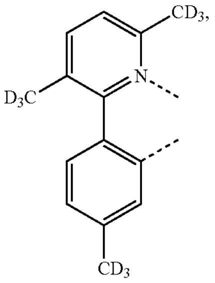
$L_{B98}$ -continued
$L_{B99}$
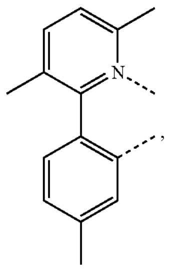
$L_{B100}$
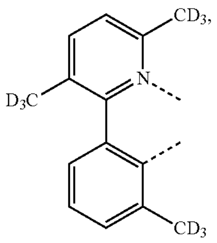
$L_{B101}$
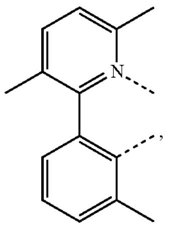
$L_{B102}$
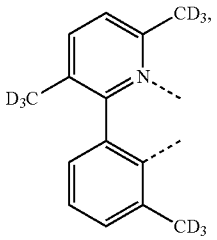
$L_{B103}$
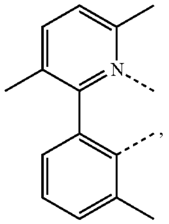
$L_{B104}$
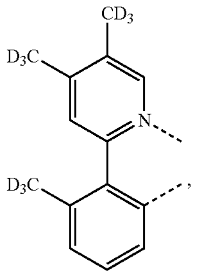
-continued
$L_{B105}$
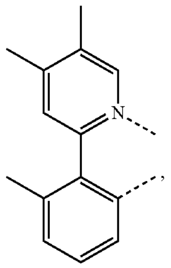
$L_{B106}$
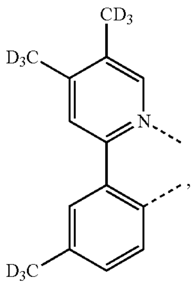
$L_{B107}$
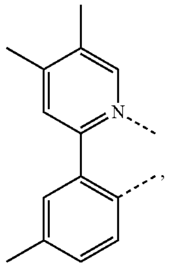
$L_{B108}$
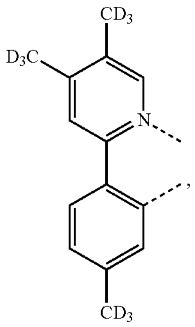
$L_{B109}$
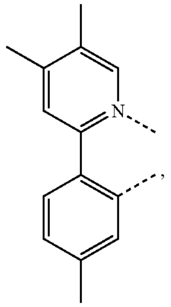

-continued
$L_{B110}$
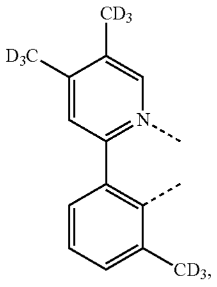
$L_{B111}$
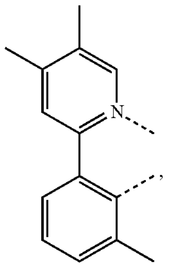
$L_{B112}$
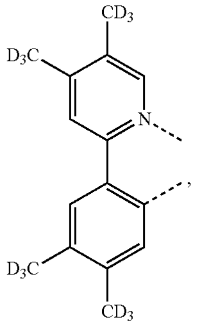
$L_{B113}$
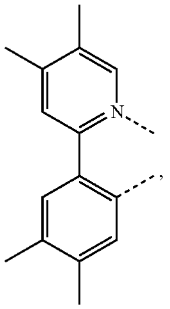
$L_{B114}$
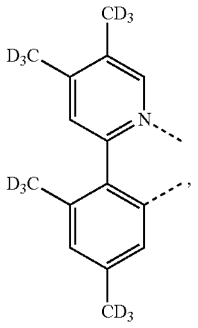
-continued
$L_{B115}$
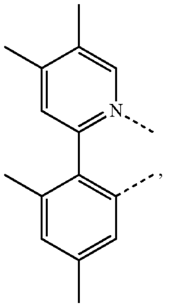
$L_{B116}$
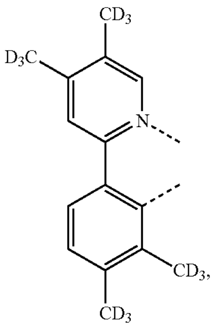
$L_{B117}$
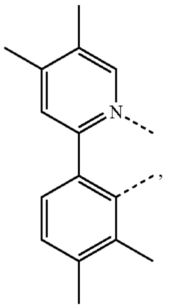
$L_{B118}$
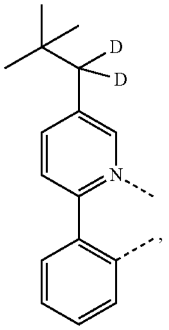
$L_{B119}$
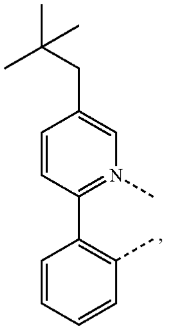

-continued
$L_{B120}$
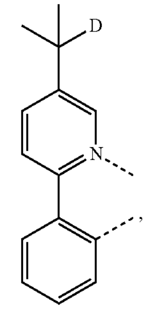
$L_{B121}$
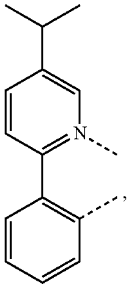
$L_{B122}$
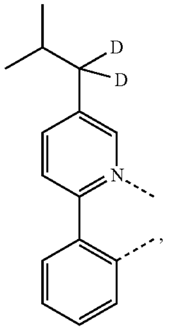
$L_{B123}$
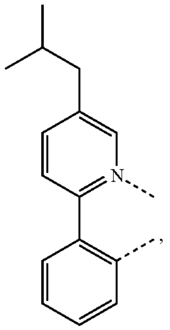
$L_{B124}$
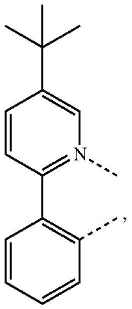
-continued
$L_{B125}$
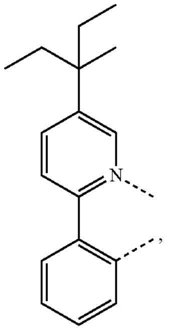
$L_{B126}$
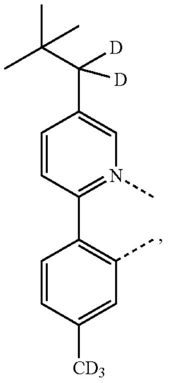
$L_{B127}$
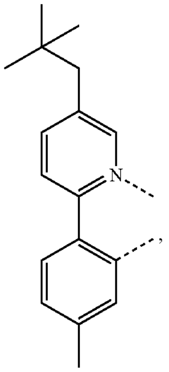
$L_{B128}$
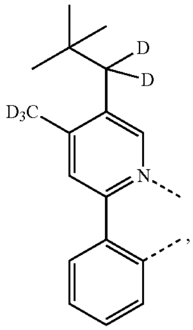

-continued
$L_{B129}$
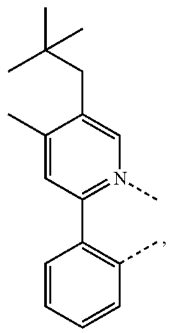
$L_{B130}$
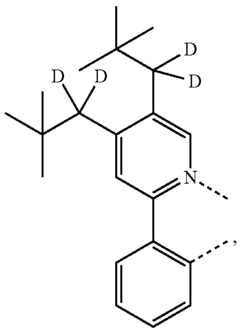
$L_{B131}$
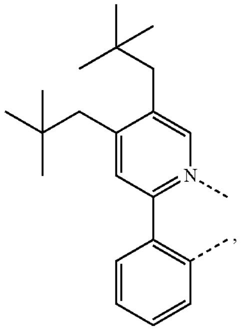
$L_{B132}$
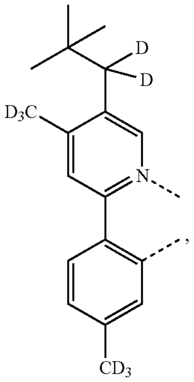
-continued
$L_{B133}$
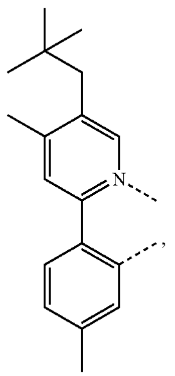
$L_{B134}$
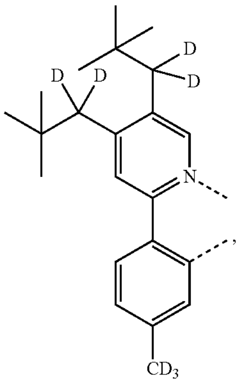
$L_{B135}$
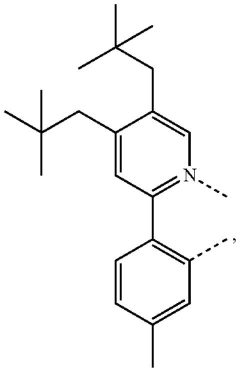
$L_{B136}$
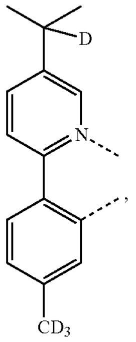

-continued
L$_{B137}$
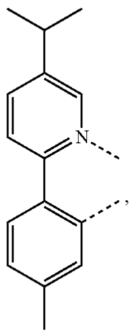
L$_{B138}$
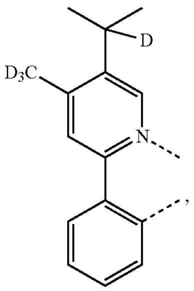
L$_{B139}$
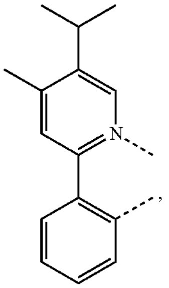
L$_{B140}$
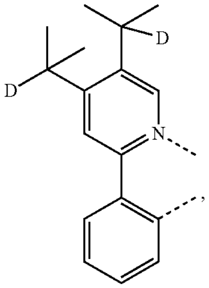
L$_{B141}$
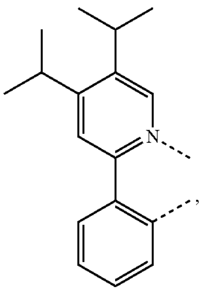
-continued
L$_{B142}$
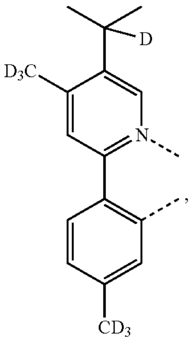
L$_{B143}$
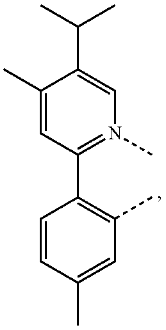
L$_{B144}$
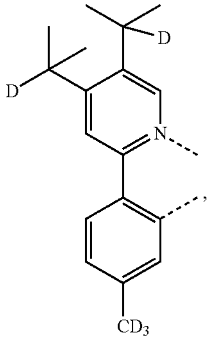
L$_{B145}$
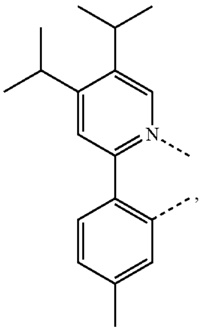

-continued
$L_{B146}$
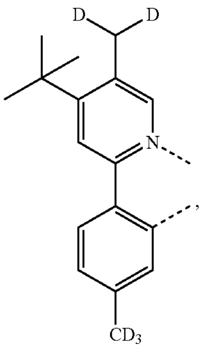
$L_{B147}$
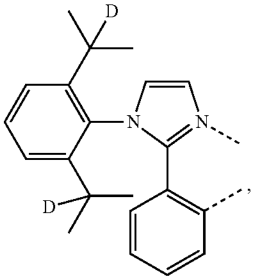
$L_{B148}$
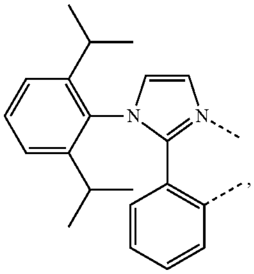
$L_{B149}$
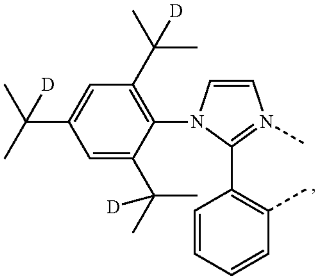
$L_{B150}$
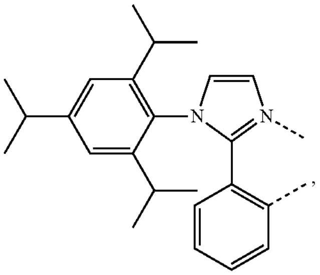
-continued
$L_{B151}$
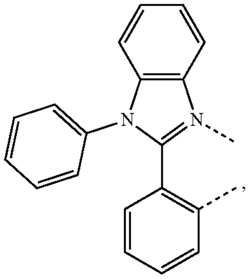
$L_{B152}$
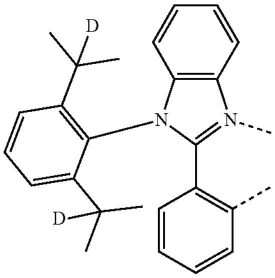
,
$L_{B153}$
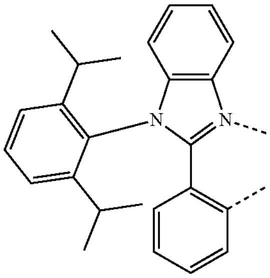
,
$L_{B154}$
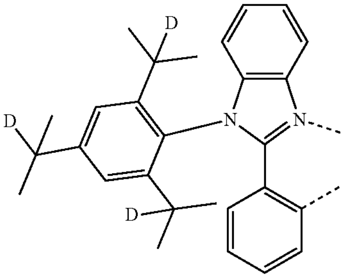
,
$L_{B155}$
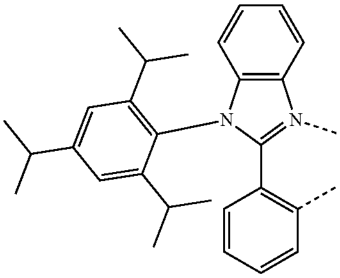
, -continued
$L_{B156}$
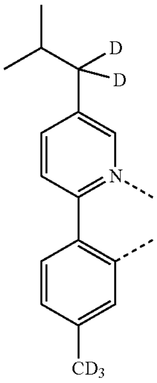
,
$L_{B157}$
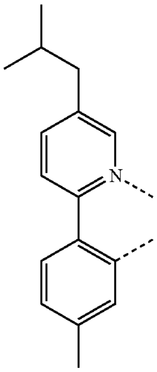
,
$L_{B158}$
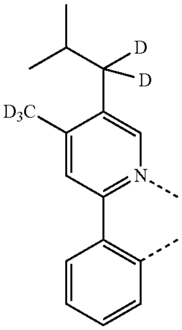
,
$L_{B159}$
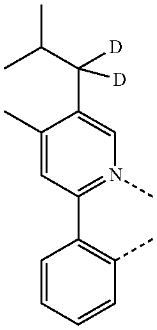
,
-continued
$L_{B160}$
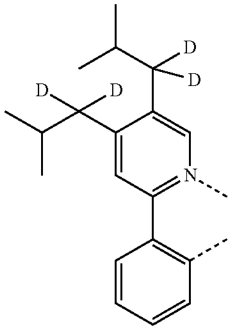
,
$L_{B161}$
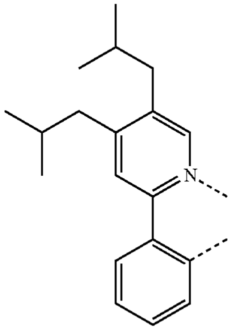
,
$L_{B162}$
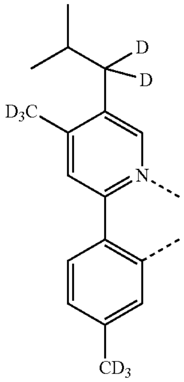
,
$L_{B163}$
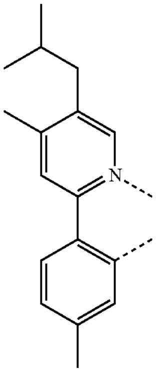
, -continued
$L_{B164}$
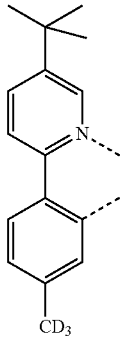
,
$L_{B165}$
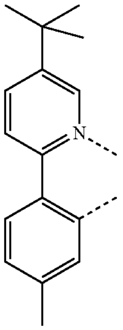
,
$L_{B166}$
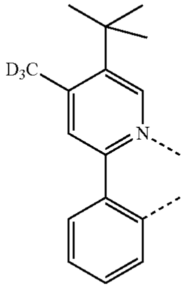
,
$L_{B167}$
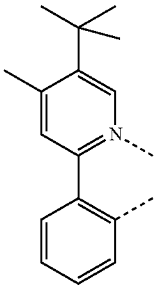
,
$L_{B168}$
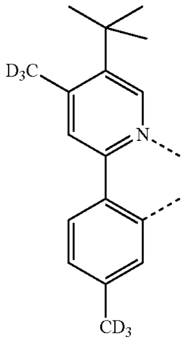
,
-continued
$L_{B169}$
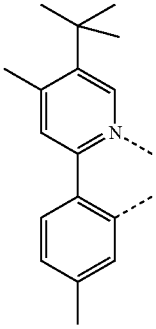
,
$L_{B170}$
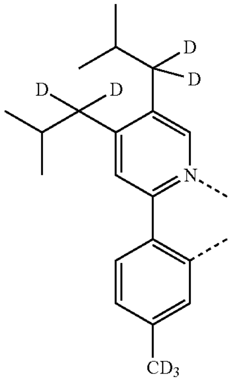
,
$L_{B171}$
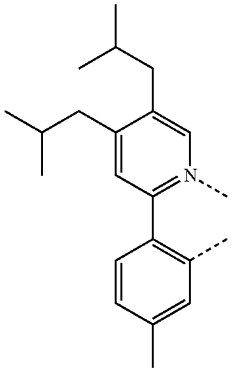
,
$L_{B172}$
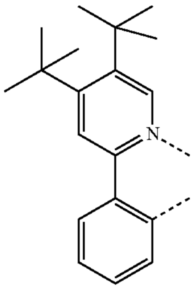
, -continued
$L_{B173}$
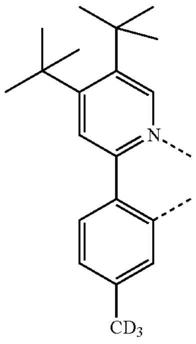
,
$L_{B174}$
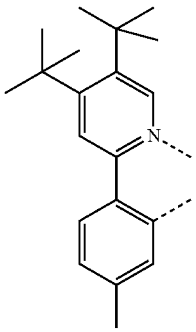
,
$L_{B175}$
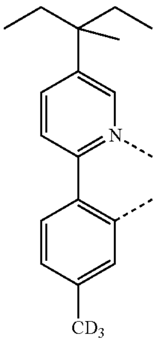
,
$L_{B176}$
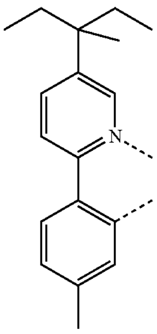
,
-continued
$L_{B177}$
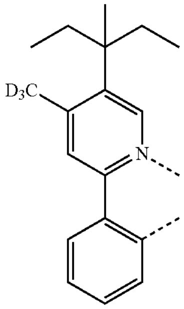
,
$L_{B178}$
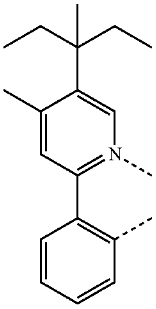
,
$L_{B179}$
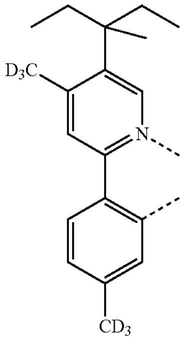
,
$L_{B180}$
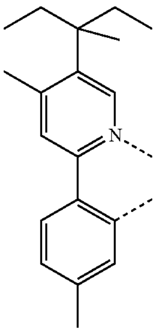
, -continued
$L_{B181}$
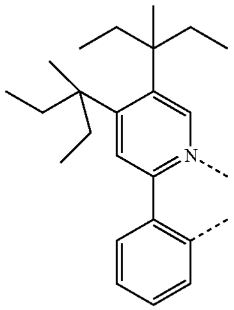
,
$L_{B182}$
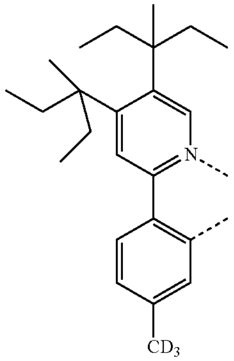
,
$L_{B183}$
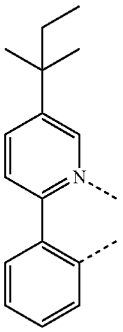
,
$L_{B184}$
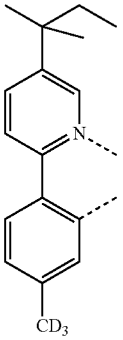
,
-continued
$L_{B185}$
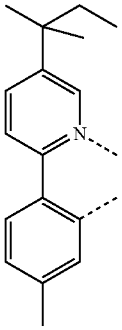
,
$L_{B186}$
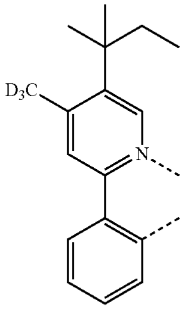
,
$L_{B187}$
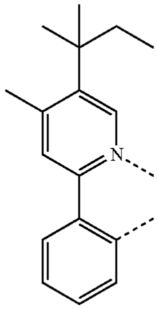
,
$L_{B188}$
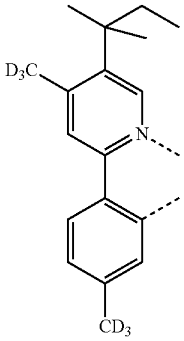
, -continued
$L_{B189}$
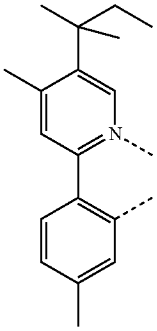
,
$L_{B190}$
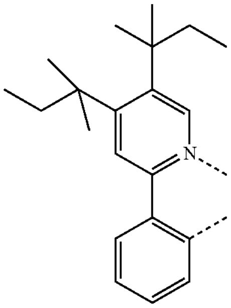
,
$L_{B191}$
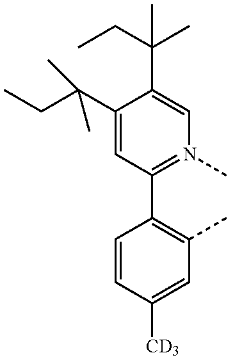
,
$L_{B192}$
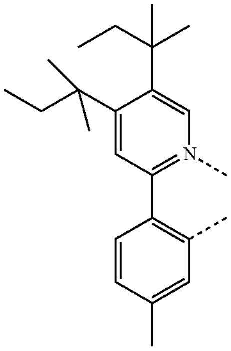
,
-continued
$L_{B193}$
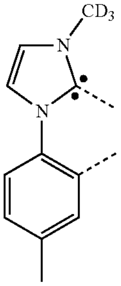
,
$L_{B194}$
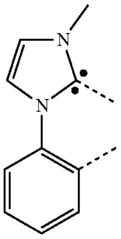
,
$L_{B195}$
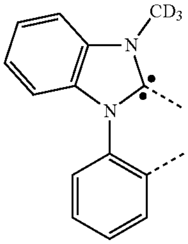
,
$L_{B196}$
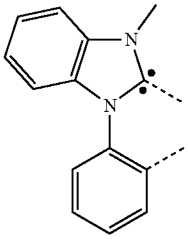
,
$L_{B197}$
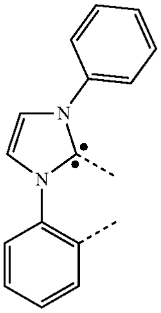
, -continued
$L_{B198}$
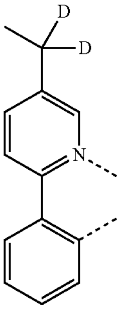
,
$L_{B199}$
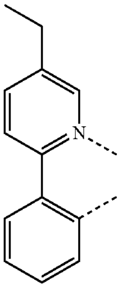
,
$L_{B200}$
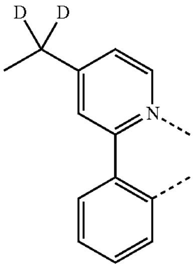
,
$L_{B201}$
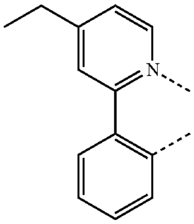
,
$L_{B202}$
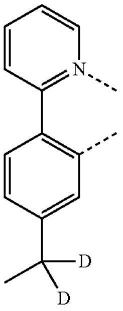
,
-continued
$L_{B203}$
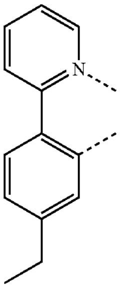
,
$L_{B204}$
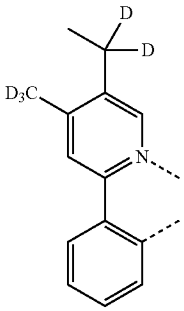
,
$L_{B205}$
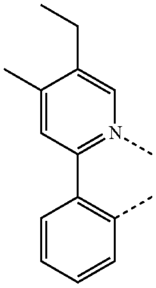
,
$L_{B206}$
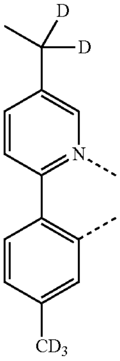
,
$L_{B207}$
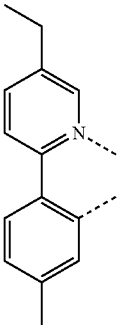
, -continued
$L_{B208}$
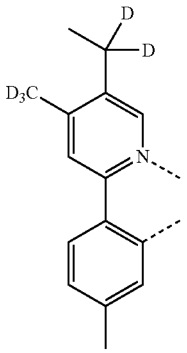
,
$L_{B209}$
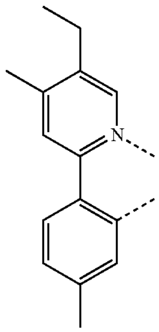
,
$L_{B210}$
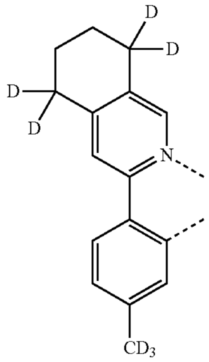
,
$L_{B211}$
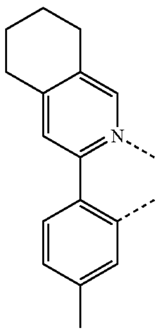
,
-continued
$L_{B212}$
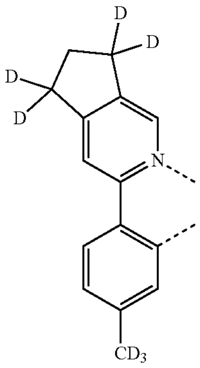
,
$L_{B213}$
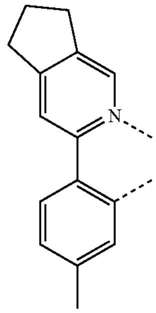
,
$L_{B214}$
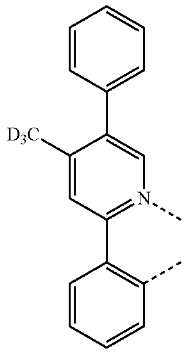
,
$L_{B215}$
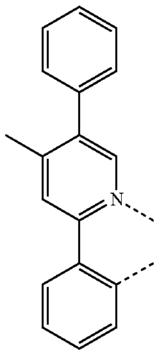
, -continued
$L_{B216}$
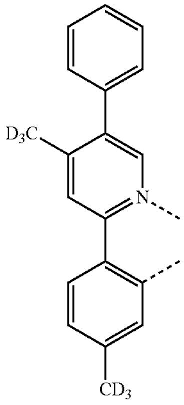
,
$L_{B217}$
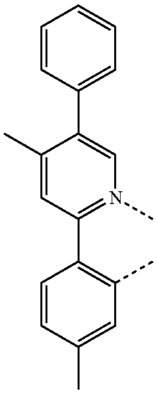
,
$L_{B218}$
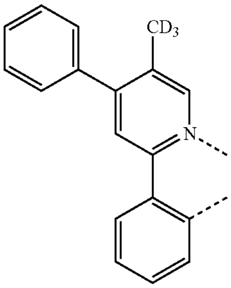
,
$L_{B219}$
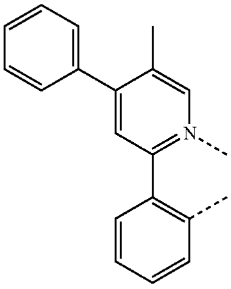
,
-continued
$L_{B220}$
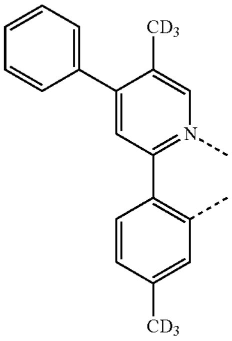
,
$L_{B221}$
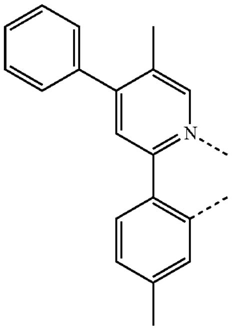
,
$L_{B222}$
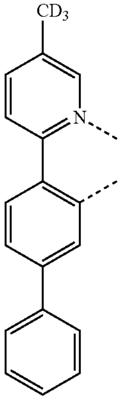
,
$L_{B223}$
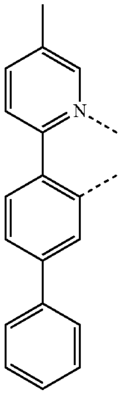
, -continued
$L_{B224}$
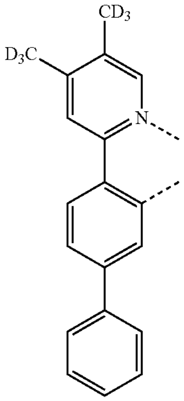
,
$L_{B225}$
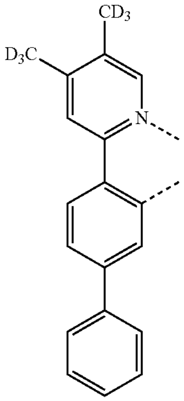
,
$L_{B226}$
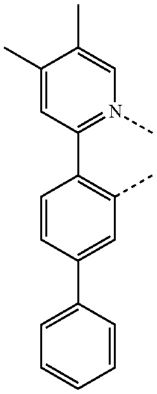
,
$L_{B227}$
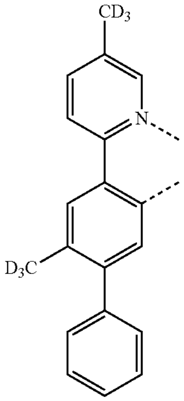
,
-continued
$L_{B228}$
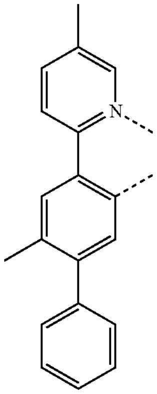
,
$L_{B229}$
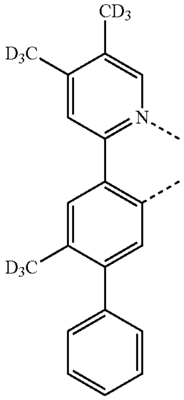
,
$L_{B230}$
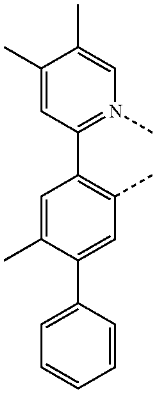
,
$L_{B231}$
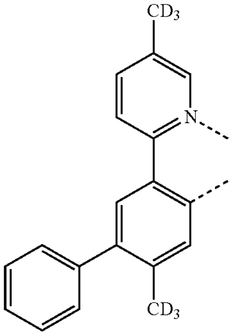
, -continued
L<sub></sub>
$L_{B232}$
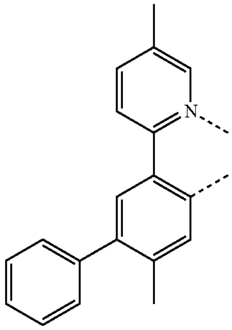
,
$L_{B233}$
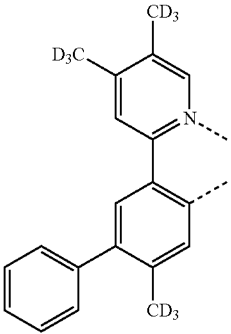
,
$L_{B234}$
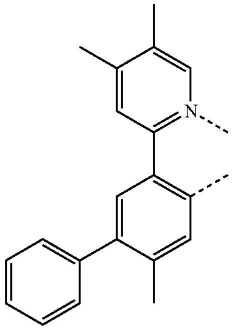
,
$L_{B235}$
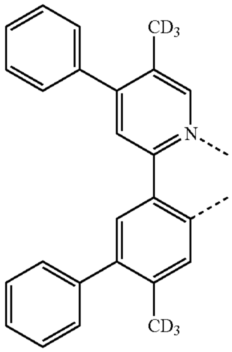
,
-continued
$L_{B236}$
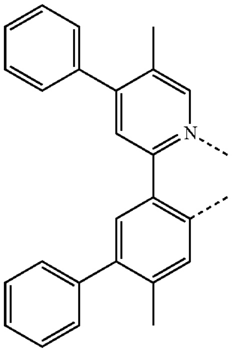
,
$L_{B237}$
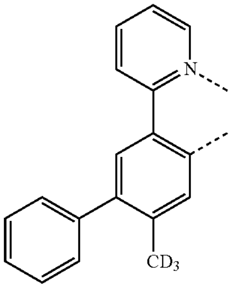
,
$L_{B238}$
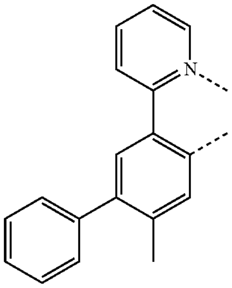
,
$L_{B239}$
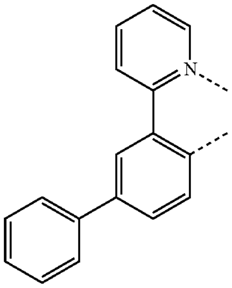
, -continued
$L_{B240}$
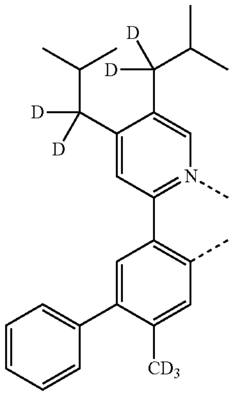
,
$L_{B241}$
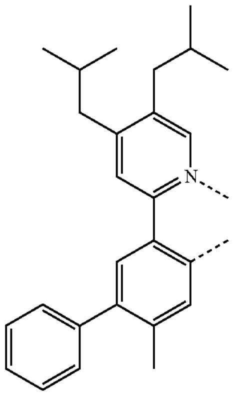
,
$L_{B242}$
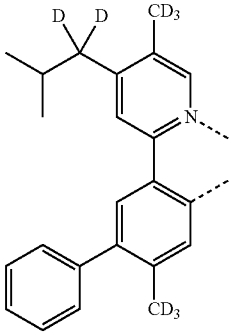
,
$L_{B243}$
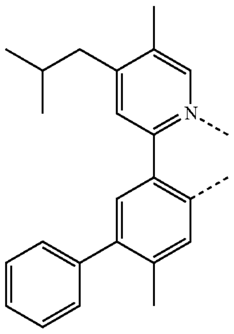
,
-continued
$L_{B244}$
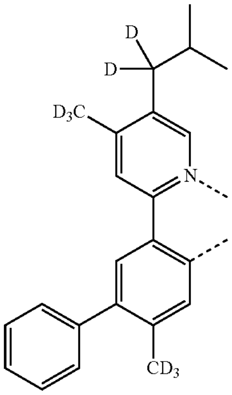
,
$L_{B245}$
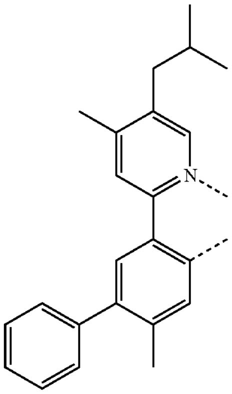
,
$L_{B246}$
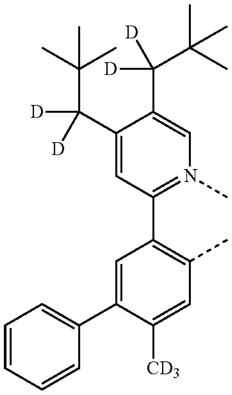
,
$L_{B247}$
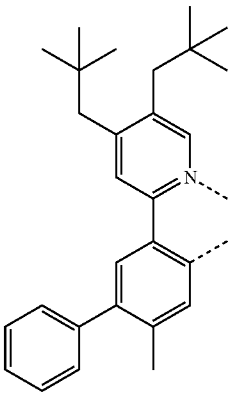
, -continued
$L_{B248}$
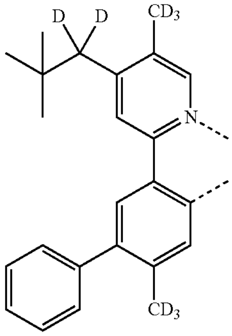
,
$L_{B249}$
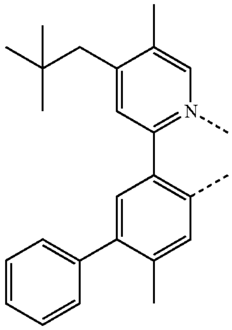
,
$L_{B250}$
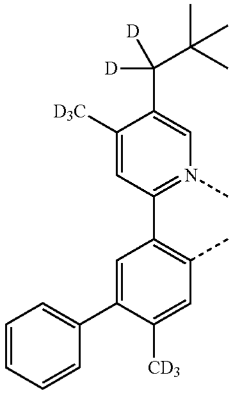
,
$L_{B251}$
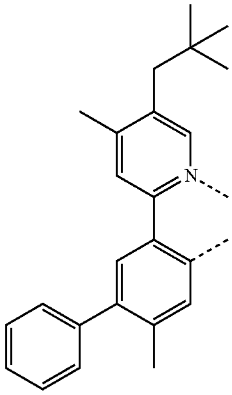
,
-continued
$L_{B252}$
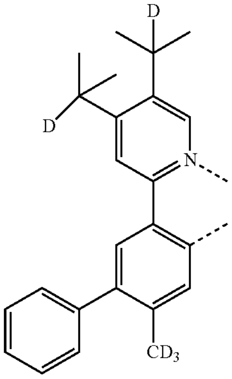
,
$L_{B253}$
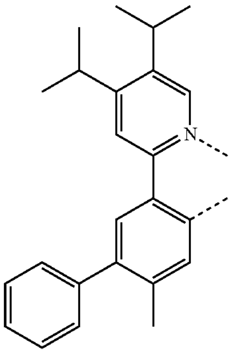
,
$L_{B254}$
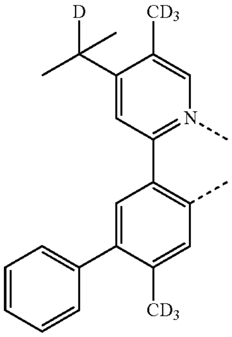
,
$L_{B255}$
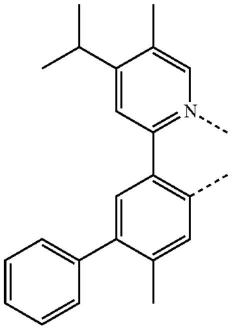
, -continued
$L_{B256}$
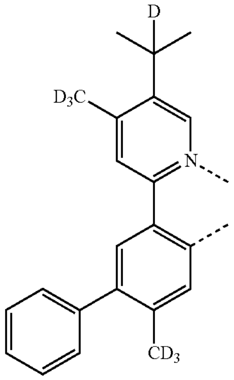
,
$L_{B257}$
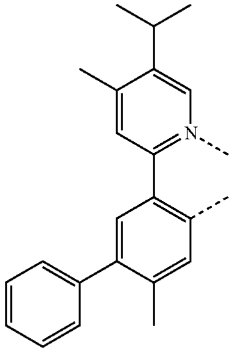
,
$L_{B258}$
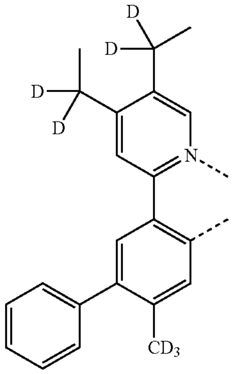
,
$L_{B259}$
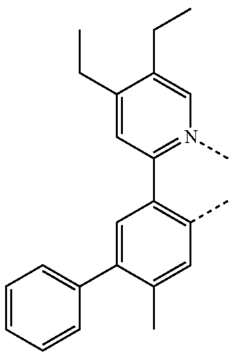
,
-continued
$L_{B260}$
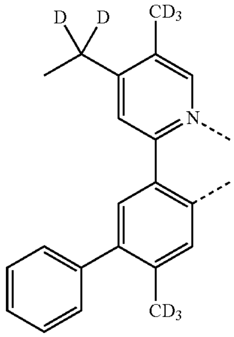
,
$L_{B261}$
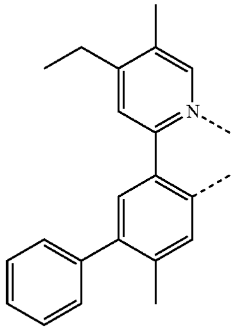
,
$L_{B262}$
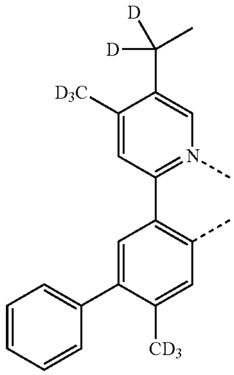
,
$L_{B263}$
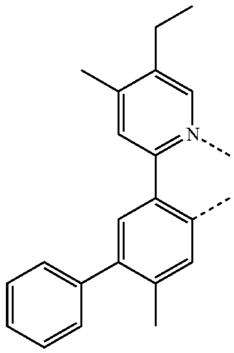
, -continued $L_{B264}$

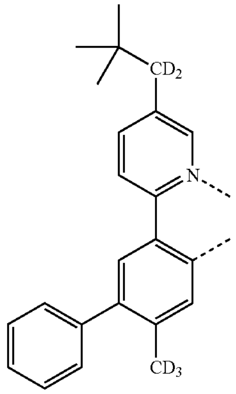

, $L_{B265}$

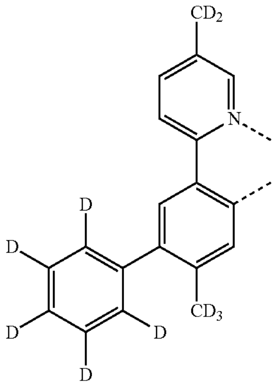

, $L_{B266}$

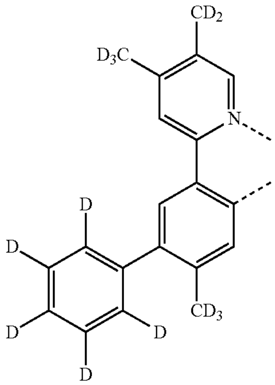

, $L_{B267}$

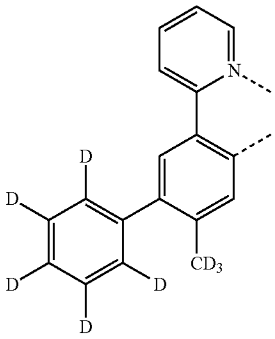

,

-continued $L_{B268}$

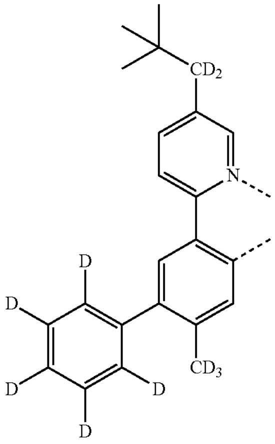

, $L_{B269}$

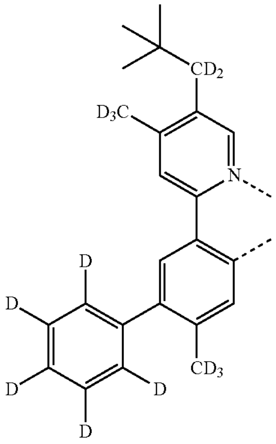

, and $L_{B270}$

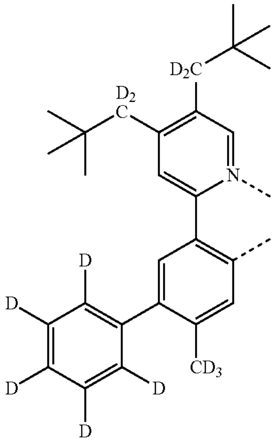

.

In some embodiments, Compound By and Compound Cz having one of the following $L_B$, are preferred: $L_{B1}$, $L_{B2}$, $L_{B18}$, $L_{B28}$, $L_{B38}$, $L_{B108}$, $L_{B118}$, $L_{B122}$, $L_{B124}$, $L_{B126}$, $L_{B128}$, $L_{B130}$, $L_{B32}$, $L_{B134}$, $L_{B136}$, $L_{B138}$, $L_{B140}$, $L_{B142}$, $L_{B144}$, $L_{B156}$, $L_{B58}$, $L_{B160}$, $L_{B162}$, $L_{B164}$, $L_{B168}$, $L_{B172}$, $L_{B175}$, $L_{B204}$, $L_{B206}$, $L_{B214}$, $L_{B216}$, $L_{B218}$, $L_{B220}$, $L_{B222}$, $L_{B231}$, $L_{B233}$, $L_{B235}$, $L_{B237}$, $L_{B240}$, $L_{B242}$, $L_{B244}$, $L_{B246}$, $L_{B248}$, $L_{B250}$, $L_{B252}$, $L_{B254}$, $L_{B256}$, $L_{B258}$, $L_{B260}$, $L_{B262}$, $L_{B263}$, $L_{B264}$, $L_{B265}$, $L_{B266}$, $L_{B267}$, $L_{B268}$, $L_{B269}$, and $L_{B270}$.

In some embodiments, Compound By and Compound Cz having one of the following $L_B$, are more preferred: $L_{B1}$, $L_{B2}$, $L_{B18}$, $L_{B28}$, $L_{B38}$, $L_{B108}$, $L_{B118}$, $L_{B122}$, $L_{B124}$, $L_{B126}$, $L_{B128}$, $L_{B132}$, $L_{B136}$, $L_{B138}$, $L_{B142}$, $L_{B156}$, $L_{B162}$, $L_{B204}$, $L_{B206}$, $L_{B214}$, $L_{B216}$, $L_{B218}$, $L_{B220}$, $L_{B231}$, $L_{B233}$, $L_{B237}$, $L_{B265}$, $L_{B266}$, $L_{B267}$, $L_{B268}$, $L_{B269}$, and $L_{B270}$.

In some embodiments of the compound having a formula selected from the group consisting of Formula V and Formula VI as defined above, the compound is selected from the group consisting of Formula XI

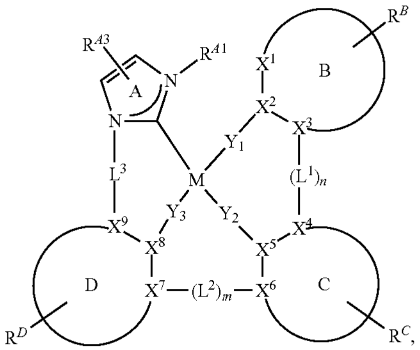

and

Formula XII

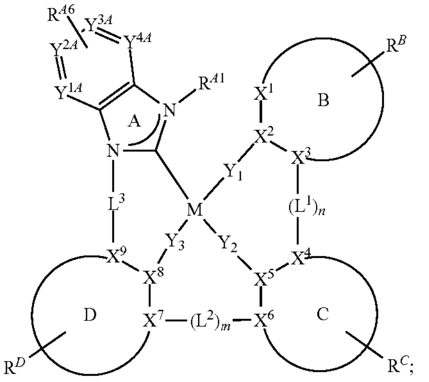

where, M is Pd or Pt; rings B, C, and D are each independently a 5-membered or 6-membered carbocyclic or heterocyclic ring; $X^1$ to $X^9$ are each independently C or N; $Y_1$ to $Y_3$ are each independently selected from the group consisting of a direct bond, O, and S; at least one of $Y_1$ to $Y_3$ is a direct bond; $Y^{1A}$ to $Y^{4A}$ are each independently C or N; $L^1$ to $L^3$ are each independently selected from the group consisting of a direct bond, O, S, CR'R", SiR'R", BR', and NR', alkyl, cycloalkyl, heteroalkyl, heterocycloalkyl, aryl, and heteroaryl; m and n are each independently 0 or 1; at least one of m and n is 1; $R^A$, $R^B$, $R^C$, $R^D$, $R^E$, and $R^F$ each independently represents mono the maximum allowable substitutions, or no substitution; each R, R', R", $R^A$, $R^B$, $R^C$, $R^D$, $R^E$, and $R^F$ is independently a hydrogen or a substituent selected from the group consisting of the general substituents defined herein; any adjacent substituents can be joined or fused into a ring; and R and an $R^B$ substituent can be joined to form a ring. In some embodiments, rings B, C, and D are each 6-membered aromatic rings. In some embodiments, ring D is phenyl. In some embodiments, ring C is phenyl. In some embodiments, ring B is selected from the group consisting of phenyl, pyridine, pyridazine, pyrimidine, pyrazine, triazine, imidazole, and imidazole-derived carbene. In some embodiments, $L^2$ is O, NR', or CRR'. In some embodiments, $X^2$ is N and $X^5$ is C. In some embodiments, $X^5$ is C and $X^2$ is N. In some embodiments, $L^1$ is a direct bond. In some embodiments, $L^1$ is NR'. In some embodiments, $L^3$ is a direct bond. In some embodiments, $Y_1$, $Y_2$, and $Y_3$ are each direct bonds. In some embodiments, one of $Y_1$, $Y_2$, and $Y_3$ is O, the remaining of $Y_1$, $Y_2$, and $Y_3$ are each direct bonds. In some embodiments, $X^1$, $X^3$, and $X^4$ are each C. In some embodiments, m+n is 2. In some embodiments, $X^8$ is C. In some embodiments, $Y^{1A}$ to $Y^{4A}$ are each C.

In some embodiments of the compound selected from the group consisting of Formula XI and Formula XII as defined above, the compound can be selected from the group consisting of:

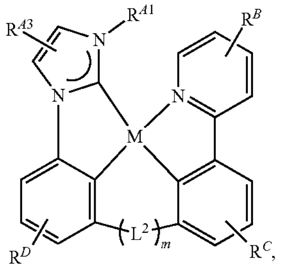

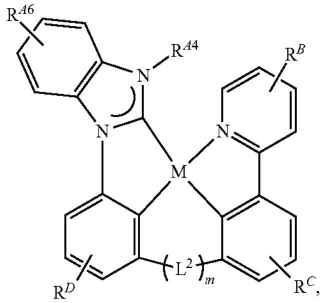

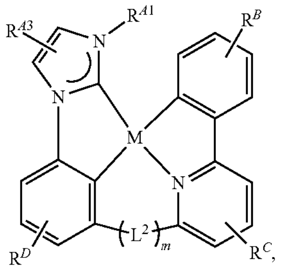

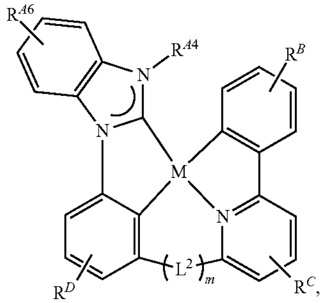

-continued
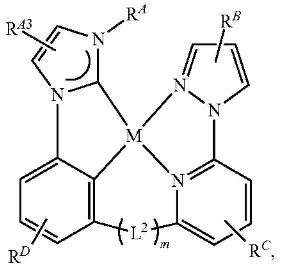
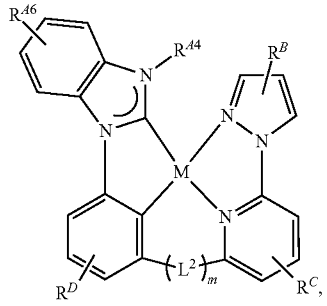
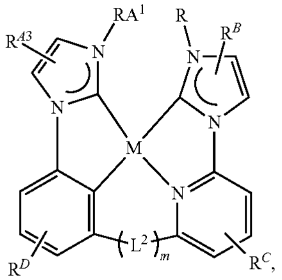
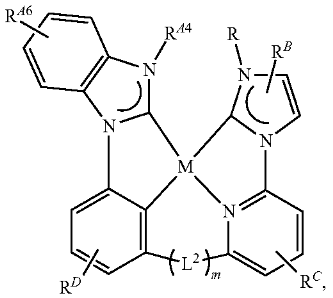
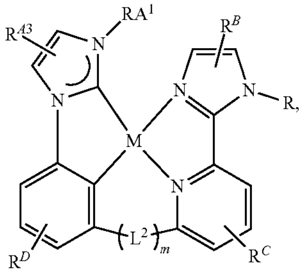
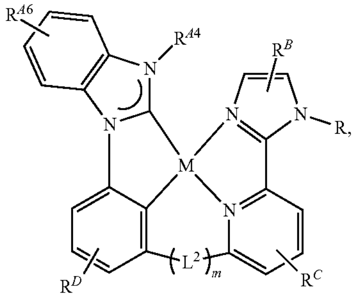
-continued
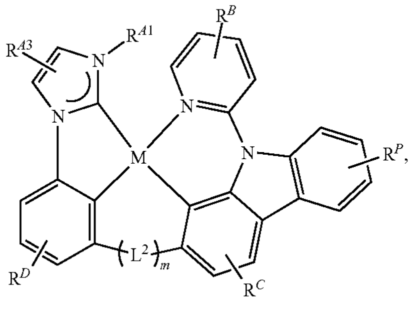
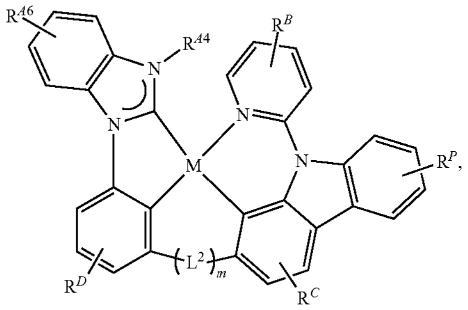
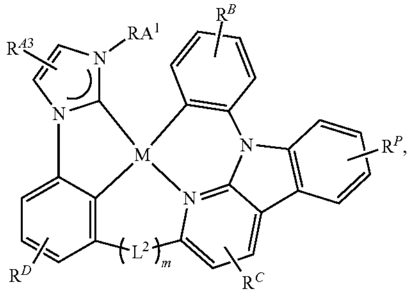
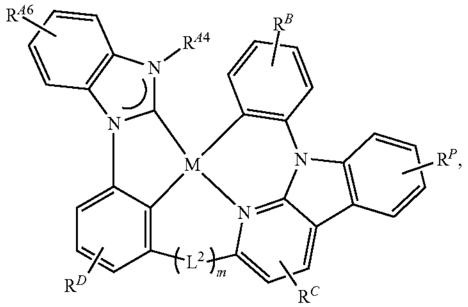
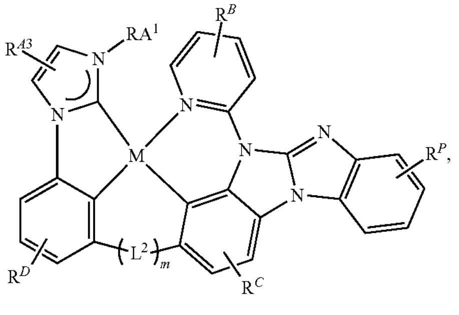

-continued

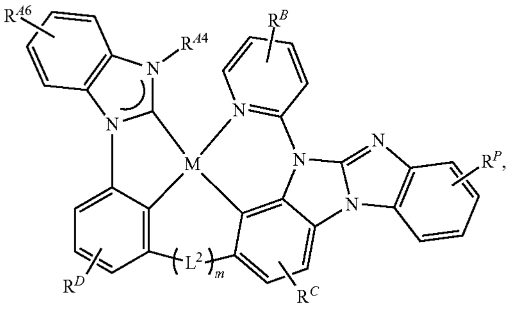

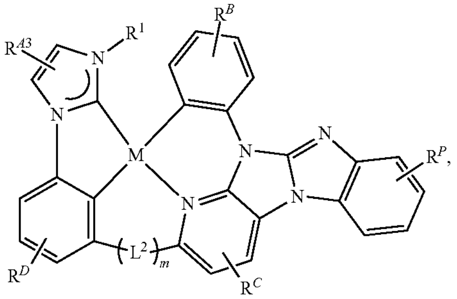

and

-continued

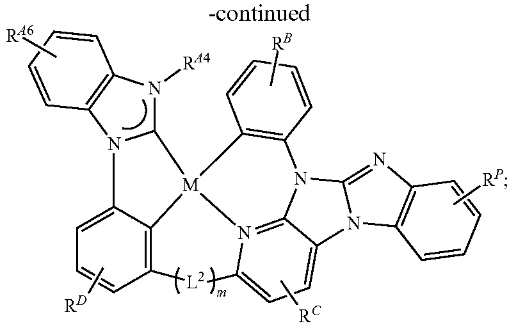

where R is selected from the group consisting of alkyl, cycloalkyl, heteroalkyl, heterocycloalkyl, aryl, heteroaryl, and combinations thereof; $R^P$ has the same definition as $R^B$ and $R^C$; and any two substituents may be joined or fused together to form a ring. In some embodiments, $R^D$ is para to the metal.

In some embodiments of the compound selected from the group consisting of Formula XI and Formula XII as defined above, the compound is selected from the group consisting of Compound y having the formula $Pt(L_{Cm})(L_{Dn})$, wherein y is an integer defined by y=25543(m−1)+n, wherein m is an integer from 1 to 2438910 and n is an integer from 1 to 25543, wherein $L_{Cm}$ have the following structures:

| $L_{Cm}$ | Structure of $L_{Cm}$ | $Ar^1$, R | m |
|---|---|---|---|
| wherein $L_{C1}$ to $L_{C110405}$ have the structure | 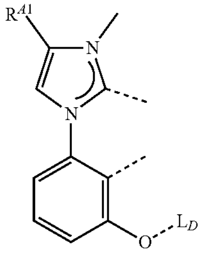 | wherein $R^{A1}$ = Rj, wherein j is an integer from 1 to 110405, and | m = j |
| wherein $L_{C110406}$-$L_{C220810}$ have the structure | 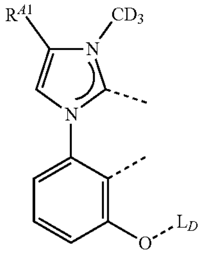 | wherein $R^{A1}$ = Rj, wherein j is an integer from 1 to 110405, and | m = j + 110405 |
| wherein $L_{C220811}$-$L_{C331215}$ have the structure | 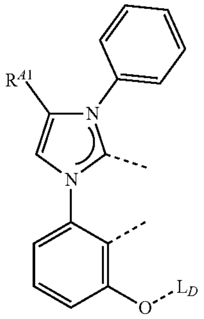 | wherein $R^{A1}$ = Rj, wherein j is an integer from 1 to 110405, and | m = j + 220810 |

-continued

| $L_{Cm}$ | Structure of $L_{Cm}$ | $Ar^1$, R | m |
|---|---|---|---|
| wherein $L_{C331216}$-$L_{C441620}$ have the structure | 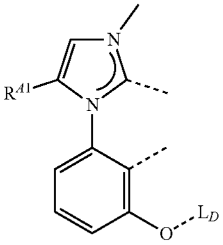 | wherein $R^{A1}$ = Rj, wherein j is an integer from 1 to 110405, and | m = j + 331215 |
| wherein $L_{C441621}$-$L_{C552025}$ have the structure | 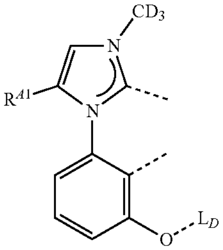 | wherein $R^{A1}$ = Rj, wherein j is an integer from 1 to 110405, and | m = j + 441620 |
| wherein $L_{C552026}$-$L_{C662430}$ have the structure | 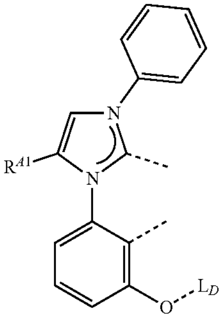 | wherein $R^{A1}$ = Rj, wherein j is an integer from 1 to 110405, and | m = j + 552025 |
| wherein $L_{C662431}$-$L_{C772835}$ have the structure | 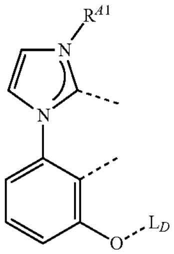 | wherein $R^{A1}$ = Rj, wherein j is an integer from 1 to 110405, and | m = j + 662430 |
| wherein $L_{C772836}$-$L_{C883240}$ have the structure | 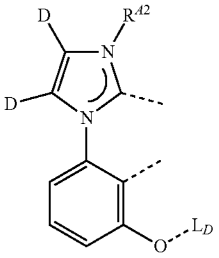 | wherein $R^{A1}$ = Rj, wherein j is an integer from 1 to 110405, and | m = j + 772835 |

-continued

| $L_{Cm}$ | Structure of $L_{Cm}$ | $Ar^1$, R | m |
|---|---|---|---|
| wherein $L_{C883241}$-$L_{C993645}$ have the structure | 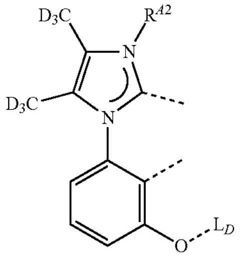 | wherein $R^{A1}$ = Rj, wherein j is an integer from 1 to 110405, and | m = j + 883240 |
| wherein $L_{C993646}$-$L_{C1104050}$ have the structure | 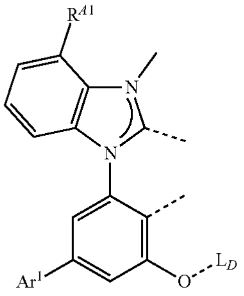 | wherein $R^{A1}$ = Rj, wherein j is an integer from 1 to 110405, and | m = j + 993645 |
| wherein $L_{C1104051}$-$L_{C1214455}$ have the structure | 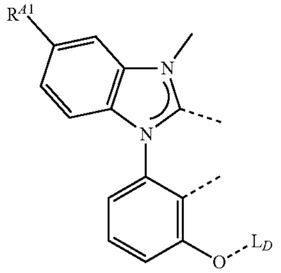 | wherein $R^{A1}$ = Rj, wherein j is an integer from 1 to 110405, and | m = j + 1104050 |
| wherein $L_{C1214456}$-$L_{C1324860}$ have the structure | 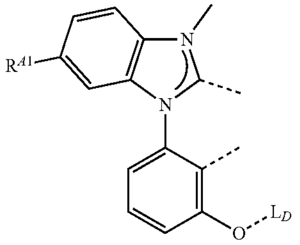 | wherein $R^{A1}$ = Rj, wherein j is an integer from 1 to 110405, and | m = j + 1214455 |
| wherein $L_{C1324861}$-$L_{C1435265}$ have the structure | 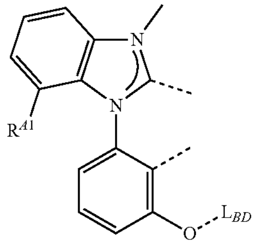 | wherein $R^{A1}$ = Rj, wherein j is an integer from 1 to 110405, and | m = j + 1324860 |

-continued

| $L_{Cm}$ | Structure of $L_{Cm}$ | $Ar^1$, R | m |
|---|---|---|---|
| wherein $L_{C1435266}$-$L_{C1545670}$ have the structure | 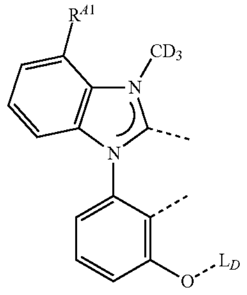 | wherein $R^{A1}$ = Rj, wherein j is an integer from 1 to 110405, and | m = j + 1435265 |
| wherein $L_{C1545671}$-$L_{C1656075}$ have the structure | 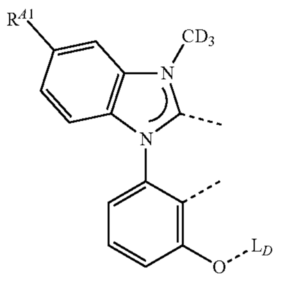 | wherein $R^{A1}$ = Rj, wherein j is an integer from 1 to 110405, and | m = j + 1545670 |
| wherein $L_{C1656076}$-$L_{C1766480}$ have the structure | 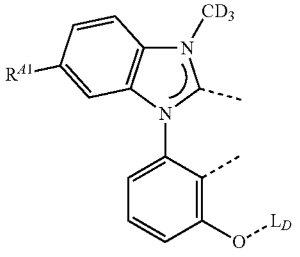 | wherein $R^{A1}$ = Rj, wherein j is an integer from 1 to 110405, and | m = j + 1656075 |
| wherein $L_{C1766481}$-$L_{C1876885}$ have the structure | 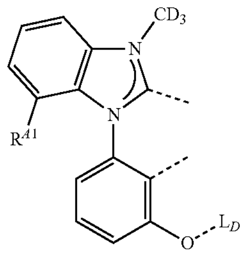 | wherein $R^{A1}$ = Rj, wherein j is an integer from 1 to 110405, and | m = j + 1766480 |
| wherein $L_{C1876886}$-$L_{C1987290}$ have the structure | 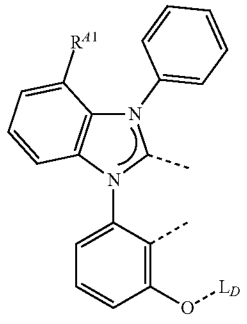 | wherein $R^{A1}$ = Rj, wherein j is an integer from 1 to 110405, and | m = j + 1876885 |

-continued

| $L_{Cm}$ | Structure of $L_{Cm}$ | $Ar^1$, R | m |
| --- | --- | --- | --- |
| wherein $L_{C1987291}$-$L_{2097695}$ have the structure | 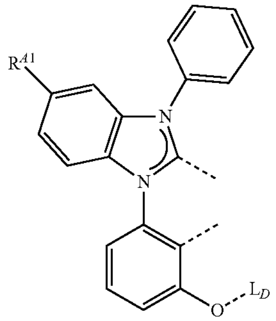 | wherein $R^{A1}$ = Rj, wherein j is an integer from 1 to 110405, and | m = j + 1987290 |
| wherein $L_{C2097696}$-$L_{C2208100}$ have the structure | 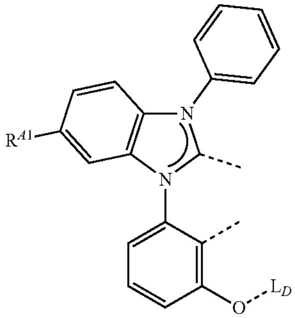 | wherein $R^{A1}$ = Rj, wherein j is an integer from 1 to 110405, and | m = j + 2097695 |
| wherein $L_{C2208101}$-$L_{C2318505}$ have the structure | 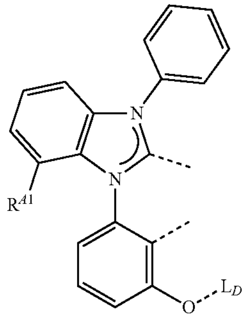 | wherein $R^{A1}$ = Rj, wherein j is an integer from 1 to 110405, and | m = j + 2208100 |
| wherein $L_{C2318506}$-$L_{C2428910}$ have the structure | 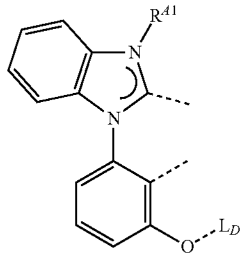 | wherein $R^{A1}$ = Rj, wherein j is an integer from 1 to 110405, and | m = j + 2318505 |
| wherein $L_{C2428911}$-$L_{C2438910}$ have the structure | 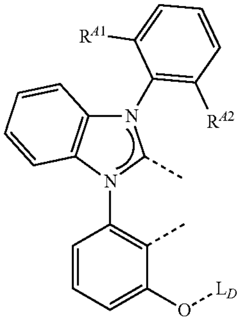 | wherein $R^{A1}$ = Bj, $R^{A2}$ = Bk, wherein j and k are independently an integer from 1 to 100, and | m = 100(j − 1) + k + 2428910 |

-continued

| $L_{Cm}$ | Structure of $L_{Cm}$ | $Ar^1$, R | m |
|---|---|---|---|
| wherein $L_{C2438911}$-$L_{C3438910}$ have the structure | 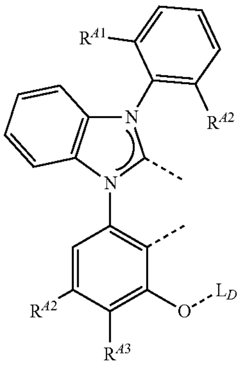 | wherein $R^{A1}$ = Bj, $R^{A2}$ = Bk, $R^{A3}$ = Bl, wherein j and k are independently an integer from 1 to 100, and | m = 10000(j − 1) + 100(k − 1) + l + 2438910 |
| wherein $L_{C3438911}$-$L_{C3448910}$ have the structure | 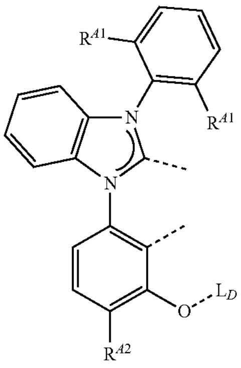 | wherein $R^{A1}$ = Bj, $R^{A2}$ = Bk, wherein j and k are independently an integer from 1 to 100, and | m = 100(j − 1) + k + 3438910 |
| wherein $L_{C3448911}$-$L_{C3458910}$ have the structure | 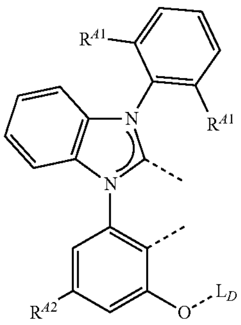 | wherein $R^{A1}$ = Bj, $R^{A2}$ = Bk, wherein j and k are independently an integer from 1 to 100, and | m = 100(j − 1) + k + 3448910 |
| wherein $L_{C3458911}$-$L_{C4458910}$ have the structure | 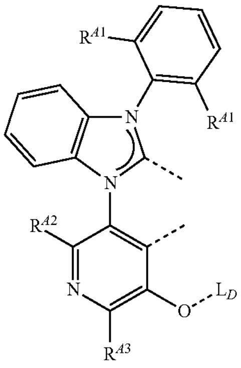 | wherein $R^{A1}$ = Bj, $R^{A2}$ = Bk, $R^{A3}$ = Bl, wherein j and k are independently an integer from 1 to 100, and | m = 10000(j − 1) + 100(k − 1) + l + 3458910 |

wherein R1 to R110405 have the following structures:

| Rj | Structure of Rm | $R^{S1}$, $R^{S2}$, $R^{S3}$ | j |
|---|---|---|---|
| wherein R1-R100 have the structure | 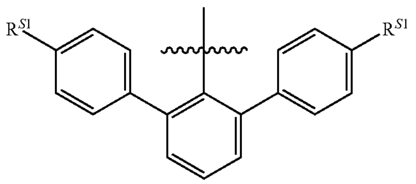 | wherein $R^{S1}$ = Bt, wherein t is an integer from 1 to 100, and | j = t |
| wherein R101-R10100 have the structure | 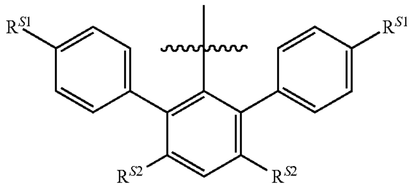 | wherein $R^{S1}$ = Bt, $R^{S2}$ = Bu wherein t and u are independently an integer from 1 to 100, and | j = 100(t − 1) + u + 100 |
| wherein R10101-R20100 have the structure | 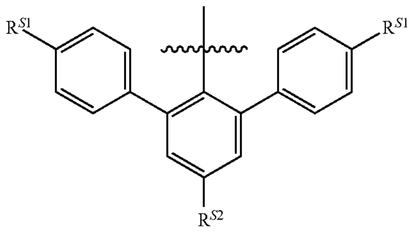 | wherein $R^{S1}$ = Bt, $R^{S2}$ = Bu wherein t and u are independently an integer from 1 to 100, and | j = 100(t − 1) + u + 10100 |
| wherein R20101-R20200 have the structure | 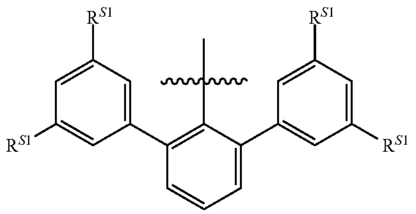 | wherein $R^{S1}$ = Bt, wherein t is an integer from 1 to 100, and | j = t + 20100 |
| wherein R20201-R30200 have the structure | 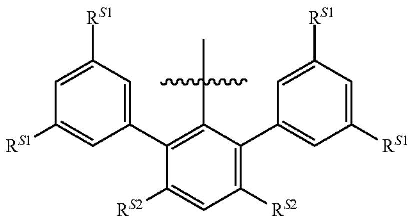 | wherein $R^{S1}$ = Bt, $R^{S2}$ = Bu wherein t and u are independently an integer from 1 to 100, and | j = 100(t − 1) + u + 20100 |
| wherein R30201-R40200 have the structure | 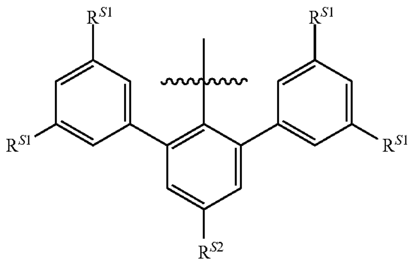 | wherein $R^{S1}$ = Bt, $R^{S2}$ = Bu wherein t and u are independdently an integer from 1 to 100, and | j = 100(t − 1) + u + 30200 |

-continued

| Rj | Structure of Rm | $R^{S1}$, $R^{S2}$, $R^{S3}$ | j |
|---|---|---|---|
| wherein R40201 have the structure | 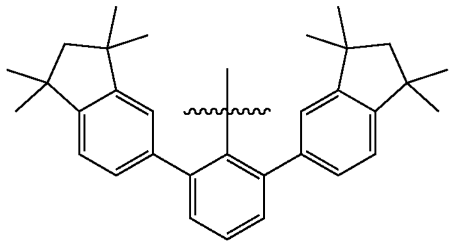 | | j = 40201 |
| wherein R40202-R40301 have the structure | 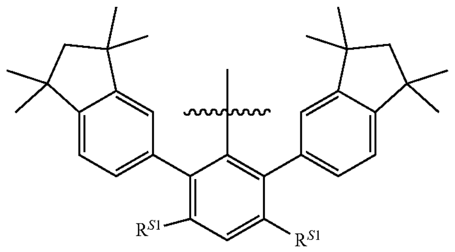 | wherein $R^{S1}$ = Bt, wherein t is an integer from 1 to 100, and | j = t + 40201 |
| wherein R40302-R40401 have the structure | 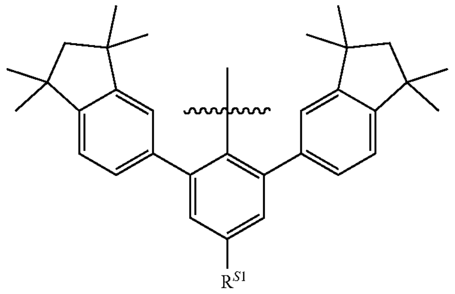 | wherein $R^{S1}$ = Bt, wherein t is an integer from 1 to 100, and | j = t + 40301 |
| wherein R40402 have the structure | 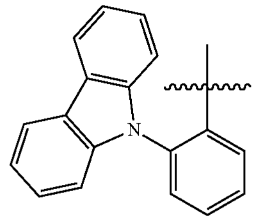 [SMILES: *c1ccccc1-n1c2ccccc2c2ccccc21] | | j = 40402 |
| wherein R40403-R40502 have the structure | 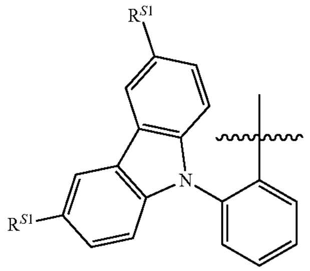 | wherein $R^{S1}$ = Bt, wherein t is an integer from 1 to 100, and | j = t + 40402 |
| wherein R40503-R40602 have the structure | 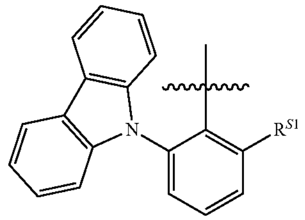 | wherein $R^{S1}$ = Bt, wherein t is an integer from 1 to 100, and | j = t + 40502 |

-continued

| Rj | Structure of Rm | $R^{S1}$, $R^{S2}$, $R^{S3}$ | j |
|---|---|---|---|
| wherein R40603-R50602 have the structure | 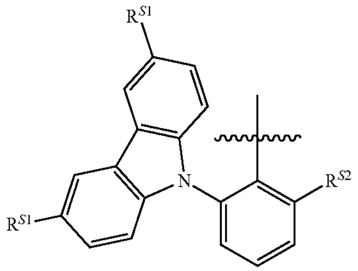 | wherein $R^{S1}$ = Bt, $R^{S2}$ = Bu wherein t and u are independently an integer from 1 to 100, and | j = 100(t − 1) + u + 40602 |
| wherein R50603 have the structure | 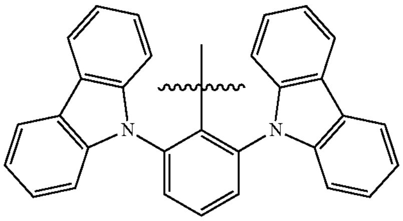 [SMILES: *c1c(-n2c3ccccc3c3ccccc32)cccc1-n1c2ccccc2c2ccccc21] | | j = 50603 |
| wherein R50604-R50703 have the structure | 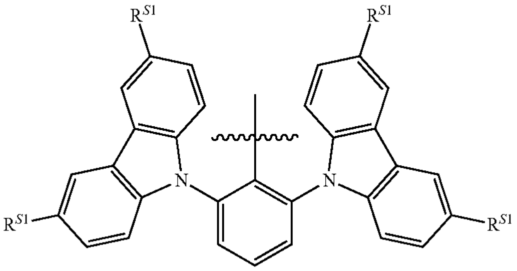 | wherein $R^{S1}$ = Bt, wherein t is an integer from 1 to 100, and | j = t + 50603 |
| wherein R50704 have the structure | 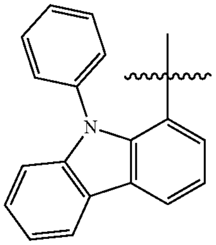 [SMILES: *c1cccc2c3ccccc3n(-c3ccccc3)c12] | | j = 50704 |
| wherein R50705-R50804 have the structure | 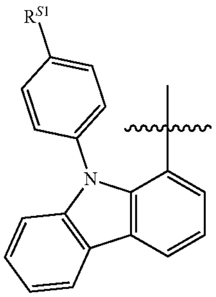 | wherein $R^{S1}$ = Bt, wherein t is an integer from 1 to 100, and | j = t + 50704 |

-continued

| Rj | Structure of Rm | $R^{S1}$, $R^{S2}$, $R^{S3}$ | j |
|---|---|---|---|
| wherein R50805-R50904 have the structure | 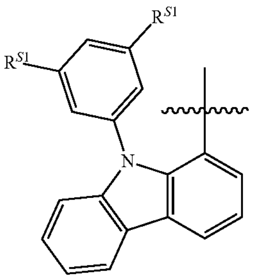 | wherein $R^{S1}$ = Bt, wherein t is an integer from 1 to 100, and | j = t + 50804 |
| wherein R50905-R51004 have the structure | 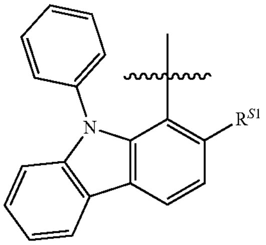 | wherein $R^{S1}$ = Bt, wherein t is an integer from 1 to 100, and | s = t + 50904 |
| wherein R51005-R61004 have the structure | 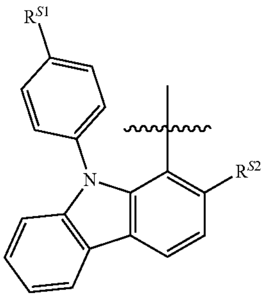 | wherein $R^{S1}$ = Bt, $R^{S2}$ = Bu wherein t and u are independently an integer from 1 to 100, and | j = 30(t − 1) + u + 51004 |
| wherein R61005-R71004 have the structure | 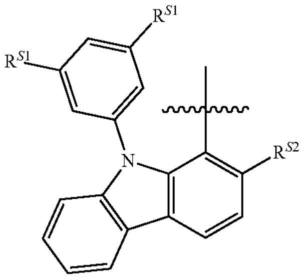 | wherein RS1 = Bt, RS2 = Bu wherein t and u are independently an integer from 1 to 100, and | j = 30(t − 1) + u + 61004 |
| wherein R71005 have the structure | 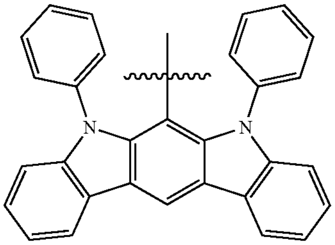 [SMILES: *c1c2c(cc3c4ccccc4n(-c4ccccc4)c13)c1ccccc1n2-c1ccccc1] | | j = 71005 |

-continued

| Rj | Structure of Rm | $R^{S1}$, $R^{S2}$, $R^{S3}$ | j |
|---|---|---|---|
| wherein R71006-R71105 have the structure | 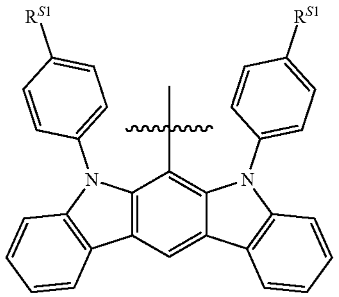 | wherein $R^{S1}$ = Bt, wherein t is an integer from 1 to 100, and | j = t + 71105 |
| wherein R71106-R71205 have the structure | 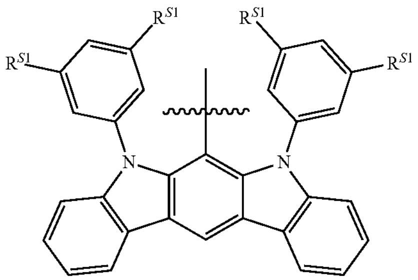 | wherein $R^{S1}$ = Bt, wherein t is an integer from 1 to 100, and | j = t + 71105 |
| wherein R71206-R71305 have the structure | 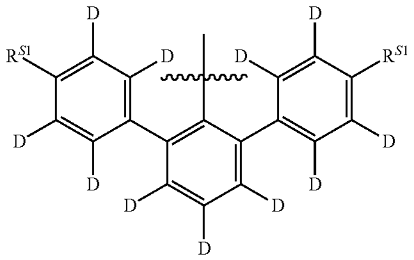 | wherein $R^{S1}$ = Bt, wherein t is an integer from 1 to 100, and | j = t + 71205 |
| wherein R71306-R81305 have the structure | 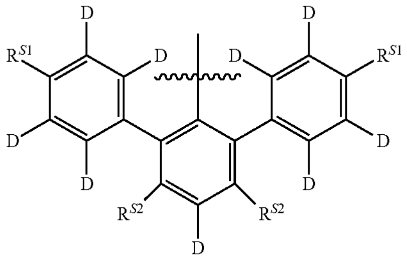 | wherein $R^{S1}$ = Bt, RS2 = Bu wherein t and u are independently an integer from 1 to 100, and | j = 100(t − 1) + u + 71305 |
| wherein R81306-R91305 have the structure | 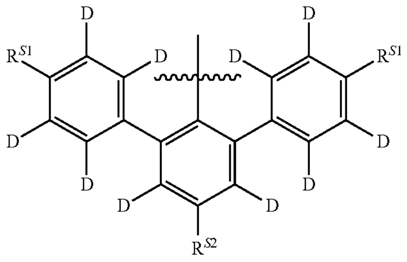 | wherein $R^{S1}$ = Bt, $R^{S2}$ = Bu wherein t and u are independently an integer from 1 to 100, and | j = 100(t − 1) + u + 81305 |

-continued

| Rj | Structure of Rm | $R^{S1}$, $R^{S2}$, $R^{S3}$ | j |
|---|---|---|---|
| wherein R91306-R91405 have the structure | 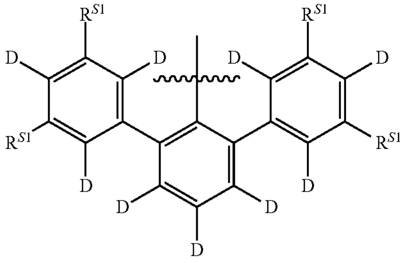 | wherein $R^{S1}$ = Bt, wherein t is an integer from 1 to 100, and | j = t + 91305 |
| wherein R91406-R101405 have the structure | 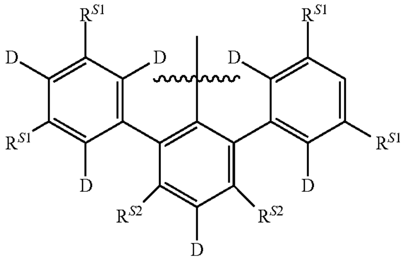 | wherein $R^{S1}$ = Bt, $R^{S2}$ = Bu wherein t and u are independently an integer from 1 to 100, and | j = 100(t − 1) + u + 91405 |
| wherein R101406-R110405 have the structure | 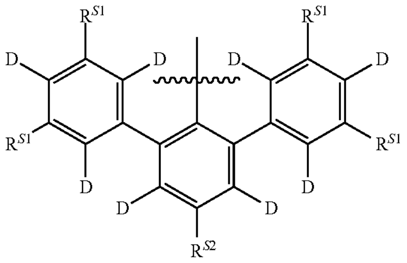 | wherein $R^{S1}$ = Bt, $R^{S2}$ = Bu wherein t and u are independently an integer from 1 to 100, and | j = 100(t − 1) + u + 101405 |

wherein B1 to B100 have the following structures:

B1

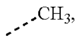

B2

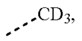

B3

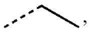

B4

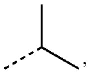

B5

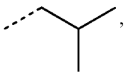

B6

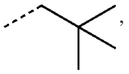

B7

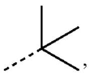

B8

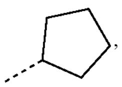

-continued

B9

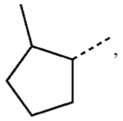

B10

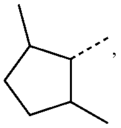

B11

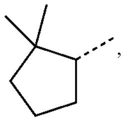

B12

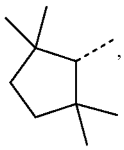

B13

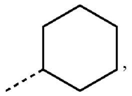

-continued
B14
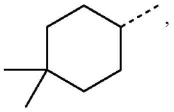
B15
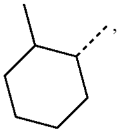
B16
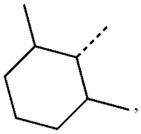
B17
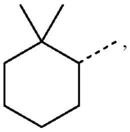
B18
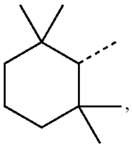
B19
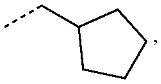
B20
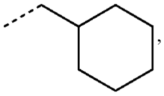
B21
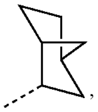
B22
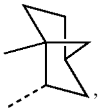
B23
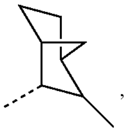
B24
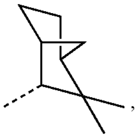
B25
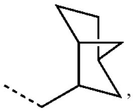
-continued
B26
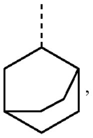
B27
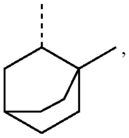
B28
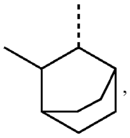
B29
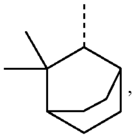
B30
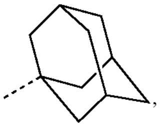
B31
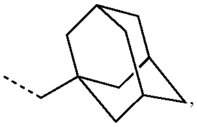
B32
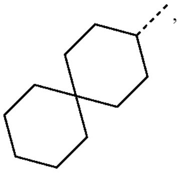
B33
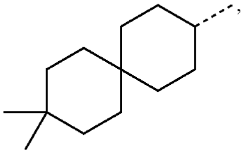
B34
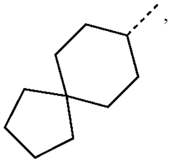
B35
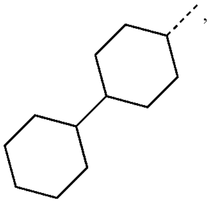

-continued
B36
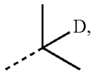
B37
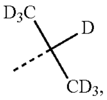
B38
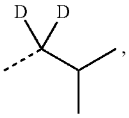
B39
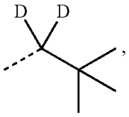
B40
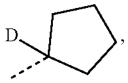
B41
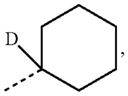
B42
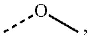
B43
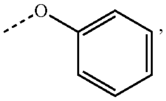
B44
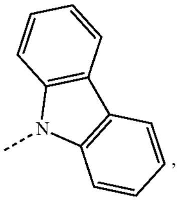
B45
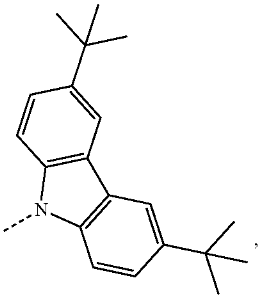
B46
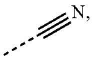
B47
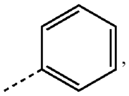
-continued
B48
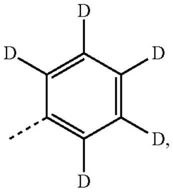
B49
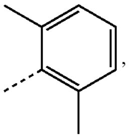
B50
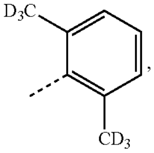
B51
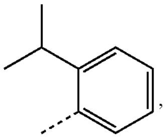
B52
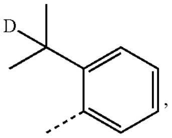
B53
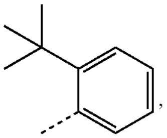
B54
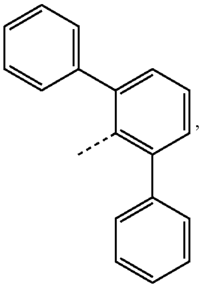

-continued
B55
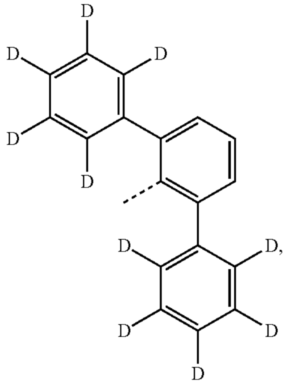
B56
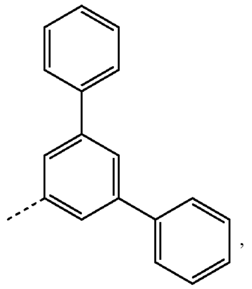
B57
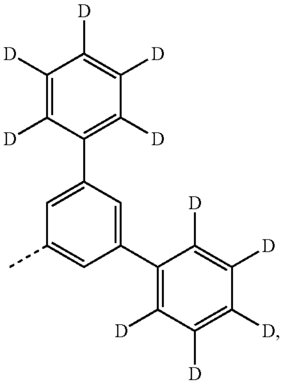
B58
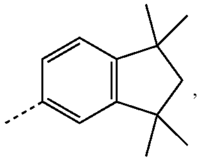
B59
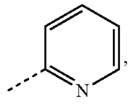
B60
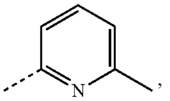
B61
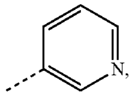
-continued
B62
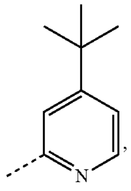
B63
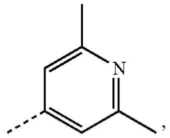
B64
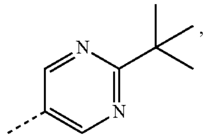
B65
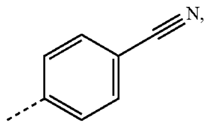
B66
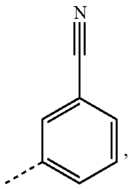
B67
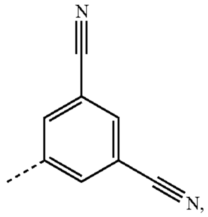
B68
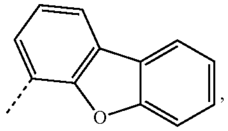
B69
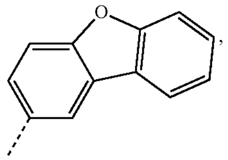
B70
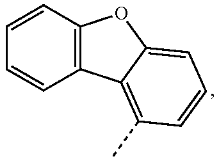

-continued
B71
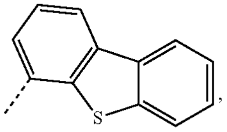
B72
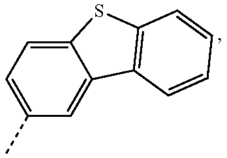
B73
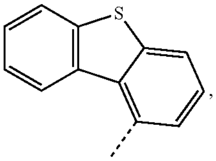
B74
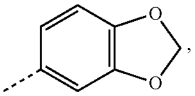
B75
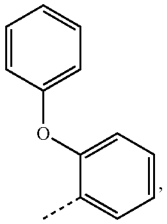
B76
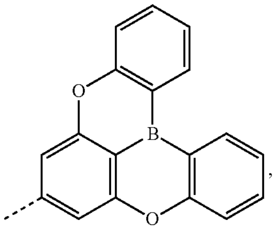
B77
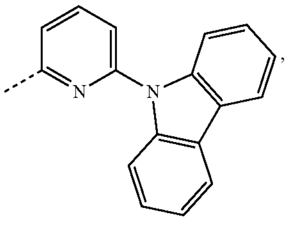
-continued
B78
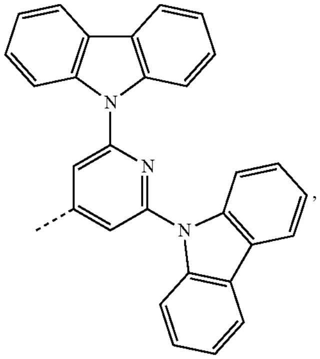
B79
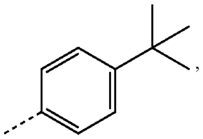
B80
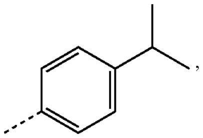
B81
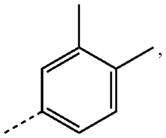
B82
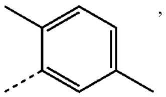
B83
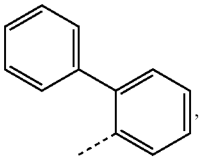
B84
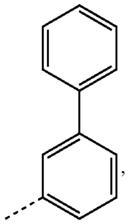
B85
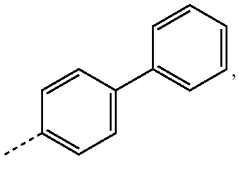

-continued
B86
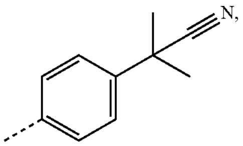,
B87
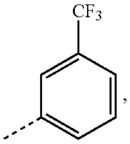,
B88
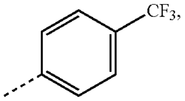,
B89
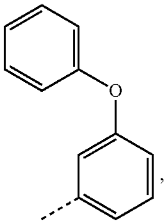,
B90
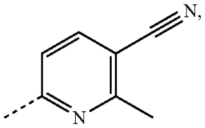,
B91
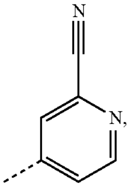,
B92
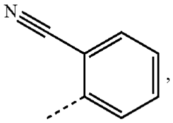,
B93
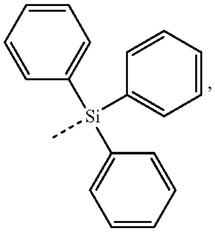,
B94
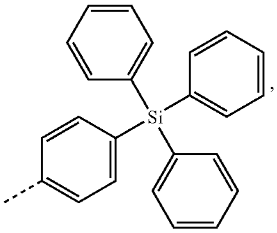,
-continued
B95
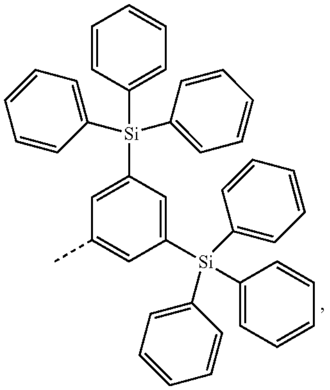,
B96
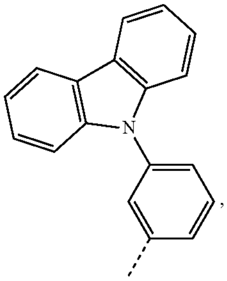,
B97
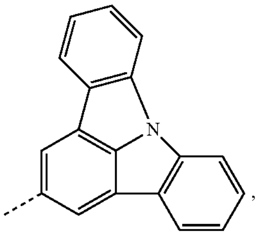,
B98
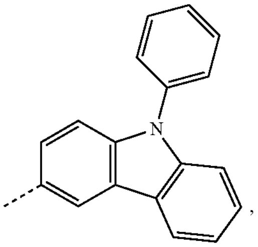,
B99
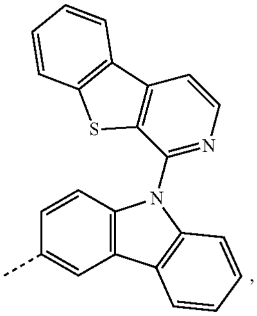, and -continued

B100

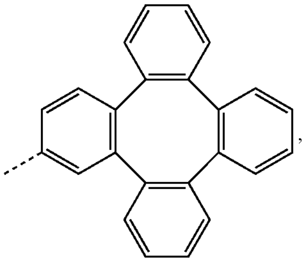

and $L_{Dn}$ have the following structures $L_{D1}$ to $L_{D25543}$:

| $L_{Dn}$ | $L_{Dn}$ structure | $Ar^2$, $Ar^3$, $R^2$ | n |
|---|---|---|---|
| wherein $L_{D1}$-$L_{D30}$ have the structure | 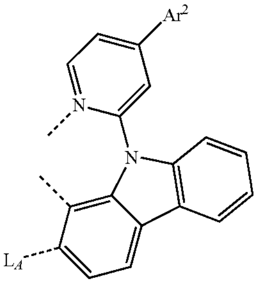 | wherein $Ar^2$ = Aj, wherein j is an integer from 1 to 30, and | n = j |
| wherein $L_{D31}$ has the structure | 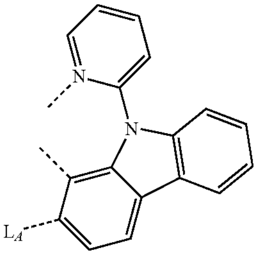 | | n = 31 |
| wherein $L_{D32}$-$L_{D931}$ have the structure | 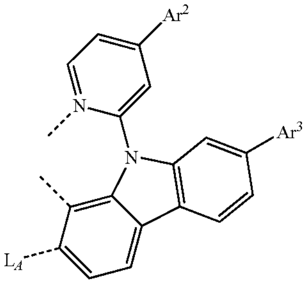 | wherein $Ar^2$ = Aj and $Ar^3$ = Am, wherein j is an integer from 1 to 30 and m is an integer from 1 to 30, and | n = 30(j − 1) + m + 31 |
| wherein $L_{D932}$-$L_{D961}$ have the structure | 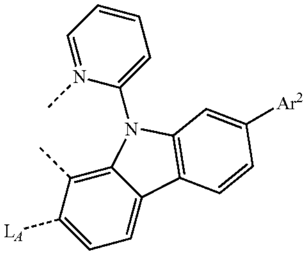 | wherein $Ar^2$ = Aj, wherein j is an integer from 1 to 30, and | n = j + 931 |

-continued

| $L_{Dn}$ | $L_{Dn}$ structure | $Ar^2$, $Ar^3$, $R^2$ | n |
|---|---|---|---|
| wherein $L_{D962}$-$L_{D1861}$ have the structure | 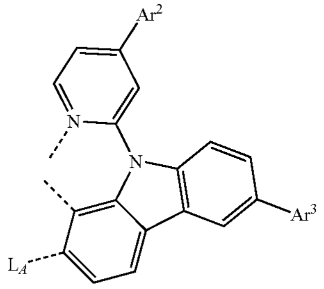 | wherein $Ar^2$ = Aj and $Ar^3$ = Am, wherein j is an integer from 1 to 30 and m is an integer from 1 to 30, and | n = 30(j − 1) + m + 961 |
| wherein $L_{D1862}$-$L_{D1891}$ have the structure | 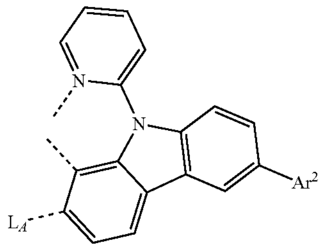 | wherein $Ar^2$ = Aj, wherein j is an integer from 1 to 30, and | n = j + 1861 |
| wherein $L_{D1892}$-$L_{D1921}$ have the structure | 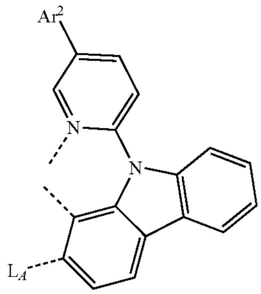 | wherein $Ar^2$ = Aj, wherein j is an integer from 1 to 30, and | n = j + 1891 |
| wherein $L_{D1922}$-$L_{D2821}$ have the structure | 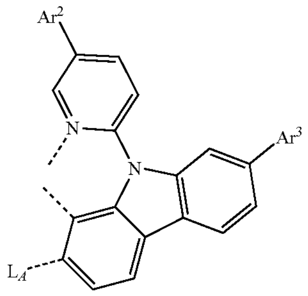 | wherein $Ar^2$ = Aj and $Ar^3$ = Am, wherein j is an integer from 1 to 30 and m is an integer from 1 to 30, and | n = 30(j − 1) + m + 1921 |
| wherein $L_{D2822}$-$L_{D3721}$ have the structure | 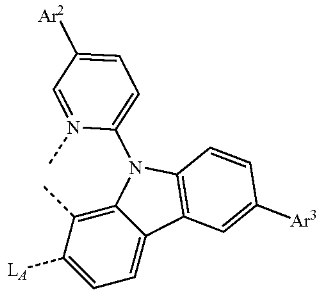 | wherein $Ar^2$ = Aj and $Ar^3$ = Am, wherein j is an integer from 1 to 30 and m is an integer from 1 to 30, and | n = 30(j − 1) + m + 2821 |

-continued

| $L_{Dn}$ | $L_{Dn}$ structure | $Ar^2$, $Ar^3$, $R^2$ | n |
| --- | --- | --- | --- |
| wherein $L_{D3722}$-$L_{D4621}$ have the structure | 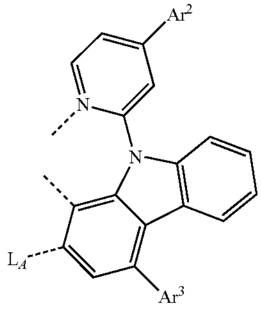 | wherein $Ar^2$ = Aj and $Ar^3$ = Am, wherein j is an integer from 1 to 30 and m is an integer from 1 to 30, and | n = 30(j − 1) + m + 3721 |
| wherein $L_{D4622}$-$L_{D4651}$ have the structure | 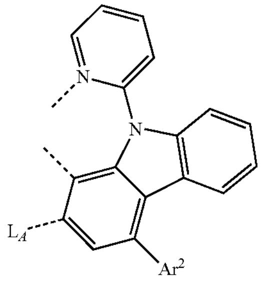 | wherein $Ar^2$ = Aj, wherein j is an integer from 1 to 30, and | n = j + 4621 |
| wherein $L_{D4652}$-$L_{D5551}$ have the structure | 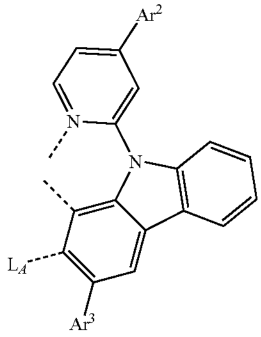 | wherein $Ar^2$ = Aj and $Ar^3$ = Am, wherein j is an integer from 1 to 30 and m is an integer from 1 to 30, and | n = 30(j − 1) + m + 4651 |
| wherein $L_{D5552}$-$L_{D5581}$ have the structure | 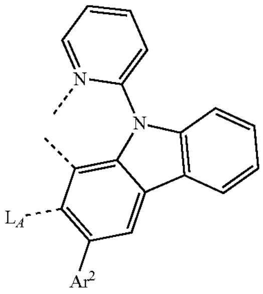 | wherein $Ar^2$ = Aj, wherein j is an integer from 1 to 30, and | n = j + 5551 |
| wherein $L_{D5582}$-$L_{D6481}$ have the structure | 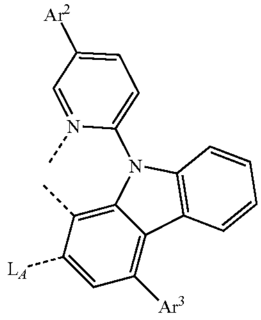 | wherein $Ar^2$ = Aj and $Ar^3$ = Am, wherein j is an integer from 1 to 30 and m is an integer from 1 to 30, and | n = 30(j − 1) + m + 5581 |

-continued

| $L_{Dn}$ | $L_{Dn}$ structure | $Ar^2$, $Ar^3$, $R^2$ | n |
|---|---|---|---|
| wherein $L_{D6482}$-$L_{D7381}$ have the structure | 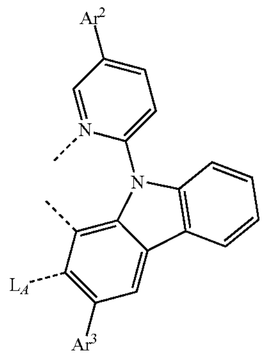 | wherein $Ar^2$ = Aj and $Ar^3$ = Am, wherein j is an integer from 1 to 30 and m is an integer from 1 to 30, and | n = 30(j − 1) + m + 6481 |
| wherein $L_{D7382}$ has the structure | 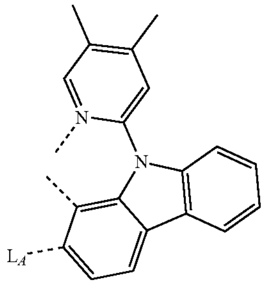 | | n = 7382 |
| wherein $L_{D7383}$-$L_{D7412}$ have the structure | 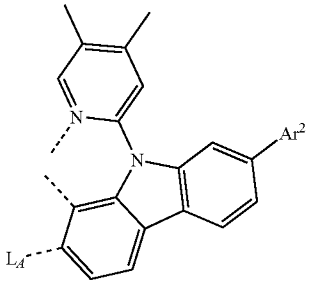 | wherein $Ar^2$ = Aj, wherein j is an integer from 1 to 30, and | n = j + 7382 |
| wherein $L_{D7413}$-$L_{D7442}$ have the structure | 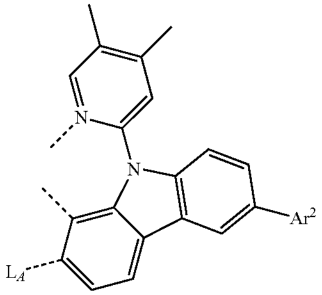 | wherein $Ar^2$ = Aj, wherein j is an integer from 1 to 30, and | n = j + 7412 |
| wherein $L_{D7443}$-$L_{D7472}$ have the structure | 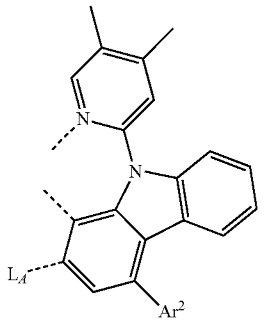 | wherein $Ar^2$ = Aj, wherein j is an integer from 1 to 30, and | n = j + 7442 |

-continued

| $L_{Dn}$ | $L_{Dn}$ structure | $Ar^2$, $Ar^3$, $R^2$ | n |
|---|---|---|---|
| wherein $L_{D7473}$-$L_{D7502}$ have the structure | 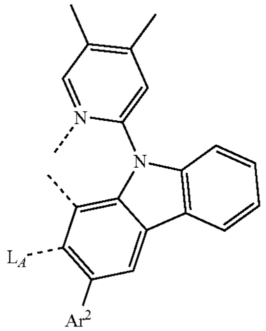 | wherein $Ar^2$ = Aj, wherein j is an integer from 1 to 30, and | n = j + 7472 |
| wherein $L_{D7503}$ has the structure | 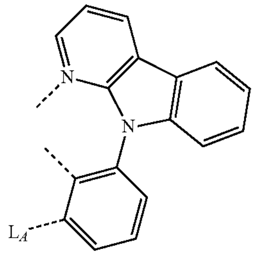 | | n = 7503 |
| wherein $L_{D7504}$-$L_{D7533}$ have the structure | 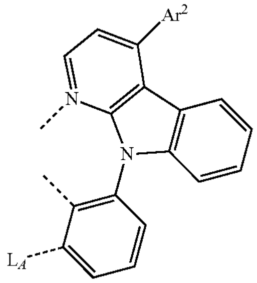 | wherein $Ar^2$ = Aj, wherein j is an integer from 1 to 30, and | n = j + 7503 |
| wherein $L_{D7534}$-$L_{D8433}$ have the structure | 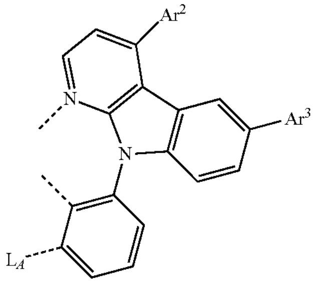 | wherein $Ar^2$ = Aj and $Ar^3$ = Am, wherein j is an integer from 1 to 30 and m is an integer from 1 to 30, and | n = 30(j − 1) + m + 7533 |
| wherein $L_{D8434}$-$L_{D8463}$ have the structure | 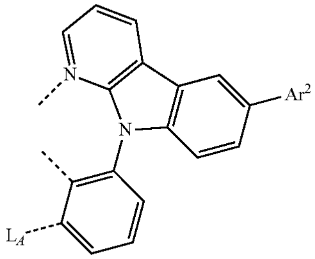 | wherein $Ar^2$ = Aj, wherein j is an integer from 1 to 30, and | n = j + 8433 |

-continued

| $L_{Dn}$ | $L_{Dn}$ structure | $Ar^2$, $Ar^3$, $R^2$ | n |
| --- | --- | --- | --- |
| wherein $L_{D8464}$-$L_{D9363}$ have the structure | 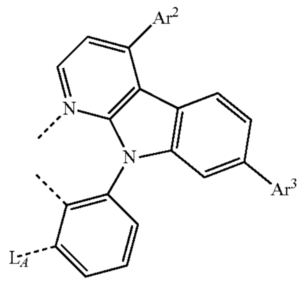 | wherein $Ar^2$ = Aj and $Ar^3$ = Am, wherein j is an integer from 1 to 30 and m is an integer from 1 to 30, and | n = 30(j − 1) + m + 8463 |
| wherein $L_{D9364}$-$L_{D9393}$ have the structure | 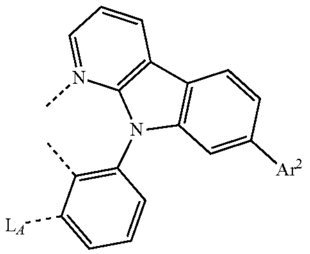 | wherein $Ar^2$ = Aj, wherein j is an integer from 1 to 30, and | n = j + 9363 |
| wherein $L_{D9394}$-$L_{D9423}$ have the structure | 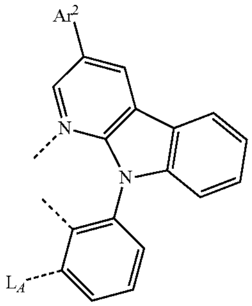 | wherein $Ar^2$ = Aj, wherein j is an integer from 1 to 30, and | n = j + 9393 |
| wherein $L_{D9424}$-$L_{D10323}$ have the structure | 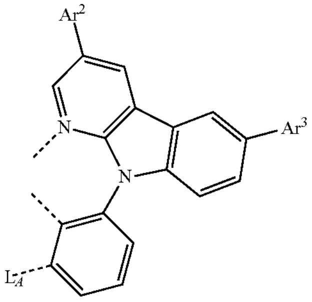 | wherein $Ar^2$ = Aj and $Ar^3$ = Am, wherein j is an integer from 1 to 30 and m is an integer from 1 to 30, and | n = 30(j − 1) + m + 9423 |
| wherein $L_{D10324}$-$L_{D11223}$ have the structure | 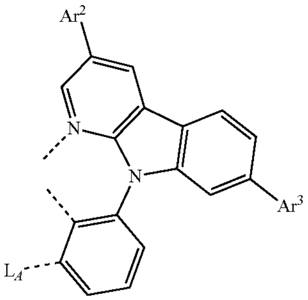 | wherein $Ar^2$ = Aj and $Ar^3$ = Am, wherein j is an integer from 1 to 30 and m is an integer from 1 to 30, and | n = 30(j − 1) + m + 10323 |

-continued

| $L_{Dn}$ | $L_{Dn}$ structure | $Ar^2$, $Ar^3$, $R^2$ | n |
|---|---|---|---|
| wherein $L_{D11224}$-$L_{D11253}$ have the structure | 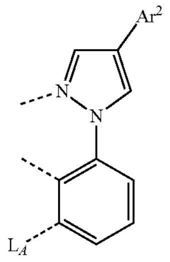 | wherein $Ar^2$ = Aj, wherein j is an integer from 1 to 30, and | n = j + 11223 |
| wherein $L_{D11254}$ has the structure | 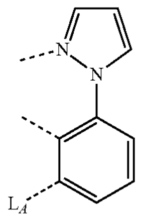 | | n = 11254 |
| wherein $L_{D11255}$-$L_{D11284}$ have the structure | 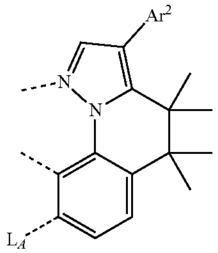 | wherein $Ar^2$ = Aj, wherein j is an integer from 1 to 30, and | n = j + 11254 |
| wherein $L_{D11285}$ has the structure | 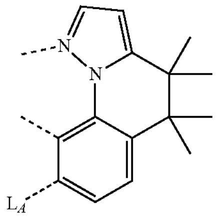 | | n = 11285 |
| wherein $L_{D11286}$-$L_{D12185}$ have the structure | 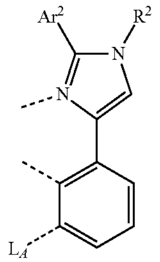 | wherein $Ar^2$ = Aj and $R^2$ = Al, wherein j is an integer from 1 to 30 and l is an integer from 1 to 30, and | n = 30(j − 1) + l + 11285 |
| wherein $L_{D12186}$-$L_{D12215}$ have the structure | 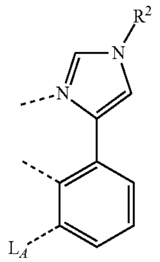 | wherein $R^2$ = Al, wherein l is an integer from 1 to 30, and | n = l + 12185 |

-continued

| $L_{Dn}$ | $L_{Dn}$ structure | $Ar^2$, $Ar^3$, $R^2$ | n |
|---|---|---|---|
| wherein $L_{D12216}$-$L_{D13115}$ have the structure | 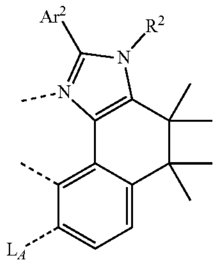 | wherein $Ar^2$ = Aj and $R^2$ = Al, wherein j is an integer from 1 to 30 and l is an integer from 1 to 30, and | n = 30(j − 1) + l + 12215 |
| wherein $L_{D13116}$-$L_{D13145}$ have the structure | 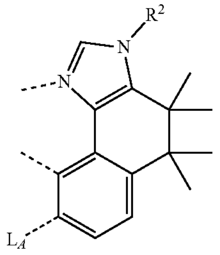 | wherein $R^2$ = Al, wherein l is an integer from 1 to 30, and | n = l + 13115 |
| wherein $L_{D13146}$-$L_{D14045}$ have the structure | 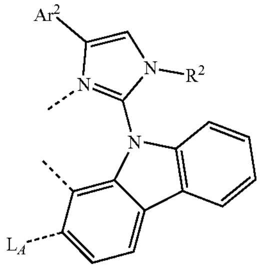 | wherein $Ar^2$ = Aj and $R^2$ = Al, wherein j is an integer from 1 to 30 and l is an integer from 1 to 30, and | n = 30(j − 1) + l + 13145 |
| wherein $L_{D14046}$-$L_{D14075}$ have the structure | 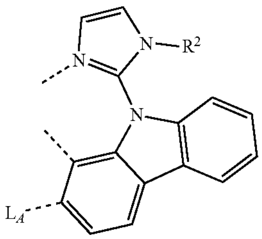 | wherein $R^2$ = Al, wherein l is an integer from 1 to 30, and | n = l + 14045 |
| wherein $L_{D14076}$-$L_{D14975}$ have the structure | 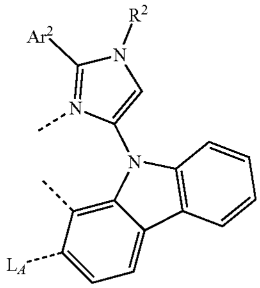 | wherein $Ar^2$ = Aj and $R^2$ = Al, wherein j is an integer from 1 to 30 and l is an integer from 1 to 30, and | n = 30(j − 1) + l + 14075 |

-continued

| $L_{Dn}$ | $L_{Dn}$ structure | $Ar^2$, $Ar^3$, $R^2$ | n |
|---|---|---|---|
| wherein $L_{D14976}$-$L_{D15005}$ have the structure | 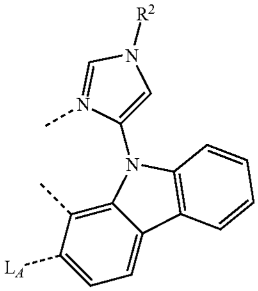 | wherein $R^2$ = Al, wherein l is an integer from 1 to 30, and | n = l + 14975 |
| wherein $L_{D15006}$-$L_{D15905}$ have the structure | 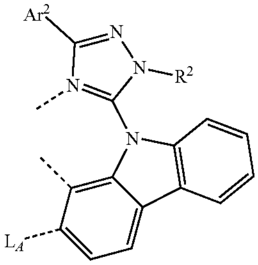 | wherein $Ar^2$ = Aj and $R^2$ = Al, wherein j is an integer from 1 to 30 and l is an integer from 1 to 30, and | n = 30(j − 1) + l + 15005 |
| wherein $L_{D15906}$-$L_{D15935}$ have the structure | 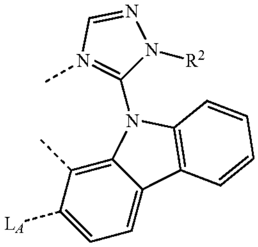 | wherein $R^2$ = Al, wherein l is an integer from 1 to 30, and | n = l + 15905 |
| wherein $L_{D15936}$-$L_{D16835}$ have the structure | 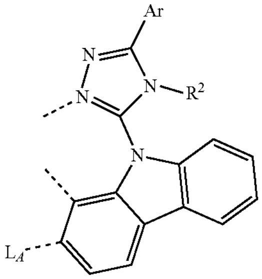 | wherein $Ar^2$ = Aj and $R^2$ = Al, wherein j is an integer from 1 to 30 and l is an integer from 1 to 30, and | n = 30(j − 1) + l + 15935 |
| wherein $L_{D16836}$-$L_{D16865}$ have the structure | 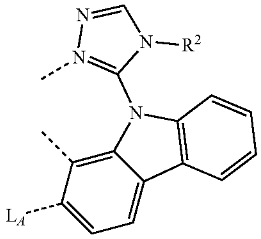 | wherein $R^2$ = Al, wherein l is an integer from 1 to 30, and | n = l + 16835 |

-continued

| $L_{Dn}$ | $L_{Dn}$ structure | $Ar^2$, $Ar^3$, $R^2$ | n |
| --- | --- | --- | --- |
| wherein $L_{D16866}$-$L_{D17765}$ have the structure | 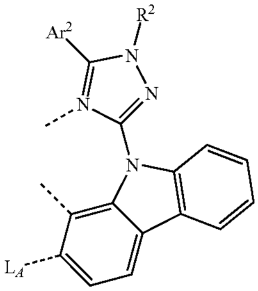 | wherein Ar2 = Aj and R2 = Al, wherein j is an integer from 1 to 30 and l is an integer from 1 to 30, and | n = 30(j − 1) + l + 16865 |
| wherein $L_{D17766}$-$L_{D17795}$ have the structure | 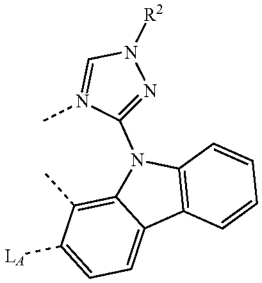 | wherein $R^2$ = Al, wherein l is an integer from 1 to 30, and | n = l + 17765 |
| wherein $L_{D17796}$-$L_{D17825}$ have the structure | 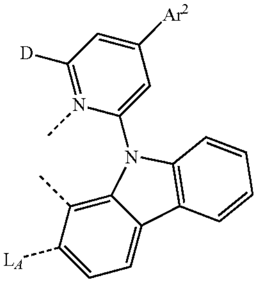 | wherein $Ar^2$ = Aj, wherein j is an integer from 1 to 30, and | n = j + 17795 |
| wherein $L_{D17826}$ has the structure | 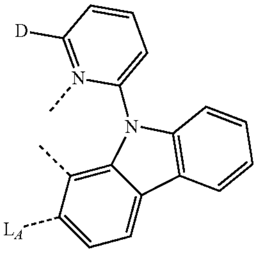 | | n = 17826 |
| wherein $L_{D17827}$-$L_{D18726}$ have the structure | 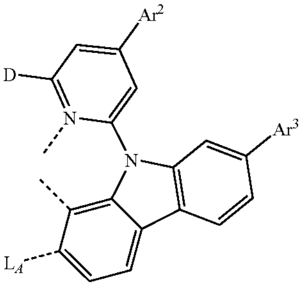 | wherein $Ar^2$ = Aj and $Ar^3$ = Am, wherein j is an integer from 1 to 30 and m is an integer from 1 to 30, and | n = 30(j − 1) + m + 17826 |

-continued

| $L_{Dn}$ | $L_{Dn}$ structure | $Ar^2$, $Ar^3$, $R^2$ | n |
|---|---|---|---|
| wherein $L_{D18727}$-$L_{D18756}$ have the structure | 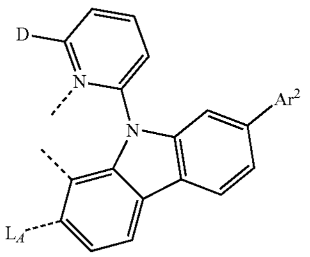 | wherein $Ar^2$ = Aj, wherein j is an integer from 1 to 30, and | n = j + 18726 |
| wherein $L_{D18757}$-$L_{D19656}$ have the structure | 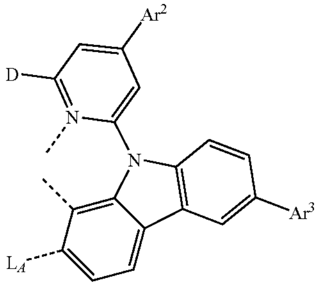 | wherein $Ar^2$ = Aj and $Ar^3$ = Am, wherein j is an integer from 1 to 30 and m is an integer from 1 to 30, and | n = 30(j − 1) + m + 18756 |
| wherein $L_{D19657}$-$L_{D19686}$ have the structure | 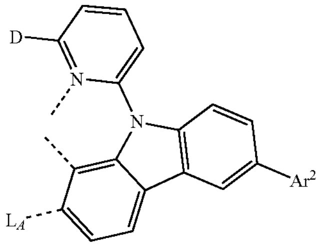 | wherein $Ar^2$ = Aj, wherein j is an integer from 1 to 30, and | n = j + 19656 |
| wherein $L_{D19687}$-$L_{D19716}$ have the structure | 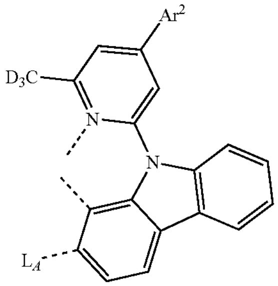 | wherein $Ar^2$ = Aj, wherein j is an integer from 1 to 30, and | n = j + 19686 |
| wherein $L_{D19717}$ have the structure | 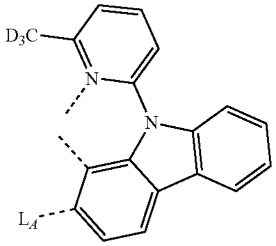 | | n = 19717 |

-continued

| $L_{Dn}$ | $L_{Dn}$ structure | $Ar^2$, $Ar^3$, $R^2$ | n |
|---|---|---|---|
| wherein $L_{D19718}$-$L_{D20617}$ have the structure | 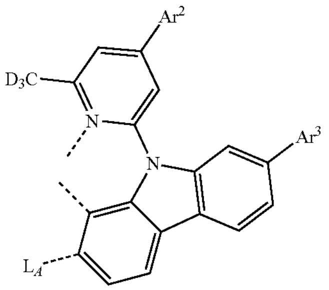 | wherein $Ar^2$ = Aj and $Ar^3$ = Am, wherein j is an integer from 1 to 30 and m is an integer from 1 to 30, and | n = 30(j − 1) + m + 19717 |
| wherein $L_{D20618}$-$L_{D20647}$ have the structure | 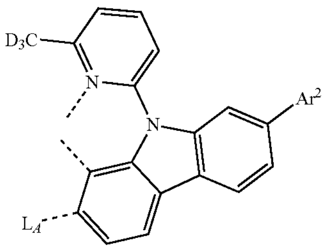 | wherein $Ar^2$ = Aj, wherein j is an integer from 1 to 30, and | n = j + 20617 |
| wherein $L_{D20648}$-$L_{D21547}$ have the structure | 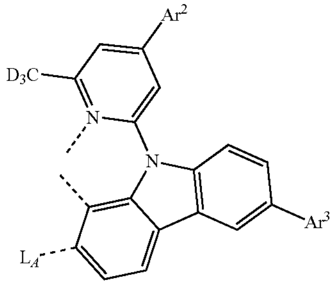 | wherein $Ar^2$ = Aj and $Ar^3$ = Am, wherein j is an integer from 1 to 30 and m is an integer from 1 to 30, and | n = 30(j − 1) + m + 20647 |
| wherein $L_{D21548}$-$L_{D21577}$ have the structure | 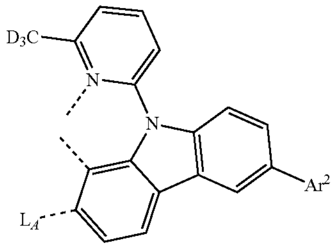 | wherein $Ar^2$ = Aj, wherein j is an integer from 1 to 30, and | n = j + 21547 |
| wherein $L_{D21578}$-$L_{D22477}$ have the structure | 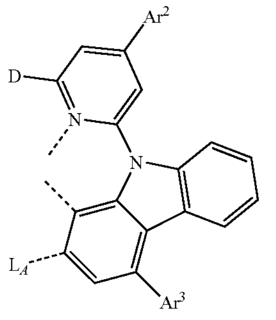 | wherein $Ar^2$ = Aj and $Ar^3$ = Am, wherein j is an integer from 1 to 30 and m is an integer from 1 to 30, and | n = 30(j − 1) + m + 21577 |

-continued

| $L_{Dn}$ | $L_{Dn}$ structure | $Ar^2$, $Ar^3$, $R^2$ | n |
|---|---|---|---|
| wherein $L_{D22478}$-$L_{D22507}$ have the structure | 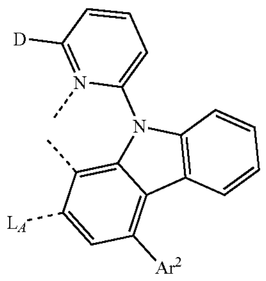 | wherein $Ar^2$ = Aj, wherein j is an integer from 1 to 30, and | n = j + 22477 |
| wherein $L_{D22508}$-$L_{D23407}$ have the structure | 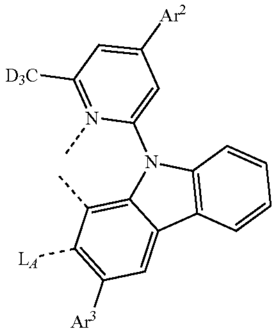 | wherein $Ar^2$ = Aj and $Ar^3$ = Am, wherein j is an integer from 1 to 30 and m is an integer from 1 to 30, and | n = 30(j − 1) + m + 22507 |
| wherein $L_{D23408}$-$L_{D23437}$ have the structure | 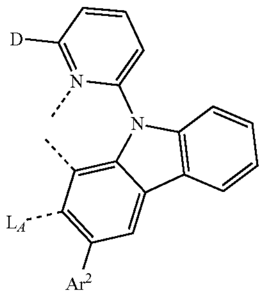 | wherein $Ar^2$ = Aj, wherein j is an integer from 1 to 30, and | n = j + 23407 |
| wherein $L_{D23438}$-$L_{D24337}$ have the structure | 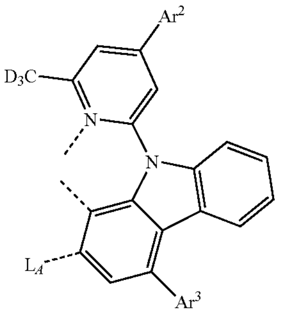 | wherein $Ar^2$ = Aj and $Ar^3$ = Am, wherein j is an integer from 1 to 30 and m is an integer from 1 to 30, and | n = 30(j − 1) + m + 23437 |
| wherein $L_{D24338}$-$L_{D24367}$ have the structure | 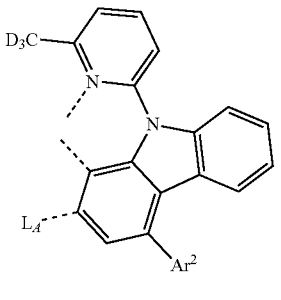 | wherein $Ar^2$ = Aj, wherein j is an integer from 1 to 30, and | n = j + 24337 |

-continued

| $L_{Dn}$ | $L_{Dn}$ structure | $Ar^2$, $Ar^3$, $R^2$ | n |
|---|---|---|---|
| wherein $L_{D24368}$-$L_{D25267}$ have the structure | 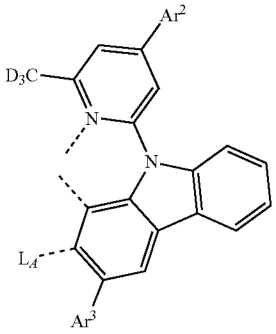 | wherein $Ar^2$ = Aj and $Ar^3$ = Am, wherein j is an integer from 1 to 30 and m is an integer from 1 to 30, and | n = 30(j − 1) + m + 24367 |
| wherein $L_{D25268}$-$L_{D25297}$ have the structure | 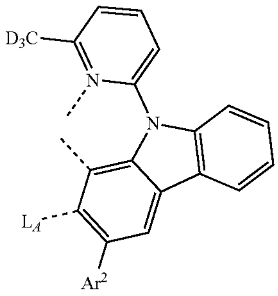 | wherein $Ar^2$ = Aj, wherein j is an integer from 1 to 30, and | n = j + 25267 |
| wherein $L_{D25298}$-$L_{D25327}$ have the structure | 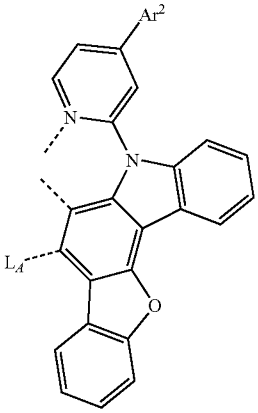 | wherein $Ar^2$ = Aj, wherein j is an integer from 1 to 30, and | n = j + 25297 |
| wherein $L_{D25328}$-$L_{D25357}$ have the structure | 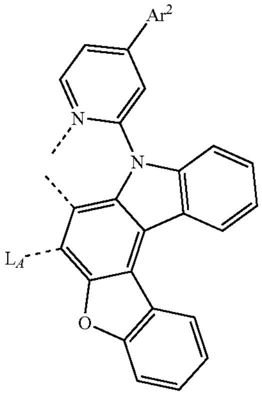 | wherein $Ar^2$ = Aj, wherein j is an integer from 1 to 30, and | n = j + 25327 |

-continued
| $L_{Dn}$ | $L_{Dn}$ structure | $Ar^2$, $Ar^3$, $R^2$ | n |
| --- | --- | --- | --- |
| wherein $L_{D25358}$-$L_{D25387}$ have the structure | 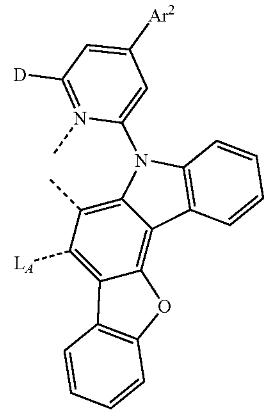 | wherein $Ar^2$ = Aj, wherein j is an integer from 1 to 30, and | n = j + 25357 |
| wherein $L_{D25388}$-$L_{D25417}$ have the structure | 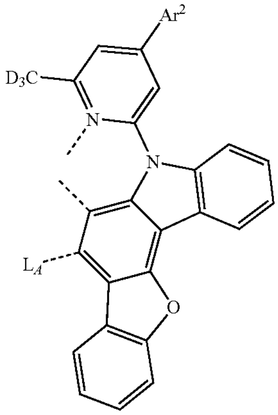 | wherein $Ar^2$ = Aj, wherein j is an integer from 1 to 30, and | n = j + 25387 |
| wherein $L_{D25418}$-$L_{D25447}$ have the structure | 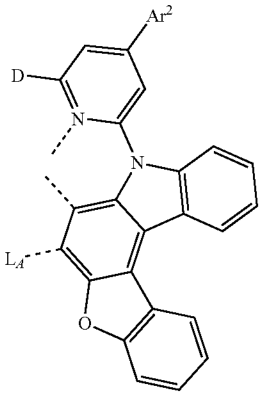 | wherein $Ar^2$ = Aj, wherein j is an integer from 1 to 30, and | n = j + 25417 |

-continued
| $L_{Dn}$ | $L_{Dn}$ structure | $Ar^2$, $Ar^3$, $R^2$ | n |
|---|---|---|---|
| wherein $L_{D25448}$-$L_{B25477}$ has the structure | 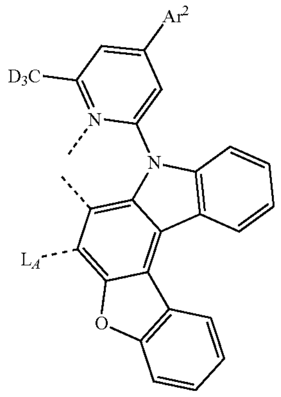 | wherein $Ar^2$ = Aj, wherein j is an integer from 1 to 30, and | n = j + 25447 |
| wherein $L_{D25478}$ has the structure | 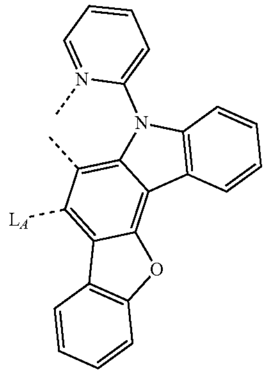 | | n = 25478 |
| wherein $L_{D25479}$ has the structure | 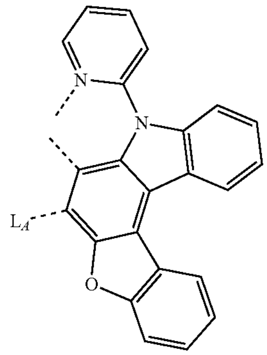 | | n = 25479 |
| wherein $L_{D25480}$ has the structure | 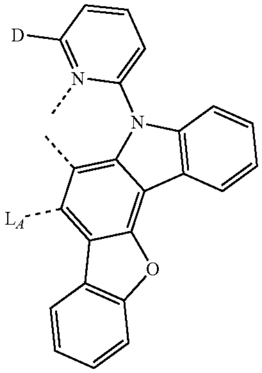 | | n = 25480 |

-continued
| $L_{Dn}$ | $L_{Dn}$ structure | $Ar^2$, $Ar^3$, $R^2$ | n |
|---|---|---|---|
| wherein $L_{D25481}$ has the structure | 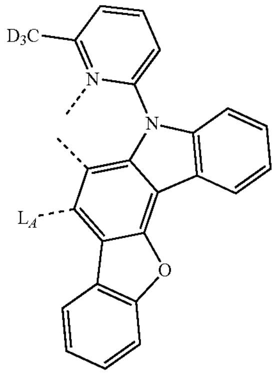 | | n = 25481 |
| wherein $L_{D25482}$ has the structure | 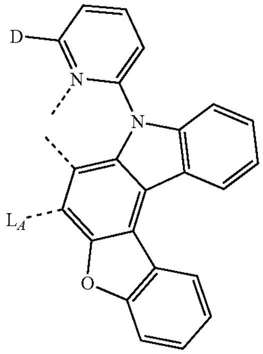 | | n = 25482 |
| wherein $L_{D25483}$ has the structure | 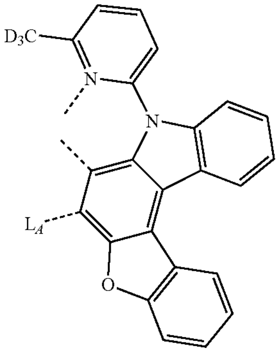 | | n = 25483 |
| wherein $L_{D25484}$-$L_{D25513}$ have the structure | 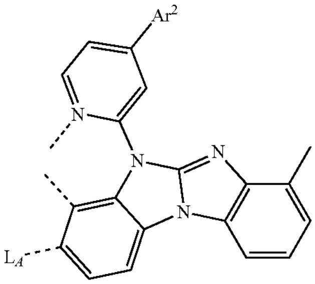 | wherein $Ar^2$ = Aj, wherein j is an integer from 1 to 30, and | n = j + 25483 |

-continued
| $L_{Dn}$ | $L_{Dn}$ structure | $Ar^2$, $Ar^3$, $R^2$ | n |
|---|---|---|---|
| wherein $L_{D25514}$-$L_{D25543}$ have the structure | 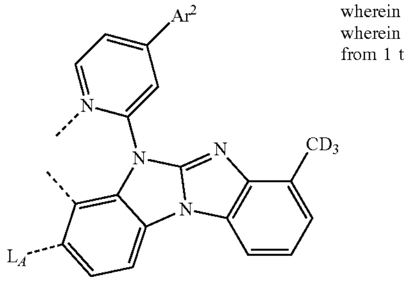 | wherein $Ar^2$ = Aj, wherein j is an integer from 1 to 30, and | n = j + 25513 |
where A1 to A30 have the following structures:
A1
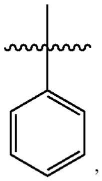
,
A2
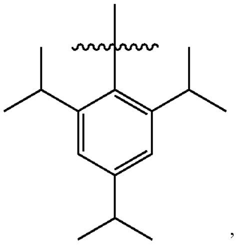
,
A3
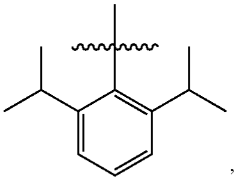
,
A4
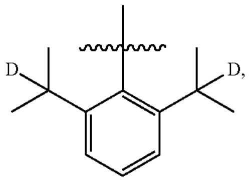
A5
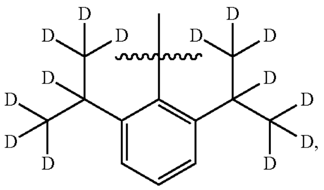
-continued
A6
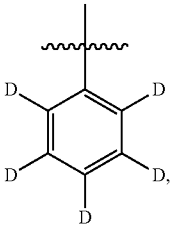
A7
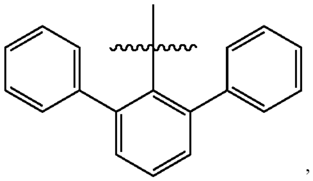
,
A8
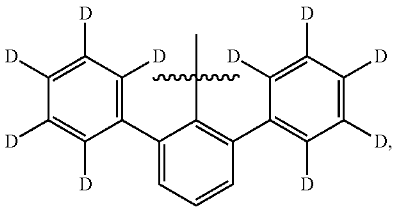
A9
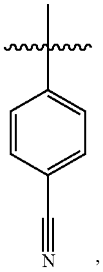
,
A10
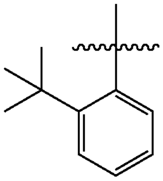
,
A11
Me,
A12
iPr, -continued

A13 tBu,

A14

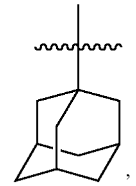
,

A15

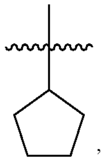
,

A16

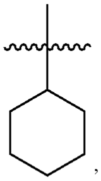
,

A17

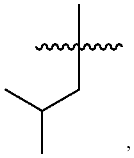
,

A18

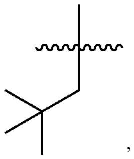
,

A19

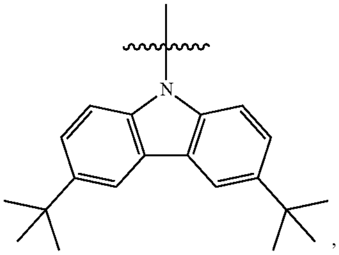
,

A20

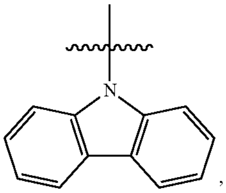
,

A21

$CD_3$,

A22

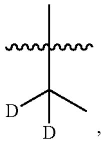
,

-continued

A23

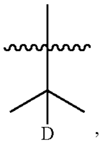
,

A24

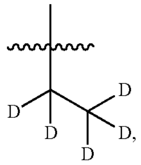

A25

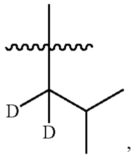
,

A26

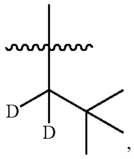
,

A27

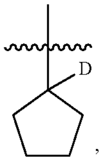
,

A28

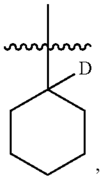
,

A29

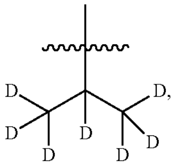

A30

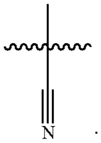
.

In some embodiments of the compound selected from the group consisting of Compound y having the formula $Pt(L_{Cm})(L_{Dn})$, wherein y is an integer defined by y=25543 (m−1)+n, wherein m is an integer from 1 to 2438910 and n is an integer from 1 to 25543, those Compound y whose ligand $L_{Cm}$ contains the structure $R^{A1}$ that contain the following structures B1, B2, B7, B13, B30, B36, B37, B44, B45, B46, B47, B48, B49, B50, B64, B65, B66, B67, B68, B69, B70, B76, B77, B78, B86, B91, B93, B94, B96, B97, B98, B99, or B100 as the substituents $R^{S1}$ and $R^{S2}$ are preferred.

In some embodiments of the compound selected from the group consisting of Compound y having the formula $Pt(L_{Cm})(L_{Dn})$, wherein y is an integer defined by y=25543 (m−1)+n, wherein m is an integer from 1 to 2438910 and n is an integer from 1 to 25543, those Compound y whose ligand $L_{Cm}$ are those defined by the following structures

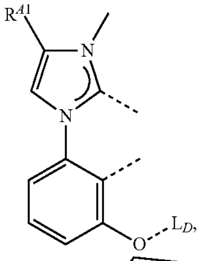

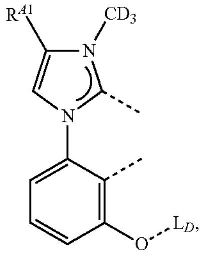

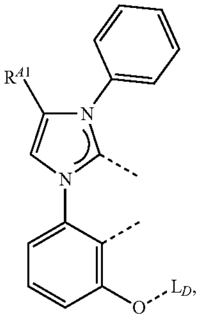

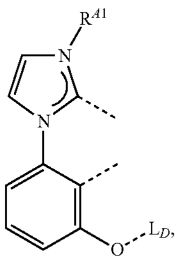

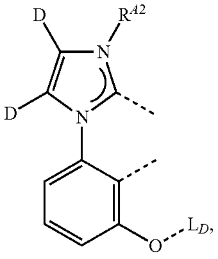

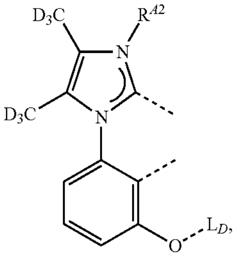

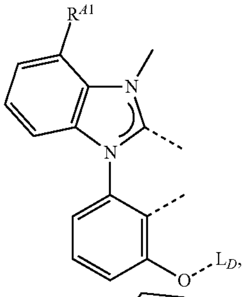

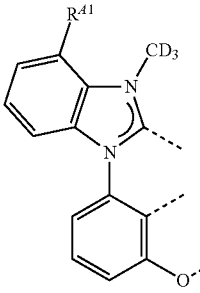

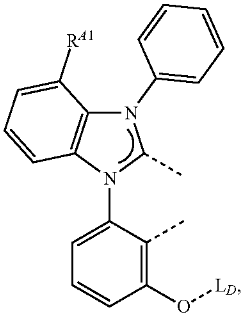

and

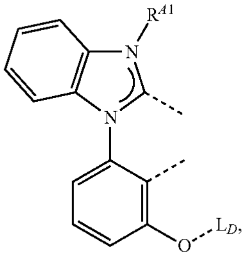

where $L_D$ can be selected from the group consisting of $L_{D1}$ to $L_{D25543}$, where A1, A3, A4, A6, A11, A12, A13, A19, A20, A21, A23, A29, or A30 as the substituents $Ar^2$ or $Ar^3$ are preferred.

In some embodiments of the compound selected from the group consisting of Compound y having the formula $Pt(L_{Cm})(L_{Dn})$, wherein y is an integer defined by y=25543 (m−1)+n, wherein m is an integer from 1 to 2438910 and n is an integer from 1 to 25543, those Compound y whose ligands $L_{Dn}$ are those defined by the following structures

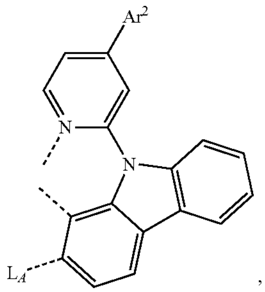

,

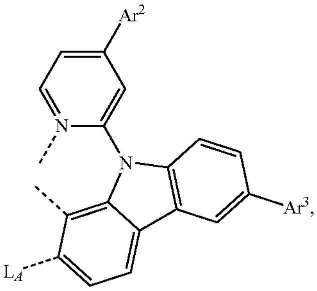

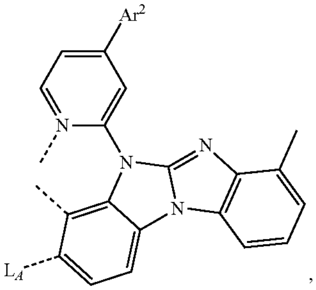

,

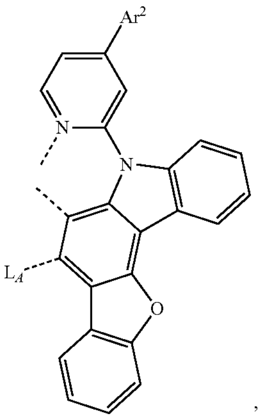

,

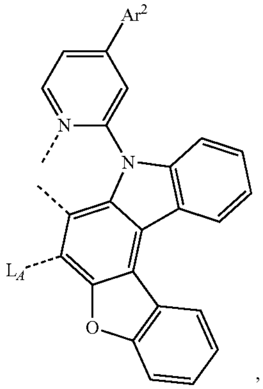

, where A1, A3, A4, A6, A11, A12, A13, A19, A20, A21, A23, A29, or A30 as the substituents $Ar^2$ or $Ar^3$ are preferred.

In some embodiments of the compound, the compound is selected from the group consisting of:

-continued
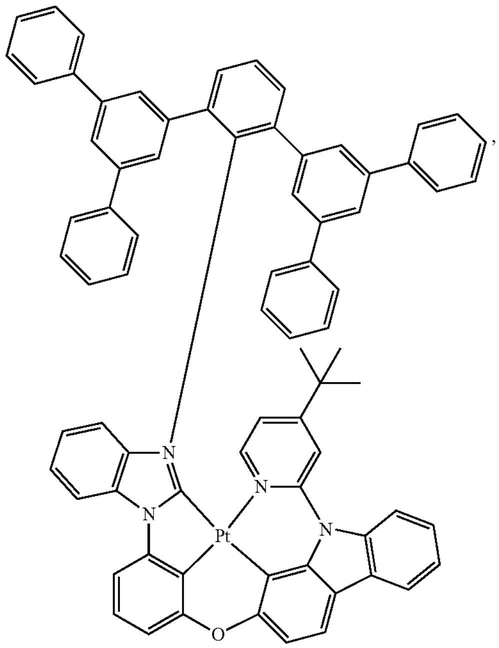
,
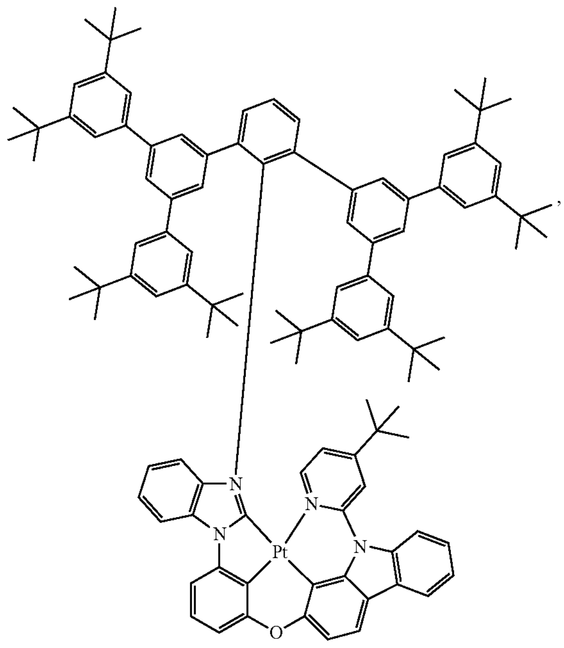
,
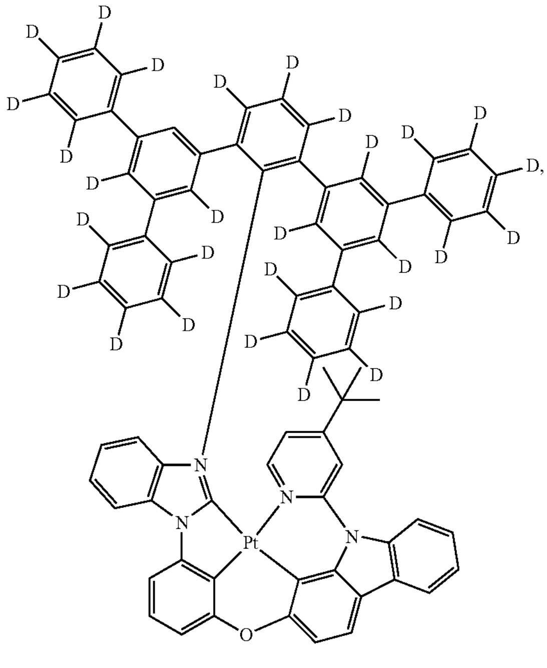
,
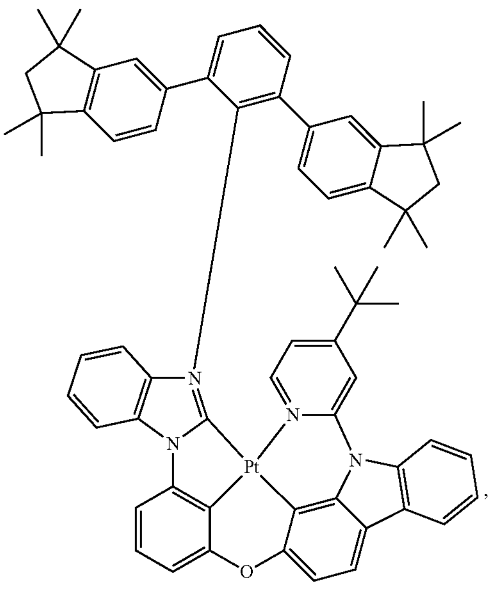
,

-continued
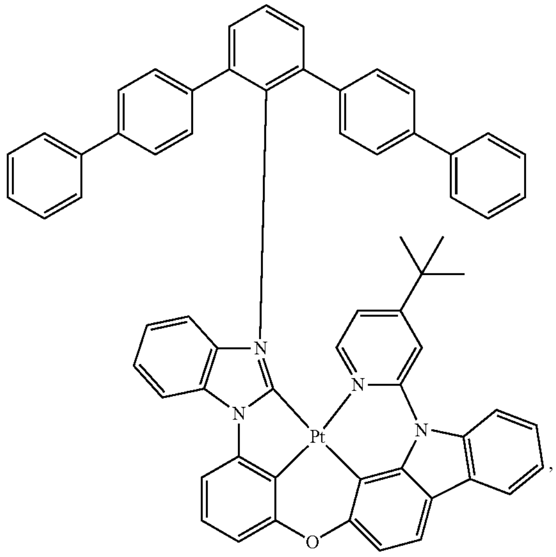
,
-continued
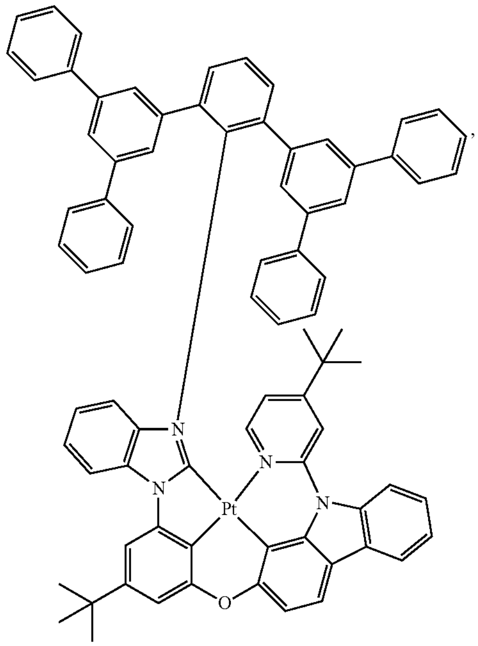
,
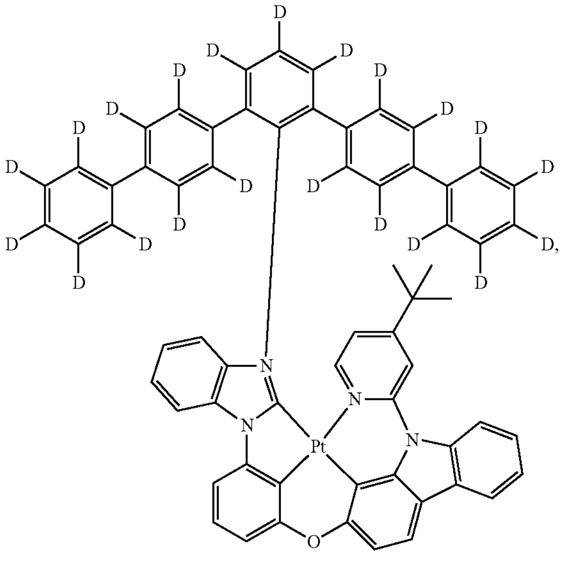
,
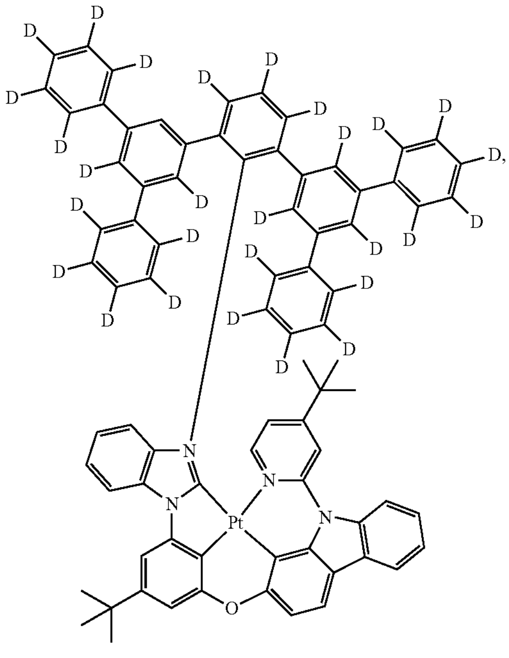
,

-continued
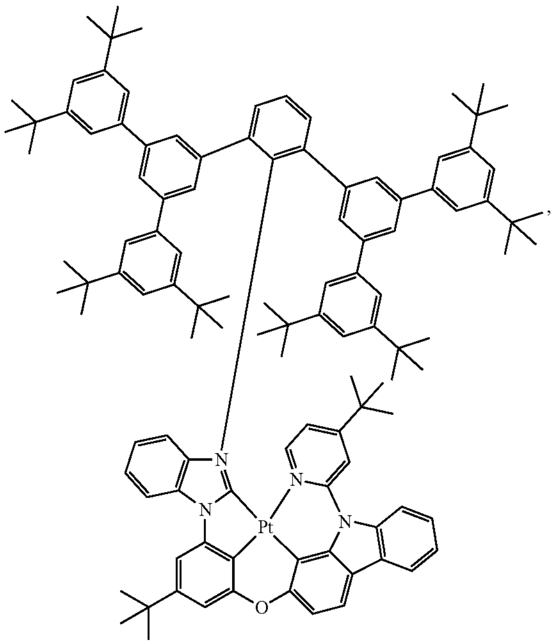
,
-continued
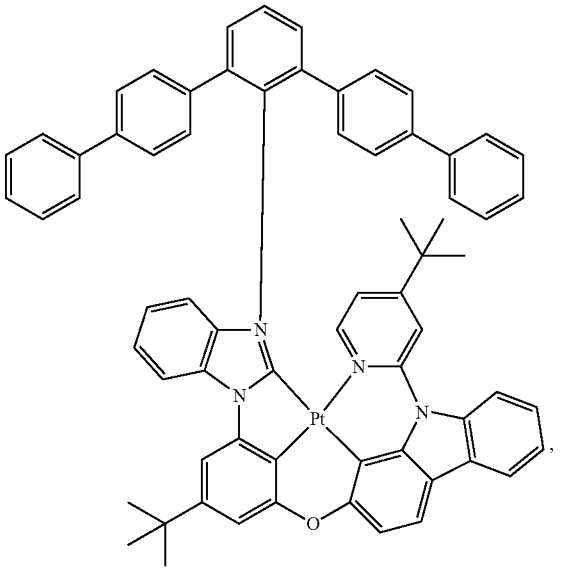
,
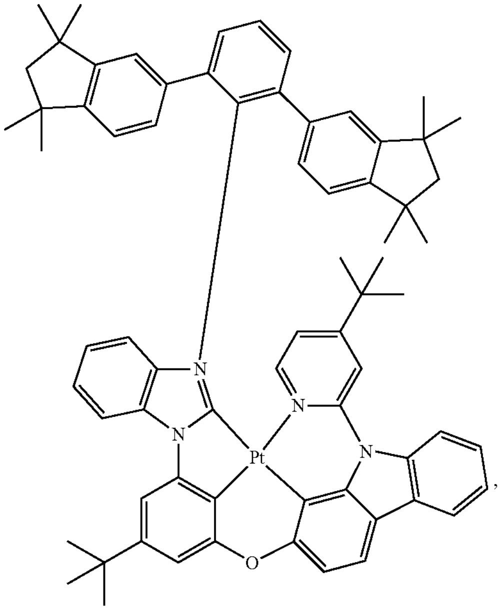
,
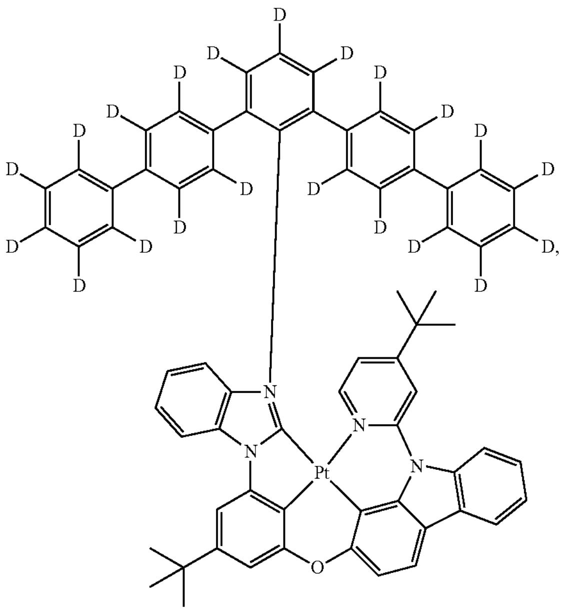
,

-continued
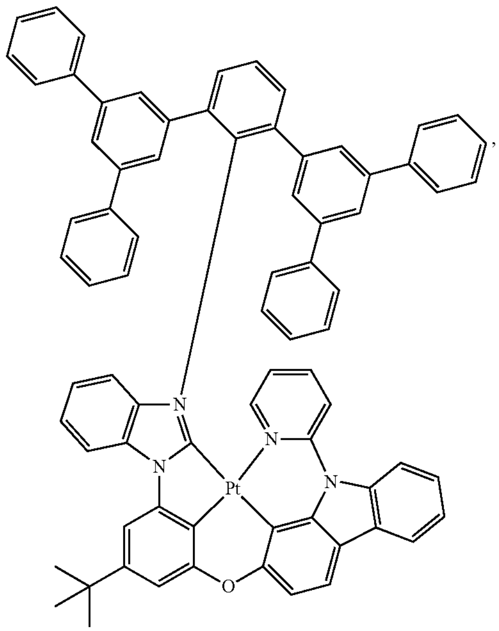
,
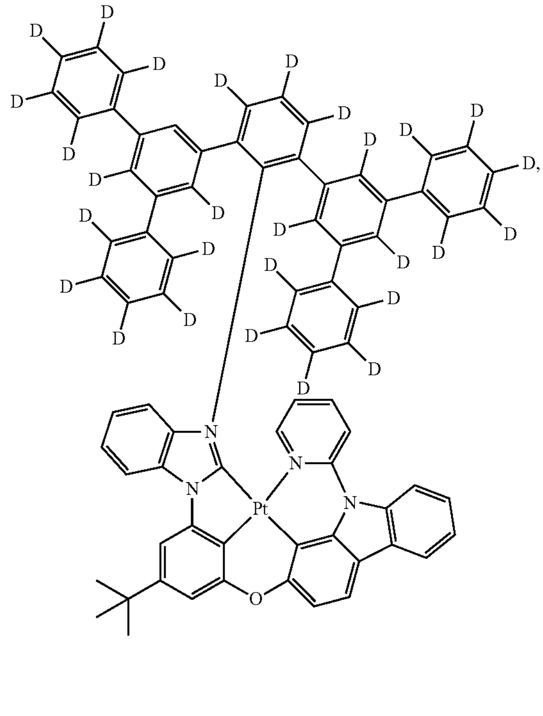
D,
-continued
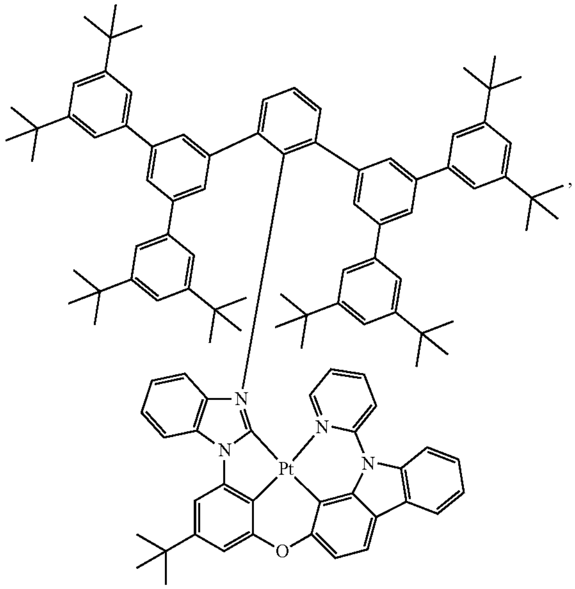
,
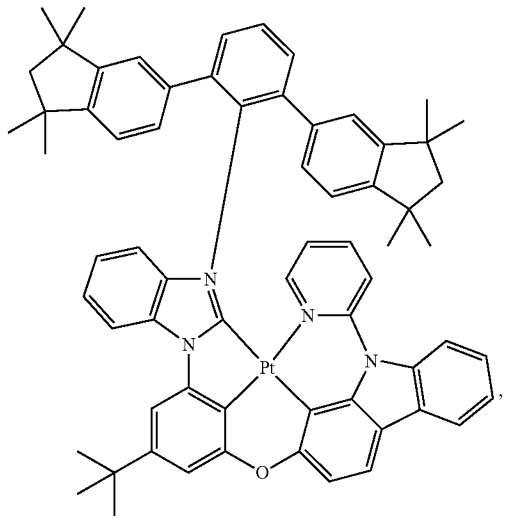
,
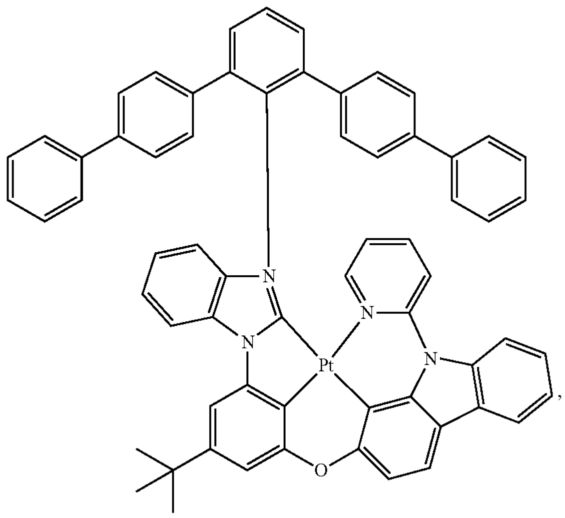
, -continued
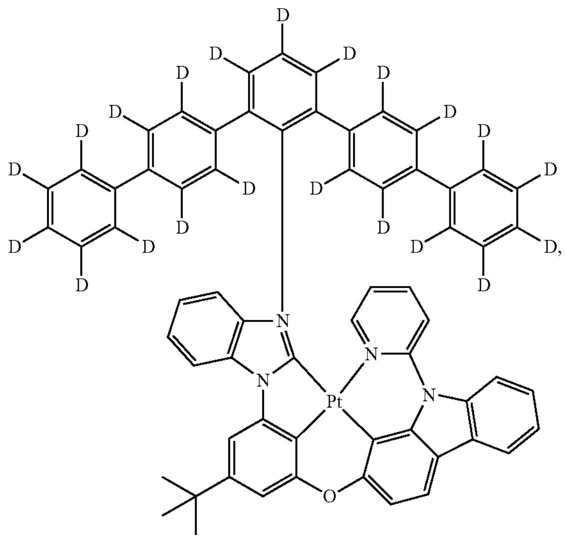
,
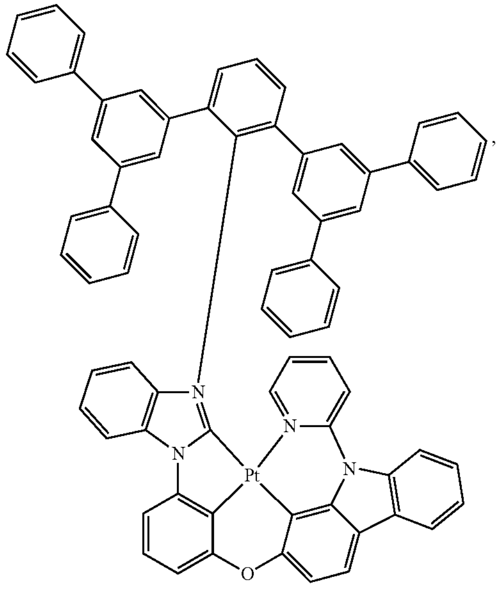
,
-continued
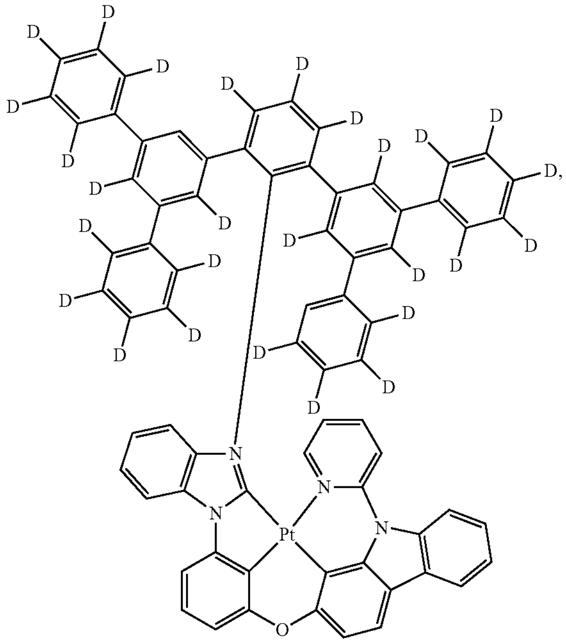
,
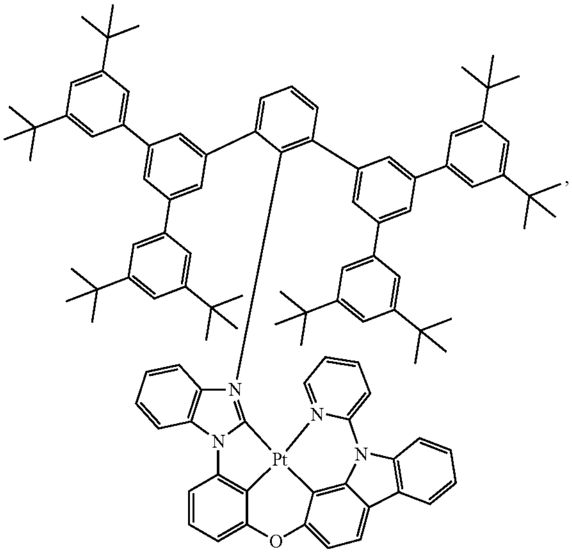
,
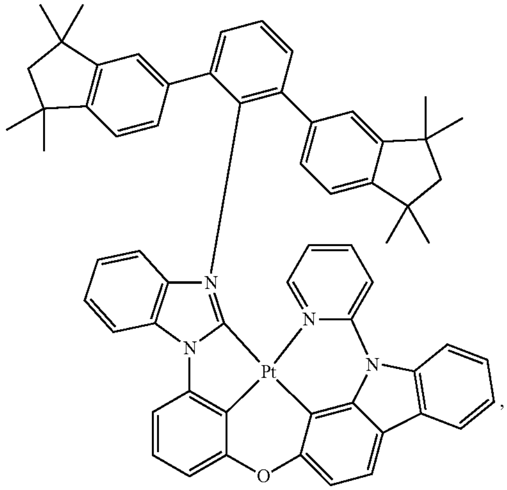
, -continued
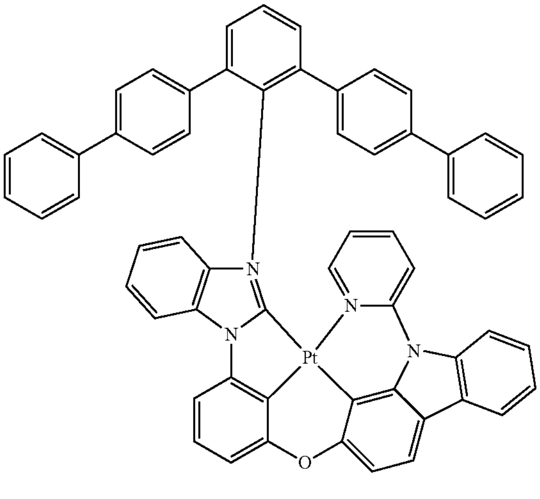
,
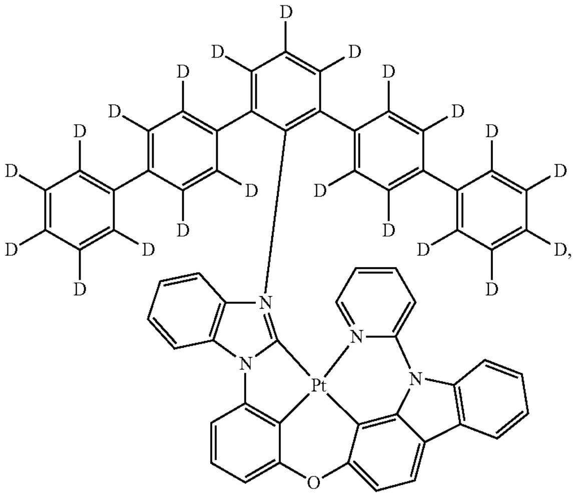
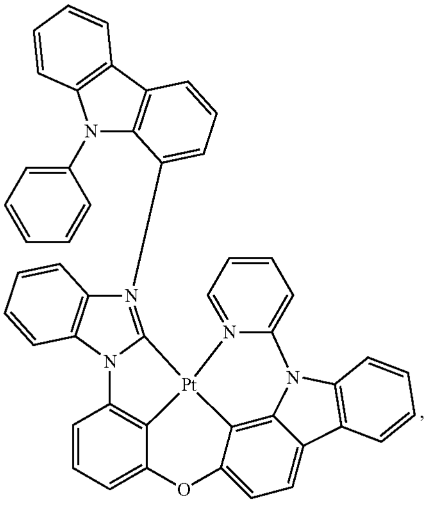
,
-continued
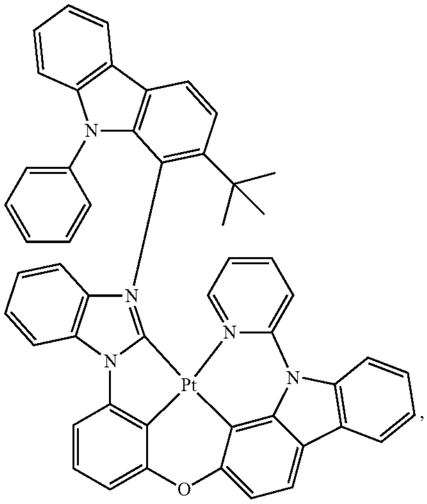
,
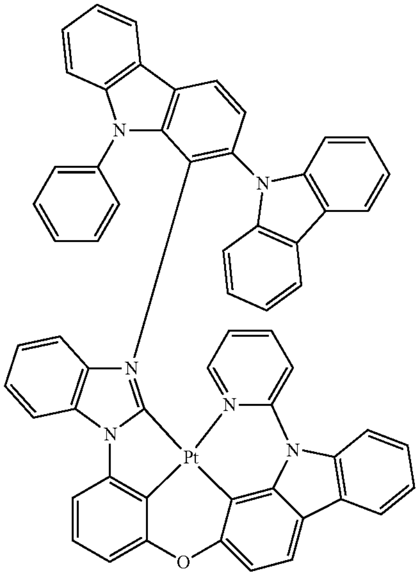
,
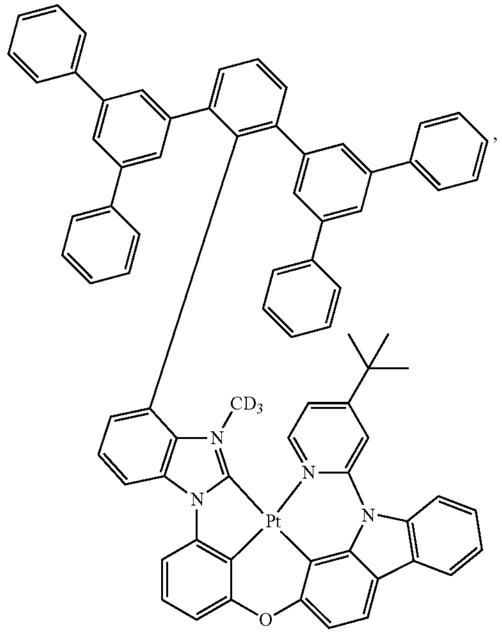

-continued
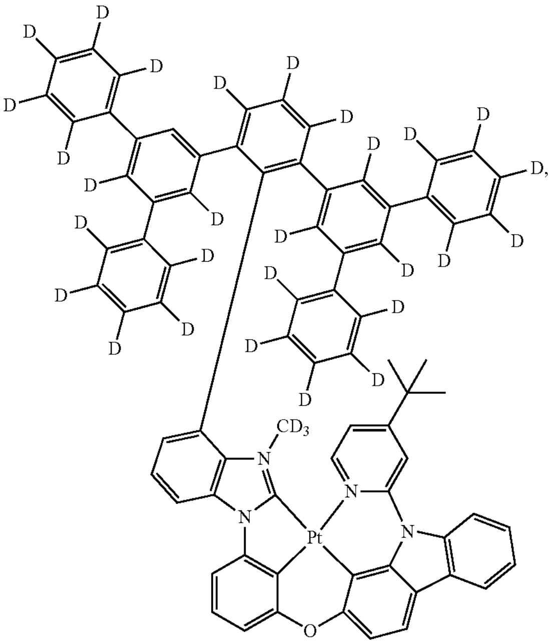
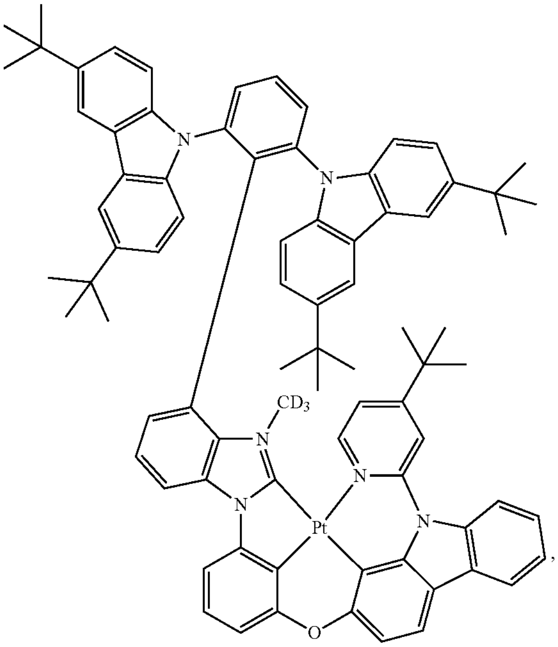
,
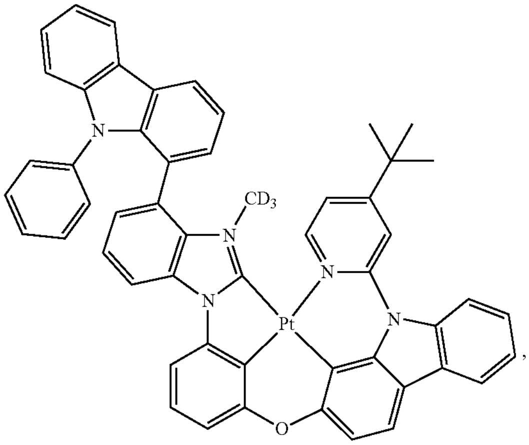
,
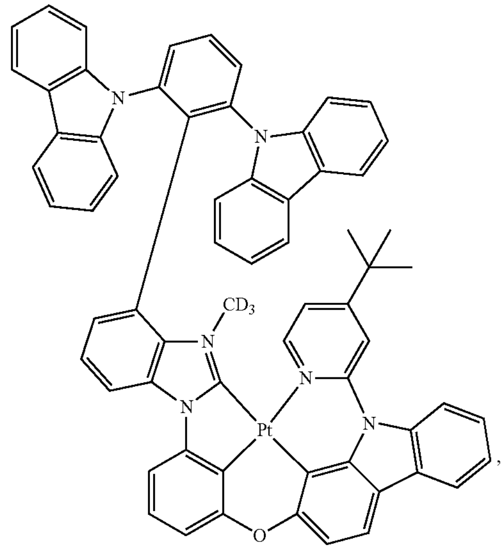
,
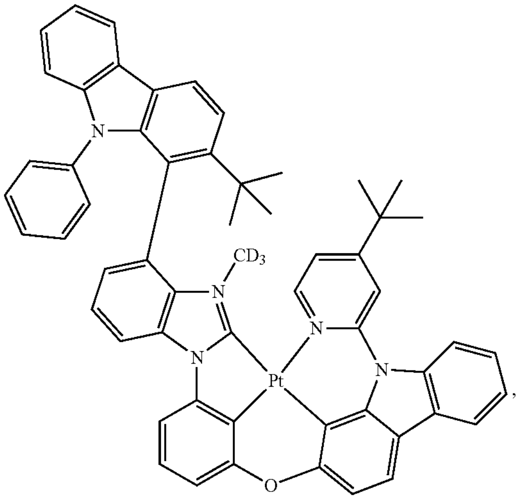
,
-continued

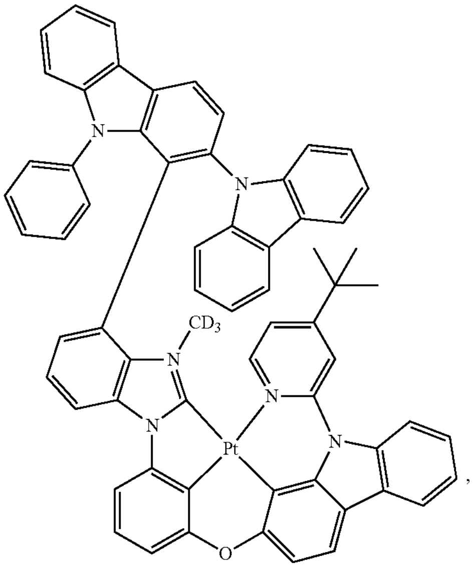
,
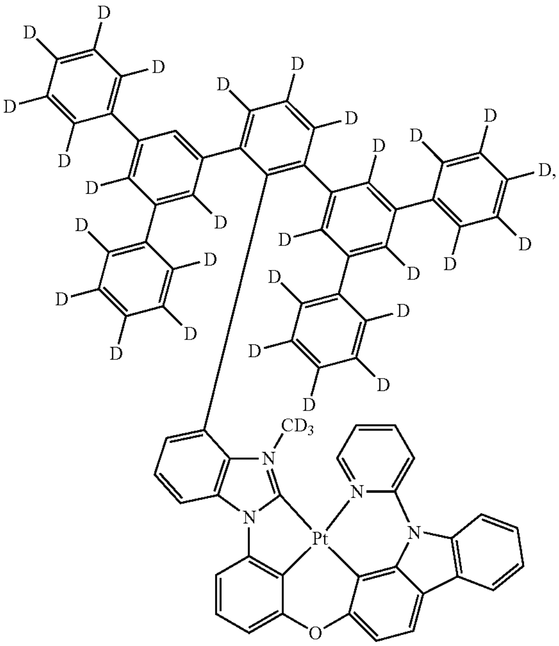
,
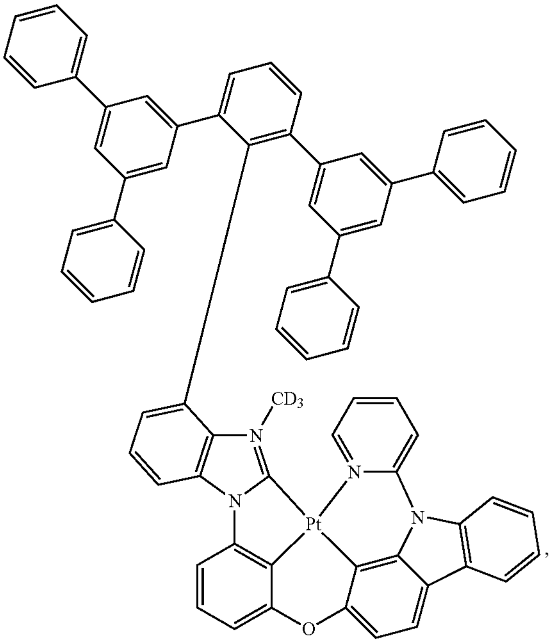
,
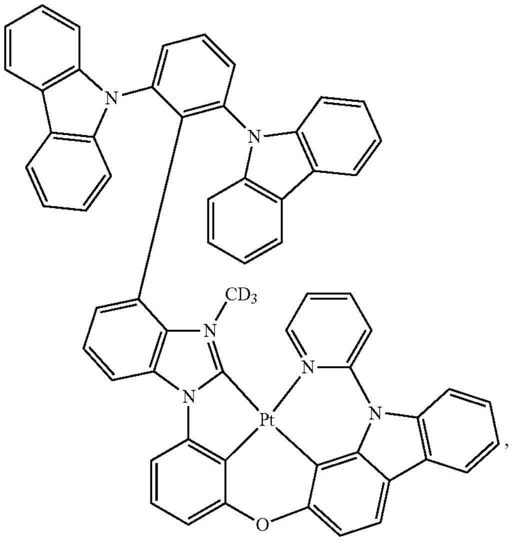
,

-continued
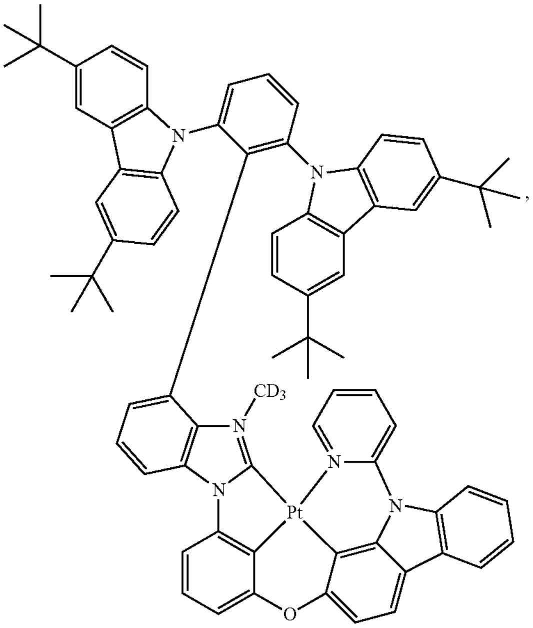
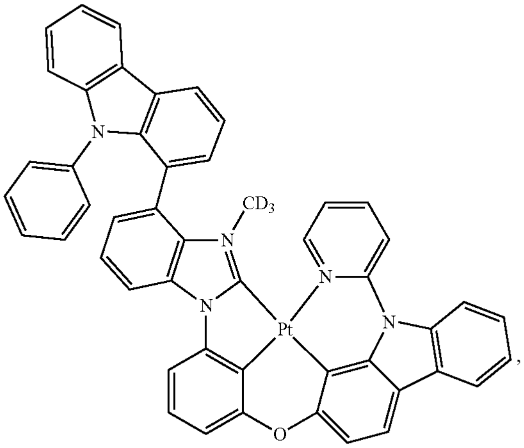
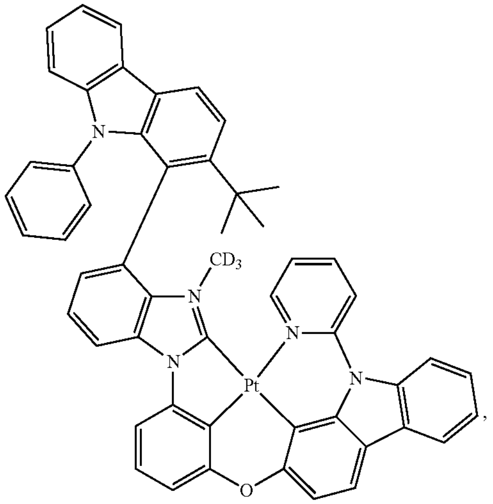
-continued
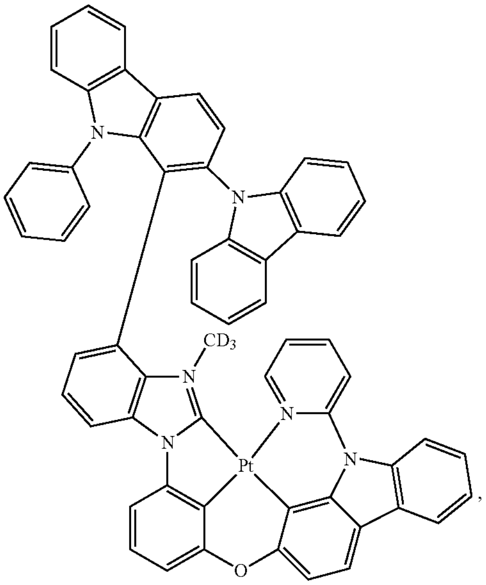
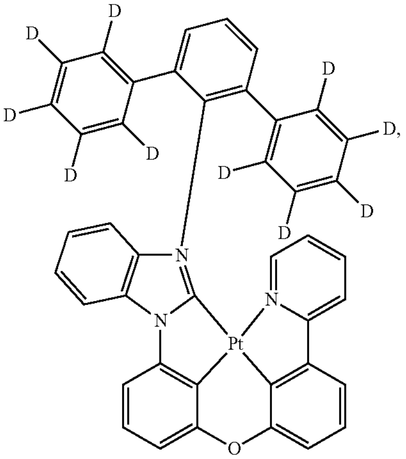
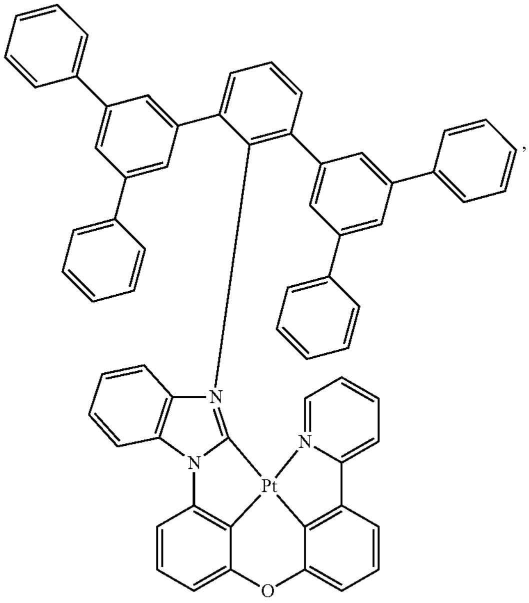

-continued
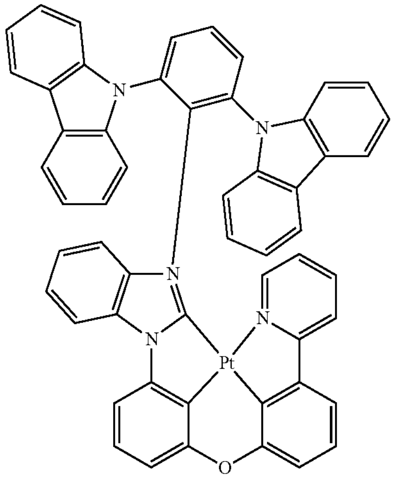
,
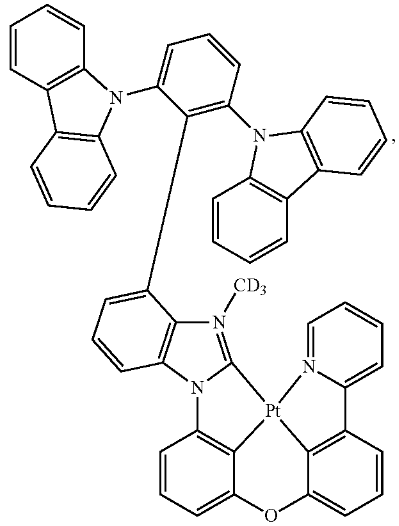
,
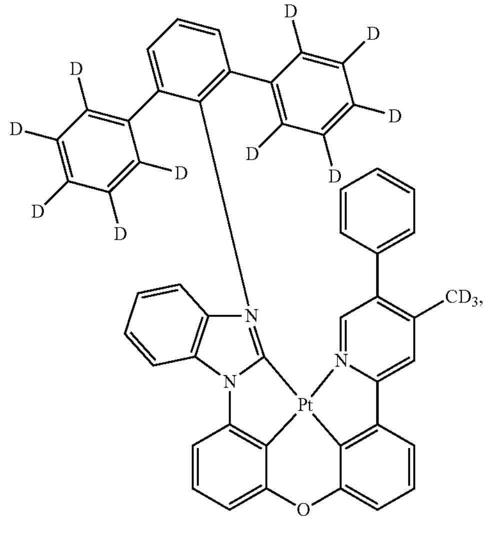
,
-continued
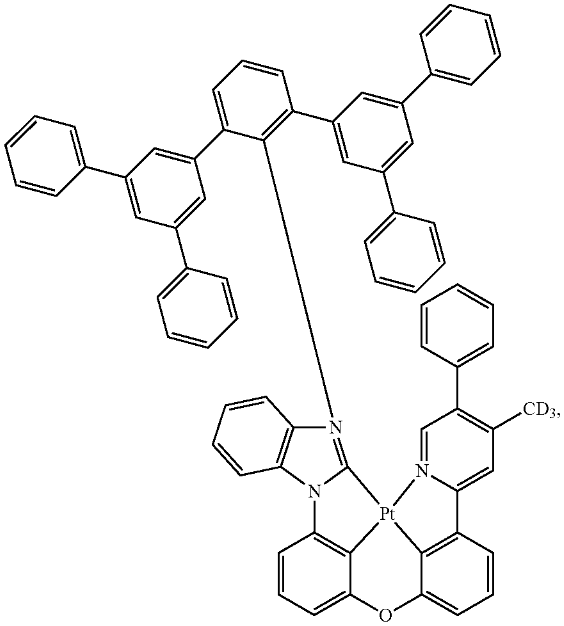
,
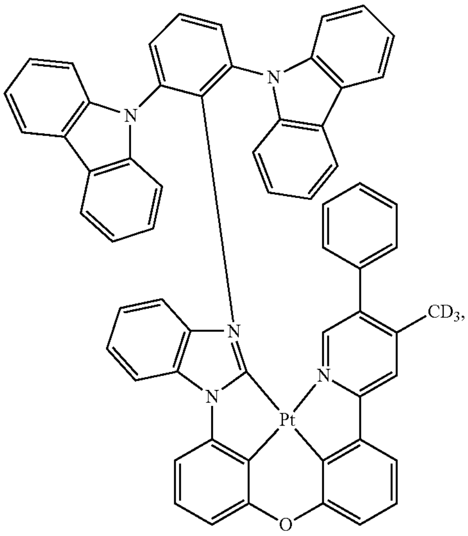
,
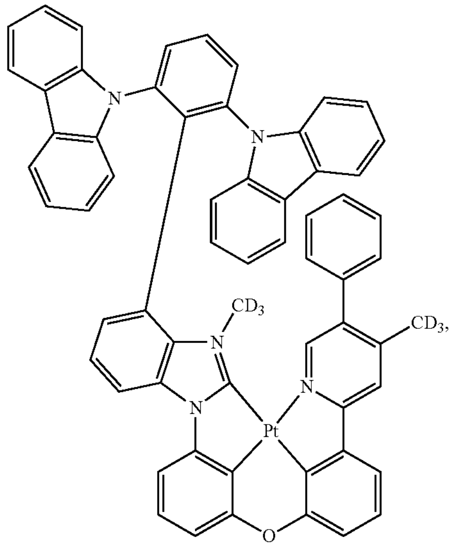
, -continued
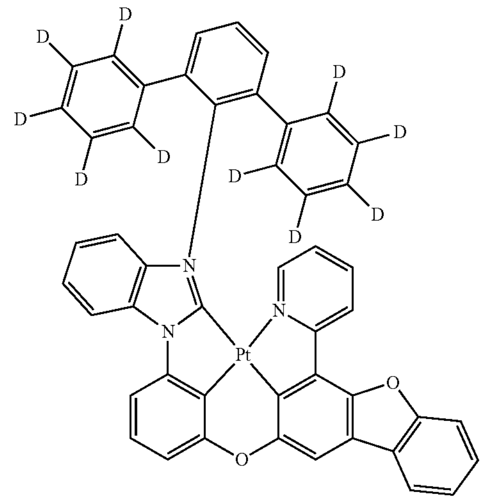
,
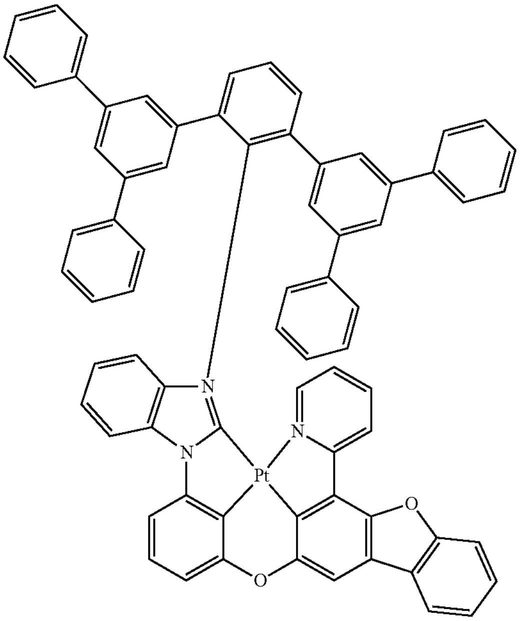
,
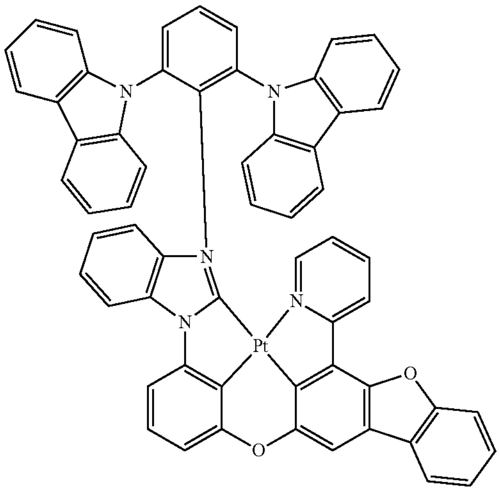
,
-continued
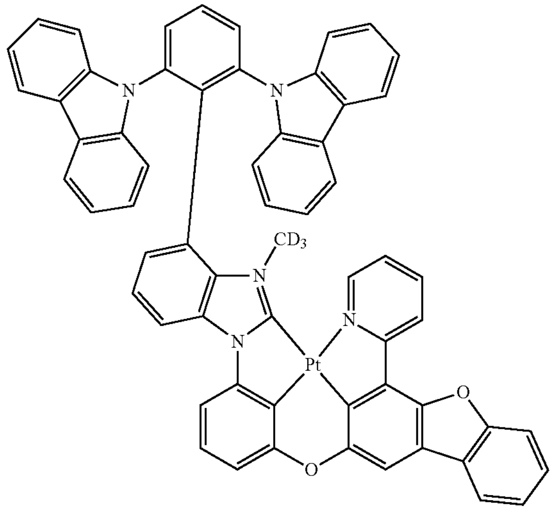
,
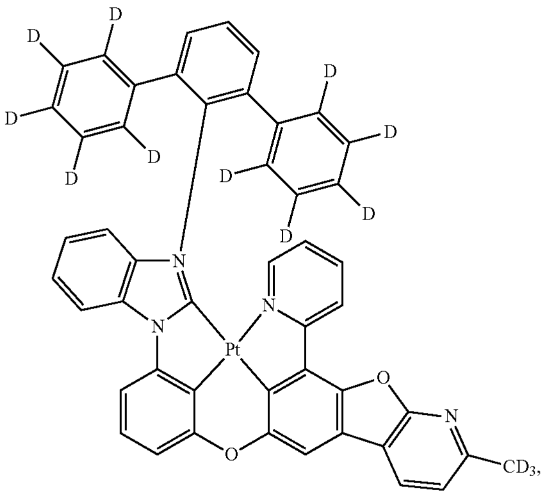
,
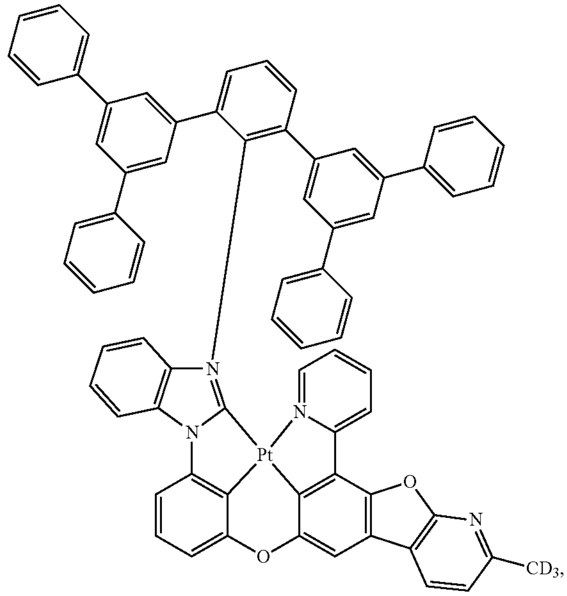
, -continued
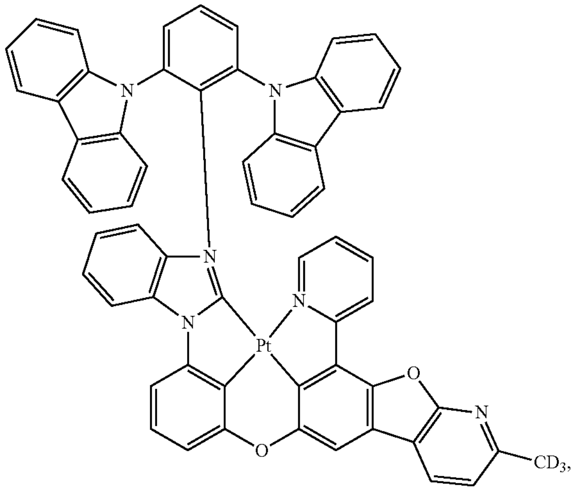
,
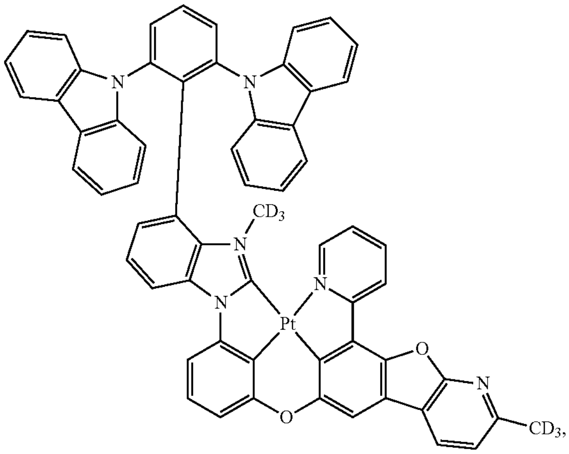
,
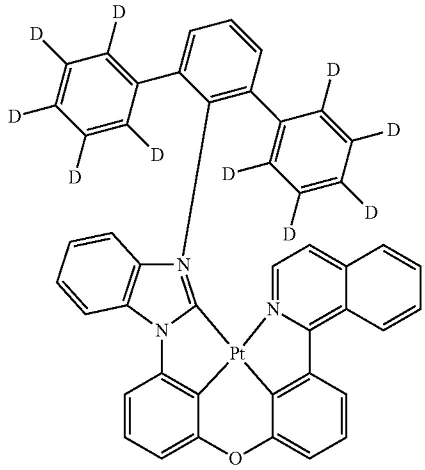
,
-continued
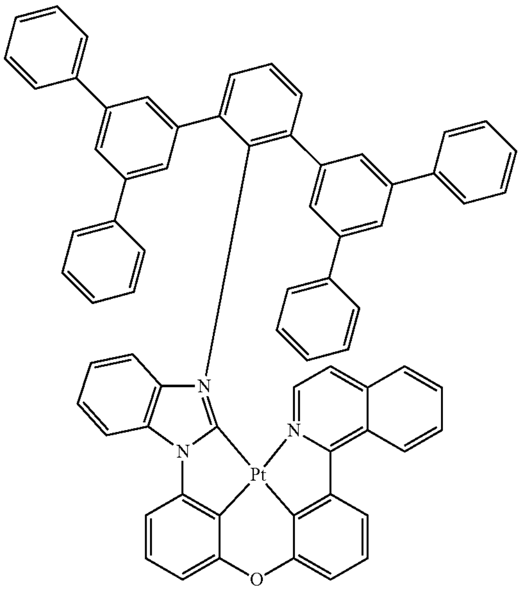
,
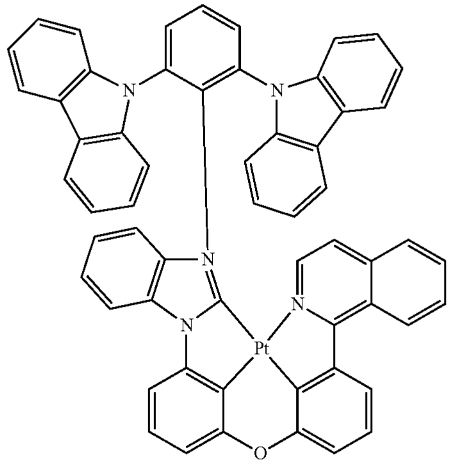
,
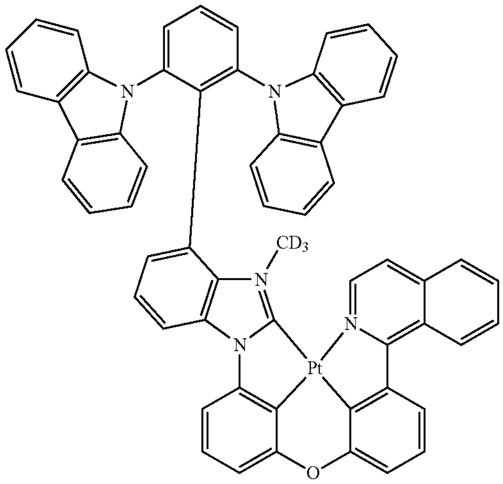
, -continued
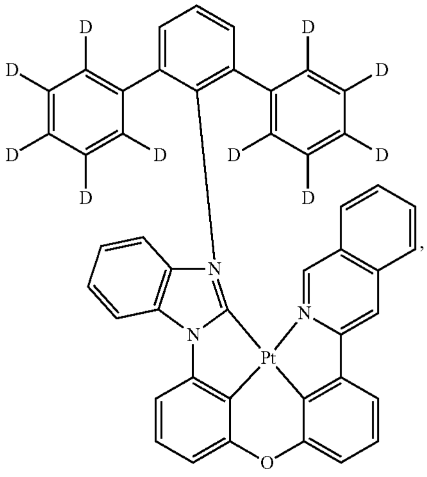
,
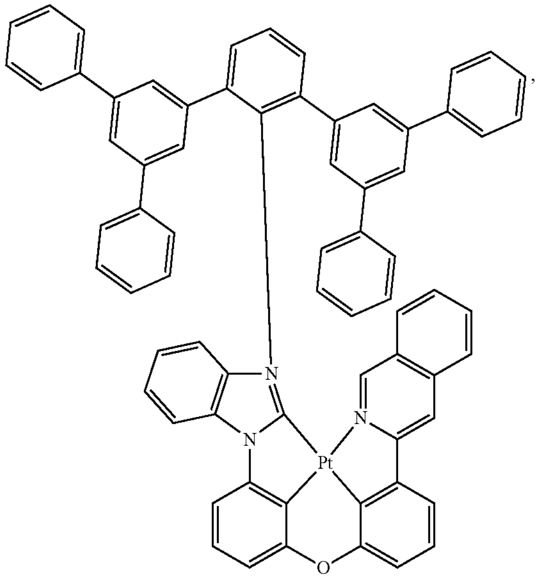
,
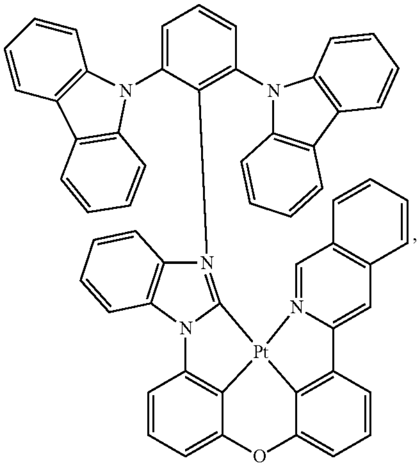
,
-continued
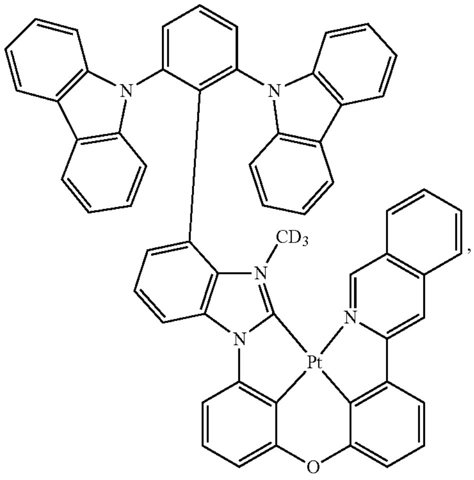
,
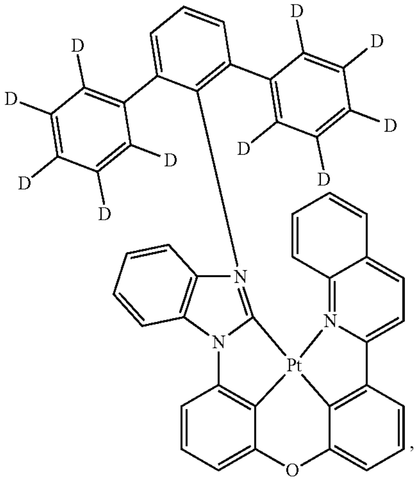
,
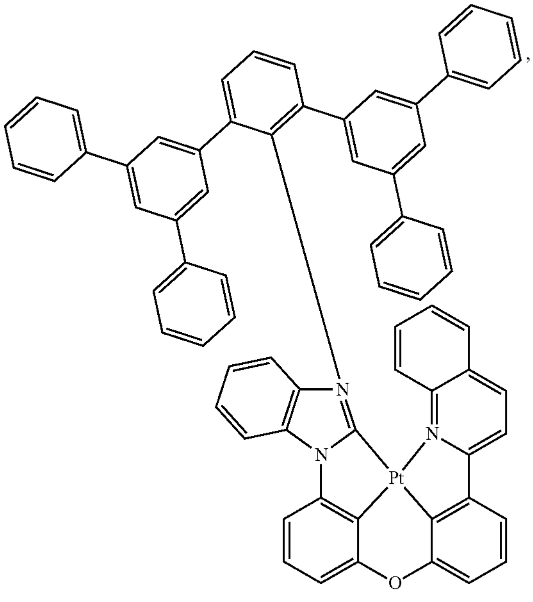
, -continued
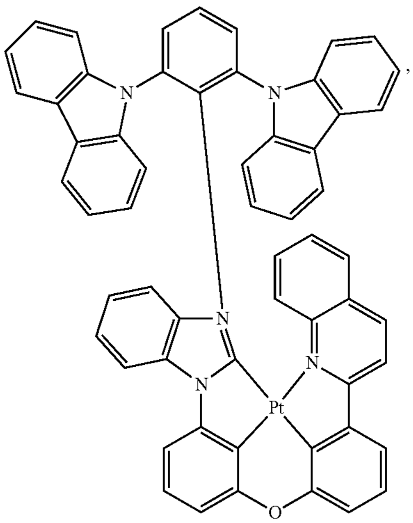
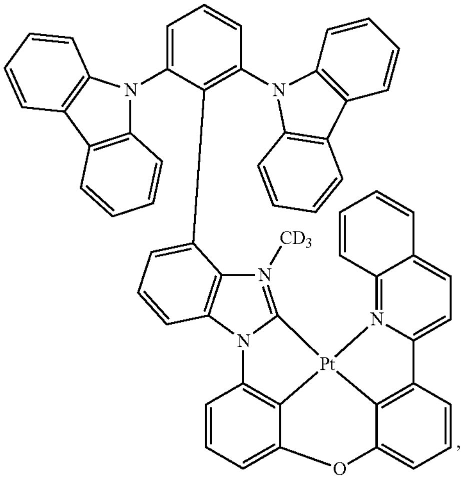
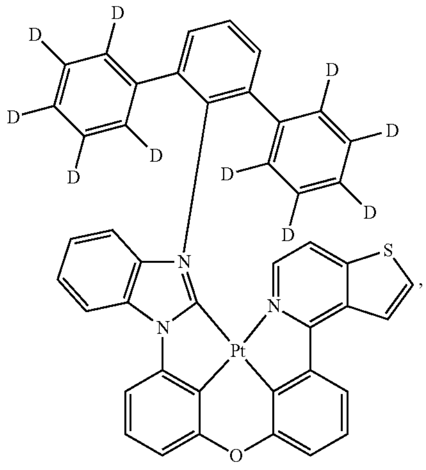
-continued
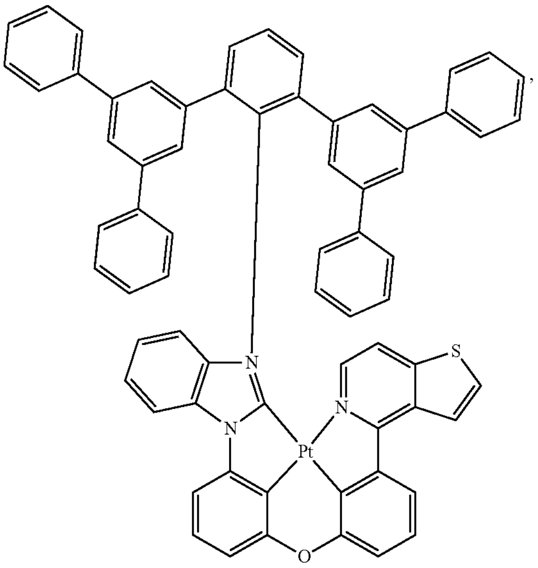
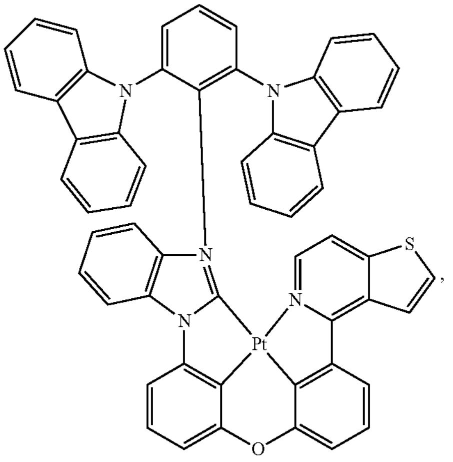
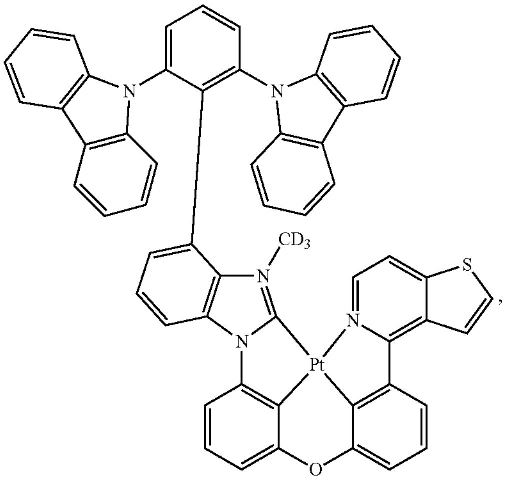

-continued
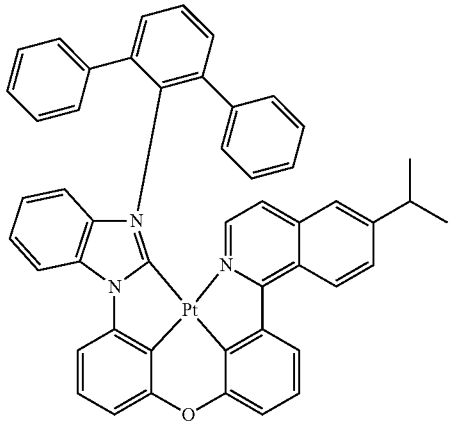
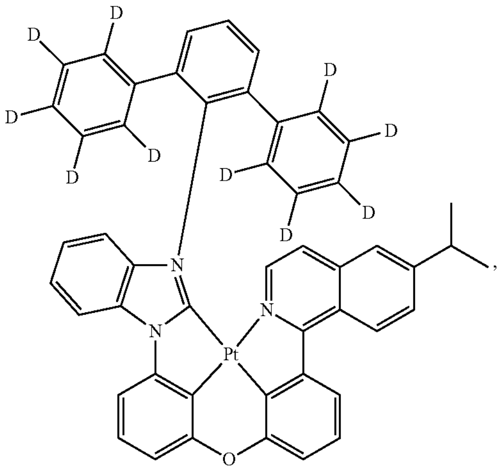
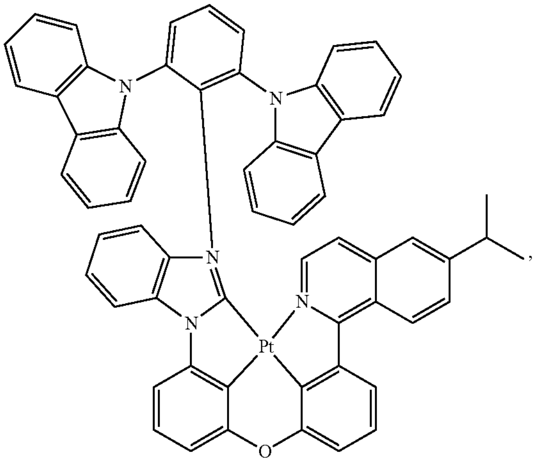
-continued
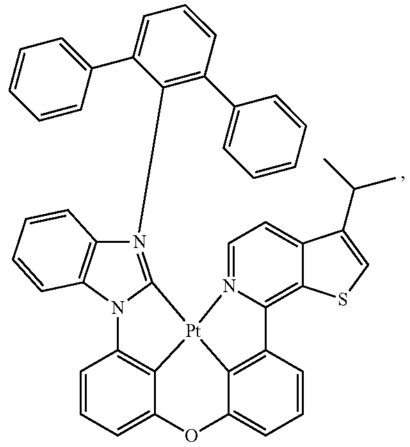
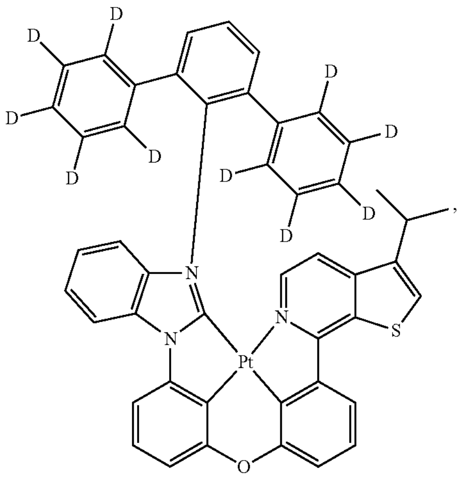
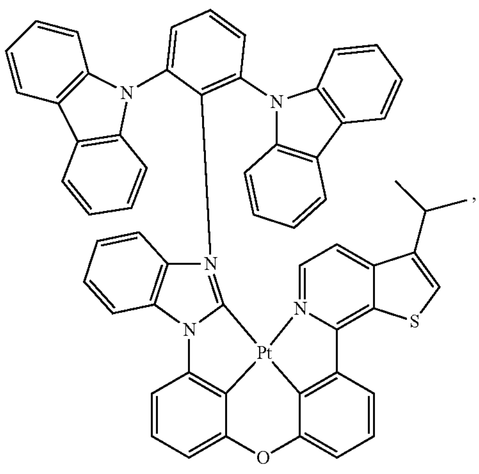

-continued
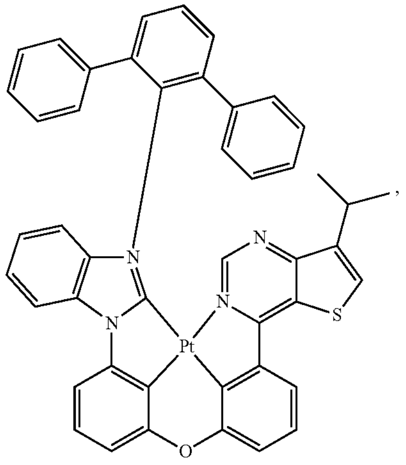
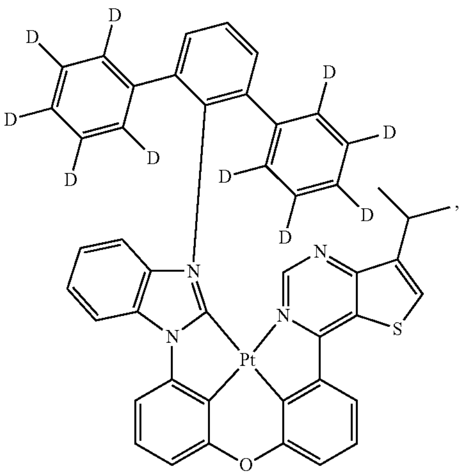
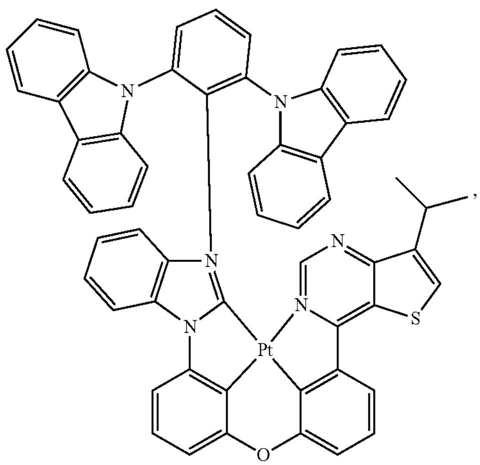
-continued
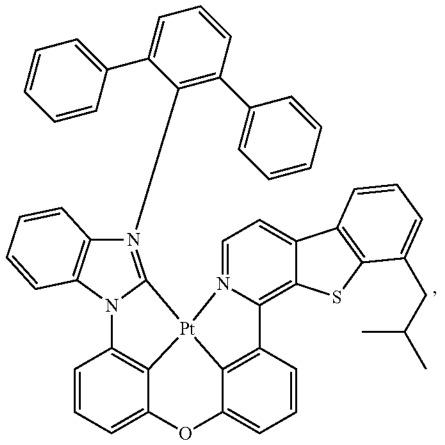
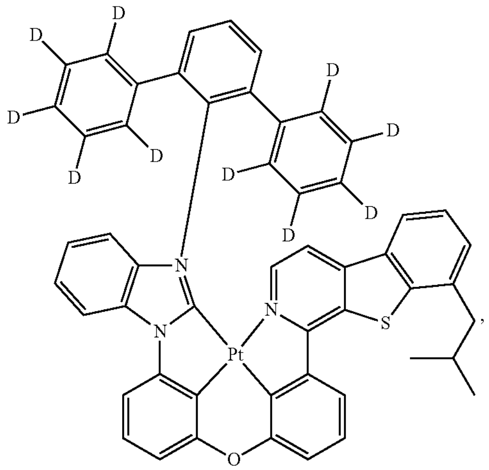
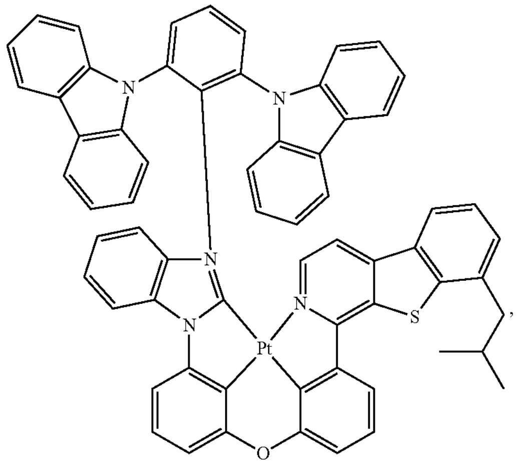

-continued
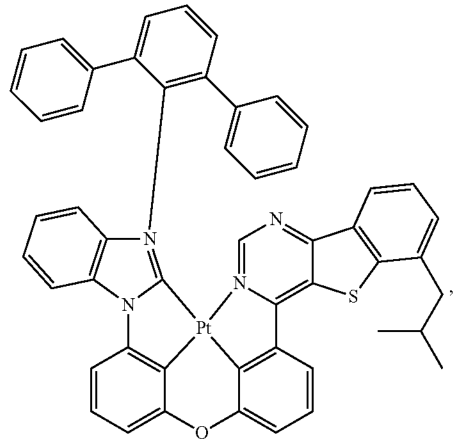
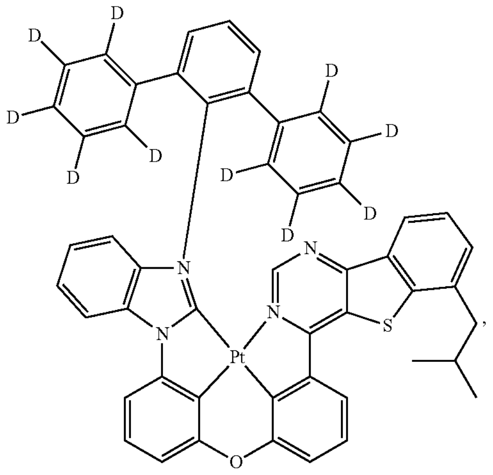
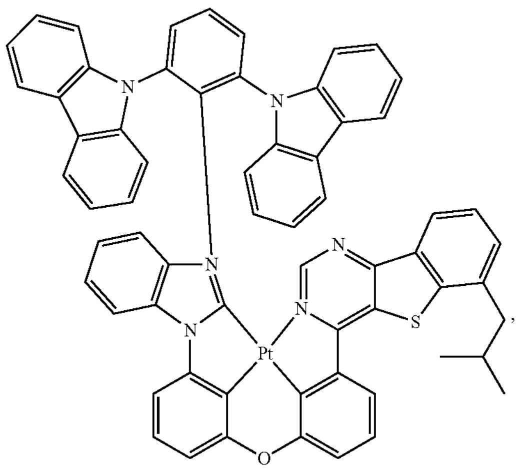
-continued
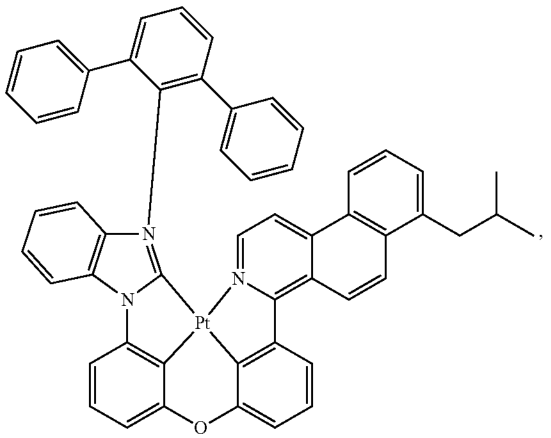
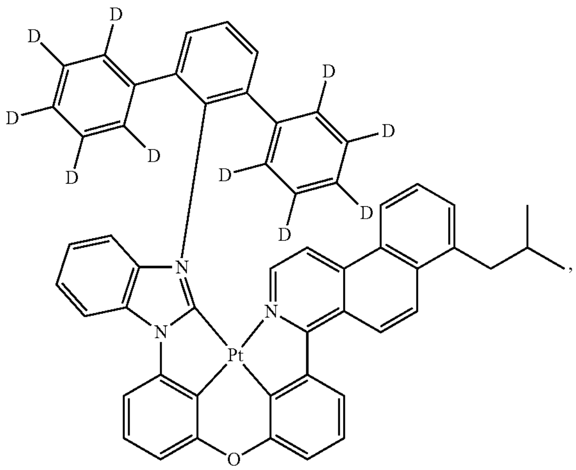
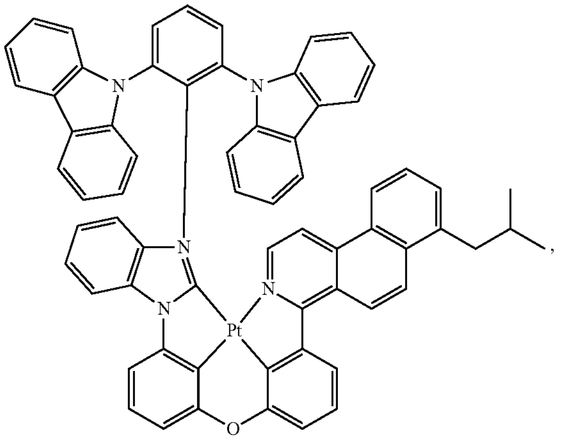

-continued
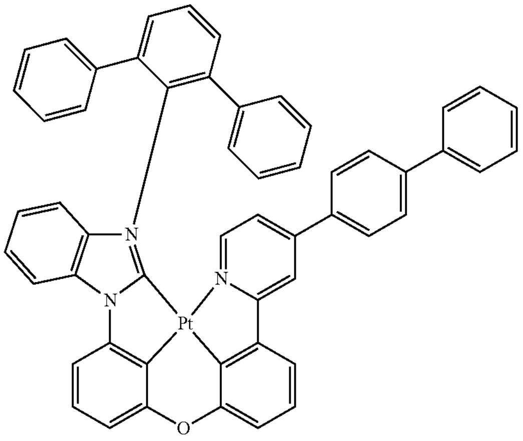
,
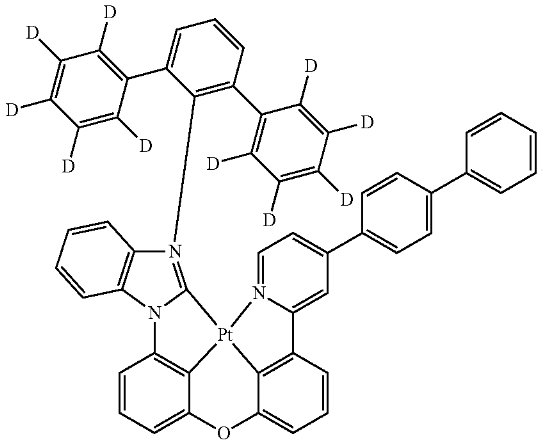
,
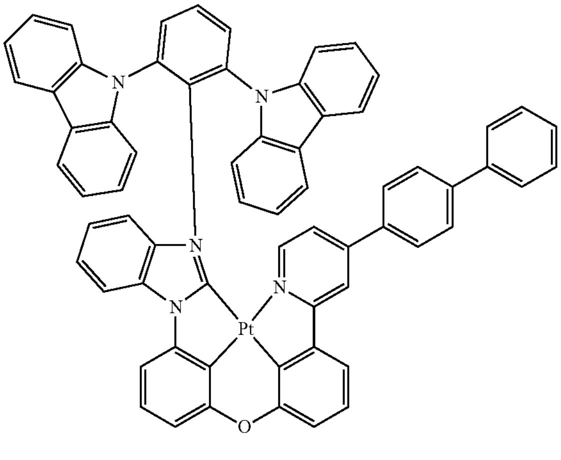
,
-continued
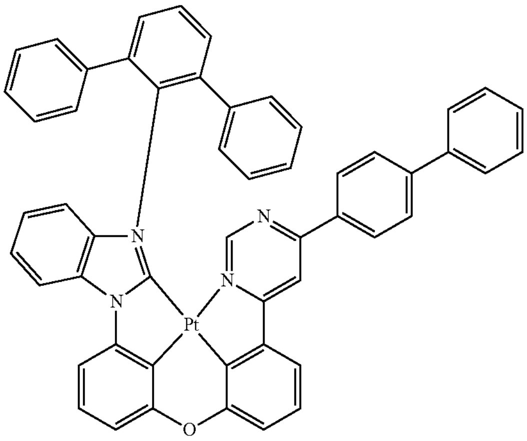
,
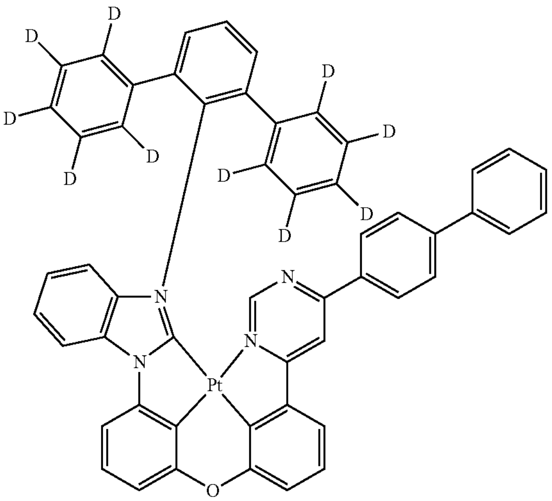
,
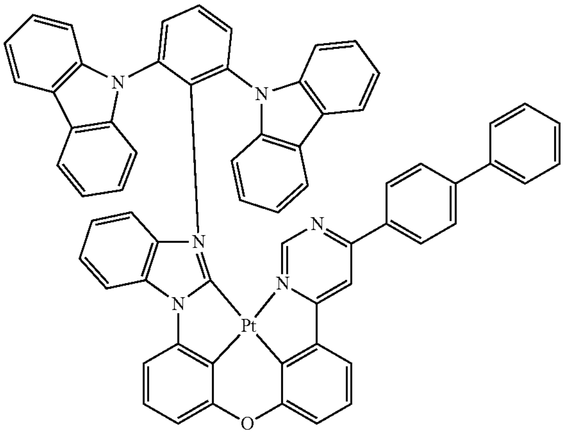
, -continued
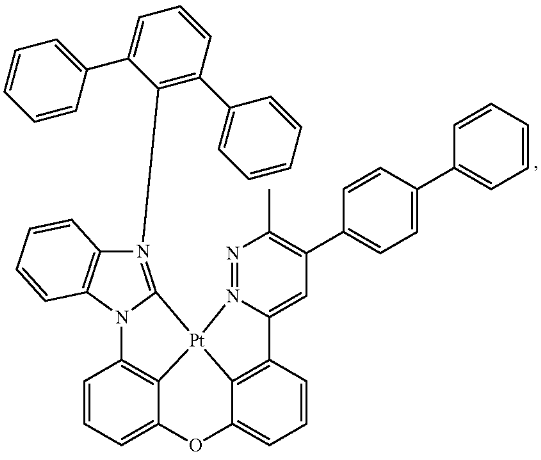
,
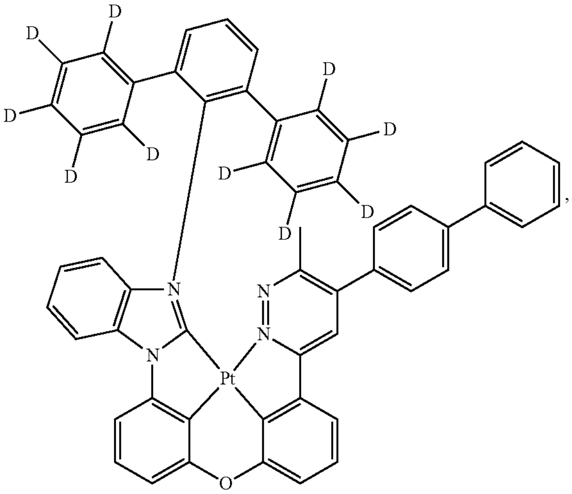
,
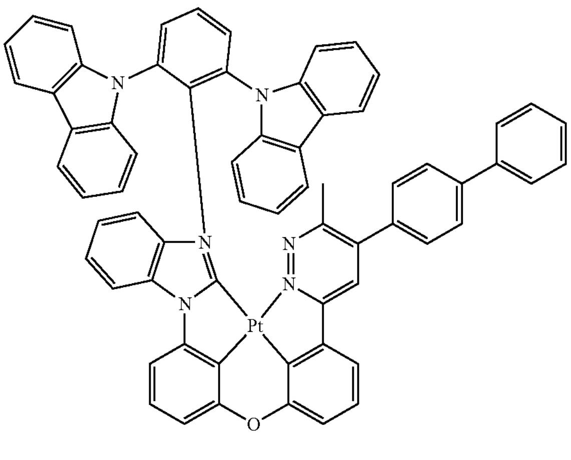
,
-continued
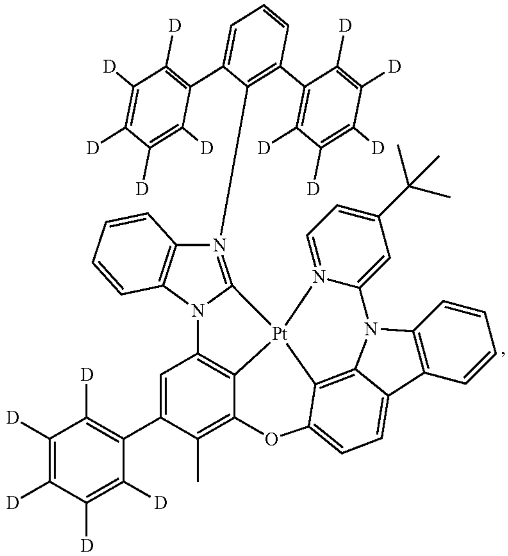
,
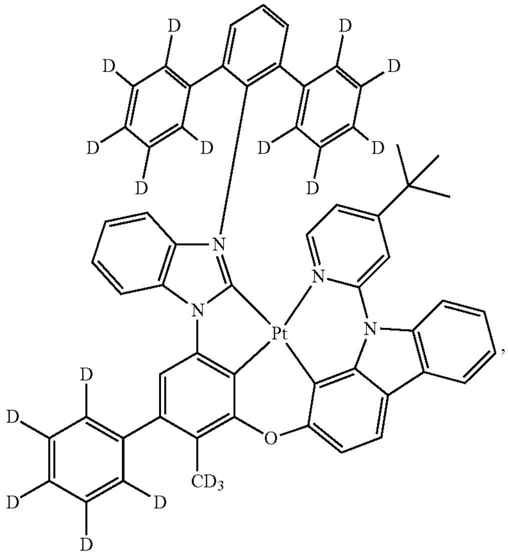
,
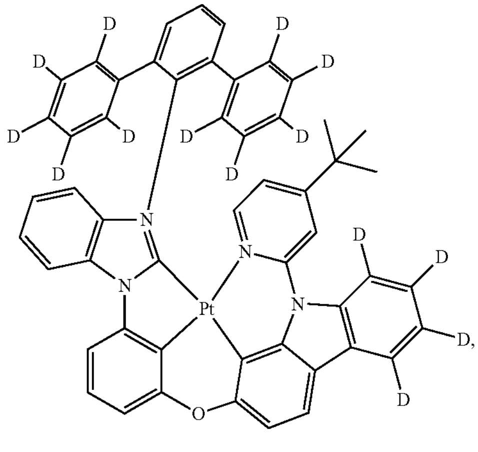
,

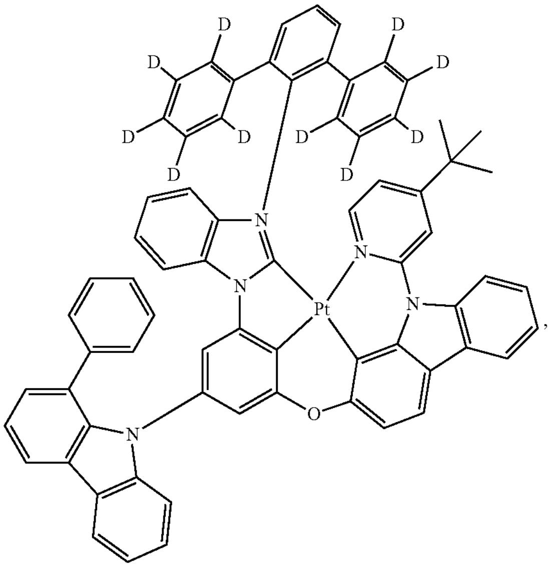
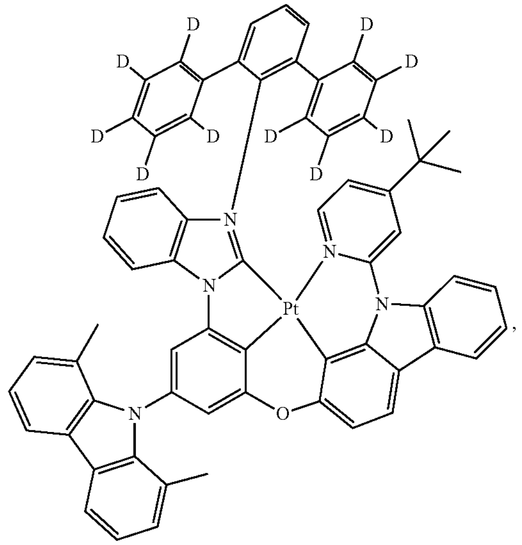
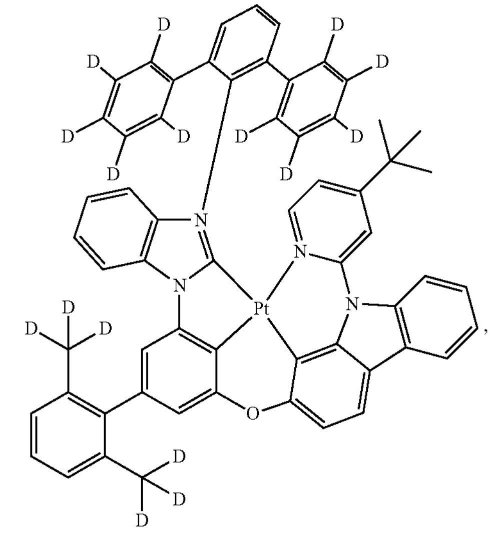
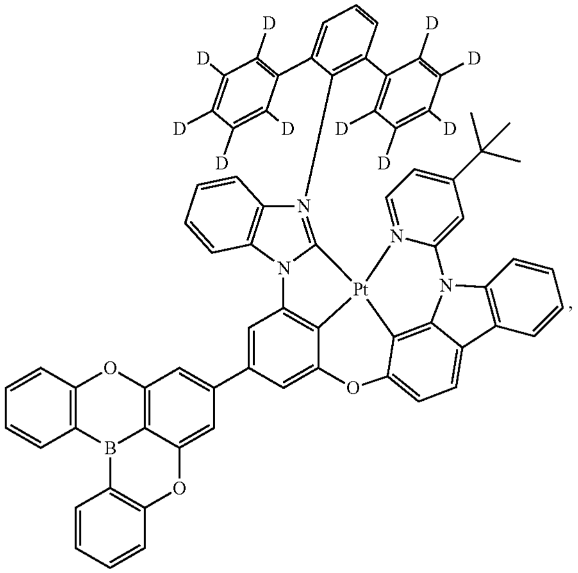
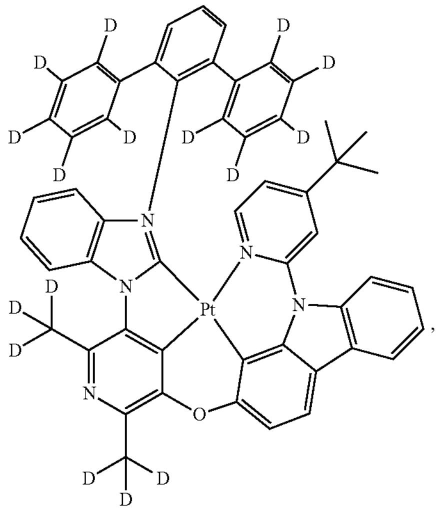
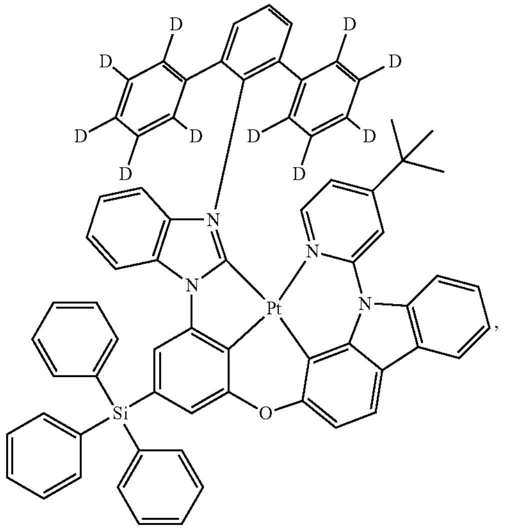

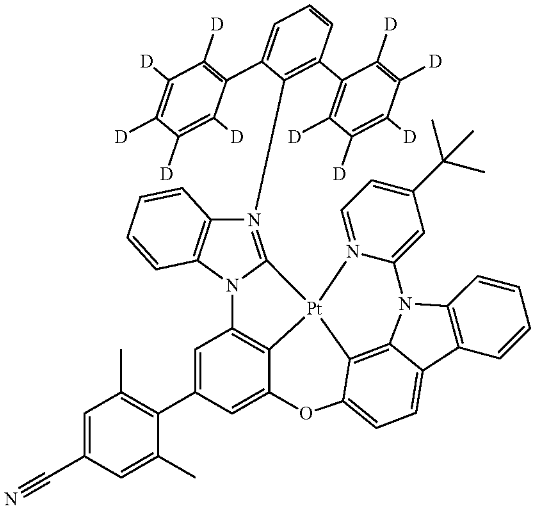
,
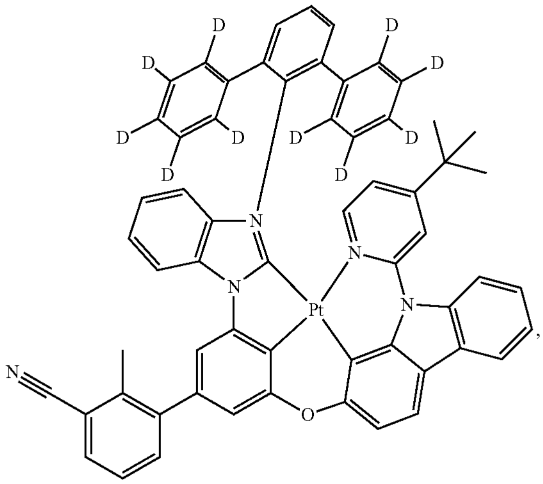
,
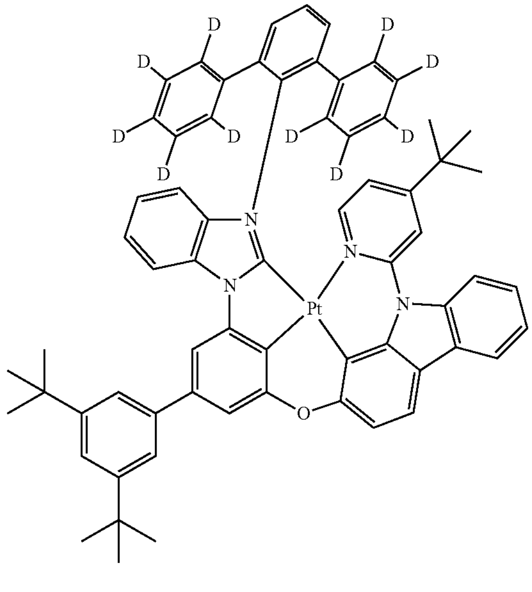
,
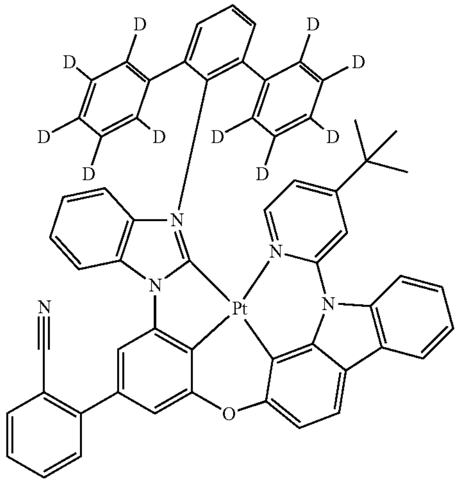
,
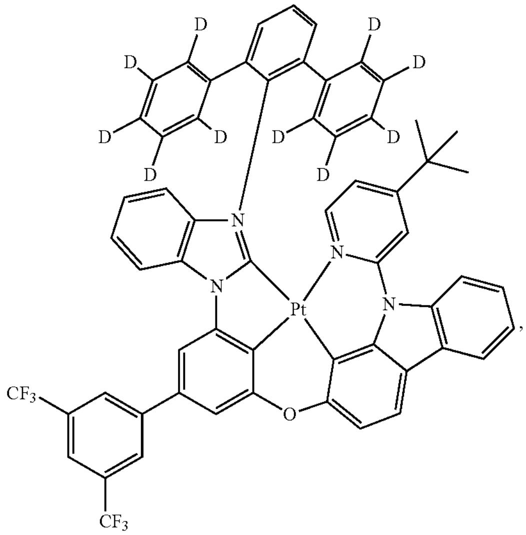
,
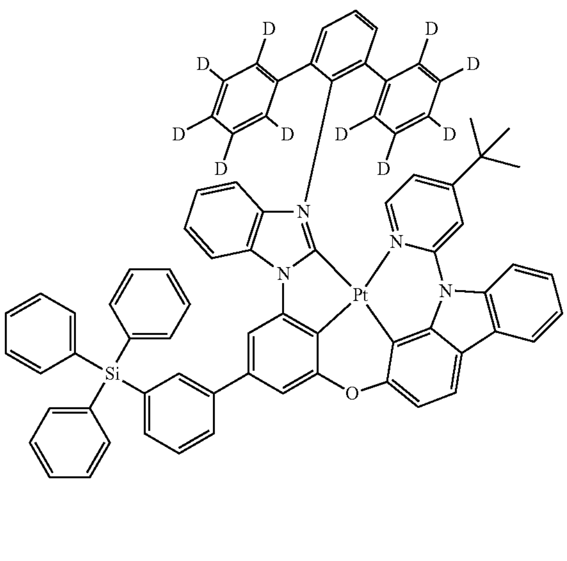
, -continued

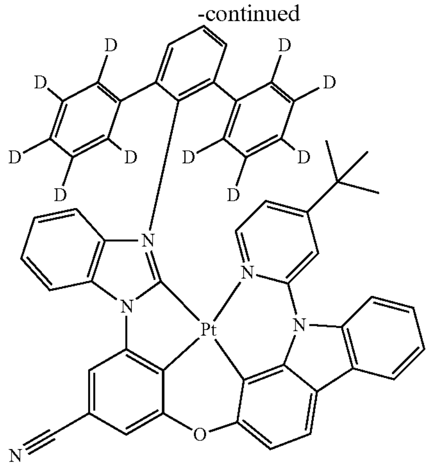

, and

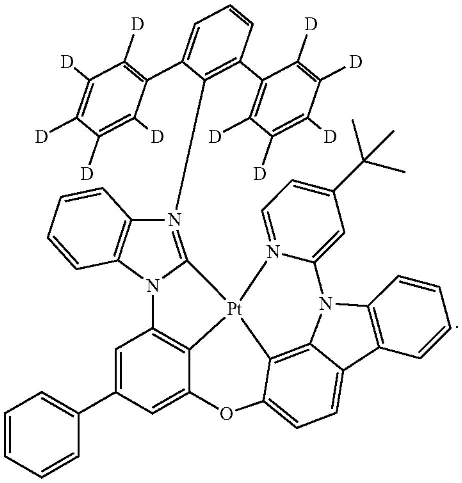

.

C. The OLEDs and the Devices of the Present Disclosure

In another aspect, the present disclosure also provides an OLED device comprising a first organic layer that contains a compound as disclosed in the above compounds section of the present disclosure.

In some embodiments, the OLED comprises an anode, a cathode, and an organic layer disposed between the anode and the cathode. The organic layer can comprise a compound of Formula I

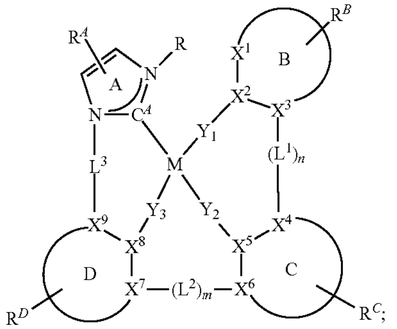

where, M is Pd or Pt; rings B, C, and D are each independently a 5-membered or 6-membered carbocyclic or heterocyclic ring; $X^1$ to $X^9$ are each independently C or N; $Y_1$ to $Y_3$ are each independently selected from the group consisting of a direct bond, O, and S; at least one of $Y_1$ to $Y_3$ is a direct bond; $C^A$ is a carbene carbon; $L^1$ to $L^3$ are each independently selected from the group consisting of a direct bond, O, S, CR'R", SiR'R", BR', and NR', alkyl, cycloalkyl, heteroalkyl, heterocycloalkyl, aryl, and heteroaryl; m and n are each independently 0 or 1; at least one of m and n is 1; at least one of R, $R^A$, $R^B$, $R^C$, $R^D$, $L^1$, $L^2$, and $L^3$ comprises a group having a structure of Formula II

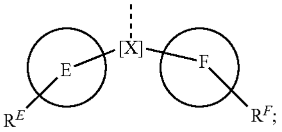

where, [X] is a 5-membered heterocyclic ring, 5-membered carbocyclic ring, a 6-membered heterocyclic ring, a 6-membered carbocyclic ring, or a fused heterocylic or carbocyclic ring system comprising two or more fused rings; rings E and F are each independently a 5-membered or 6-membered carbocyclic or heterocyclic ring; $R^A$, $R^B$, $R^C$, $R^D$, $R^E$, and $R^F$ each independently represent mono the maximum number of allowable substitutions, or no substitution; each R, R', R", $R^A$, $R^B$, $R^C$, $R^D$, $R^E$, and $R^F$ is independently a hydrogen or a substituent selected from the group consisting of the general substituents defined herein; any adjacent substituents can be joined or fused into a ring; R and an $R^B$ substituent can be joined to form a ring; and the molecular weight of the group having a structure of Formula II is greater than or equal to 395 grams/mole.

In another embodiment of the OLED, the organic layer comprises a compound comprising a structure selected from the group consisting of:

Formula V

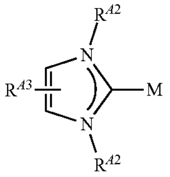

and

Formula VI

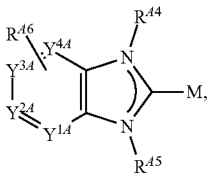

where,

M is selected from the group consisting of Os, Pd, Pt, Ir, Cu, and Au;

at least one of $R^{A1}$, $R^{A2}$, $R^{A4}$, $R^{A5}$, or $R^{A6}$ is a structure of Formula VII

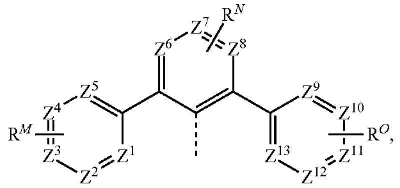

Formula VIII

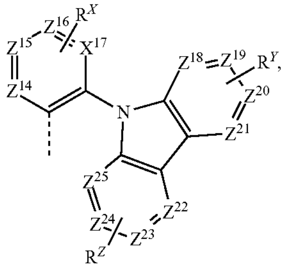

or

Formula IX

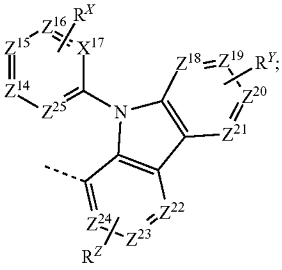

where $Y^{1A}$ to $Y^{4A}$ are each independently C or N; no more than two of $Y^{1A}$ to $Y^{4A}$ are N; $Z^1$ to $Z^{21}$ are each independently C or N; three consecutive Z' to $Z^{21}$ in the same ring cannot be N; $R^{A5}$, $R^{A6}$, $R^M$, $R^N$, $R^O$, $R^X$, $R^Y$, and $R^Z$ each independently represent mono to the maximum allowable substitutions, or no substitution; each $R^{A1}$, $R^{A2}$, $R^{A5}$, $R^{A4}$, $R^{A5}$, $R^{A6}$, $R^M$, $R^N$, $R^O$, $R^X$, $R^Y$, and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof; M can be coordinated to other ligands; any two substituents can be joined or fused to form a ring; and provided that when the compound is Formula V, and one of $R^{A1}$ and $R^{A2}$ is Formula VII, then at least one of $R^M$, $R^N$, and $R^O$ is selected from the group consisting of deuterium, alkyl, cycloalkyl, heteroalkyl, heterocycloalkyl, aryl, heteroaryl, and combinations thereof.

In some embodiments, the organic layer may be an emissive layer and the compound as described herein may be an emissive dopant or a non-emissive dopant.

In some embodiments, the organic layer may further comprise a host, wherein the host comprises a triphenylene containing benzo-fused thiophene or benzo-fused furan, wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1{-}Ar_2$, $C_nH_{2n}{-}Ar_1$, or no substitution, wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments, the organic layer may further comprise a host, wherein host comprises at least one chemical group selected from the group consisting of triphenylene, carbazole, indolocarbazole, dibenzothiophene, dibenzofuran, dibenzoselenophene, 5,9-dioxa-13b-boranaphtho[3,2,1-de]anthracene, aza-triphenylene, aza-carbazole, aza-indolocarbazole, aza-dibenzothiophene, aza-dibenzofuran, aza-dibenzoselenophene, and aza-(5,9-dioxa-13b-boranaphtho[3,2,1-de]anthracene).

In some embodiments, the host may be selected from the HOST Group consisting of:

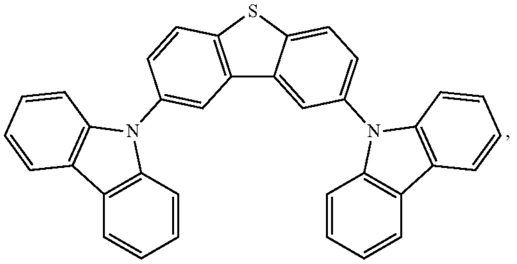

,

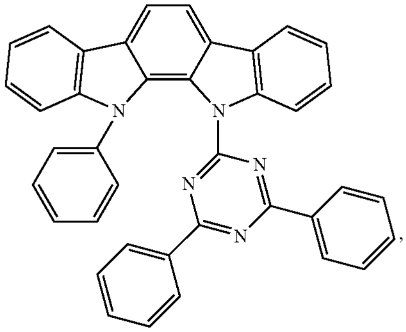

,

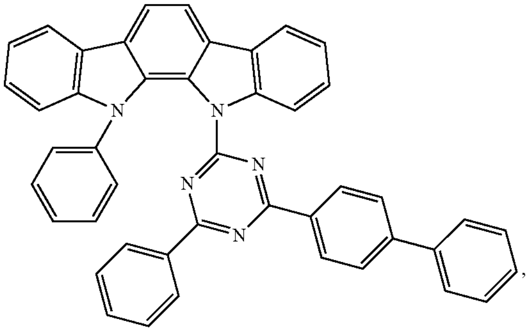

,

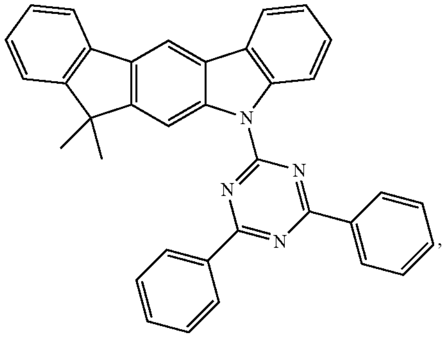

,

-continued
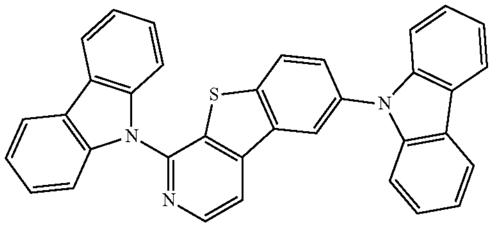
,
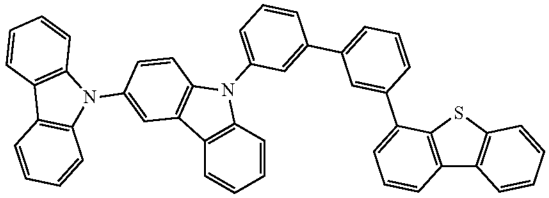
,
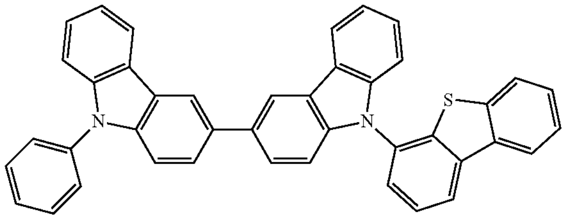
,
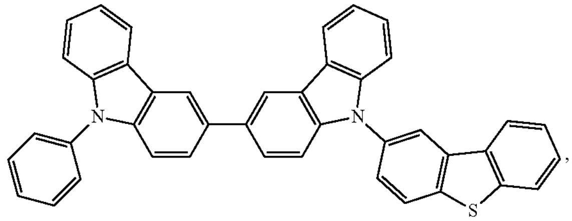
,
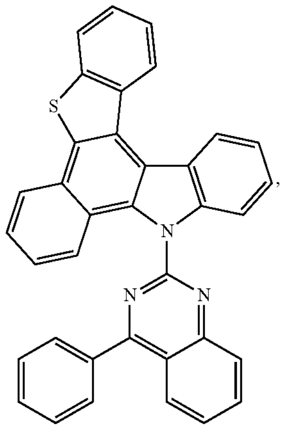
,
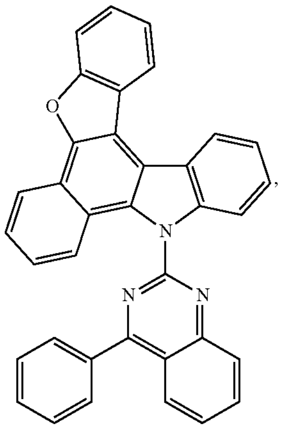
,
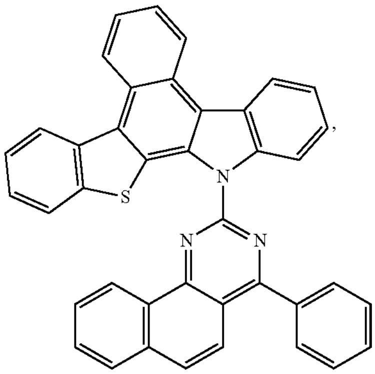
,
-continued
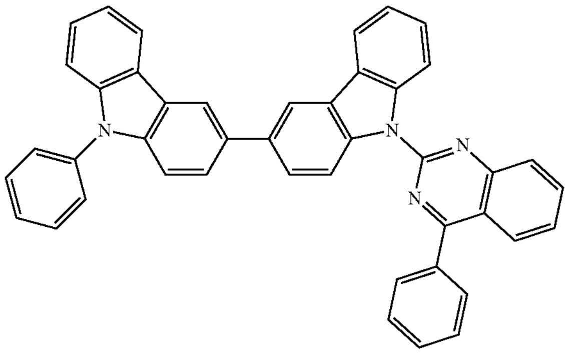
,
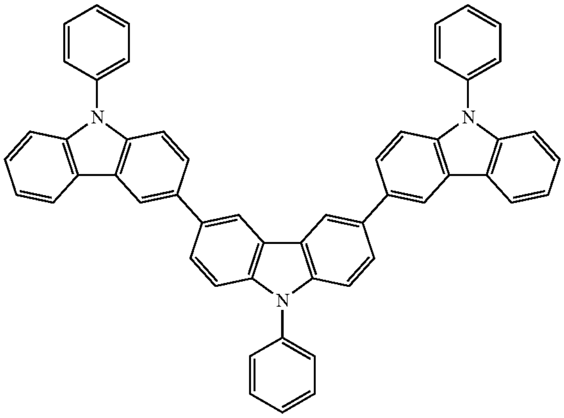
,
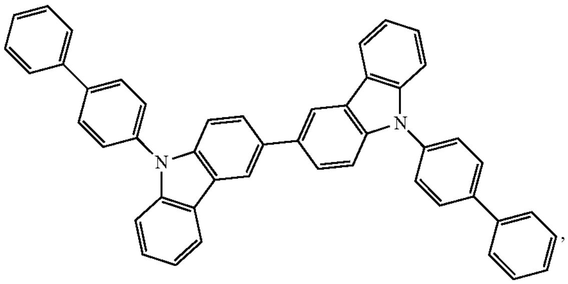
,
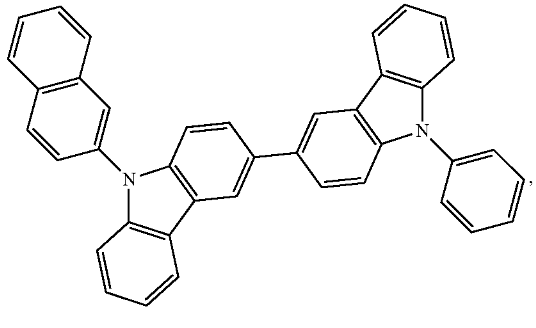
,
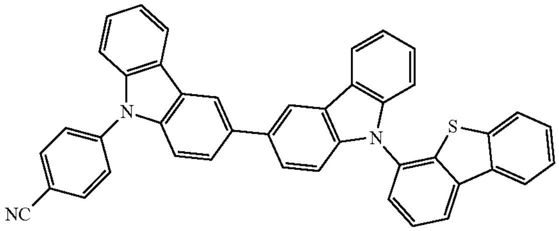
, -continued
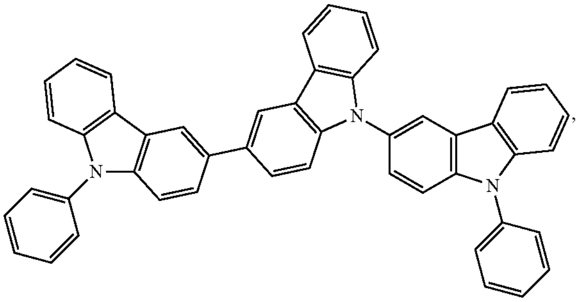
,
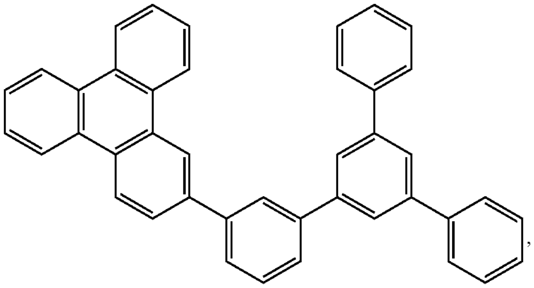
,
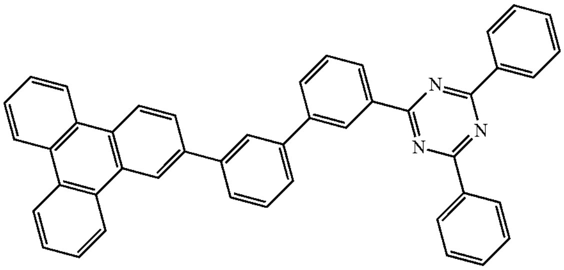
,
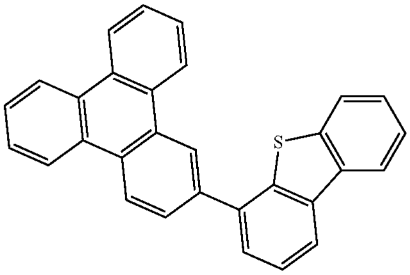
,
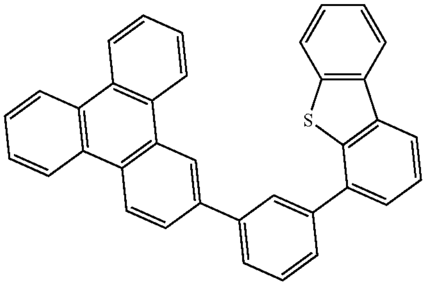
,
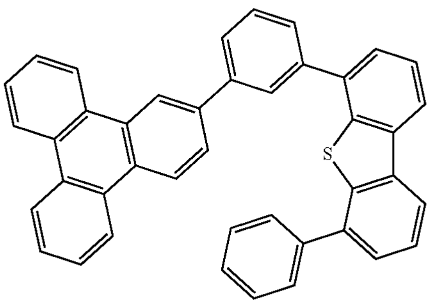
,
-continued
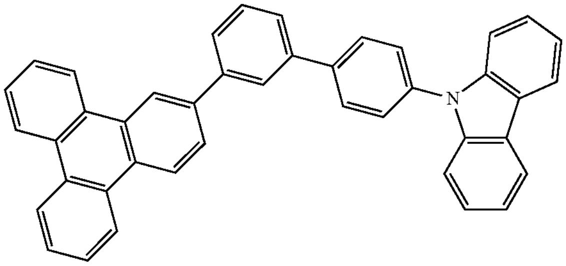
,
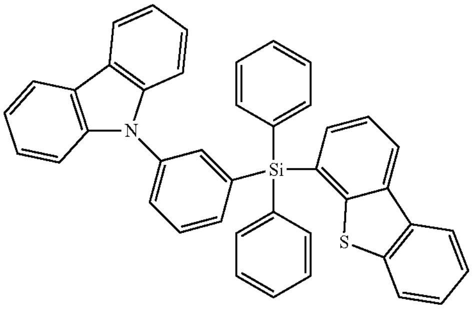
,
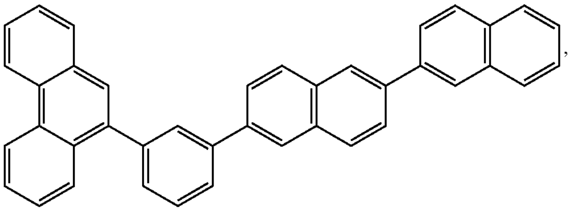
,
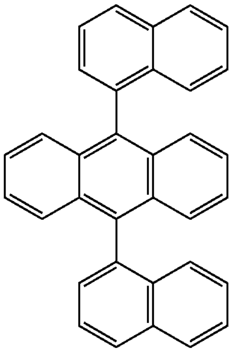
,
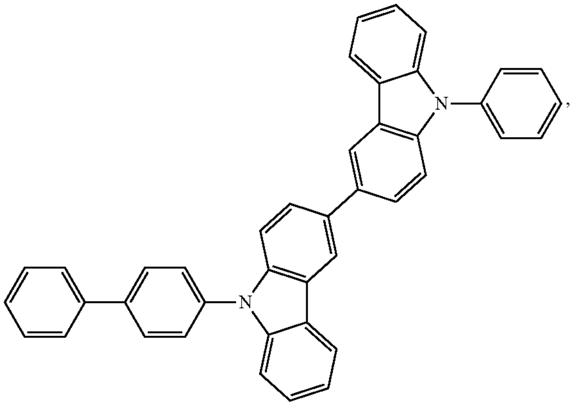
, -continued

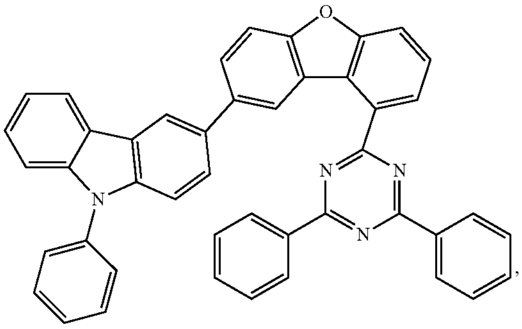,

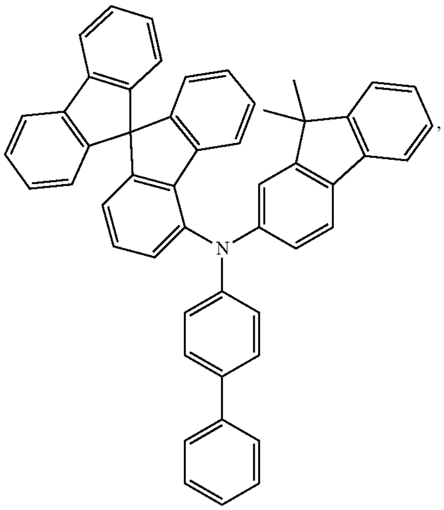,

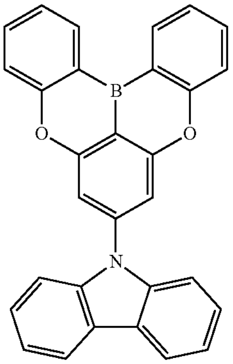,

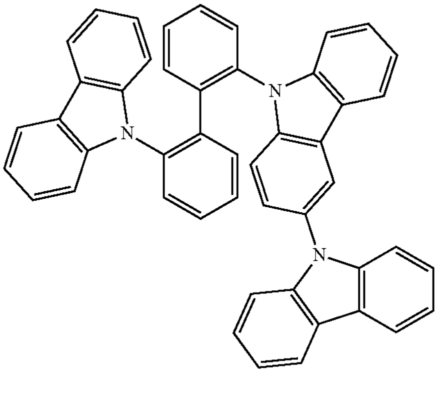,

-continued

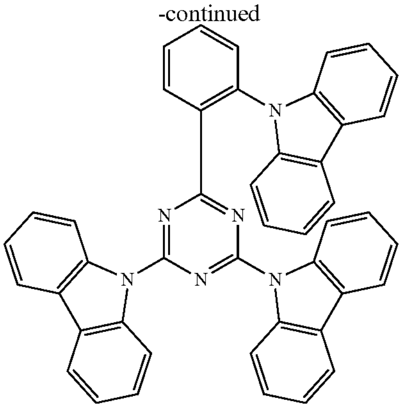,

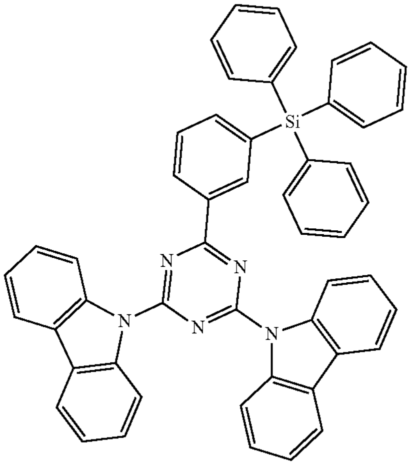, and combinations thereof.

In some embodiments, the organic layer may further comprise a host, wherein the host comprises a metal complex.

In some embodiments, the compound as described herein may be a sensitizer; wherein the device may further comprise an acceptor; and wherein the acceptor may be selected from the group consisting of fluorescent emitter, delayed fluorescence emitter, and combination thereof.

In yet another aspect, the OLED of the present disclosure may also comprise an emissive region containing a compound as disclosed in the above compounds section of the present disclosure.

An emissive region in an OLED is also disclosed. The emissive region comprises a compound of Formula I

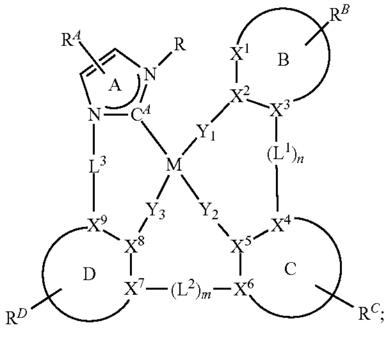;

where, M is Pd or Pt; rings B, C, and D are each independently a 5-membered or 6-membered carbocyclic or heterocyclic ring; $X^1$ to $X^9$ are each independently C or N; $Y_1$ to $Y_3$ are each independently selected from the group consisting of a direct bond, O, and S; at least one of $Y_1$ to $Y_3$ is a direct bond; $C^A$ is a carbene carbon; $L^1$ to $L^3$ are each independently selected from the group consisting of a direct bond, O, S, CR'R", SiR'R", BR', and NR', alkyl, cycloalkyl, heteroalkyl, heterocycloalkyl, aryl, and heteroaryl; m and n are each independently 0 or 1; at least one of m and n is 1; at least one of R, $R^A$, $R^B$, $R^C$, $R^D$, $L^1$, $L^2$, and $L^3$ comprises a group having a structure of Formula II

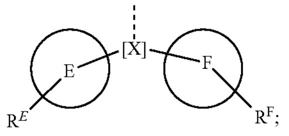

where, [X] is a 5-membered heterocyclic ring, 5-membered carbocyclic ring, a 6-membered heterocyclic ring, a 6-membered carbocyclic ring, or a fused heterocylic or carbocyclic ring system comprising two or more fused rings; rings E and F are each independently a 5-membered or 6-membered carbocyclic or heterocyclic ring; $R^A$, $R^B$, $R^C$, $R^D$, $R^E$, and $R^F$ each independently represent mono the maximum number of allowable substitutions, or no substitution; each R, R', R", $R^A$, $R^B$, $R^C$, $R^D$, $R^E$, and $R^F$ is independently a hydrogen or a substituent selected from the group consisting of the general substituents defined herein; any adjacent substituents can be joined or fused into a ring; R and an $R^B$ substituent can be joined to form a ring; and the molecular weight of the group having a structure of Formula II is greater than or equal to 395 grams/mole.

In another embodiment of an emissive region in an OLED, the emissive region comprises a compound comprising a structure of a formula selected from the group consisting of Formula V

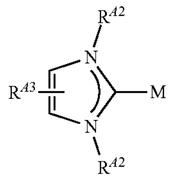

and

Formula VI

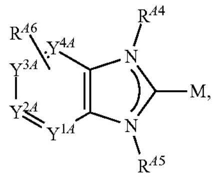

where,

M is selected from the group consisting of Os, Pd, Pt, Ir, Cu, and Au; at least one of $R^{A1}$, $R^{A2}$, $R^{A4}$, $R^{A5}$, or $R^{A6}$ is a structure of Formula VII

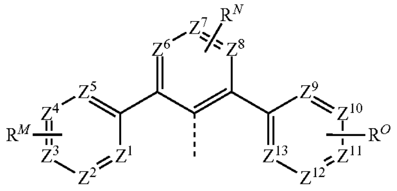

or

Formula VIII

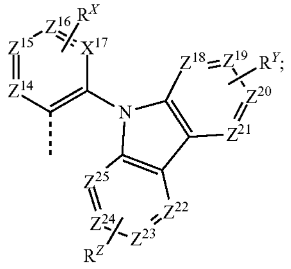

where $Y^{1A}$ to $Y^{4A}$ are each independently C or N; no more than two of $Y^{1A}$ to $Y^{4A}$ are N; $Z^1$ to $Z^{25}$ are each independently C or N; three consecutive $Z^1$ to $Z^{25}$ in the same ring cannot be N; $R^{A3}$, $R^{A6}$, $R^M$, $R^N$, $R^O$, $R^X$, $R^Y$, and $R^Z$ each independently represent mono to the maximum allowable substitutions, or no substitution; each $R^{A1}$, $R^{A2}$, $R^{A5}$, $R^{A4}$, $R^{A5}$, $R^{A6}$, $R^M$, $R^N$, $R^O$, $R^X$, $R^Y$, and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof; M can be coordinated to other ligands; any two substituents can be joined or fused to form a ring; and provided that when the compound is Formula V, and one of $R^{A1}$ and $R^{A2}$ is Formula VII, then at least one of $R^M$, $R^N$, and $R^O$ is selected from the group consisting of deuterium, alkyl, cycloalkyl, heteroalkyl, heterocycloalkyl, aryl, heteroaryl, and combinations thereof.

In some embodiments of the emissive region described above, the compound can be an emissive dopant or a non-emissive dopant. In some embodiments, the emissive region further comprises a host, wherein the host contains at least one group selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

In some embodiments of the emissive region, the emissive region further comprises a host, where the host is selected from the Host Group defined herein.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In yet another aspect, the present disclosure also provides a consumer product comprising an organic light-emitting device (OLED) having an anode; a cathode; and an organic layer disposed between the anode and the cathode, wherein the organic layer may comprise a compound as disclosed in the above compounds section of the present disclosure.

According to some embodiments of the present disclosure, a consumer product comprising the OLED that contains the novel compound of the present disclosure is also disclosed.

In some embodiments, the consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
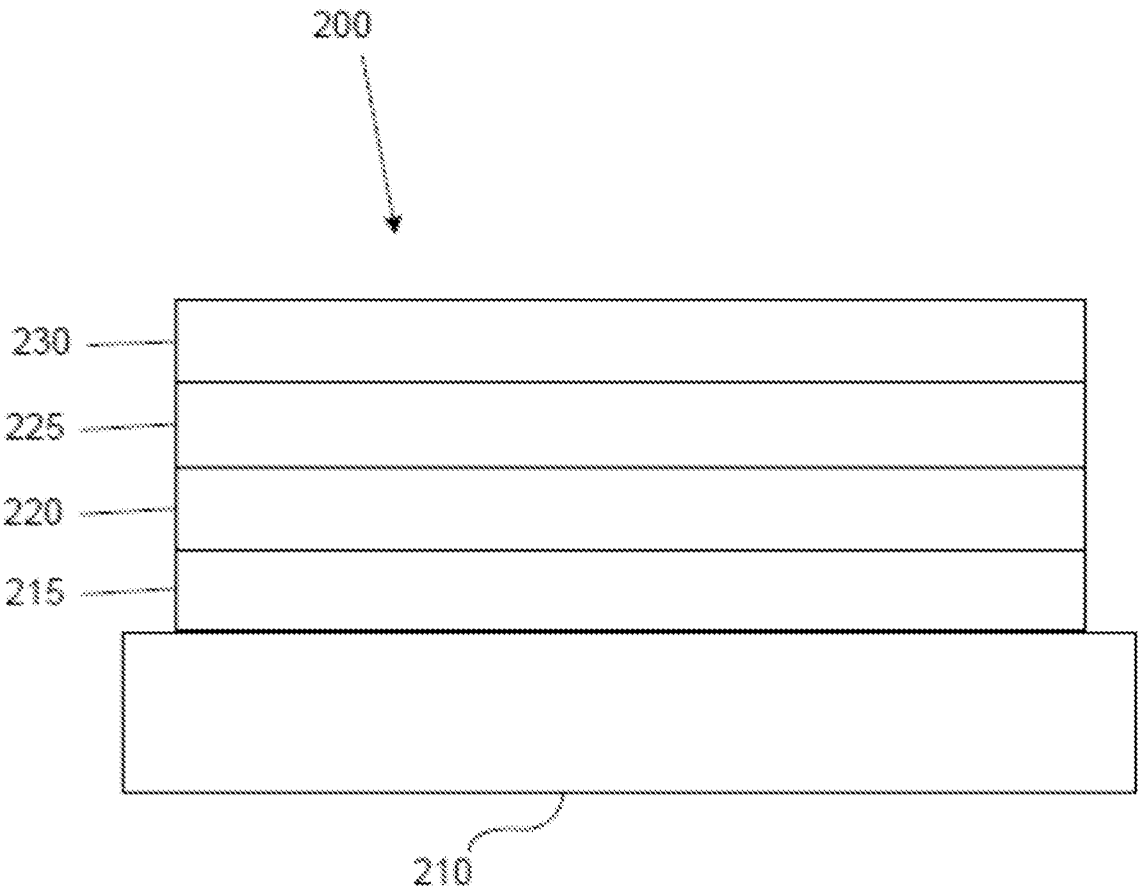
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree c. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

D. Combination of the Compounds of the Present Disclosure with Other Materials The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

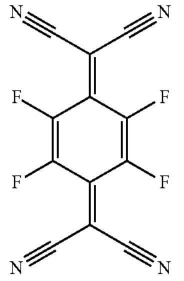

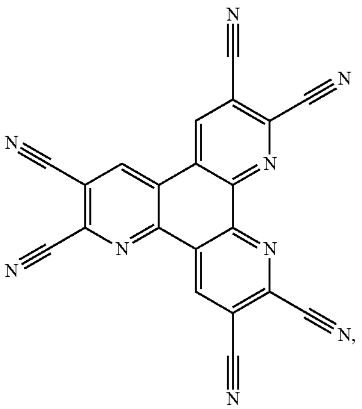

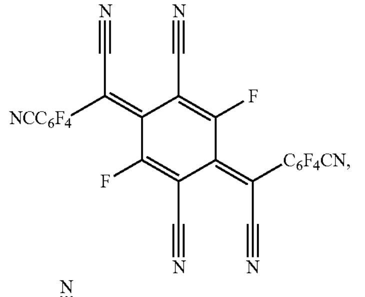

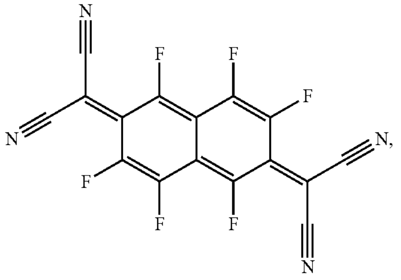

-continued

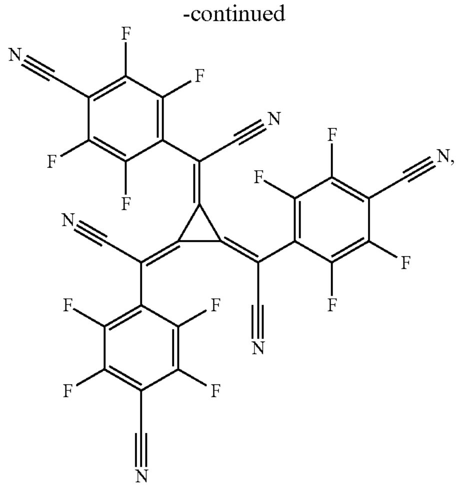

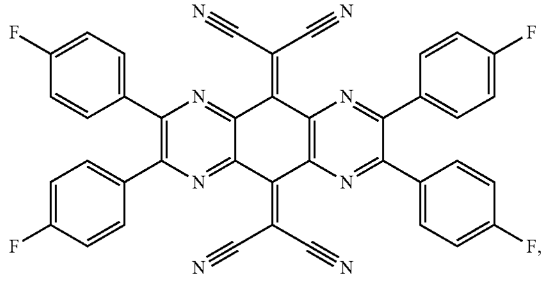

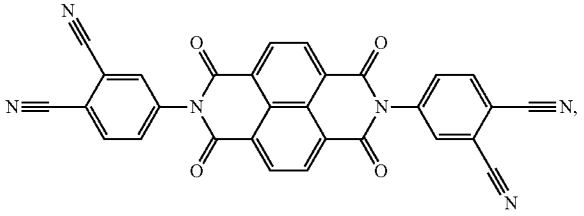

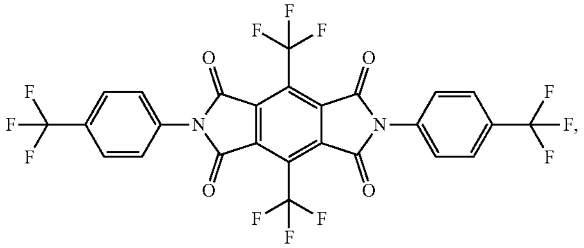

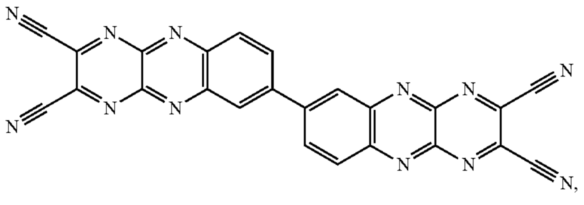

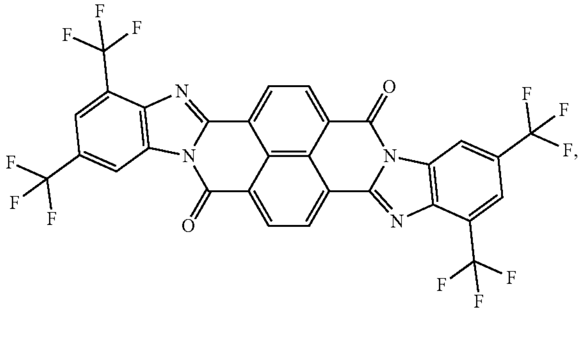

-continued

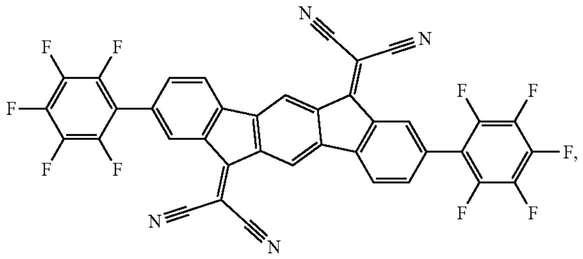

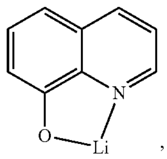

,

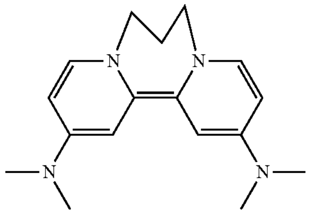

and

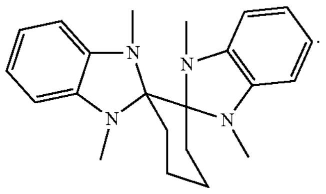

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

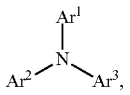

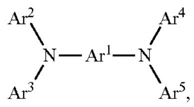

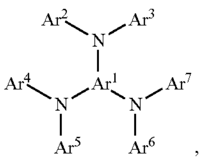

,

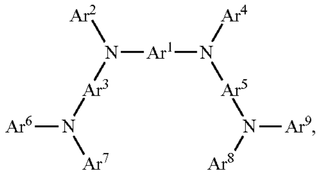

and

-continued

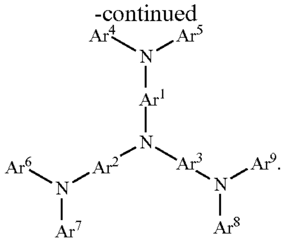

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

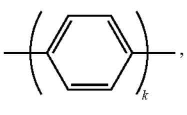,
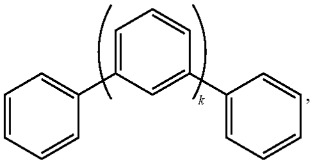,
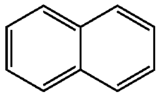,
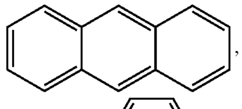,
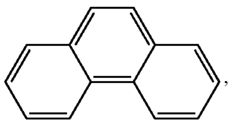,
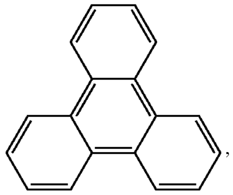, -continued

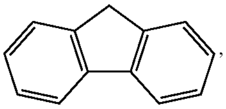, and 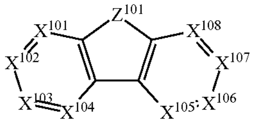, wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

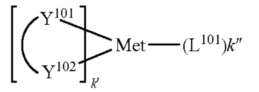

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

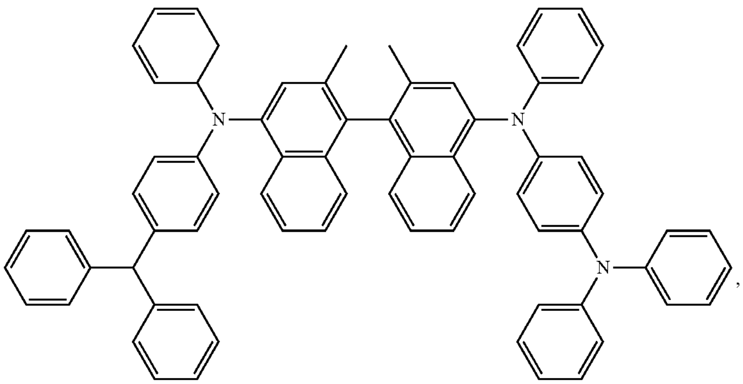
,
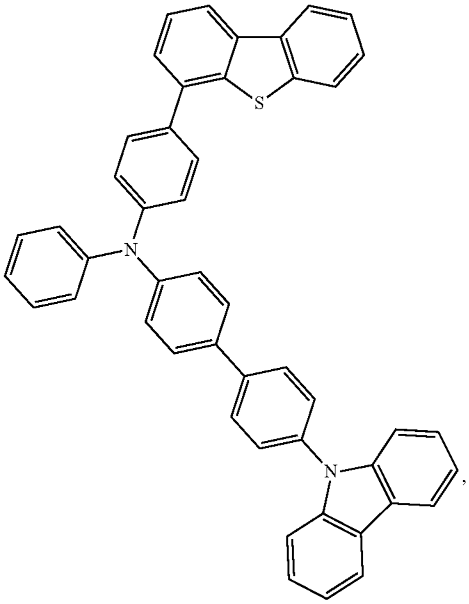
,
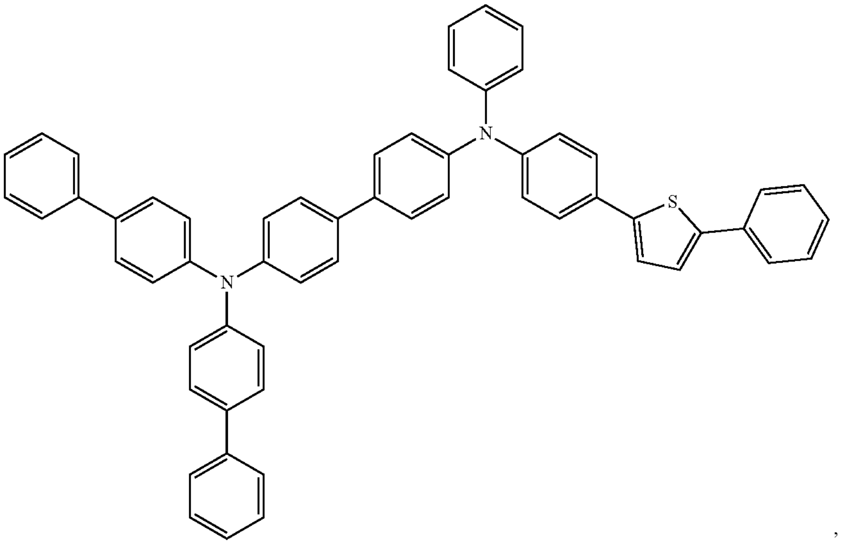
,

-continued
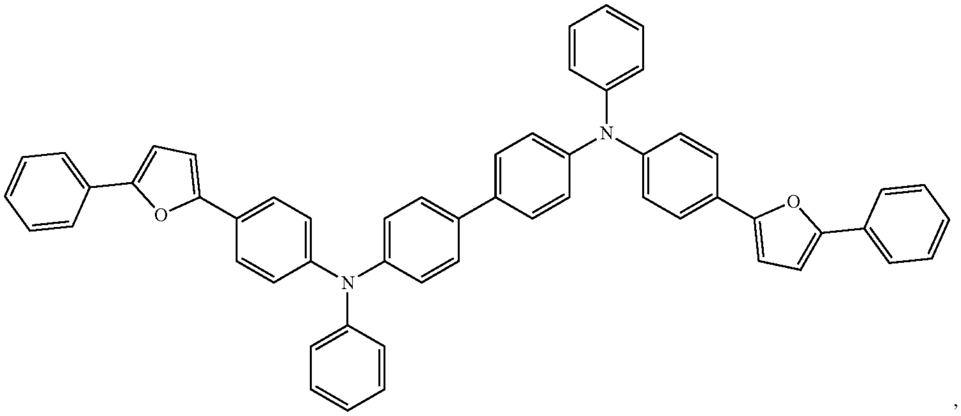
,
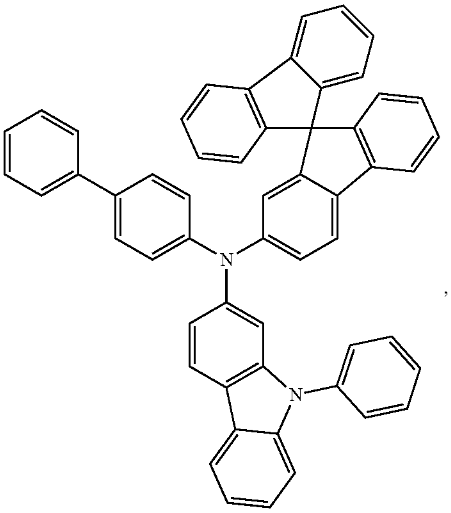
,
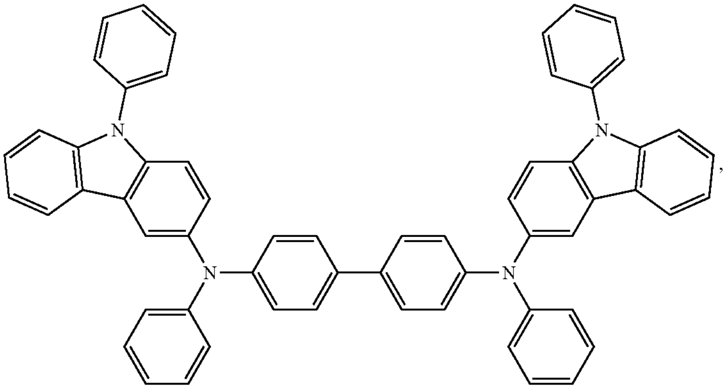
,
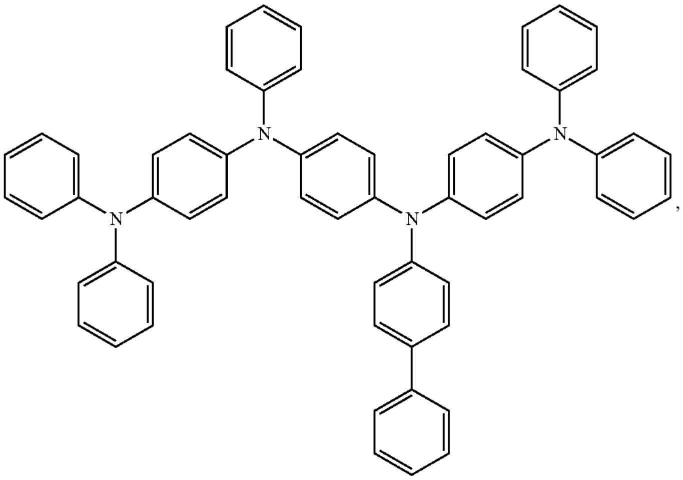
,

-continued
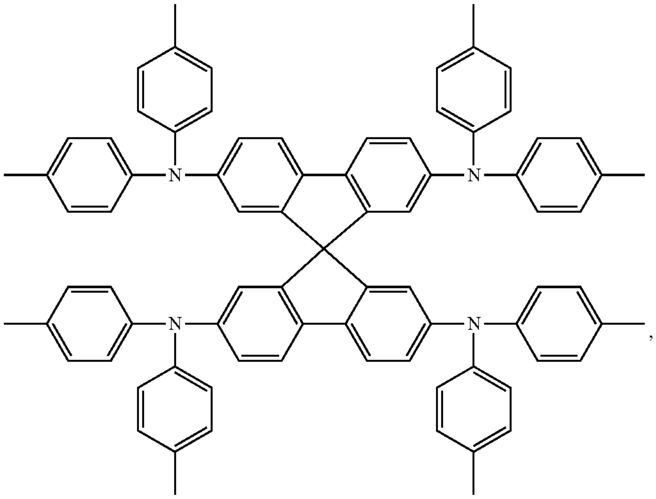
,
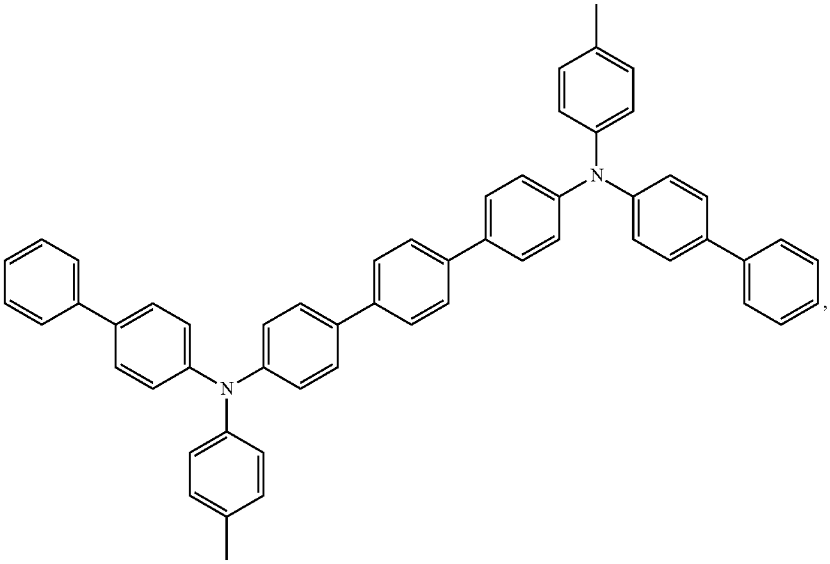
,
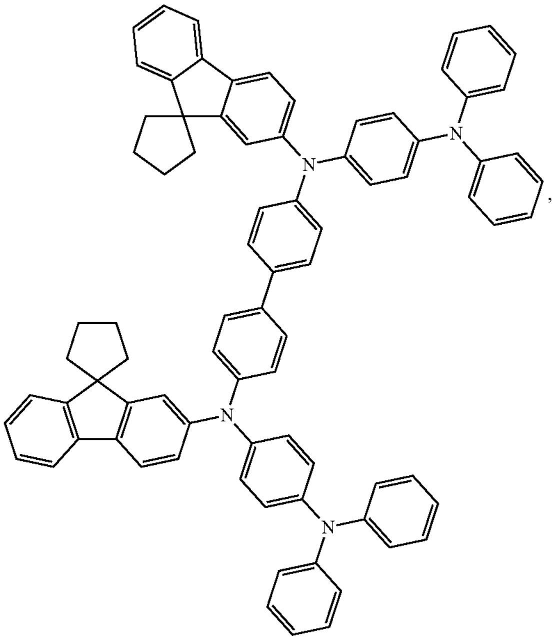
,

-continued
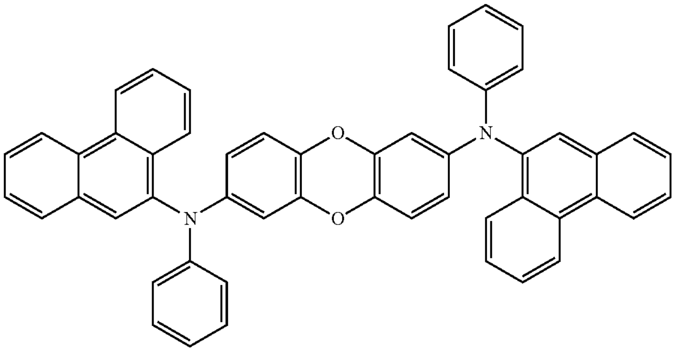
,
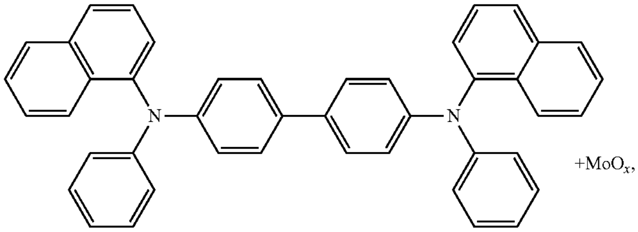
+MoO$_x$,
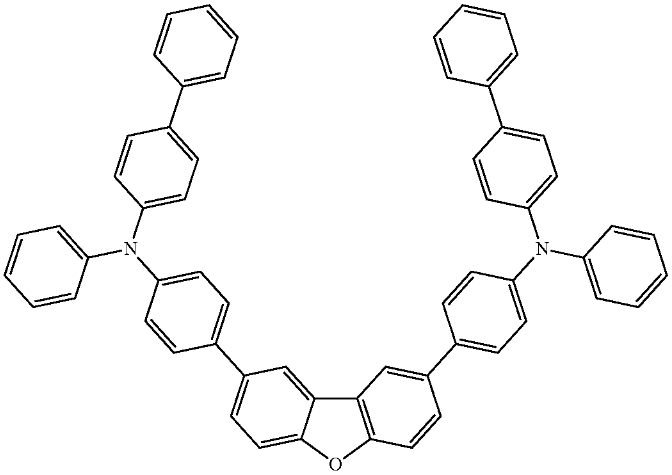
,
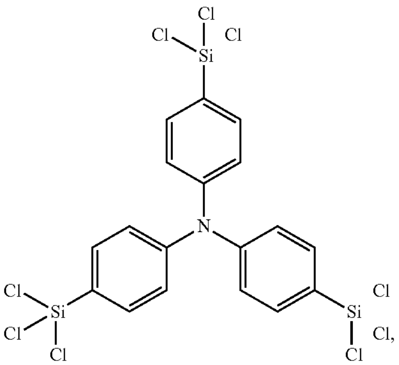
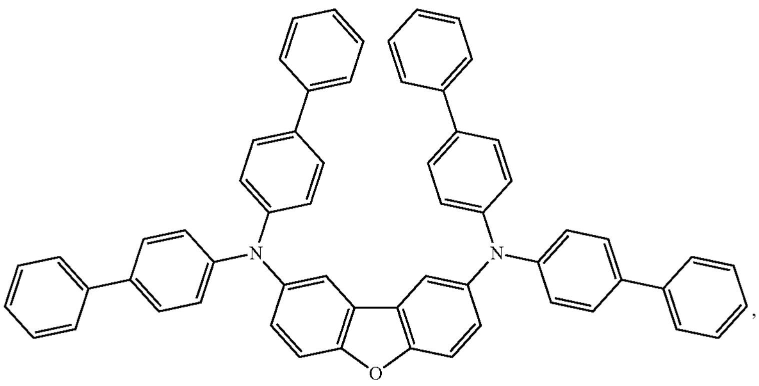
,
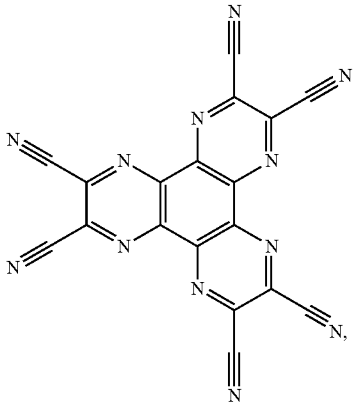

-continued
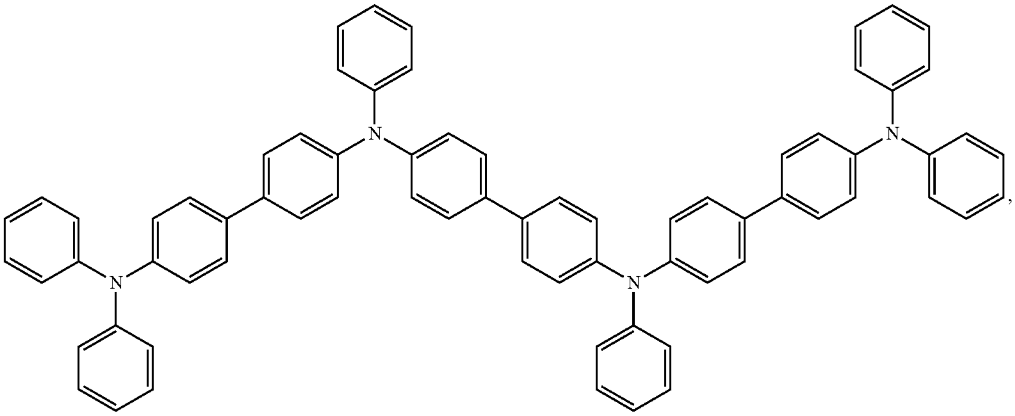
,
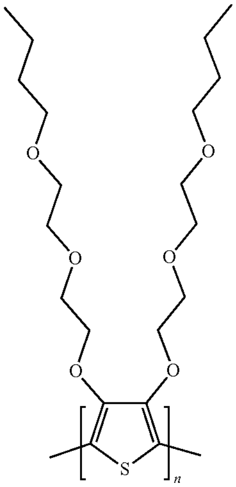
,
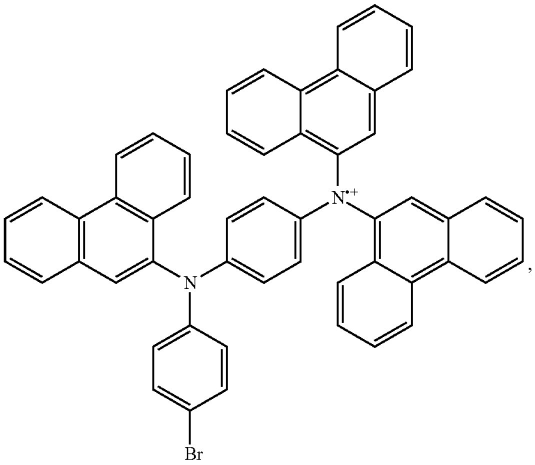
,
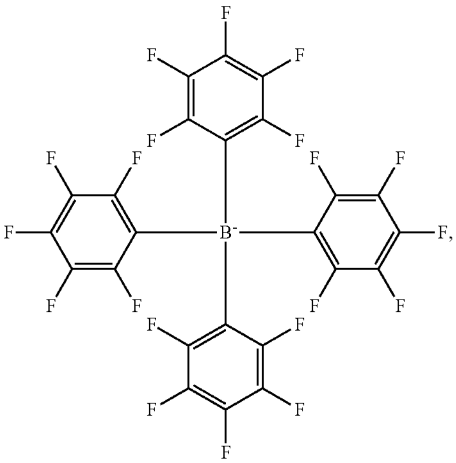
,
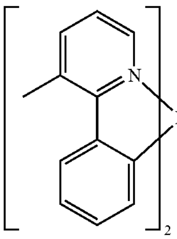
,
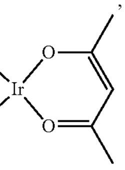
, -continued
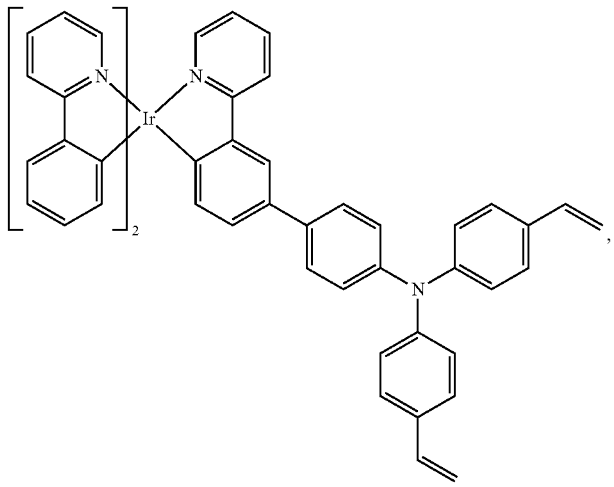
,
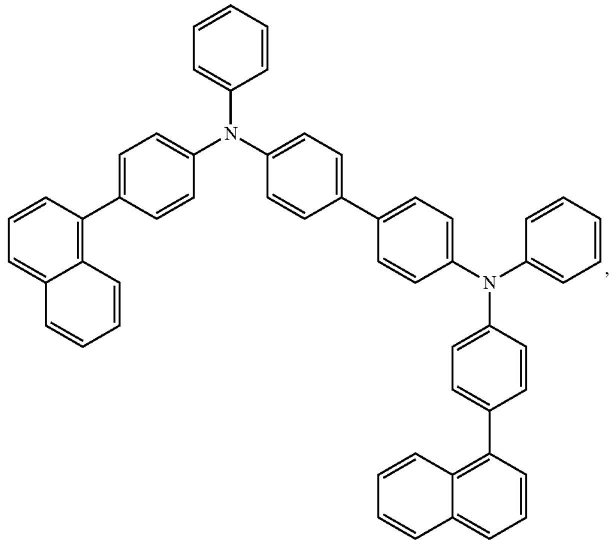
,
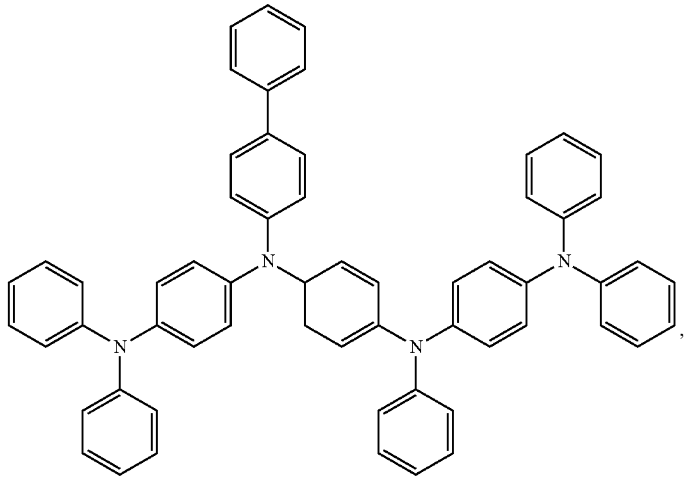
, -continued
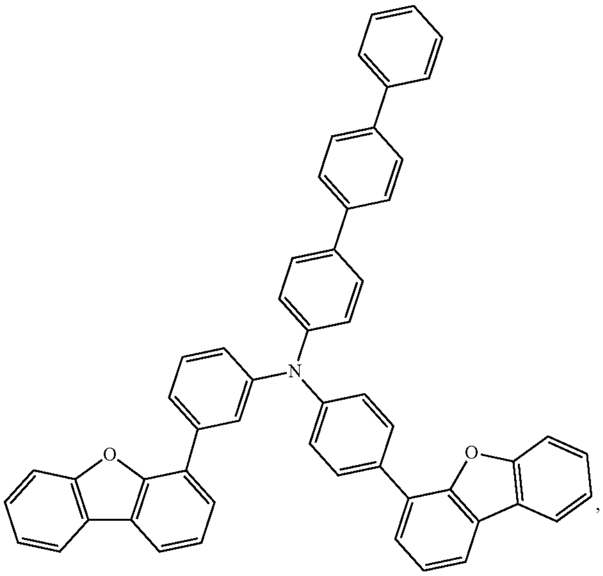
,
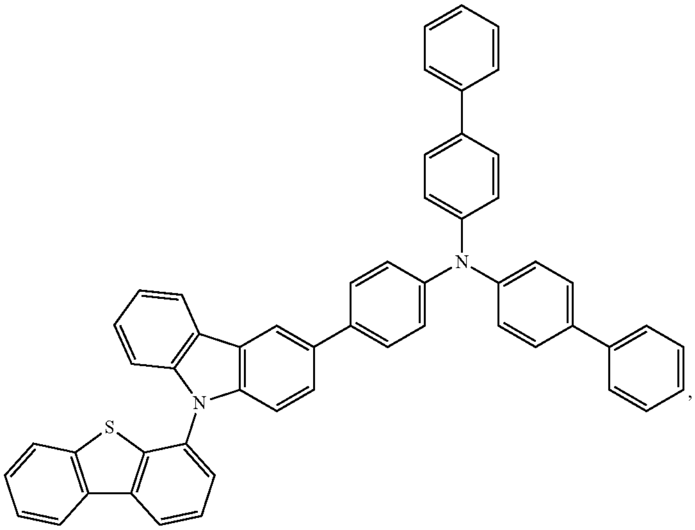
,
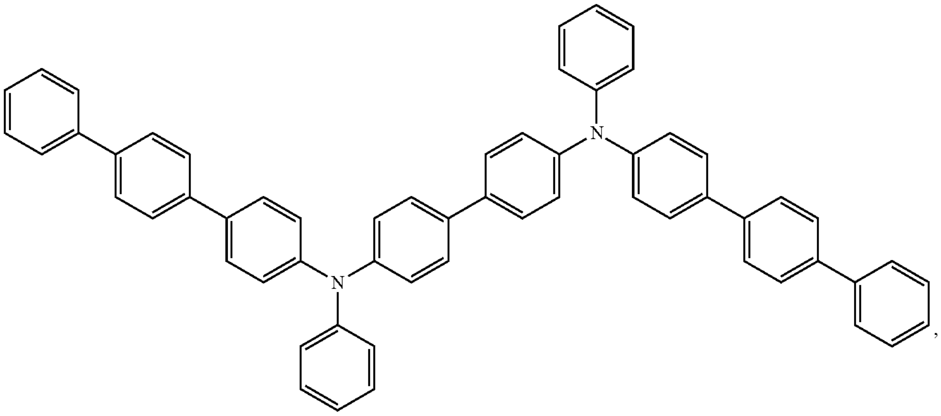
, -continued
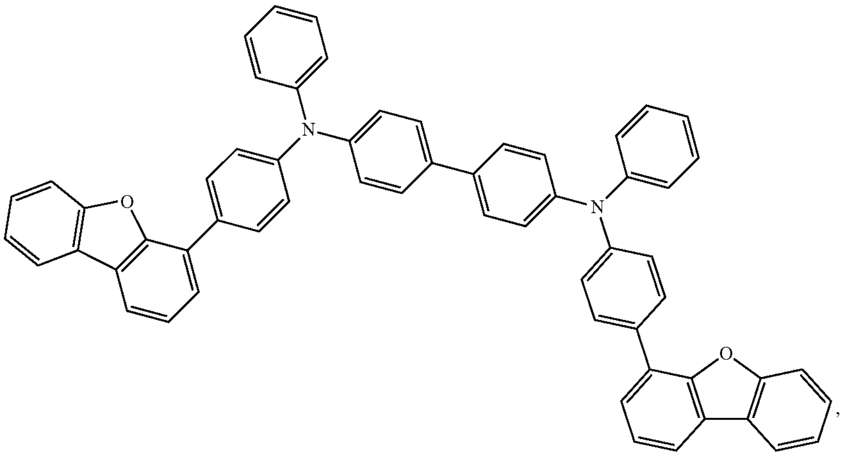
,
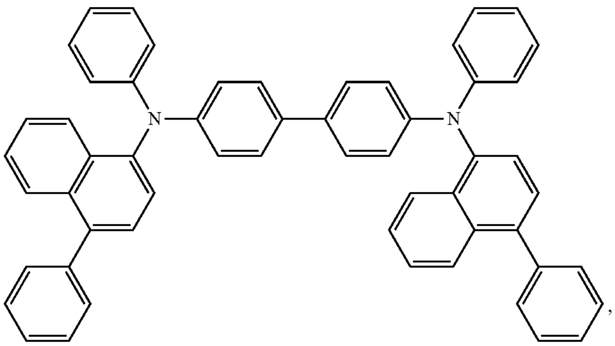
,
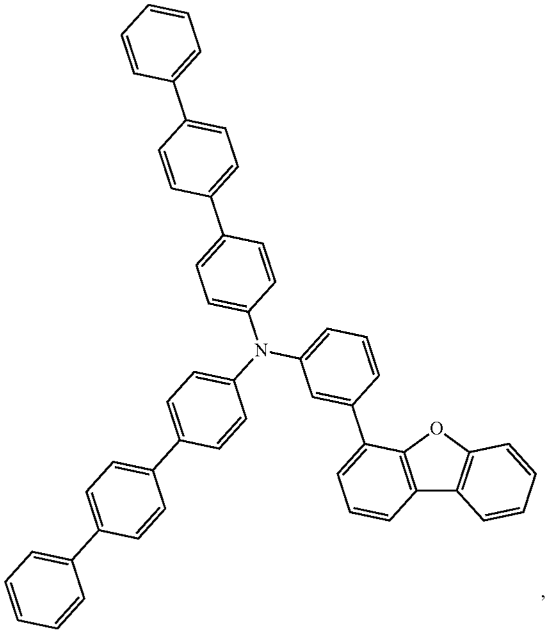
,
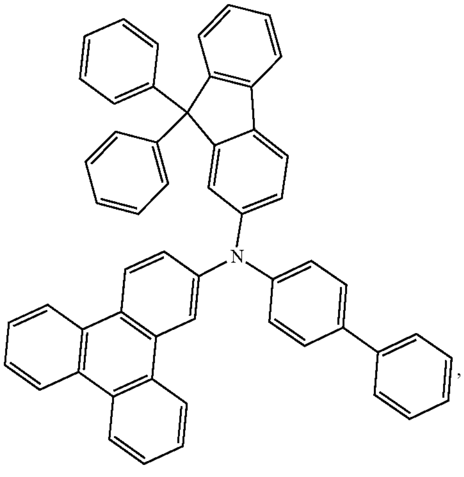
,
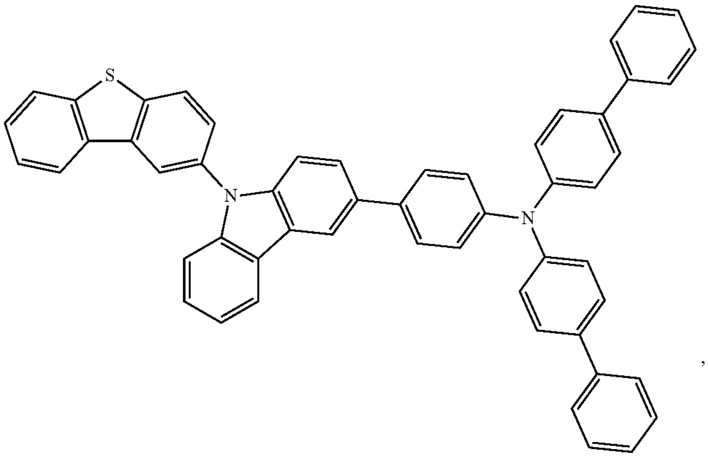
, -continued
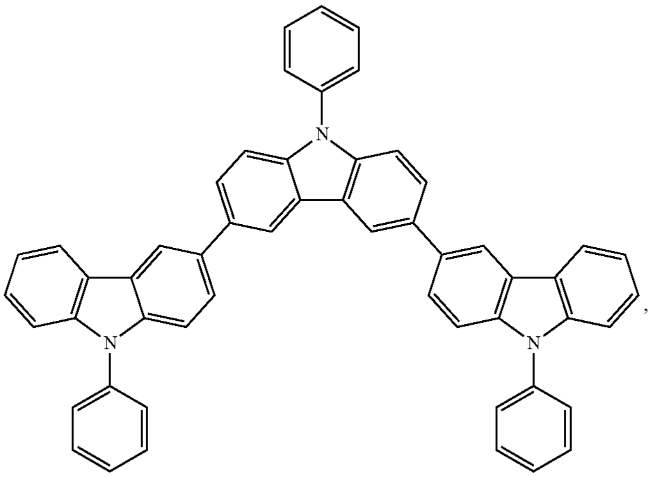
,
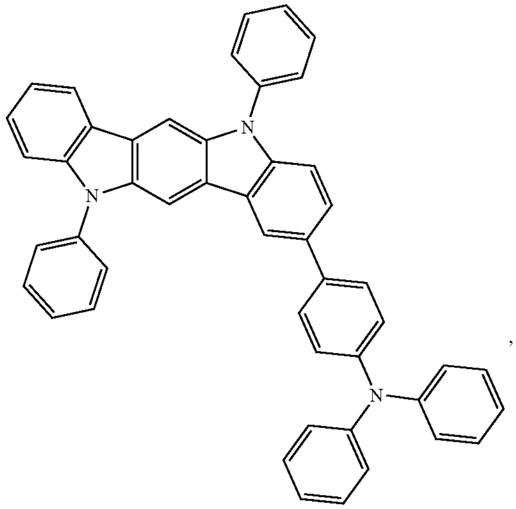
,
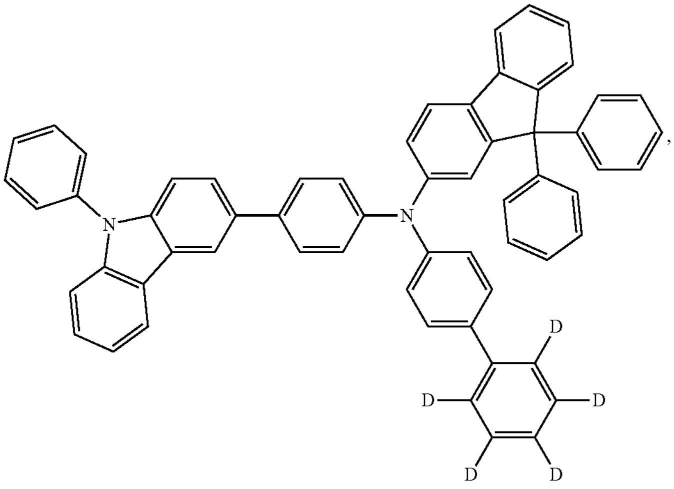
,
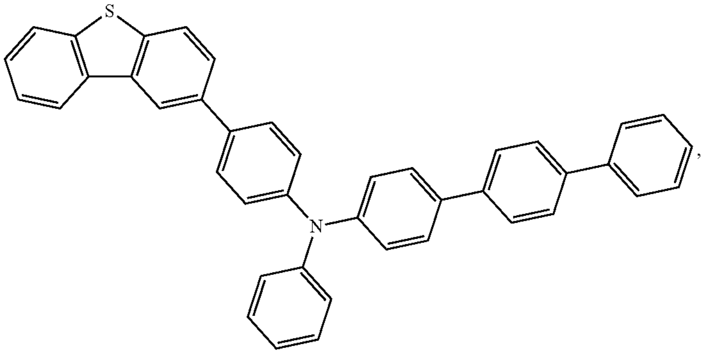
, -continued
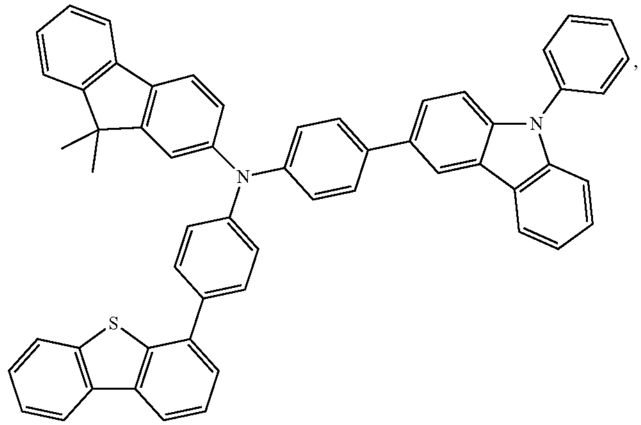
,
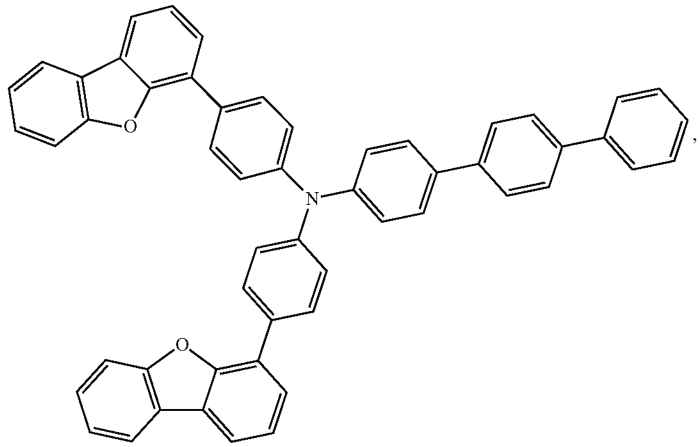
,
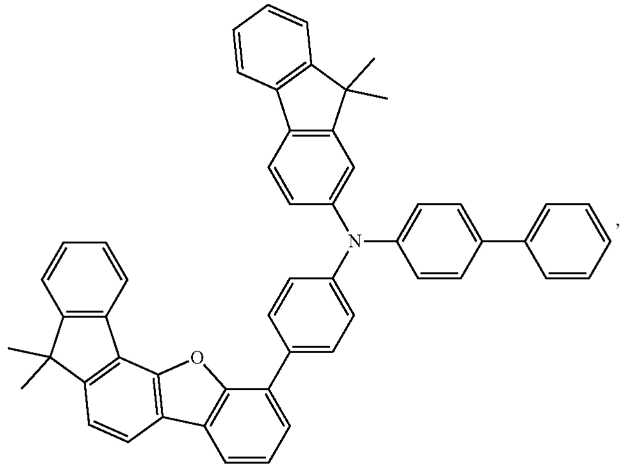
,
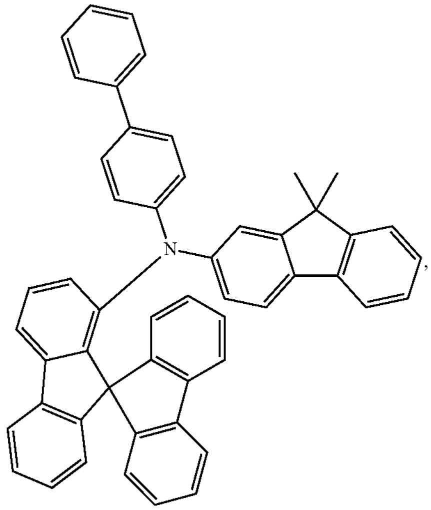
, -continued
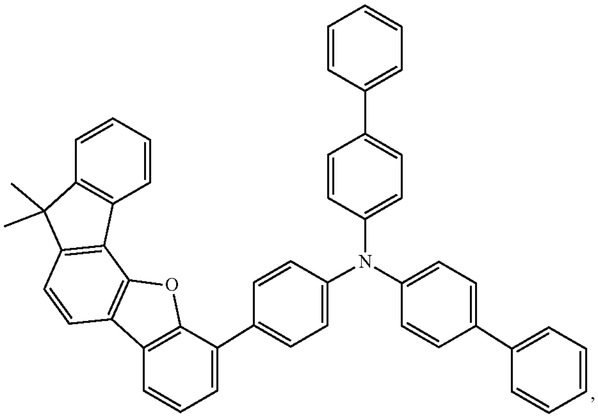,
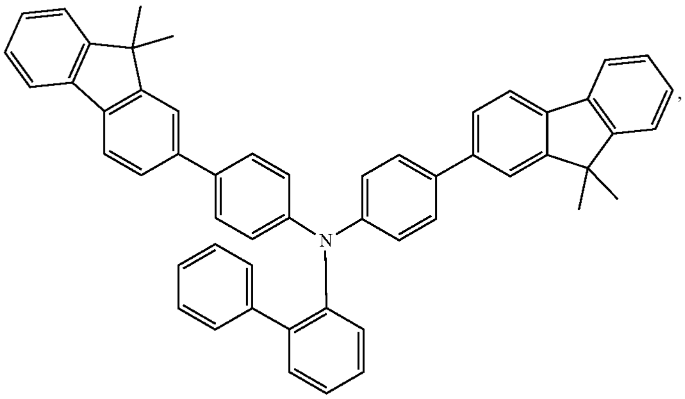,
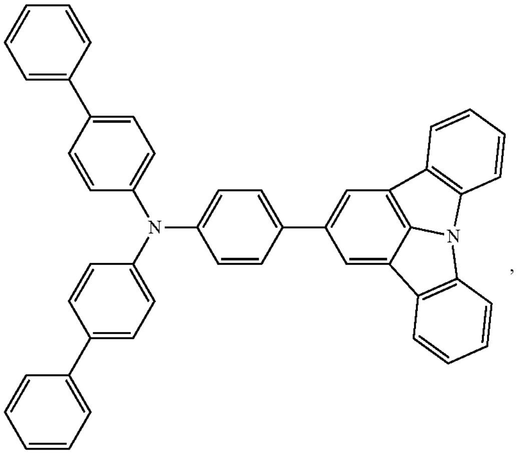,
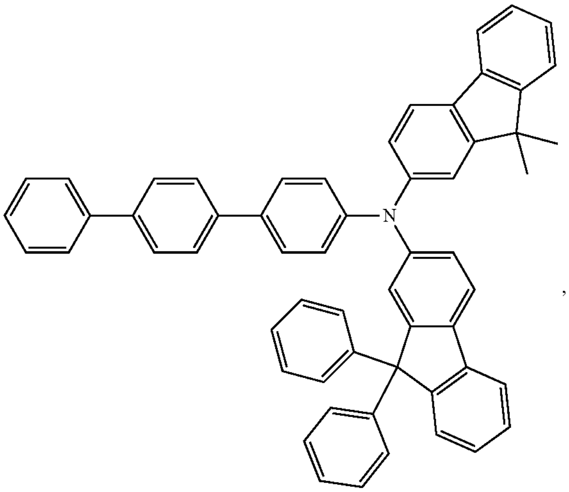, -continued
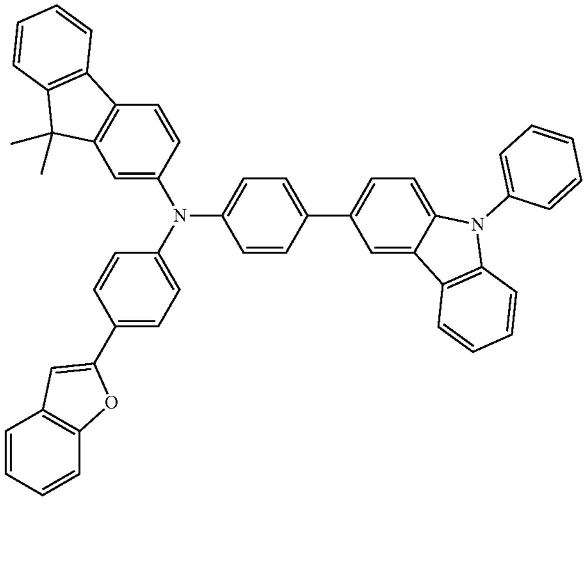
,
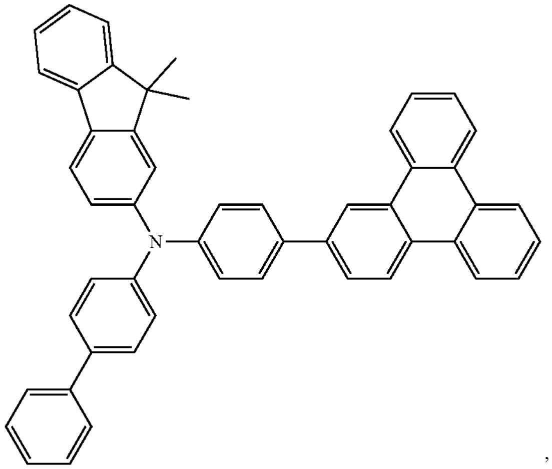
,
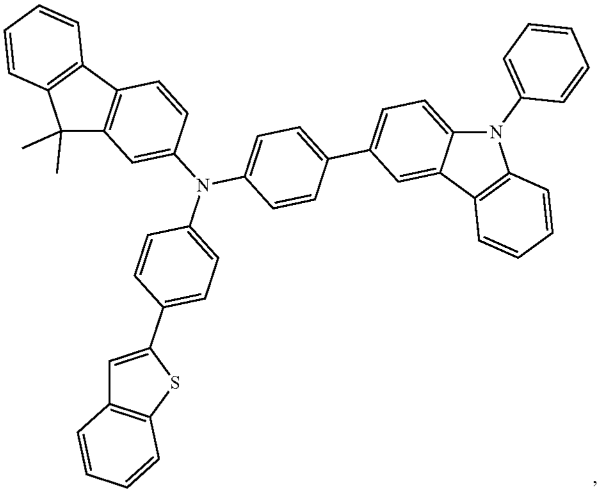
,
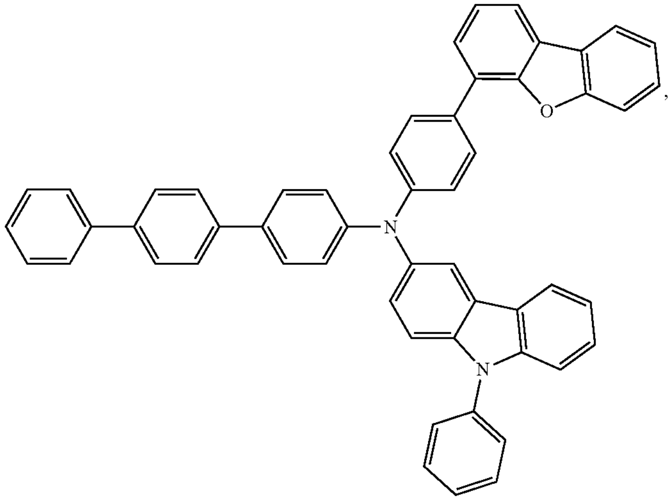
, -continued
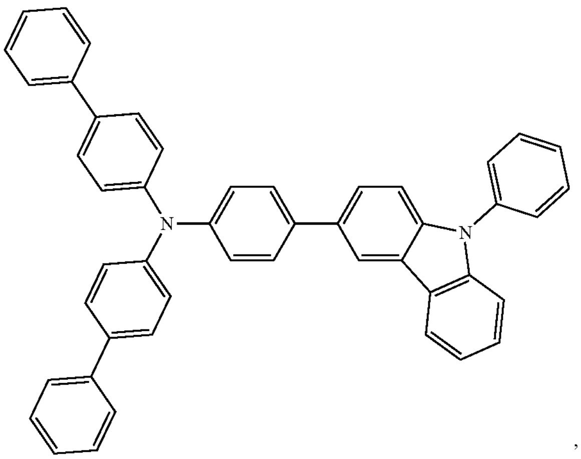
,
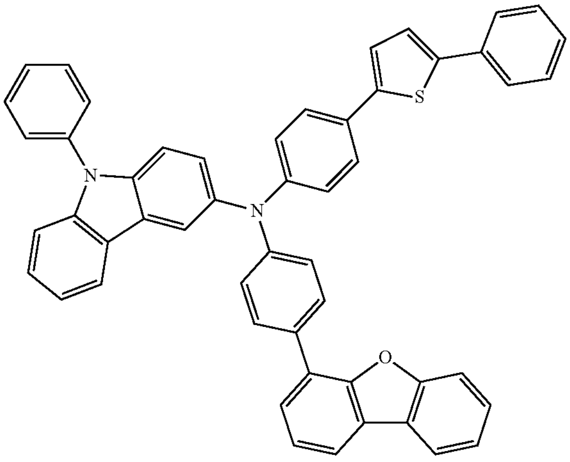
,
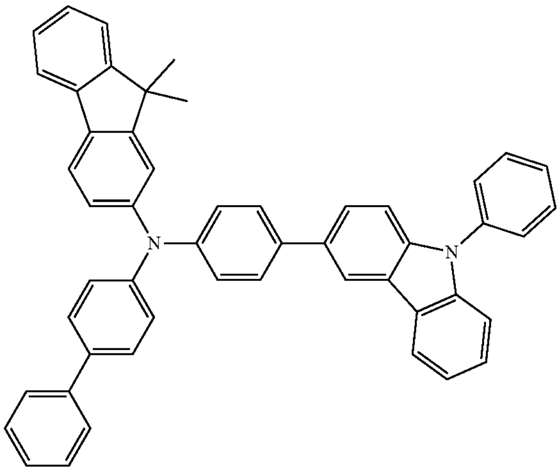
,
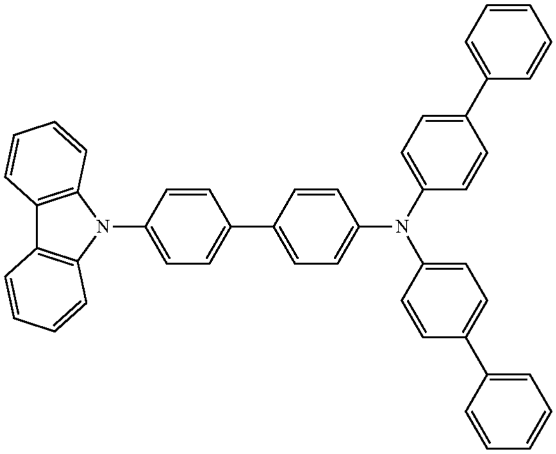
,
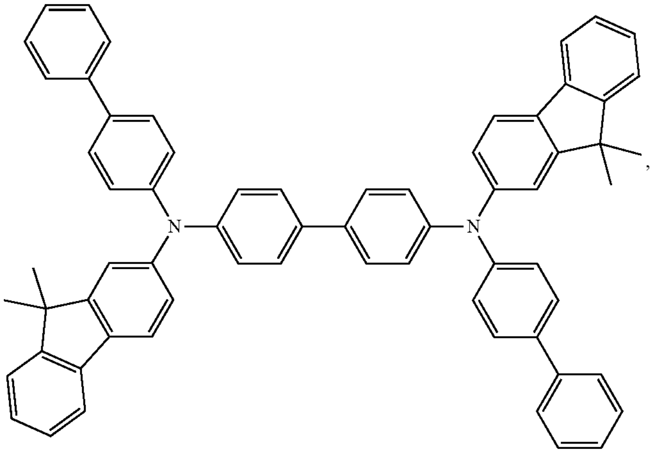
, -continued
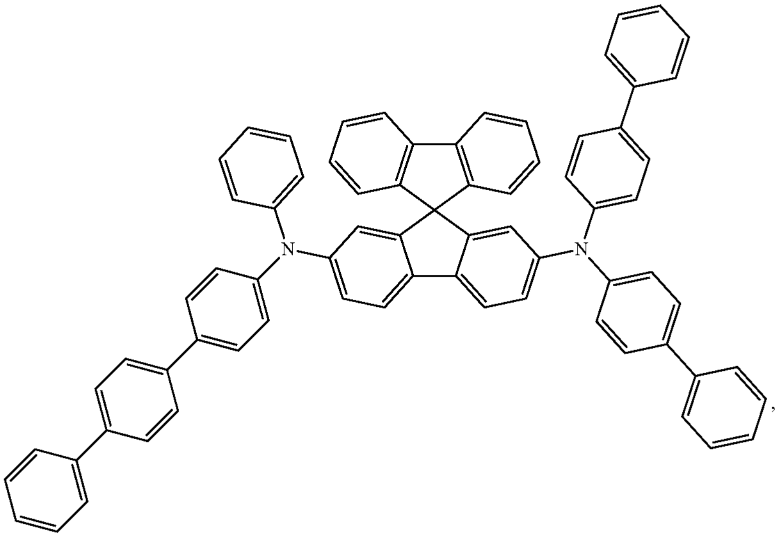
,
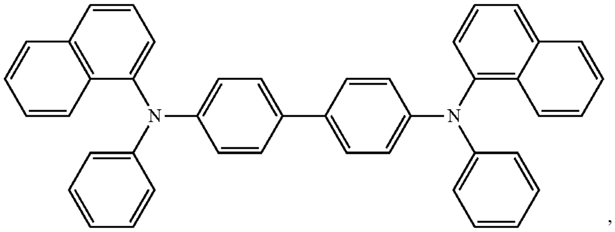
,
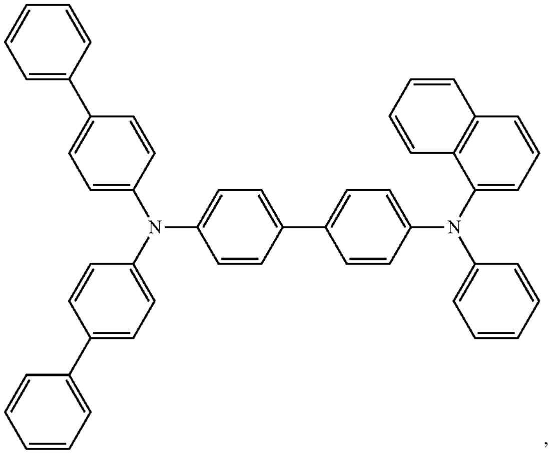
,
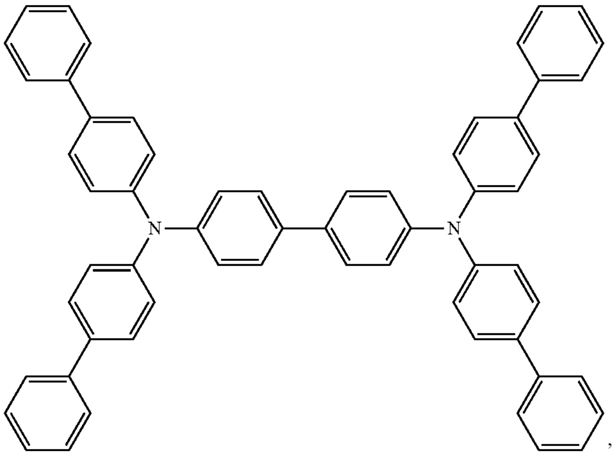
, -continued
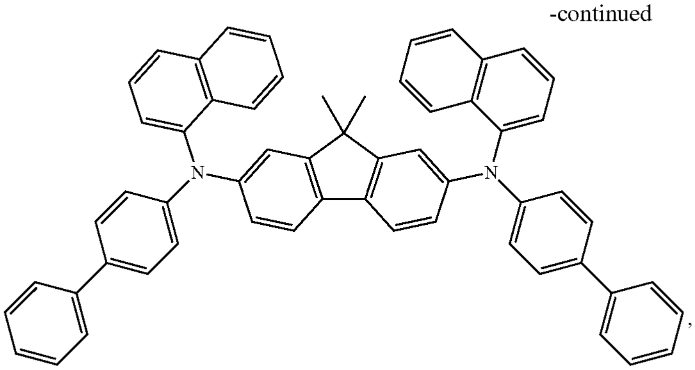
,
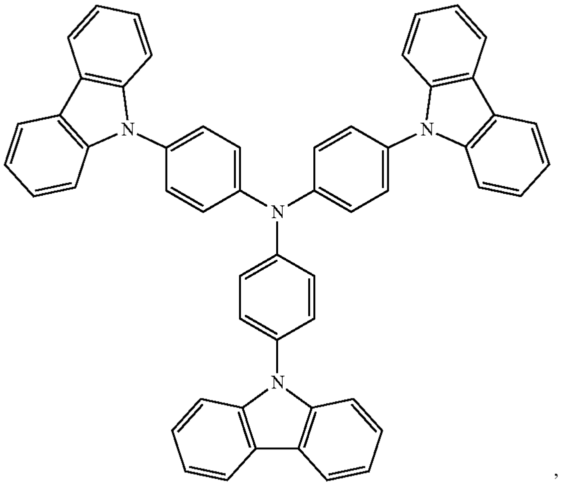
,
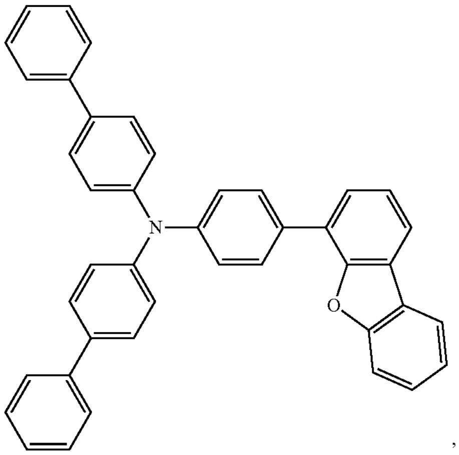
,
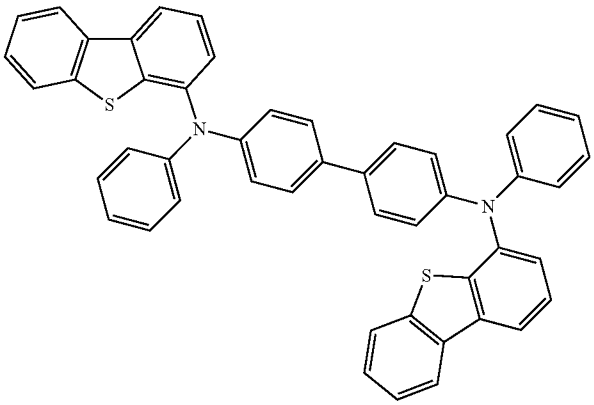
,
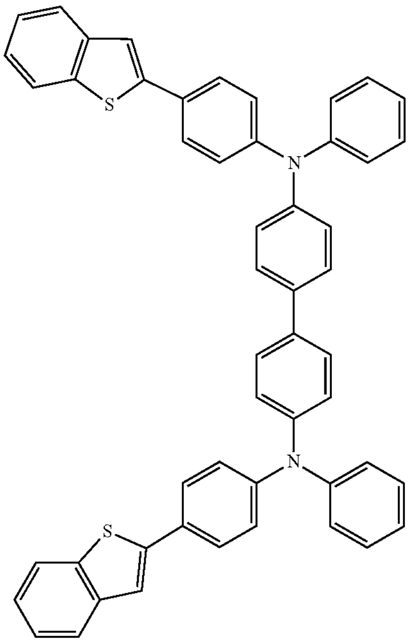
, and -continued

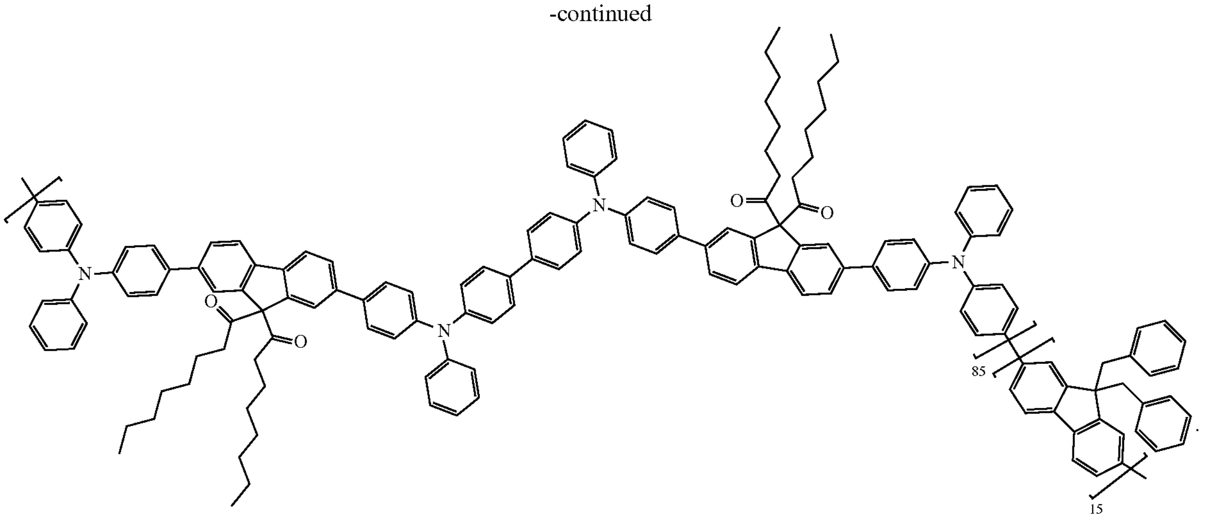

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

d) Hosts:

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

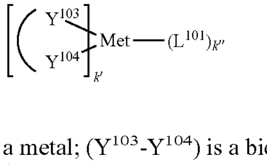

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

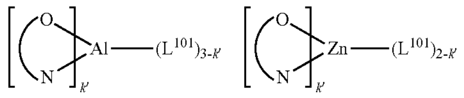

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

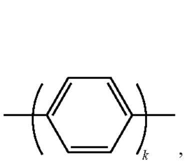, 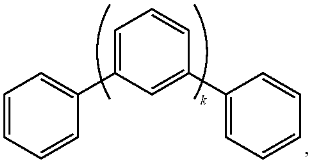, 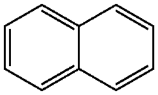, 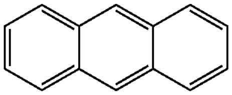, 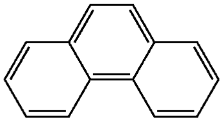, 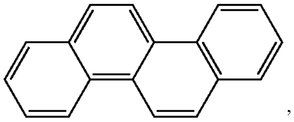, 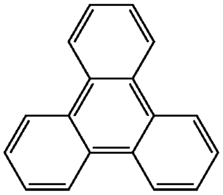, 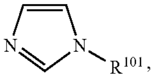, 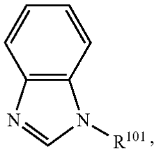, 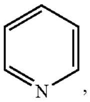, 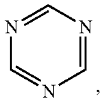, 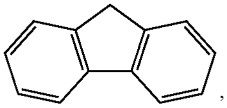, 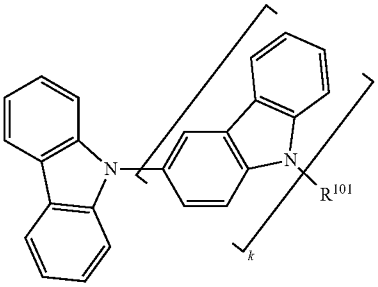, 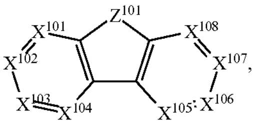, 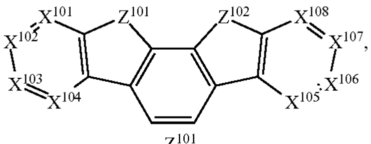, 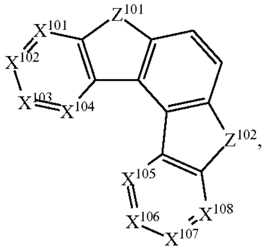, -continued

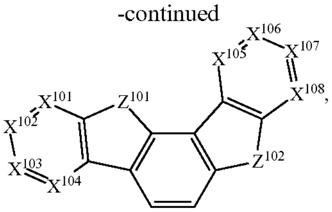,

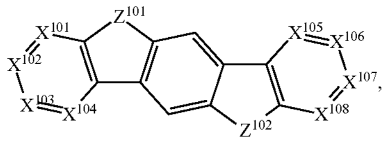, and

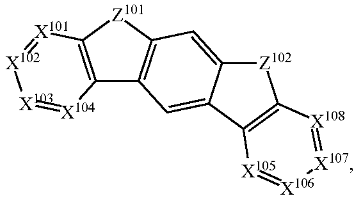, wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

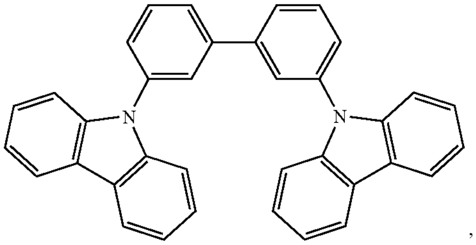
,
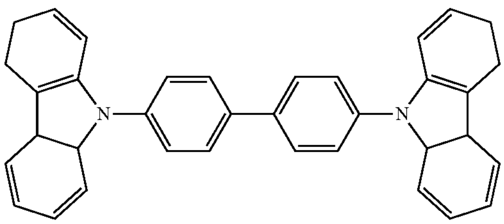
,
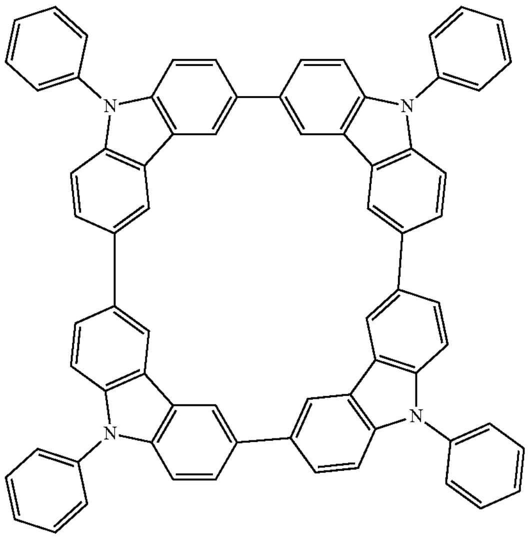
,
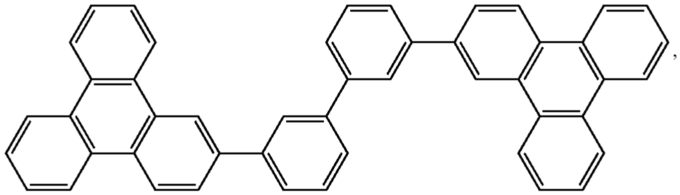
,
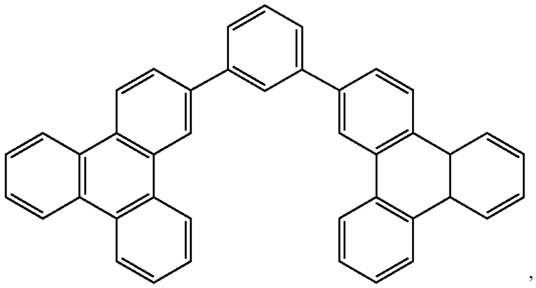
,
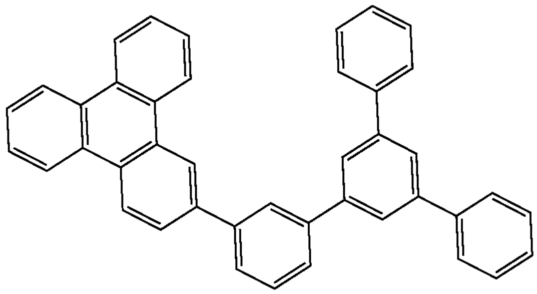
,
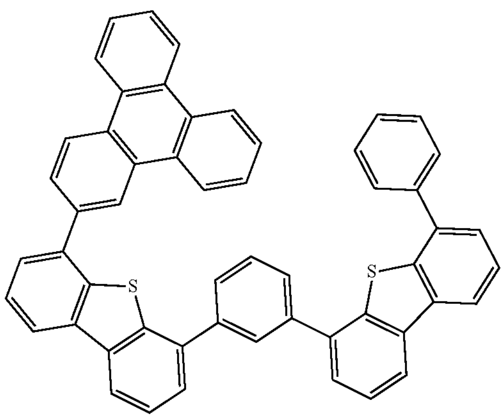
,
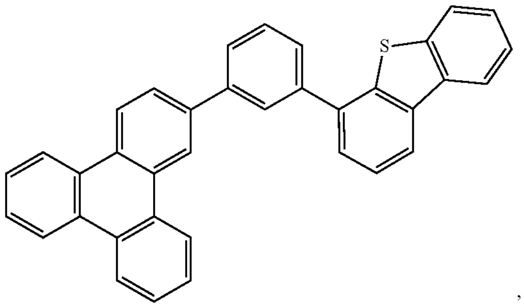
, -continued
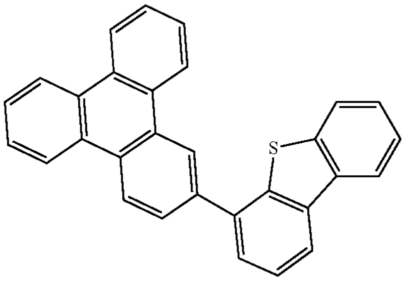
,
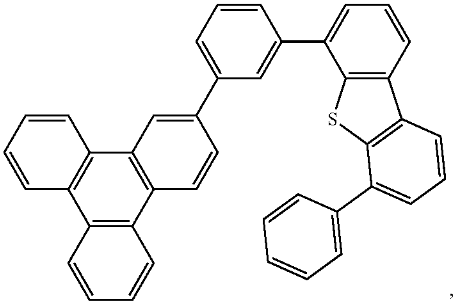
,
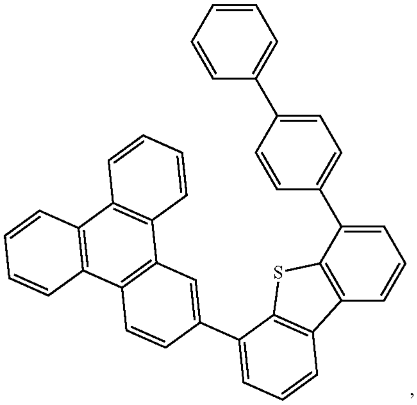
,
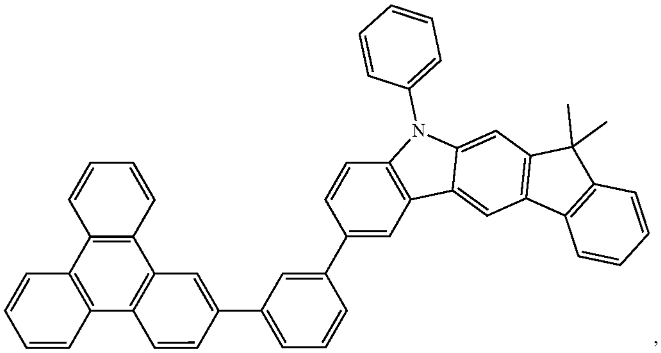
,
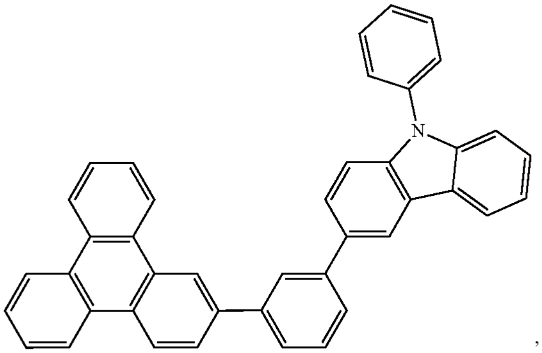
,
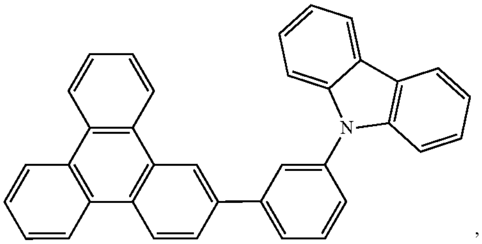
,
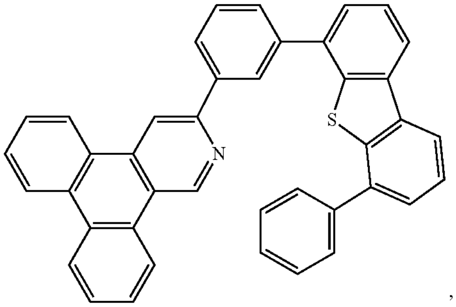
,
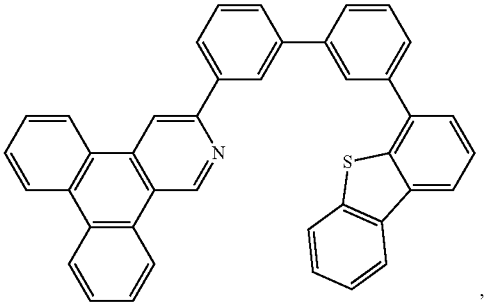
,
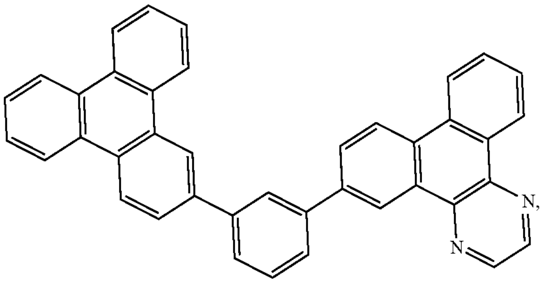
,
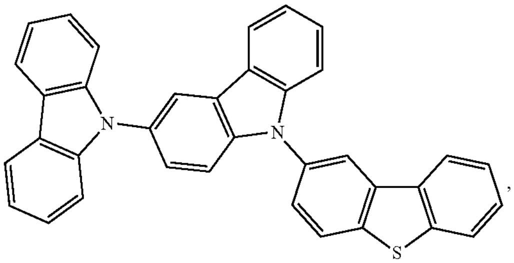
, -continued
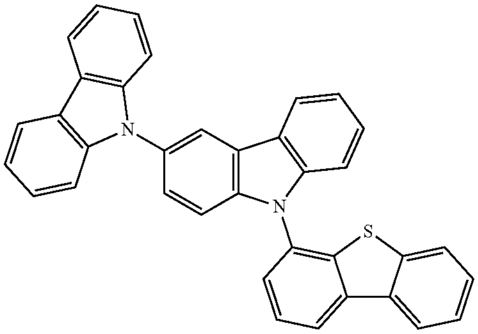
,
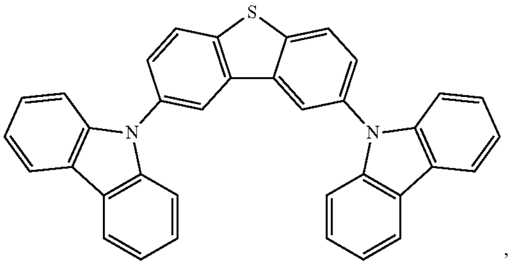
,
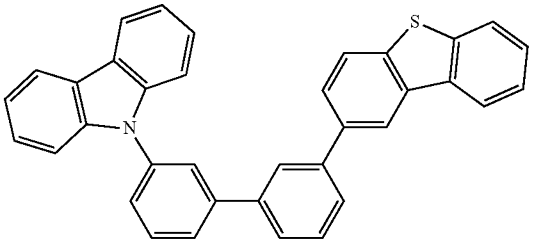
,
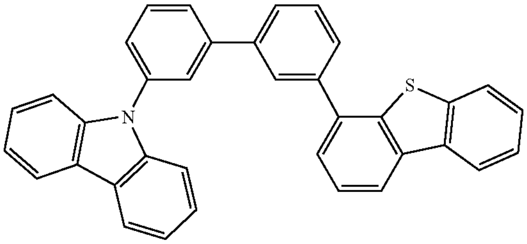
,
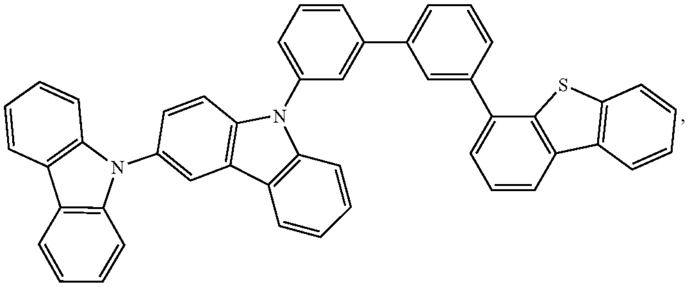
,
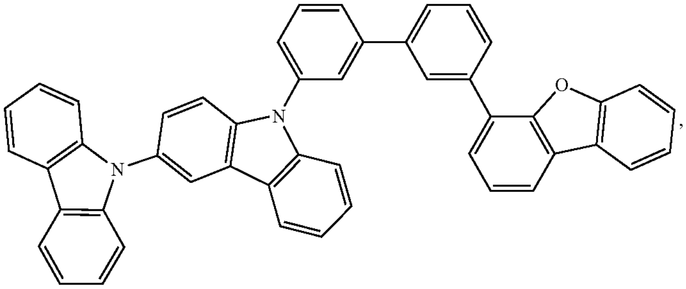
,
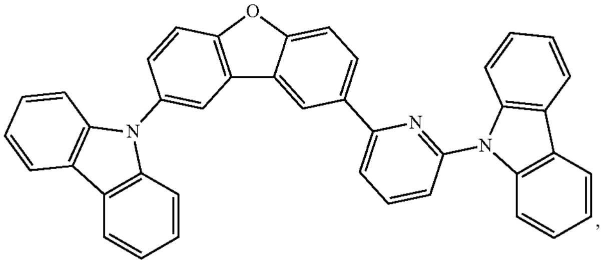
,
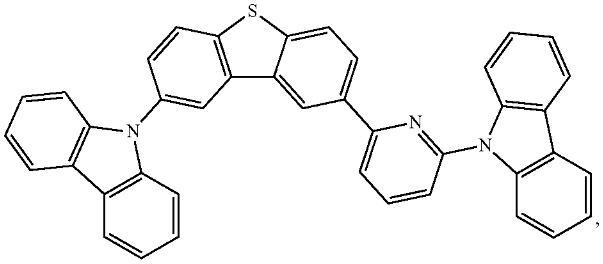
, -continued
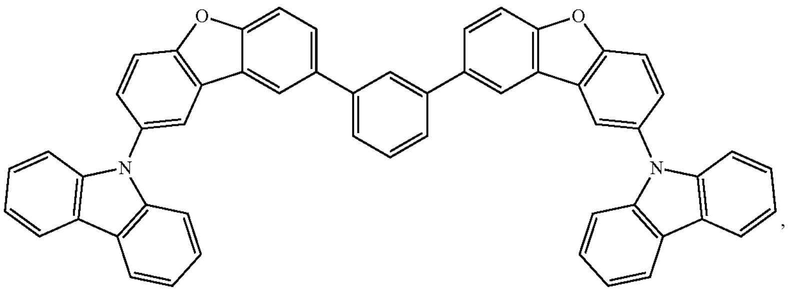
,
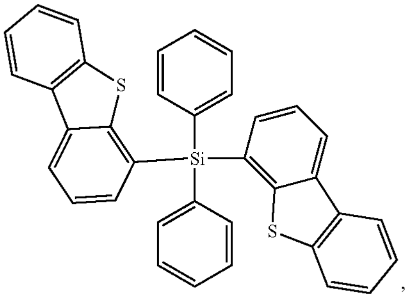
,
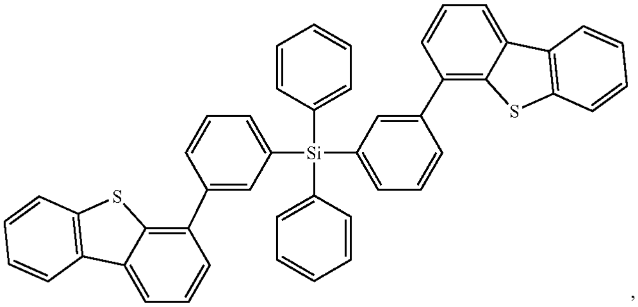
,
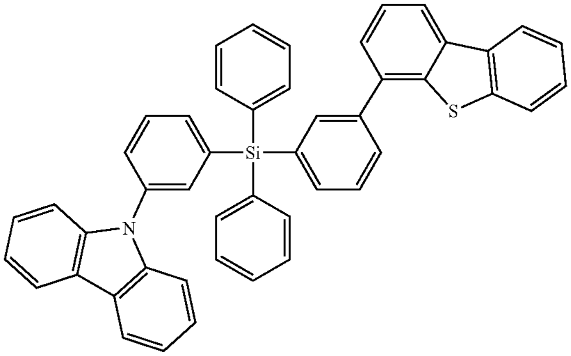
,
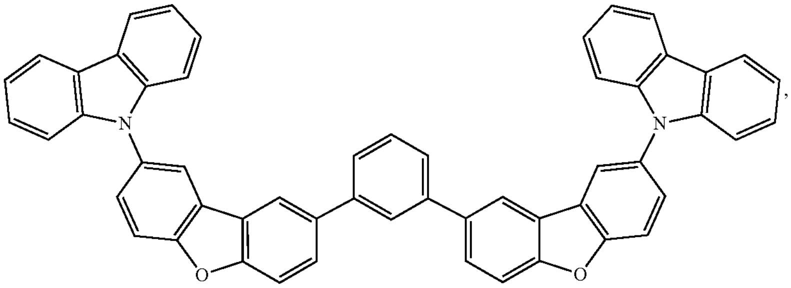
,
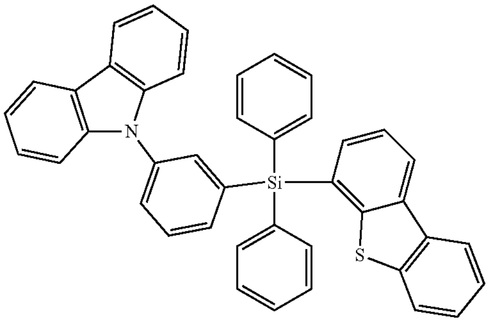
,
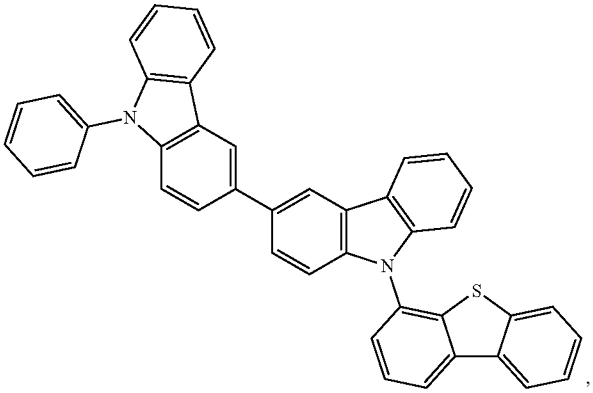
, -continued
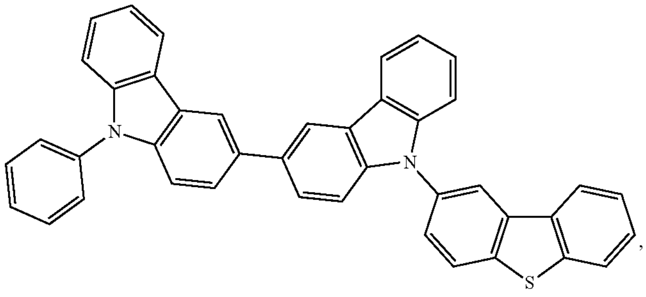,
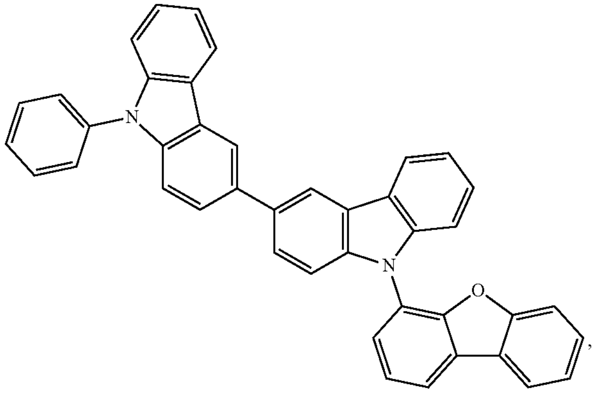,
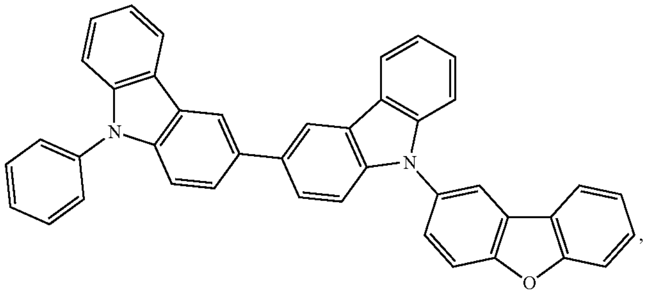,
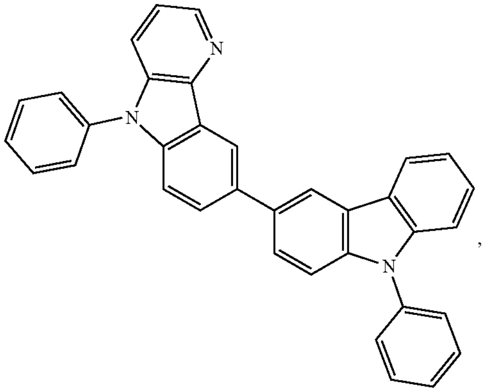,
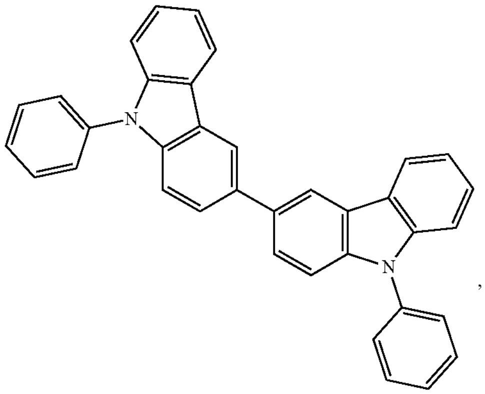,
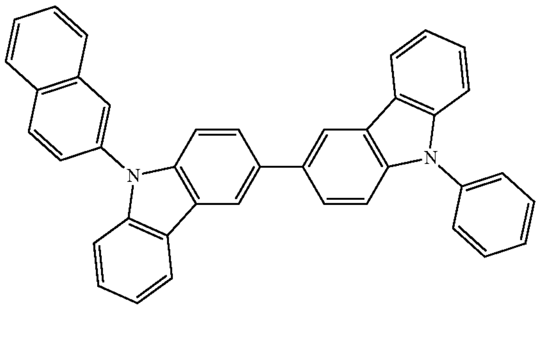, -continued
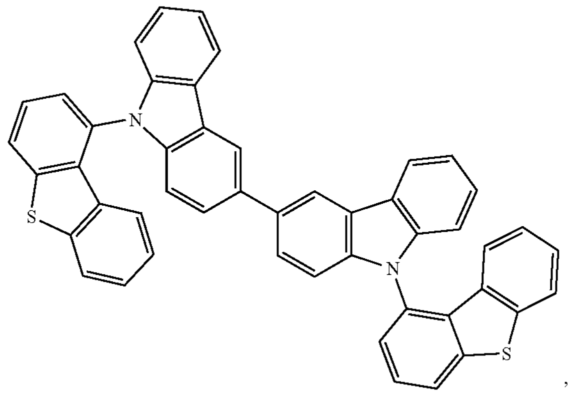
,
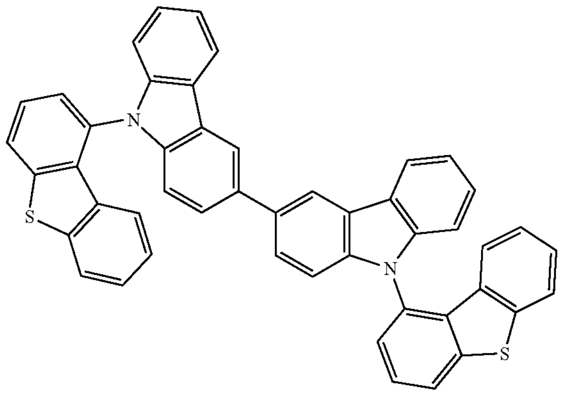
,
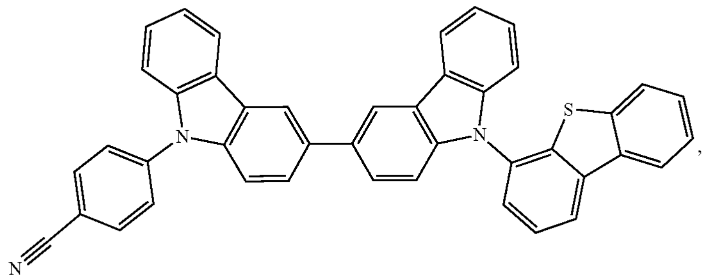
,
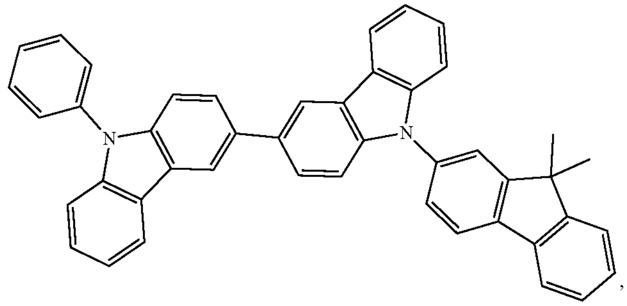
,
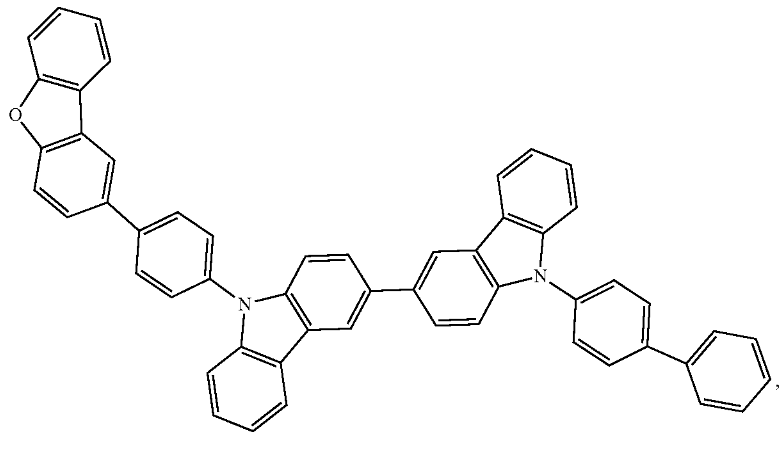
, -continued
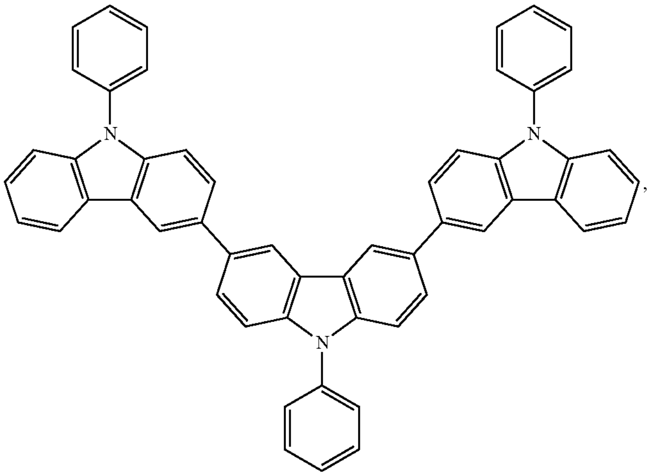
,
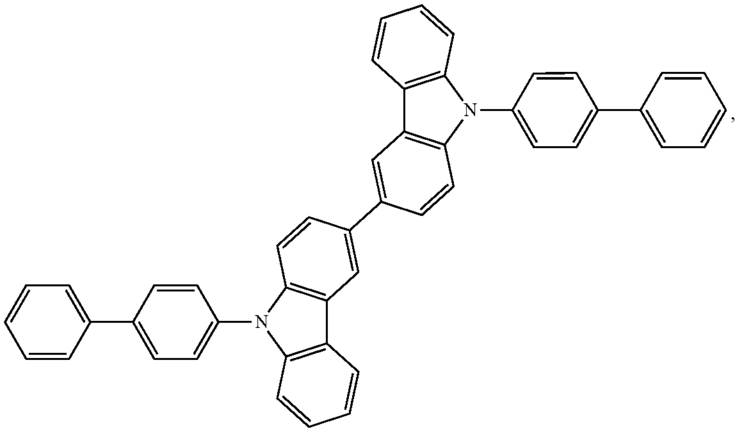
,
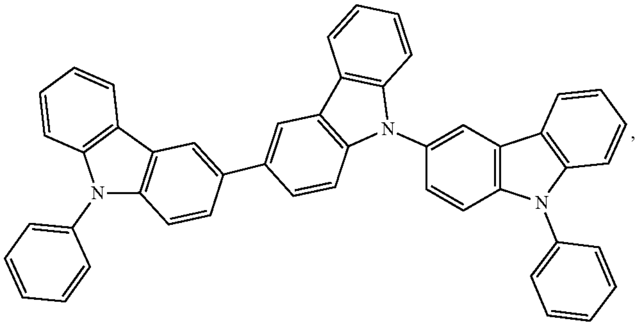
,
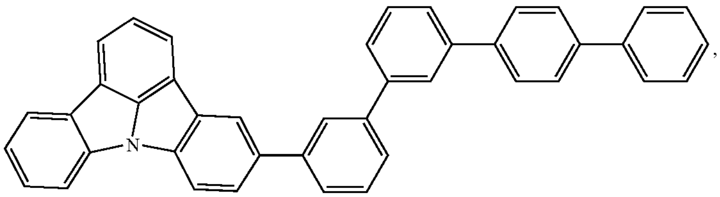
, -continued
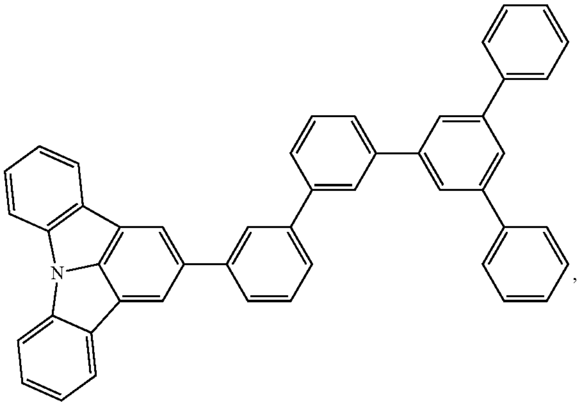
,
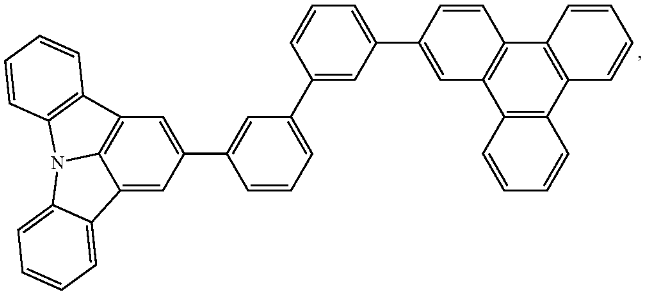
,
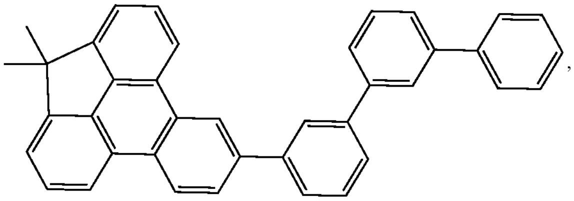
,
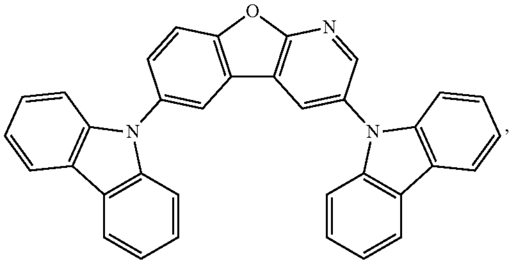
,
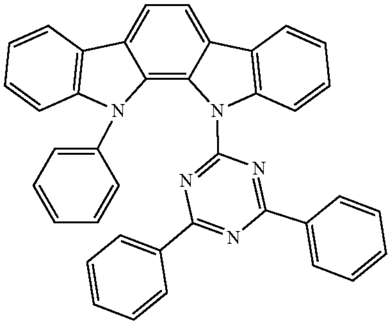
,
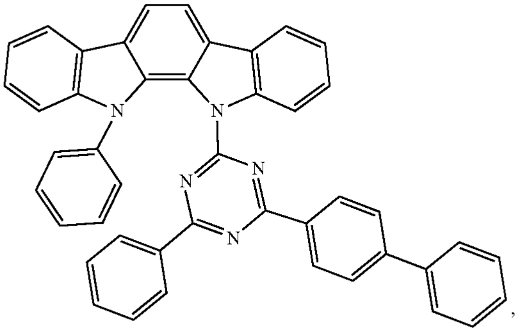
,
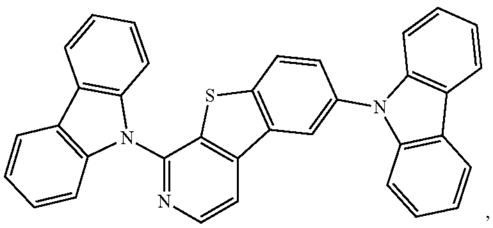
,
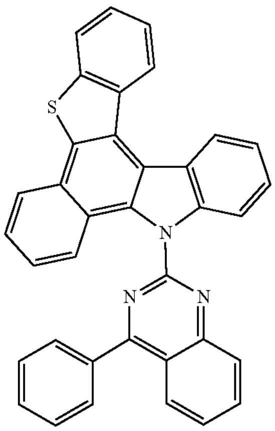
,
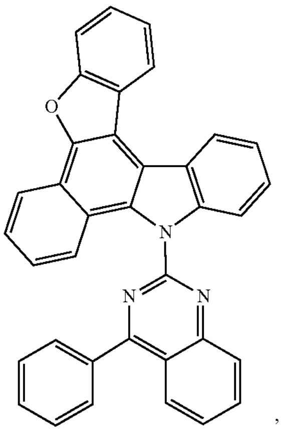
, -continued
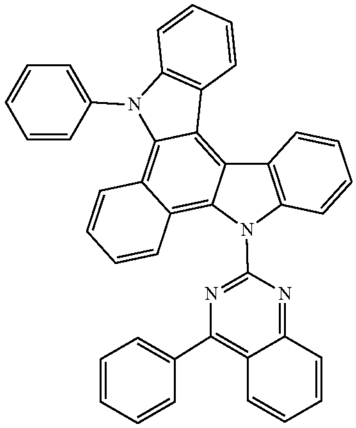
,
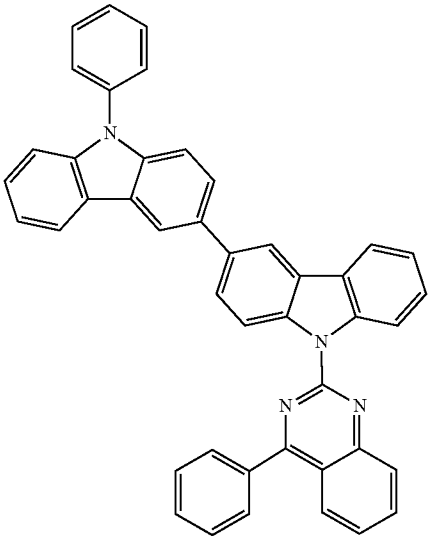
,
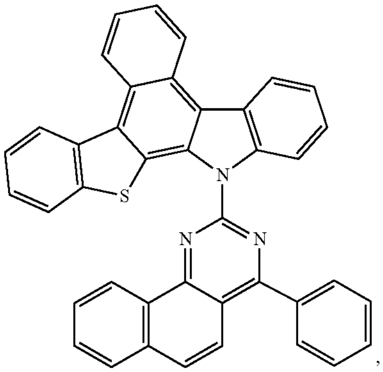
,
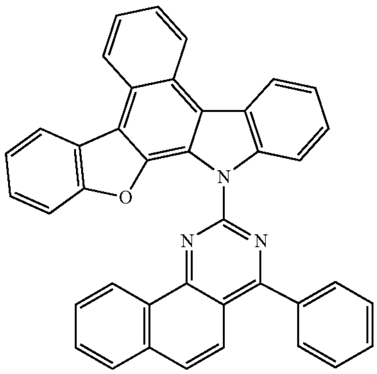
,
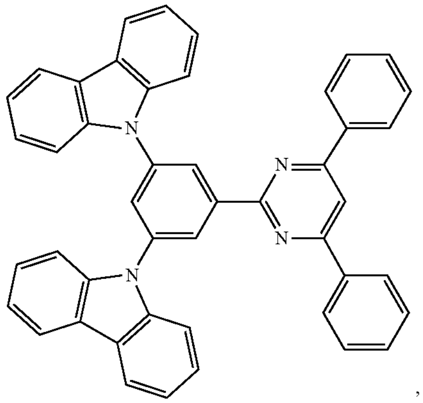
,
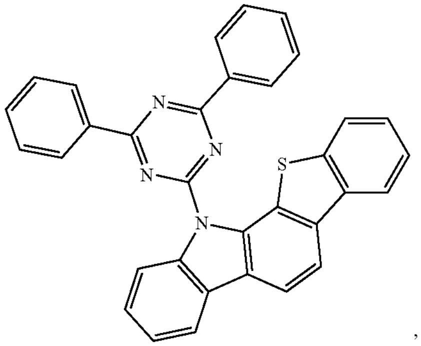
,
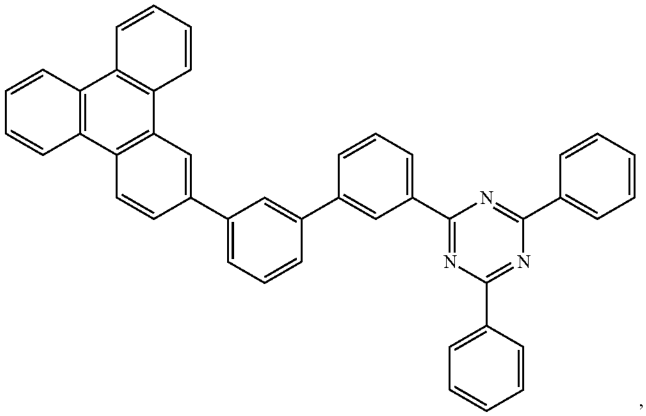
,
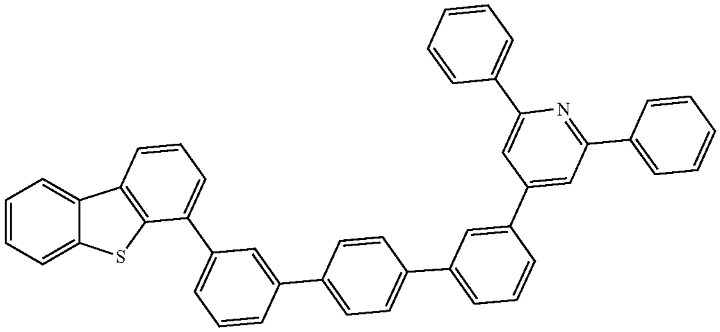
, -continued
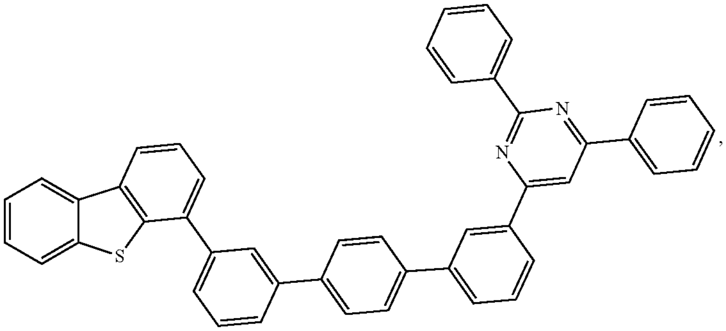
,
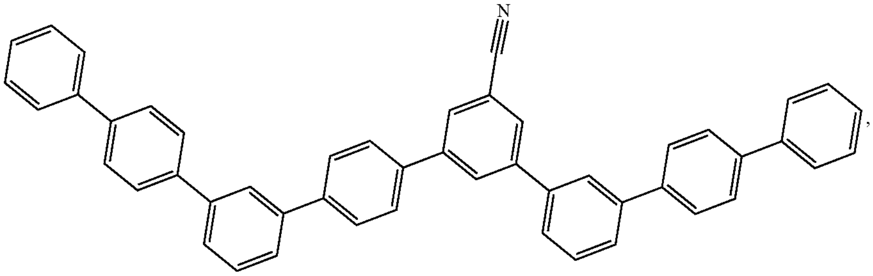
,
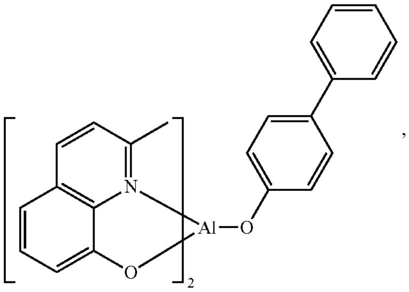
,
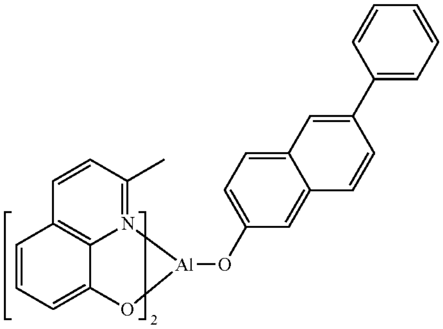
,
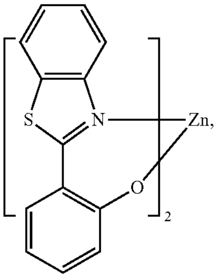
,
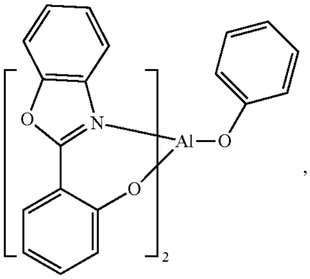
,
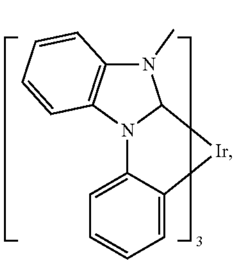
,
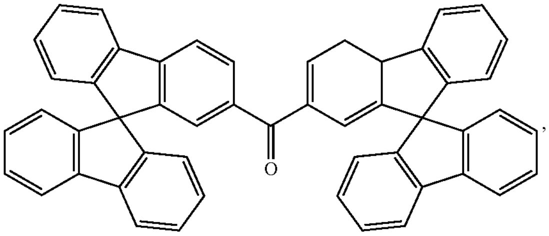
,
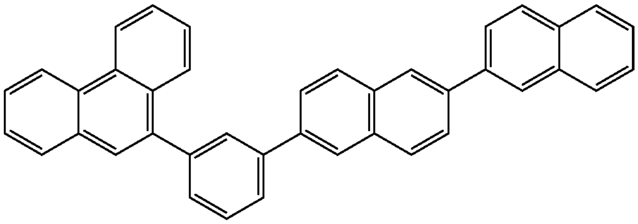
,
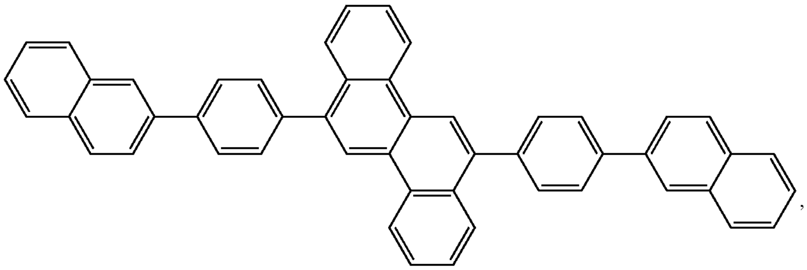
, and -continued

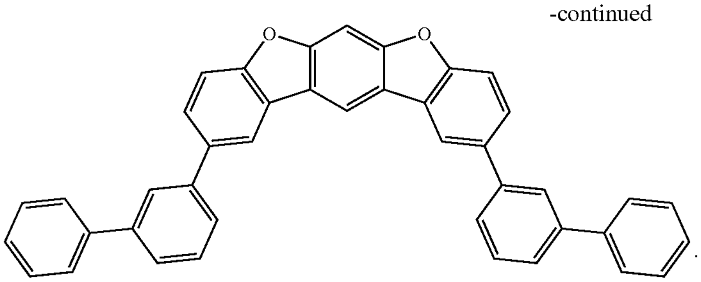

e) Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

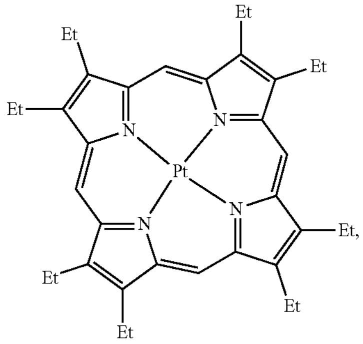

,

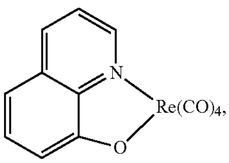

,

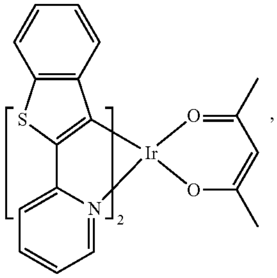

,

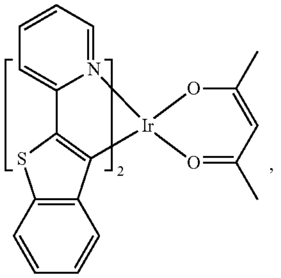

,

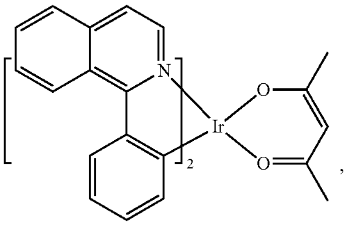

,

-continued
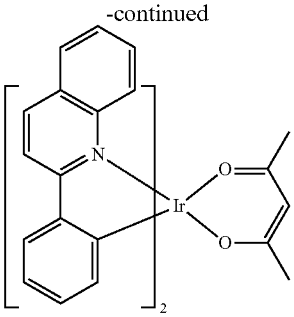
,
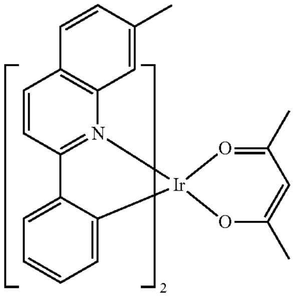
,
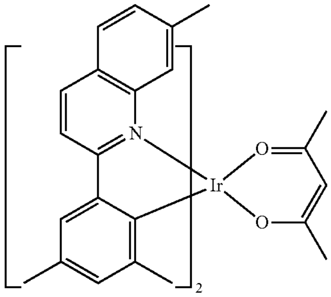
,
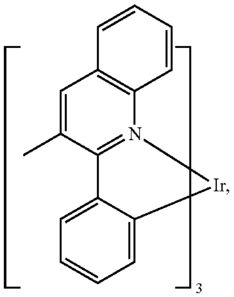
,
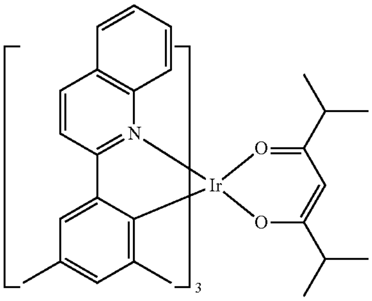
,
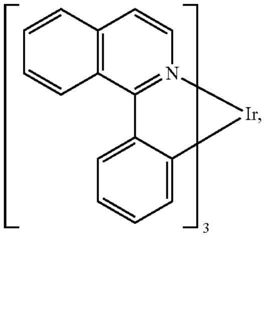
,
-continued
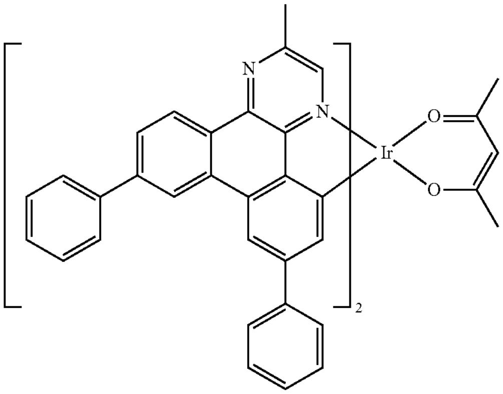
,
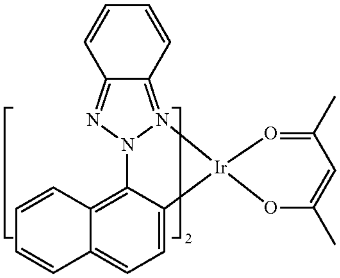
,
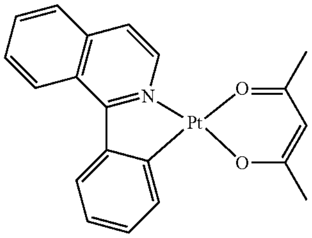
,
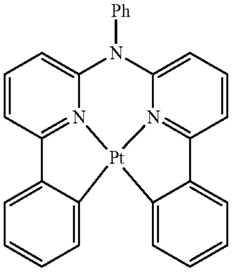
,
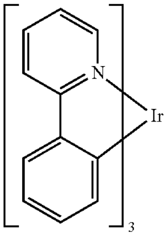
,
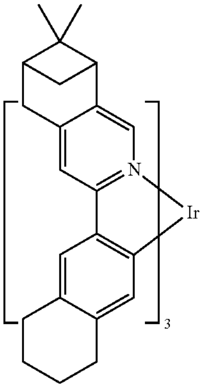
,
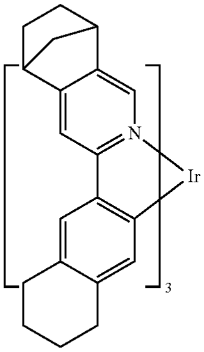
, -continued
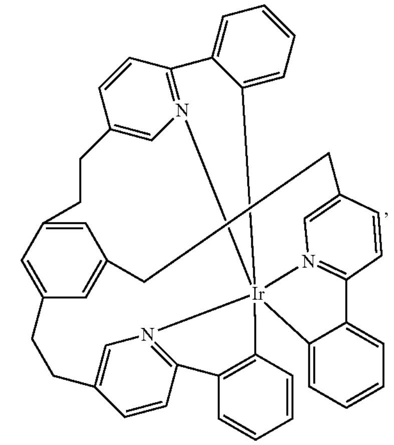
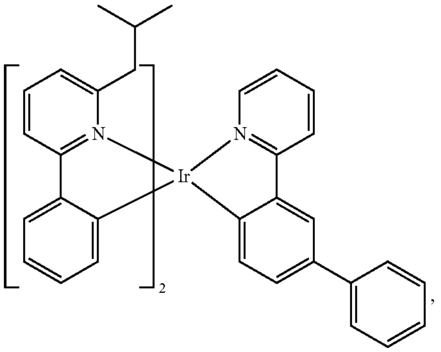
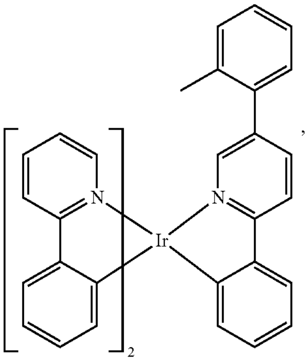
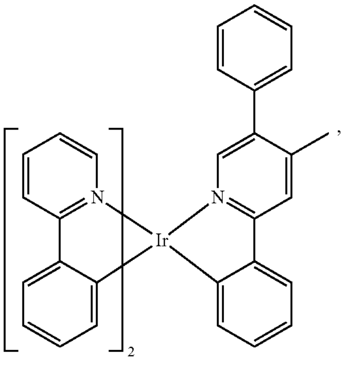
-continued
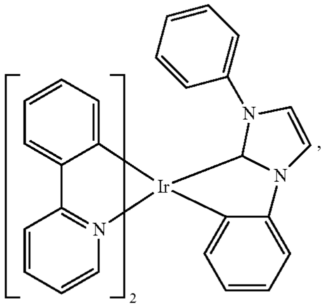
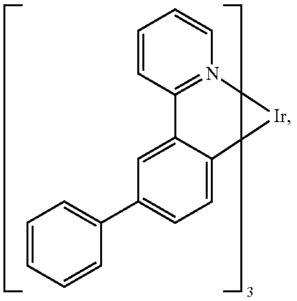
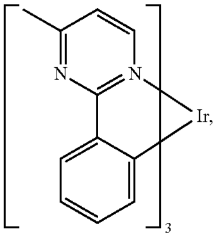
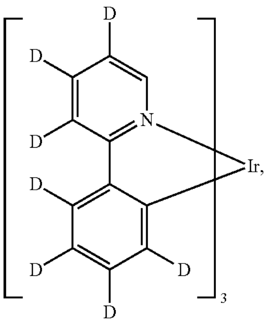
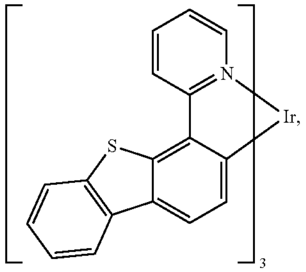
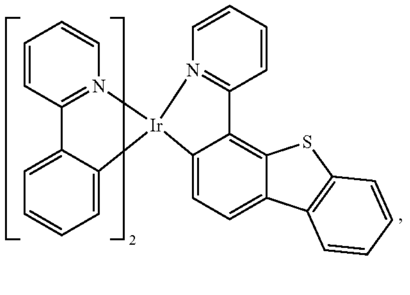

-continued
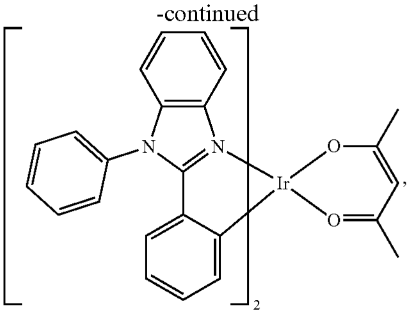
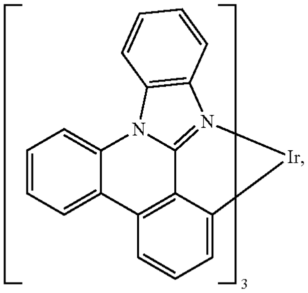
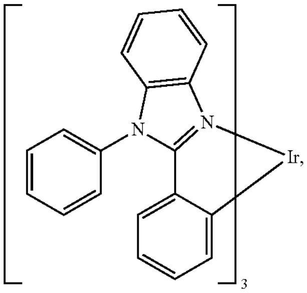
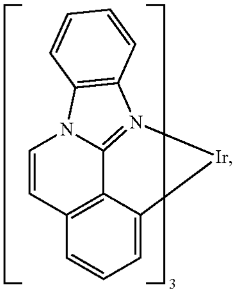
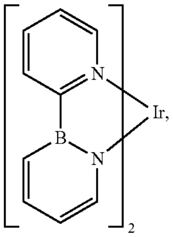
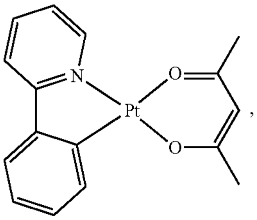
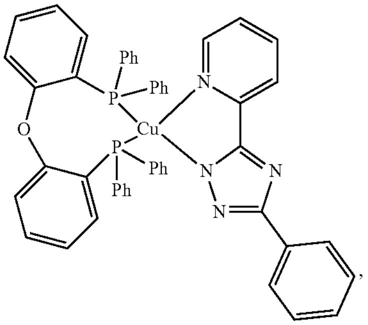
-continued
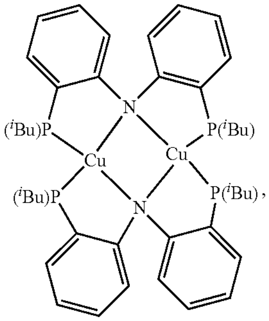
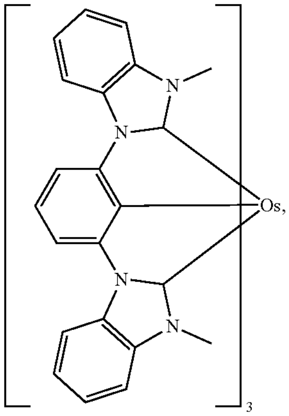
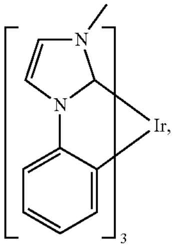
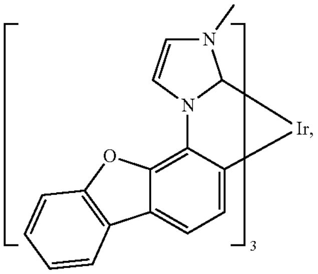
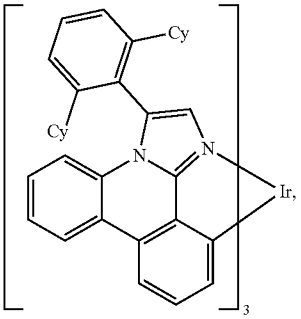
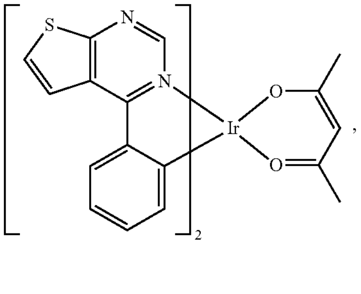

-continued
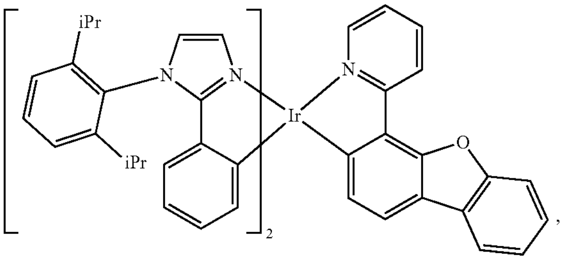
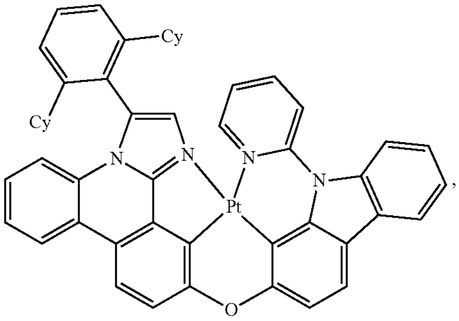
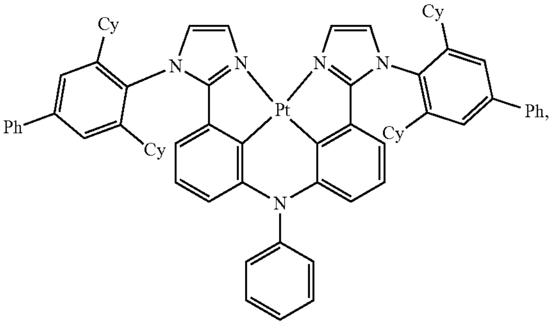
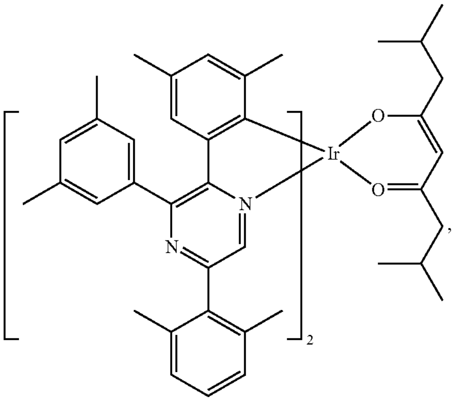
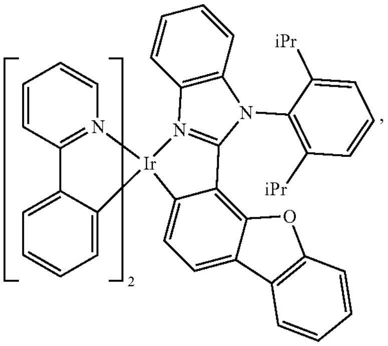
-continued
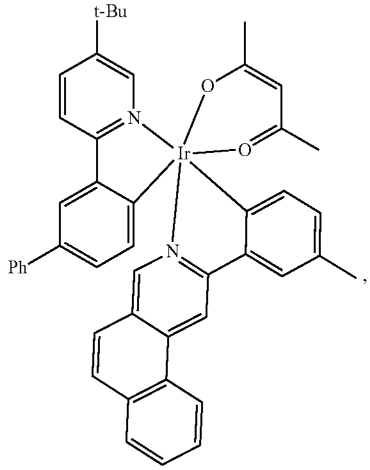
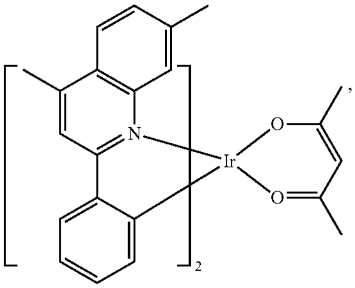
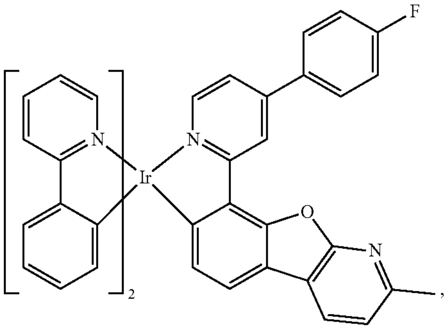
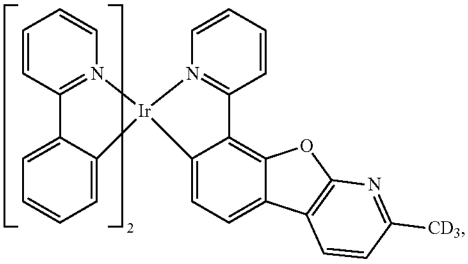
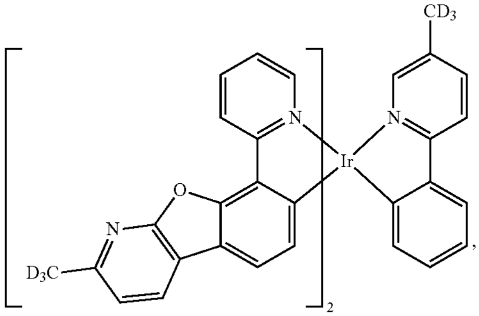

-continued
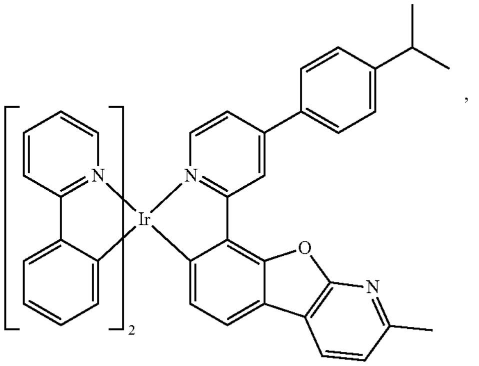
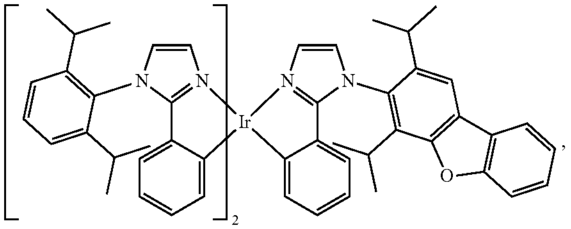
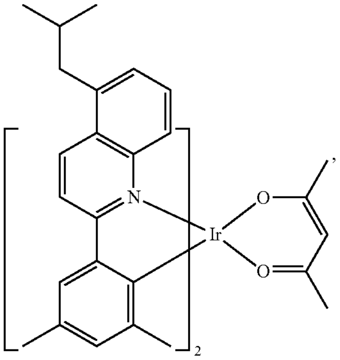
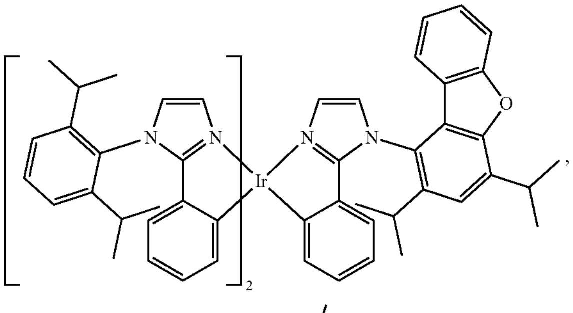
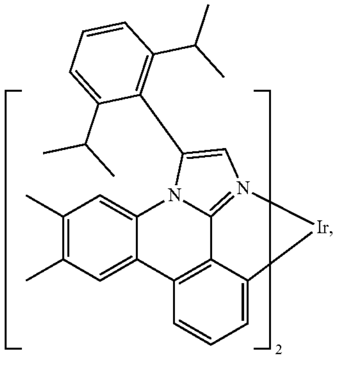
-continued
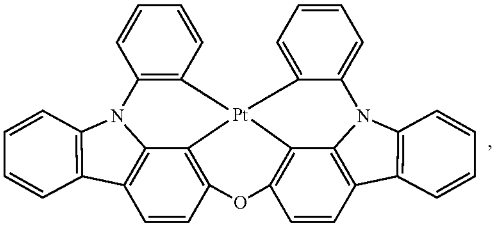
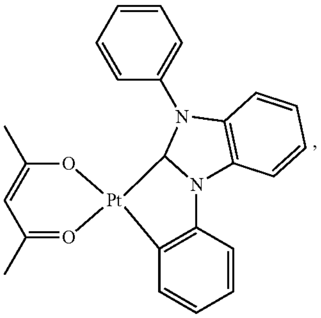
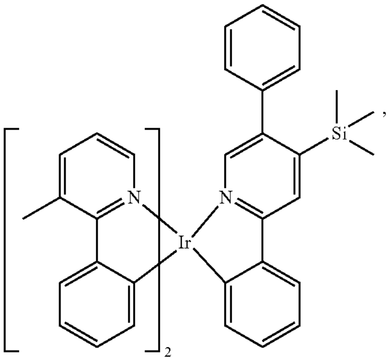
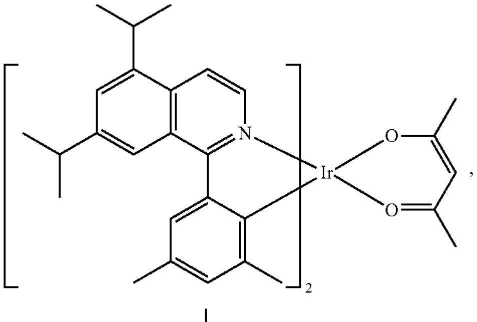
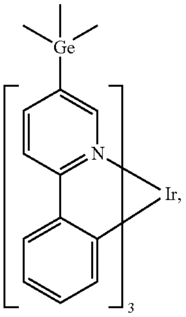

-continued
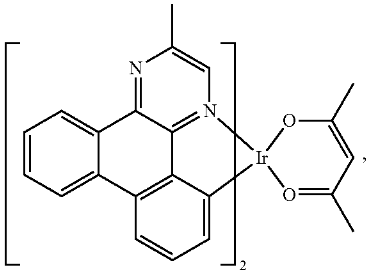
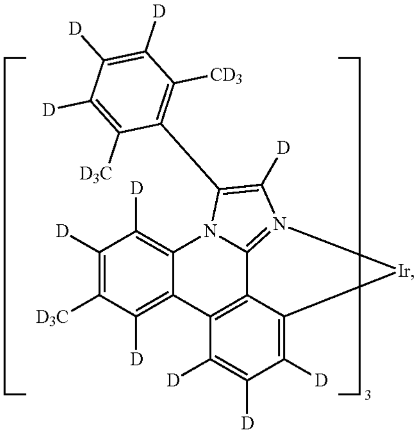
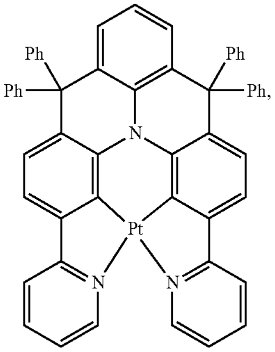
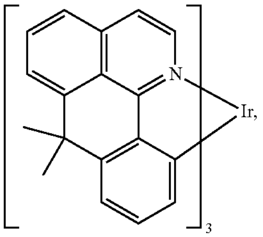
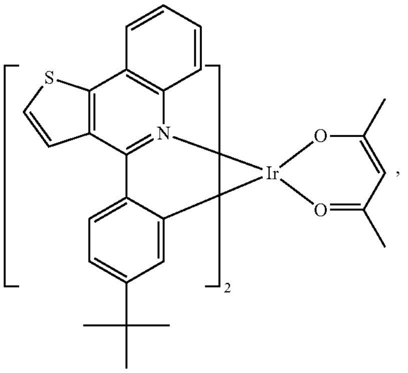
-continued
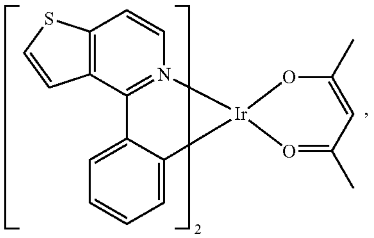
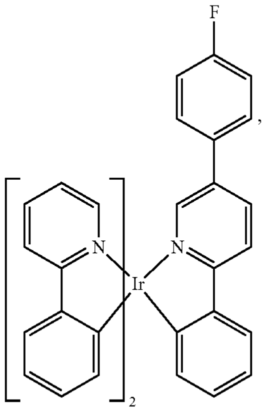
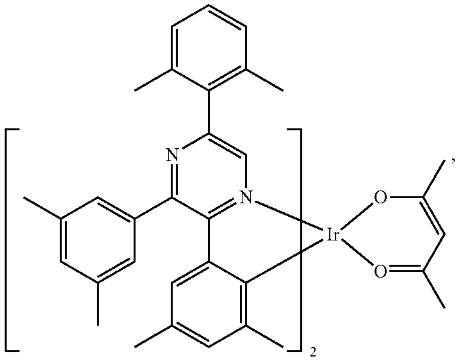
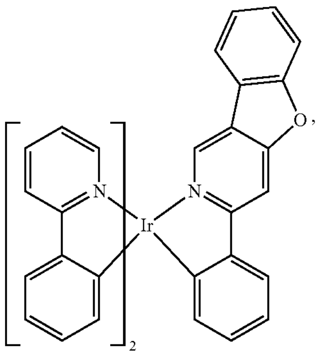

-continued
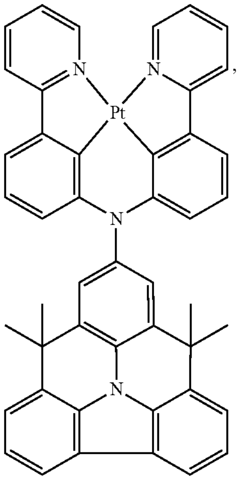
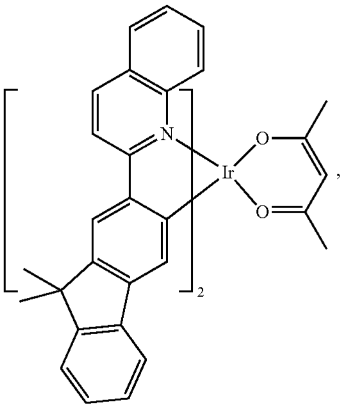
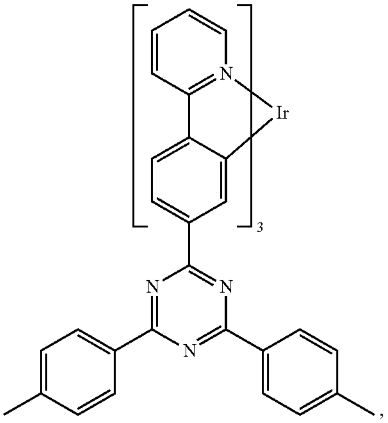
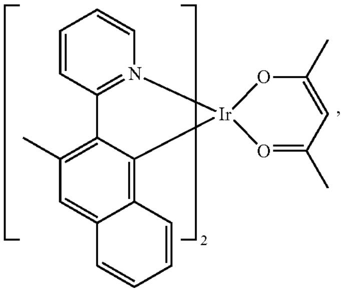
-continued
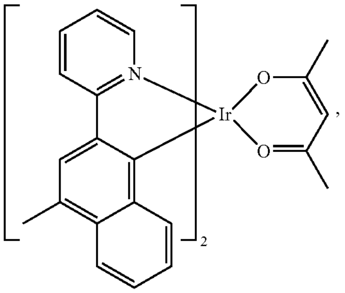
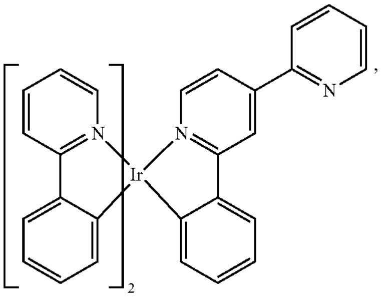
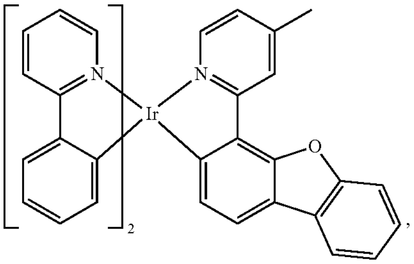
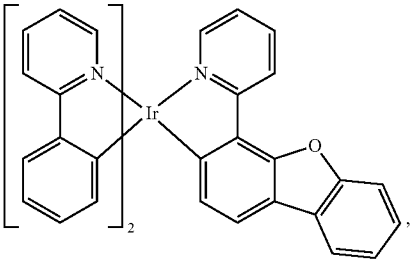
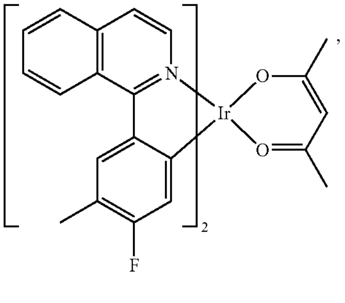

-continued
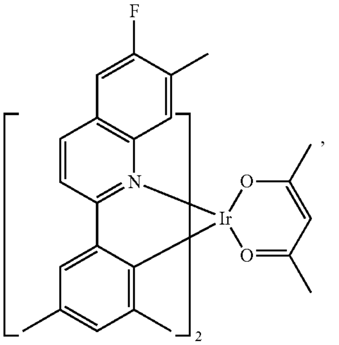
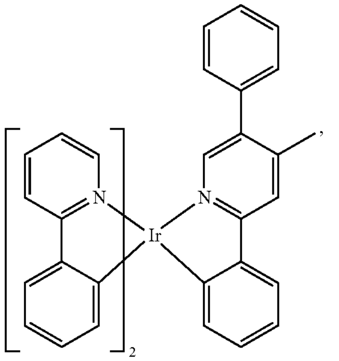
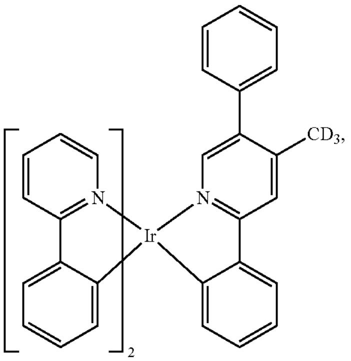
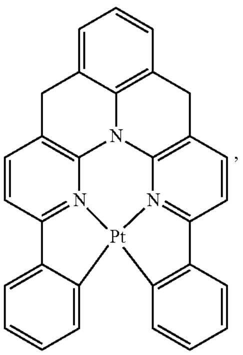
-continued
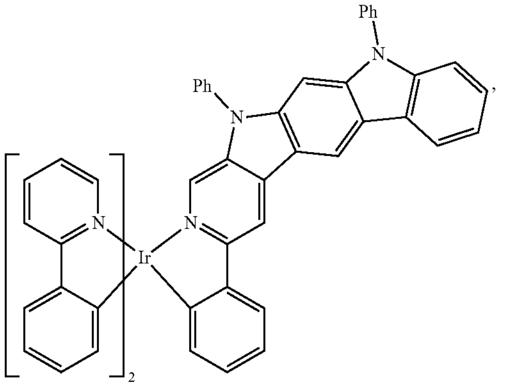
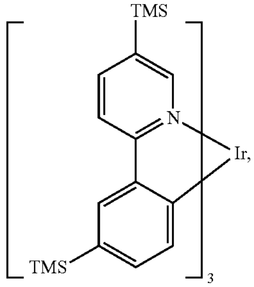
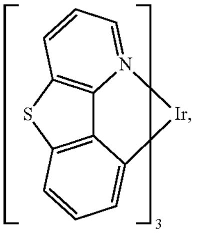
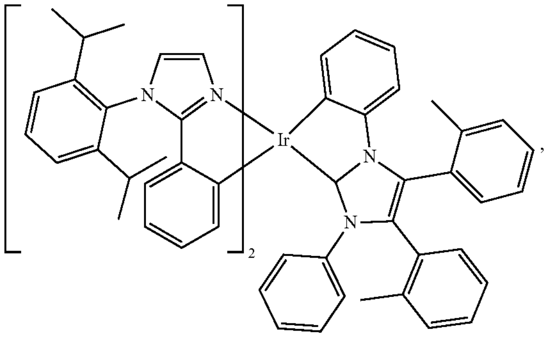
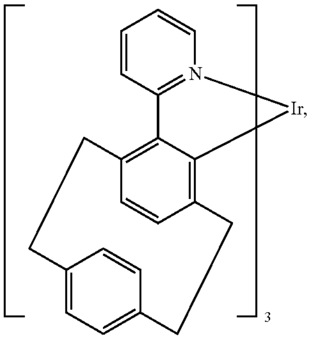
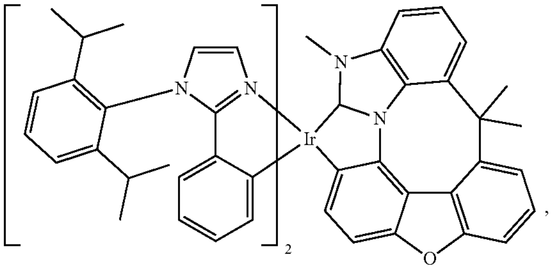

-continued
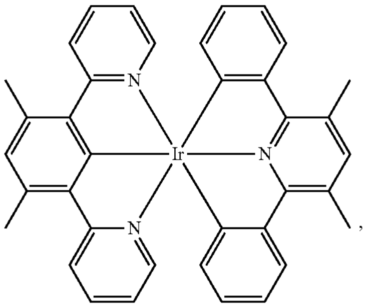
,
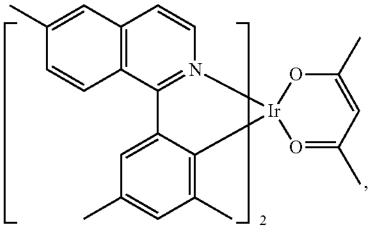
,
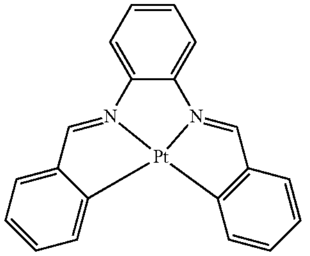
,
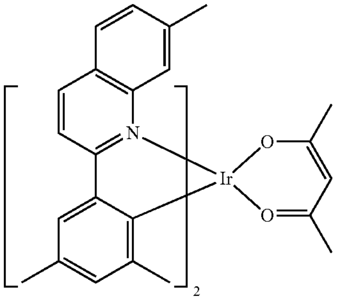
,
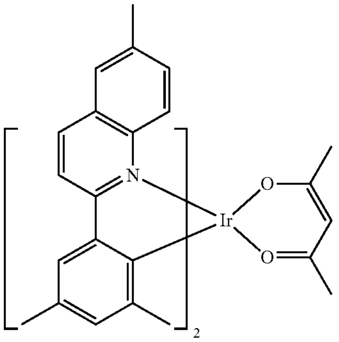
,
-continued
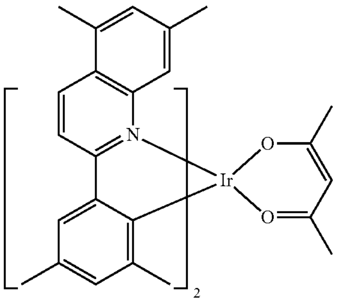
,
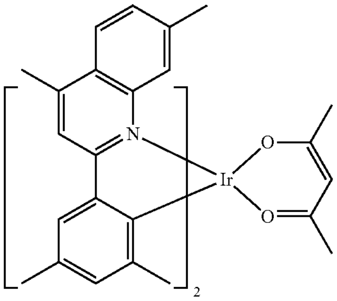
,
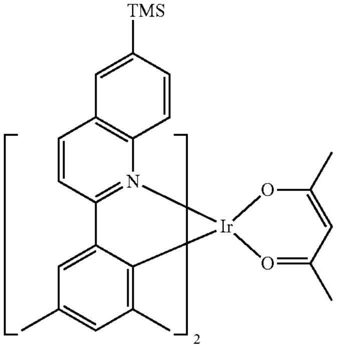
,
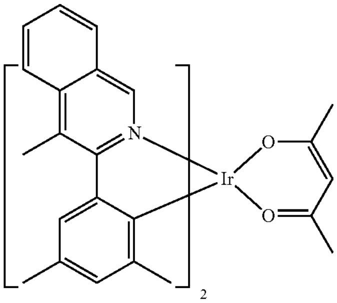
,
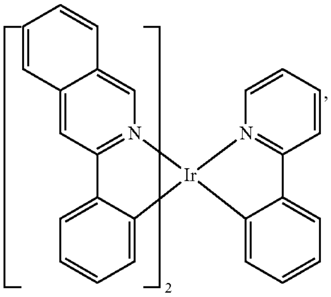
, -continued
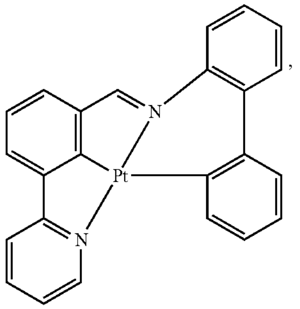
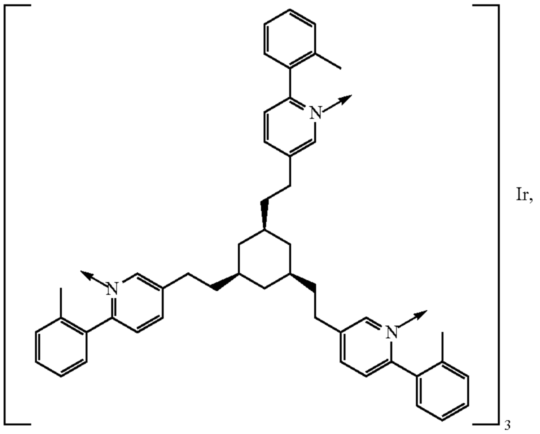
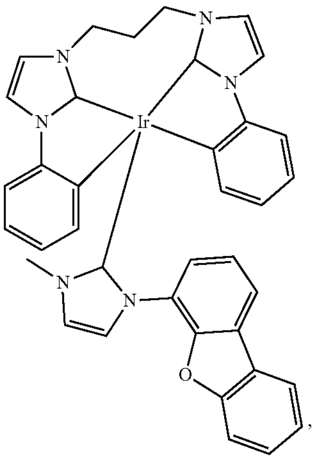
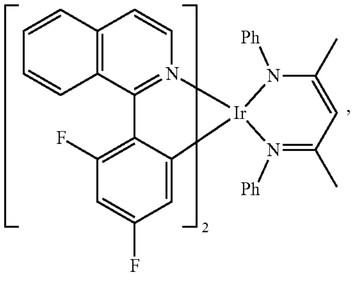
-continued
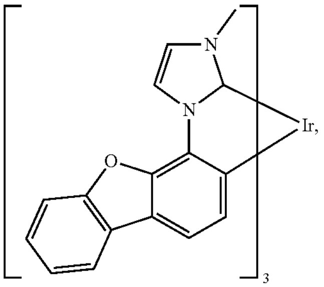
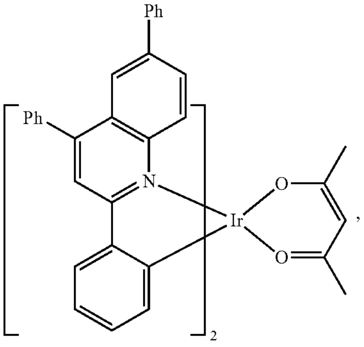
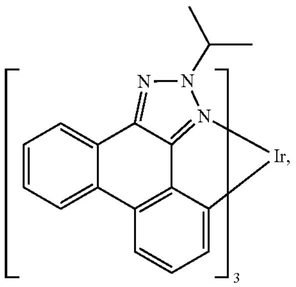
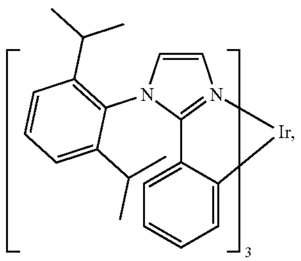
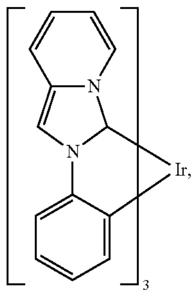
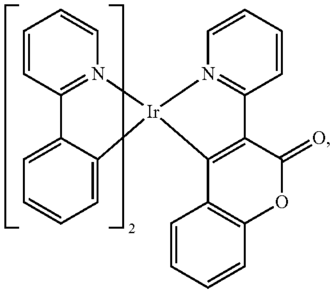

-continued

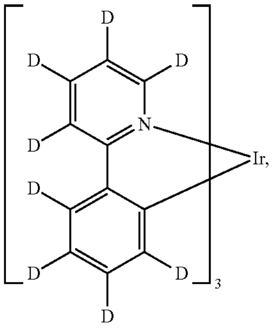

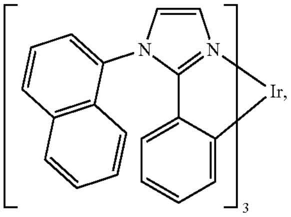

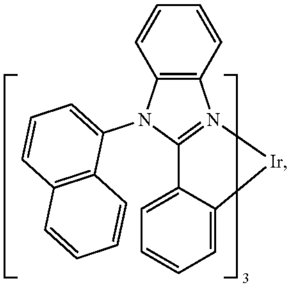

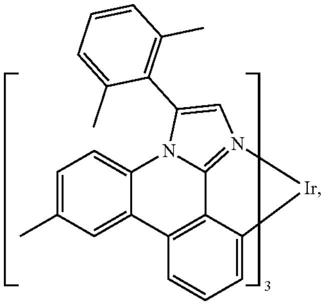

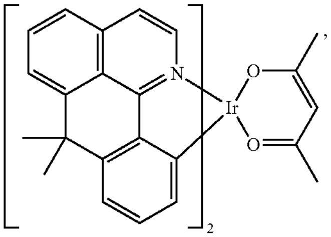

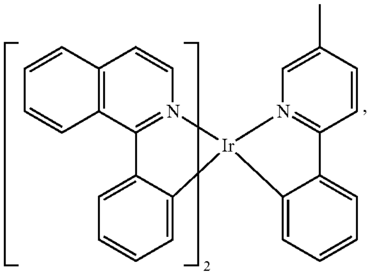

-continued

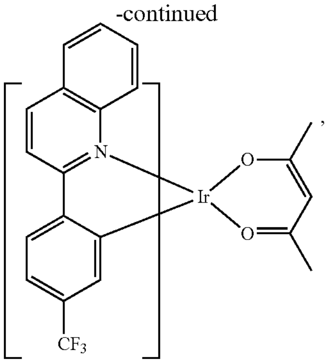

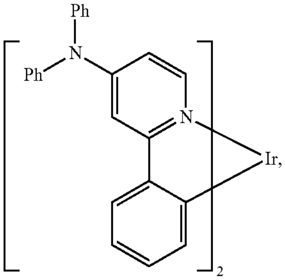

and

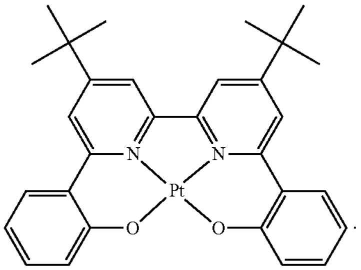

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

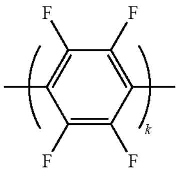

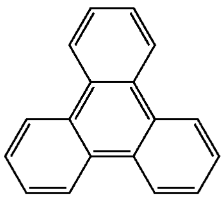

-continued

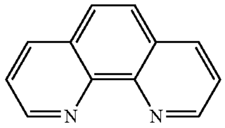

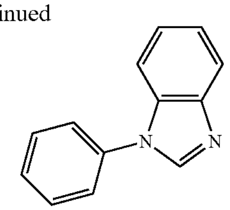

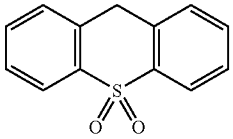

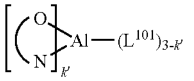

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

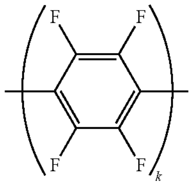

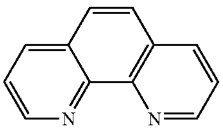

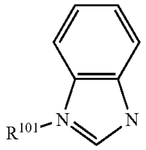

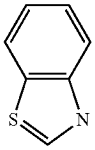

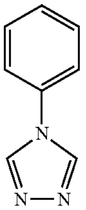

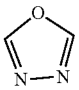

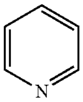

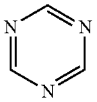

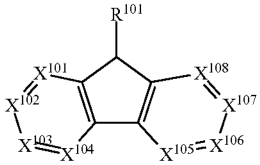

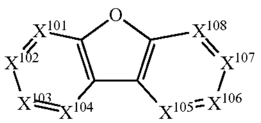

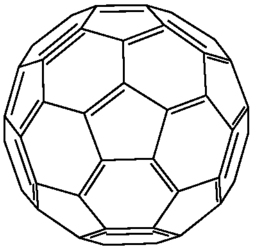

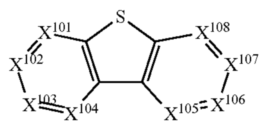

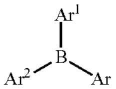

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

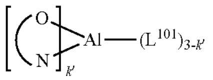

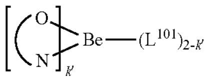

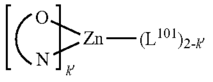

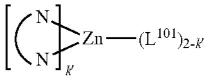

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

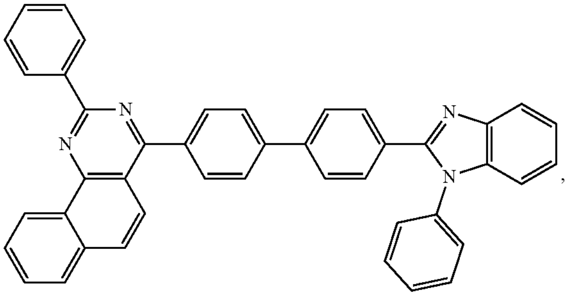,

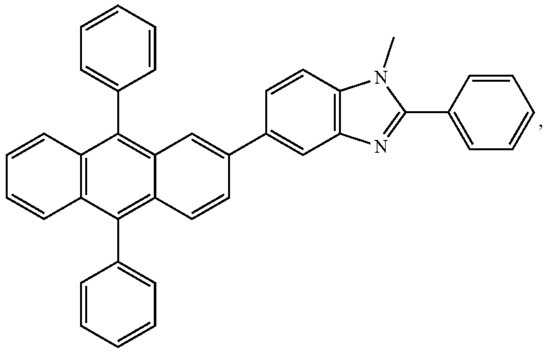,

-continued
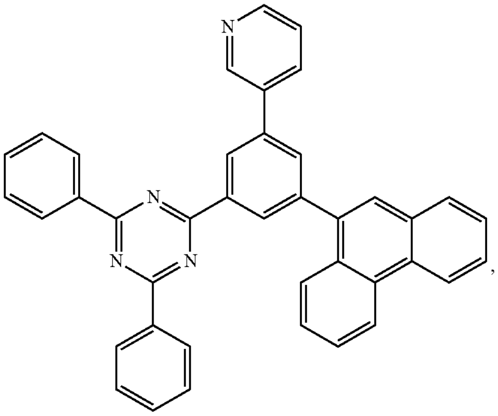
,
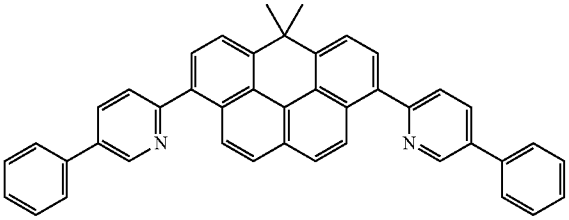
,
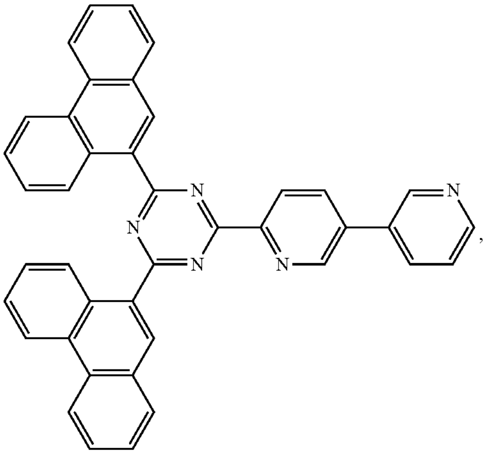
,
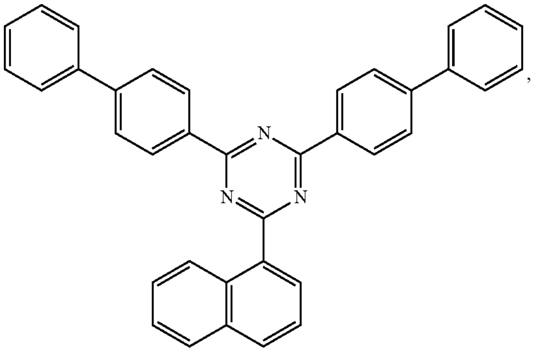
,
-continued
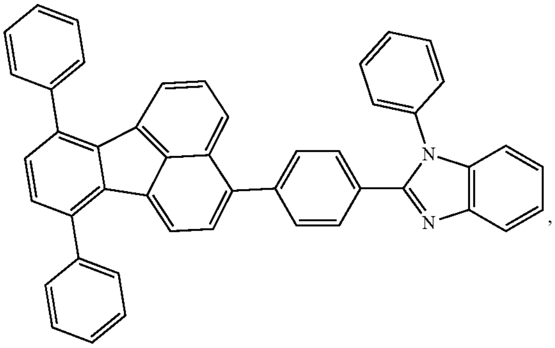
,
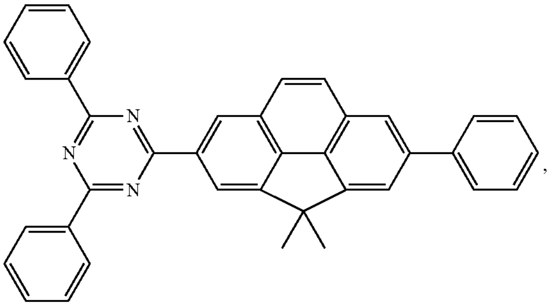
,
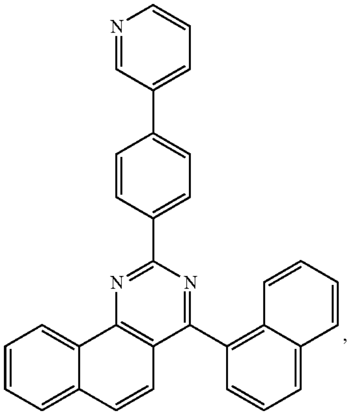
,
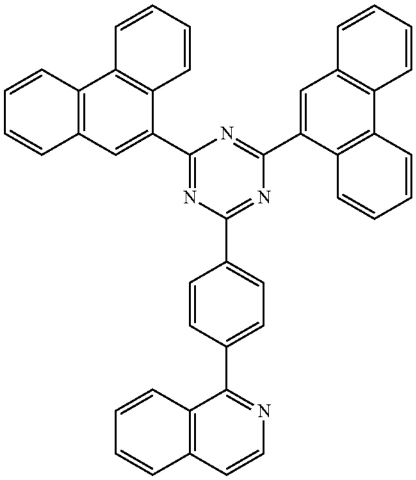
, -continued
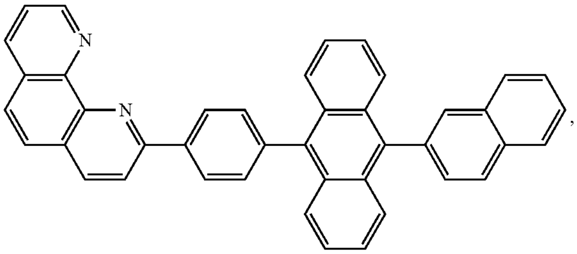
,
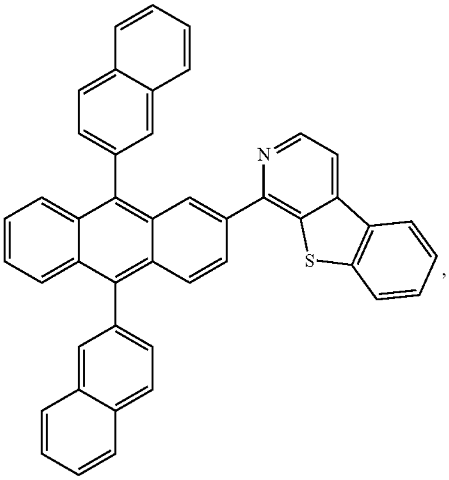
,
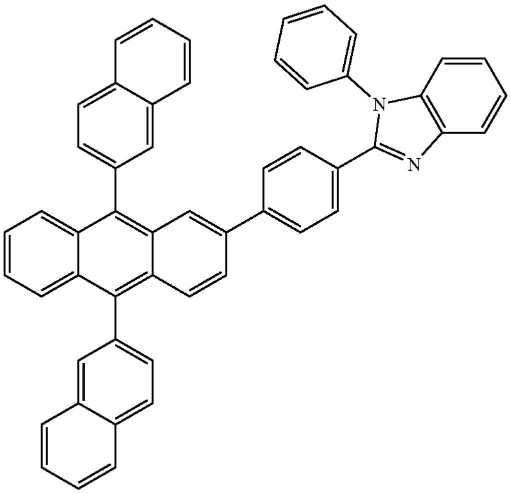
,
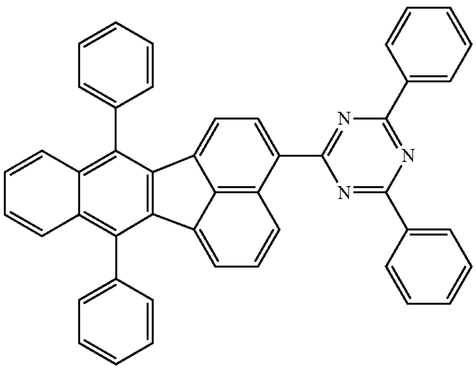
,
-continued
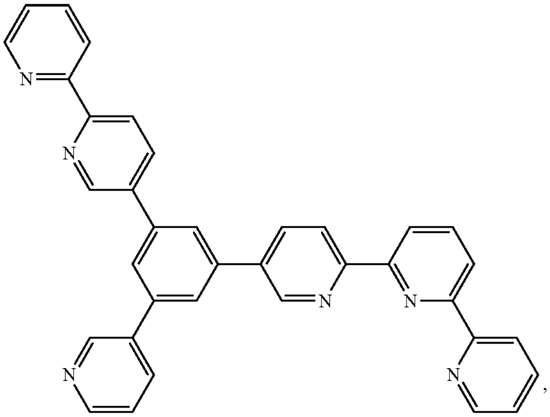
,
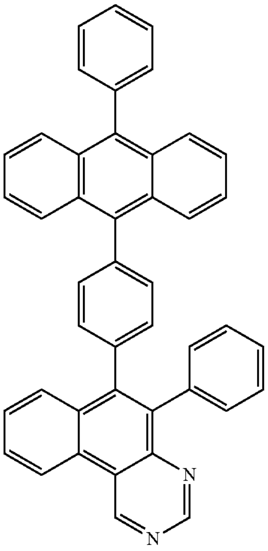
,
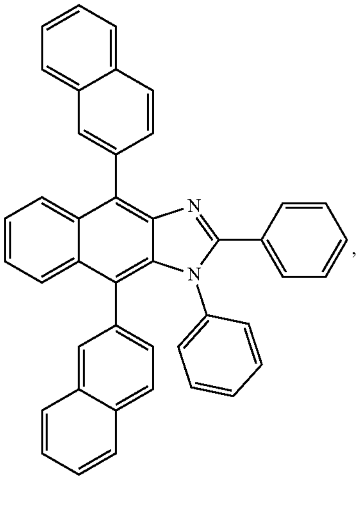
, -continued
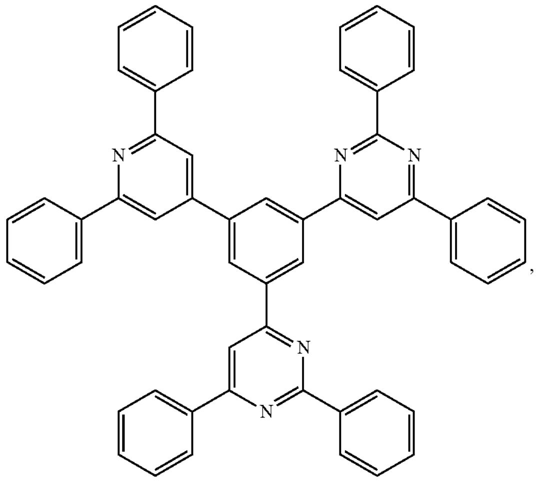
,
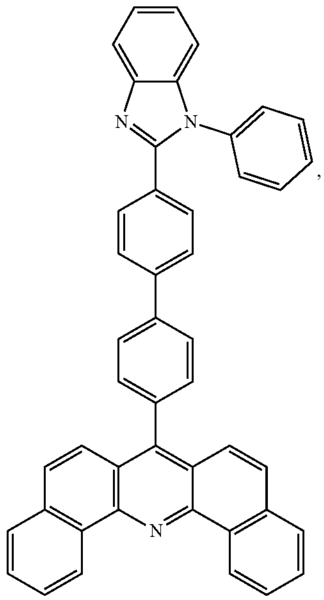
,
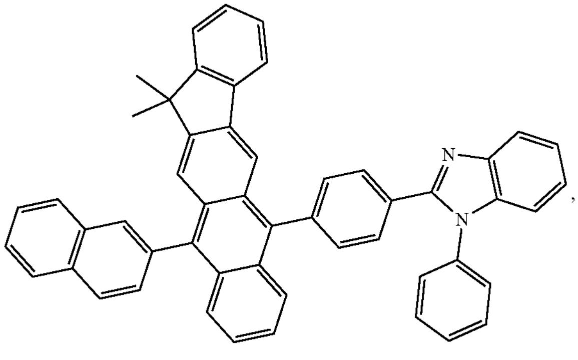
,
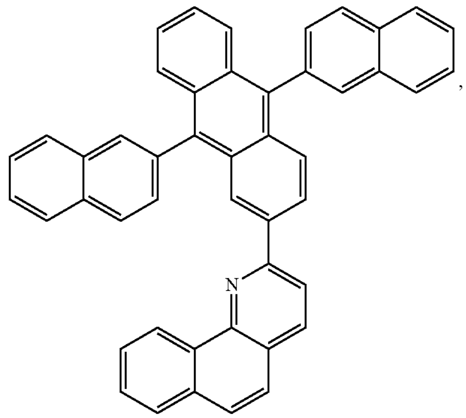
,
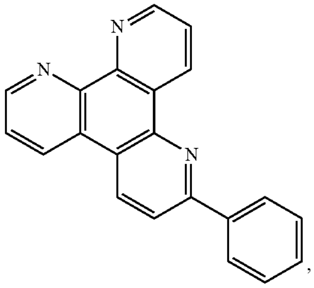
,
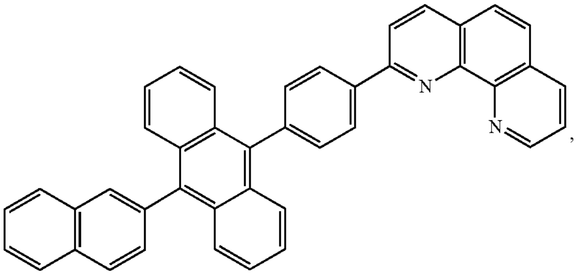
,
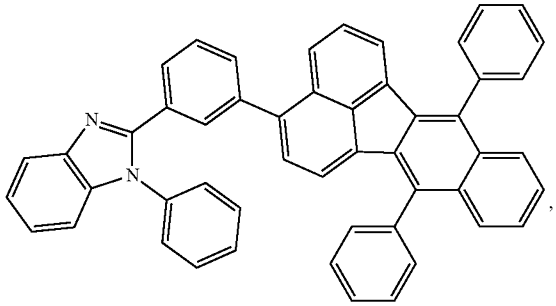
, -continued
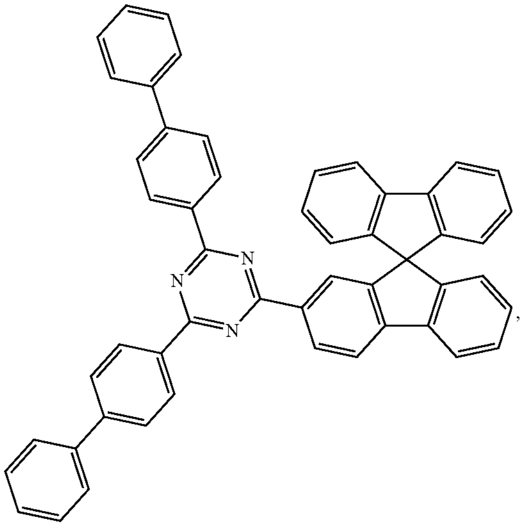
,
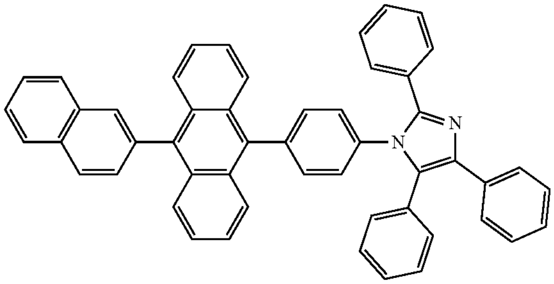
,
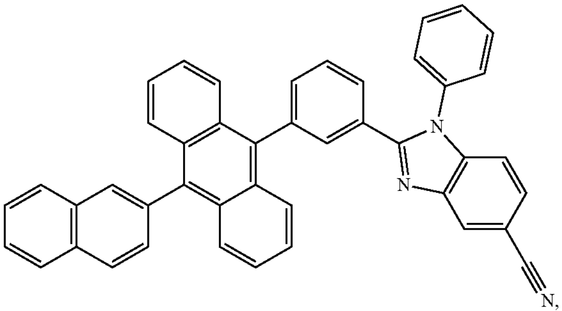
,
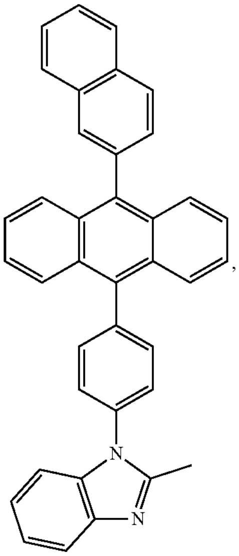
,
-continued
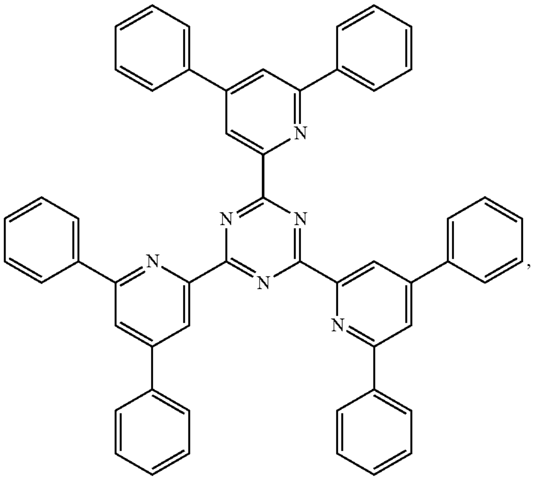
,
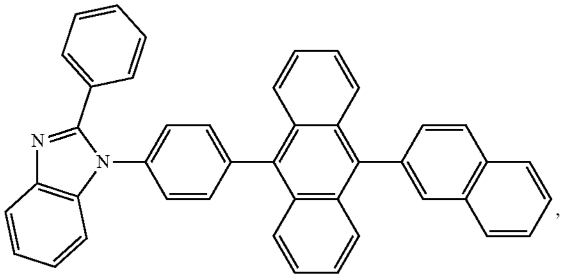
,
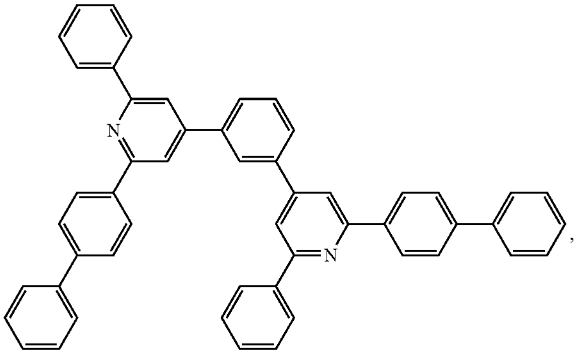
,
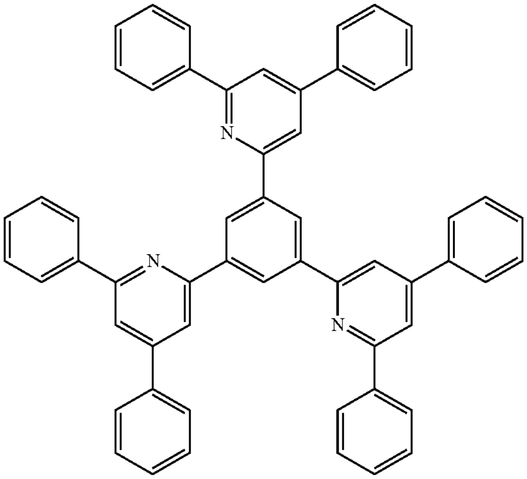
, -continued

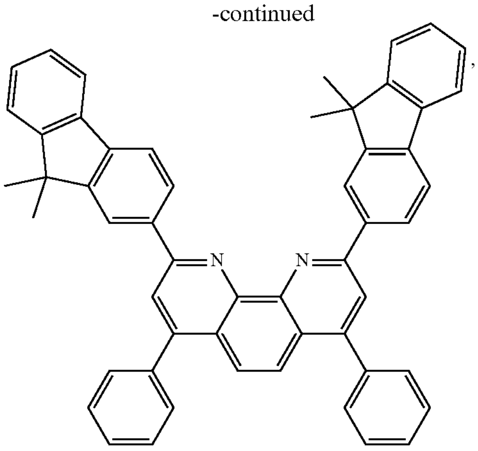

, and

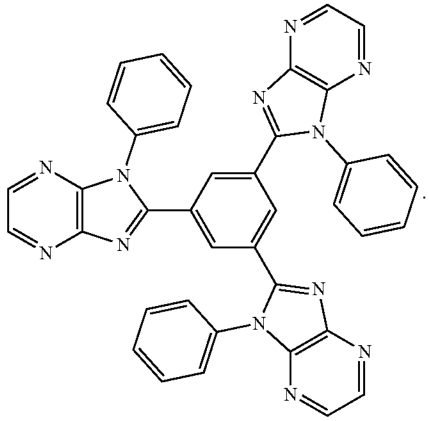 [SMILES: c1ccc(-n2c(-c3cc(-c4nc5nccnc5n4-c4ccccc4)cc(-c4nc5nccnc5n4-c4ccccc4)c3)nc3nccnc32)cc1]

.

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

EXPERIMENTAL

Scheme 1. General synthetic procedure for inventive compounds

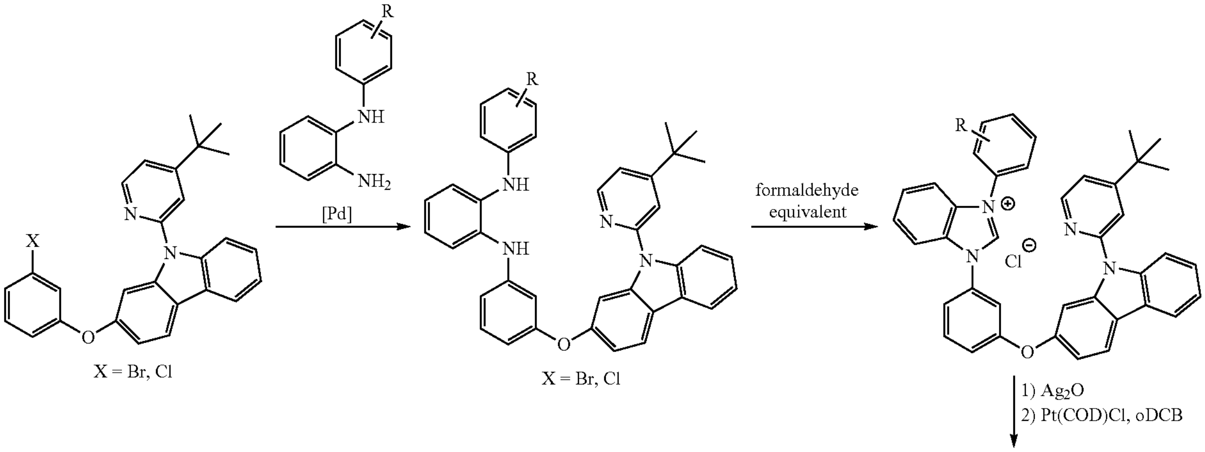

-continued
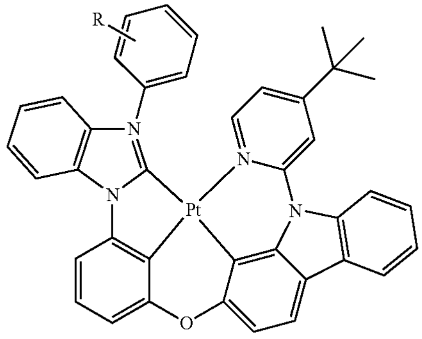
TABLE 1
| | Structure | λmax in PMMA (nm) | PLQY in PMMA (%) | Excited state lifetime at 77 K (μs) |
|---|---|---|---|---|
| Compound 60253535971 [$L_{C2358970}$ ($R_{40402}$), $L_{D13}$] | 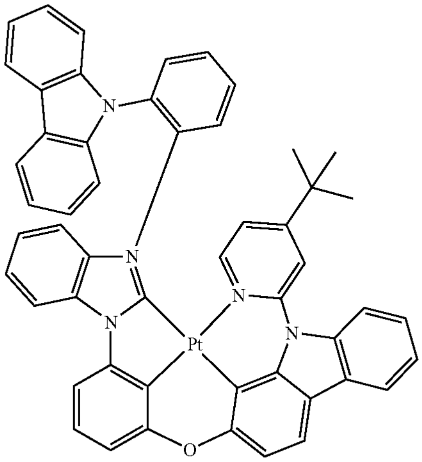 | 458 | 70 | 3.0 |
| Compound 59736162506 [$L_{C2338652}$ ($R_{20147}$), $L_{D13}$] | 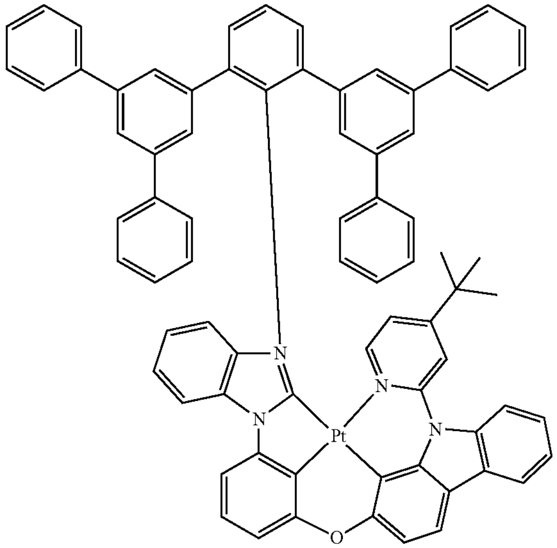 | 458 | 92 | 3.0 |

TABLE 1-continued
| | Structure | λmax in PMMA (nm) | PLQY in PMMA (%) | Excited state lifetime at 77 K (μs) |
|---|---|---|---|---|
| Compound 59735728275 [$L_{C2338635}$ ($R_{20130}$), $L_{D13}$] | 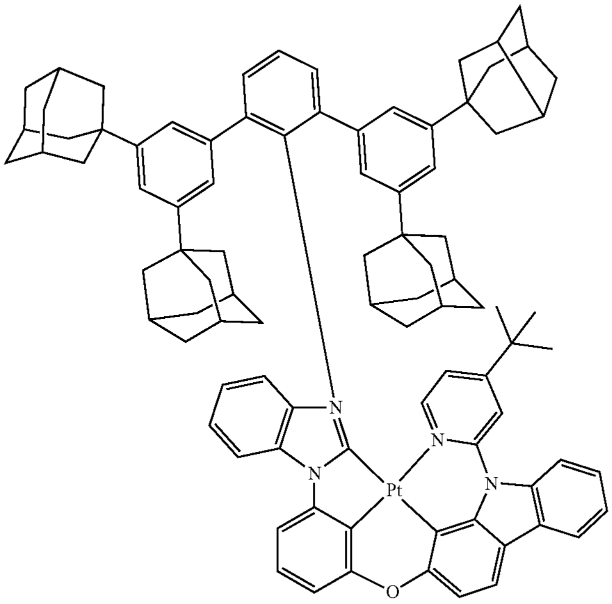 | 455 | 100 | 3.2 |
| Compound 62201598409 [$L_{C2435173}$, $L_{D13}$] | 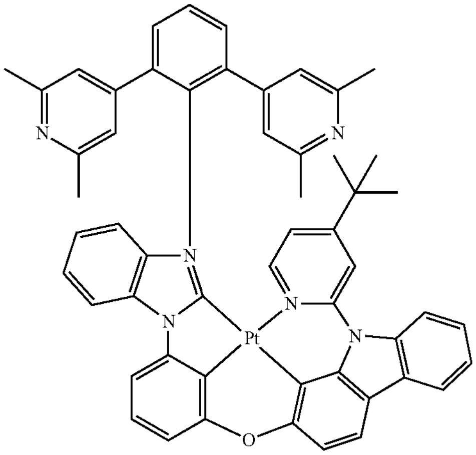 | 457 | 85 | 3.4 |
| Compound 59735140786 [$L_{C2338612}$ ($R_{20107}$), $L_{D13}$] | 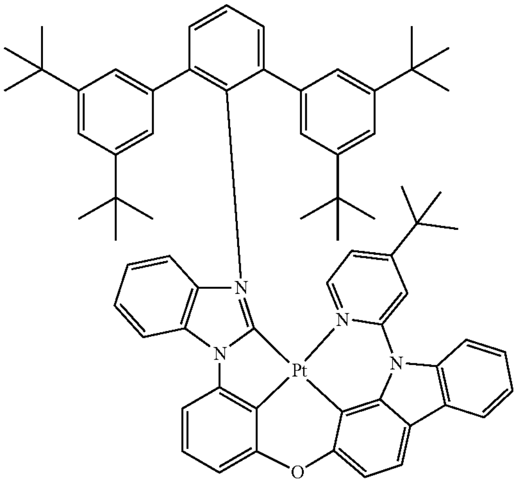 | 455 | 81 | 3.1 |

TABLE 1-continued

| | Structure | λmax in PMMA (nm) | PLQY in PMMA (%) | Excited state lifetime at 77 K (μs) |
|---|---|---|---|---|
| Compound 59221752029 [$L_{C2318513}$ ($R_7$), $L_{D13}$] | 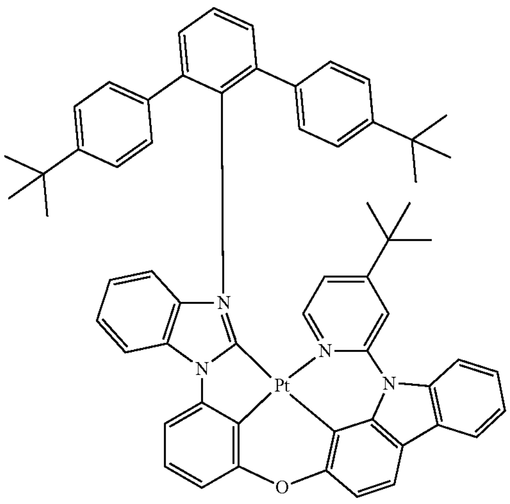 | 455 | 89 | 3.6 |
| Comparative Example | 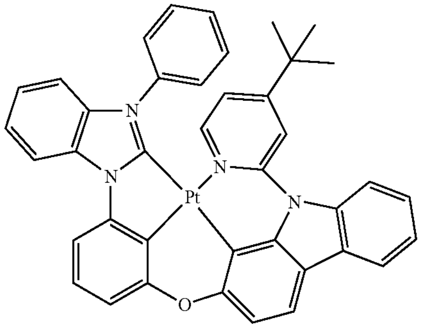 | 452 | 56 | 3.6 |

Table 1 shows emission peak, PLQY, and excited state lifetime for the inventive Compound 60253535971, 59736162506, 59735728275, 62201598409, 59735140786, and 59221752029. All inventive compounds showed higher PLQYs and shorter excited state lifetime, indicating the bulky group around the metal preserves compound's emissivity. Their emissions in PMMA are in a range of 455-458 inn, which are excellent candidate for generating saturate blue for display application.

Synthesis of Compound 60253535971:

Synthesis of 9-(2-nitrophenyl)-9H-carbazole: 2.00 grams, 12.0 mmol of 9H-carbazole, 1.69 grams, 12.0 mmol of 1-fluoro-2-nitrobenzene and 7.79 grams, 24.0 mmol of cesium carbonate were combined in a 250 mL round bottom flask. 60 mL of DMSO was added and this was stirred at 60° C. for 18 hours. The mixture was diluted with ethyl acetate and water and the layers were separated. The organic layer was washed with water, dried and chromatographed on silica eluted with 6-20% ethyl acetate in heptane to give 3.14 grams (91%) of product as a yellow solid.

Synthesis of 2-(9H-carbazol-9-yl)aniline: 3.1 grams of 9-(2-nitrophenyl)-9H-carbazole was dissolved in 200 mL of ethyl acetate, and 2 grams of Pd/C 10% was added. A hydrogen balloon was installed and this was stirred for 5 hours. This was filtered through Celite and evaporated to give 2.5 grams (90%) of product.

Synthesis of N-(2-(9H-carbazol-9-yl)phenyl)-2-nitroaniline: 2.60 grams, 0.07 mmol of 2-(9H-carbazol-9-yl)aniline, 2.91 grams, 11.7 mmol of 1-iodo-2-nitrobenzene, 0.363 grams, 0.503 mmol of SPhos-Pd-G2 and 1.94 grams, 20.13 mmol of sodium tert-butoxide were combined in a flask. This was evacuated and backfilled with nitrogen. 50 mL of toluene was added and this was refluxed for 22 hours. The mix was then diluted with ethyl acetate, filtered through Celite and chromatographed on silica eluted with 10-15% ethyl acetate in heptane to give 2.90 grams, 76% of product.

Synthesis of N1-(2-(9H-carbazol-9-yl)phenyl)benzene-1,2-diamine: 2.90 grams of N-(2-(9H-carbazol-9-yl)phenyl)-2-nitroaniline and 2.00 grams of Pd/C 10% was added and the reaction mixture was hydrogenated by balloon in ethyl acetate to give 2.56 grams of product.

Synthesis of N1-(2-(9H-carbazol-9-yl)phenyl)-N2-(3-((9-(4-(tert-butyl)pyridin-2-yl)-9H-carbazol-2-yl)oxy)phenyl)benzene-1,2-diamine: 0.408 grams, 1.17 mmol of N1-(2-(9H-carbazol-9-yl)phenyl)benzene-1,2-diamine, 0.50 grams, 1.06 mmol of 2-(3-bromophenoxy)-9-(4-(tert-butyl)pyridin-2-yl)-9H-carbazole, 12 mg, 0.032 mmol of Pd(allyl)Cl-dimer, 45 mg, 0.27 mmol of cBRIDP and 0.255 grams, 2.65 mmol of sodium tert-butoxide were refluxed in 7 mL of toluene for 5 his. The mix was chromatographed on silica eluted with 10% ethyl acetate in heptane to give 0.58 grams, 74% of product.

Synthesis of 3-(2-(9H-carbazol-9-yl)phenyl)-1-(3-((9-(4-(tert-butyl)pyridin-2-yl)-9H-carbazol-2-yl)oxy)phenyl)-1H-benzo[d]imidazol-3-ium chloride: 1.20 grams, 1.62 mmol of N1-(2-(9H-carbazol-9-yl)phenyl)-N2-(3-((9-(4-(tert-butyl) pyridin-2-yl)-9H-carbazol-2-yl)oxy)phenyl)benzene-1,2-diamine was stirred in 15 mL of triethylorthoformate. 0.16 mL, 1.95 mmol of hydrochloric acid (37%) was added and this was stirred at 80° C. for 24 hours. The product was filtered and washed with heptane to give 1.01 grams, 79% of product.

Synthesis of Compound 60253535971: 1.0 grams, 1.27 mmol of 3-(2-(9H-carbazol-9-yl)phenyl)-1-(3-((9-(4-(tert-butyl)pyridin-2-yl)-9H-carbazol-2-yl)oxy)phenyl)-1H-benzo[d]imidazol-3-ium chloride and 0.162 grams, 0.70 mmol of silver (I) oxide were stirred in 15 mL of 1,2-dichloroethane for two days. After solvent was evaporated, the crude product was dissolved in 15 mL of o-dichlorobenzene and transferred to a 100 mL Schlenk tube with 0.476 grams, 1.27 mmol of $Pt(COD)Cl_2$ and stirred at reflux for 24 hours. Evaporation of solvent and chromatography on silica eluted with 60% DCM in heptane to give 750 mg of product (63%).

Synthesis of Compound 59736162506:

Synthesis of 2,6-dibromo-N-(2-nitrophenyl)aniline: Sodium hydride (23.91 g, 598 mmol) and NMP (1 L) were added to a dray round bottom flask. The mixture was cooled on ice bath and 2,6-dibromoaniline (100 g, 399 mmol) was added. The mixture was stirred under nitrogen for 30 mm. 1-fluoro-2-nitrobenzene (84 g, 598 mmol) was added dropwise. The mixture was then warmed up to room temperature for 16 hours. The reaction mixture was slowly poured onto ice (~500 g) and stirred for ~1 hour, precipitation started to form. The suspension filtered and solids were collected and dried. The crude was recrystallized in methanol (84% yield).

Synthesis of N1-(2,6-dibromophenyl)benzene-1,2-diamine: 2,6-dibromo-N-(2-nitrophenyl)aniline (85 g, 228 mmol) in Ethanol (1 L) were added to a 3 L round bottom flask. Iron (51.0 g, 914 mmol) was added and then aqueous hydrogen chloride (0.019 L, 228 mmol) was added dropwise. The reaction mixture was stirred and heated to reflux for 2 hours. GC/MS analysis indicated the reaction was complete. Then sat. $NaHCO_3$ (500 mL) was added to adjust the pH value of reaction mixture to around 8. Then ethanol was removed under reduced pressure. The residue was extracted with EtOAc (3×1 L). The combined organic layer was dried over sodium sulfate (~100 g) and concentrated. The crude material was recrystallized with hot methanol (1 L) (38.9 g, 114 mmol, 49.8% yield) as brown solid.

Synthesis of N1-(5',5'''-diphenyl-[1,1':3',1'':3'',1''':3''',1''''-quinquephenyl]-2''-yl)benzene-1,2-diamine: A mixture of N1-(2,6-dibromophenyl)benzene-1,2-diamine (1 g, 2.92 mmol), [1,1':3',1''-terphenyl]-5'-ylboronic acid (2.404 g, 8.77 mmol), tetrakis(triphenylphosphine)palladium(0) (0.169 g, 0.146 mmol), and potassium phosphate (1.862 g, 8.77 mmol) was vacuumed and back-filled with nitrogen. Dioxane (18 ml) and Water (2 ml) were added to the reaction mixture and refluxed for 16 hours. Partitioned between EA and water and extracted with EA. Coated on celite and chromatographed on silica (DCM/Hep=3/1) (85% yield).

Synthesis of N1-(3-((9-(4-(tert-butyl)pyridin-2-yl)-9H-carbazol-2-yl)oxy)phenyl)-N2-(5',5'''-diphenyl-[1,1':3',1'':3'',1''':3''',1''''-quinquephenyl]-2''-yl)benzene-1,2-diamine: A mixture of N1-(5',5'''-diphenyl-[1,1':3',1'':3'',1''':3''',1''''-quinquephenyl]-2''-yl)benzene-1,2-diamine (1.020 g, 1.591 mmol), 2-(3-bromophenoxy)-9-(4-(tert-butyl)pyridin-2-yl)-9H-carbazole (0.75 g, 1.591 mmol), (allyl)PdCl-dimer (0.023 g, 0.064 mmol), cBRIDP (0.090 g, 0.255 mmol), and sodium 2-methylpropan-2-olate (0.382 g, 3.98 mmol) was vacuumed and back-filled with nitrogen several times. Toluene (8 ml) was added to the reaction mixture and refluxed for 16 hours. Coated on Celite and chromatographed on silica (DCM/Hep=3/1) (52% yield).

Synthesis of 1-(3-((9-(4-(tert-butyl)pyridin-2-yl)-9H-carbazol-2-yl)oxy)phenyl)-3-(5',5'''-diphenyl-[1,1':3',1'':3'',1''':3''',1''''-quinquephenyl]-2''-yl)-1H-benzo[d]imidazol-3-ium chloride: N1-(3-((9-(4-(tert-butyl)pyridin-2-yl)-9H-carbazol-2-yl)oxy)phenyl)-N2-(5',5'''-diphenyl-[1,1':3',1'':3'',1:3''',1''''-quinquephenyl]-2''-yl)benzene-1,2-diamine (0.86 g, 0.834 mmol) was dissolved in Acetonitrile (20 ml) (not very soluble, added 10 mL EA and 2 mL THF) and N-(chloromethylene)-N-methylmethanaminium chloride (0.192 g, 1.501 mmol) was added and stirred at R.T. for 10 min then added triethylamine (0.349 ml, 2.502 mmol) and the reaction mixture was stirred at 85° C. for 16 hours. Coated on Celite and chromatographed on silica (DCM to DCM/MeOH=9/1, the dark band). After evaporation of solvent, the product was dissolved in DCM and dried with $MgSO_4$ and evaporated (82% yield).

Synthesis of Compound 59736162506: A mixture of 1-(3-((9-(4-(tert-butyl)pyridin-2-yl)-9H-carbazol-2-yl)oxy) phenyl)-3-(5',5'''-diphenyl-[1,1':3',1''::3'',1':3''',1''''-quinquephenyl]-2''-yl)-1H-benzo[d]imidazol-3-ium chloride (734 mg, 0.681 mmol) and silver oxide (79 mg, 0.341 mmol) was stirred in 1,2-dichloroethane (15 ml) at R.T. for about 16 hours. After removing 1,2-dichloroethane, $Pt(COD)Cl_2$ (255 mg, 0.681 mmol) was added and the reaction mixture was vacuumed and back-filled with nitrogen. 1,3-dichlorotoluene (15 ml) was added and heated at 205° C. for 2 days. Removed solvent and coated on celite and chromatographed on silica (DCM/Hep=2/1). The product was triturated in MeOH and dried in the vacuum oven (34% yield).

Synthesis of Compound 59735728275:

Synthesis of 2,6-dibromo-N-(2-nitrophenyl)aniline: To a dry round-bottom flask was added sodium hydride (23.91 g, 598 mmol) and NMP (1 L). The mixture was cooled on ice bath and 2,6-dibromoaniline (100 g, 399 mmol) was added. The mixture was stirred under nitrogen for 30 mm. 1-fluoro-2-nitrobenzene (84 g, 598 mmol) was added dropwise. The mixture was then warmed up to room temperature for 16 hours. The reaction mixture was slowly poured onto ice (~500 g) and stirred for ~1 hour, precipitation started to form. The suspension was filtered and solids were collected and dried. The crude was recrystallized in methanol (84% yield).

Synthesis of N1-(2,6-dibromophenyl)benzene-1,2-diamine: 2,6-dibromo-N-(2-nitrophenyl)aniline (85 g, 228 mmol) was dissolved in ethanol (1 L). iron (51.0 g, 914 mmol) was added and then aqueous hydrogen chloride (0.019 L, 228 mmol) was added dropwise. The reaction mixture was stirred and heated to reflux for 2 hours. GC/MS analysis indicated the reaction was complete. Then sat. $NaHCO_3$ (500 mL) was added to adjust the pH value of reaction mixture to around 8. Then ethanol was removed under reduced pressure. The residue was extracted with EtOAc (3×1 L). The combined organic layer was dried over sodium sulfate (~100 g) and concentrated. The crude material was recrystallized with hot methanol (1 L) (38.9 g, 114 mmol, 49.8% yield) as brown solid.

Synthesis of N1-(3,3'',5,5''-tetra(adamantan-1-yl)-[1,1':3',1''-terphenyl]-2'-yl)benzene-1,2-diamine: A mixture of N1-(2,6-dibromophenyl)benzene-1,2-diamine (400 mg, 1.169 mmol), (3,5-di((3R,5R,7R)-adamantan-1-yl)phenyl)boronic acid (1141 mg, 2.92 mmol), tetrakis(triphenylphosphine) palladium(0) (67.6 mg, 0.058 mmol), and potassium phosphate (745 mg, 3.51 mmol) was vacuumed and back-filled with nitrogen. Dioxane (9 ml) and Water (1 ml) were added to the reaction mixture and refluxed for 16 hours. Partitioned between EA and water and extracted with EA. Coated on celite and chromatographed on silica (DCM/Hep=1/1) (87% yield).

Synthesis of N1-(3-((9-(4-(tert-butyl)pyridin-2-yl)-9H-carbazol-2-yl)oxy)phenyl)-N2-(3,3",5,5"-tetra(adamantan-1-yl)-[1,1':3',1"-terphenyl]-2'-yl)benzene-1,2-diamine: A mixture of N1-(3,3",5,5"-tetra(adamantan-1-yl)-[1,1':3',1"-terphenyl]-2'-yl)benzene-1,2-diamine (0.89 g, 1.019 mmol), 2-(3-bromophenoxy)-9-(4-(tert-butyl)pyridin-2-yl)-9H-carbazole (0.480 g, 1.019 mmol), Pd(allyl)Cl-dimer (0.015 g, 0.041 mmol), cBRIDP (0.057 g, 0.163 mmol), and sodium 2-methylpropan-2-olate (0.245 g, 2.55 mmol) was vacuumed and back-filled with nitrogen several times. Toluene (8 ml) was added to the reaction mixture and refluxed for 16 h. Coated on celite and chromatographed on silica (DCM/Hep=2/1) (65% yield).

Synthesis of 1-(3-((9-(4-(tert-butyl)pyridin-2-yl)-9H-carbazol-2-yl)oxy)phenyl)-3-(3,3",5,5"-tetra(adamantan-1-yl)-[1,1':3',1"-terphenyl]-2'-yl)-1H-benzo[d]imidazol-3-ium chloride: N1-(3-((9-(4-(tert-butyl)pyridin-2-yl)-9H-carbazol-2-yl)oxy)phenyl)-N2-(3,3",5,5"-tetra(adamantan-1-yl)-[1,1':3',1"-terphenyl]-2'-yl)benzene-1,2-diamine (840 mg, 0.665 mmol) was dissolved in THF (15 ml) and Acetonitrile (15 ml) and N-(chloromethylene)-N-methylmethanaminium chloride (153 mg, 1.196 mmol) was added and stirred at R.T. for 10 min then added triethylamine (0.278 ml, 1.994 mmol) and the reaction mixture was stirred at 85° C. for 16 h. Coated on celite and chromatographed on silica (DCM to DCM/MeOH=9/1). After evaporation of solvent, the product was dissolved in DCM and dried with $MgSO_4$. (75% yield).

Synthesis of Compound 59735728275: A mixture of 1-(3-((9-(4-(tert-butyl)pyridin-2-yl)-9H-carbazol-2-yl)oxy)phenyl)-3-(3,3",5,5"-tetra(adamantan-1-yl)-[1,1':3',1"-terphenyl]-2'-yl)-1H-benzo[d]imidazol-3-ium chloride (650 mg, 0.496 mmol) and silver oxide (57.5 mg, 0.248 mmol) was stirred in 1,2-dichloroethane (15 ml) at R.T. for 16 hours. After removing 1,2-dichloroethane, $Pt(COD)Cl_2$ (186 mg, 0.496 mmol) was added and the reaction mixture was vacuumed and back-filled with nitrogen. 1,2-dichlorobenzene (15 ml) was added and heated at 203° C. for about 48 hours. Solvent was removed and coated on Celite and chromatographed on silica (DCM/Hep=2/3). The product was triturated in MeOH and dried in the vacuum oven. (51% yield).

Synthesis of Compound 62201598409:

Synthesis 9-(4-(tert-butyl)pyridin-2-yl)-2-(3-(4,4,5,5-tetramethyl-1,3,2-dioxaborolan-2-yl)phenoxy)-9H-carbazole: 2-(3-bromophenoxy)-9-(4-(tert-butyl)pyridin-2-yl)-9H-carbazole (32.2 g, 68.3 mmol), potassium acetate (20.11 g, 205 mmol), 4,4,4',4',5,5,5',5'-octamethyl-2,2'-bi(1,3,2-dioxaborolane) (20.82 g, 82 mmol) in dioxane (395 ml) were sparged with nitrogen for 30 min. $Pd(dppf)_2Cl_2$ dichloromethane adduct (2.79 g, 3.42 mmol) was added. The reaction was refluxed for 16 h. Reaction mixture was cooled to room temperature and filtered through a pad of celite. The filtrate was concentrated, adsorbed onto silica (90 g) and purified on silica eluting with a gradient of 2 to 30% ethyl acetate in hexanes to give desired product as a white foam (88% yield).

Synthesis of (3-((9-(4-(tert-butyl)pyridin-2-yl)-9H-carbazol-2-yl)oxy)phenyl)boronic acid: A mixture of 9-(4-(tert-butyl)pyridin-2-yl)-2-(3-(4,4,5,5-tetramethyl-1,3,2-dioxaborolan-2-yl)phenoxy)-9H-carbazole (11 g, 21.22 mmol), ammonium acetate (8.18 g, 106 mmol), acetone (70.7 ml) and water (35.4 ml) was cooled to 0° C., and sodium periodate (22.69 g, 106 mmol) was added portion wise over 10 min. After stirring for 16 hours at room temperature, additional ammonium acetate (8.18 g, 106 mmol) and sodium periodate (22.69 g, 106 mmol) were added to drive reaction to completion. The reaction mixture was stirred with EA (250 mL) at RT for 1 hour and filtered. Filtrate was dried over $Na_2SO_4$ and concentrated under reduced pressure (97% yield).

Synthesis 9-(4-(tert-butyl)pyridin-2-yl)-2-(3-(mesityl(tetrafluoro-15-boranyl)-13-iodanyl)phenoxy)-9H-carbazole: (3-((9-(4-(tert-butyl)pyridin-2-yl)-9H-carbazol-2-yl)oxy)phenyl)boronic acid (9.2 g, 21.09 mmol) was dissolved in Dichloromethane (100 ml) and cooled to 0° C. under $N_2$ atmosphere. Boron trifluoride etherate (3.47 ml, 27.4 mmol) was added and stirred at 0° C. for 30 min. Mesityl-13-iodanediyl diacetate (9.98 g, 27.4 mmol) was added in one portion and stirred for 16 hours. The reaction mixture was treated with a solution of sodium tetrafluoroborate (57.9 g, 527 mmol) in $H_2O$ (200 mL) and stirred for 45 min and extracted with DCM (200 mL). Organics were combined, dried over $Na_2SO_4$, and concentrated to afford a brown solid (83% yield).

Synthesis of 3-(3-((9-(4-(tert-butyl)pyridin-2-yl)-9H-carbazol-2-yl)oxy)phenyl)-1-(2,6-dibromophenyl)-1-(tetrafluoro-15-boranyl)-2,3-dihydro-1H-benzo[d]imidazol-1-ium-2-ide: A mixture of copper(II) trifluoromethanesulfonate (0.241 g, 0.668 mmol), 1-(2,6-dibromophenyl)-1H-benzo[d]imidazole (2.35 g, 6.68 mmol) and 9-(4-(tert-butyl)pyridin-2-yl)-2-(3-(mesityl(tetrafluoro-15-boranyl)-13-iodanyl)phenoxy)-9H-carbazole (5.08 g, 7.01 mmol) in anhydrous DMF (26.7 ml) was stirred at 100° C. for 16 hours. DMF was removed under reduced pressure, the residue was adsorbed onto celite (12 g) and purified on silica eluting with a gradient of 5 to 30% ethyl acetate (57% yield).

Synthesis of platinated 3-(3-((9-(4-(tert-butyl)pyridin-2-yl)-9H-carbazol-2-yl)oxy)phenyl)-1-(2,6-dibromophenyl)-1-(tetrafluoro-15-boranyl)-2,3-dihydro-1H-benzo[d]imidazol-1-ium-2-ide: A mixture of 3-(3-((9-(4-(tert-butyl)pyridin-2-yl)-9H-carbazol-2-yl)oxy)phenyl)-1-(2,6-dibromophenyl)-1-(tetrafluoro-15-boranyl)-2,3-dihydro-1H-benzo[d]imidazol-1-ium-2-ide (34 g, 40.9 mmol) 2,6-lutidine (14.31 ml, 123 mmol), and potassium tetrachloroplatinate(II) (17.00 g, 40.9 mmol) in 1,2-dichlorobenzene (1638 ml) was sparged with argon for about an hour. The reaction was heated at 125° C. for total of 68 hours. The mixture was concentrated under reduced pressure, dissolved in DCM (200 mL), absorbed on to Celite and purified on silica eluting with 40-55% DCM in hexanes (46% yield).

Synthesis of 62201598409: potassium carbonate (0.092 g, 0.668 mmol), platinated 3-(3-((9-(4-(tert-butyl)pyridin-2-yl)-9H-carbazol-2-yl)oxy)phenyl)-1-(2,6-dibromophenyl)-1-(tetrafluoro-15-boranyl)-2,3-dihydro-1H-benzo[d]imidazol-1-ium-2-ide (0.05 g, 0.053 mmol), SPhos-Pd-G2 (4.43 mg, 5.34 mol) and SPhos (1.755 mg, 4.28 mol) in Dioxane (0.972 ml) and Water (0.097 ml) were sparged with argon for 25 min. (2,6-dimethylpyridin-4-yl)boronic acid (0.040 g, 0.267 mmol) was added and sparging continued for another 10 min. The reaction temperature was raised to 80° C. and the reaction was stirred for 16 hours. Reaction mixture was diluted with water (10 mL) and DCM (15 mL). Organic layer was separated, dried over anhydrous sodium sulfate (1.5 g) and concentrated. The residue was purified on silica eluting with 40% ethyl acetate in DCM to give 24 mg of yellow solid (46% yield).

Synthesis of Compound 59735140786:

Synthesis of N1-(3,3",5,5"-tetra-tert-butyl-[1,1':3',1"-terphenyl]-2'-yl)benzene-1,2-diamine: A mixture of N1-(2,6- dibromophenyl)benzene-1,2-diamine (1.02 g, 2.98 mmol), (3,5-di-tert-butylphenyl)boronic acid (2.79 g, 11.93 mmol), tetrakis(triphenylphosphine)palladium(0) (0.35 g, 0.29 mmol, 10 mol %), and potassium phosphate tribasic (1.90 g, 8.95 mmol) was dissolved in 3:1 1,4-dioxane:water (30 mL) and degassed with nitrogen for 30 min and heated to 95° C. for 18 hours. The mixture was cooled and poured into a 500 mL separatory funnel to which saturated sodium bicarbonate (100 mL) and ethyl acetate (300 mL) were added. The aqueous layer was extracted with ethyl acetate. The organics were dried over anhydrous sodium sulfate and concentrated under reduced pressure. The crude product was coated on Celite (120 g) and purified by silica gel chromatography using 5% ethyl acetate/hexanes to give product as a dark oil. (72% yield)

Synthesis of N1-(3-((9-(4-(tert-butyl)pyridin-2-yl)-9H-carbazol-2-yl)oxy)phenyl)-N2-(3,3",5,5"-tetra-tert-butyl-[1,1':3',1"-terphenyl]-2'-yl)benzene-1,2-diamine: A mixture of N1-(3,3",5,5"-tetra-tert-butyl-[1,1':3',1"-terphenyl]-2'-yl)benzene-1,2-diamine (8 g, 14.26 mmol), 2-(3-bromophenoxy)-9-(4-(tert-butyl)pyridin-2-yl)-9H-carbazole (6.72 g, 14.26 mmol), (allyl)PdCl-dimer (0.261 g, 0.713 mmol), di-tert-butyl(1-methyl-2,2-diphenylcyclopropyl)phosphane (1.006 g, 2.85 mmol), and sodium tert-butoxide (4.11 g, 42.8 mmol) was added argon purged toluene (100 ml) and heated to 110° C. for about 16 hours. The reaction mixture was cooled down to room temperature and poured into 200 mL sat. $NaHCO_3$. The mixture was extracted with EtOAc and dried over sodium sulfate and concentrated. The crude product was coated on Celite and chromatographed on silica eluting with 40-100% DCM/Hex to give products as brown solid (59% yield).

Synthesis of 1-(3-((9-(4-(tert-butyl)pyridin-2-yl)-9H-carbazol-2-yl)oxy)phenyl)-3-(3,3",5,5"-tetra-tert-butyl-[1,1':3',1"-terphenyl]-2'-yl)-1H-benzo[d]imidazol-3-ium chloride: To a 250 mL sealed tube was added N1-(3-((9-(4-(tert-butyl)pyridin-2-yl)-9H-carbazol-2-yl)oxy)phenyl)-N2-(3,3",5,5"-tetra-tert-butyl-[1,1':3',1"-terphenyl]-2'-yl)benzene-1,2-diamine (8.0 g, 8.41 mmol), triethoxymethane (70 ml, 421 mmol) and hydrogen chloride in dioxane (17 ml, 68.0 mmol). The tube was sealed and the reaction was heated at 140° C. for 16 hours. After cooling to room temperature, the crude reaction mixture was concentrated and adsorbed onto silica gel (50 g) and purified by chromatography on silica, eluting with a gradient of 5% methanol in dichloromethane to yield product as light yellow solid (53% yield).

Synthesis of (1-(3-((9-(4-(tert-butyl)pyridin-2-yl)-9H-carbazol-2-yl)oxy)phenyl)-3-(3,3",5,5"-tetra-tert-butyl-[1,1':3',1"-terphenyl]-2'-yl)-1H-benzo[d]imidazol-3-ium-2-yl) silver: A mixture of 1-(3-((9-(4-(tert-butyl)pyridin-2-yl)-9H-carbazol-2-yl)oxy)phenyl)-3-(3,3",5,5"-tetra-tert-butyl-[1,1':3',1"-terphenyl]-2'-yl)-1H-benzo[d]imidazol-3-ium chloride (4.5 g, 4.51 mmol) and 1,2-dichloroethane (90 mL) was sparged with argon for 20 minutes. Silver (I) oxide (520 mg, 2.25 mmol, 0.50 equiv) was added. The flask was covered with foil to exclude light. After stirring at reflux for 16 hours, the mixture was cooled down to room temperature and filtered through a pad of Celite, which was washed with dichloromethane (100 mL). The filtrates were concentrated under reduced pressure to yield the silver carbene (99% yield).

Synthesis of Compound 59735140786: (1-(3-((9-(4-(tert-butyl)pyridin-2-yl)-9H-carbazol-2-yl)oxy)phenyl)-3-(3,3",5,5"-tetra-tert-butyl-[1,1':3',1"-terphenyl]-2'-yl)-1H-benzo[d]imidazol-3-ium-2-yl)silver (3.5 g, 3.27 mmol) was suspended in 1,2-dichlorobenzene (60 mL) and the mixture was sparged with argon for 30 minutes. Pt(COD)$Cl_2$ (1.225 g, 3.27 mmol) was added and the mixture was heated at 185° C. for 24 hours. After cooling to room temperature, the combine crude material was adsorbed onto silica gel (50 g) and purified by chromatography on silica, eluting with a gradient of 0 to 80% dichloromethane in hexanes to give product as a yellow solid. The product was dissolved in a minimal amount of dichloromethane (10 mL) and methanol (200 mL) was added. The resulting solid was collected by filtration. (37% yield).

Synthesis of Compound 59221752029:

Synthesis of N1-(3,3",5,5"-tetra-tert-butyl-[1,1':3',1"-terphenyl]-2'-yl)benzene-1,2-diamine: A mixture of N1-(2,6-dibromophenyl)benzene-1,2-diamine (1.02 g, 2.98 mmol), (3,5-di-tert-butylphenyl)boronic acid (2.79 g, 11.93 mmol), tetrakis(triphenylphosphine)palladium(0) (0.35 g, 0.29 mmol, 10 mol %), and potassium phosphate tribasic (1.90 g, 8.95 mmol) was dissolved in 3:1 1,4-dioxane:water (30 mL) and degassed with nitrogen for 30 min and heated to 95° C. for 18 hours. The mixture was cooled and poured into a 500 mL separatory funnel to which saturated sodium bicarbonate (100 mL) and ethyl acetate (300 mL) were added. The aqueous layer was extracted with ethyl acetate. The organics were dried over anhydrous sodium sulfate and concentrated under reduced pressure. The crude product was coated on Celite (120 g) and purified by silica gel chromatography using 5% ethyl acetate/hexanes to give product as a dark oil. (72% yield)

Synthesis of N1-(4,4"-di-tert-butyl-[1,1':3',1"-terphenyl]-2'-yl)benzene-1,2-diamine: To a 100 mL pressure vessel was added N1-(2,6-dibromophenyl)benzene-1,2-diamine (1 g, 2.92 mmol) in argon purged dioxane (27 mL):water mixture (9 mL), (4-(tert-butyl)phenyl)boronic acid (2.082 g, 11.69 mmol), tetrakis(triphenylphosphine)palladium(0) (0.338 g, 0.292 mmol) and potassium phosphate tribasic (1.862 g, 8.77 mmol) was added while suspension was purged with argon. The mixture was further purged with argon for 5 min before sealed. The reaction was heated to 95° C. and stirred 16 hours. The mixture was cooled down room temperature and poured into 50 mL $NaHCO_3$ solution. The mixture was then extracted with EtOAc. The organic layer was dried over sodium sulfate and concentrated under vacuum. The residue was absorbed to 120 g silica gel and chromatographed on silica eluting with 0-45% EA/Hex to give product as pale grey solid (69% yield).

Synthesis of N1-(3-((9-(4-(tert-butyl)pyridin-2-yl)-9H-carbazol-2-yl)oxy)phenyl)-N2-(4,4"-di-tert-butyl-[1,1':3',1"-terphenyl]-2'-yl)benzene-1,2-diamine: To a 250 mL pressure vessel was added N1-(4,4"-di-tert-butyl-[1,1':3',1"-terphenyl]-2'-yl)benzene-1,2-diamine (3.16 g, 7.04 mmol), 2-(3-bromophenoxy)-9-(4-(tert-butyl)pyridin-2-yl)-9H-carbazole (3.32 g, 7.04 mmol) in argon purged Toluene (75 ml). palladium(II) dichloride diprop-2-en-1-ide (0.129 g, 0.352 mmol),di-tert-butyl(1-methyl-2,2-diphenylcyclopropyl) phosphane (0.497 g, 1.409 mmol) and sodium tert-butoxide (2.031 g, 21.13 mmol) were added under argon. The mixture was further purged with argon for another 5 mm. The tube was sealed and heated to 110° C. for 16 hours. The reaction mixture was cooled down to room temperature and poured into 250 mL sat. $NaHCO_3$. The mixture was extracted with EtOAc and dried over sodium sulfate and concentrated. The residue was absorbed to silica gel (50 g) and chromatographed on silica eluting with 0-55% Hex/EA to give product as brown solid (37.2% yield).

Synthesis of 1-(3-((9-(4-(tert-butyl)pyridin-2-yl)-9H-carbazol-2-yl)oxy)phenyl)-3-(4,4"-di-tert-butyl-[1,1':3',1"-terphenyl]-2'-yl)-1H-benzo[d]imidazol-3-ium chloride: To a 40 mL reaction vial was added N1-(3-((9-(4-(tert-butyl)pyridin-2-yl)-9H-carbazol-2-yl)oxy)phenyl)-N2-(4,4"-di-tert-butyl-[1,1':3',1"-terphenyl]-2'-yl)benzene-1,2-diamine (2.2 g, 2.62 mmol), trimethoxymethane (13.91 g, 131 mmol), hydrogen chloride in dioxane (5.24 ml, 20.97 mmol). The vial was sealed and heated to 80° C. for 16 hours. Trimethyl orthoformate and dioxane was removed under reduced pressure. The residue was absorbed to 30 g silica gel and chromatographed on silica eluting with 0-20% MeOH/DCM to give product as pale grey solids (73% yield).

Synthesis of Compound 59221752029: To a pressure vessel was added 1-(3-((9-(4-(tert-butyl)pyridin-2-yl)-9H-carbazol-2-yl)oxy)phenyl)-3-(4,4"-di-tert-butyl-[1,1':3',1"-terphenyl]-2'-yl)-1H-benzo[d]imidazol-3-ium chloride (1.4 g, 1.581 mmol) in 1,2-dichlorobenzene (25 ml), the mixture was purged with argon for 20 min, then Pt(COD)$Cl_2$ (0.592 g, 1.581 mmol) and potassium 2-methylpropan-2-olate (0.266 g, 2.371 mmol) was added. The reaction mixture was heated to 60° C. for 1 hour, then heated to 225° C. for 10 days. The reaction mixture was concentrated and absorbed to 30 g Celite and purified by column chromatography eluting with 35% DCM/Hex to give product (9.10% yield).

OLED device fabrication: OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes.

The devices in Table21 were fabricated in high vacuum (<$10^{-6}$ Torr) by thermal evaporation. The anode electrode was 750 Å of indium tin oxide (ITO). The device example had organic layers consisting of, sequentially, from the ITO surface, 100 Å thick Compound A (HIL), 250 Å layer of Compound B (HTL), 50 Å of Compound C (EBL), 300 Å of Compound D doped with 10% of Emitter (EML), 50 Å of Compound E (BL), 300 Å of Compound G doped with 35% of Compound F (ETL), 10 Å of Compound G (EIL) followed by 1,000 Å of Al (Cath). All devices were encapsulated with a glass lid sealed with an epoxy resin in a nitrogen glove box (<1 ppm of $H_2O$ and $O_2$) immediately after fabrication with a moisture getter incorporated inside the package. Doping percentages are in volume percent.

Compound A

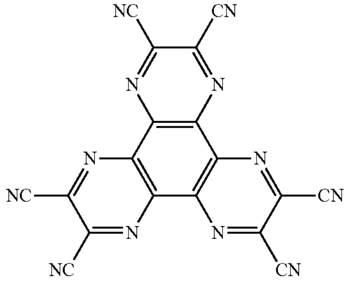

-continued

Compound B

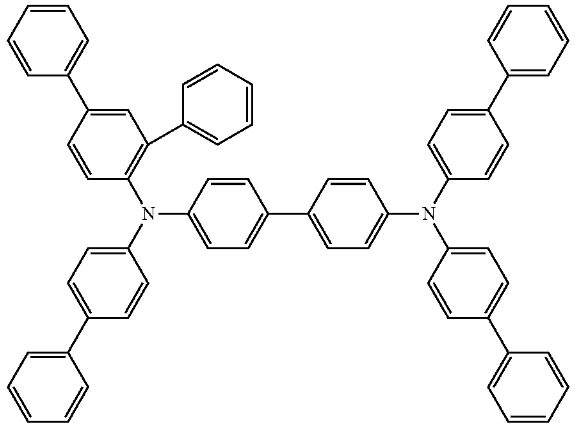

Compound C

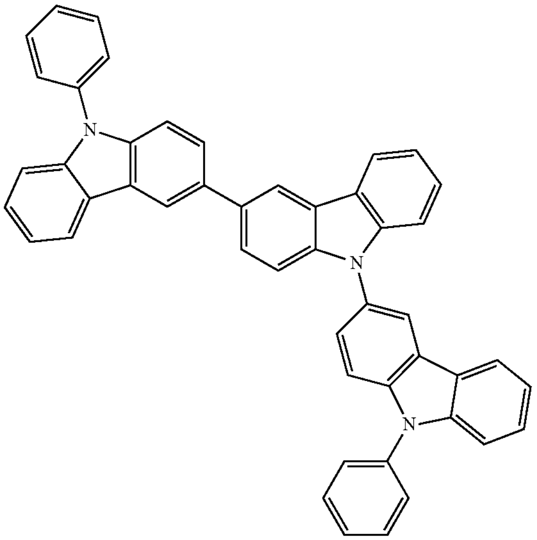

Compound D

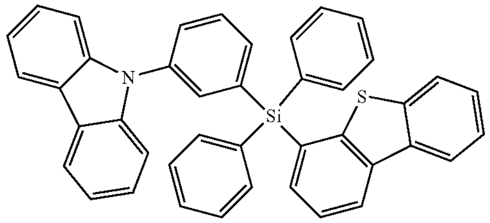

-continued

Compound E

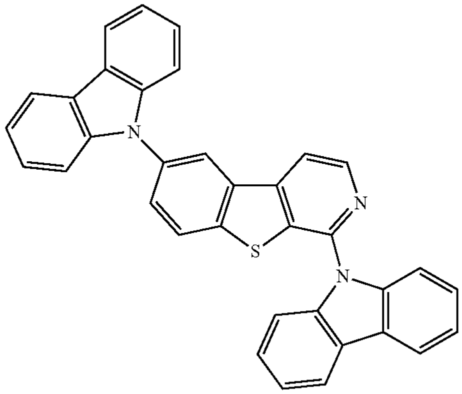

-continued

Compound F

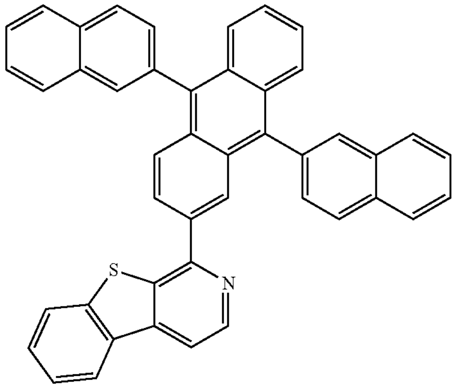

Compound G

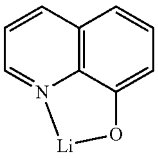

TABLE 2

| Device data | | | | | at 1,000 nit | | | |
|---|---|---|---|---|---|---|---|---|
| | 1931 CIE | | λ max | FWHM | Voltage | LE | EQE | PE |
| Device | x | y | [nm] | [nm] | [V] | [cd/A] | [%] | [lm/W] |
| Compound 60253535971 | 0.147 | 0.165 | 459 | 37 | 0.91 | 1.24 | 1.17 | 1.38 |
| Compound 59736162506 | 0.129 | 0.168 | 465 | 24 | 0.95 | 2.38 | 2.33 | 2.52 |
| Compound 59735728275 | 0.132 | 0.148 | 461 | 20 | 0.98 | 1.89 | 2.01 | 1.95 |
| Compound 62201598409 | 0.130 | 0.188 | 466 | 40 | 0.82 | 2.17 | 1.98 | 2.68 |
| Compound 59735140786 | 0.135 | 0.166 | 462 | 41 | 0.91 | 1.79 | 1.74 | 2.00 |
| Compound 59221752029 | 0.133 | 0.154 | 462 | 22 | 0.80 | 1.95 | 2.03 | 2.47 |
| Comparative Example | 0.137 | 0.160 | 461 | 40 | 1.00 | 1.00 | 1.00 | 1.00 |

Table 2 shows device data for the inventive compounds, Compound 60253535971, Compound 59736162506, Compound 59735728275, Compound 62201598409, Compound 59735140786, and Compound 59221752029, which are normalized to the Comparative one. All inventive compounds exhibit lower voltages as compared to the Comparative Example at 1000 nit. The EQE of the inventive compounds are much higher than that of Comparative Example, indicating the steric bulk is beneficial to preserve dopant's emission. Compound 59735728275 has a CIE-y of 0.148 which is comparable to that of commercial fluorescent blue.

We claim:

1. A compound comprising a structure of a formula selected from the group consisting of Formula V

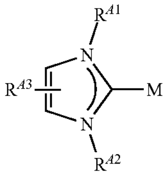

and

-continued

Formula VI

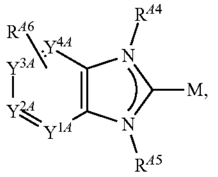

wherein,

M is selected from the group consisting of Os, Pd, Pt, Ir, Cu, and Au;

at least one of $R^{A1}$, $R^{A2}$, $R^{A4}$, $R^{A5}$, or $R^{A6}$ is a structure of Formula VII

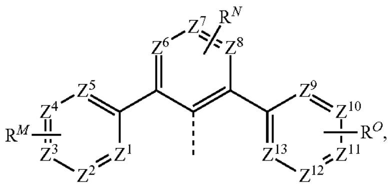

Formula VIII

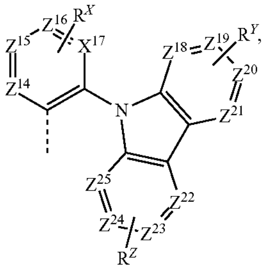

or

Formula IX

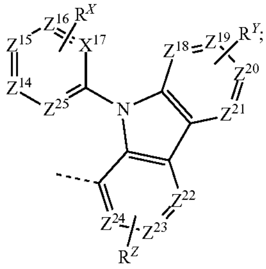

$Y^{1A}$ to $Y^{4A}$ are each independently C or N;

no more than two of $Y^{1A}$ to $Y^{4A}$ are N;

$Z^1$ to $Z^{25}$ are each independently C or N;

three consecutive $Z^1$ to $Z^{25}$ in the same ring cannot be N;

$R^{A3}$, $R^{A6}$, $R^M$, $R^N$, $R^O$, $R^X$, $R^Y$, and $R^Z$ each independently represent mono to the maximum allowable substitutions, or no substitution;

each $R^{A1}$, $R^{A2}$, $R^{A3}$, $R^{A4}$, $R^{A5}$, $R^{A6}$, $R^M$, $R^N$, $R^O$, $R^X$, $R^Y$, and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof;

M is coordinated to at least one monoanionic bidentate ligand;

any two substituents can be joined or fused to form a ring;

provided that when one of $R^{A1}$, $R^{A2}$, $R^{A4}$, $R^{A5}$, or $R^{A6}$ is a structure of Formula VIII, then at least one of $R^X$, $R^Y$, and $R^Z$ is selected from the group consisting of deuterium, alkyl, cycloalkyl, heteroalkyl, heterocycloalkyl, aryl, heteroaryl, and combinations thereof; and provided that when one of $R^{A1}$, $R^{A2}$, $R^{A4}$, or $R^{A5}$ is Formula VII, then at least one of $R^M$, $R^N$, and $R^O$ is selected from the group consisting of deuterium, alkyl, cycloalkyl, heteroalkyl, heterocycloalkyl, aryl, heteroaryl, and combinations thereof.

2. The compound of claim 1, wherein each $R^{A1}$, $R^{A2}$, $R^{A3}$, $R^{A4}$, $R^{A5}$, $R^{A6}$, $R^M$, $R^N$, $R^O$, $R^X$, $R^Y$, and $R^Z$ is independently a hydrogen or a substituent selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof.

3. The compound of claim 1, wherein $Z^1$ to $Z^{25}$ are each C.

4. The compound of claim 1, wherein at least one of $R^{A1}$, $R^{A2}$, $R^{A4}$, $R^{A5}$, or $R^{A6}$ is selected from the group consisting of:

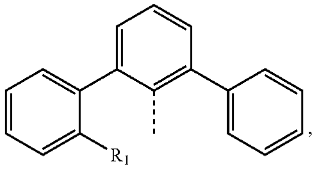

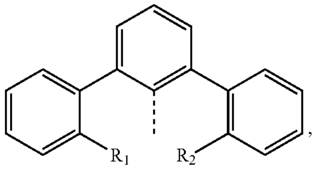

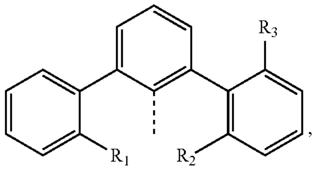

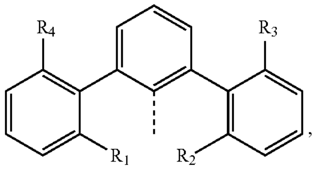

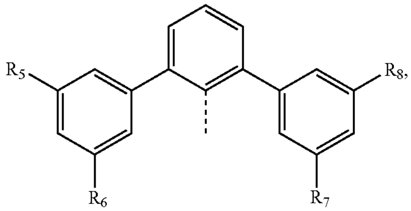

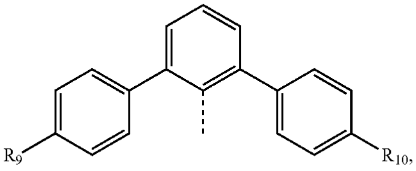

-continued

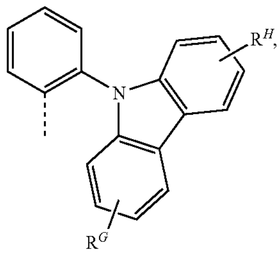

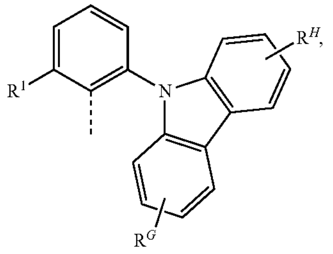

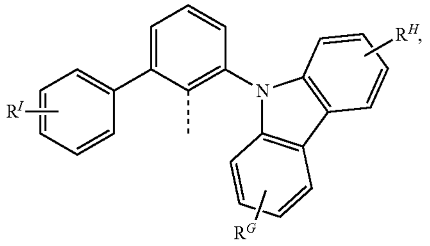

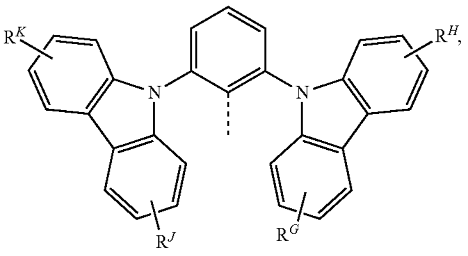

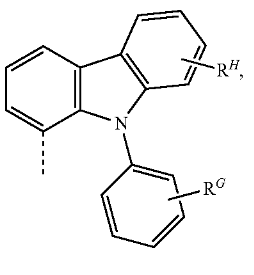

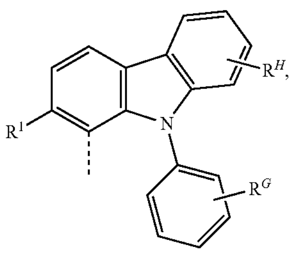

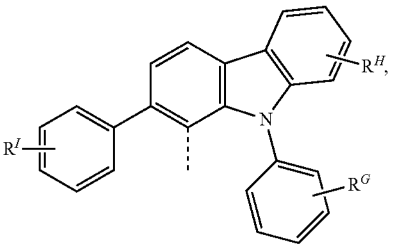

-continued

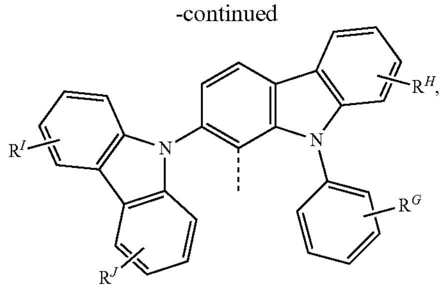

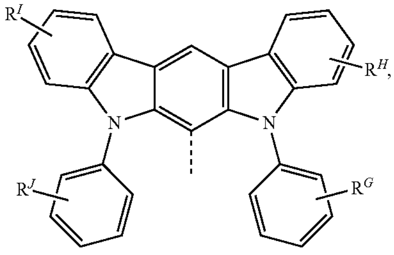

wherein:

$R^G$, $R^H$, $R^I$, and $R^J$ each independently represent mono to the maximum allowable substitutions, or no substitution;

each $R^1$, $R^2$, $R^3$, $R^4$, $R^5$, $R^6$, $R^7$, $R^8$, $R^9$, $R^{10}$, $R^G$, $R^H$, $R^I$, and $R^J$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof; and any two substituents can be joined or fused to form a ring.

5. The compound of claim 1, wherein M is Ir, Pt, or Pd and the compound comprises a ligand $L_A$ selected from the group consisting of Formula IX

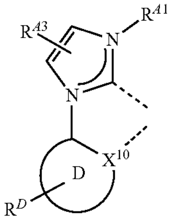

and

Formula X

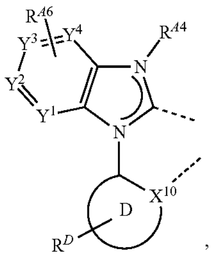

, wherein, ring D is a 5-membered or 6-membered carbocyclic or heterocyclic ring;

$X^{10}$ is C or N;

$R^D$ represents mono to the maximum number of allowable substitutions, or no substitution;

each $R^D$ is hydrogen or a substituent selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof; and any two substituents can be joined or fused to form a ring.

6. The compound of claim 5, wherein ring D is a 6-membered aromatic ring, and $X^{10}$ is C.

7. The compound of claim 5, wherein the ligand $L_A$ is selected from the group consisting of:

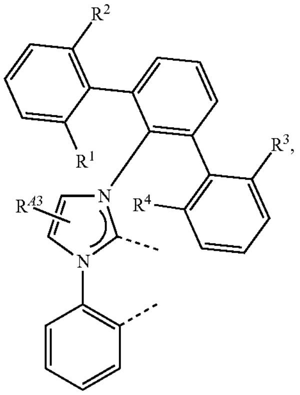

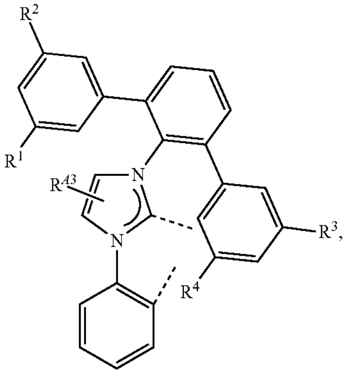

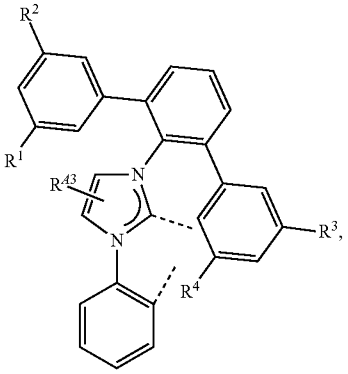

-continued

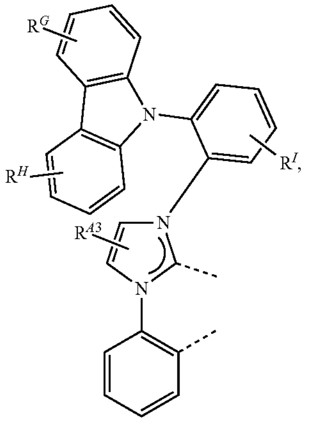

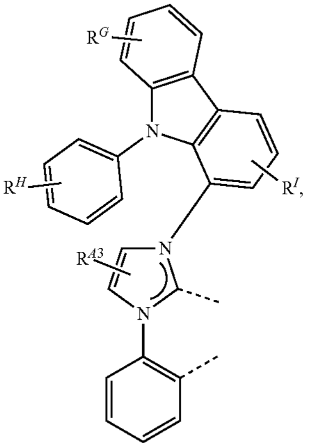

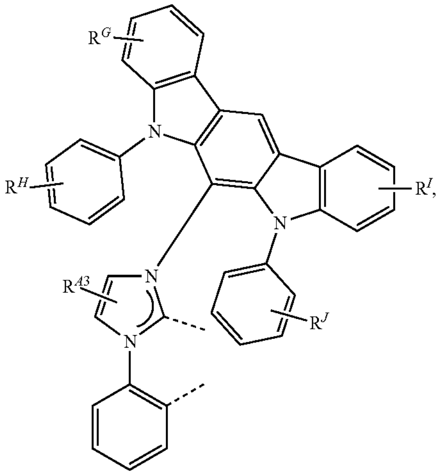

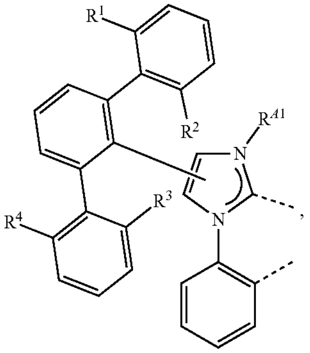

-continued
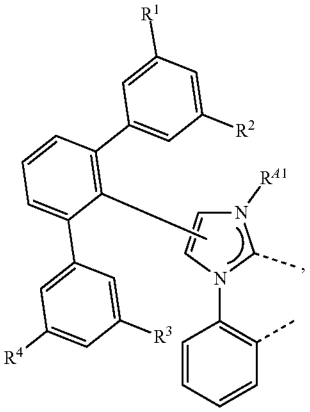
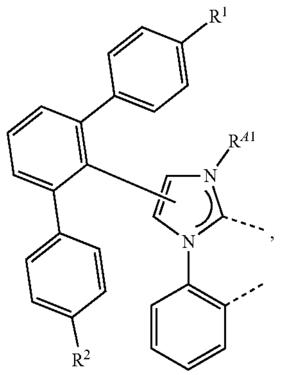
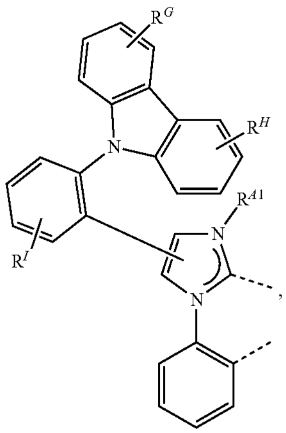
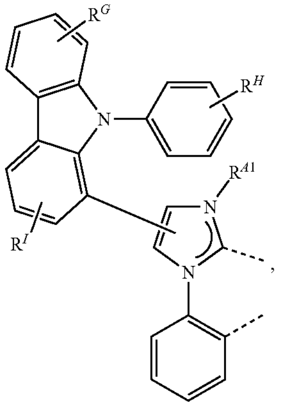
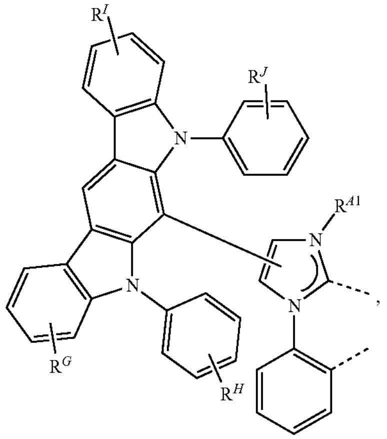
-continued
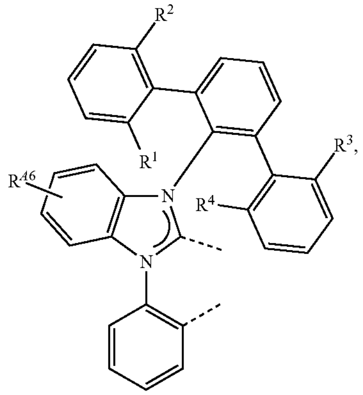
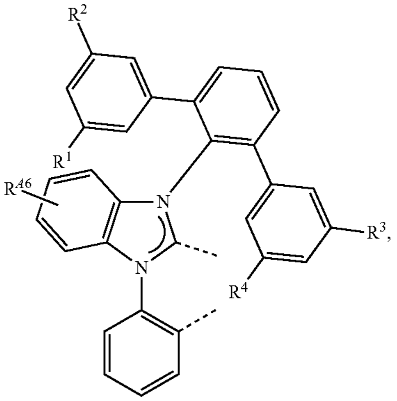
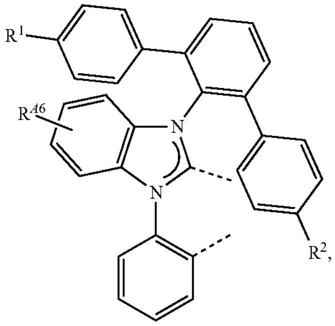
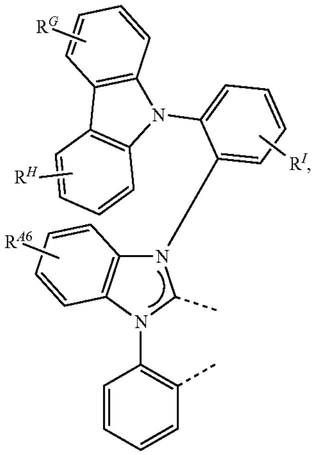

-continued
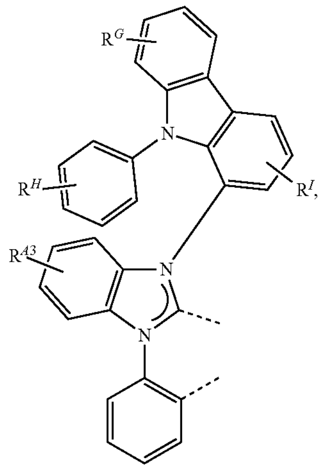
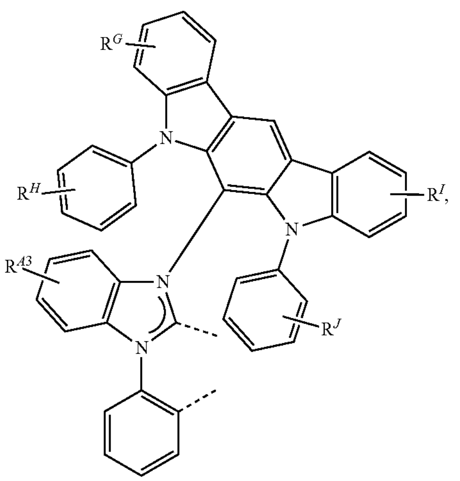
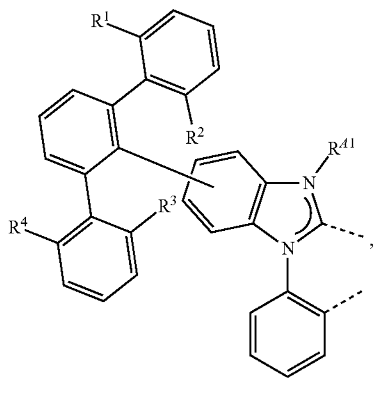
-continued
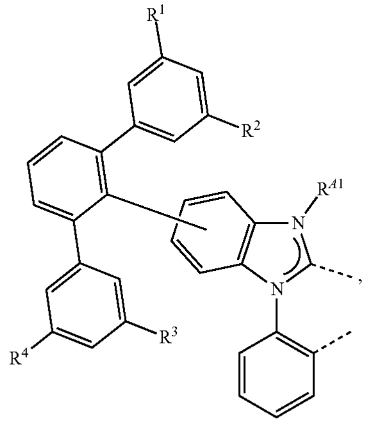
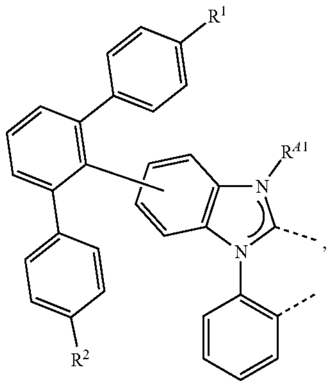
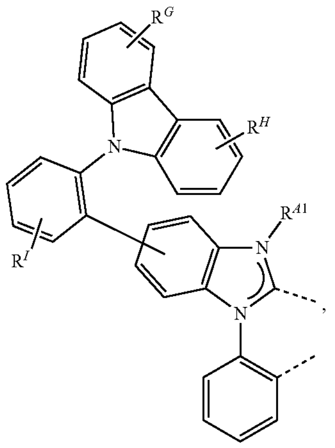
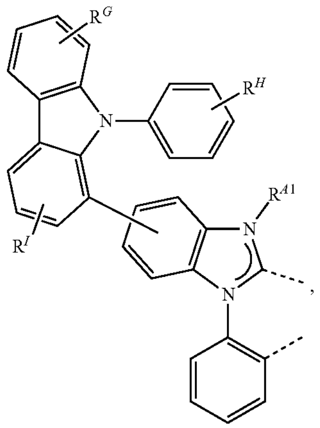

-continued

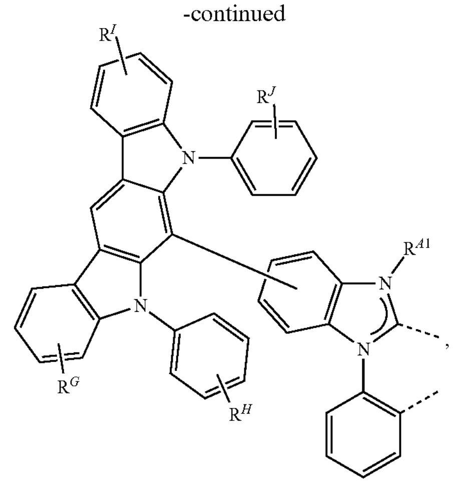

wherein:

$R^G$, $R^H$, $R^I$, and $R^J$ each independently represent mono to the maximum allowable substitutions, or no substitution;

each $R^1$, $R^2$, $R^3$, $R^4$, $R^G$, $R^H$, $R^I$ and $R^J$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof; and any two substituents can be joined or fused to form a ring.

8. The compound of claim 1, wherein the compound is selected from the group consisting of Formula XI

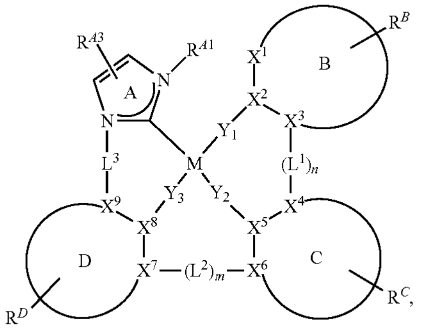

and

Formula XI

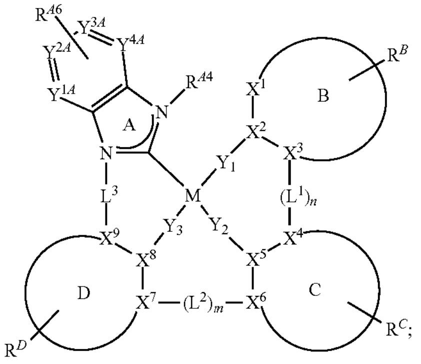

wherein,

M is Pd or Pt;

rings B, C, and D are each independently a 5-membered or 6-membered carbocyclic or heterocyclic ring;

$X^1$ to $X^9$ are each independently C or N;

$Y_1$ to $Y_3$ are each independently selected from the group consisting of a direct bond, O, and S;

at least one of $Y_1$ to $Y_3$ is a direct bond;

$Y^{1A}$ to $Y^{4A}$ are each independently C or N;

$L^1$ to $L^3$ are each independently selected from the group consisting of a direct bond, O, S, CR'R'', SiR'R'', BR', and NR', alkyl, cycloalkyl, heteroalkyl, heterocycloalkyl, aryl, and heteroaryl;

m and n are each independently 0 or 1;

at least one of m and n is 1;

$R^A$, $R^B$, $R^C$, $R^D$, $R^E$, and $R^F$ each independently represents mono the maximum allowable substitution, or no substitution;

each R, R', R'', $R^A$, $R^B$, $R^C$, $R^D$, $R^E$, and $R^F$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof;

any adjacent substituents can be joined or fused into a ring; and

R and an $R^B$ substituent can be joined to form a ring.

9. The compound of claim 8, wherein rings B, C, and D are each 6-membered aromatic rings.

10. The compound of claim 8, wherein $L^2$ is O, NR', or CRR'.

11. The compound of claim 8, wherein $L^1$ is a direct bond or NR'.

12. The compound of claim 8, wherein $L^3$ is a direct bond, and $Y_1$, $Y_2$, and $Y_3$ are each direct bonds.

13. The compound of claim 8, wherein m+n is 2.

14. The compound of claim 8, wherein the compound is selected from the group consisting of:

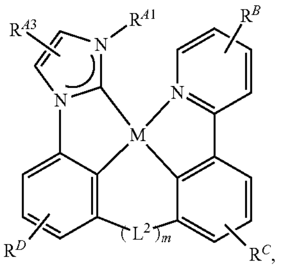

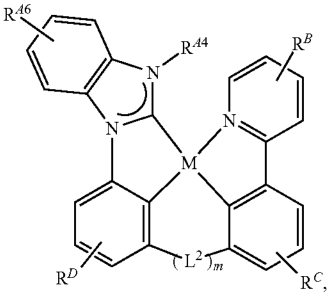

-continued
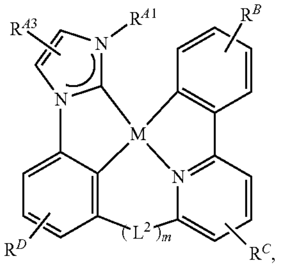
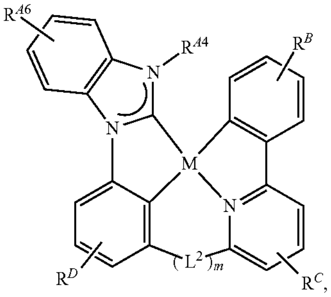
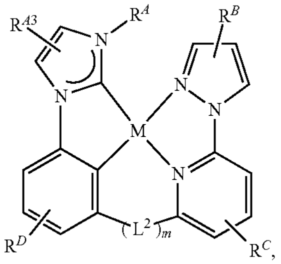
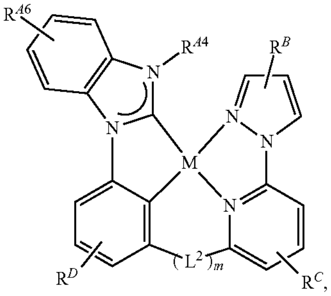
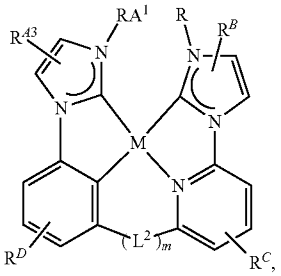
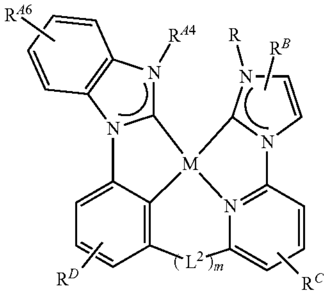
-continued
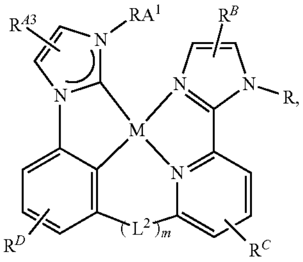
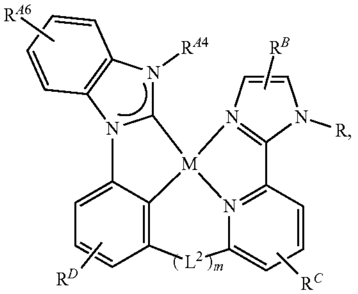
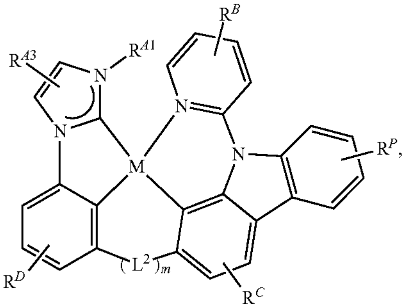
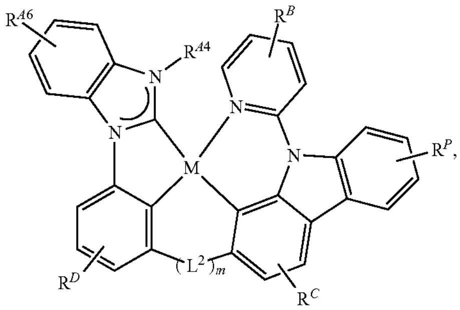
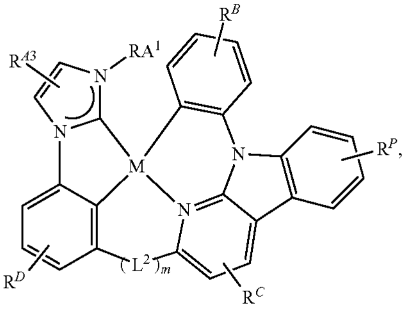

-continued

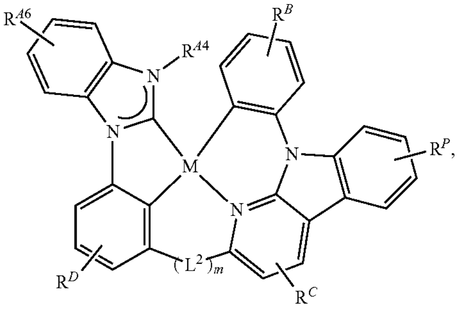

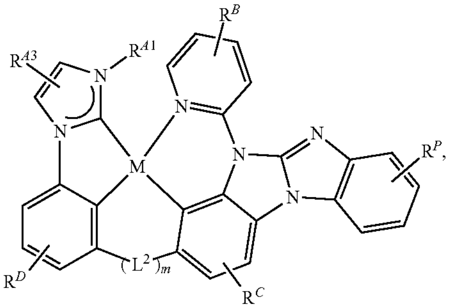

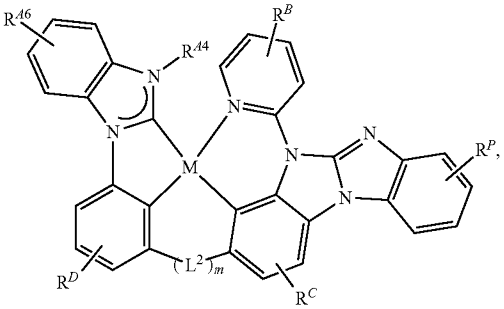

-continued

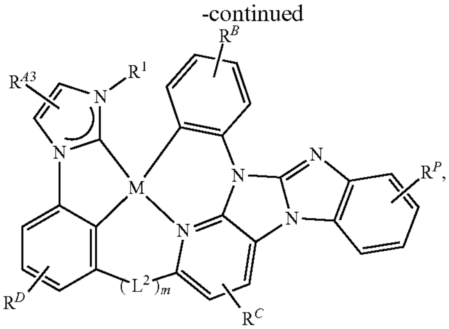

and

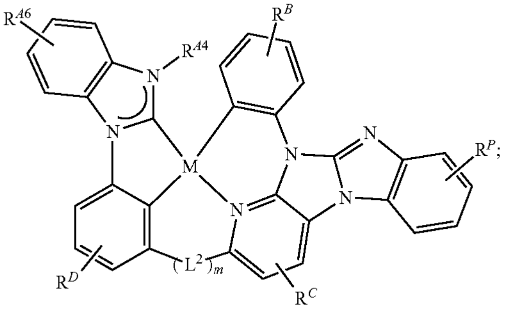

wherein R is selected from the group consisting of alkyl, cycloalkyl, heteroalkyl, heterocycloalkyl, aryl, heteroaryl, and combinations thereof;

wherein R has the same definition as $R^B$ and $R^C$; and wherein any two substituents may be joined or fused together to form a ring.

15. The compound of claim 8, the compound is selected from the group consisting of Compound y having the formula $Pt(L_{Cm})(L_{Dn})$, wherein y is an integer defined by y=25543(m−1)+n, wherein m is an integer as defined below and n is an integer from 1 to 25543, wherein $L_{Cm}$ has the following structures:

| $L_{Cm}$ | Structure of $L_{Cm}$ | $Ar^1$, R | m |
|---|---|---|---|
| wherein $L_{C1}$ to $L_{C110405}$ have the structure | 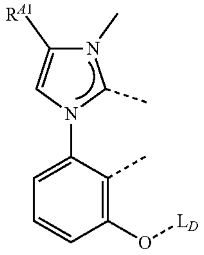 | wherein $R^{A1}$ = Rj, wherein j is an integer from 1 to 40401 or 40403 to 110405, and | m = j |
| wherein $L_{C110406}$-$L_{C220810}$ have the structure | 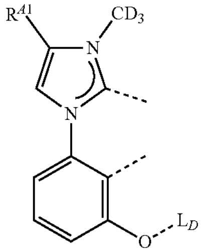 | wherein $R^{A1}$ = Rj, wherein j is an integer from 1 to 40401 or 40403 to 110405, and | m = j + 110405 |

-continued

| $L_{Cm}$ | Structure of $L_{Cm}$ | $Ar^1$, R | m |
| --- | --- | --- | --- |
| wherein $L_{C220811}$-$L_{C331215}$ have the structure | 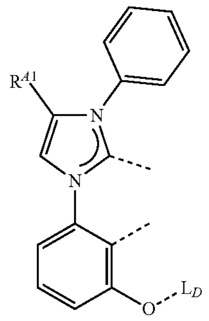 | wherein $R^{A1}$ = Rj, wherein j is an integer from 1 to 40401 or 40403 to 110405, and | m = j + 220810 |
| wherein $L_{C331216}$-$L_{C441620}$ have the structure | 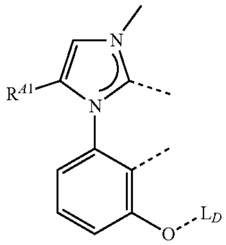 | wherein $R^{A1}$ = Rj, wherein j is an integer from 1 to 40401 or 40403 to 110405, and | m = j + 331215 |
| wherein $L_{C441621}$-$L_{C552025}$ have the structure | 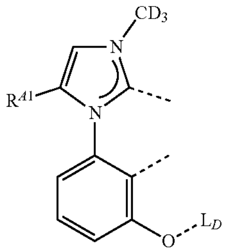 | wherein $R^{A1}$ = Rj, wherein j is an integer from 1 to 40401 or 40403 to 110405, and | m = j + 441620 |
| wherein $L_{C552026}$-$L_{C662430}$ have the structure | 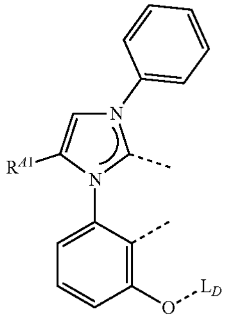 | wherein $R^{A1}$ = Rj, wherein j is an integer from 1 to 40401 or 40403 to 110405, and | m = j + 552025 |
| wherein $L_{C662431}$-$L_{C772835}$ have the structure | 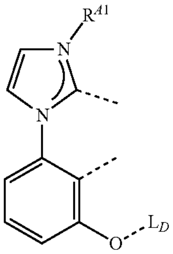 | wherein $R^{A1}$ = Rj, wherein j is an integer from 1 to 40401 or 40403 to 110405, and | m = j + 662430 |

-continued

| $L_{Cm}$ | Structure of $L_{Cm}$ | $Ar^1$, R | m |
|---|---|---|---|
| wherein $L_{C772836}$-$L_{C883240}$ have the structure | 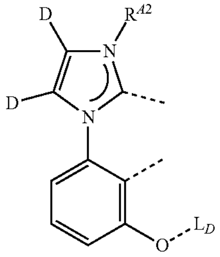 | wherein $R^{A1}$ = Rj, wherein j is an integer from 1 to 40401 or 40403 to 110405, and | m = j + 772835 |
| wherein $L_{C883241}$-$L_{C993645}$ have the structure | 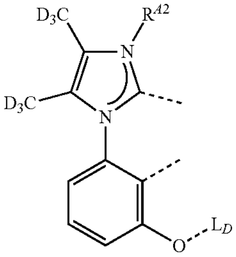 | wherein $R^{A1}$ = Rj, wherein j is an integer from 1 to 40401 or 40403 to 110405, and | m = j + 883240 |
| wherein $L_{C993646}$-$L_{C1104050}$ have the structure | 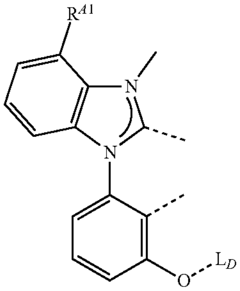 | wherein $R^{A1}$ = Rj, wherein j is an integer from 1 to 40401 or 40403 to 110405, and | m = j + 993645 |
| wherein $L_{C1104051}$-$L_{C1214455}$ have the structure | 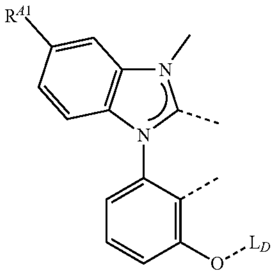 | wherein $R^{A1}$ = Rj, wherein j is an integer from 1 to 40401 or 40403 to 110405, and | m = j + 1104050 |
| wherein $L_{C1214456}$-$L_{C1324860}$ have the structure | 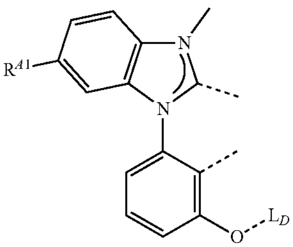 | wherein $R^{A1}$ = Rj, wherein j is an integer from 1 to 40401 or 40403 to 110405, and | m = j + 1214455 |

-continued

| $L_{Cm}$ | Structure of $L_{Cm}$ | $Ar^1$, R | m |
|---|---|---|---|
| wherein $L_{C1324861}$-$L_{C1435265}$ have the structure | 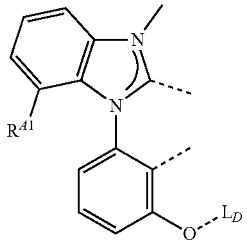 | wherein $R^{A1}$ = Rj, wherein j is an integer from 1 to 40401 or 40403 to 110405, and | m = j + 1324860 |
| wherein $L_{C1435266}$-$L_{C1545670}$ have the structure | 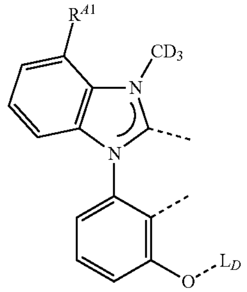 | wherein $R^{A1}$ = Rj, wherein j is an integer from 1 to 40401 or 40403 to 110405, and | m = j + 1435265 |
| wherein $L_{C1545671}$-$L_{C1656075}$ have the structure | 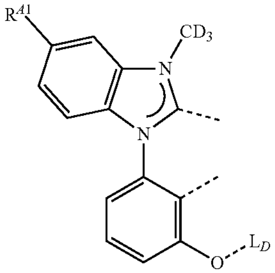 | wherein $R^{A1}$ = Rj, wherein j is an integer from 1 to 40401 or 40403 to 110405, and | m = j + 1545670 |
| wherein $L_{C1656076}$-$L_{C1766480}$ have the structure | 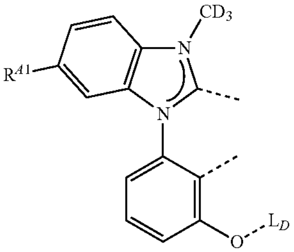 | wherein $R^{A1}$ = Rj, wherein j is an integer from 1 to 40401 or 40403 to 110405, and | m = j + 1656075 |
| wherein $L_{C1766481}$-$L_{C1876885}$ have the structure | 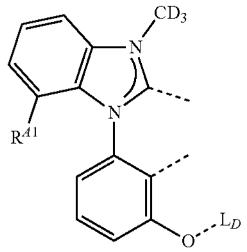 | wherein $R^{A1}$ = Rj, wherein j is an integer from 1 to 40401 or 40403 to 110405, and | m = j + 1766480 |

-continued

| $L_{Cm}$ | Structure of $L_{Cm}$ | $Ar^1$, R | m |
|---|---|---|---|
| wherein $L_{C1876886}$-$L_{C1987290}$ have the structure | 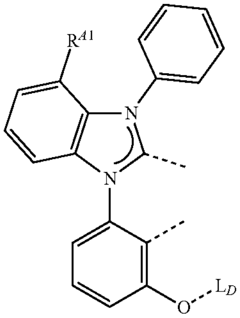 | wherein $R^{A1}$ = Rj, wherein j is an integer from 1 to 40401 or 40403 to 110405, and | m = j + 1876885 |
| wherein $L_{C1987291}$-$L_{2097695}$ have the structure | 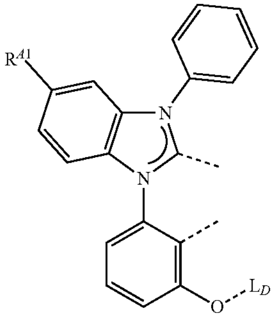 | wherein $R^{A1}$ = Rj, wherein j is an integer from 1 to 40401 or 40403 to 110405, and | m = j + 1987290 |
| wherein $L_{C2097696}$-$L_{C2208100}$ have the structure | 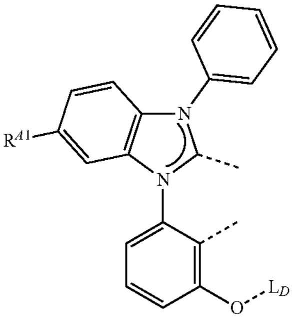 | wherein $R^{A1}$ = Rj, wherein j is an integer from 1 to 40401 or 40403 to 110405, and | m = j + 2097695 |
| wherein $L_{C2208101}$-$L_{C2318505}$ have the structure | 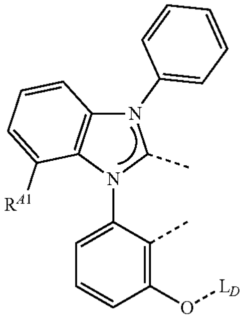 | wherein $R^{A1}$ = Rj, wherein j is an integer from 1 to 40401 or 40403 to 110405, and | m = j + 2208100 |
| wherein $L_{C2318506}$-$L_{C2428910}$ have the structure | 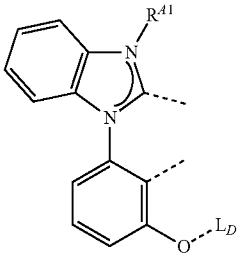 | wherein $R^{A1}$ = Rj, wherein j is an integer from 1 to 40401 or 40403 to 110405, and | m = j + 2318505 |

-continued

| $L_{Cm}$ | Structure of $L_{Cm}$ | $Ar^1$, R | m |
|---|---|---|---|
| wherein $L_{C2428911}$-$L_{C2438910}$ have the structure | 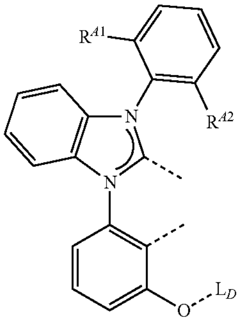 | wherein $R^{A1}$ = Bj, $R^{A2}$ = Bk, wherein j and k is an integer from 47 to 100, where at least one of j or k is an integer from 48-58, 60, or 62-100, and | m = 100(j − 1) + k + 2428910 |
| wherein $L_{C2438911}$-$L_{C3438910}$ have the structure | 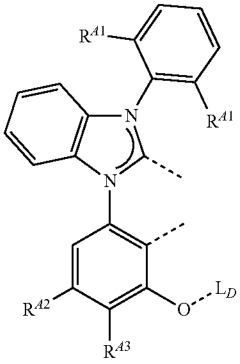 | wherein $R^{A1}$ = Bj, $R^{A2}$ = Bk, $R^{A3}$ = Bl, wherein j is an integer from 48-58. 60, or 62-100, and k and l are independently an integer from 1 to 100, and | m = 10000(j − 1) + 100(k − 1) + l + 2438910 |
| wherein $L_{C3438911}$-$L_{C3448910}$ have the structure | 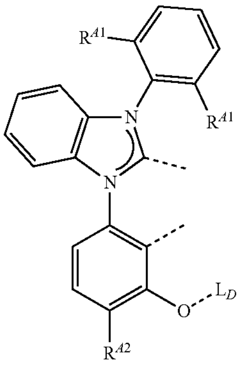 | wherein $R^{A1}$ = Bj, $R^{A2}$ = Bk, wherein j is an integer from 48-58, 60, or 62-100, and k is an integer from 1 to 100, and | m = 100(j − 1) + k + 3438910 |
| wherein $L_{C3448911}$-$L_{C3458910}$ have the structure | 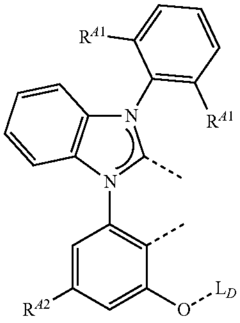 | wherein $R^{A1}$ = Bj, $R^{A2}$ = Bk, wherein j is an integer from 48-58. 60, or 62-100, and k is an integer from 1 to 100, and | m = 100(j − 1) + k + 3448910 |

-continued

| $L_{Cm}$ | Structure of $L_{Cm}$ | $Ar^1$, R | m |
|---|---|---|---|
| wherein $L_{C3458911}$-$L_{C4458910}$ have the structure | 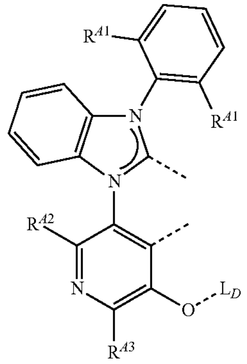 | wherein $R^{A1}$ = Bj, $R^{A2}$ = Bk, $R^{A3}$ = Bl, wherein j is an integer from 48-58, 60, or 62-100, and k and l are independently an integer from 1 to 100, and | m = 10000(j − 1) + 100(k − 1) + l + 3458910 |

wherein R1 to R110405 have the following structures:

| Rj | Structure of Rm | $R^{S1}$, $R^{S2}$, $R^{S3}$ | j |
|---|---|---|---|
| wherein R1-R100 have the structure | 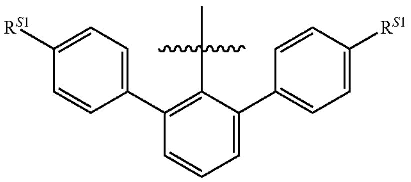 | wherein $R^{S1}$ = Bt, wherein t is an integer from 1 to 100, and | j = t |
| wherein R101-R10100 have the structure | 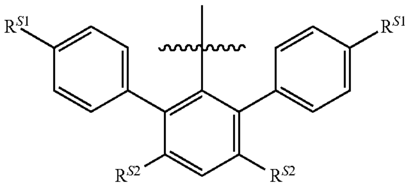 | wherein $R^{S1}$ = Bt, $R^{S2}$ = Bu wherein t and u are an integer from 1 to 100, and | j = 100(t − 1) + u + 100 |
| wherein R10101-R20100 have the structure | 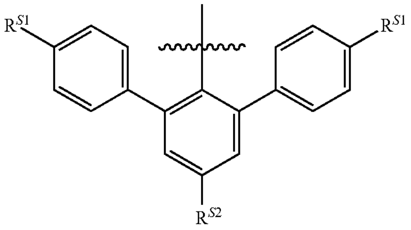 | wherein $R^{S1}$ = Bt, $R^{S2}$ = Bu wherein t and u are an integer from 1 to 100, and | j = 100(t − 1) + u + 10100 |
| wherein R20101-R20200 have the structure | 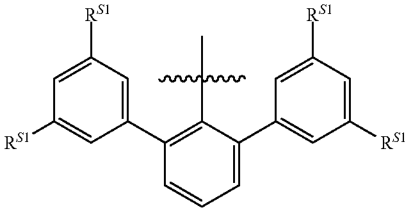 | wherein $R^{S1}$ = Bt, wherein t is an integer from 1 to 100, and | j = t + 20100 |
| wherein R20201-R30200 have the structure | 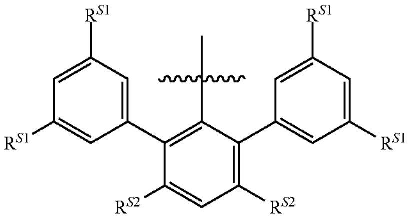 | wherein $R^{S1}$ = Bt, $R^{S2}$ = Bu wherein t and u are an integer from 1 to 100, and | j = 100(t − 1) + u + 20100 |

-continued

| Rj | Structure of Rm | $R^{S1}$, $R^{S2}$, $R^{S3}$ | j |
|---|---|---|---|
| wherein R30201-R40200 have the structure | 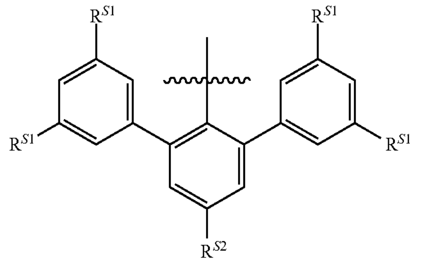 | wherein $R^{S1}$ = Bt, $R^{S2}$ = Bu wherein t and u are an integer from 1 to 100, and | j = 100(t − 1) + u + 30200 |
| wherein R40201 have the structure | 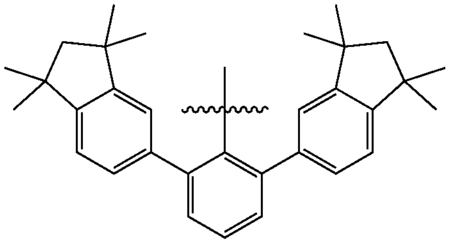 | | j = 40201 |
| wherein R40202-R40301 have the structure | 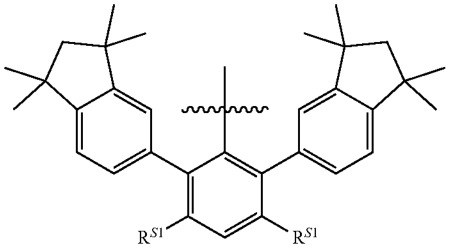 | wherein $R^{S1}$ = Bt, wherein t is an integer from 1 to 100, and | j = t + 40201 |
| wherein R40302-R40401 have the structure | 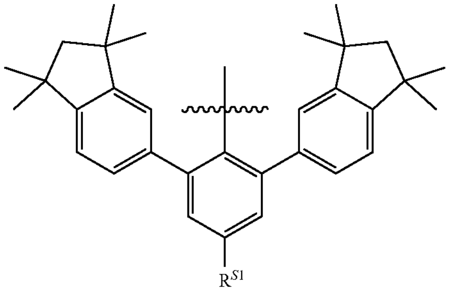 | wherein $R^{S1}$ = Bt, wherein t is an integer from 1 to 100, and | j = t + 40301 |
| wherein R40402 have the structure | 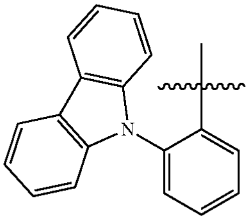 [SMILES: *c1ccccc1-n1c2ccccc2c2ccccc21] | | j = 40402 |
| wherein R40403-R40502 have the structure | 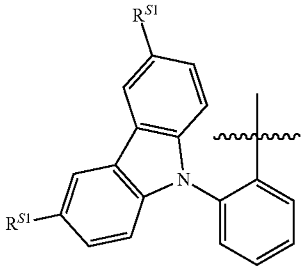 | wherein $R^{S1}$ = Bt, wherein t is an integer from 1 to 100, and | j = t + 40402 |

-continued

| Rj | Structure of Rm | $R^{S1}$, $R^{S2}$, $R^{S3}$ | j |
|---|---|---|---|
| wherein R40503-R40602 have the structure | 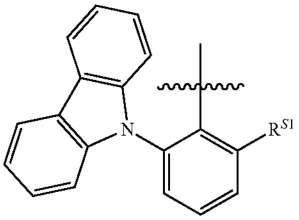 | wherein $R^{S1}$ = Bt, wherein t is an integer from 1 to 100, and | j = t + 40502 |
| wherein R40603-R50602 have the structure | 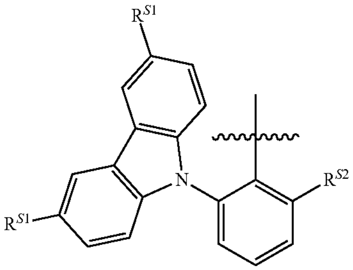 | wherein $R^{S1}$ = Bt, $R^{S2}$ = Bu wherein t and u are an integer from 1 to 100, and | j = 100(t − 1) + u + 40602 |
| wherein R50603 have the structure | 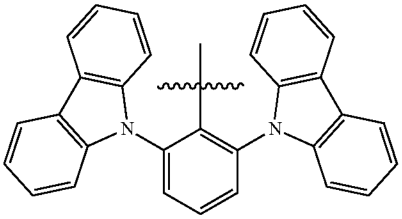 [SMILES: *c1c(-n2c3ccccc3c3ccccc32)cccc1-n1c2ccccc2c2ccccc21] | | j = 50603 |
| wherein R50604-R50703 have the structure | 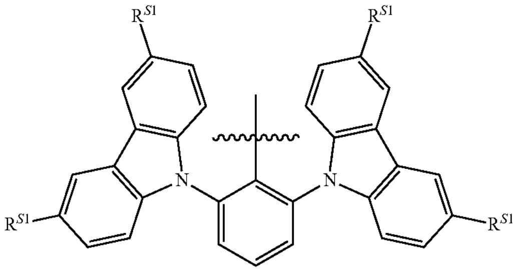 | wherein $R^{S1}$ = Bt, wherein t is an integer from 1 to 100, and | j = t + 50603 |
| wherein R50704 have the structure | 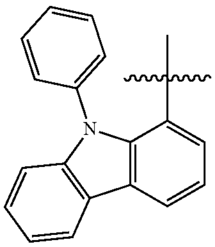 [SMILES: *c1cccc2c3ccccc3n(-c3ccccc3)c12] | | j = 50704 |
| wherein R50705-R50804 have the structure | 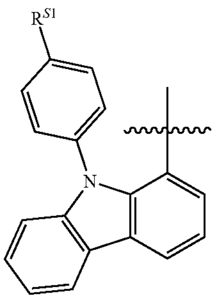 | wherein $R^{S1}$ = Bt, wherein t is an integer from 1 to 100, and | j = t + 50704 |

-continued

| Rj | Structure of Rm | $R^{S1}$, $R^{S2}$, $R^{S3}$ | j |
|---|---|---|---|
| wherein R50805-R50904 have the structure | 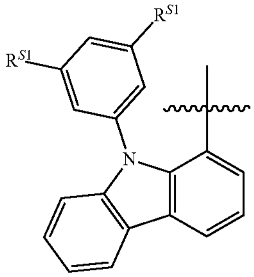 | wherein $R^{S1}$ = Bt, wherein t is an integer from 1 to 100, and | j = t + 50804 |
| wherein R50905-R51004 have the structure | 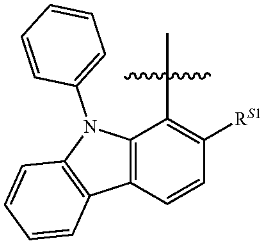 | wherein $R^{S1}$ = Bt, wherein t is an integer from 1 to 100, and | s = t + 50904 |
| wherein R51005-R61004 have the structure | 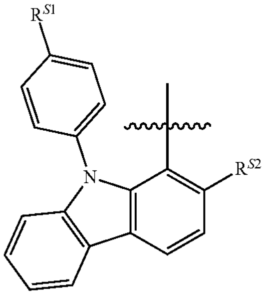 | wherein $R^{S1}$ = Bt, $R^{S2}$ = Bu wherein t and u are an integer from 1 to 100, and | j = 30(t − 1) + u + 51004 |
| wherein R61005-R71004 have the structure | 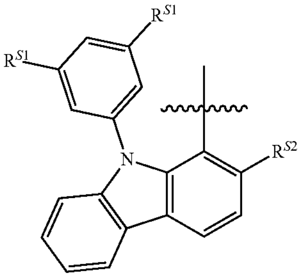 | wherein $R^{S1}$ = Bt, $R^{S2}$ = Bu wherein t and u are an integer from 1 to 100, and | j = 30(t − 1) + u + 61004 |
| wherein R71005 have the structure | 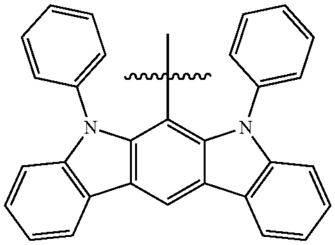 [SMILES: *c1c2c(cc3c4ccccc4n(-c4ccccc4)c13)c1ccccc1n2-c1ccccc1] | | j = 71005 |

-continued

| Rj | Structure of Rm | $R^{S1}$, $R^{S2}$, $R^{S3}$ | j |
|---|---|---|---|
| wherein R71006-R71105 have the structure | 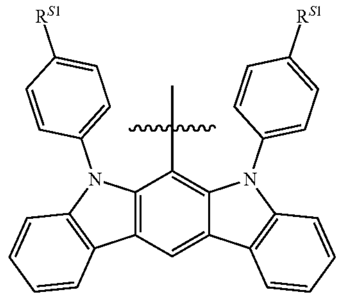 | wherein $R^{S1}$ = Bt, wherein t is an integer from 1 to 100, and | j = t + 71105 |
| wherein R71106-R71205 have the structure | 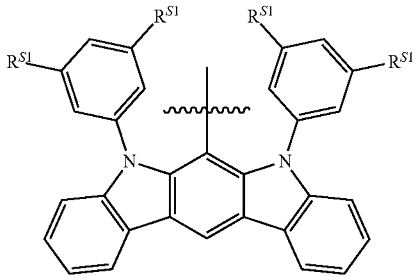 | wherein $R^{S1}$ = Bt, wherein t is an integer from 1 to 100, and | j = t + 71105 |
| wherein R71206-R71305 have the structure | 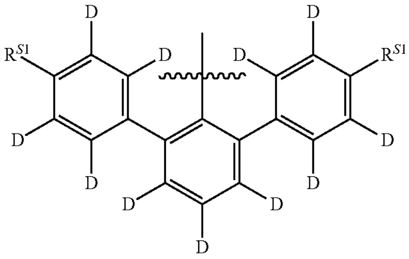 | wherein $R^{S1}$ = Bt, wherein t is an integer from 1 to 100, and | j = t + 71205 |
| wherein R71306-R81305 have the structure | 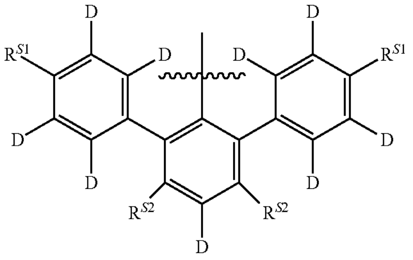 | wherein $R^{S1}$ = Bt, $R^{S2}$ = Bu wherein t and u are an integer from 1 to 100, and | j = 100(t − 1) + u + 71305 |
| wherein R81306-R91305 have the structure | 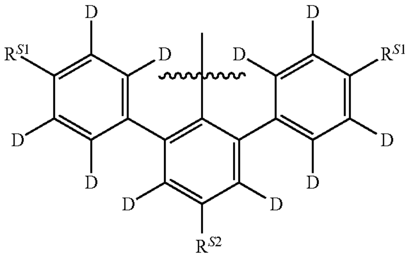 | wherein $R^{S1}$ = Bt, $R^{S2}$ = Bu wherein t and u are an integer from 1 to 100, and | j = 100(t − 1) + u + 81305 |

-continued

| Rj | Structure of Rm | $R^{S1}$, $R^{S2}$, $R^{S3}$ | j |
| --- | --- | --- | --- |
| wherein R91306-R91405 have the structure | 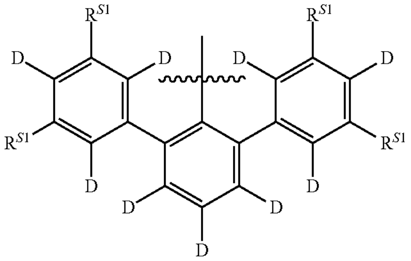 | wherein $R^{S1}$ = Bt, wherein t is an integer from 1 to 100, and | j = t + 91305 |
| wherein R91406-R101405 have the structure | 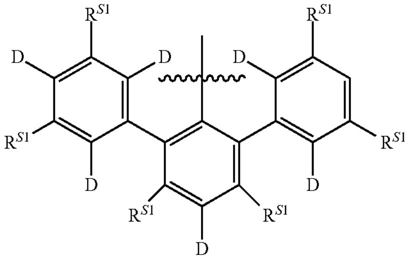 | wherein $R^{S1}$ = Bt, $R^{S2}$ = Bu wherein t and u are an integer from 1 to 100, and | j = 100(t − 1) + u + 91405 |
| wherein R101406-R110405 have the structure | 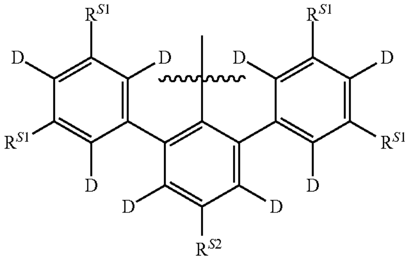 | wherein $R^{S1}$ = Bt, $R^{S2}$ = Bu wherein t and u are an integer from 1 to 100, and | j = 100(t − 1) + u + 101405 |

wherein B1 to B100 have the following structures:

B1

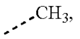

B2

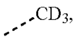

B3

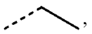

B4

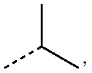

B5

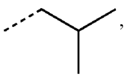

B6

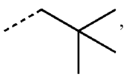

B7

B8

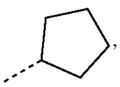

-continued

B9

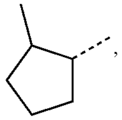

B10

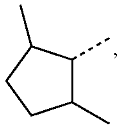

B11

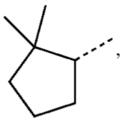

B12

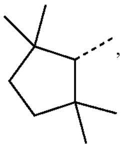

B13

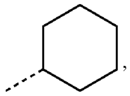

415
-continued
B14
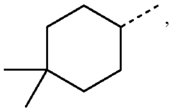
B15
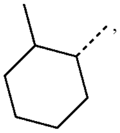
B16
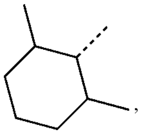
B17
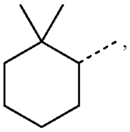
B18
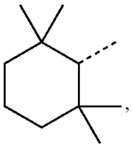
B19
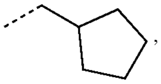
B20
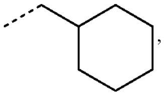
B21
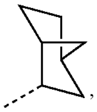
B22
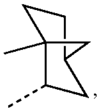
B23
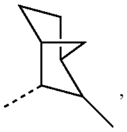
B24
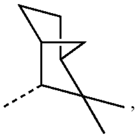
B25
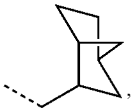
416
-continued
B26
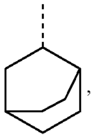
B27
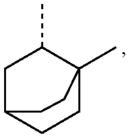
B28
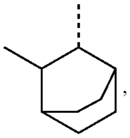
B29
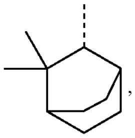
B30
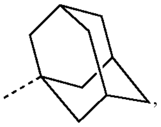
B31
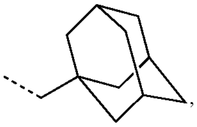
B32
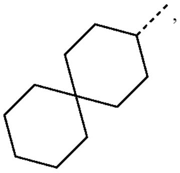
B33
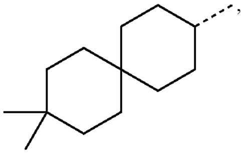
B34
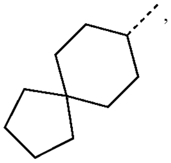
B35
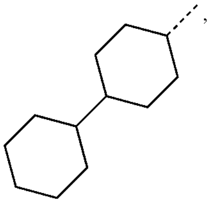

-continued
B36
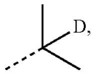
B37
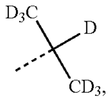
B38
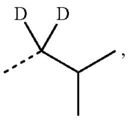
B39
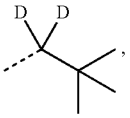
B40
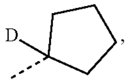
B41
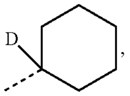
B42
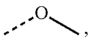
B43
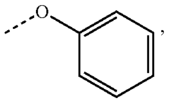
B44
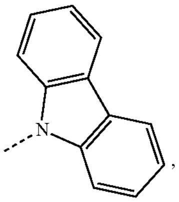
B45
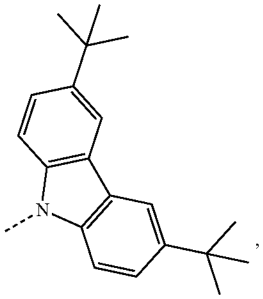
B46
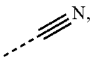
B47
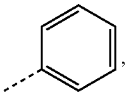
-continued
B48
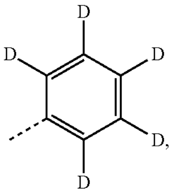
B49
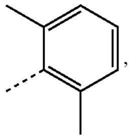
B50
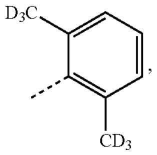
B51
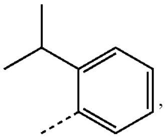
B52
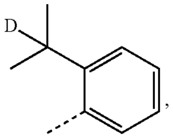
B53
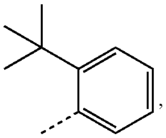
B54
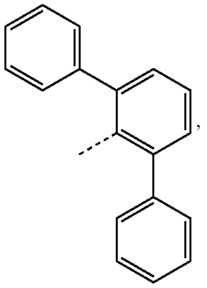

-continued
B55
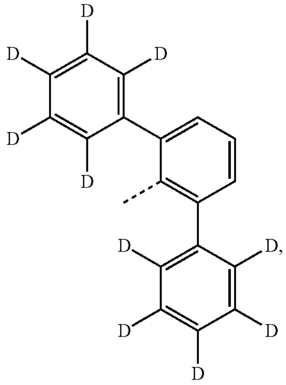
B56
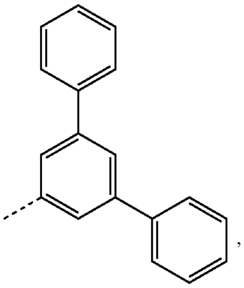
B57
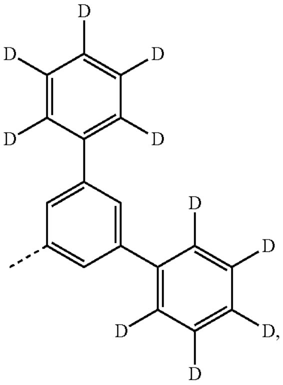
B58
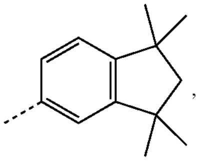
B59
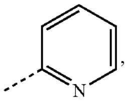
B60
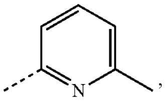
B61
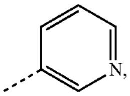
-continued
B62
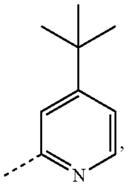
B63
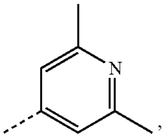
B64
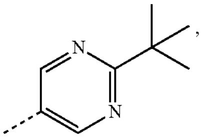
B65
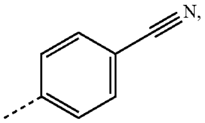
B66
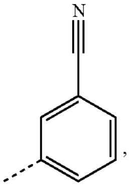
B67
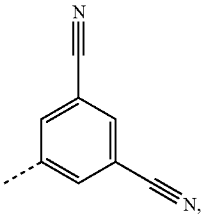
B68
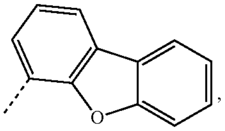
B69
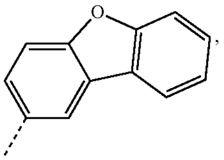
B70
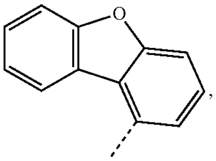

-continued
B71
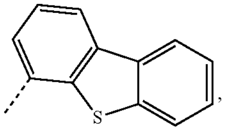
B72
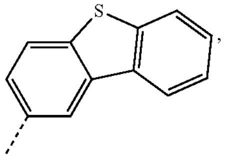
B73
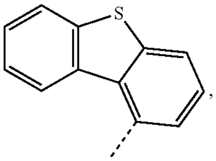
B74
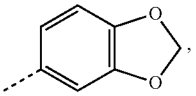
B75
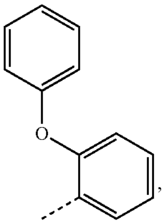
B76
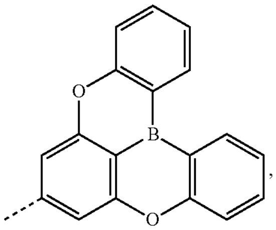
B77
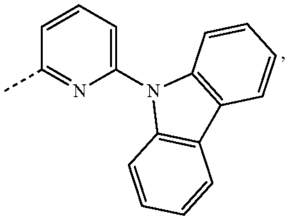
-continued
B78
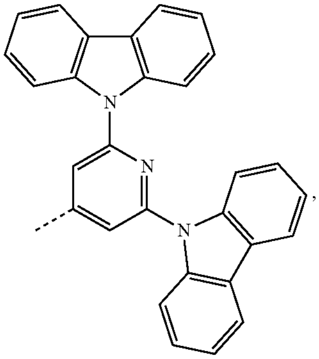
B79
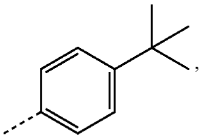
B80
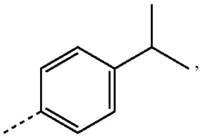
B81
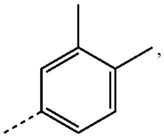
B82
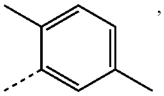
B83
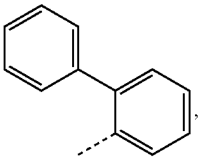
B84
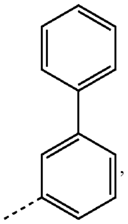
B85
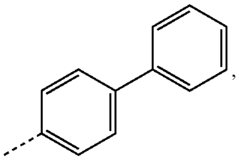

-continued
B86
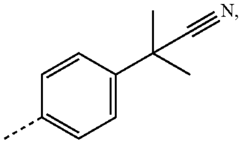
B87
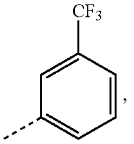
B88
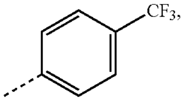
B89
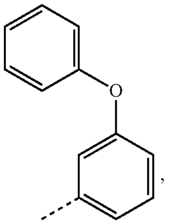
B90
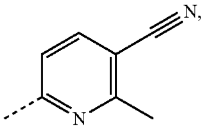
B91
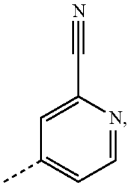
B92
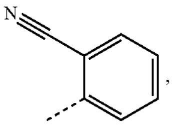
B93
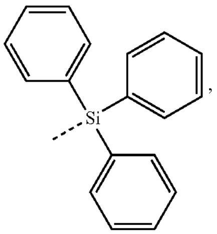
B94
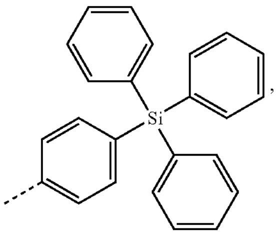
-continued
B95
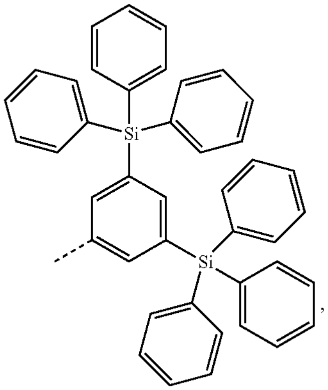
B96
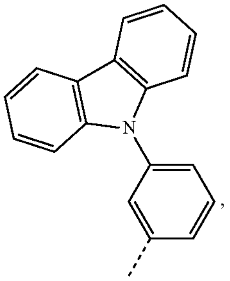
B97
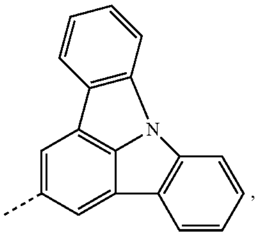
B98
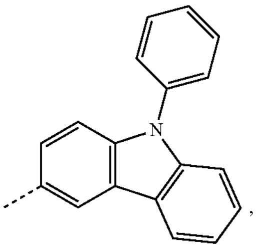
B99
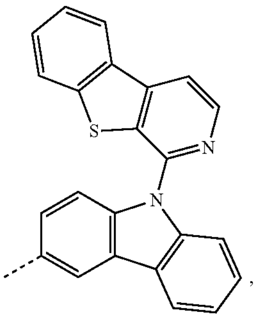
and -continued

B100

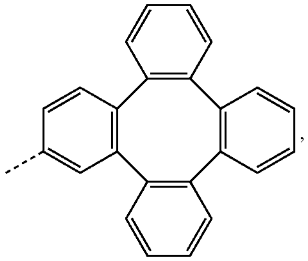

wherein $L_{Dn}$ has the following structures:

| $L_{Dn}$ | $L_{Dn}$ structure | $Ar^2$, $Ar^3$, $R^2$ | n |
|---|---|---|---|
| wherein $L_{D1}$-$L_{D30}$ have the structure | 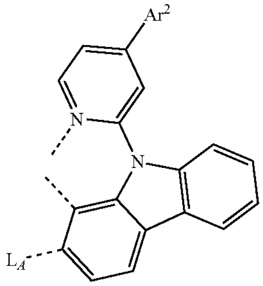 | wherein $Ar^2$ = Aj, wherein j is an integer from 1 to 30, and | n = j |
| wherein $L_{D31}$ has the structure | 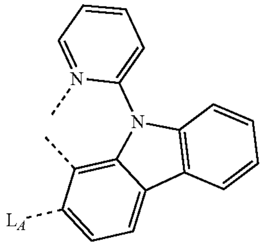 | | n = 31 |
| wherein $L_{D32}$-$L_{D931}$ have the structure | 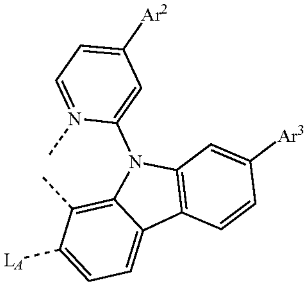 | wherein $Ar^2$ = Aj and $Ar^3$ = Am, wherein j is an integer from 1 to 30 and m is an integer from 1 to 30, and | n = 30(j − 1) + m + 31 |
| wherein $L_{D932}$-$L_{D961}$ have the structure | 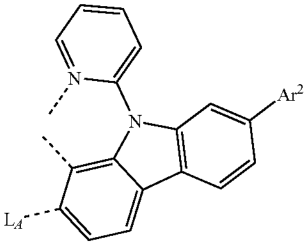 | wherein $Ar^2$ = Aj, wherein j is an integer from 1 to 30, and | n = j + 931 |

-continued

| $L_{Dn}$ | $L_{Dn}$ structure | $Ar^2$, $Ar^3$, $R^2$ | n |
|---|---|---|---|
| wherein $L_{D962}$-$L_{D1861}$ have the structure | 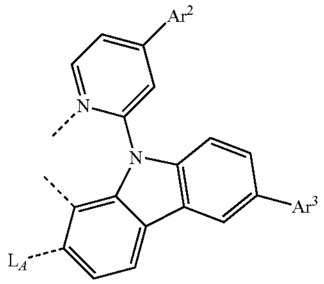 | wherein $Ar^2$ = Aj and $Ar^3$ = Am, wherein j is an integer from 1 to 30 and m is an integer from 1 to 30, and | n = 30(j − 1) + m + 961 |
| wherein $L_{D1862}$-$L_{D1891}$ have the structure | 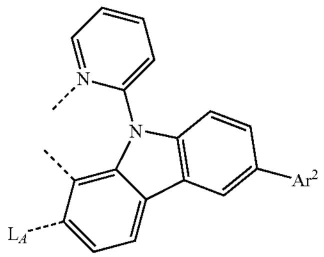 | wherein $Ar^2$ = Aj, wherein j is an integer from 1 to 30, and | n = j + 1861 |
| wherein $L_{D1892}$-$L_{D1921}$ have the structure | 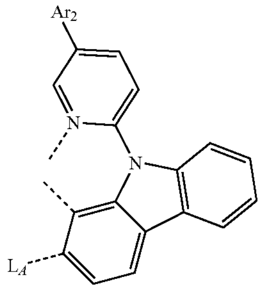 | wherein $Ar^2$ = Aj, wherein j is an integer from 1 to 30, and | n = j + 1891 |
| wherein $L_{D1922}$-$L_{D2821}$ have the structure | 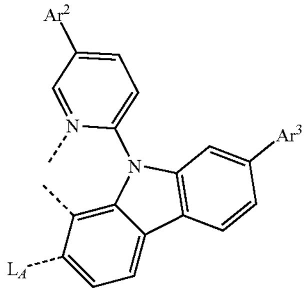 | wherein $Ar^2$ = Aj and $Ar^3$ = Am, wherein j is an integer from 1 to 30 and m is an integer from 1 to 30, and | n = 30(j − 1) + m + 1921 |
| wherein $L_{D2822}$-$L_{D3721}$ have the structure | 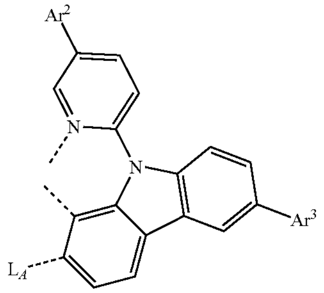 | wherein $Ar^2$ = Aj and $Ar^3$ = Am, wherein j is an integer from 1 to 30 and m is an integer from 1 to 30, and | n = 30(j − 1) + m + 2821 |

-continued

| $L_{Dn}$ | $L_{Dn}$ structure | $Ar^2$, $Ar^3$, $R^2$ | n |
|---|---|---|---|
| wherein $L_{D3722}$-$L_{D4621}$ have the structure | 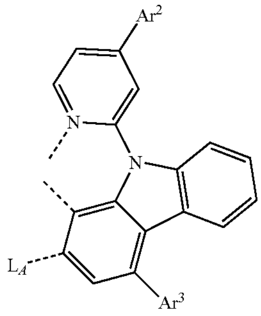 | wherein $Ar^2$ = Aj and $Ar^3$ = Am, wherein j is an integer from 1 to 30 and m is an integer from 1 to 30, and | n = 30(j − 1) + m + 3721 |
| wherein $L_{D4622}$-$L_{D4651}$ have the structure | 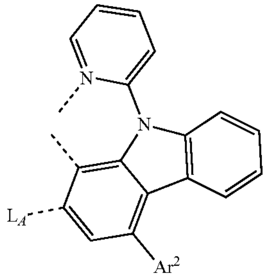 | wherein $Ar^2$ = Aj, wherein j is an integer from 1 to 30, and | n = j + 4621 |
| wherein $L_{D4652}$-$L_{D5551}$ have the structure | 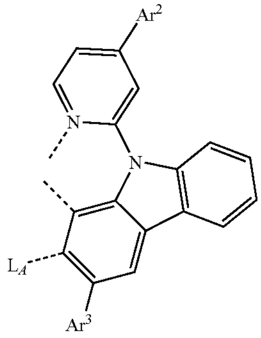 | wherein $Ar^2$ = Aj and $Ar^3$ = Am, wherein j is an integer from 1 to 30 and m is an integer from 1 to 30, and | n = 30(j − 1) + m + 4651 |
| wherein $L_{D5552}$-$L_{D5581}$ have the structure | 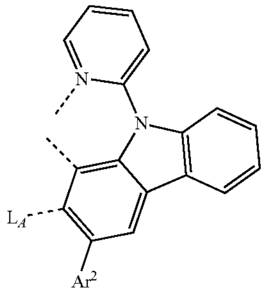 | wherein $Ar^2$ = Aj, wherein j is an integer from 1 to 30, and | n = j + 5551 |
| wherein LD5582-LD6481 have the structure | 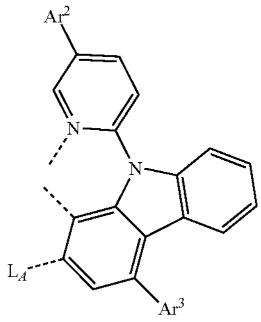 | wherein $Ar^2$ = Aj and $Ar^3$ = Am, wherein j is an integer from 1 to 30 and m is an integer from 1 to 30, and | n = 30(j − 1) + m + 5581 |

-continued

| $L_{Dn}$ | $L_{Dn}$ structure | $Ar^2$, $Ar^3$, $R^2$ | n |
|---|---|---|---|
| wherein $L_{D6482}$-$L_{D7381}$ have the structure | 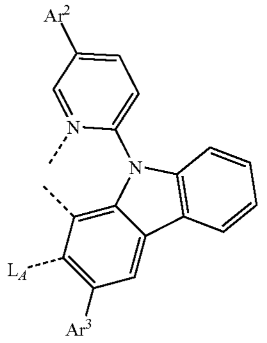 | wherein $Ar^2$ = Aj and $Ar^3$ = Am, wherein j is an integer from 1 to 30 and m is an integer from 1 to 30, and | n = 30(j − 1) + m + 6481 |
| wherein $L_{D7382}$ has the structure | 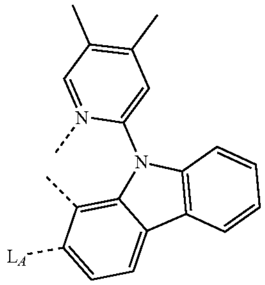 | | n = 7382 |
| wherein $L_{D7383}$-$L_{D7412}$ have the structure | 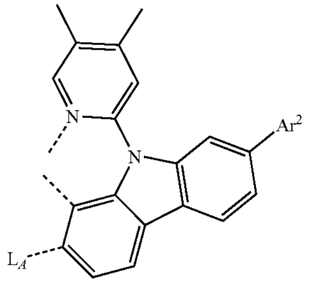 | wherein $Ar^2$ = Aj, wherein j is an integer from 1 to 30, and | n = j + 7382 |
| wherein $L_{D7413}$-$L_{D7442}$ have the structure | 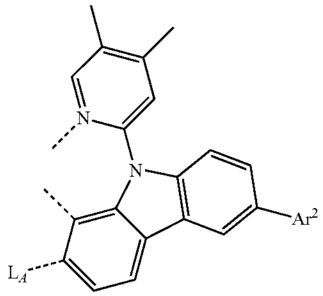 | wherein $Ar^2$ = Aj, wherein j is an integer from 1 to 30, and | n = j + 7412 |
| wherein $L_{D7443}$-$L_{D7472}$ have the structure | 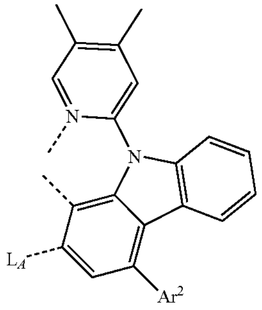 | wherein $Ar^2$ = Aj, wherein j is an integer from 1 to 30, and | n = j + 7442 |

-continued

| $L_{Dn}$ | $L_{Dn}$ structure | $Ar^2$, $Ar^3$, $R^2$ | n |
|---|---|---|---|
| wherein $L_{D7473}$-$L_{D7502}$ have the structure | 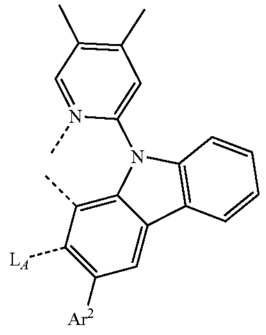 | wherein $Ar^2$ = Aj, wherein j is an integer from 1 to 30, and | n = j + 7472 |
| wherein LD7503 has the structure | 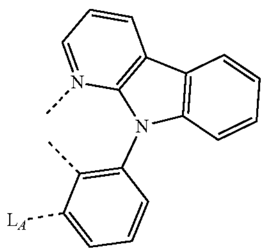 | | n = 7503 |
| wherein $L_{D7504}$-$L_{D7533}$ have the structure | 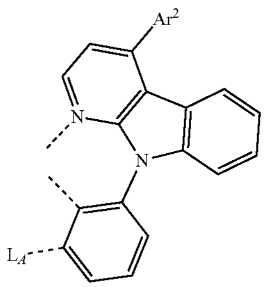 | wherein Ar2 = Aj, wherein j is an integer from 1 to 30, and | n = j + 7503 |
| wherein $L_{D7534}$-$L_{D8433}$ have the structure | 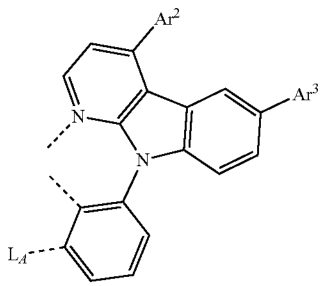 | wherein $Ar^2$ = Aj and $Ar^3$ = Am, wherein j is an integer from 1 to 30 and m is an integer from 1 to 30, and | n = 30(j − 1) + m + 7533 |
| wherein $L_{D8434}$-$L_{D8463}$ have the structure | 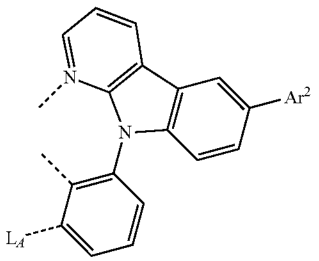 | wherein $Ar^2$ = Aj, wherein j is an integer from 1 to 30, and | n = j + 8433 |

-continued

| $L_{Dn}$ | $L_{Dn}$ structure | $Ar^2$, $Ar^3$, $R^2$ | n |
|---|---|---|---|
| wherein $L_{D8464}$-$L_{D9363}$ have the structure | 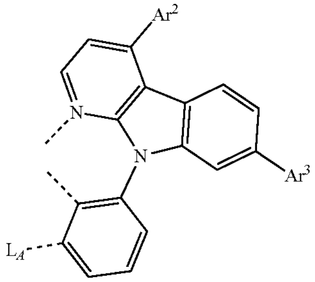 | wherein $Ar^2$ = Aj and $Ar^3$ = Am, wherein j is an integer from 1 to 30 and m is an integer from 1 to 30, and | n = 30(j − 1) + m + 8463 |
| wherein $L_{D9364}$-$L_{D9393}$ have the structure | 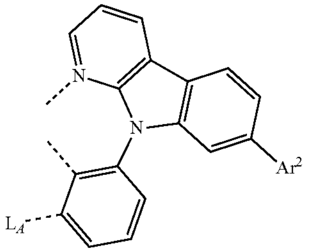 | wherein $Ar^2$ = Aj, wherein j is an integer from 1 to 30, and | n = j + 9363 |
| wherein $L_{D9394}$-$L_{D9423}$ have the structure | 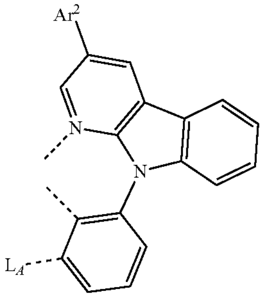 | wherein $Ar^2$ = Aj, wherein j is an integer from 1 to 30, and | n = j + 9393 |
| wherein $L_{D9424}$-$L_{D10323}$ have the structure | 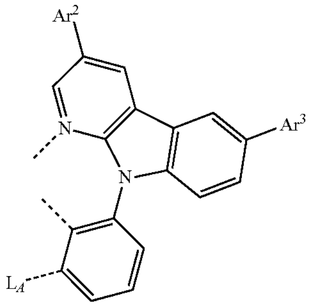 | wherein $Ar^2$ = Aj and $Ar^3$ = Am, wherein j is an integer from 1 to 30 and m is an integer from 1 to 30, and | n = 30(j − 1) + m + 9423 |
| wherein $L_{D10324}$-$L_{D11223}$ have the structure | 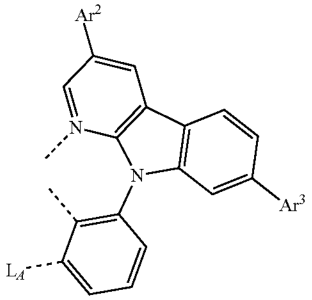 | wherein $Ar^2$ = Aj and $Ar^3$ = Am, wherein j is an integer from 1 to 30 and m is an integer from 1 to 30, and | n = 30(j − 1) + m + 10323 |

-continued

| $L_{Dn}$ | $L_{Dn}$ structure | $Ar^2$, $Ar^3$, $R^2$ | n |
|---|---|---|---|
| wherein $L_{D11224}$-$L_{D11253}$ have the structure | 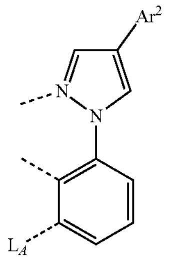 | wherein $Ar^2$ = Aj, wherein j is an integer from 1 to 30, and | n = j + 11223 |
| wherein $L_{D11254}$ has the structure | 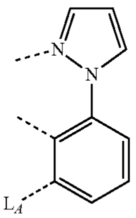 | | n = 11254 |
| wherein $L_{D11255}$-$L_{D11284}$ have the structure | 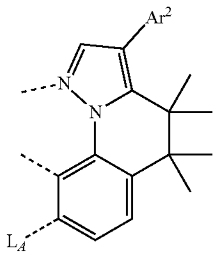 | wherein $Ar^2$ = Aj, wherein j is an integer from 1 to 30, and | n = j + 11254 |
| wherein $L_{D11285}$ has the structure | 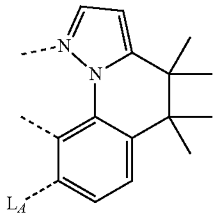 | | n = 11285 |
| wherein $L_{D11286}$-$L_{D12185}$ have the structure | 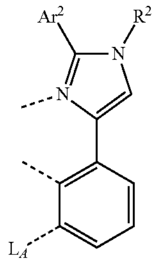 | wherein $Ar^2$ = Aj and $R^2$ = Al, wherein j is an integer from 1 to 30 and l is an integer from 1 to 30, and | n = 30(j − 1) + l + 11285 |
| wherein $L_{D12186}$-$L_{D12215}$ have the structure | 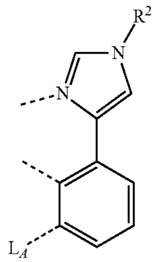 | wherein R2 = Al, wherein l is an integer from 1 to 30, and | n = l + 12185 |

-continued

| $L_{Dn}$ | $L_{Dn}$ structure | $Ar^2$, $Ar^3$, $R^2$ | n |
|---|---|---|---|
| wherein $L_{D12216}$-$L_{D13115}$ have the structure | 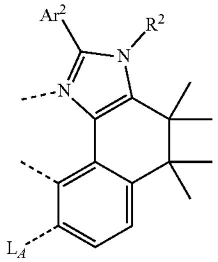 | wherein $Ar^2$ = Aj and $R^2$ = Al, wherein j is an integer from 1 to 30 and l is an integer from 1 to 30, and | n = 30(j − 1) + l + 12215 |
| wherein $L_{D13116}$-$L_{D13145}$ have the structure | 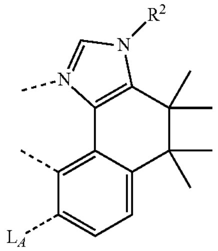 | wherein $R^2$ = Al, wherein l is an integer from 1 to 30, and | n = l + 13115 |
| wherein $L_{D13146}$-$L_{D14045}$ have the structure | 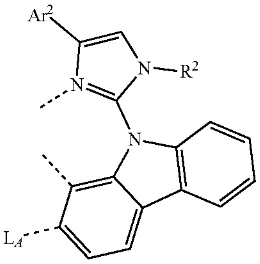 | wherein $Ar^2$ = Aj and $R^2$ = Al, wherein j is an integer from 1 to 30 and l is an integer from 1 to 30, and | n = 30(j − 1) + l + 13145 |
| wherein $L_{D14046}$-$L_{D14075}$ have the structure | 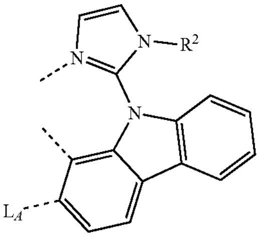 | wherein $R^2$ = Al, wherein l is an integer from 1 to 30, and | n = l + 14045 |
| wherein $L_{D14076}$-$L_{D14975}$ have the structure | 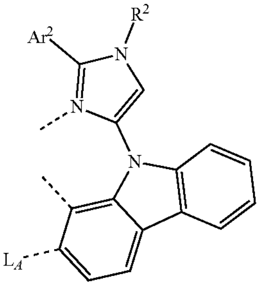 | wherein $Ar^2$ = Aj and $R^2$ = Al, wherein j is an integer from 1 to 30 and l is an integer from 1 to 30, and | n = 30(j − 1) + l + 14075 |

-continued

| $L_{Dn}$ | $L_{Dn}$ structure | $Ar^2$, $Ar^3$, $R^2$ | n |
|---|---|---|---|
| wherein $L_{D14976}$-$L_{D15005}$ have the structure | 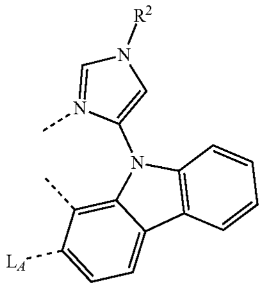 | wherein R2 = Al, wherein l is an integer from 1 to 30, and | n = l + 14975 |
| wherein $L_{D15006}$-$L_{D15905}$ have the structure | 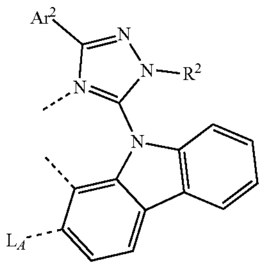 | wherein $Ar^2$ = Aj and $R^2$ = Al, wherein j is an integer from 1 to 30 and l is an integer from 1 to 30, and | n = 30(j − 1) + l + 15005 |
| wherein $L_{D15906}$-$L_{D15935}$ have the structure | 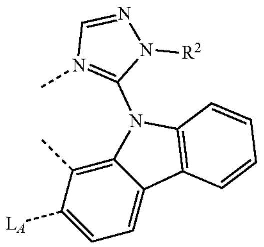 | wherein $R^2$ = Al, wherein l is an integer from 1 to 30, and | n = l + 15905 |
| wherein $L_{D15936}$-$L_{D16835}$ have the structure | 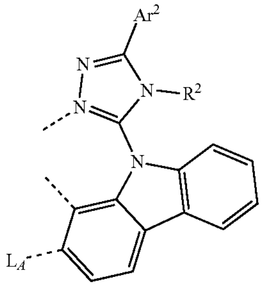 | wherein $Ar^2$ = Aj and $R^2$ = Al, wherein j is an integer from 1 to 30 and l is an integer from 1 to 30, and | n = 30(j − 1) + l + 15935 |
| wherein $L_{D16836}$-$L_{D16865}$ have the structure | 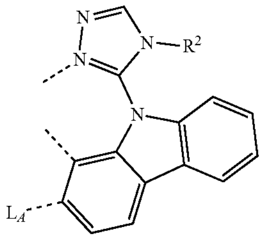 | wherein R2 = Al, wherein l is an integer from 1 to 30, and | n = l + 16835 |

-continued

| $L_{Dn}$ | $L_{Dn}$ structure | $Ar^2$, $Ar^3$, $R^2$ | n |
|---|---|---|---|
| wherein $L_{D16866}$-$L_{D17765}$ have the structure | 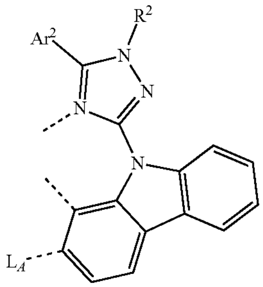 | wherein $Ar^2$ = Aj and $R^2$ = Al, wherein j is an integer from 1 to 30 and l is an integer from 1 to 30, and | n = 30(j − 1) + l + 16865 |
| wherein $L_{D17766}$-$L_{D17795}$ have the structure | 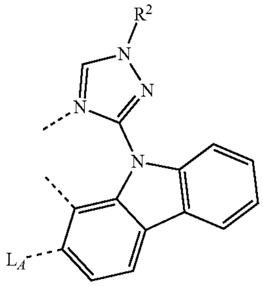 | wherein $R^2$ = Al, wherein l is an integer from 1 to 30, and | n = l + 17765 |
| wherein $L_{D17796}$-$L_{D17825}$ have the structure | 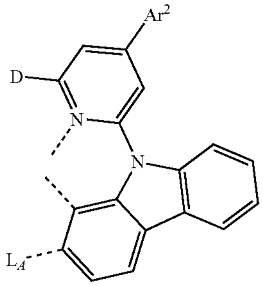 | wherein $Ar^2$ = Aj, wherein j is an integer from 1 to 30, and | n = j + 17795 |
| wherein $L_{D17826}$ has the structure | 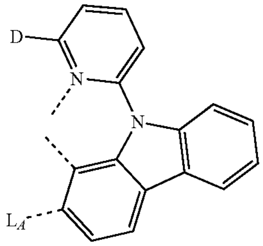 | | n = 17826 |
| wherein $L_{D17827}$-$L_{D18726}$ have the structure | 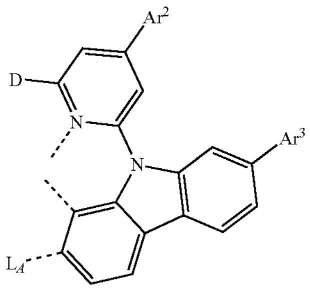 | wherein $Ar^2$ = Aj and $Ar^3$ = Am, wherein j is an integer from 1 to 30 and m is an integer from 1 to 30, and | n = 30(j − 1) + m + 17826 |

-continued

| $L_{Dn}$ | $L_{Dn}$ structure | $Ar^2$, $Ar^3$, $R^2$ | n |
|---|---|---|---|
| wherein $L_{D18727}$-$L_{D18756}$ have the structure | 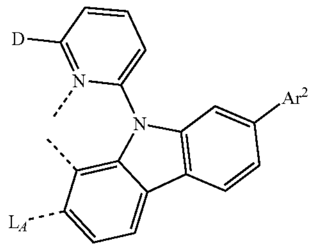 | wherein $Ar^2$ = Aj, wherein j is an integer from 1 to 30, and | n = j + 18726 |
| wherein $L_{D18757}$-$L_{D19656}$ have the structure | 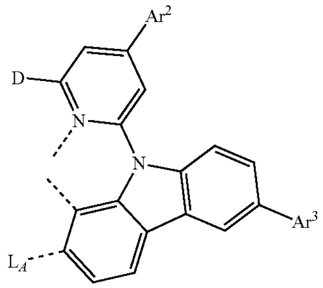 | wherein $Ar^2$ = Aj and $Ar^3$ = Am, wherein j is an integer from 1 to 30 and m is an integer from 1 to 30, and | n = 30(j − 1) + m + 18756 |
| wherein $L_{D19657}$-$L_{D19686}$ have the structure | 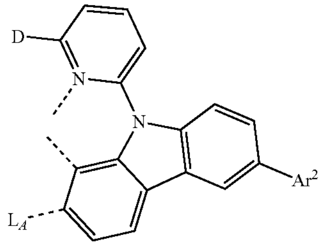 | wherein $Ar^2$ = Aj, wherein j is an integer from 1 to 30, and | n = j + 19656 |
| wherein $L_{D19687}$-$L_{D19716}$ have the structure | 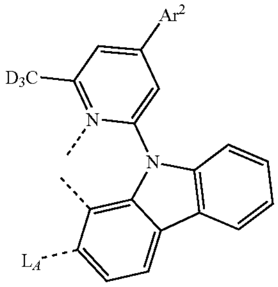 | wherein $Ar^2$ = Aj, wherein j is an integer from 1 to 30, and | n = j + 19686 |
| wherein $L_{D19717}$ have the structure | 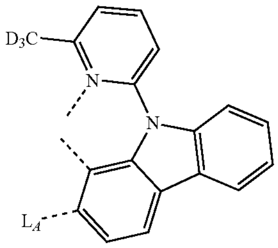 | | n = 19717 |

-continued

| $L_{Dn}$ | $L_{Dn}$ structure | $Ar^2$, $Ar^3$, $R^2$ | n |
|---|---|---|---|
| wherein $L_{D19718}$-$L_{D20617}$ have the structure | 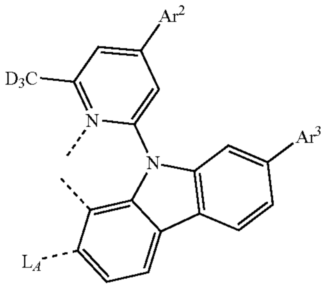 | wherein $Ar^2$ = Aj and $Ar^3$ = Am, wherein j is an integer from 1 to 30 and m is an integer from 1 to 30, and | n = 30(j − 1) + m + 19717 |
| wherein $L_{D20618}$-$L_{D20647}$ have the structure | 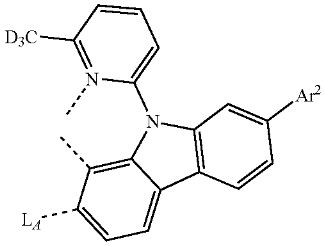 | wherein $Ar^2$ = Aj, wherein j is an integer from 1 to 30, and | n = j + 20617 |
| wherein $L_{D20648}$-$L_{D21547}$ have the structure | 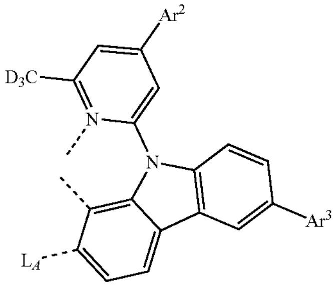 | wherein $Ar^2$ = Aj and $Ar^3$ = Am, wherein j is an integer from 1 to 30 and m is an integer from 1 to 30, and | n = 30(j − 1) + m + 20647 |
| wherein $L_{D21548}$-$L_{D21577}$ have the structure | 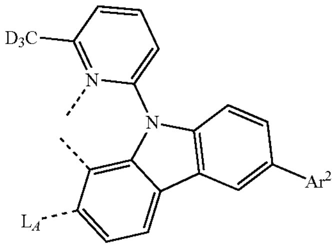 | wherein $Ar^2$ = Aj, wherein j is an integer from 1 to 30, and | n = j + 21547 |
| wherein $L_{D21578}$-$L_{D22477}$ have the structure | 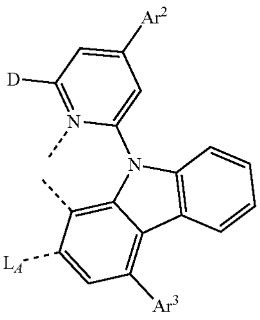 | wherein $Ar^2$ = Aj and $Ar^3$ = Am, wherein j is an integer from 1 to 30 and m is an integer from 1 to 30, and | n = 30(j − 1) + m + 21577 |

-continued

| $L_{Dn}$ | $L_{Dn}$ structure | $Ar^2$, $Ar^3$, $R^2$ | n |
|---|---|---|---|
| wherein $L_{D22478}$-$L_{D22507}$ have the structure | 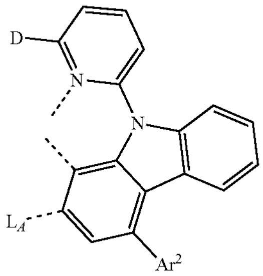 | wherein $Ar^2$ = Aj, wherein j is an integer from 1 to 30, and | n = j + 22477 |
| wherein $L_{D22508}$-$L_{D23407}$ have the structure | 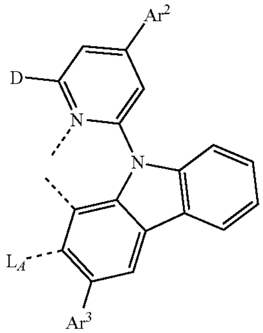 | wherein $Ar^2$ = Aj and $Ar^3$ = Am, wherein j is an integer from 1 to 30 and m is an integer from 1 to 30, and | n = 30(j − 1) + m + 22507 |
| wherein $L_{D23408}$-$L_{D23437}$ have the structure | 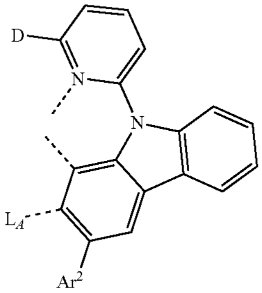 | wherein $Ar^2$ = Aj, wherein j is an integer from 1 to 30, and | n = j + 23407 |
| wherein $L_{D23438}$-$L_{D24337}$ have the structure | 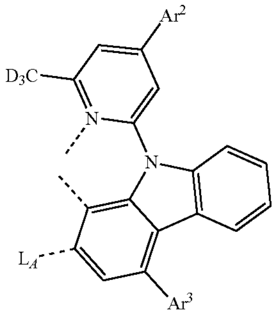 | wherein $Ar^2$ = Aj and $Ar^3$ = Am, wherein j is an integer from 1 to 30 and m is an integer from 1 to 30, and | n = 30(j − 1) + m + 23437 |
| wherein $L_{D24338}$-$L_{D24367}$ have the structure | 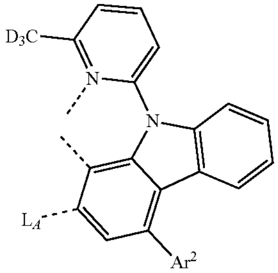 | wherein $Ar^2$ = Aj, wherein j is an integer from 1 to 30, and | n = j + 24337 |

-continued

| $L_{Dn}$ | $L_{Dn}$ structure | $Ar^2$, $Ar^3$, $R^2$ | n |
|---|---|---|---|
| wherein $L_{D24368}$-$L_{D25267}$ have the structure | 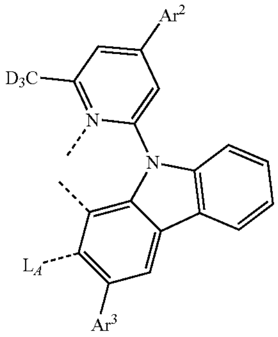 | wherein $Ar^2$ = Aj and $Ar^3$ = Am, wherein j is an integer from 1 to 30 and m is an integer from 1 to 30, and | n = 30(j − 1) + m + 24367 |
| wherein $L_{D25268}$-$L_{D25297}$ have the structure | 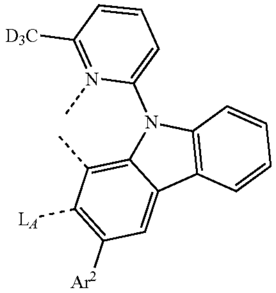 | wherein $Ar^2$ = Aj, wherein j is an integer from 1 to 30, and | n = j + 25267 |
| wherein $L_{D25298}$-$L_{D25327}$ have the structure | 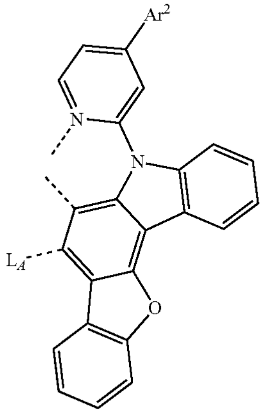 | wherein $Ar^2$ = Aj, wherein j is an integer from 1 to 30, and | n = j + 25297 |
| wherein $L_{D25328}$-$L_{D25357}$ have the structure | 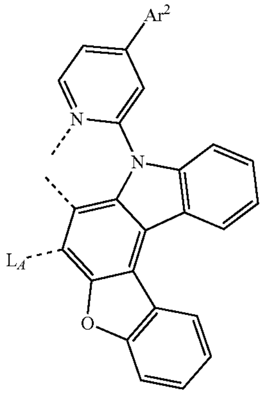 | wherein $Ar^2$ = Aj, wherein j is an integer from 1 to 30, and | n = j + 25327 |

-continued
| $L_{Dn}$ | $L_{Dn}$ structure | $Ar^2$, $Ar^3$, $R^2$ | n |
|---|---|---|---|
| wherein $L_{D25358}$-$L_{D25387}$ have the structure | 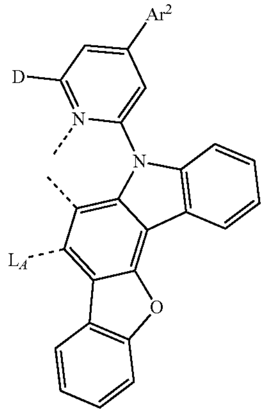 | wherein $Ar^2$ = Aj, wherein j is an integer from 1 to 30, and | n = j + 25357 |
| wherein $L_{D25388}$-$L_{D25417}$ have the structure | 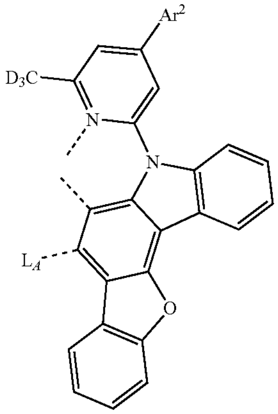 | wherein $Ar^2$ = Aj, wherein j is an integer from 1 to 30, and | n = j + 25387 |
| wherein $L_{D25418}$-$L_{D25447}$ have the structure | 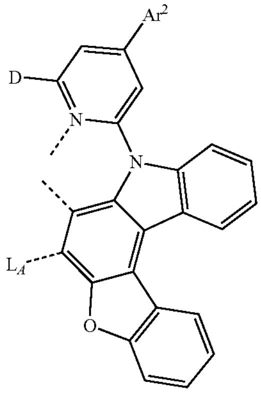 | wherein $Ar^2$ = Aj, wherein j is an integer from 1 to 30, and | n = j + 25417 |

-continued
| $L_{Dn}$ | $L_{Dn}$ structure | $Ar^2$, $Ar^3$, $R^2$ | n |
|---|---|---|---|
| wherein $L_{D25448}$-$L_{B25477}$ has the structure | 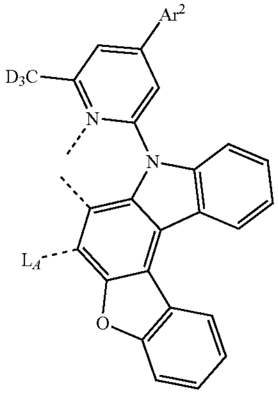 | wherein $Ar^2$ = Aj, wherein j is an integer from 1 to 30, and | n = j + 25447 |
| wherein $L_{D25478}$ has the structure | 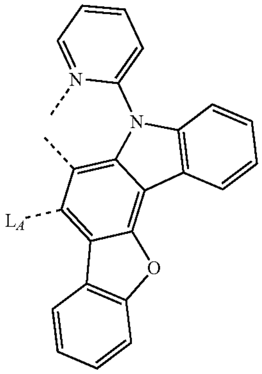 | | n = 25478 |
| wherein $L_{D25479}$ has the structure | 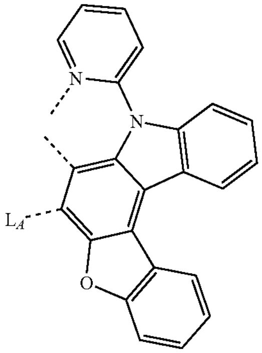 | | n = 25479 |
| wherein $L_{D25480}$ has the structure | 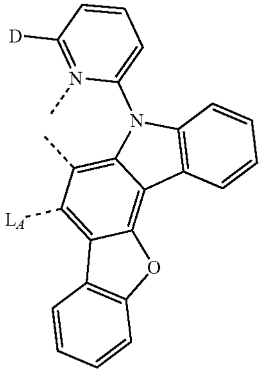 | | n = 25480 |

-continued
| $L_{Dn}$ | $L_{Dn}$ structure | $Ar^2$, $Ar^3$, $R^2$ | n |
|---|---|---|---|
| wherein $L_{D25481}$ has the structure | 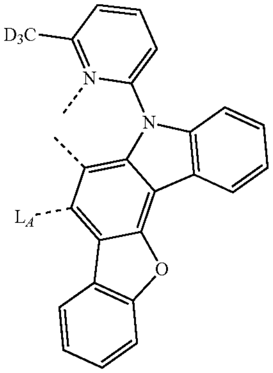 | | n = 25481 |
| wherein $L_{D25482}$ has the structure | 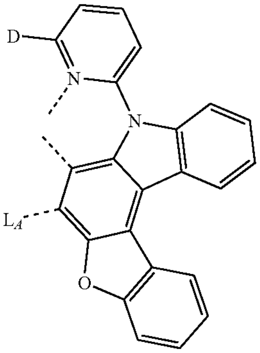 | | n = 25482 |
| wherein $L_{D25483}$ has the structure | 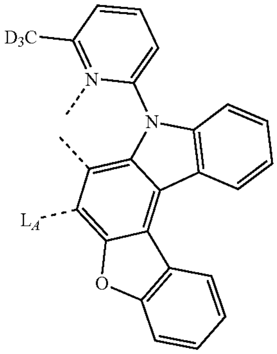 | | n = 25483 |
| wherein $L_{D25484}$-$L_{D25513}$ have the structure | 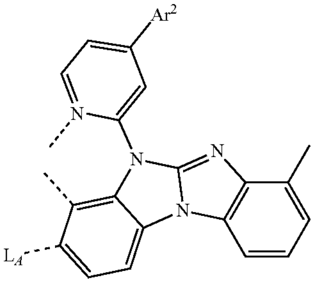 | wherein $Ar^2$ = Aj, wherein j is an integer from 1 to 30, and | n = j + 25483 |

-continued
| $L_{Dn}$ | $L_{Dn}$ structure | $Ar^2$, $Ar^3$, $R^2$ | n |
| --- | --- | --- | --- |
| wherein $L_{D25514}$-$L_{D25543}$ have the structure | 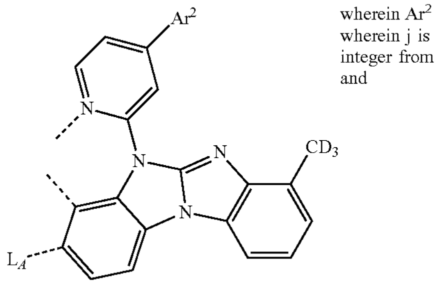 | wherein $Ar^2$ = Aj, wherein j is an integer from 1 to 30, and | n = j + 25513 |
wherein A1 to A30 have the following structures:
A1
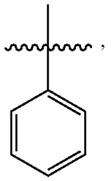
A2
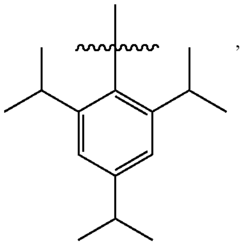
A3
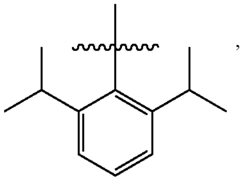
A4
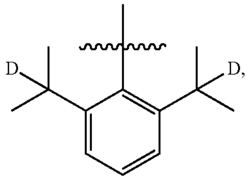
A5
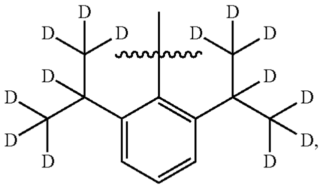
-continued
A6
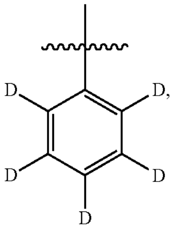
A7
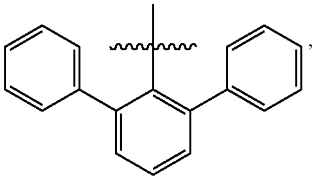
A8
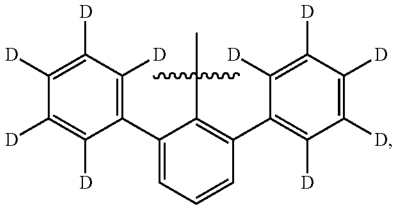
A9
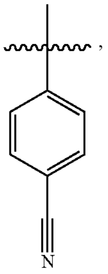
A10
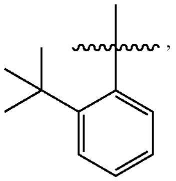
A11
Me,
A12
iPr, -continued
A13
tBu,
A14
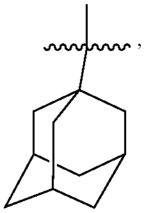
A15
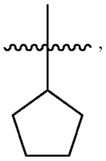
A16
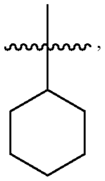
A17
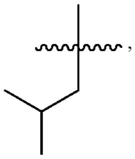
A18
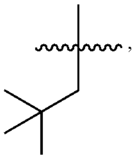
A19
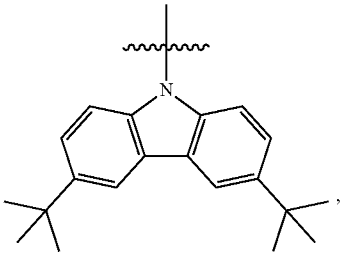
A20
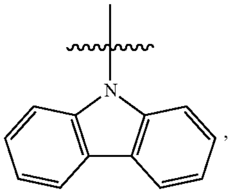
A21
$CD_3$,
-continued
A22
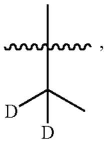
A23
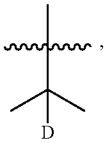
A24
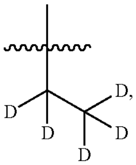
A25
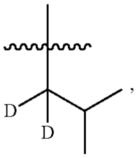
A26
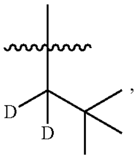
A27
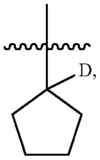
A28
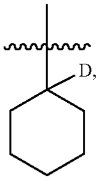
A29
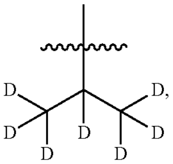
A30
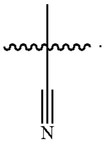

16. A compound selected from the group consisting of:
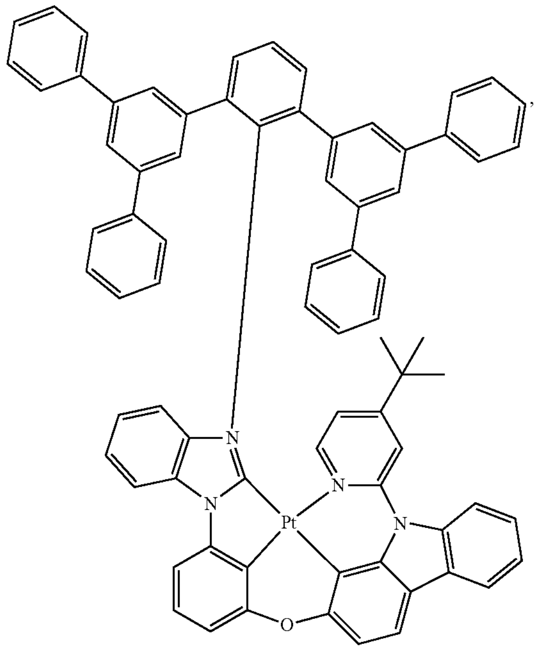
,
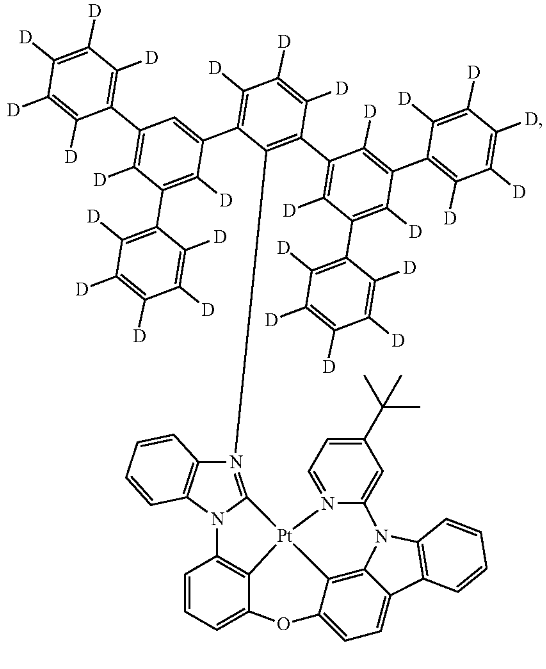
,
-continued
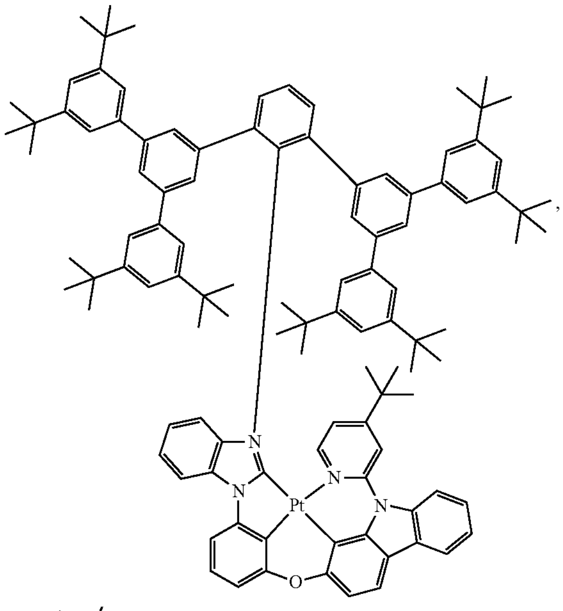
,
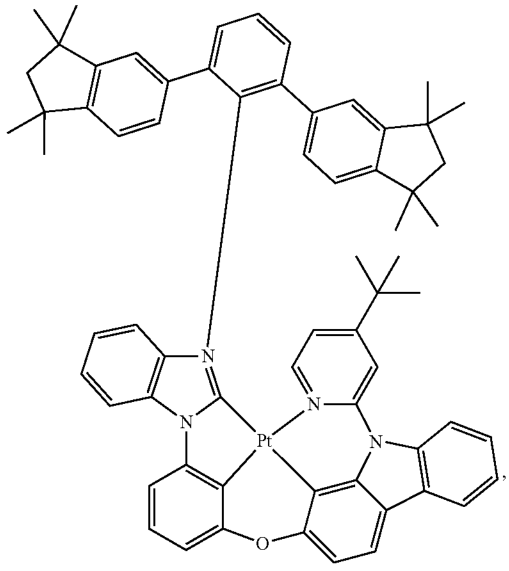
,
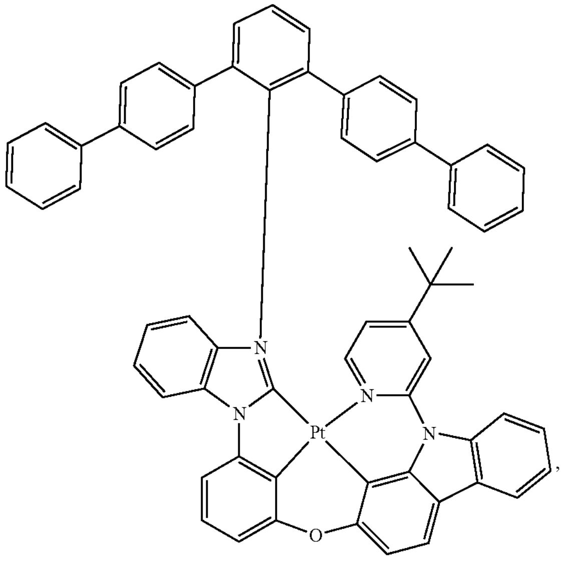
, -continued
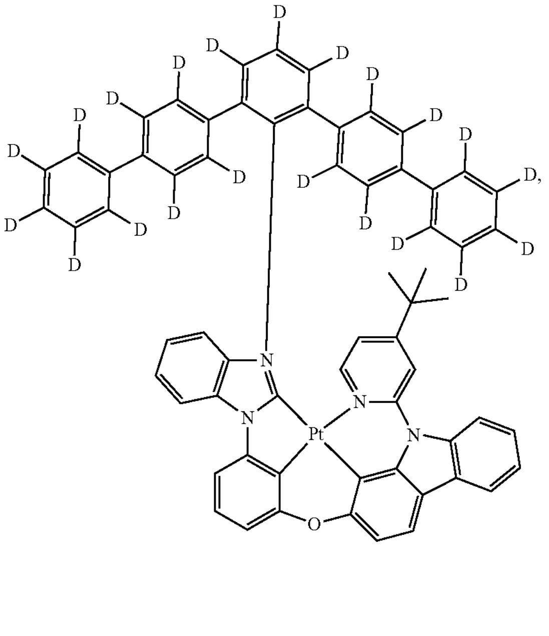
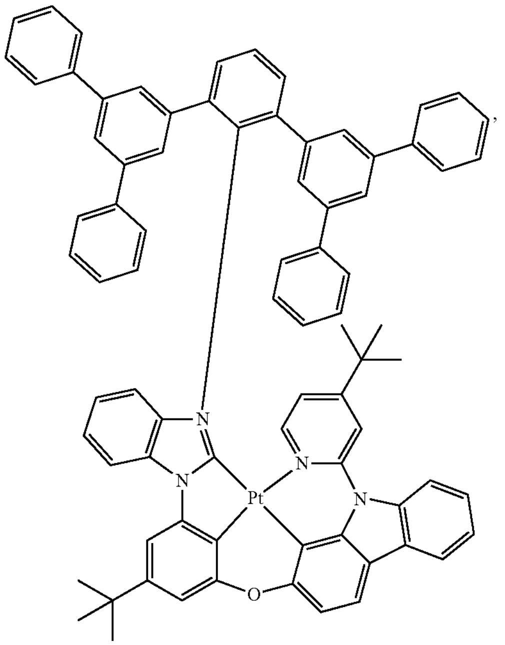
-continued
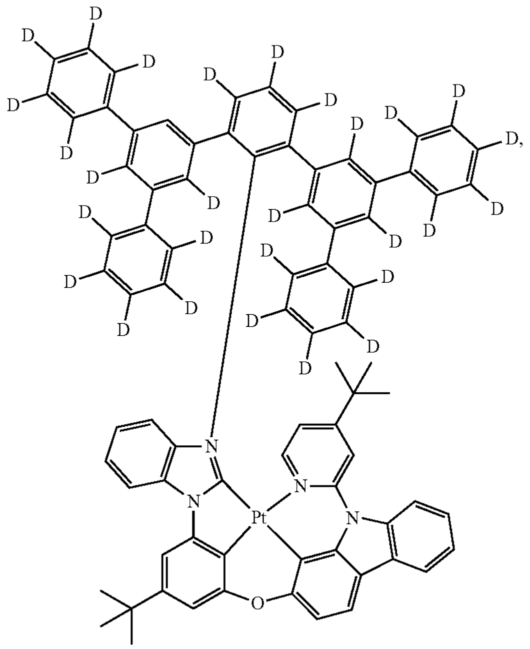
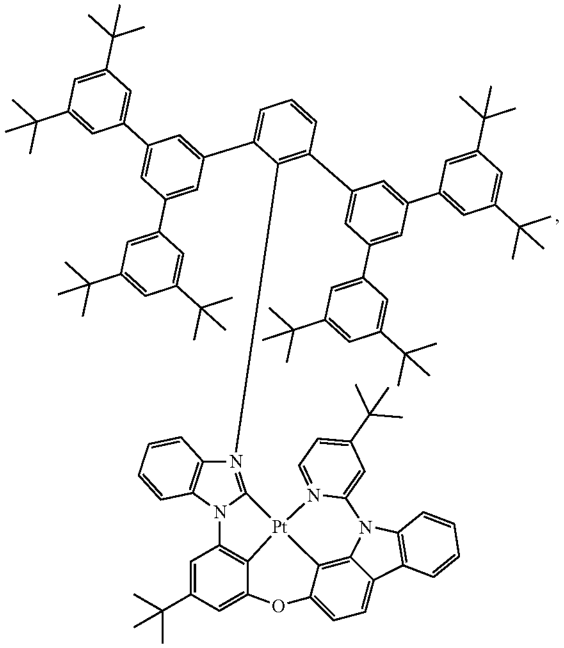

-continued
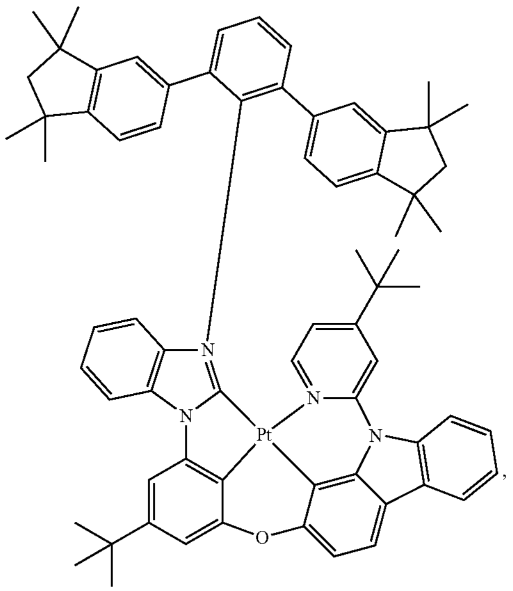
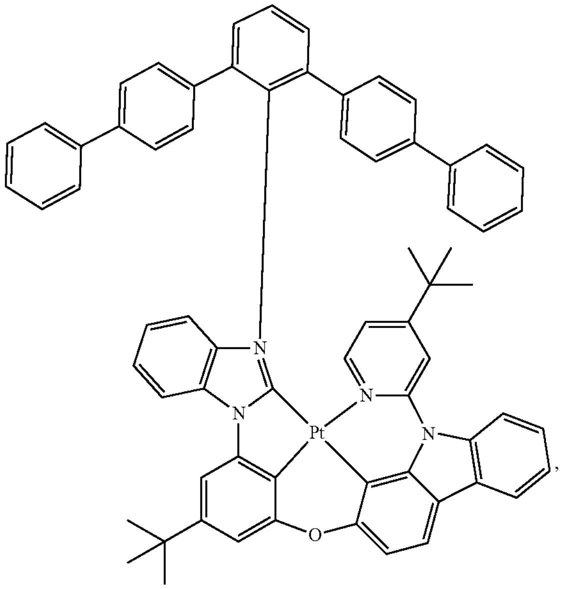
-continued
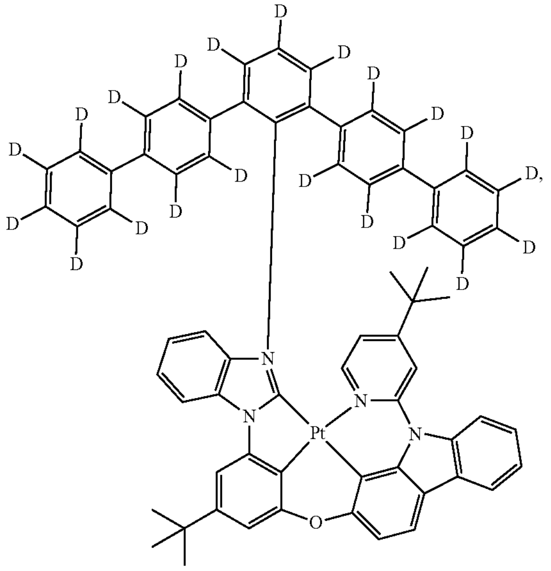
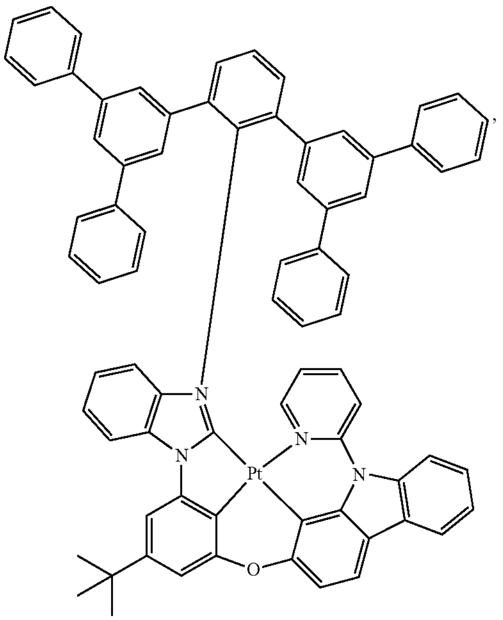

-continued
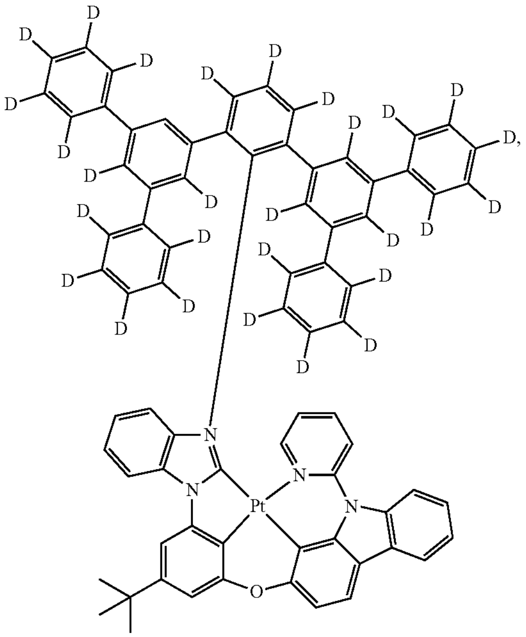
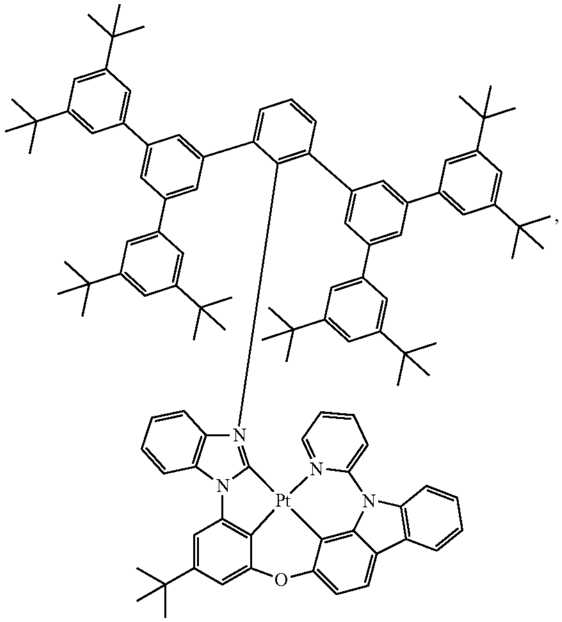
,
-continued
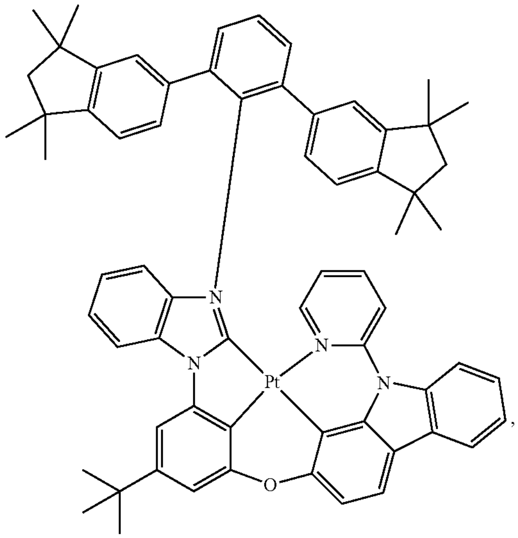
,
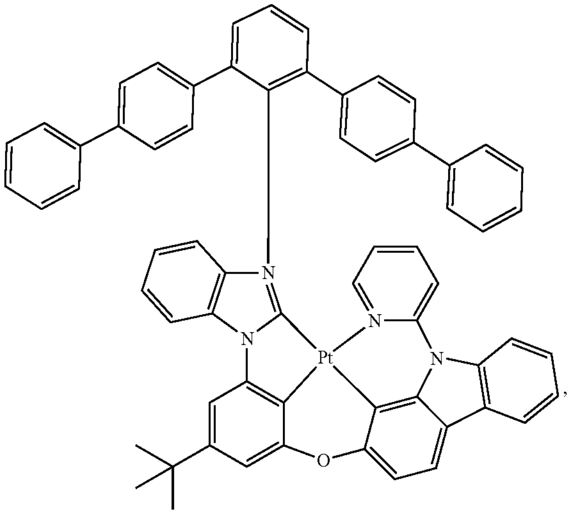
,
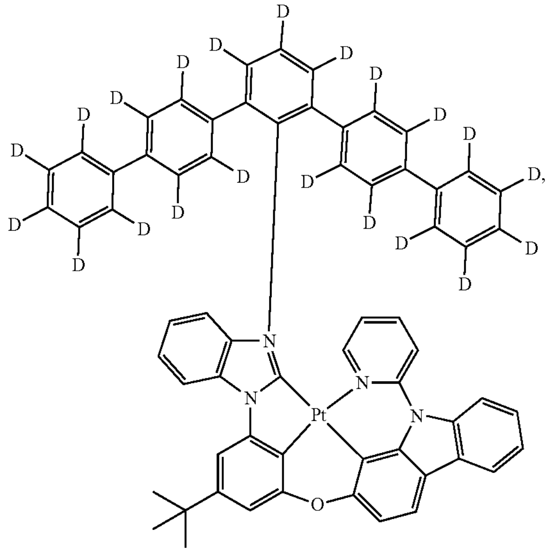

-continued
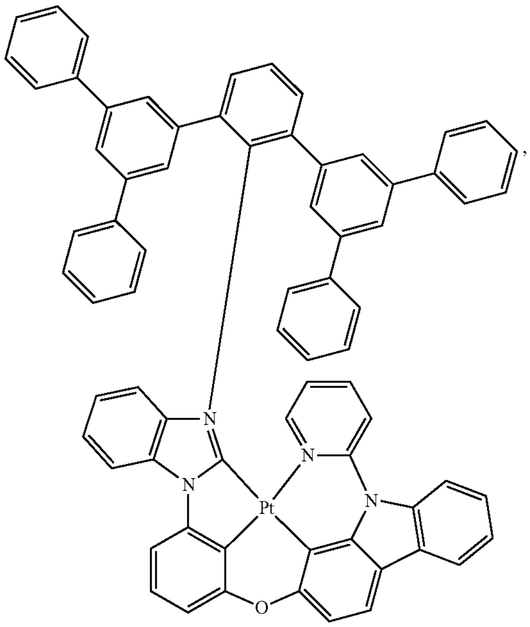
,
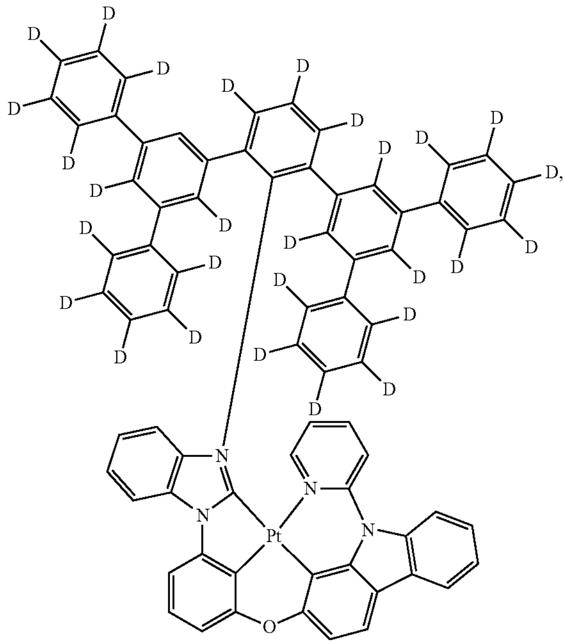
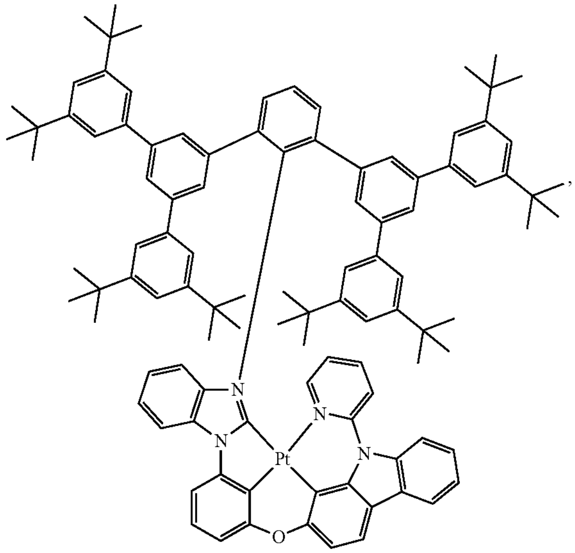
,
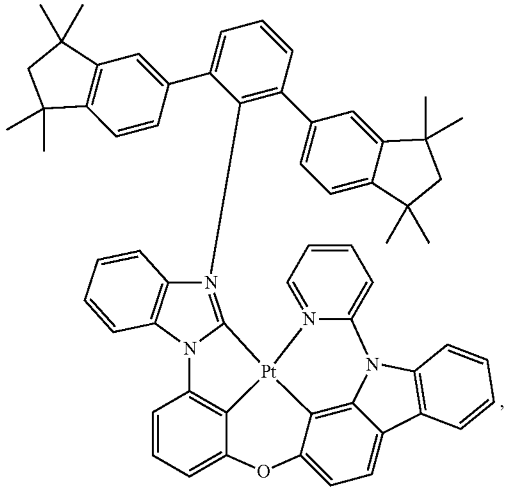
,
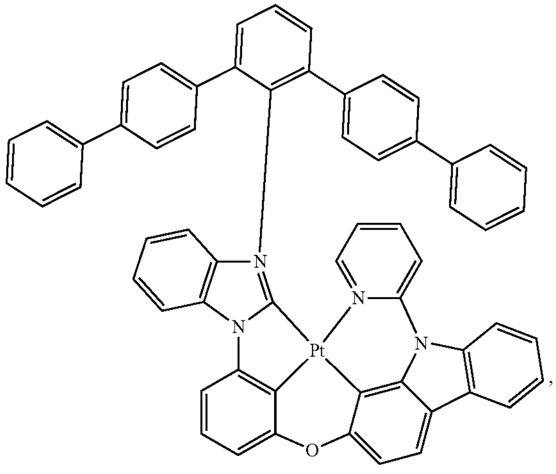
, -continued
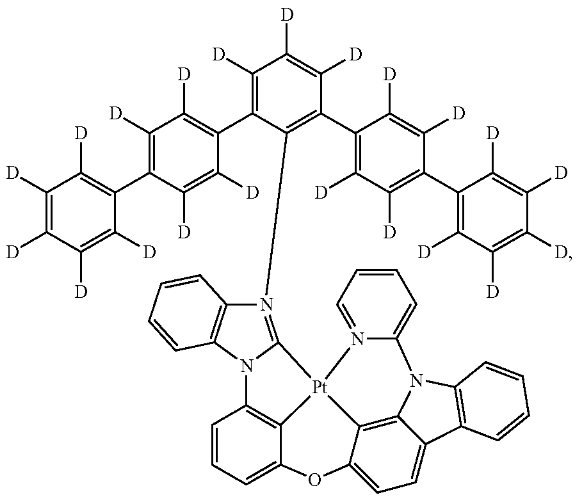
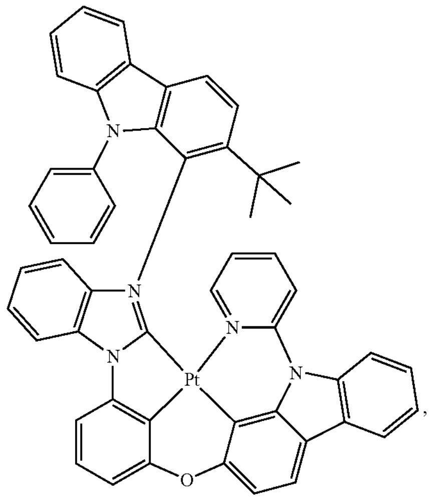
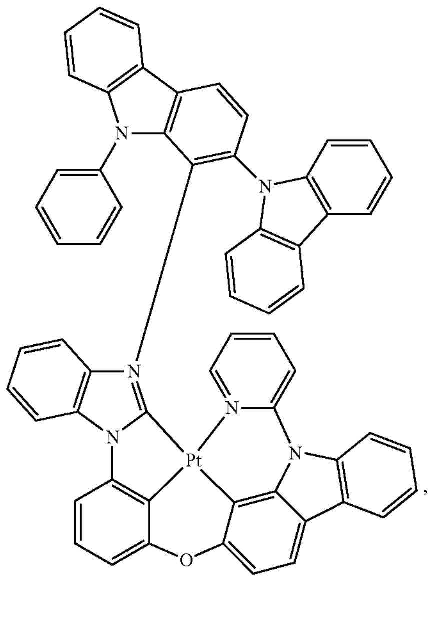
-continued
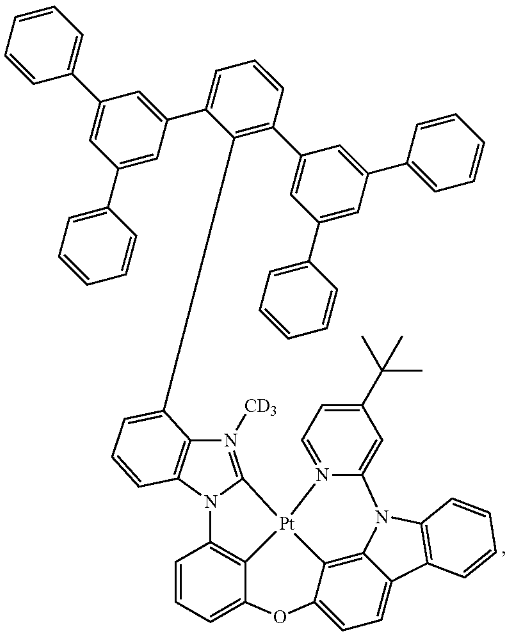
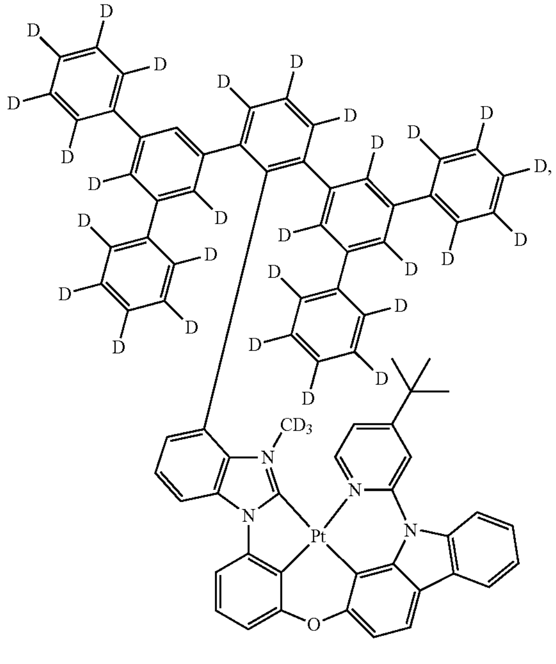

-continued
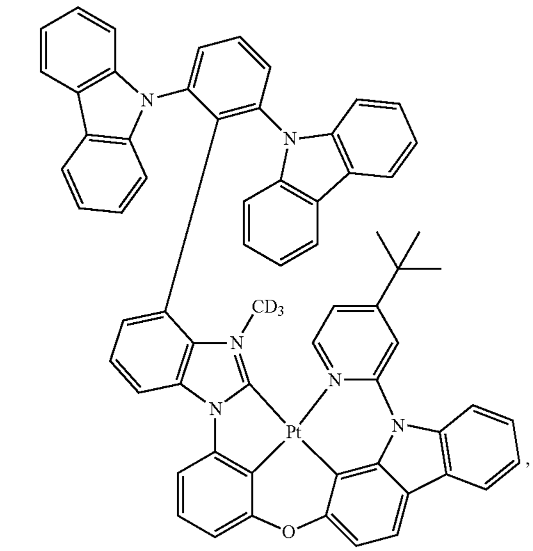
,
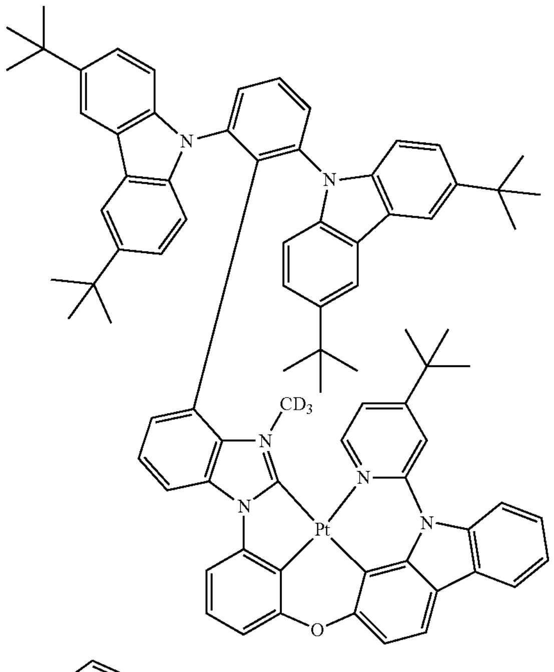
,
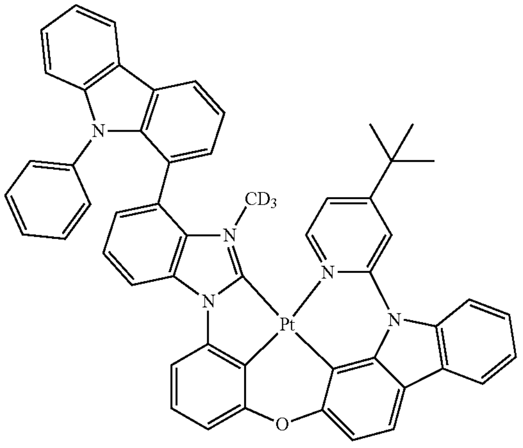
,
-continued
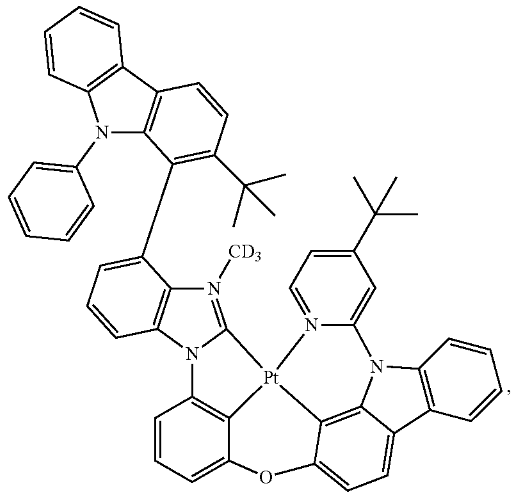
,
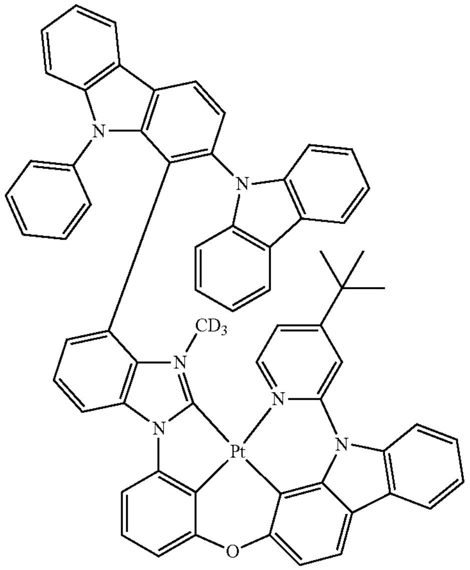
,
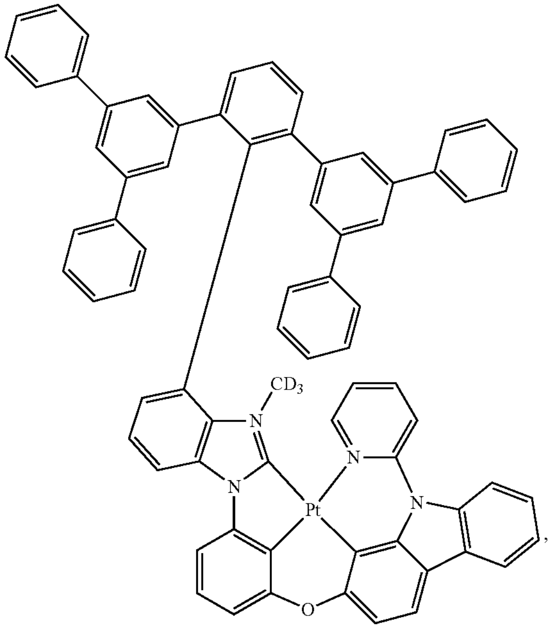
, -continued
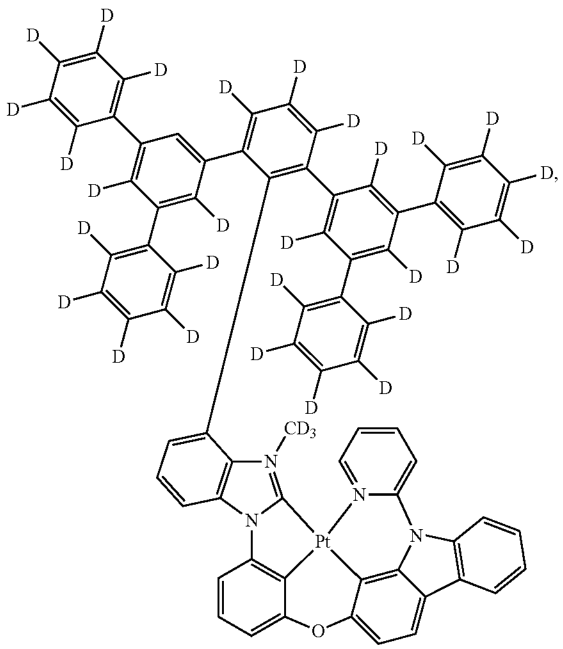
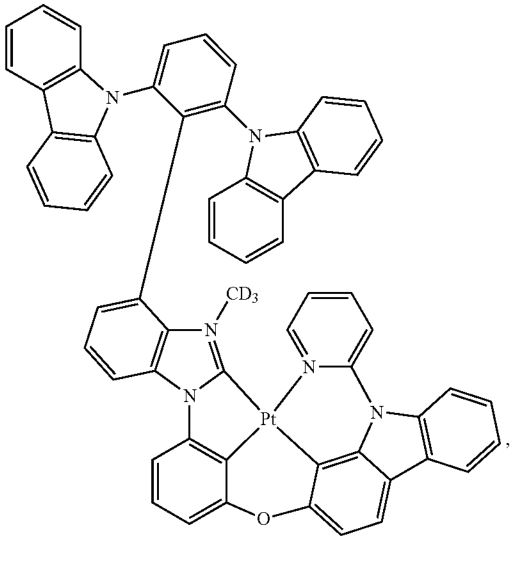
,
-continued
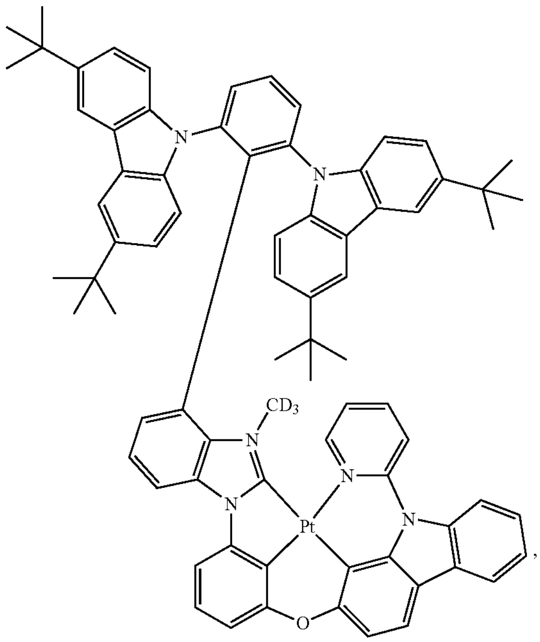
,
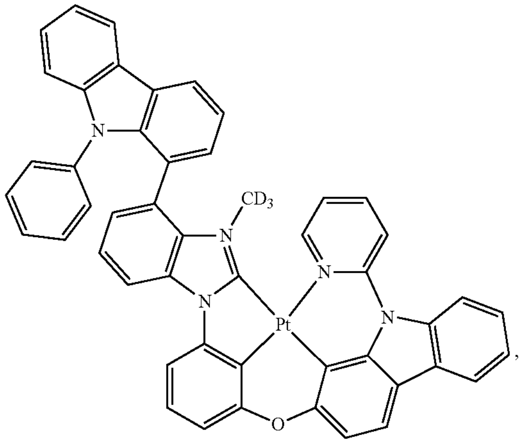
,
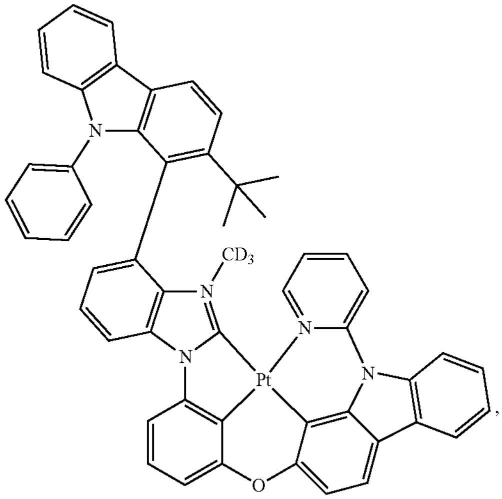
, -continued
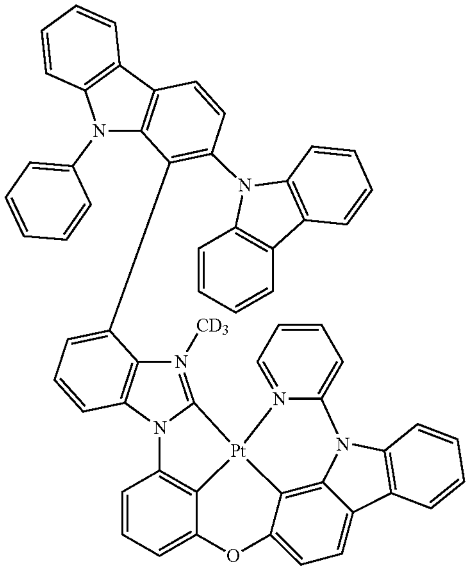
,
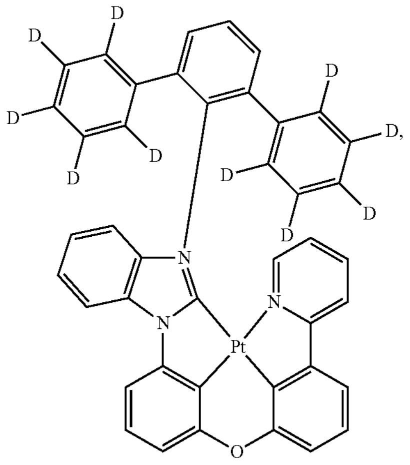
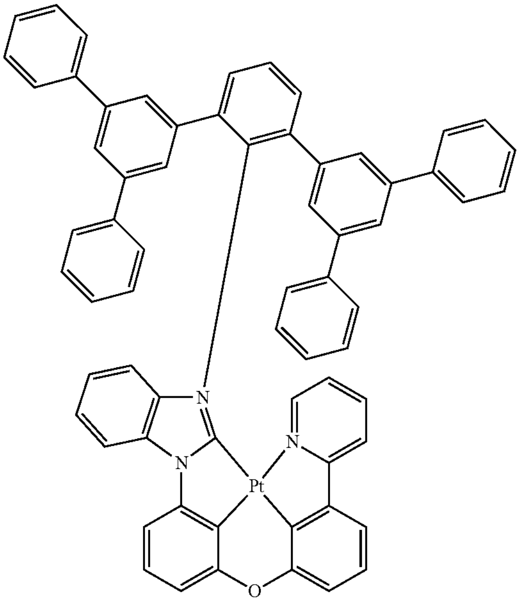
,
-continued
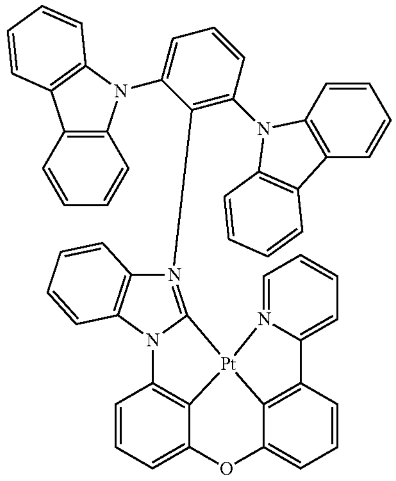
,
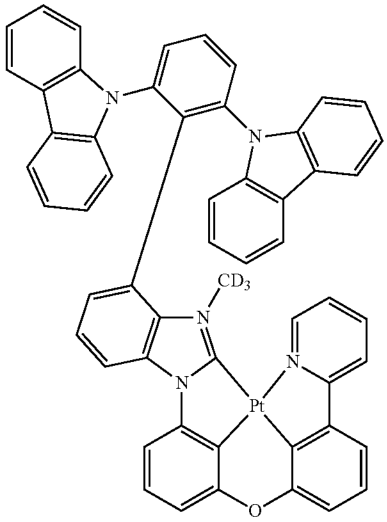
,
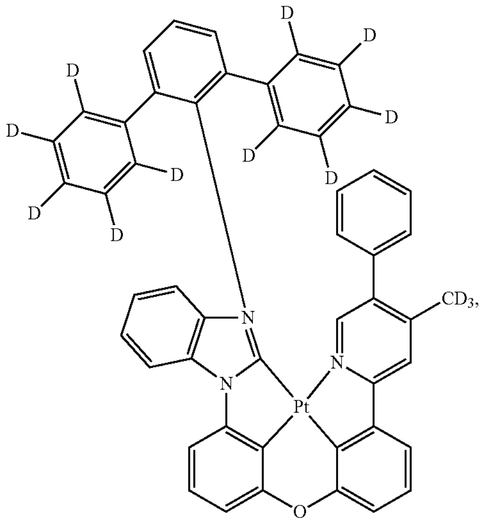

-continued
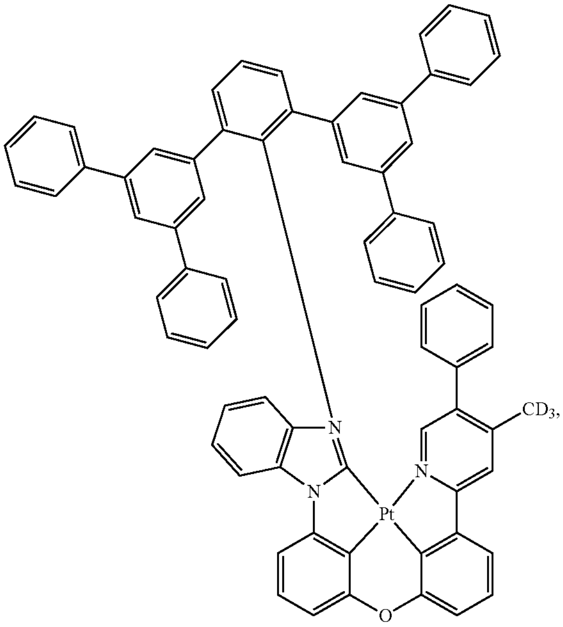
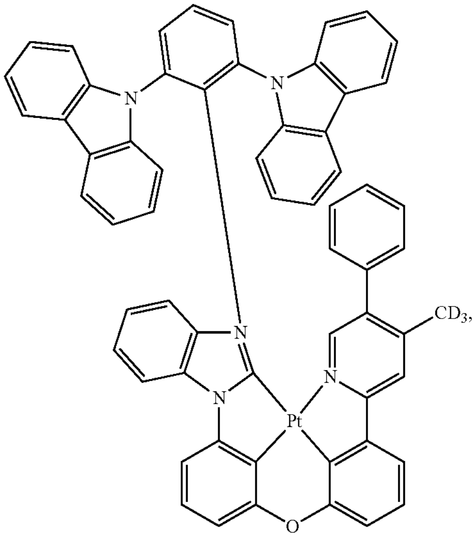
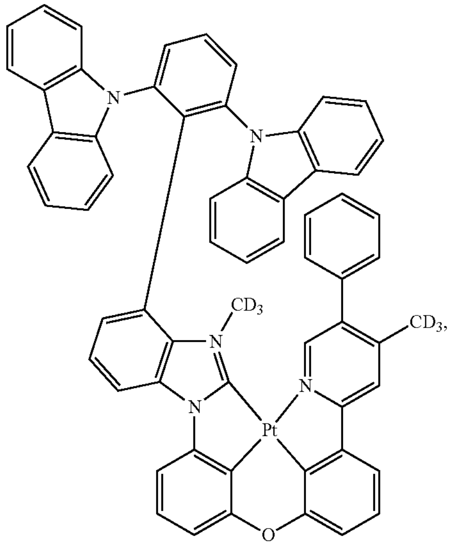
-continued
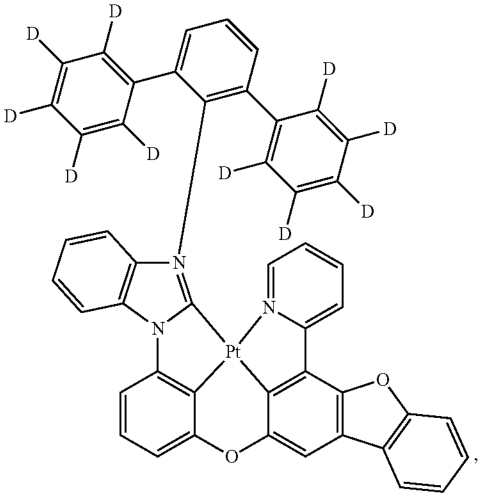
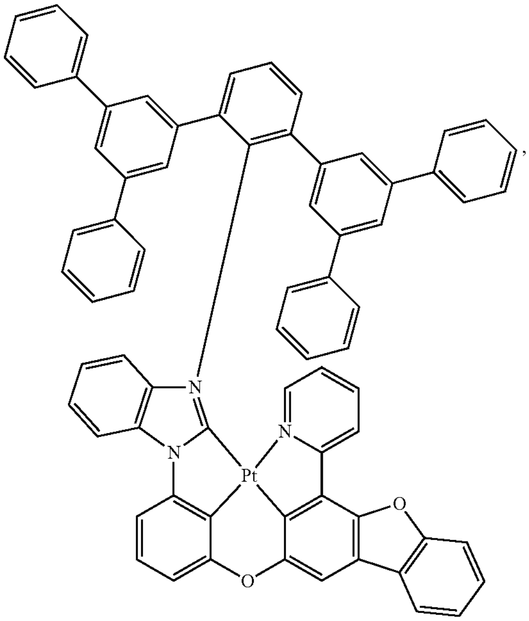
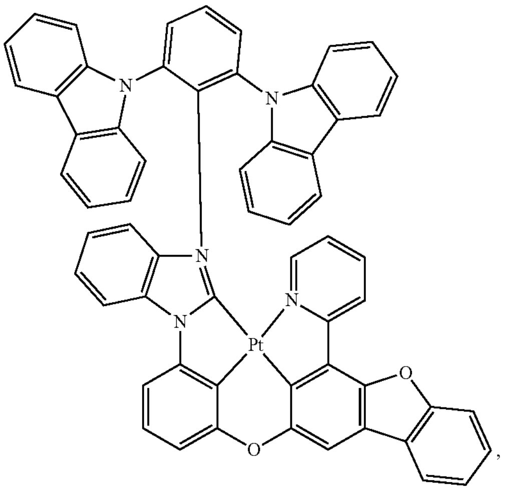

-continued
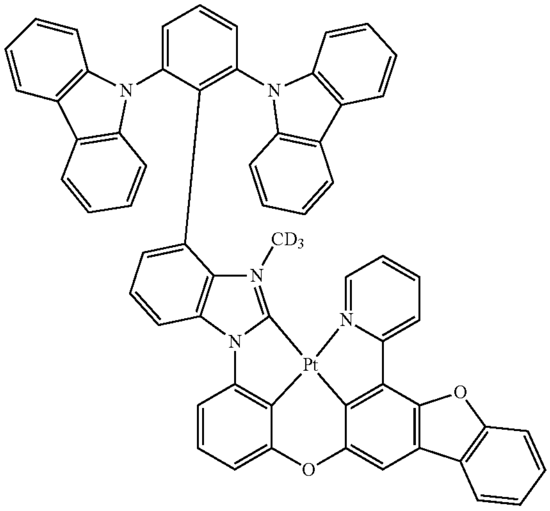
,
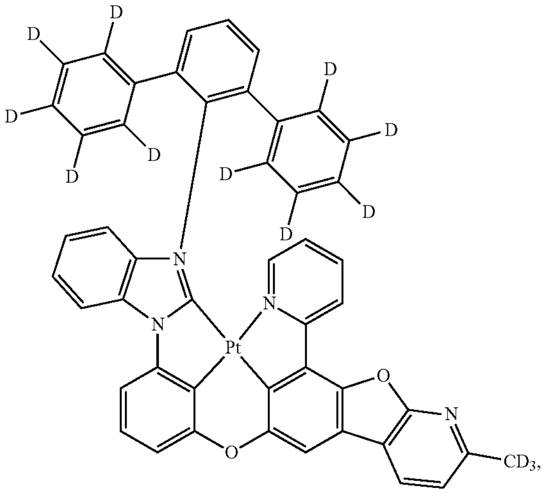
,
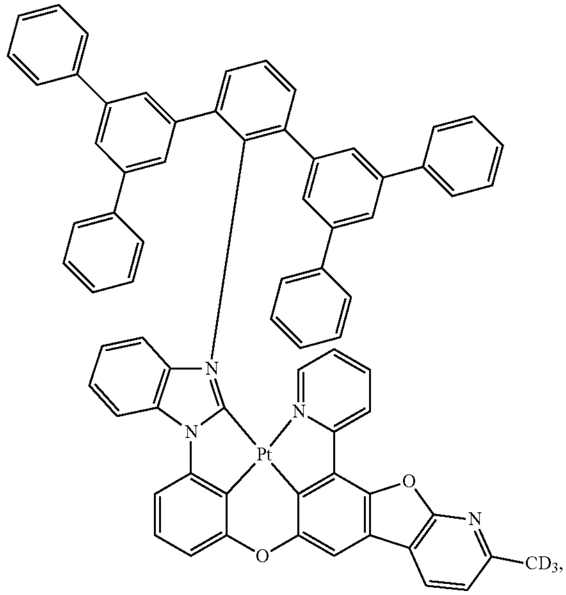
,
-continued
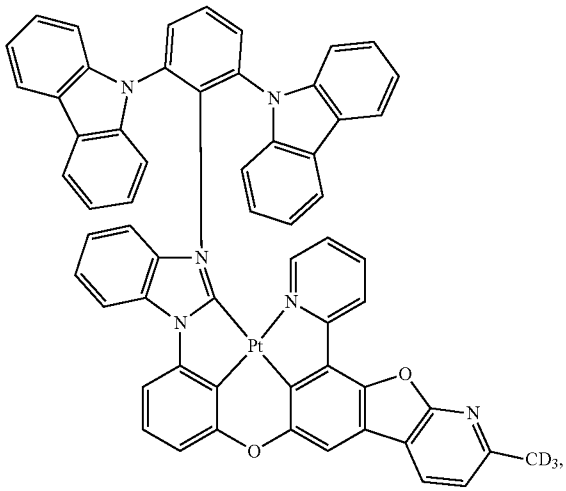
,
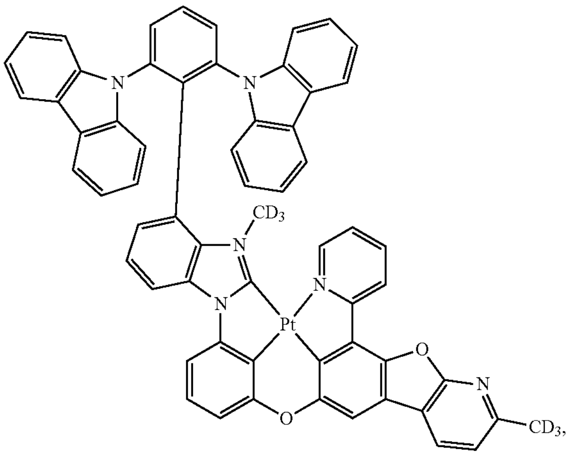
,
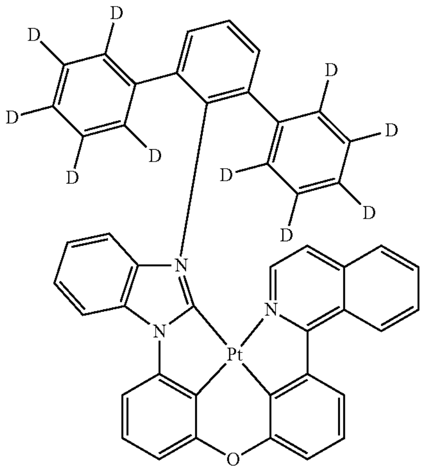
, -continued
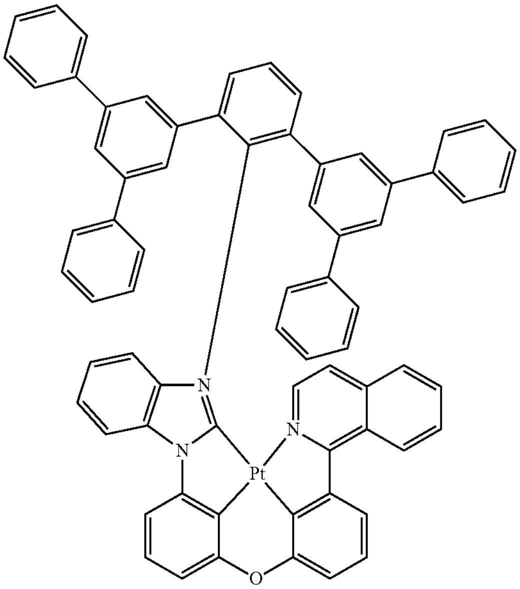
,
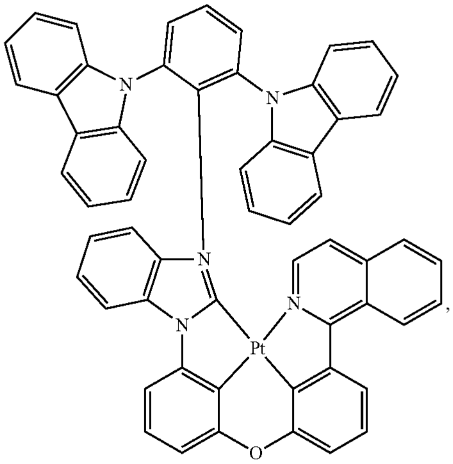
,
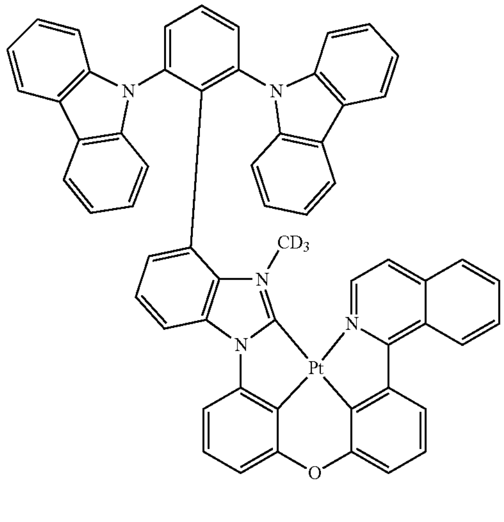
,
-continued
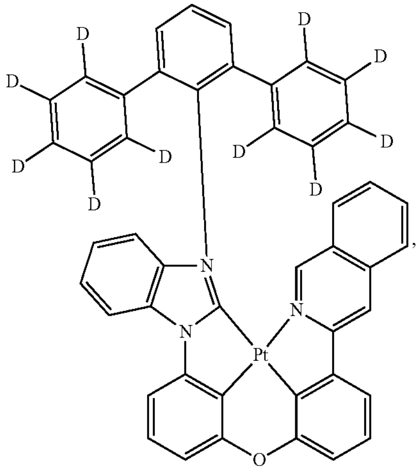
,
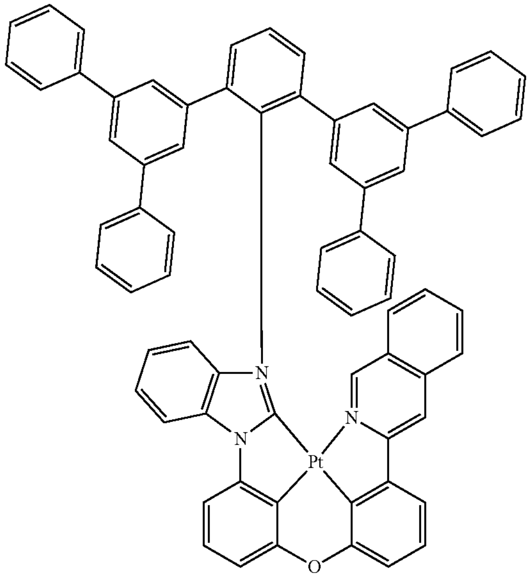
,
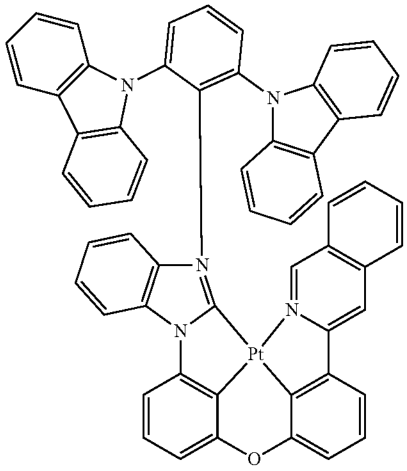
, -continued
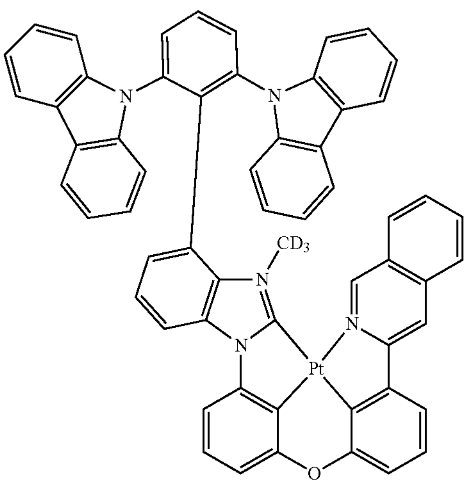
,
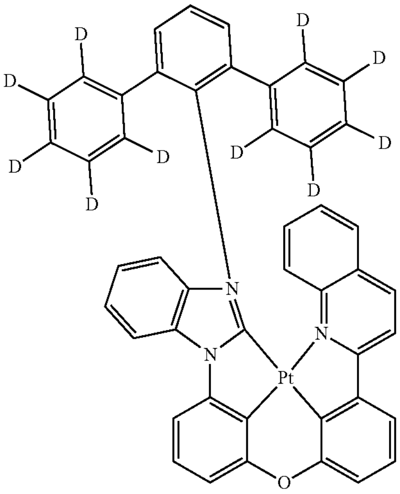
,
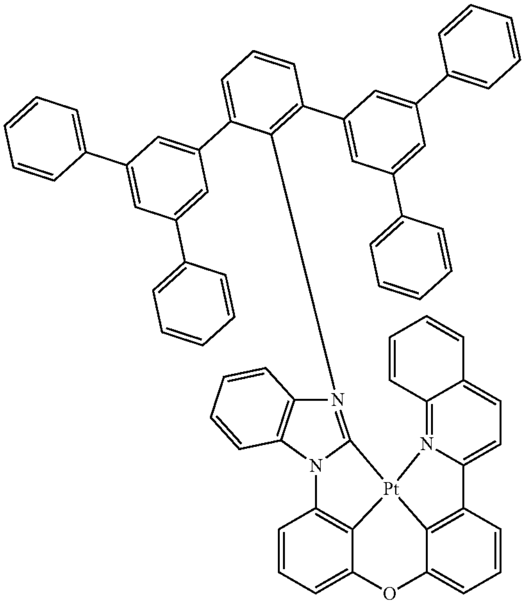
,
-continued
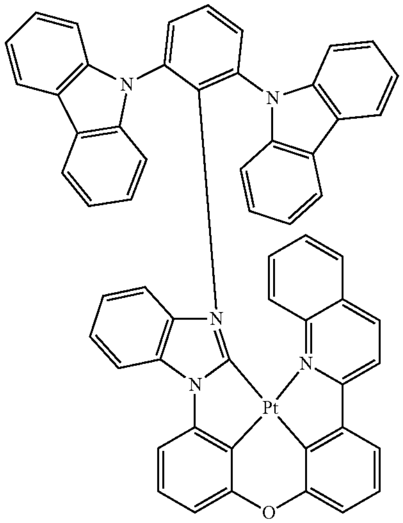
,
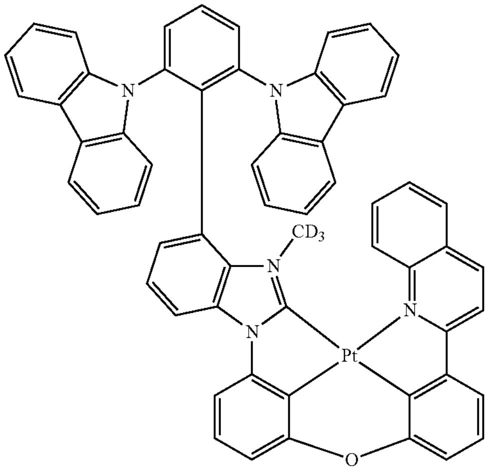
,
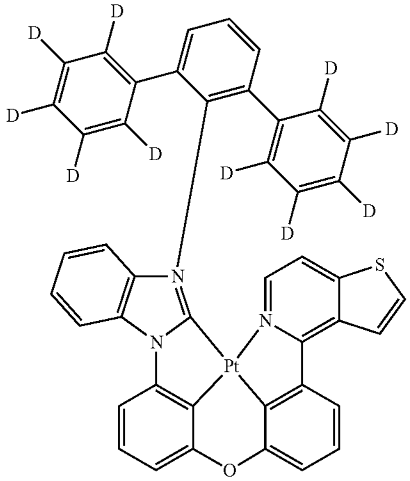
, -continued
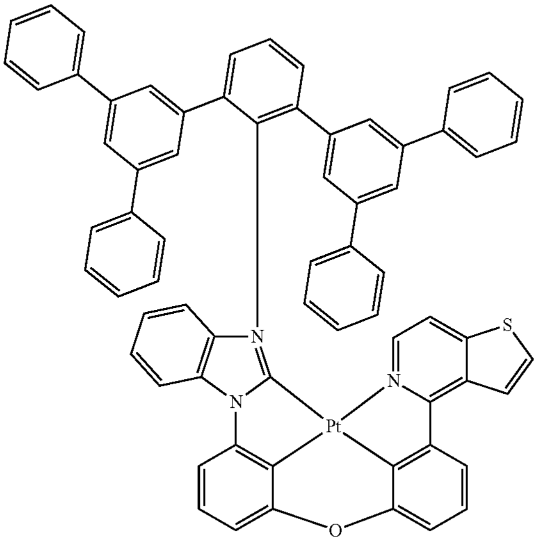
,
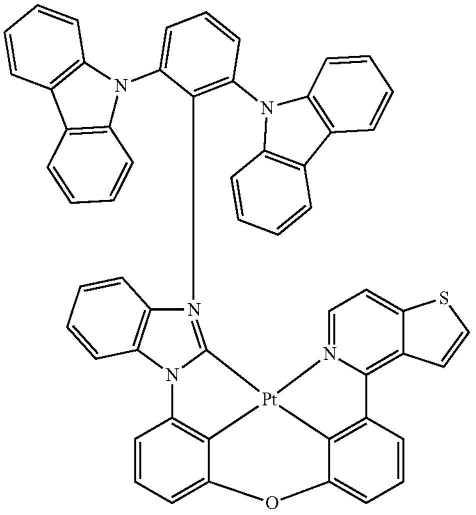
,
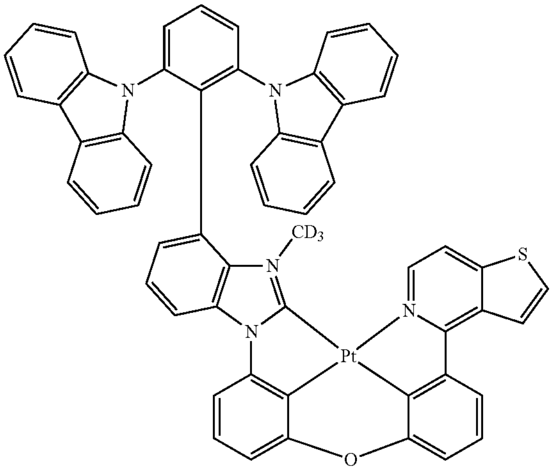
,
-continued
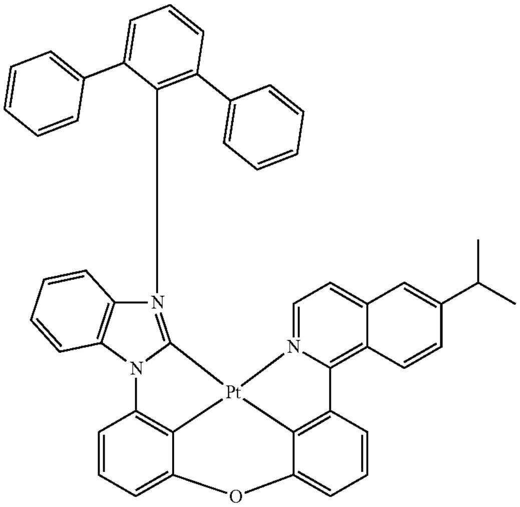
,
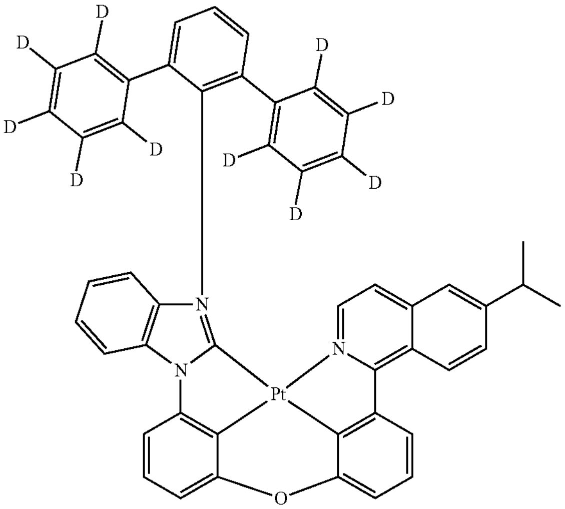
,
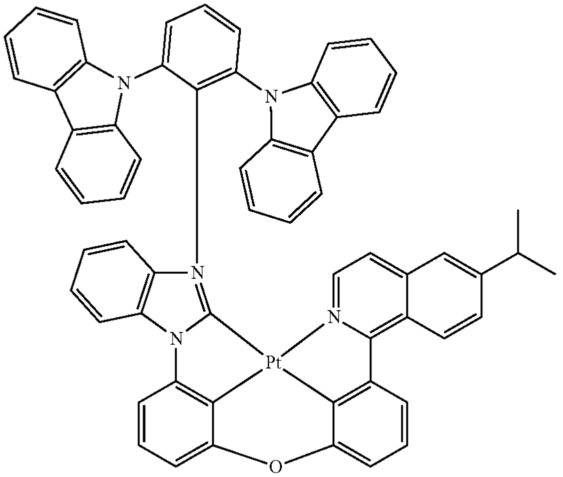
, -continued
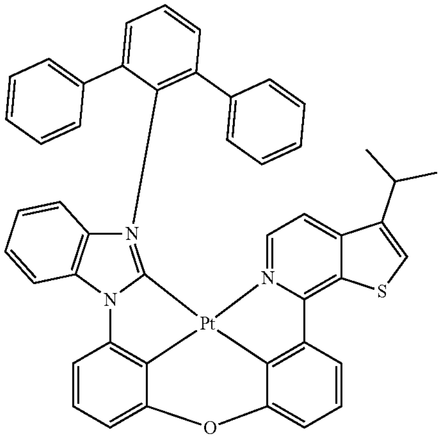
,
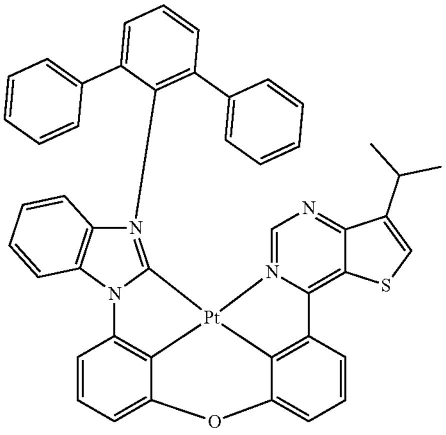
,
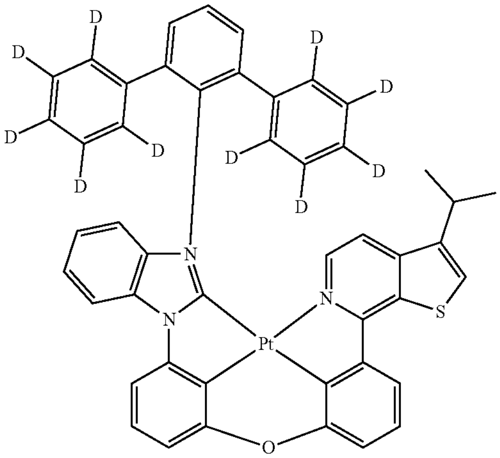
,
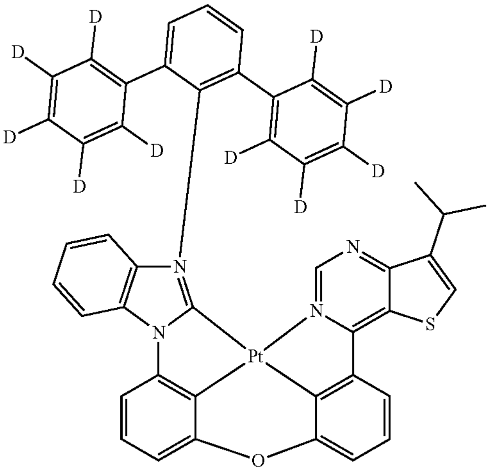
,
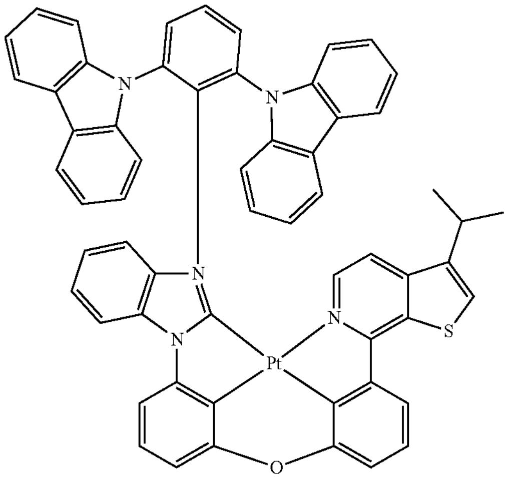
,
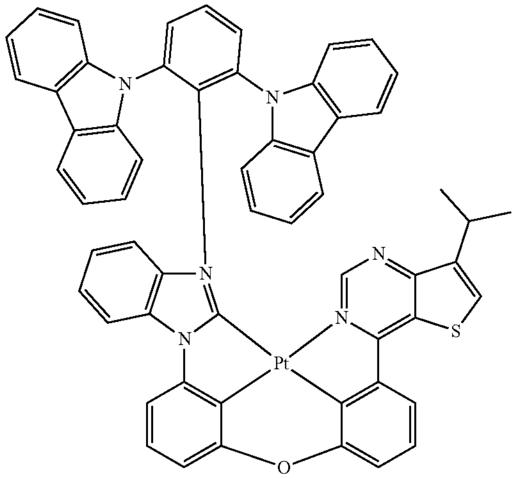
, -continued
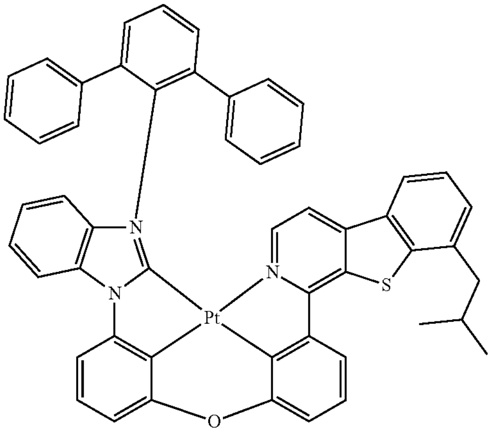
,
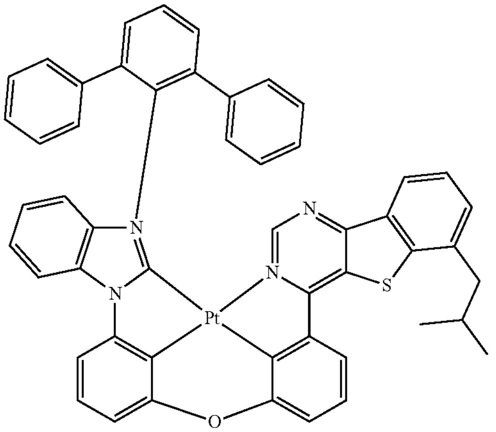
,
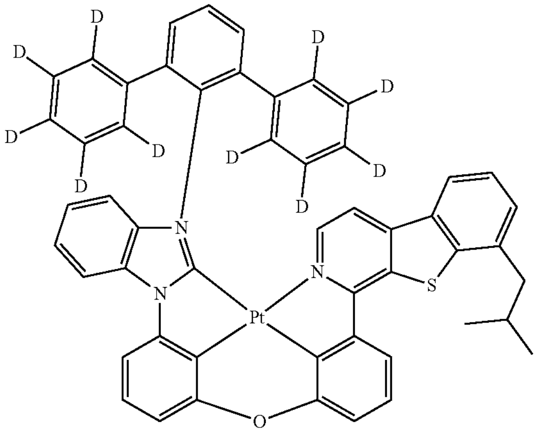
,
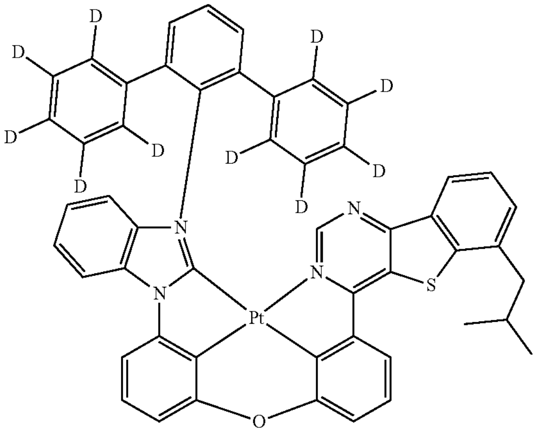
,
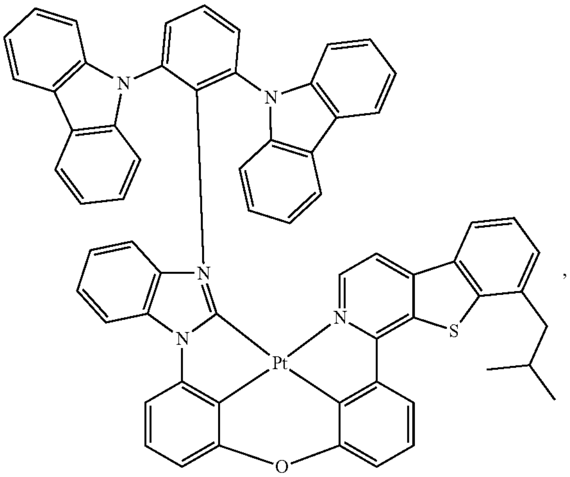
,
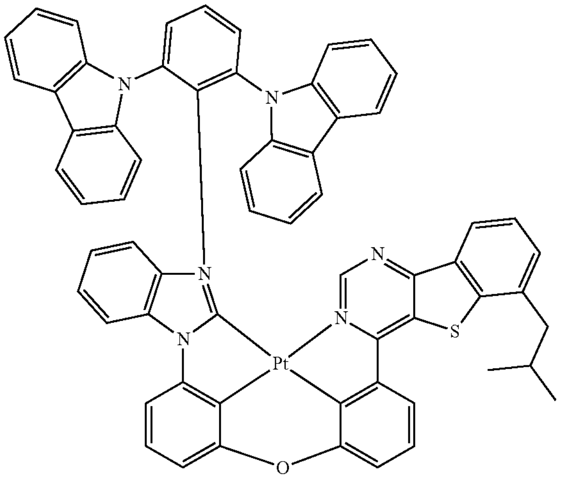
, -continued
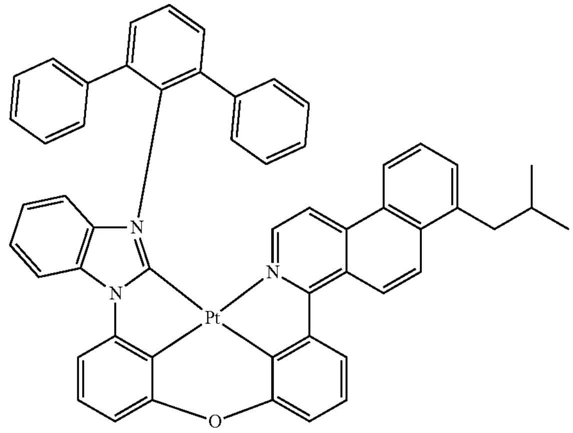
,
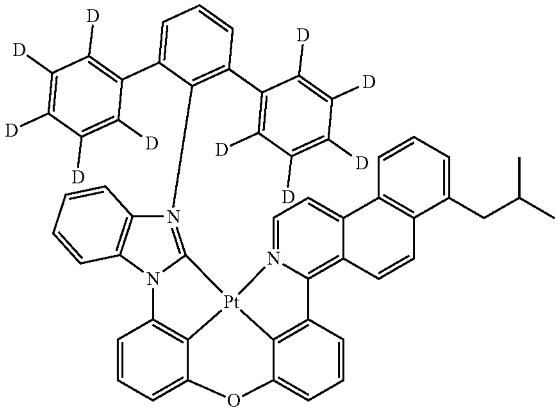
,
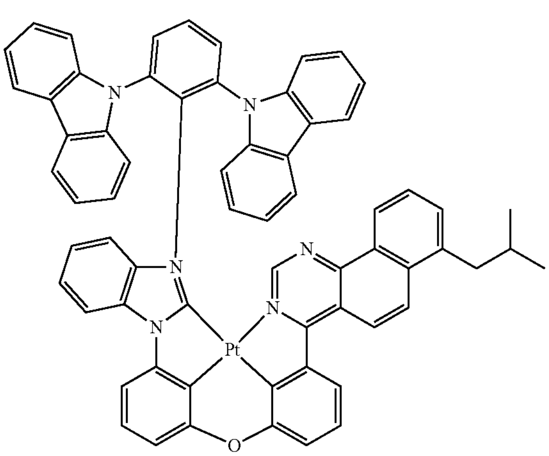
,
-continued
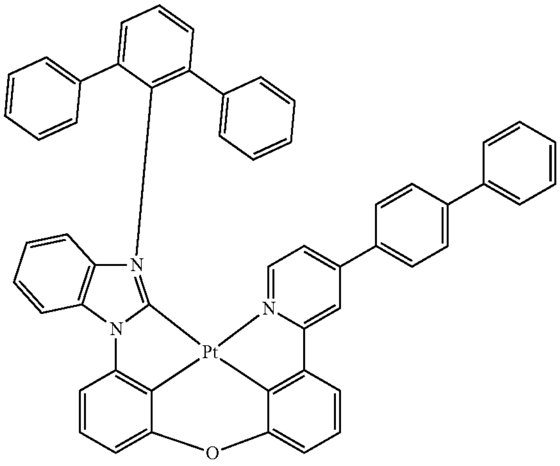
,
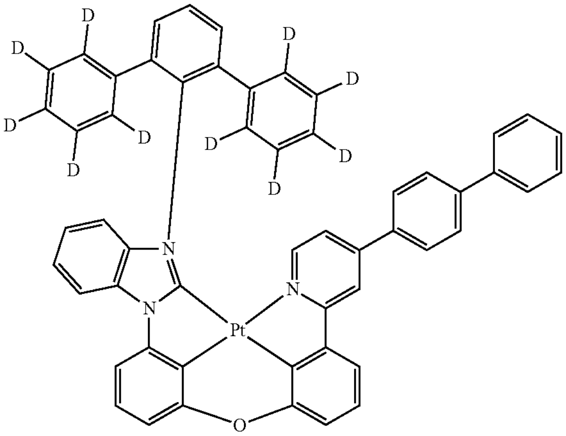
,
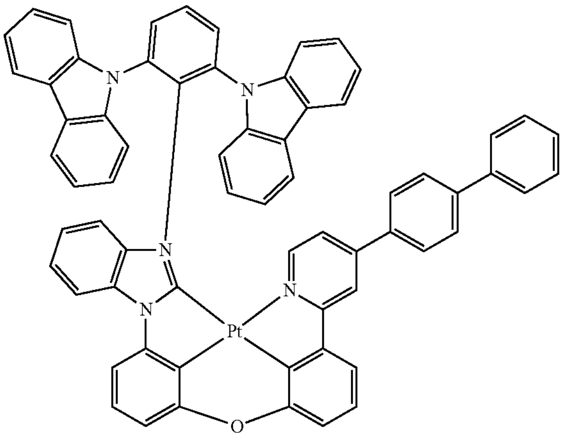
, -continued
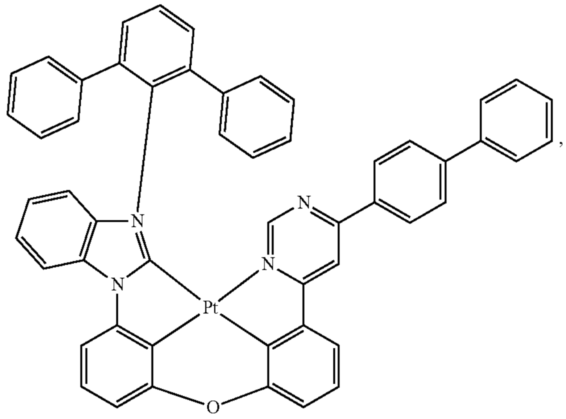
,
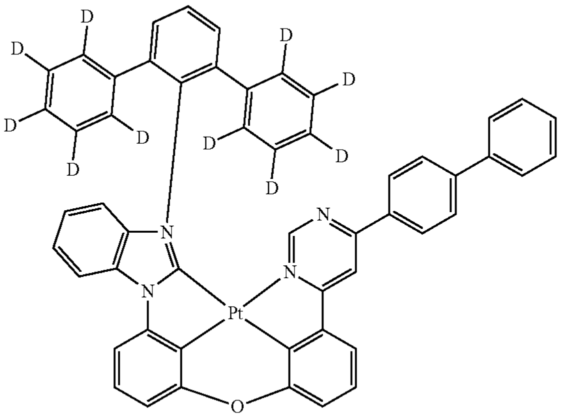
,
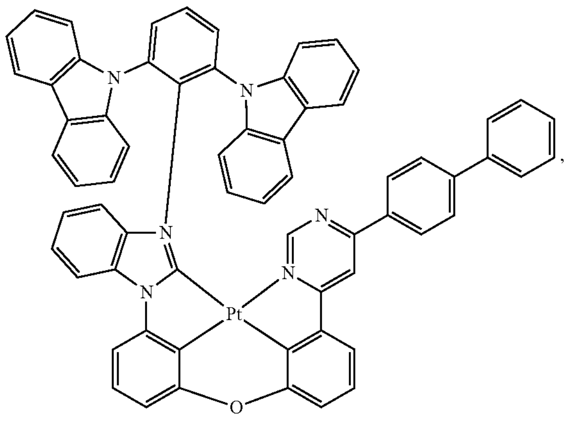
,
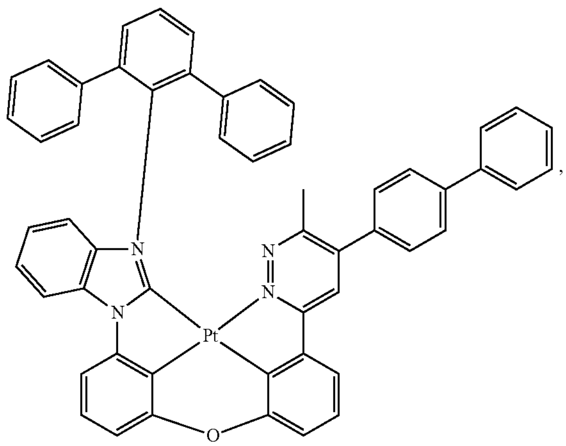
,
-continued
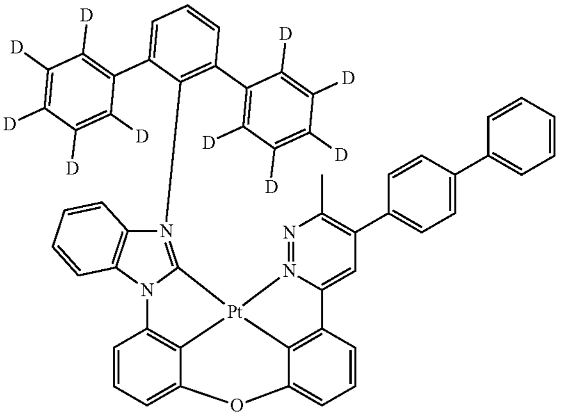
,
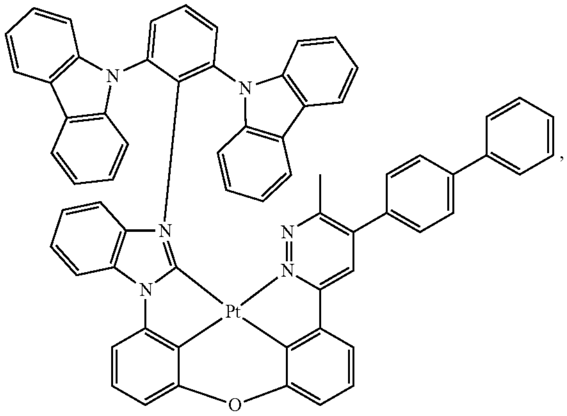
,
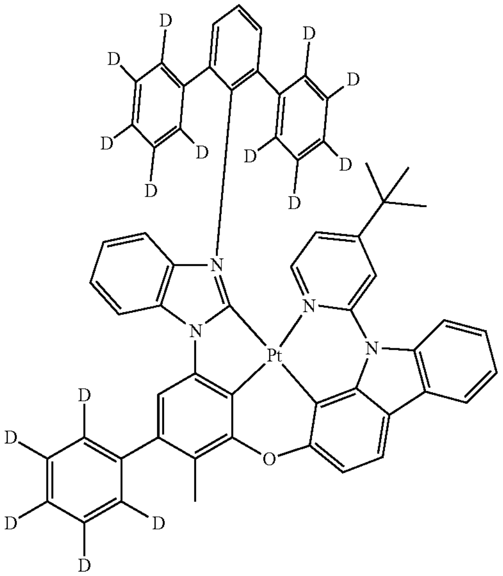
, -continued
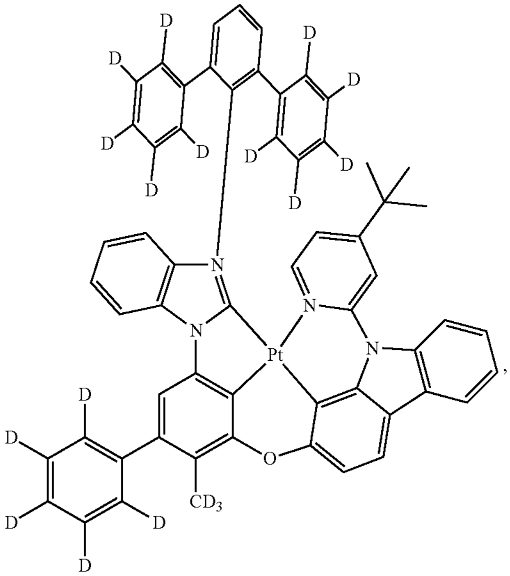
,
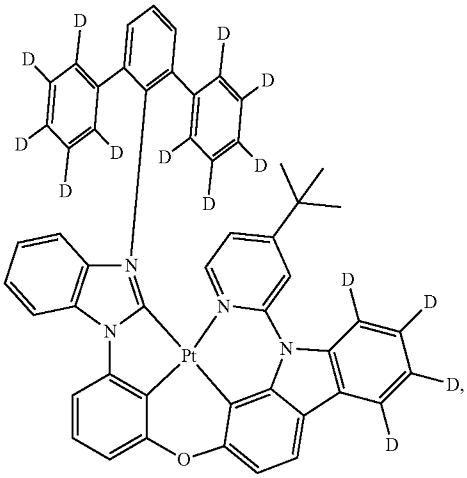
,
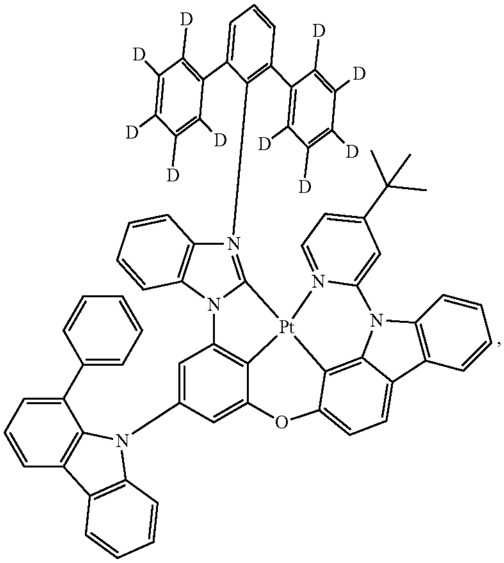
,
-continued
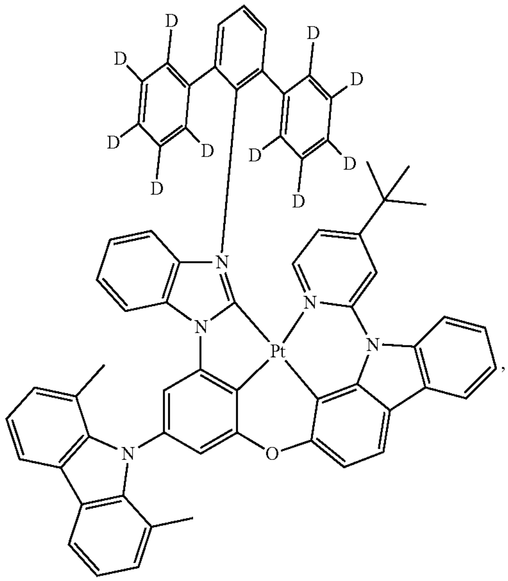
,
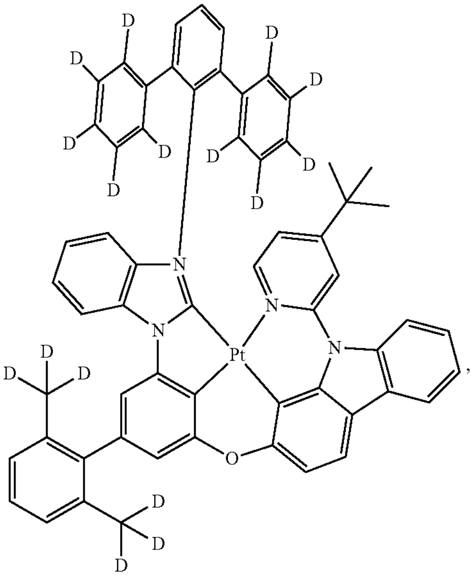
, -continued
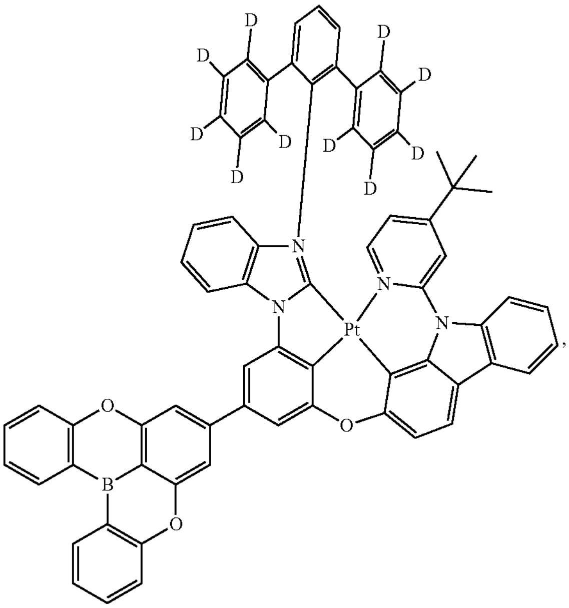
,
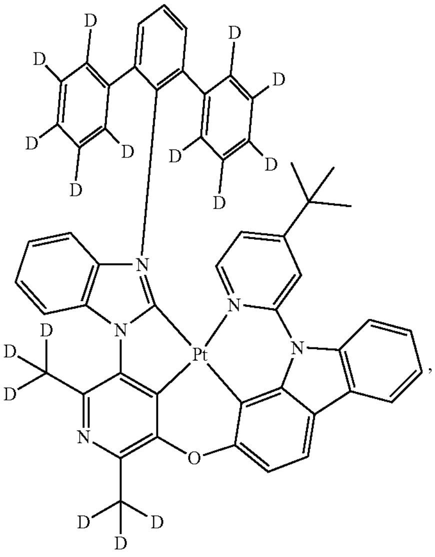
,
-continued
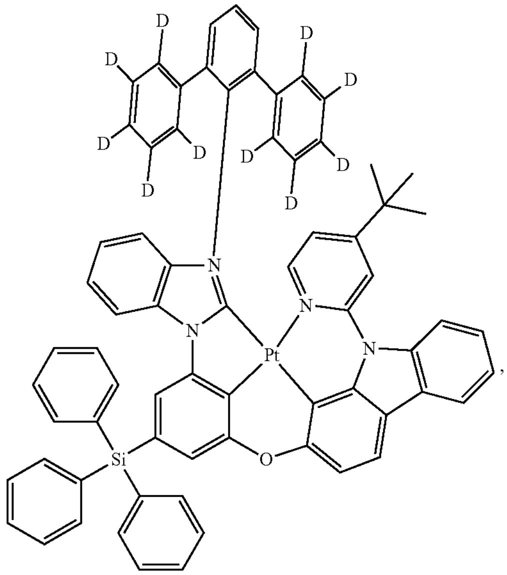
,
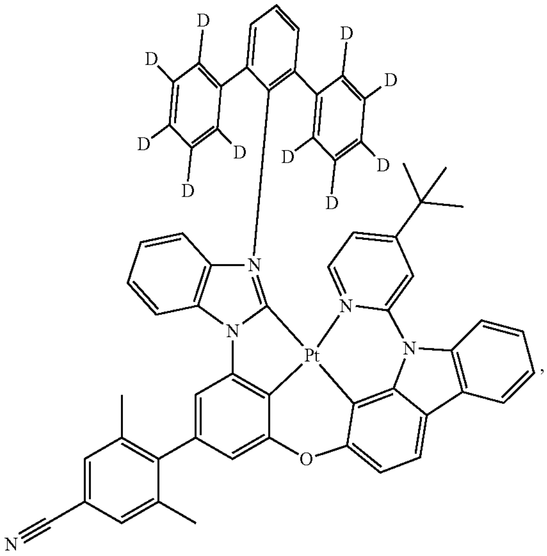
,
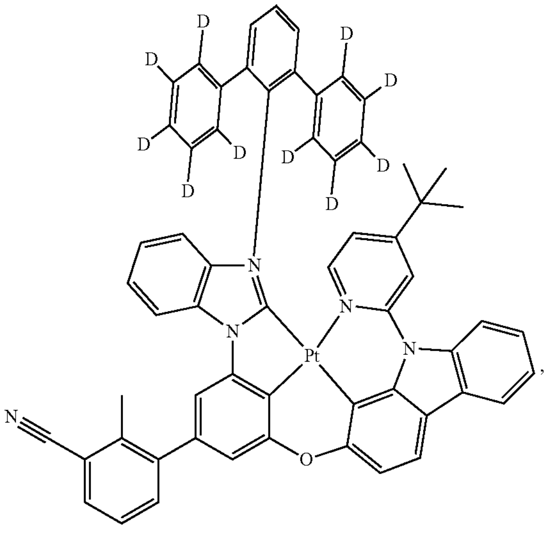
, -continued
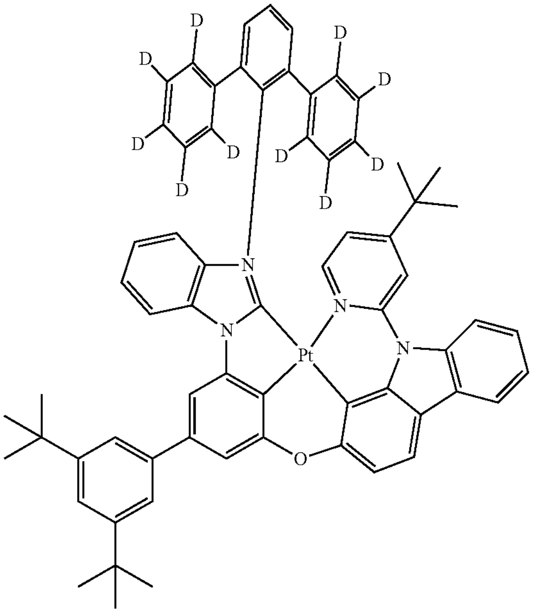
,
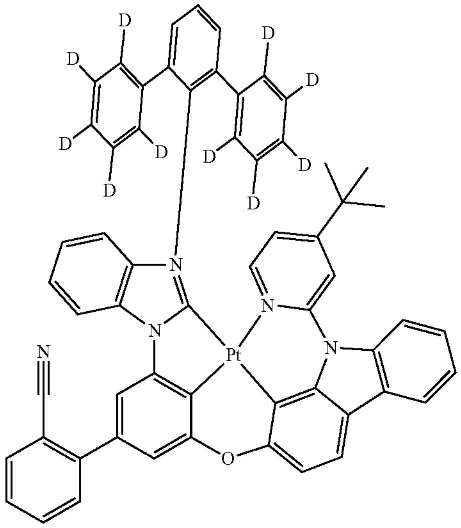
,
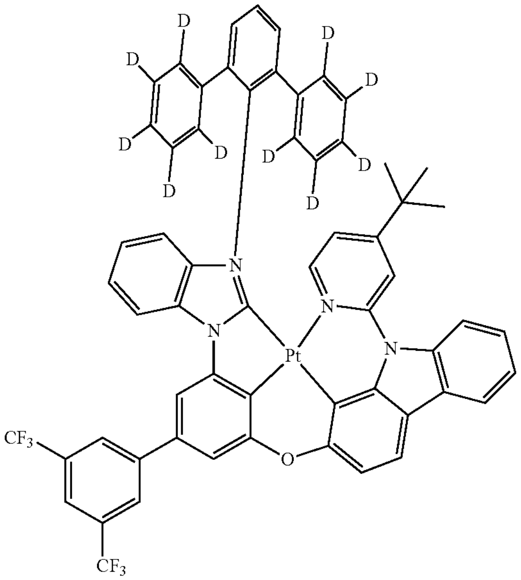
,
-continued
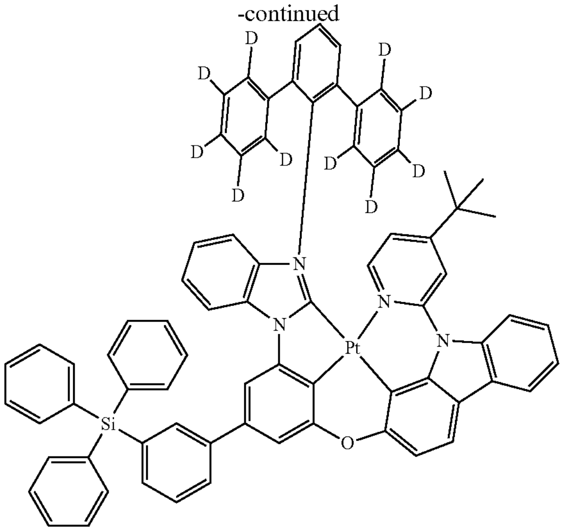
,
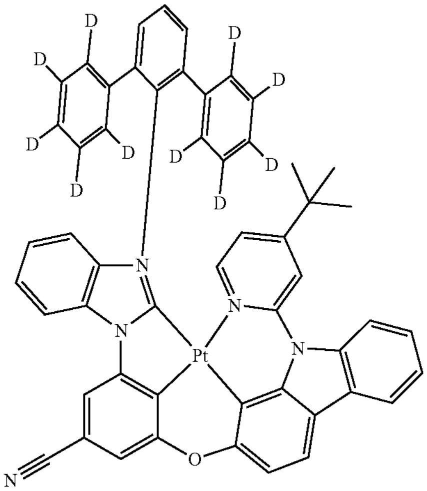
, and
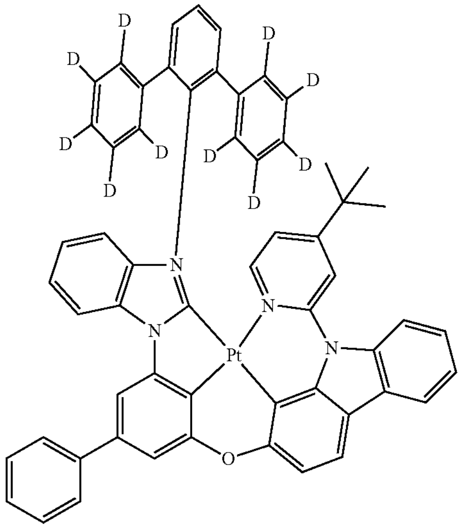
.
17. An organic light emitting device (OLED) comprising:
an anode;
a cathode; and
an organic layer, disposed between the anode and the cathode, comprising a compound comprising a structure of a formula selected from the group consisting of Formula V

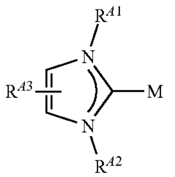

and

Formula VI

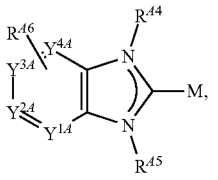

wherein,

M is selected from the group consisting of Os, Pd, Pt, Ir, Cu, and Au;

at least one of $R^{A1}$, $R^{A2}$, $R^{A4}$, $R^{A5}$, or $R^{A6}$ is a structure of Formula VII

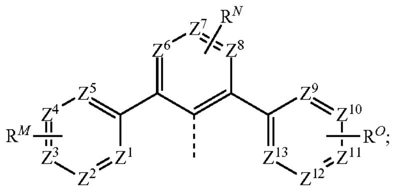

Formula VIII

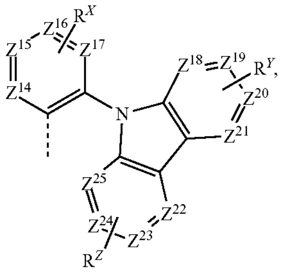

or

Formula IX

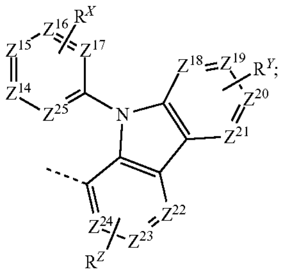

$Y^{1A}$ to $Y^{4A}$ are each independently C or N;

no more than two of $Y^{1A}$ to $Y^{4A}$ are N;

$Z^1$ to $Z^{25}$ are each independently C or N;

three consecutive $Z^1$ to $Z^{21}$ in the same ring cannot be N;

$R^{A3}$, $R^{A6}$, $R^M$, $R^N$, $R^O$, $R^X$, $R^Y$, and $R^Z$ each independently represent mono to the maximum allowable substitutions, or no substitution;

each $R^{A1}$, $R^{A2}$, $R^{A3}$, $R^{A4}$, $R^{A5}$, $R^{A6}$, $R^M$, $R^N$, $R^O$, $R^X$, $R^Y$, and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof;

M is coordinated to at least one monoanionic bidentate ligand;

any two substituents can be joined or fused to form a ring;

provided that when one of $R^{A1}$, $R^{A2}$, $R^{A4}$, $R^{A5}$, or $R^{A6}$ is a structure of Formula VIII, then at least one of $R^X$, $R^Y$, and $R^Z$ is selected from the group consisting of deuterium, alkyl, cycloalkyl, heteroalkyl, heterocycloalkyl, aryl, heteroaryl, and combinations thereof; and provided that when one of $R^{A1}$, $R^{A2}$, $R^{A4}$, or $R^{A5}$ is Formula VII, then at least one of $R^M$, $R^N$, and $R^O$ is selected from the group consisting of deuterium, alkyl, cycloalkyl, heteroalkyl, heterocycloalkyl, aryl, heteroaryl, and combinations thereof.

18. The OLED of claim 17, wherein the organic layer further comprises a host, wherein host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

19. A consumer product comprising an organic light-emitting device (OLED) comprising:

an anode;

a cathode; and an organic layer, disposed between the anode and the cathode, comprising a compound of claim 1.

20. An organic light emitting device (OLED) comprising:

an anode;

a cathode; and an organic layer, disposed between the anode and the cathode, comprising a compound of claim 16.

* * * * *